US009397307B2

(12) United States Patent
Nishimura et al.

(10) Patent No.: US 9,397,307 B2
(45) Date of Patent: Jul. 19, 2016

(54) ORGANIC ELECTROLUMINESCENCE DEVICE AND ELECTRONIC DEVICE

(71) Applicant: IDEMITSU KOSAN CO., LTD., Tokyo (JP)

(72) Inventors: Kazuki Nishimura, Sodegaura (JP); Sayaka Mizutani, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 300 days.

(21) Appl. No.: 14/178,278

(22) Filed: Feb. 12, 2014

(65) Prior Publication Data

US 2014/0231769 A1 Aug. 21, 2014

(30) Foreign Application Priority Data

Feb. 15, 2013 (JP) ................................ 2013-028457

(51) Int. Cl.
*H01L 51/00* (2006.01)
*H01L 51/50* (2006.01)

(52) U.S. Cl.
CPC ............ *H01L 51/50* (2013.01); *H01L 51/0052* (2013.01); *H01L 51/0054* (2013.01); *H01L 51/0055* (2013.01); *H01L 51/0056* (2013.01); *H01L 51/0067* (2013.01); *H01L 51/0072* (2013.01); *H01L 51/0073* (2013.01); *H01L 51/0074* (2013.01); *H01L 51/0085* (2013.01); *H01L 2251/5384* (2013.01)

(58) Field of Classification Search
None
See application file for complete search history.

(56) References Cited

U.S. PATENT DOCUMENTS 7,011,871 B2 * 3/2006 Herron ................. C07D 209/86 252/299.5
7,597,955 B2 * 10/2009 Takiguchi ............ C07D 209/08 356/244
2004/0115476 A1 * 6/2004 Oshiyama ............. C09K 11/06 428/690

FOREIGN PATENT DOCUMENTS

JP 2008-088083 4/2008
JP 4316387 * 5/2009
WO WO 03/080760 10/2003

* cited by examiner

*Primary Examiner* — Nathan T Leong
(74) *Attorney, Agent, or Firm* — Oblon, McClelland, Maier & Neustadt, L.L.P

(57) ABSTRACT

An organic electroluminescence device includes: a cathode; an anode; and an organic layer having one or more layers and provided between the anode and the cathode, in which the organic layer includes an emitting layer, and the emitting layer includes a first host material, a second host material and a phosphorescent dopant material. The first host material is a compound represented by a formula (1) below. The second host material is a compound represented by a formula (4) below.

(1)

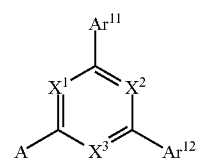

(4)

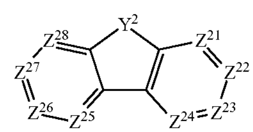

19 Claims, 1 Drawing Sheet

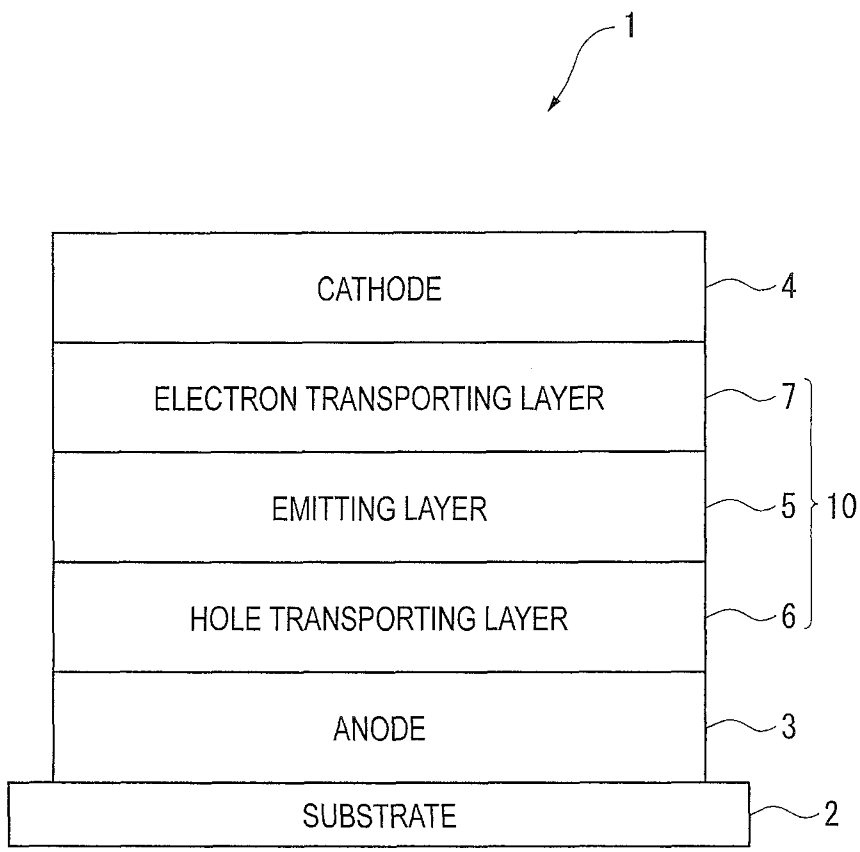
1
CATHODE
4
ELECTRON TRANSPORTING LAYER
7
EMITTING LAYER
5
10
HOLE TRANSPORTING LAYER
6
ANODE
3
SUBSTRATE
2

ORGANIC ELECTROLUMINESCENCE DEVICE AND ELECTRONIC DEVICE

CROSS-REFERENCE TO RELATED APPLICATION(S)

The application is based upon and claims the benefit of priority from the prior Japanese Patent Application No. 2013-028457, filed on Feb. 15, 2013; the entire contents of which are incorporated herein by reference.

FIELD

The present invention relates to an organic electroluminescence device and an electronic device.

BACKGROUND

There has been known an organic electroluminescence device (hereinafter, occasionally referred to as an "organic EL device") that includes an emitting unit (in which an emitting layer is included) between an anode and a cathode and emits light using exciton energy generated by a recombination of holes and electrons that have been injected into the emitting layer.

As the organic EL device, a phosphorescent organic EL device using a phosphorescent dopant material as a luminescent material has been known. The phosphorescent organic EL device can attain a high luminous efficiency by using a singlet state and a triplet state of an excited state of the phosphorescent dopant material. When holes and electrons are recombined in the emitting layer, it is presumed that singlet excitons and triplet excitons are produced at a rate of 1:3 due to difference in spin multiplicity. Accordingly, the phosphorescent organic EL device can attain a luminous efficiency three to four times as high as that of an organic EL device using a fluorescent material alone.

Patent Literature 1 (International Publication No. WO2003/080760) discloses a compound suitable as a phosphorescent host material for use in combination with a phosphorescent dopant material, in which a nitrogen-containing heterocyclic group is bonded to an aryl carbazoyl group or carbazoyl alkylene group. It is disclosed that an organic EL device capable of being driven at a low voltage and exhibiting a high color purity is obtainable by using the phosphorescent dopant material and this compound in the emitting layer.

However, Patent Literature 1 is silent on lifetime of the organic EL device. In order to use the organic EL device for a light source of an electronic device such as an illumination unit and a display, a long lifetime of the organic EL device is required while a voltage thereof being kept low.

BRIEF SUMMARY OF THE INVENTION

According to an aspect of the invention, an organic electroluminescence device includes: a cathode; an anode; and an organic layer having one or more layers and provided between the anode and the cathode, in which the organic layer includes an emitting layer, the emitting layer includes a first host material, a second host material, and a phosphorescent dopant material, the first host material is a compound represented by a formula (1) below, and the second host material is a compound represented by a formula (4) below.

(1)

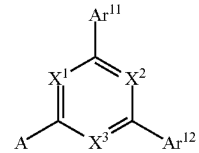

In the formula (1), $X^1$ to $X^3$ each are a nitrogen atom or $CR^1$, with a proviso that at least one of $X^1$ to $X^3$ is a nitrogen atom.

$R^1$ independently represents a hydrogen atom, a halogen atom, a cyano group, a substituted or unsubstituted alkyl group having 1 to 30 carbon atoms, a substituted or unsubstituted alkenyl group having 2 to 30 carbon atoms, a substituted or unsubstituted alkynyl group having 2 to 30 carbon atoms, a substituted or unsubstituted alkylsilyl group having 3 to 30 carbon atoms, a substituted or unsubstituted arylsilyl group having 6 to 30 ring carbon atoms, a substituted or unsubstituted alkoxy group having 1 to 30 carbon atoms, a substituted or unsubstituted aralkyl group having 6 to 30 ring carbon atoms, a substituted or unsubstituted aryloxy group having 6 to 30 ring carbon atoms, a substituted or unsubstituted aromatic hydrocarbon group having 6 to 30 ring carbon atoms, or a substituted or unsubstituted heterocyclic group having 5 to 30 ring atoms.

In the formula (1), A is represented by a formula (2) below.

In the formula (1), $Ar^{11}$ and $Ar^{12}$ are each independently represented by the formula (2), or a substituted or unsubstituted aromatic hydrocarbon group having 6 to 30 ring carbon atoms, or a substituted or unsubstituted heterocyclic group having 5 to 30 ring atoms.

$$(HAr^1)_m\text{-}L^1\text{-} \qquad (2)$$

In the formula (2), $HAr^1$ is represented by a formula (3) below.

In the formula (2), m is 1 or 2.

When m is 1, $L^1$ is a single bond or a divalent linking group.

When m is 2, $L^1$ is a trivalent linking group and $HAr^1$ are the same or different.

The linking group in $L^1$ is a substituted or unsubstituted divalent or trivalent aromatic hydrocarbon group having 6 to 30 ring carbon atoms, a substituted or unsubstituted divalent or trivalent heterocyclic group having 5 to 30 ring atoms, or a divalent or trivalent multiple linking group provided by bonding two or three groups selected from the aromatic hydrocarbon group and the heterocyclic group.

In the multiple linking group, the aromatic hydrocarbon group and the heterocyclic group forming the multiple linking group are mutually the same or different and may be mutually bonded to form a ring.

(3)

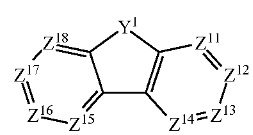

In the formula (3), $Z^{11}$ to $Z^{18}$ each independently represent a nitrogen atom, $CR^{11}$ or a carbon atom to be bonded to $L^1$ by a single bond.

In the formula (3), $Y^1$ represents an oxygen atom, a sulfur atom, $SiR^{12}R^{13}$ or a silicon atom to be bonded to $L^1$ by a single bond.

One of the carbon atom at $Z^{11}$ to $Z^{18}$ and $R^{11}$ to $R^{13}$ and the silicon atom at $Y^1$ is bonded to $L^1$.

$R^{11}$, $R^{12}$ and $R^{13}$ represent the same as $R^1$ of the formula (1). A plurality of $R^{11}$ are mutually the same or different. Adjacent ones of $R^{11}$ may be bonded to each other to form a ring. $R^{12}$ and $R^{13}$ are the same or different. $R^{12}$ and $R^{13}$ may be bonded to each other to form a ring.

(4)

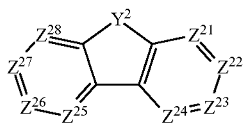

In the formula (4), $Y^2$ is represented by a formula (4-B) below.

In the formula (4), one of $Z^{21}$ to $Z^{28}$ is a carbon atom to be bonded to $L^{211}$ in a formula (5) below, or a pair of adjacent ones of $Z^{21}$ to $Z^{28}$ are carbon atoms to be bonded to b and c in one of formulae (6-1) to (6-4) below to form a fused ring.

$Z^{21}$ to $Z^{28}$ which are not bonded to $L^{211}$, b and c are $CR^{21}$. $R^{21}$ represents the same as $R^1$ of the formula (1). A plurality of $R^{21}$ are mutually the same or different.

(4-B)

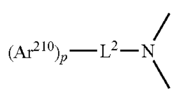

In the formula (4-B), $Ar^{210}$ is a substituted or unsubstituted aromatic hydrocarbon group having 6 to 30 ring carbon atoms or a substituted or unsubstituted heterocyclic group having 5 to 30 ring atoms.

p is an integer of 1 to 3. When p is 2 or more, a plurality of $Ar^{210}$ are the same or different.

$L^2$ represents a single bond or a linking group. $L^2$ as the linking group is a substituted or unsubstituted aromatic hydrocarbon group having 6 to 30 ring carbon atoms, a substituted or unsubstituted polyvalent heterocyclic group having 5 to 30 ring atoms, or a polyvalent multiple linking group provided by bonding two or three selected from the aromatic hydrocarbon group and the heterocyclic group.

In the multiple linking group, the aromatic hydrocarbon group and the heterocyclic group forming the multiple linking group are mutually the same or different and may be mutually bonded to form a ring.

(5)

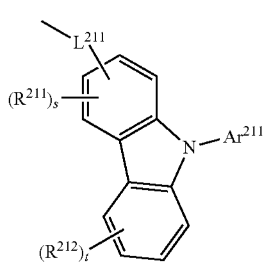

In the formula (5), $L^{211}$ is a single bond or a linking group which is bonded to one of $Z^{21}$ to $Z^{28}$ in the formula (4).

$L^{211}$ as the linking group is a substituted or unsubstituted divalent or trivalent aromatic hydrocarbon group having 6 to 30 ring carbon atoms, a substituted or unsubstituted divalent or trivalent heterocyclic group having 5 to 30 ring atoms, or a divalent or trivalent multiple linking group provided by bonding two or three groups selected from the aromatic hydrocarbon group and the heterocyclic group.

In the multiple linking group, the aromatic hydrocarbon group and the heterocyclic group forming the multiple linking group are mutually the same or different and may be mutually bonded to form a ring.

$Ar^{211}$ is a substituted or unsubstituted aromatic hydrocarbon group having 6 to 30 ring carbon atoms or a substituted or unsubstituted heterocyclic group having 5 to 30 ring atoms.

$R^{211}$ and $R^{212}$ represent the same as $R_1$ of the formula (1).

s is 3 and t is 4. A plurality of $R^{211}$ and $R^{212}$ are mutually the same or different.

(6-1)

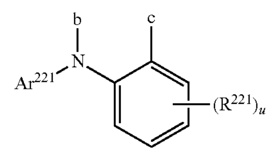

(6-2)

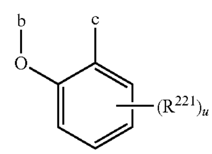

(6-3)

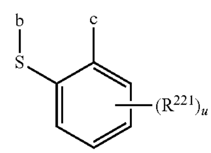

(6-4)

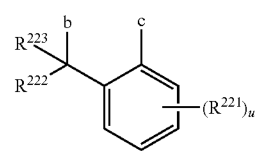

In the formulae (6-1) to (6-4), b and c are bonded to one of the pairs of adjacent ones of $Z^{21}$ to $Z^{28}$ in the formula (4) to form a fused ring.

$Ar^{221}$ is a substituted or unsubstituted aromatic hydrocarbon group having 6 to 30 ring carbon atoms or a substituted or unsubstituted heterocyclic group having 5 to 30 ring atoms.

$R^{221}$ to $R^{223}$ represent the same as $R^1$ of the formula (1).

u is 4. A plurality of $R^{221}$ are the same or different.

Adjacent ones of $R^{221}$ are optionally bonded to each other to form a ring.

According to another aspect of the invention, an organic electroluminescence device includes: a cathode; an anode; and an organic layer having one or more layers and provided between the anode and the cathode, in which the organic layer includes an emitting layer, the emitting layer includes a first host material, a second host material, and a phosphorescent dopant material, the first host material is the compound represented by the formula (1) below, and the second host material is a compound represented by a formula (30) below.

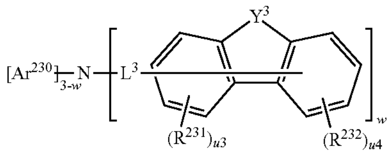

(30)

In the formula (30), $Ar^{230}$ is a substituted or unsubstituted aromatic hydrocarbon group having 6 to 30 ring carbon atoms.

$Y^3$ is selected from an oxygen atom, a sulfur atom, $NR^{230}$ and a nitrogen atom to be bonded to $L^3$ by a single bond.

$L^3$ is a single bond or a linking group and the linking group is a substituted or unsubstituted aromatic hydrocarbon group having 6 to 30 ring carbon atoms.

$L^3$ may be bonded to a carbon atom of the group including $Y^3$. When $Y^3$ is a nitrogen atom, $L^3$ may be bonded to $Y^3$.

w is 1 or 2. When w is 1, two $Ar^{230}$ are the same or different. When w is 2, structures represented by the formula (30-1) below are mutually the same or different.

$R^{230}$ to $R^{232}$ each independently represent the same as $R^1$ of the formula (1).

u3 and u4 are each independently an integer of 3 to 4.

A plurality of $R^{231}$ are mutually the same or different. Adjacent ones of $R^{231}$ may be bonded to each other to form a ring. $R^{232}$ are mutually the same or different. Adjacent ones of $R^{232}$ are optionally bonded to each other to form a ring.

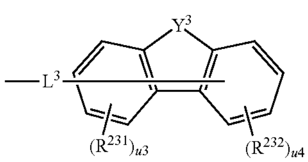

(30-1)

In the formula (30-1), $Y^3$, $L^3$, $R^{231}$, $R^{232}$, u3 and u4 respectively represent the same as $Y^3$, $L^3$, $R^{231}$, $R^{232}$, u3 and u4 of the formula (30).

According to a still another aspect of the invention, an electronic device includes the organic electroluminescence device according to the above aspect of the invention.

BRIEF DESCRIPTION OF THE DRAWINGS

FIG. 1 schematically shows an exemplary embodiment of an organic EL device according to an exemplary embodiment of the invention.

DETAILED DESCRIPTION OF THE INVENTION

Arrangement(s) of Organic EL Device

Arrangement(s) of an organic EL device of the invention will be described below.

The organic EL device of the invention includes a pair of electrodes and an organic layer between the pair of electrodes. The organic layer includes at least one layer formed of an organic compound. The organic layer may include an inorganic compound.

In the organic EL device of the invention, at least one layer of the organic layer includes an emitting layer. Accordingly, the organic layer may be provided by a single emitting layer. Alternatively, the organic layer may be provided by layers applied in a known organic EL device such as a hole injecting layer, a hole transporting layer, an electron injecting layer, an electron transporting layer, a hole blocking layer and an electron blocking layer.

The followings are representative arrangement examples of an organic EL device:

(a) anode/emitting layer/cathode;

(b) anode/hole injecting•transporting layer/emitting layer/cathode;

(c) anode/emitting layer/electron injecting•transporting layer/cathode;

(d) anode/hole injecting•transporting layer/emitting layer/electron injecting•transporting layer/cathode; and (e) anode/hole injecting•transporting layer/emitting layer/blocking layer/electron injecting transporting layer/cathode.

While the arrangement (d) is preferably used among the above arrangements, the arrangement of the invention is not limited to the above arrangements.

It should be noted that the aforementioned "emitting layer" is an organic layer having an emission function and, when a doping system is employed, containing a host material and a dopant material. At this time, the host material has a function to mainly promote recombination of electrons and holes and trap excitons within the emitting layer while the dopant material has a function to promote an efficient emission from the excitons obtained by the recombination. In case of a phosphorescent device, the host material has a main function to trap the excitons generated in the dopant, within the emitting layer.

The "hole injecting/transporting layer (or hole injecting•transporting layer) means "at least one of a hole injecting layer and a hole transporting layer while the "electron injecting/transporting layer (or electron injecting•transporting layer) means "at least one of an electron injecting layer and an electron transporting layer. Herein, when the hole injecting layer and the hole transporting layer are provided, the hole injecting layer is preferably close to the anode. When the electron injecting layer and the electron transporting layer are provided, the electron injecting layer is preferably close to the cathode.

In the invention, the electron transporting layer means an organic layer having the highest electron mobility among organic layer(s) providing an electron transporting zone existing between the emitting layer and the cathode. When the electron transporting zone is provided by a single layer, the single layer is the electron transporting layer. Moreover, in a phosphorescent organic EL device, a blocking layer having a not-necessarily-high electron mobility may be provided as shown in the arrangement (e) between the emitting layer and the electron transporting layer in order to prevent diffusion of excitation energy generated in the emitting layer. Thus, an organic layer adjacent to the emitting layer does not necessarily correspond to the electron transporting layer.

First Exemplary Embodiment

FIG. 1 schematically shows an exemplary arrangement of an organic EL device according to an exemplary embodiment of the invention.

An organic EL device 1 includes a light-transmissive substrate 2, an anode 3, a cathode 4 and an organic layer 10 disposed between the anode 3 and the cathode 4.

The organic layer 10 includes an emitting layer 5 containing a host material and a dopant material. The organic layer 10 also includes a hole transporting layer 6 between the emitting layer 5 and the anode 3. The organic layer 10 further includes an electron transporting layer 7 between the emitting layer 5 and the cathode 4.

Emitting Layer

In the exemplary embodiment, the emitting layer 5 includes a first host material, second host material and phosphorescent dopant material.

It is preferable that a concentration of the first host material is set in a range of 10 mass % to 90 mass %, a concentration of the second host material is set in a range of 10 mass % to 90 mass %, and a concentration of the phosphorescent dopant material is set in a range of 0.1 mass % to 30 mass % so that a total mass percentage of the materials contained in the emitting layer 5 becomes 100 mass % The first host material is more preferably set in a range of 40 mass % to 60 mass %.

First Host Material

As the first host material used in the organic EL device of this exemplary embodiment, a compound represented by a formula (1) below may be used.

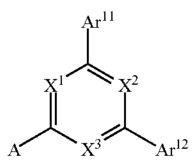

(1)

In the formula (1), $X^1$ to $X^3$ each are a nitrogen atom or $CR^1$.

However, at least one of $X^1$ to $X^3$ is a nitrogen atom.

$R^1$ independently represents a hydrogen atom, a halogen atom, a cyano group, a substituted or unsubstituted alkyl group having 1 to 30 carbon atoms, a substituted or unsubstituted alkenyl group having 2 to 30 carbon atoms, a substituted or unsubstituted alkynyl group having 2 to 30 carbon atoms, a substituted or unsubstituted alkylsilyl group having 3 to 30 carbon atoms, a substituted or unsubstituted arylsilyl group having 6 to 30 ring carbon atoms, a substituted or unsubstituted alkoxy group having 1 to 30 carbon atoms, a substituted or unsubstituted aralkyl group having 6 to 30 ring carbon atoms, a substituted or unsubstituted aryloxy group having 6 to 30 ring carbon atoms, a substituted or unsubstituted aromatic hydrocarbon group having 6 to 30 ring carbon atoms, or a substituted or unsubstituted heterocyclic group having 5 to 30 ring atoms.

In the formula (1), A is represented by a formula (2) below.

In the formula (1), $Ar^{11}$ and $Ar^{12}$ are each independently represented by a formula (2) below, or a substituted or unsubstituted aromatic hydrocarbon group having 6 to 30 ring carbon atoms, or a substituted or unsubstituted heterocyclic group having 5 to 30 ring atoms.

$$(HAr^1)_m\text{-}L^1\text{-} \quad (2)$$

In the formula (2), $HAr^1$ is represented by a formula (3) below.

In the formula (2), m is 1 or 2.

When m is 1, $L^1$ is a single bond or a divalent linking group.

When m is 2, $L^1$ is a trivalent linking group and $HAr^1$ are the same or different.

The linking group in $L^1$ is a substituted or unsubstituted divalent or trivalent aromatic hydrocarbon group having 6 to 30 ring carbon atoms, a substituted or unsubstituted divalent or trivalent heterocyclic group having 5 to 30 ring atoms, or a divalent or trivalent multiple linking group provided by bonding two or three groups selected from the aromatic hydrocarbon group and the heterocyclic group.

In the multiple linking group, the aromatic hydrocarbon group and the heterocyclic group forming the multiple linking group may be mutually the same or different and may be mutually bonded to form a ring.

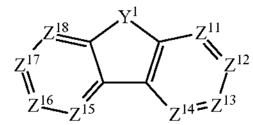

(3)

In the formula (3), $Z^{11}$ to $Z^{18}$ each independently represent a nitrogen atom, $CR^{11}$ or a carbon atom to be bonded to $L^1$ by a single bond.

In the formula (3), $Y^1$ represents an oxygen atom, a sulfur atom, $SiR^{12}R^{13}$ or a silicon atom to be bonded to $L^1$ by a single bond.

However, one of the carbon atom at $Z^{11}$ to $Z^{18}$ and $R^{11}$ to $R^{13}$ and the silicon atom at $Y^1$ is bonded to $L^1$.

$R^{11}$, $R^{12}$ and $R^{13}$ represent the same as $R^1$ of the formula (1). A plurality of $R^{11}$ are mutually the same or different. Adjacent ones of $R^{11}$ may be bonded to each other to form a ring. $R^{12}$ and $R^{13}$ are mutually the same or different. $R^{12}$ and $R^{13}$ may be bonded to each other to form a ring.

In the formula (1), two or three of $X^1$ to $X^3$ are preferably nitrogen atoms. In other words, the formula (1) is preferably represented by one of formulae (1-1) to (1-3) below.

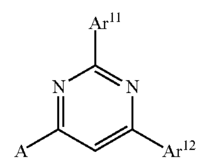

(1-1)

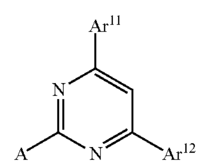

(1-2)

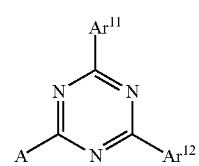

(1-3)

In the formulae (1-1) to (1-3), A, $Ar^{11}$ and $Ar^{12}$ represent the same as A, $Ar^{11}$ and $Ar^{12}$ of the formula (1).

In the formulae (1), $Ar^{11}$ and $Ar^{12}$ are each independently preferably the substituted or unsubstituted aromatic hydrocarbon group having 6 to 30 ring carbon atoms, more preferably a substituted or unsubstituted phenyl group, further preferably an unsubstituted phenyl group. In this case, the formula (1) is represented by a formula (1-4) below. When $Ar^{11}$ or $Ar^{11}$ is a substituted phenyl group, a substituent is preferably an aromatic hydrocarbon group having 6 to 30 ring carbon atoms, particularly preferably a phenyl group. In this case, the formula (1) is represented by a formula (1-5) or (1-6) below.

(1-4)

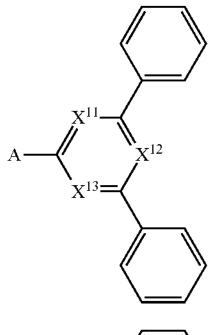

(1-5)

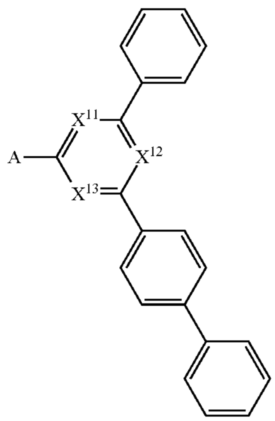

(1-6)

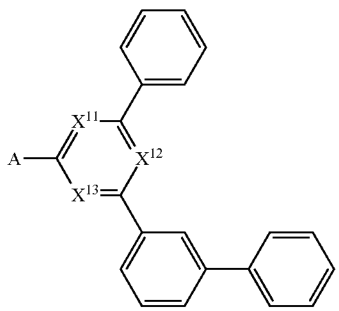

In the formulae (1-4), (1-5) and (1-6), A represents the same as A of the formula (1).

$X^{11}$, $X^{12}$ and $X^{13}$ respectively represent the same as $X^1$, $X^2$ and $X^3$ of the formula (1).

When m is 1 in the formula (2), $L^1$ is a single bond or a divalent linking group and the formula (2) is represented by a formula (2-1) below.

When m is 2 in the formula (2), $L^1$ is a trivalent linking group and the formula (2) is represented by a formula (2-2) below.

(2-1)

$$(HAr^1)—L^1—$$

(2-2)

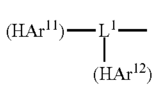

In the formulae (2-1) and (2-2), $L^1$ represents the same as $L^1$ of the formula (2). HAr, $HAr^{11}$ and $HAr^{12}$ each independently represent the same as HAr of the formula (2).

In the formula (2), $L^1$ is preferably a linking group. $L^1$ as a linking group is preferably a substituted or unsubstituted divalent or trivalent aromatic hydrocarbon group having 6 to 30 ring carbon atoms or a substituted or unsubstituted divalent or trivalent heterocyclic group having 5 to 30 ring atoms, more preferably a substituted or unsubstituted divalent or trivalent aromatic hydrocarbon group having 6 to 30 ring carbon atoms.

$L^1$ is further preferably a divalent or trivalent linking group derived from one of benzene, biphenyl, terphenyl, naphthalene and phenanthrene.

In the formula (2), m is preferably 1.

Accordingly, in the formula (2), preferably, m is 1 and $L^1$ is a linking group. $L^1$ is preferably a substituted or unsubstituted divalent aromatic hydrocarbon group having 6 to 30 ring carbon atoms or a substituted or unsubstituted divalent heterocyclic group having 5 to 30 ring atoms, more preferably a substituted or unsubstituted divalent aromatic hydrocarbon group having 6 to 30 ring carbon atoms.

In the formula (2), further preferably, m is 1 and $L^1$ as a linking group is a divalent linking group derived from one of benzene, biphenyl, terphenyl, naphthalene and phenanthrene. Among the above, $L^1$ is preferably a divalent linking group derived from benzene or biphenyl.

Such a compound is exemplified by a compound represented by a formula (1-7) or (1-8) below.

(1-7)

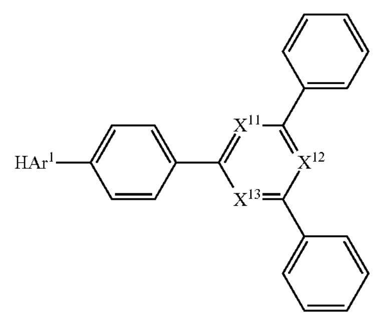

(1-8)

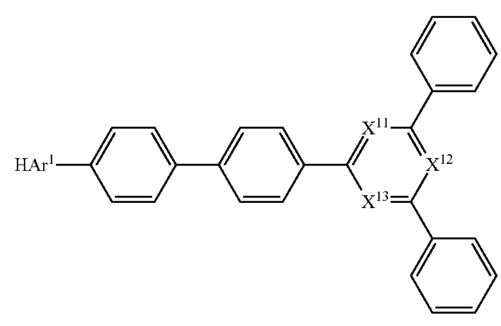

In the formulae (1-7) and (1-8), $X^{11}$ to $X^{13}$ represent the same as $X^1$ to $X^3$ of the formula (1).

$HAr^1$ represents the same as $HAr^1$ of the formula (2).

In the formula (3), $Y^1$ is preferably an oxygen atom or a sulfur atom, more preferably an oxygen atom.

Further preferably, one of $Z^{11}$ to $Z^{18}$ is a carbon atom to be bonded to $L^1$ by a single bond and the rest of $Z^{11}$ to $Z^{18}$ are $CR^{11}$.

Among the above, $Z^{13}$ or $Z^{16}$ is preferably a carbon atom to be bonded to $L^1$ by a single bond. Moreover, $Z^{11}$ or $Z^{18}$ is preferably a carbon atom to be bonded to $L^1$ by a single bond.

In other words, the formula (2) is preferably represented by a formula (2-3) or (2-4) below.

(2-3)

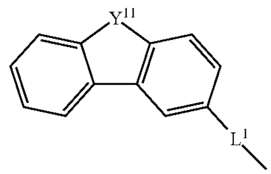

(2-4)

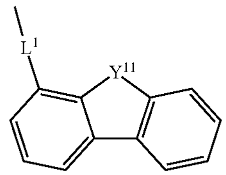

In the formulae (2-3) and (2-4), $Y^{11}$ represents an oxygen atom or a sulfur atom.

$L^1$ represents the same as L' of the formula (2).

Next, each of the substituents described in the formulae (1) to (3), (1-1) to (1-8) and (2-1) to (2-4) will be described.

Examples of the aromatic hydrocarbon group having 6 to 30 ring carbon atoms in the exemplary embodiment are a phenyl group, biphenyl group, terphenyl group, naphthyl group, anthryl group, phenanthryl group, fluorenyl group, pyrenyl group, chrysenyl group, fluoranthenyl group, benz[z]anthryl group, benzo[c]phenanthryl group, triphenylenyl group, benzo[k]fluoranthenyl group, benzo[g]chrysenyl group, benzo[b]triphenylenyl group, picenyl group, and perylenyl group.

The aromatic hydrocarbon group in the exemplary embodiment preferably has 6 to 20 ring carbon atoms, and more preferably has 6 to 12 ring carbon atoms. Among the aryl group, a phenyl group, biphenyl group, naphthyl group, phenanthryl group, terphenyl group, and fluorenyl group are particularly preferable. In a 1-fluorenyl group, 2-fluorenyl group, 3-fluorenyl group and 4-fluorenyl group, a carbon atom at a position 9 is preferably substituted by the substituted or unsubstituted alkyl group having 1 to 30 carbon atoms in a later-described exemplary embodiment.

Examples of the heterocyclic group having 5 to 30 ring atoms in the exemplary embodiment are a pyridyl group, pyrimidinyl group, pyrazinyl group, pyridazynyl group, triazinyl group, quinolyl group, isoquinolinyl group, naphthyridinyl group, phthalazinyl group, quinoxalinyl group, quinazolinyl group, phenanthridinyl group, acridinyl group, phenanthrolinyl group, pyrrolyl group, imidazolyl group, pyrazolyl group, triazolyl group, tetrazolyl group, indolyl group, benzimidazolyl group, indazolyl group, imidazopyridinyl group, benzotriazolyl group, carbazolyl group, furyl group, thienyl group, oxazolyl group, thiazolyl group, isoxazolyl group, isothiazolyl group, oxadiazolyl group, thiadiazolyl group, benzofuranyl group, benzothiophenyl group, benzoxazolyl group, benzothiazolyl group, benzisoxazolyl group, benzisothiazolyl group, benzoxadiazolyl group, benzothiadiazolyl group, dibenzofuranyl group, dibenzothiophenyl group, piperidinyl group, pyrrolidinyl group, piperazinyl group, morpholyl group, phenazinyl group, phenothiazinyl group, and phenoxazinyl group.

The heterocyclic group in the exemplary embodiment preferably has 5 to 20 ring atoms, more preferably 5 to 14 ring atoms. Among the above, a 1-dibenzofuranyl group, 2-dibenzofuranyl group, 3-dibenzofuranyl group, 4-dibenzofuranyl group, 1-dibenzothiophenyl group, 2-dibenzothiophenyl group, 3-dibenzothiophenyl group, 4-dibenzothiophenyl group, 1-carbazolyl group, 2-carbazolyl group, 3-carbazolyl group, 4-carbazolyl group, and 9-carbazolyl group are particularly preferable. In the 1-carbazolyl group, 2-carbazolyl group, 3-carbazolyl group, and 4-carbazolyl group, a nitrogen atom at a position 9 is preferably substituted by a substituted or unsubstituted aromatic hydrocarbon group having 6 to 30 ring carbon atoms or a substituted or unsubstituted heterocyclic group having 5 to 30 ring atoms in the exemplary embodiment.

The alkyl group having 1 to 30 carbon atoms in the exemplary embodiment may be linear, branched or cyclic. Examples of the linear or branched alkyl group are a methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neo-pentyl group, amyl group, isoamyl group, 1-methylpentyl group, 2-methylpentyl group, 1-pentylhexyl group, 1-butylpentyl group, 1-heptyloctyl group and 3-methylpentyl group.

The linear or branched alkyl group in the exemplary embodiment preferably has 1 to 10 carbon atoms, more preferably 1 to 6 carbon atoms. Among the linear or branched alkyl group, a methyl group, ethyl group, propyl group, isopropyl group, n-butyl group, s-butyl group, isobutyl group, t-butyl group, n-pentyl group, n-hexyl group, amyl group, isoamyl group and neopentyl group are particularly preferable.

Examples of the cycloalkyl group in the exemplary embodiment are a cyclopropyl group, cyclobutyl group, cyclopentyl group, cyclohexyl group, 4-methylcyclohexyl group, adamantyl group and norbornyl group. The cycloalkyl group preferably has 3 to 10 ring carbon atoms, more preferably 5 to 8 ring carbon atoms. Among the cycloalkyl group, a cyclopentyl group and a cyclohexyl group are particularly preferable.

The halogenated alkyl group provided by substituting an alkyl group with a halogen atom is exemplified by a halogenated alkyl group provided by substituting the above alkyl group having 1 to 30 carbon atoms with one or more halogen groups. Specific examples of the above halogenated alkyl group are a fluoromethyl group, difluoromethyl group, trifluoromethyl group, fluoroethyl group, trifluoromethylmethyl group, trifluoroethyl group and pentafluoroethyl group.

The alkylsilyl group having 3 to 30 carbon atoms in the exemplary embodiment is exemplified by a trialkylsilyl group having the above examples of the alkyl group having 1 to 30 carbon atoms. Specific examples of the alkylsilyl group are a trimethylsilyl group, triethylsilyl group, tri-n-butylsilyl group, tri-n-octylsilyl group, triisobutylsilyl group, dimethylethylsilyl group, dimethylisopropylsilyl group, dimethyl-n-propylsilyl group, dimethyl-n-butylsilyl group, dimethyl-t-butylsilyl group, diethylisopropylsilyl group, vinyl dimethylsilyl group, propyldimethylsilyl group, and triisopropylsilyl group. Three alkyl groups in the trialkylsilyl group may be the same or different.

Examples of the arylsilyl group having 6 to 30 ring carbon atoms in the exemplary embodiment are a dialkylarylsilyl group, alkyldiarylsilyl group and triarylsilyl group.

The dialkylarylsilyl group is exemplified by a dialkylarylsilyl group having two of the examples of the alkyl group having 1 to 30 carbon atoms and one of the examples of the aromatic hydrocarbon group having 6 to 30 ring carbon atoms. The dialkylarylsilyl group preferably has 8 to 30 carbon atoms.

The alkyldiarylsilyl group is exemplified by a alkyldiarylsilyl group having one of the examples of the alkyl group having 1 to 30 carbon atoms and two of the examples of the aromatic hydrocarbon group having 6 to 30 ring carbon atoms. The alkyldiarylsilyl group preferably has 13 to 30 carbon atoms.

The triarylsilyl group is exemplified by a triarylsilyl group having three of the examples of the aromatic hydrocarbon group having 6 to 30 ring carbon atoms. The triarylsilyl group preferably has 18 to 30 carbon atoms.

The alkoxy group having 1 to 30 carbon atoms in the exemplary embodiment is represented by —$OZ_1$. $Z_1$ is exemplified by the above alkyl group having 1 to 30 carbon atoms. Examples of the alkoxy group are a methoxy group, ethoxy group, propoxy group, butoxy group, pentyloxy group and hexyloxy group.

The halogenated alkoxy group provided by substituting an alkoxy group with a halogen atom is exemplified by a halogenated alkoxy group provided by substituting the above alkoxy group having 1 to 30 carbon atoms with one or more halogen groups.

The aryloxy group having 6 to 30 ring carbon atoms in the exemplary embodiment is represented by —$OZ_2$. $Z_2$ is exemplified by the above aromatic hydrocarbon group having 6 to 30 ring carbon atoms or a later-described monocyclic group and fused ring group. The aryloxy group is exemplified by a phenoxy group.

The alkylamino group having 2 to 30 carbon atoms in the exemplary embodiment is represented by —$NHR_V$ or —$N(R_V)_2$. $R_V$ is exemplified by the above alkyl group having 1 to 30 carbon atoms.

The arylamino group having 6 to 60 ring carbon atoms in the exemplary embodiment is represented by —$NHR_W$ or —$N(R_W)_2$. $R_W$ is exemplified by the above aromatic hydrocarbon group having 6 to 30 ring carbon atoms.

The alkylthio group having 1 to 30 carbon atoms in the exemplary embodiment is represented by —$SR_V$. $R_V$ is exemplified by the above alkyl group having 1 to 30 carbon atoms.

The arylthio group having 6 to 30 ring carbon atoms is represented by —$SR_W$. $R_W$ is exemplified by the above aromatic hydrocarbon group having 6 to 30 ring carbon atoms.

The alkenyl group in the exemplary embodiment preferably has 2 to 30 carbon atoms and may be linear, branched or cyclic. Examples of the alkenyl group are a vinyl group, propenyl group, butenyl group, oleyl group, eicosapentaenyl group, docosahexaenyl group, styryl group, 2,2-diphenylvinyl group, 1,2,2-triphenylvinyl group, 2-phenyl-2-propenyl group, cyclopentadienyl group, cyclopentenyl group, cyclohexenyl group and cyclohexadienyl group.

The alkynyl group in the exemplary embodiment preferably has 2 to 30 carbon atoms and may be linear, branched or cyclic. Examples of the alkynyl group are ethynyl, propynyl and 2-phenylethynyl.

The aralkyl group in the exemplary embodiment preferably has 6 to 30 ring carbon atoms and is represented by —$Z_3$—$Z_4$. $Z_3$ is exemplified by an alkylene group corresponding to the above alkyl group having 1 to 30 carbon atoms. $Z_4$ is exemplified by the above aryl group having 6 to 30 ring carbon atoms. The aralkyl group is preferably an aralkyl having 7 to 30 carbon atoms in which an aryl portion has 6 to 30 carbon atoms, preferably 6 to 20 carbon atoms, more preferably 6 to 12 carbon atoms and an alkyl portion has 1 to 30 carbon atoms, preferably 1 to 20 carbon atoms, more preferably 1 to 10 carbon atoms, further preferably 1 to 6 carbon atoms. Examples of the aralkyl group are a benzyl group, 2-phenylpropane-2-yl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, and 2-β-naphthylisopropyl group.

Examples of the halogen atom in the exemplary embodiment are fluorine, chlorine, bromine, and iodine, among which a fluorine atom is preferable.

In the invention, "carbon atoms forming a ring (ring carbon atoms)" mean carbon atoms forming a saturated ring, unsaturated ring, or aromatic ring. "Atoms forming a ring (ring atoms)" mean carbon atoms and hetero atoms forming a hetero ring including a saturated ring, unsaturated ring and aromatic ring.

In the invention, a hydrogen atom includes isotope having different numbers of neutrons, specifically, protium, deuterium and tritium.

Moreover, in the invention, examples of a substituent in "substituted or unsubstituted" are the above-described aromatic hydrocarbon group, heterocyclic group, alkyl group (linear or branched alkyl group, cycloalkyl group, haloalkyl group), alkoxy group, aryloxy group, aralkyl group, haloalkoxy group, alkylsilyl group, dialkylarylsilyl group, alkyldiarylsilyl group, triarylsilyl group, halogen atom, cyano group, hydroxyl group, nitro group and carboxy group. In addition, an alkenyl group and an alkynyl are included.

Among the above substituents, the aromatic hydrocarbon group, heterocyclic group, alkyl group, halogen atom, alkylsilyl group, arylsilyl group and cyano group are preferable and the specific preferable substituents described in each of the substituents are further preferable.

Herein, "unsubstituted" in "substituted or unsubstituted" means that a group is not substituted by the above substituents but bonded with a hydrogen atom.

Herein, in the expression of a "substituted or unsubstituted XX group having a to b carbon atoms," "a to b carbon atoms" represent the number of carbon atoms when the XX group is unsubstituted and does not include the number of carbon atoms of a substituent when the XX group is substituted by the substituent.

The same description as the above applies to "substituted or unsubstituted" in the following compound or a partial structure thereof.

Specific examples of the compound represented by the formula (1) are shown below, but the compound represented by the formula (1) is not limited thereto.

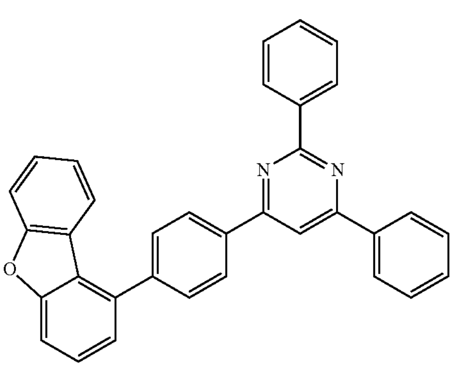

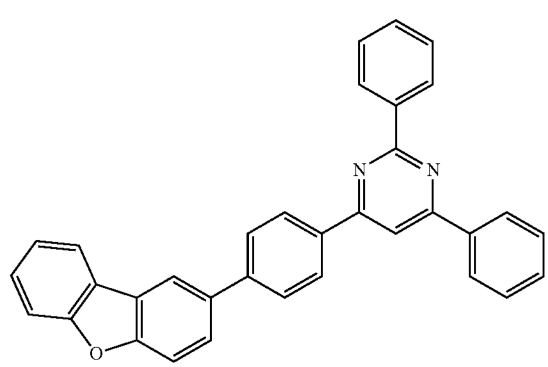

-continued
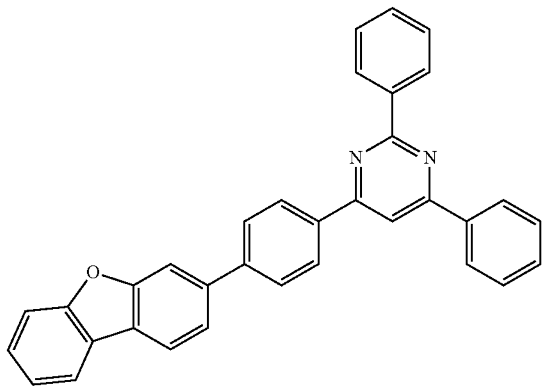
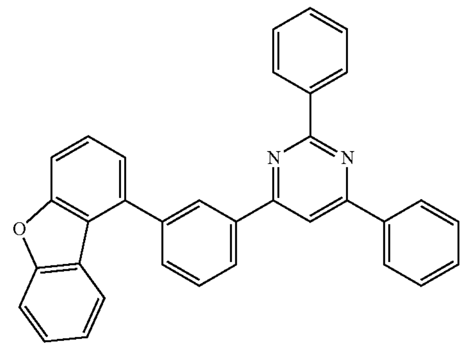
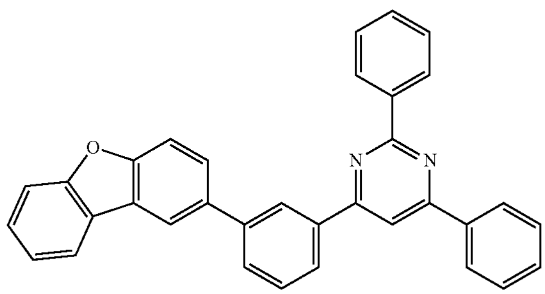
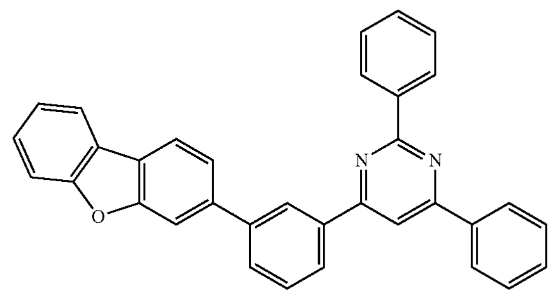
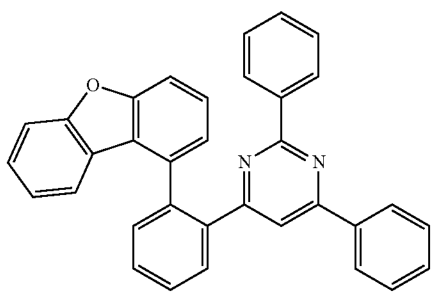
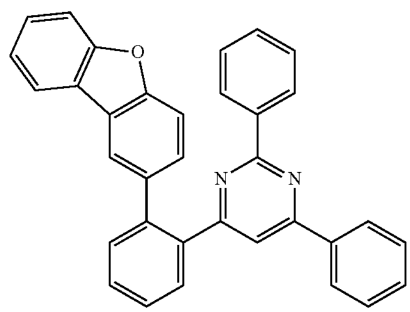
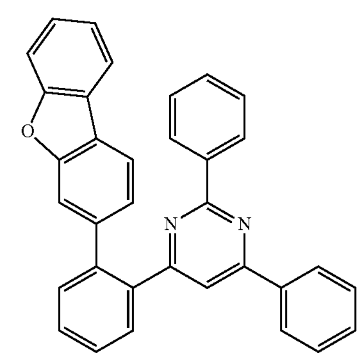
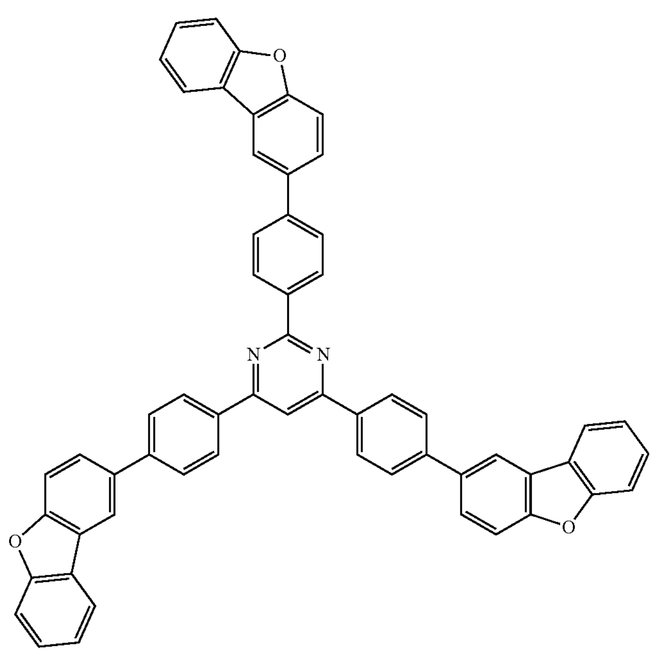

-continued
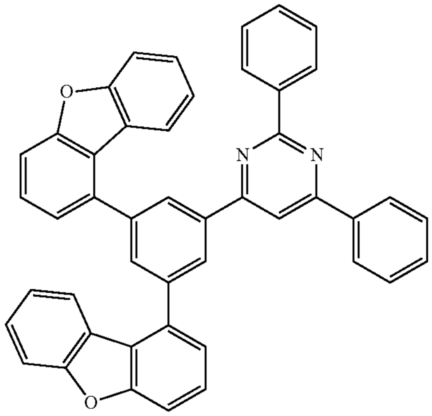
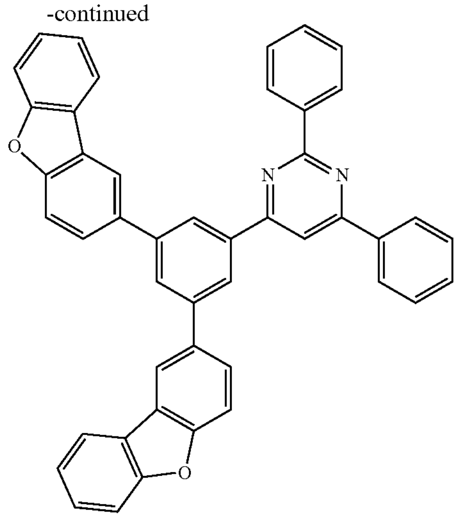
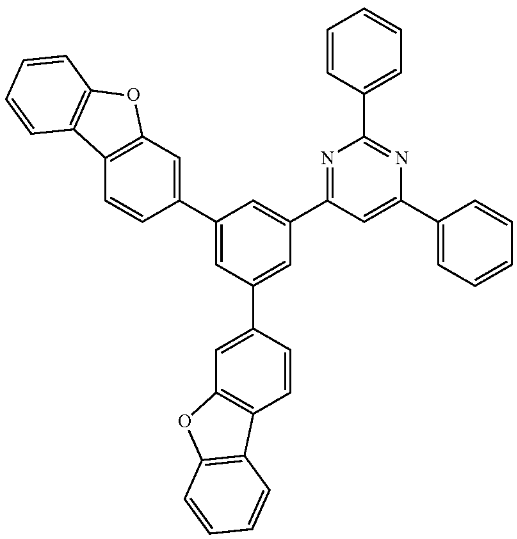
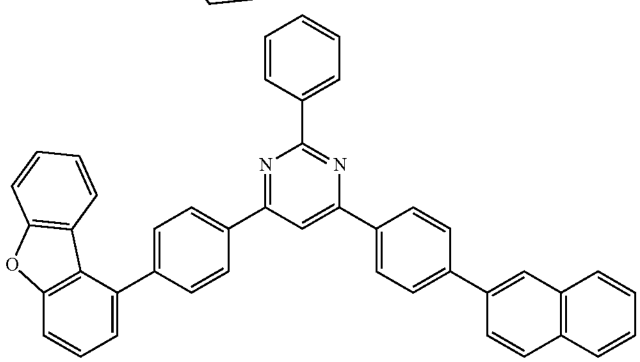
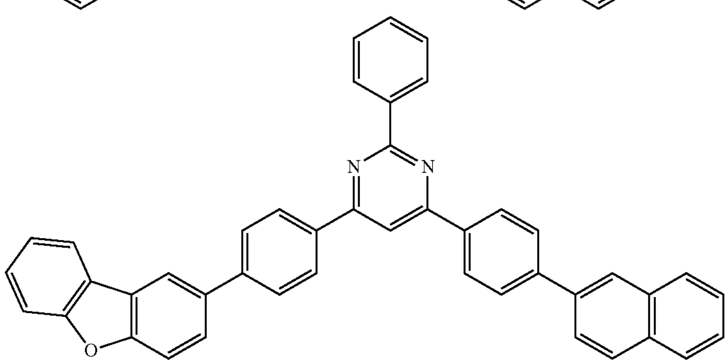

-continued
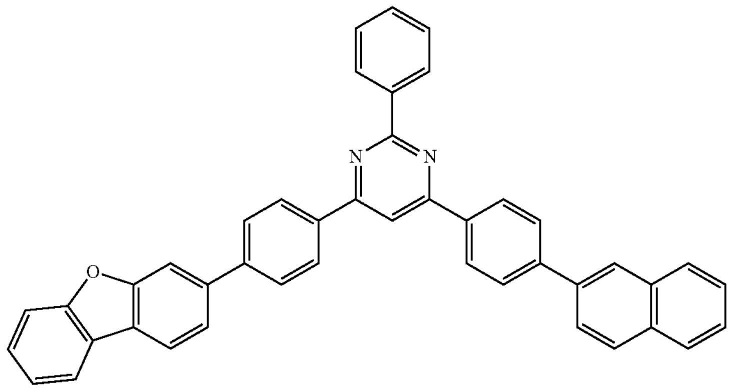
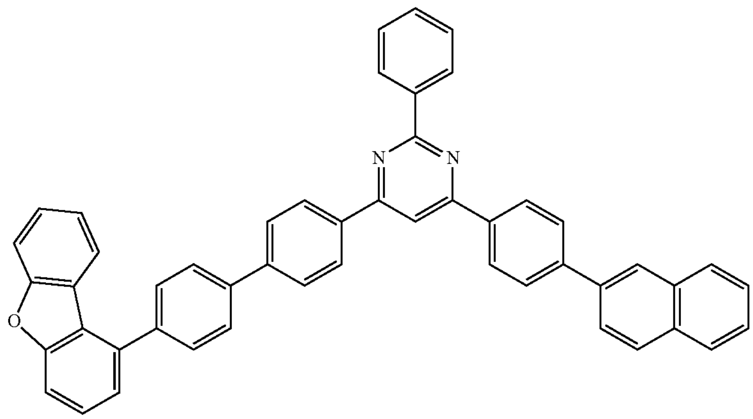
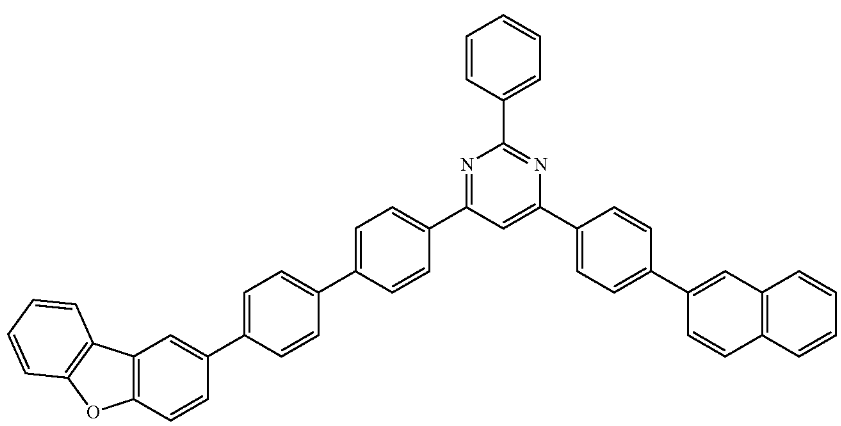
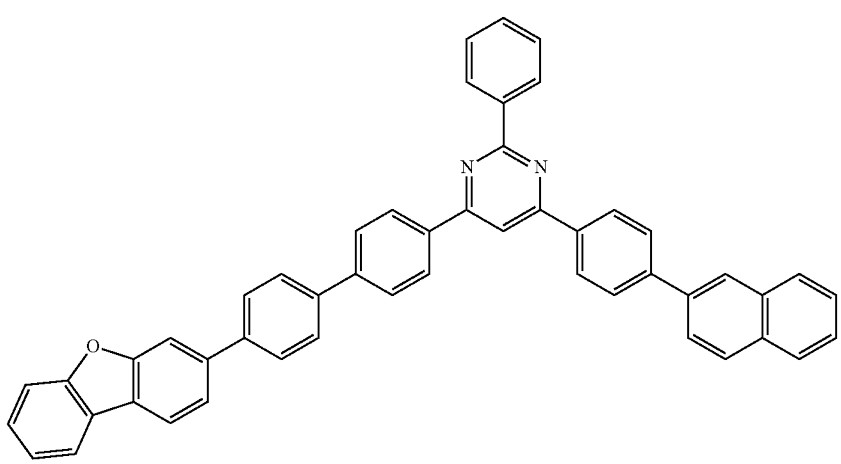 [SMILES: c1ccc(-c2nc(-c3ccc(-c4ccc(-c5ccc6c(c5)oc5ccccc56)cc4)cc3)cc(-c3ccc(-c4ccc5ccccc5c4)cc3)n2)cc1]

-continued
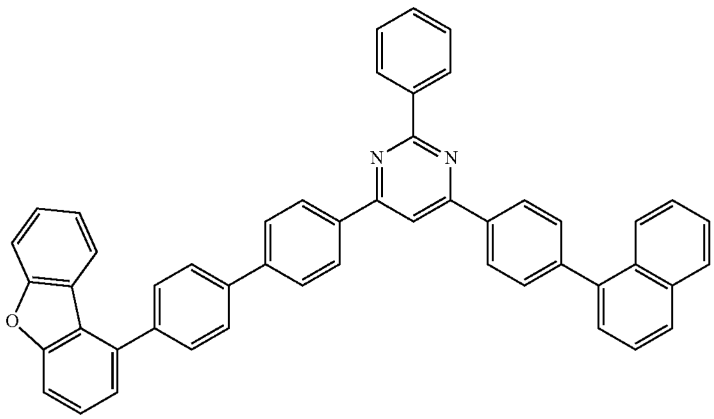
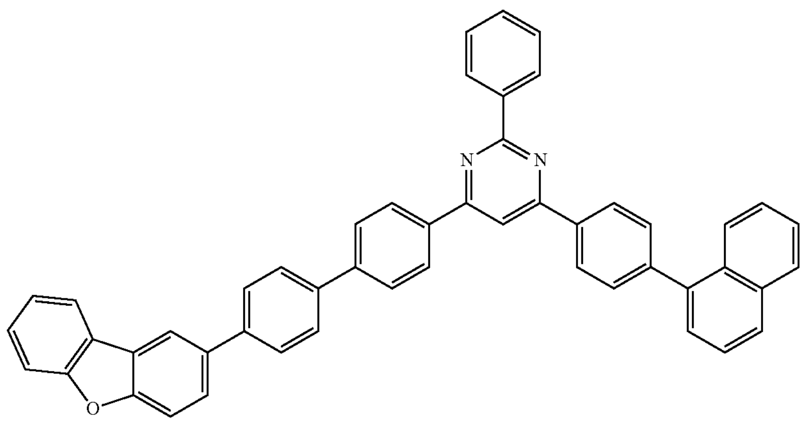
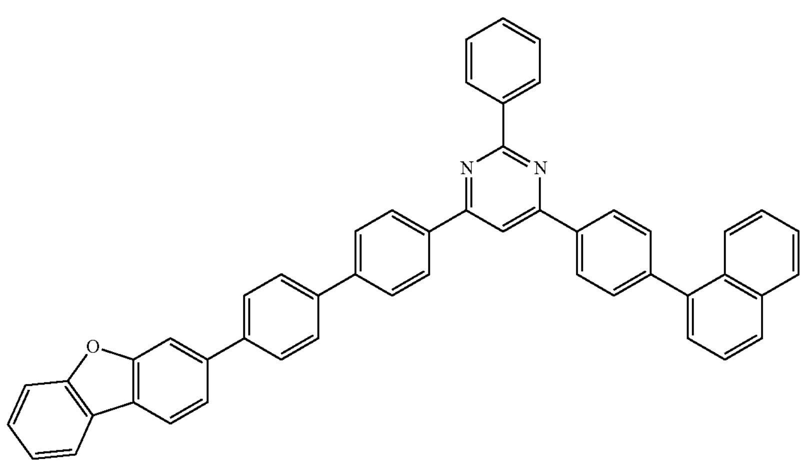
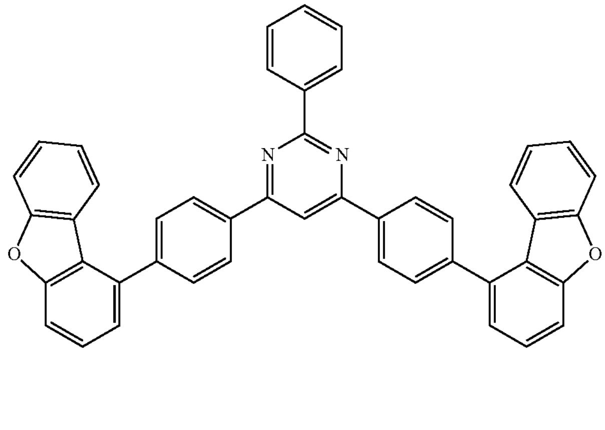

-continued
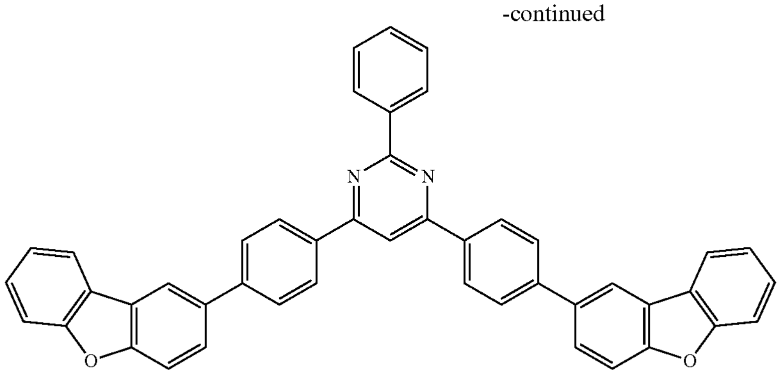
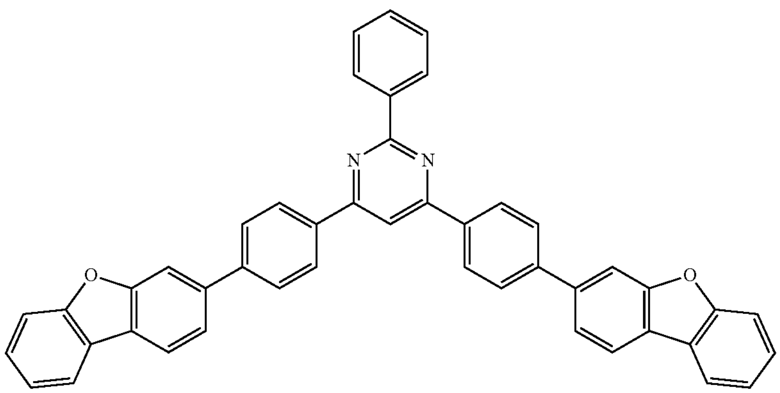
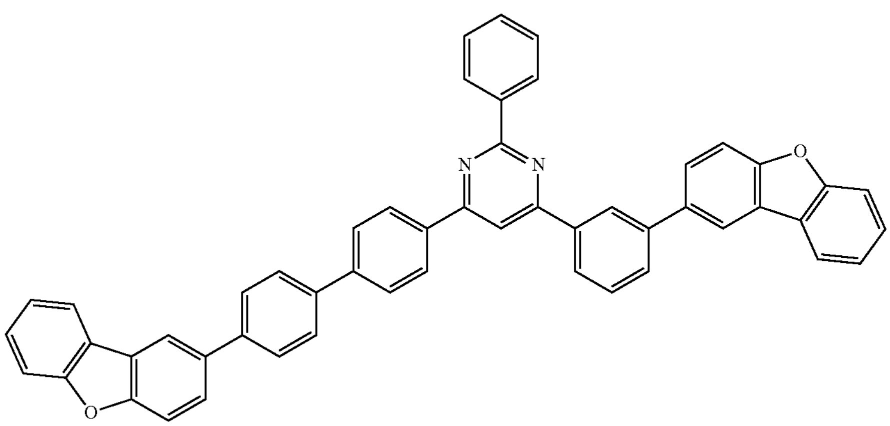
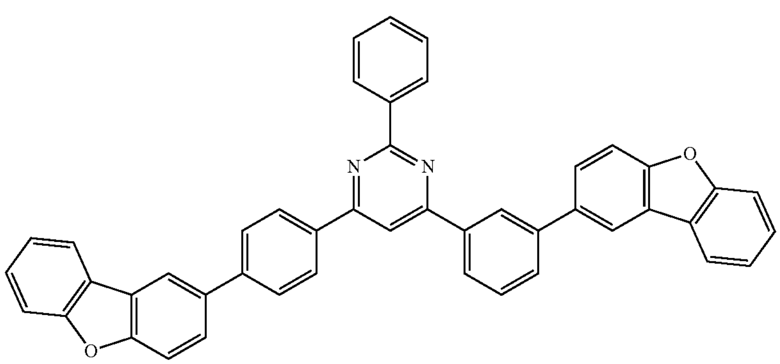

-continued
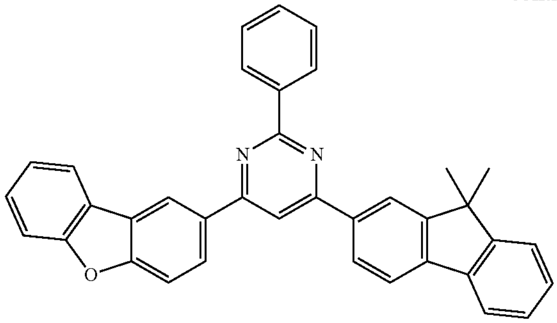
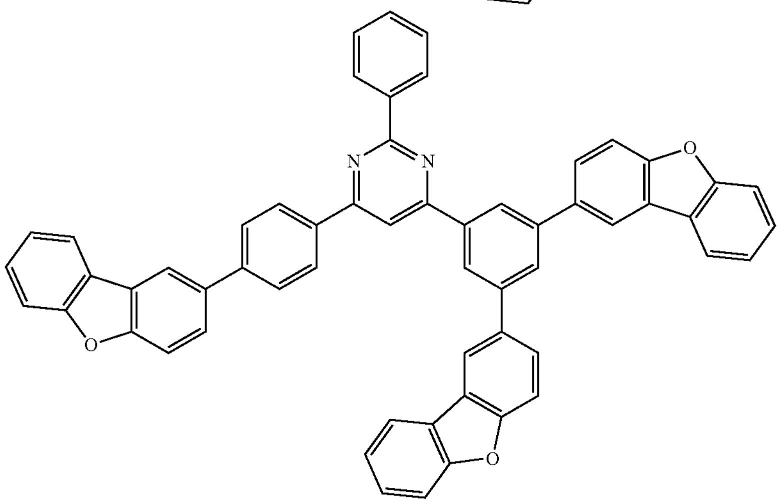
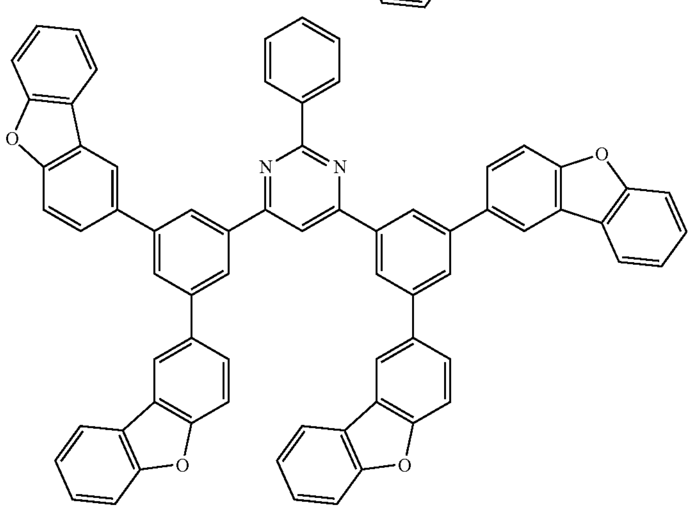
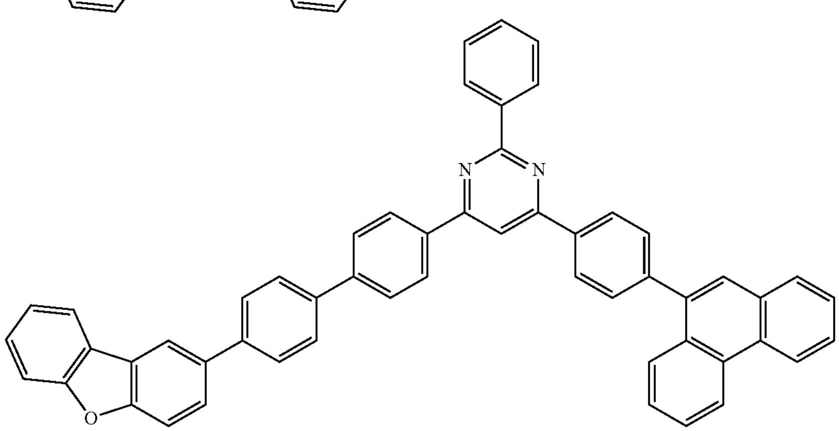

-continued
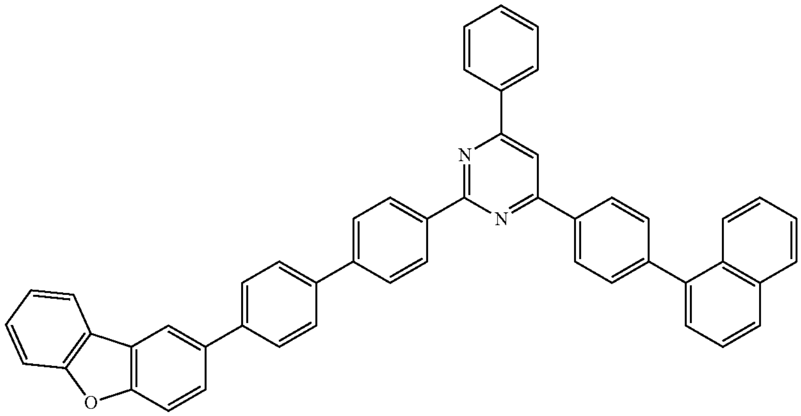
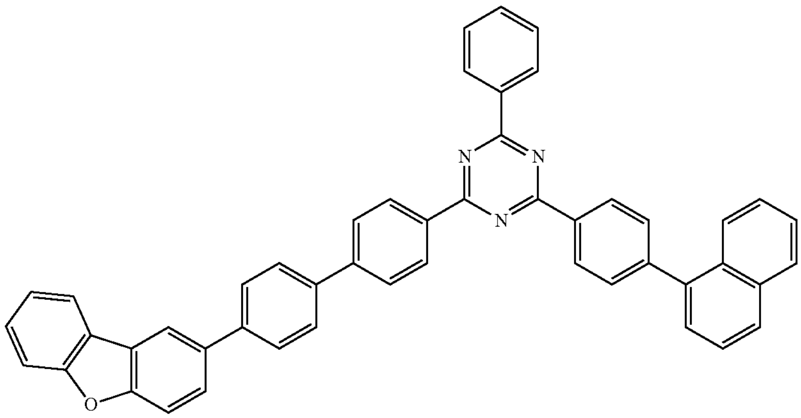
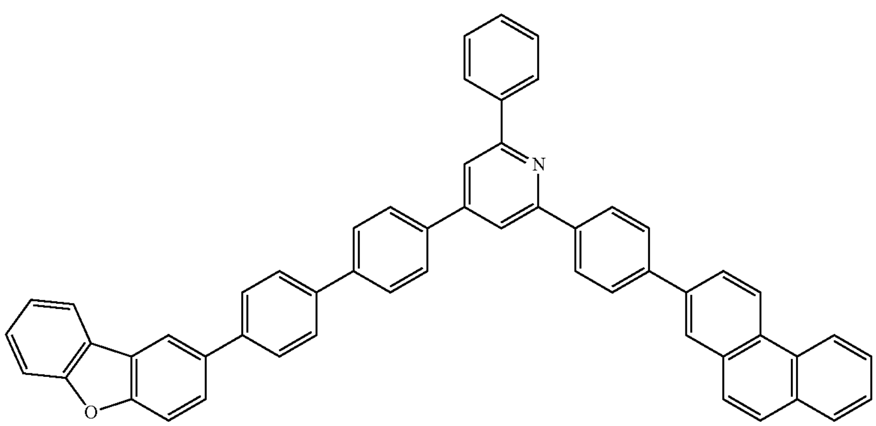
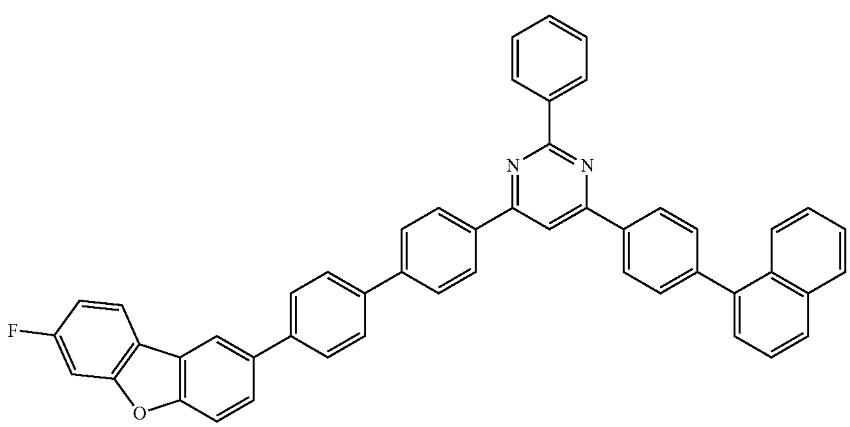

-continued
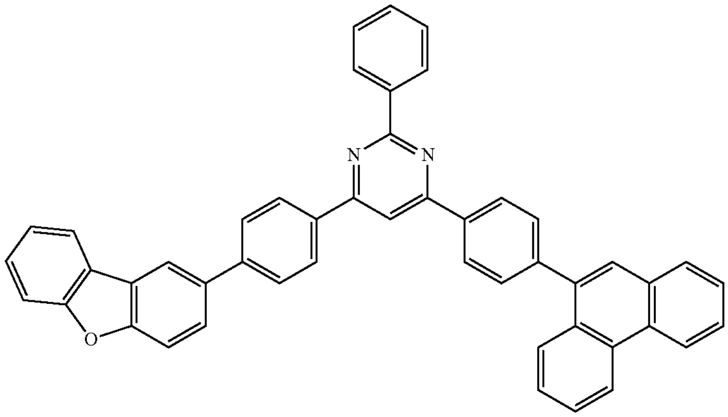
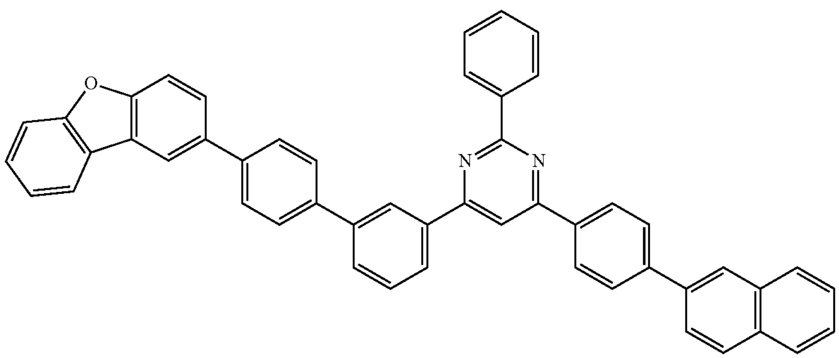
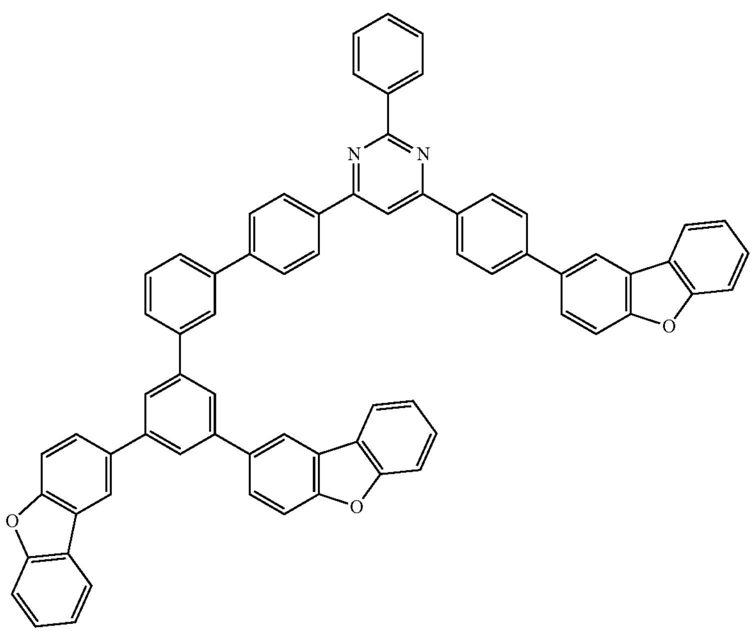

-continued
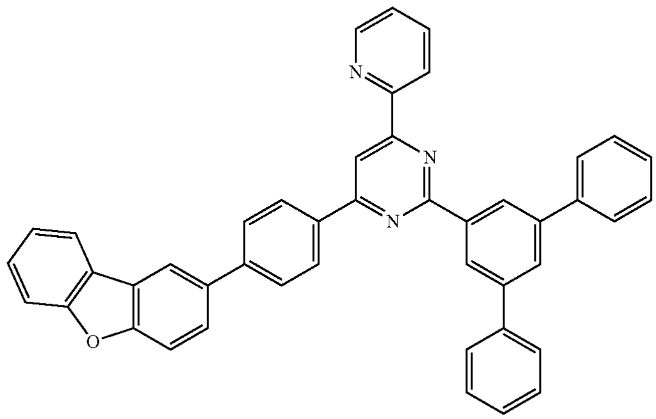
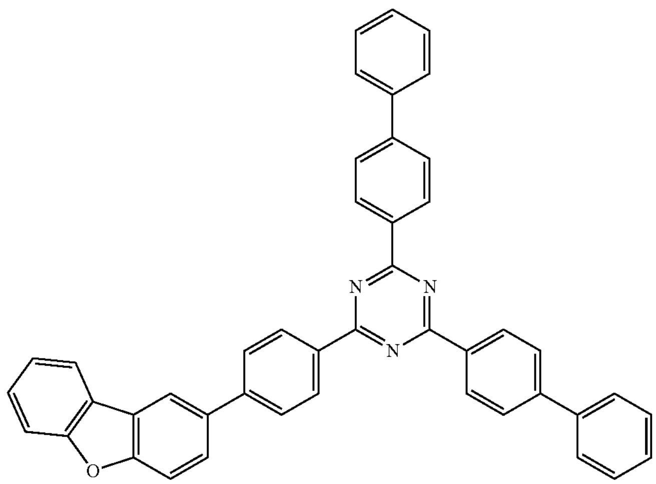
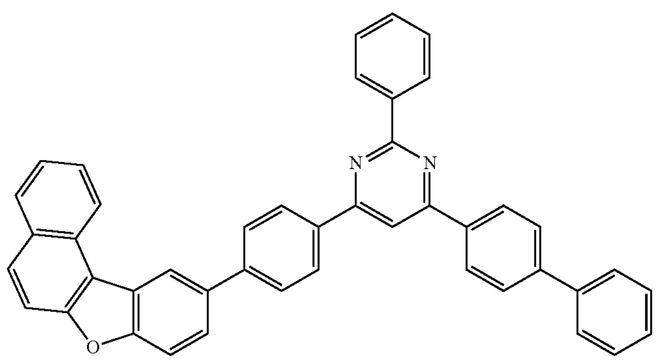
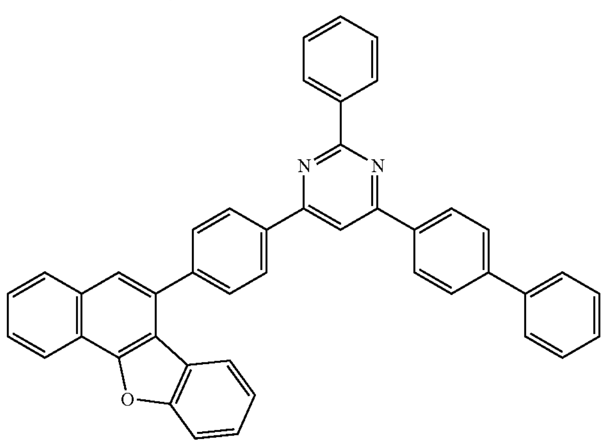

-continued
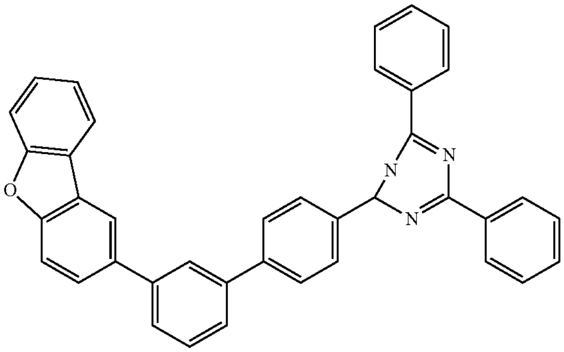
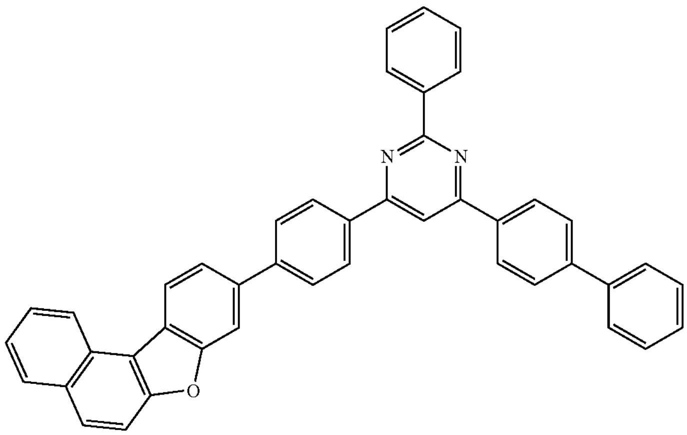
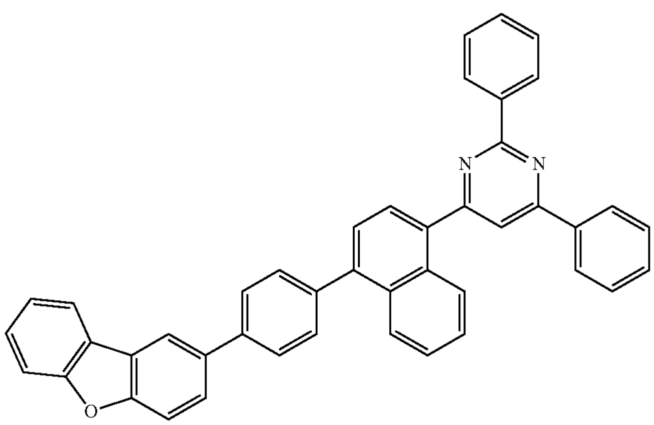
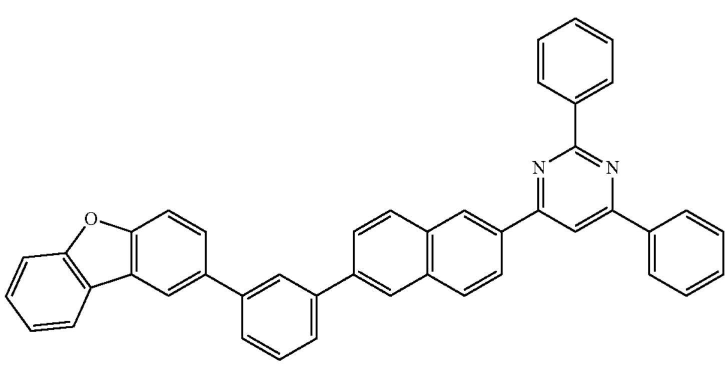

-continued
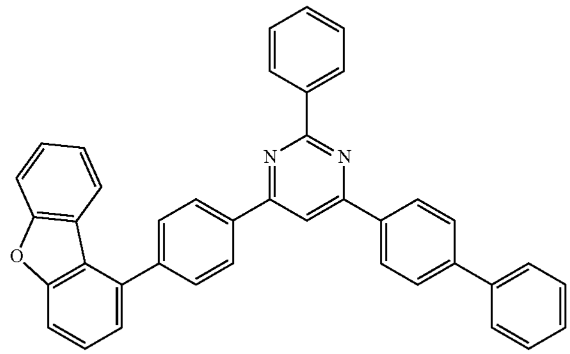
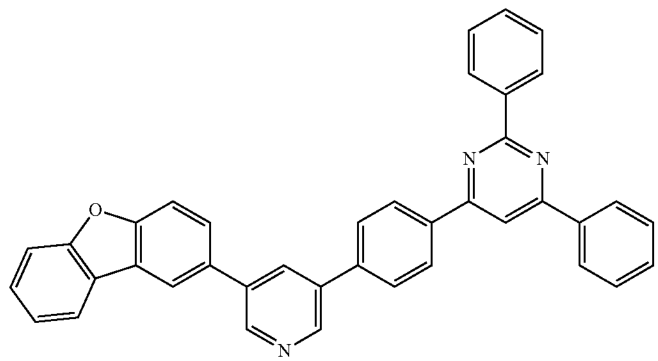
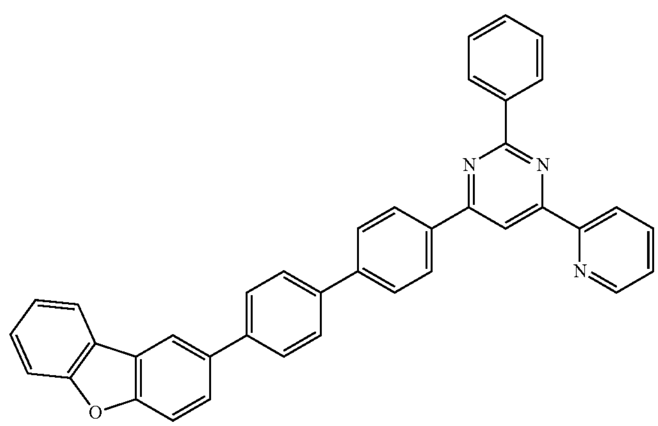
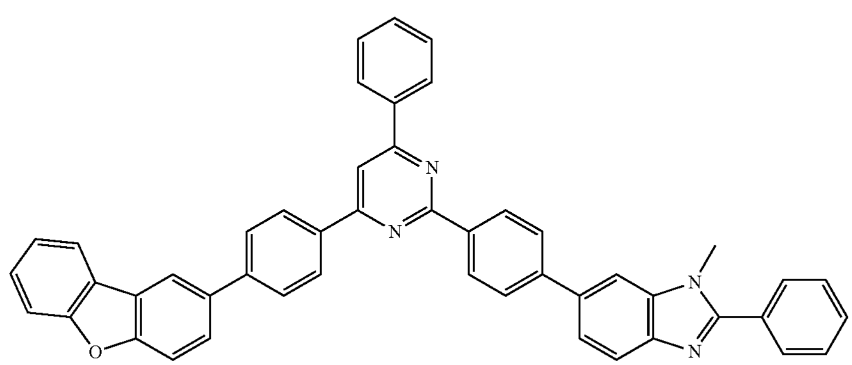

-continued
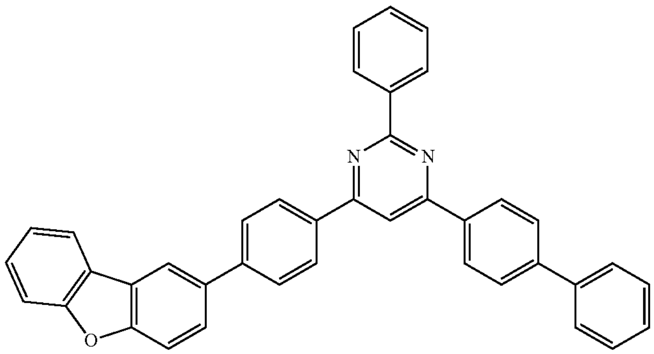
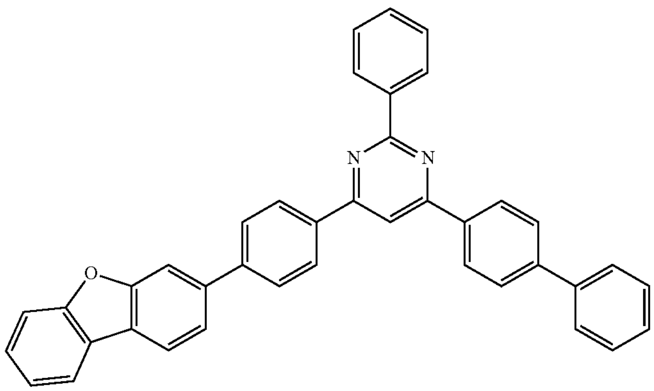
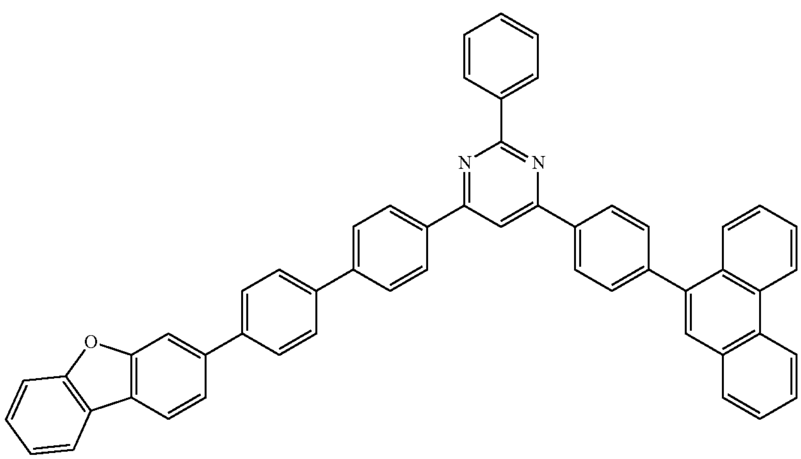
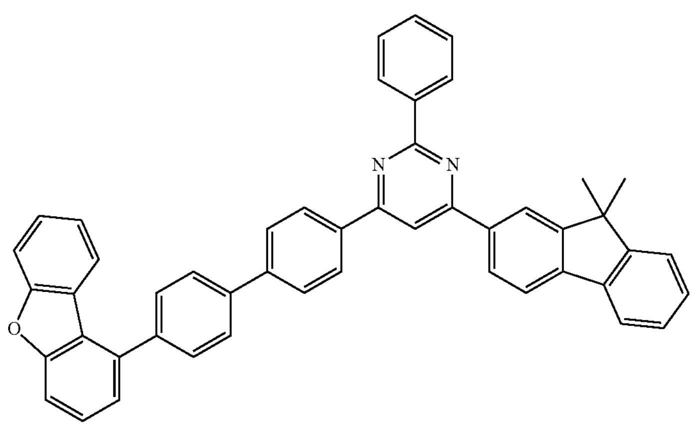

-continued
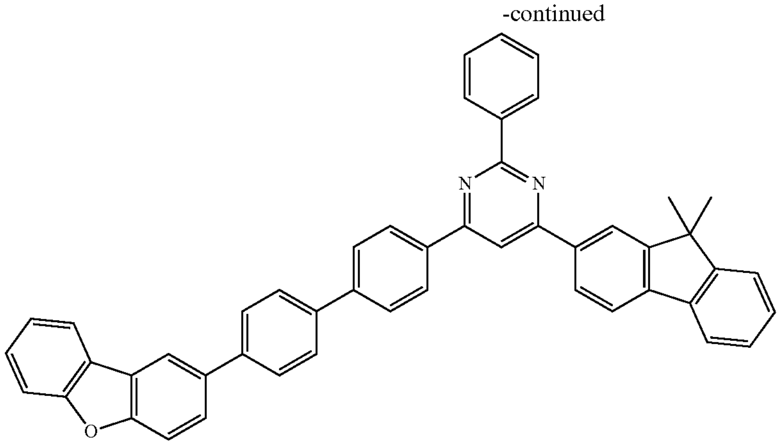
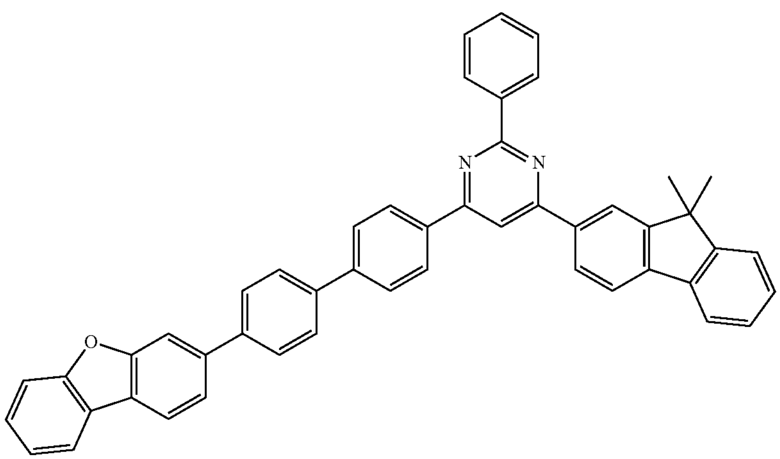
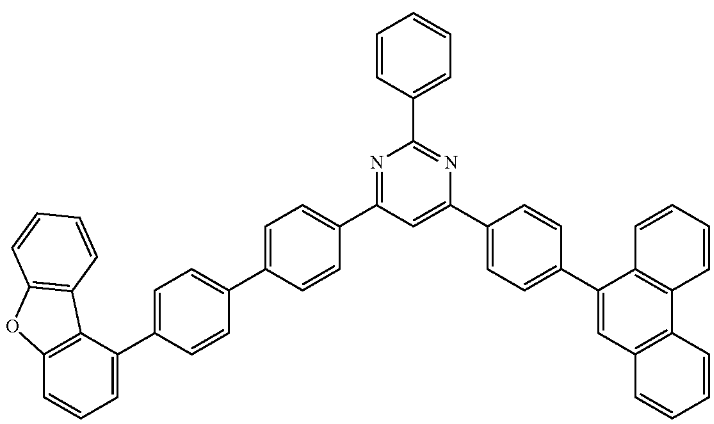
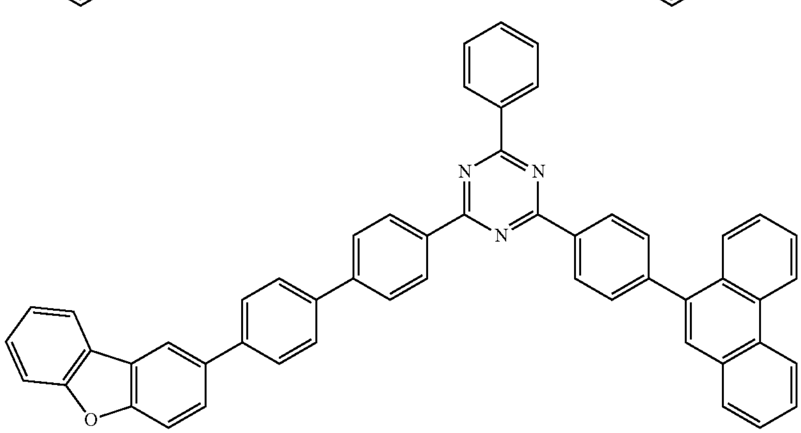

-continued
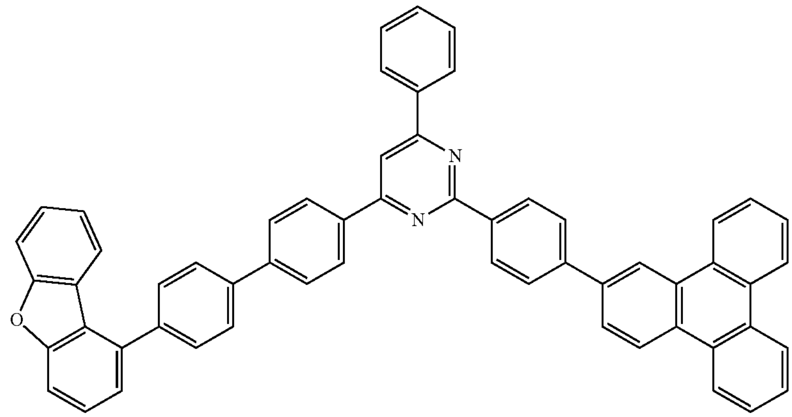
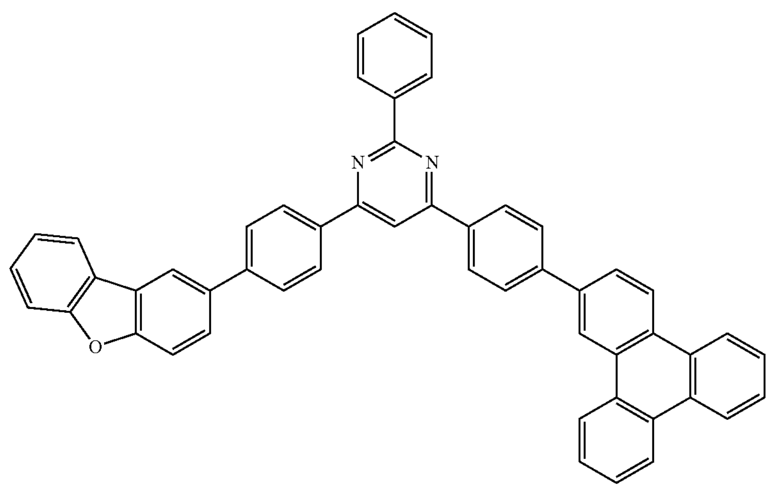
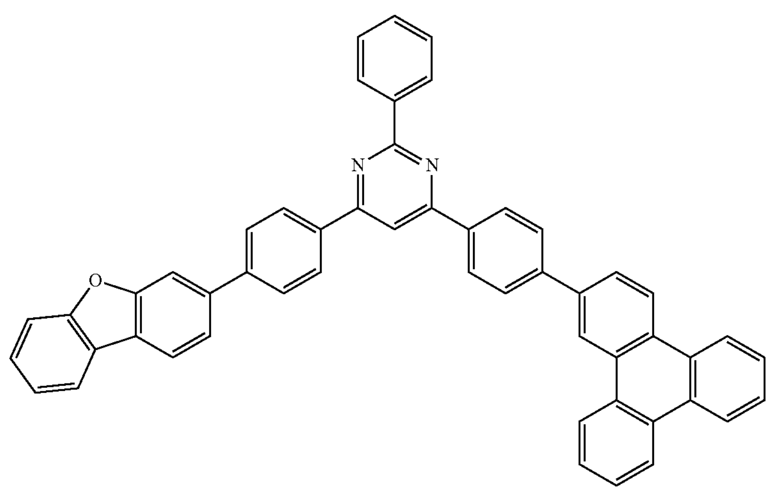

-continued
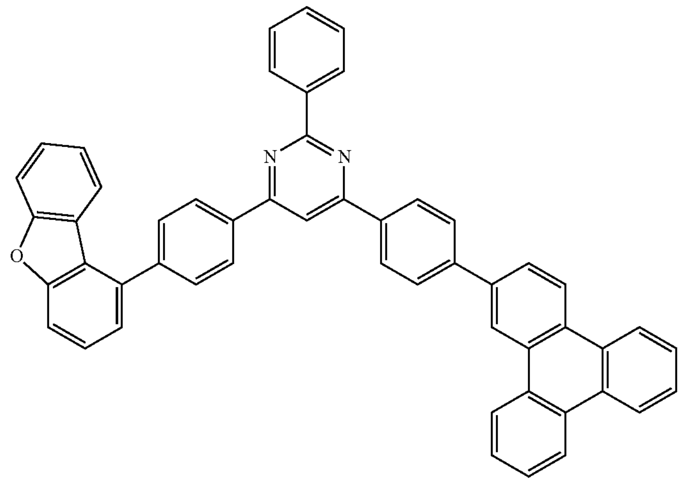
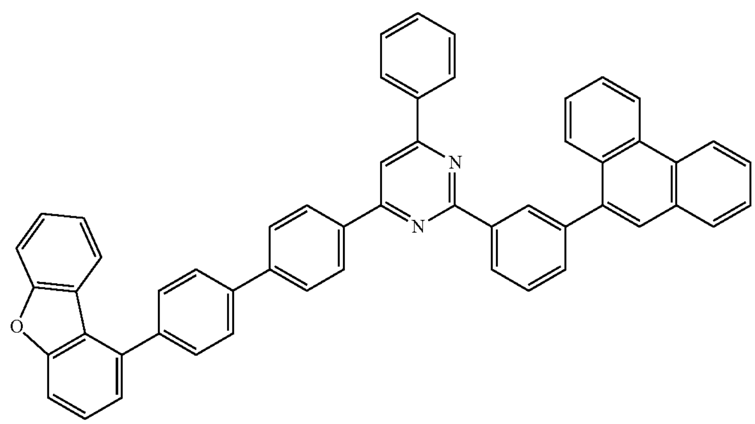
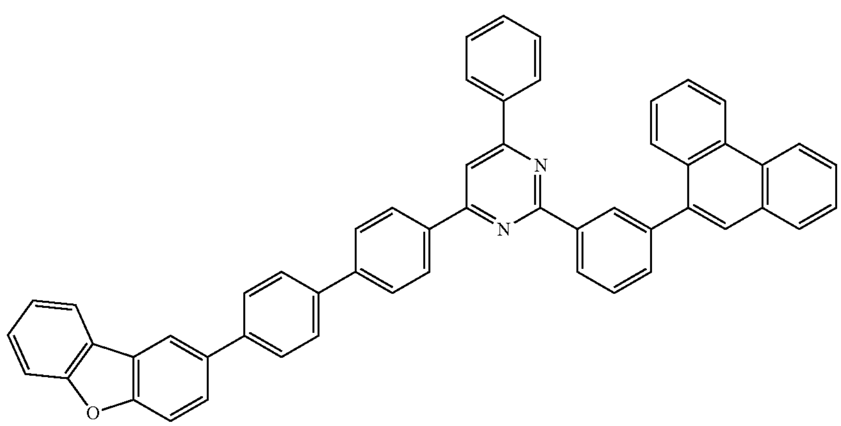

-continued
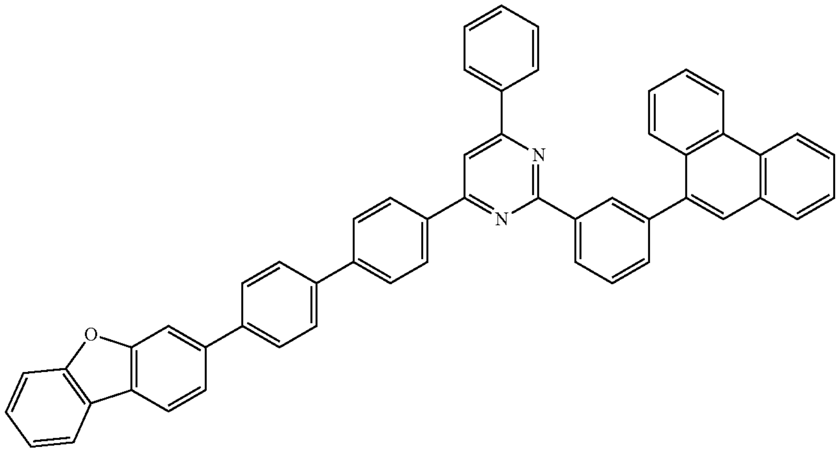
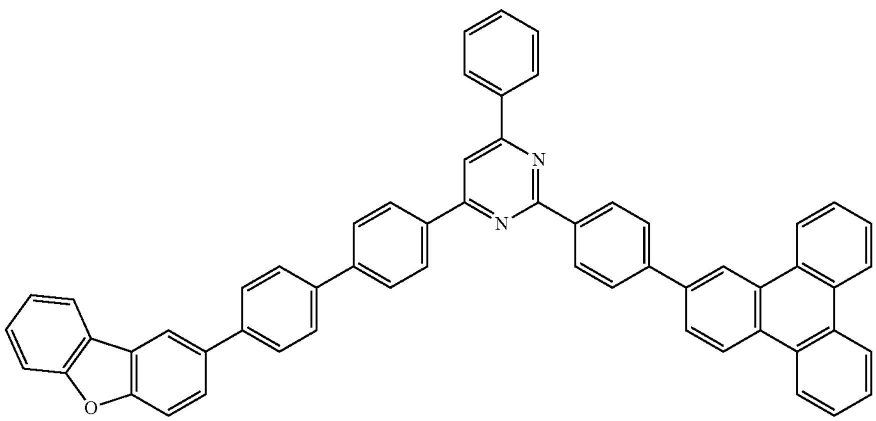
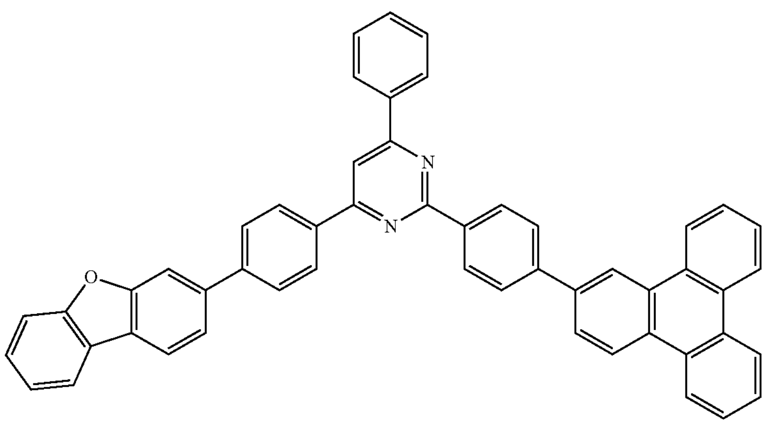
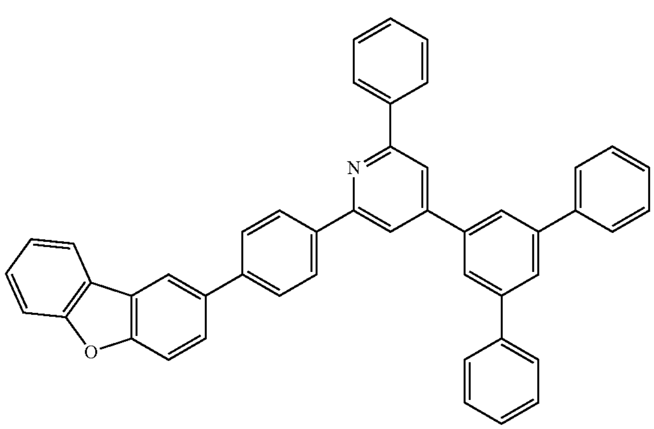

-continued
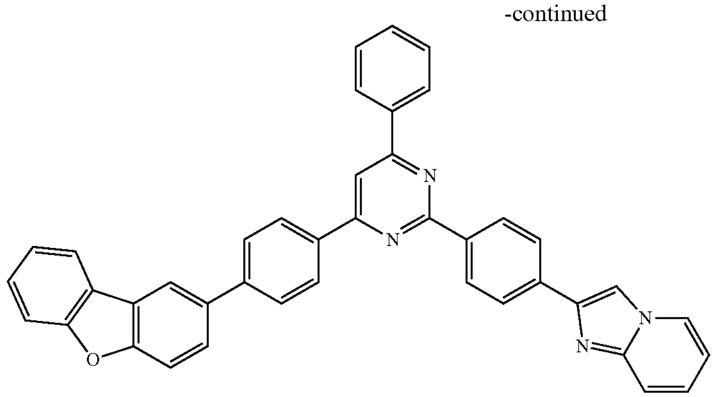
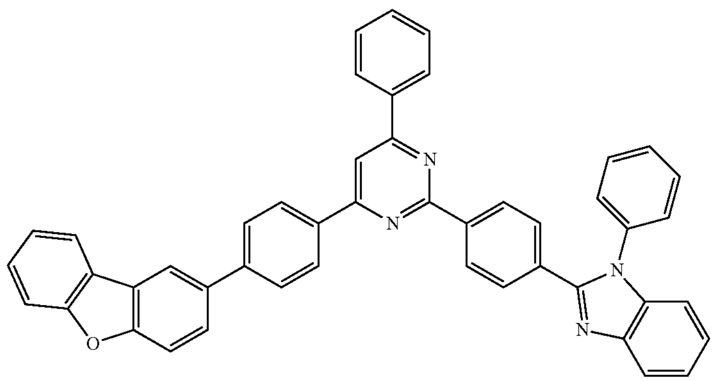
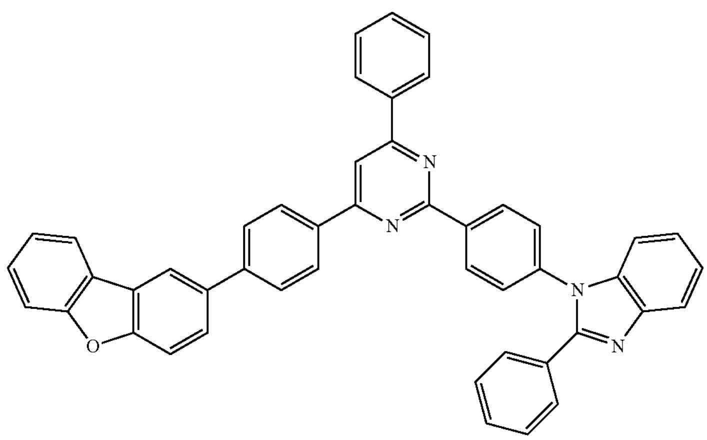
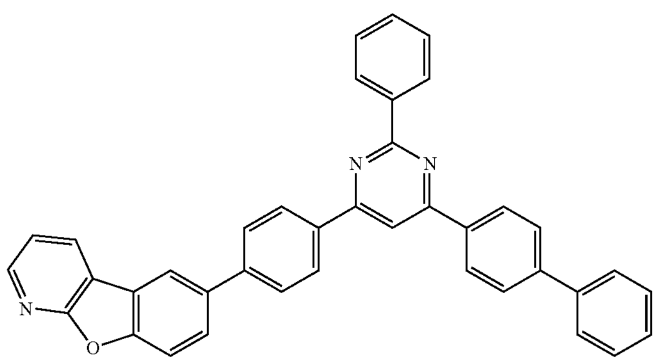

-continued
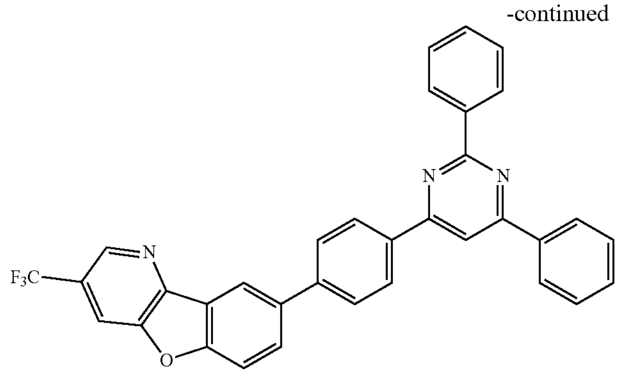
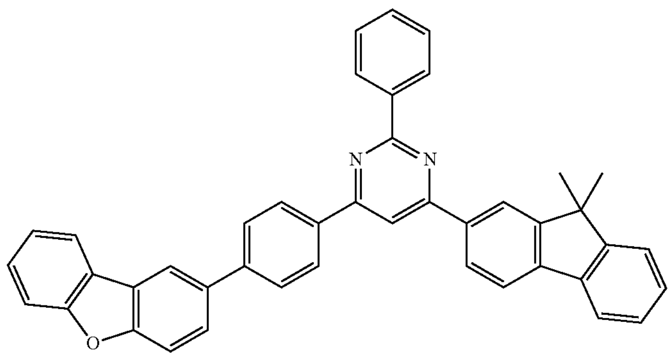
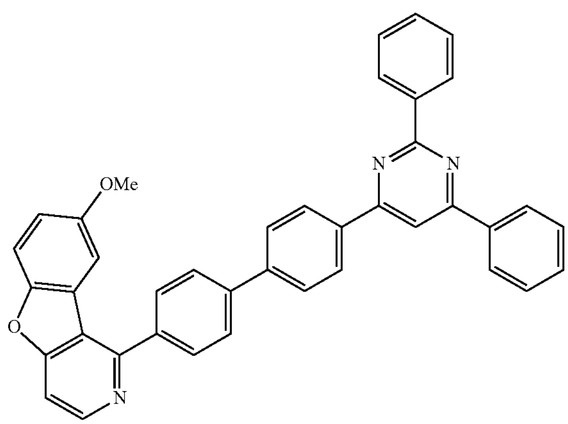
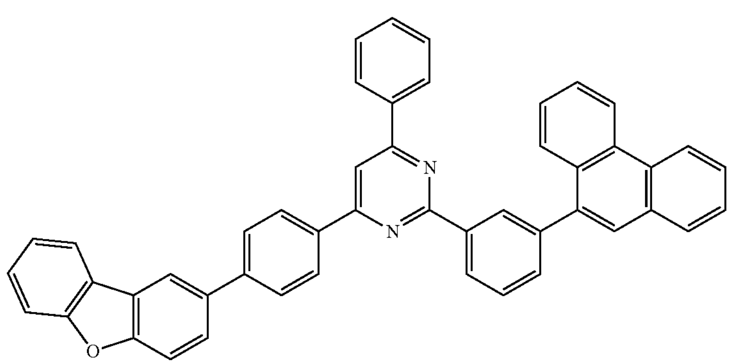

-continued
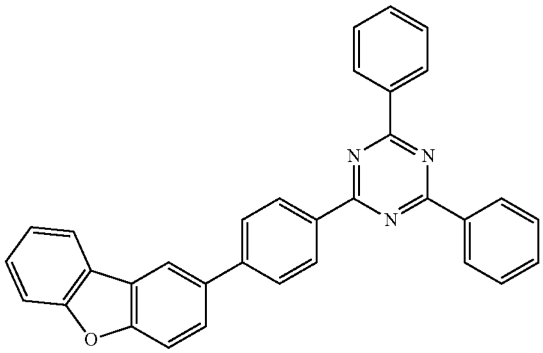
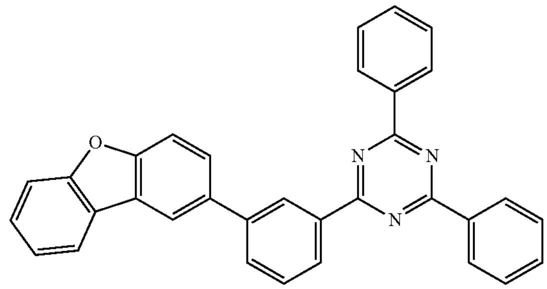
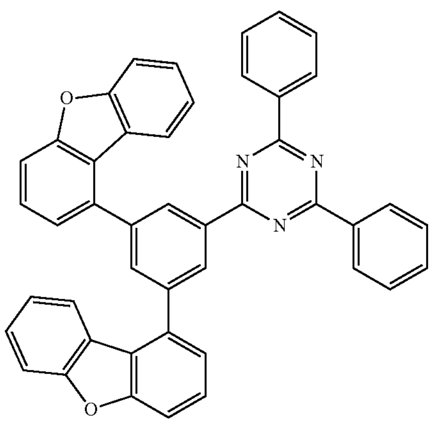
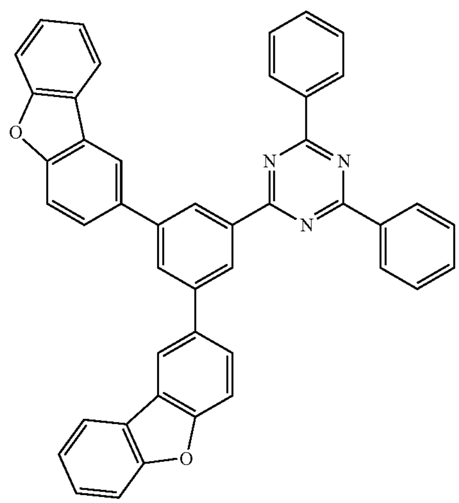
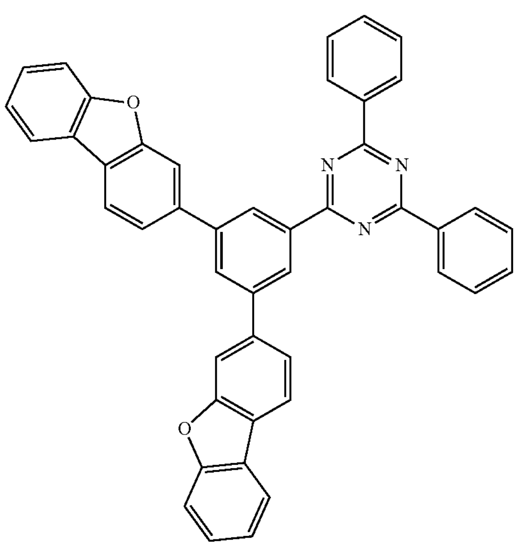

-continued
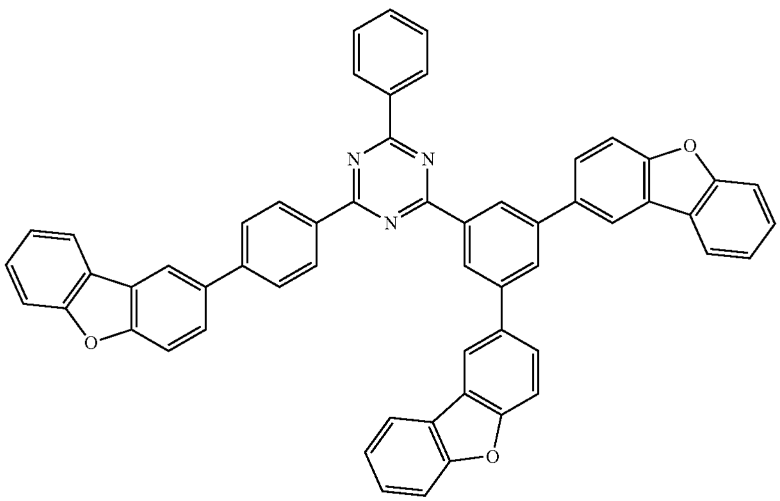 [SMILES: c1ccc(-c2nc(-c3ccc(-c4ccc5oc6ccccc6c5c4)cc3)cc(-c3cc(-c4ccc5oc6ccccc6c5c4)cc(-c4ccc5oc6ccccc6c5c4)c3)n2)cc1]
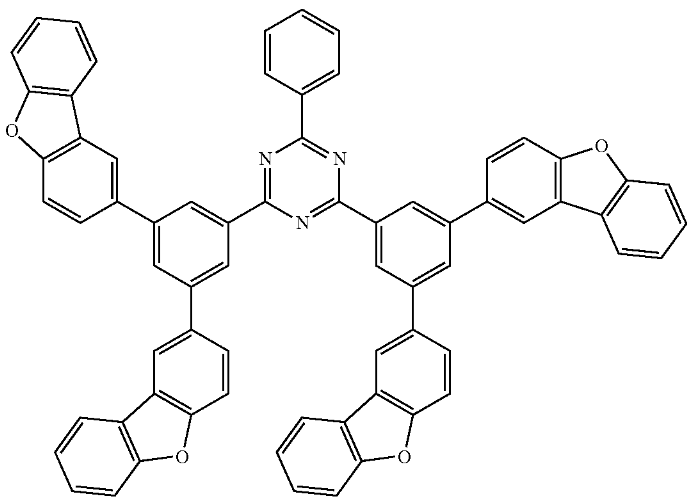
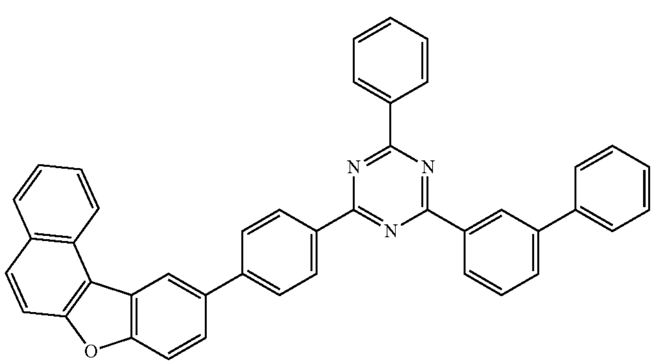

-continued
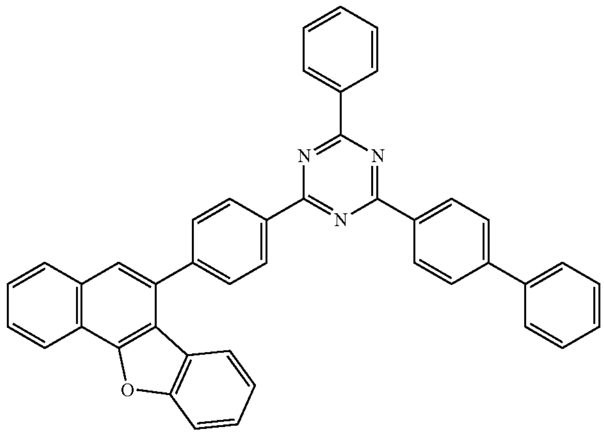
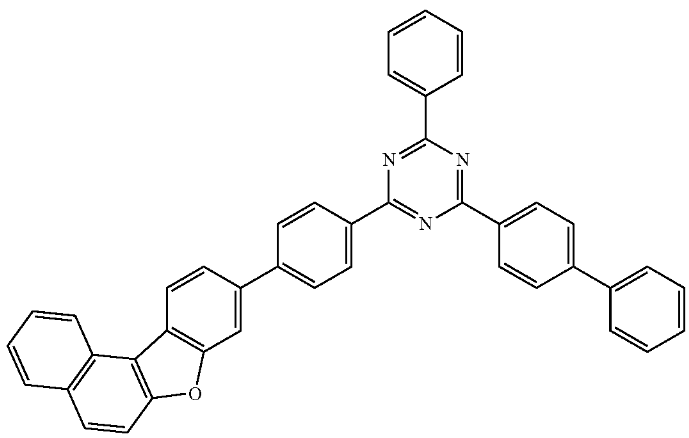
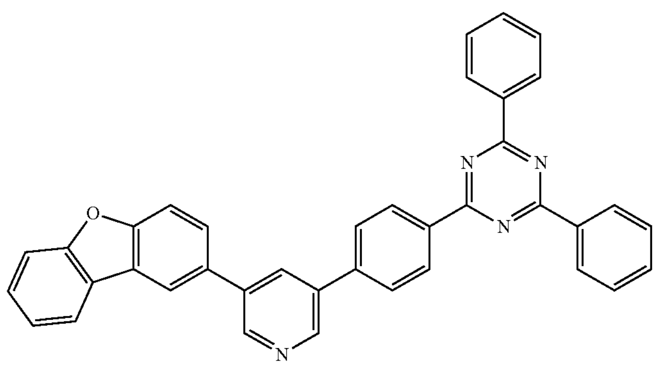
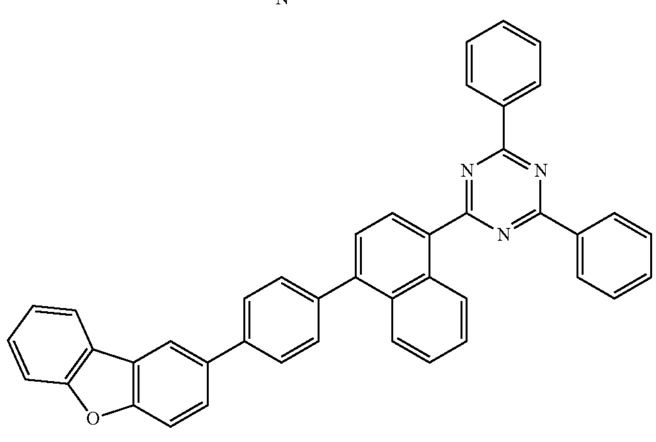

-continued
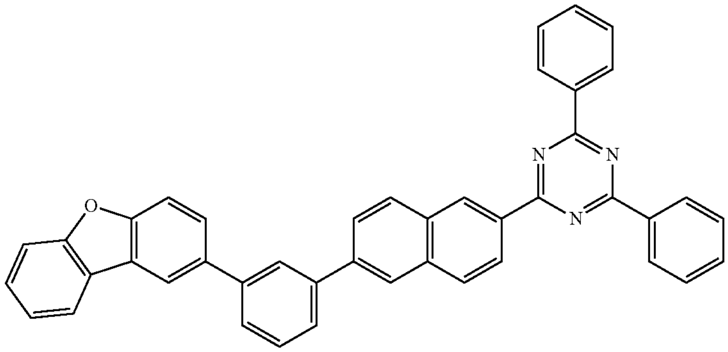
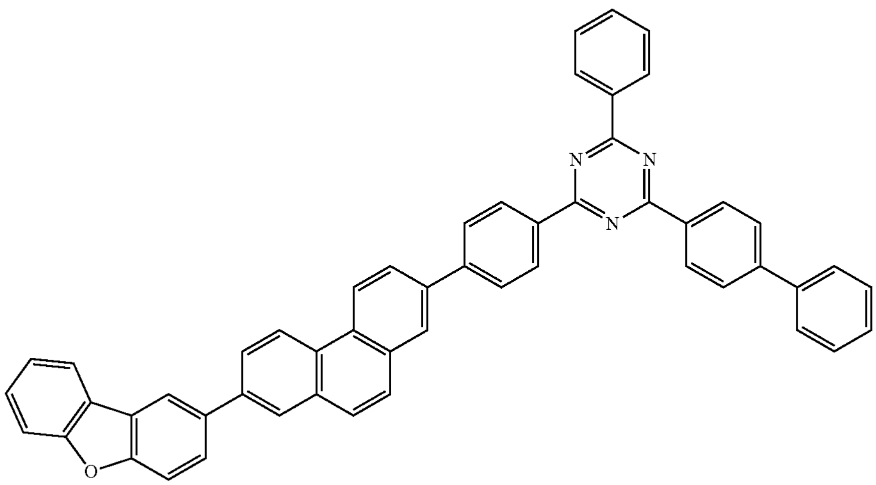
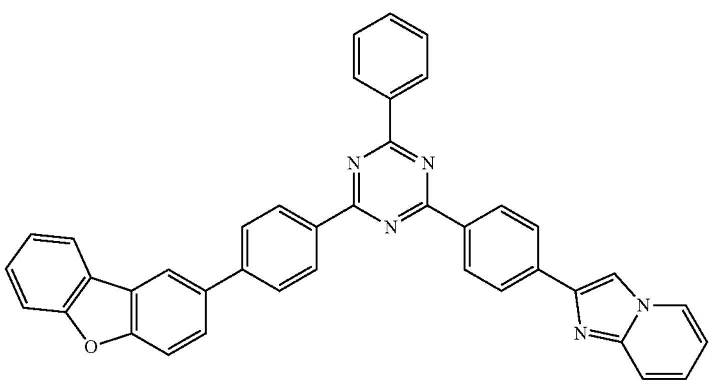
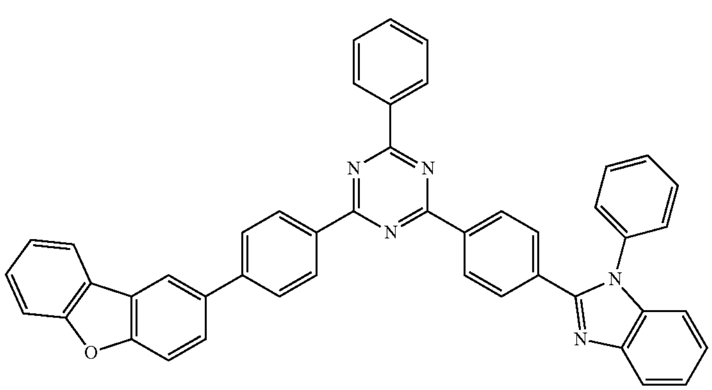

-continued
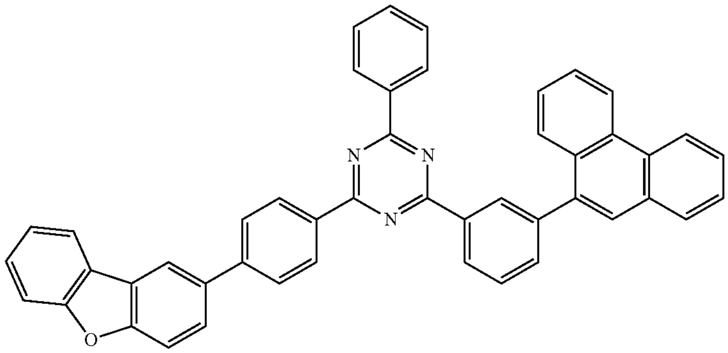
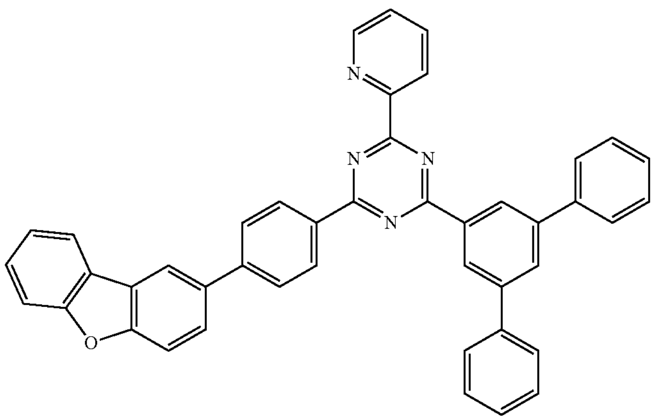
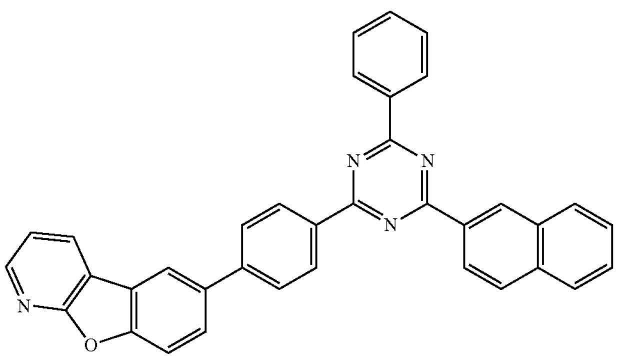
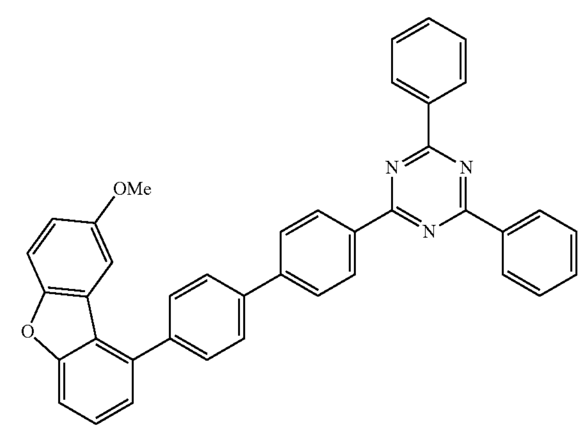

-continued
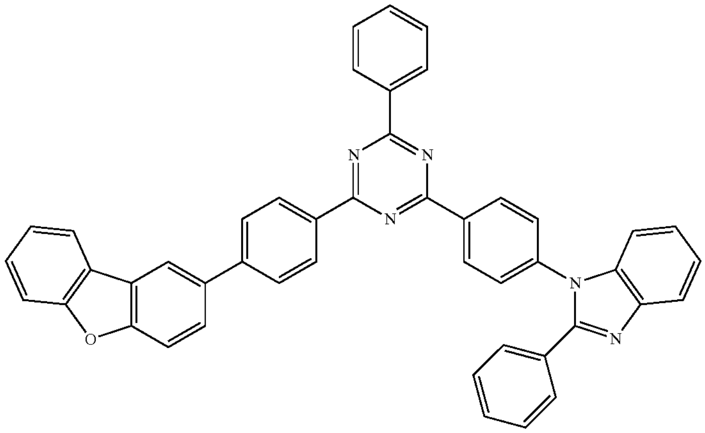
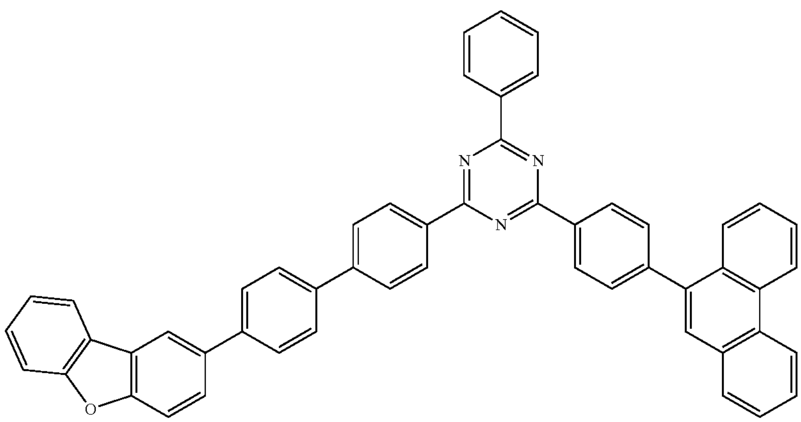
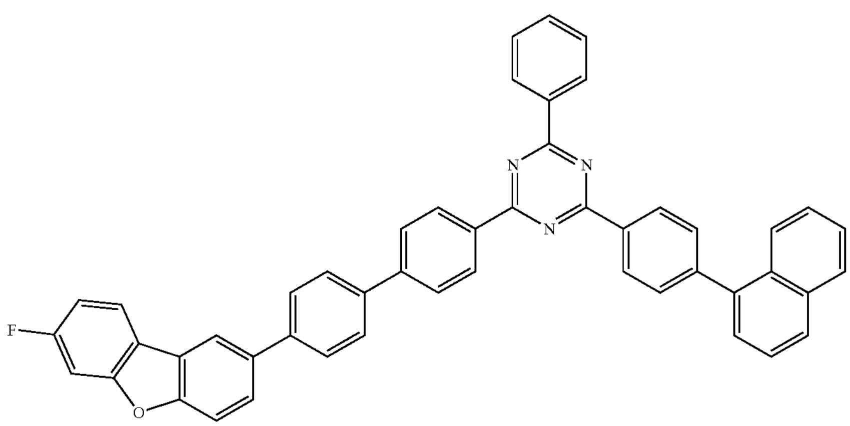

-continued
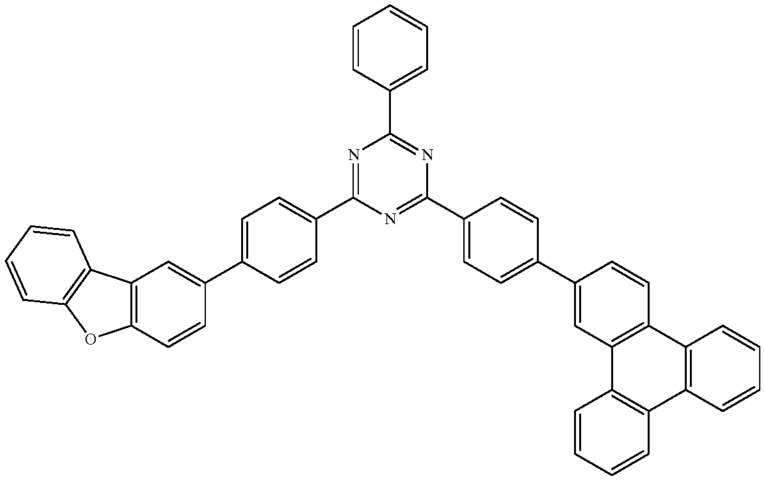
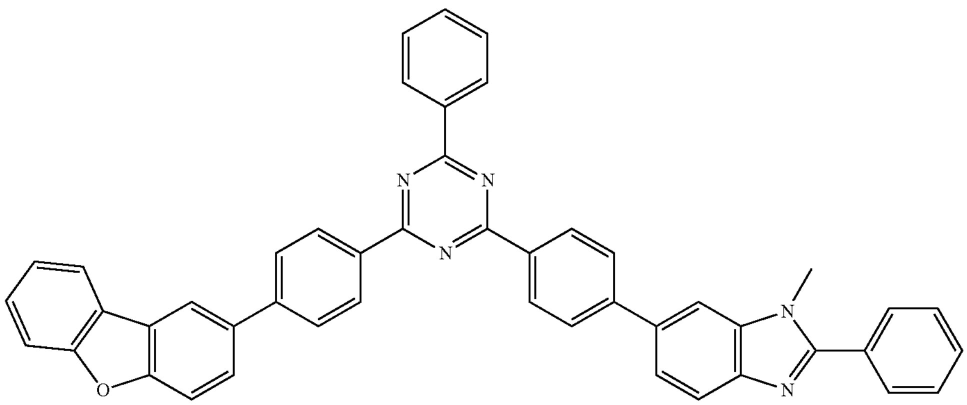 [SMILES: Cn1c(-c2ccccc2)nc2ccc(-c3ccc(-c4nc(-c5ccccc5)nc(-c5ccc(-c6ccc7oc8ccccc8c7c6)cc5)n4)cc3)cc21]
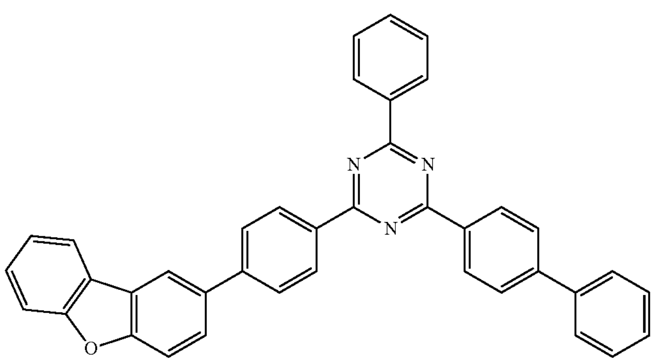
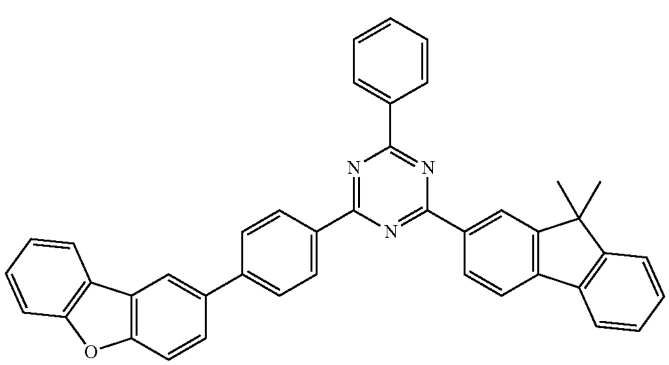

-continued
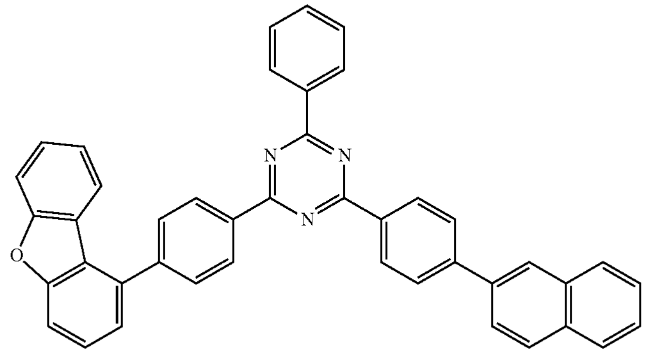
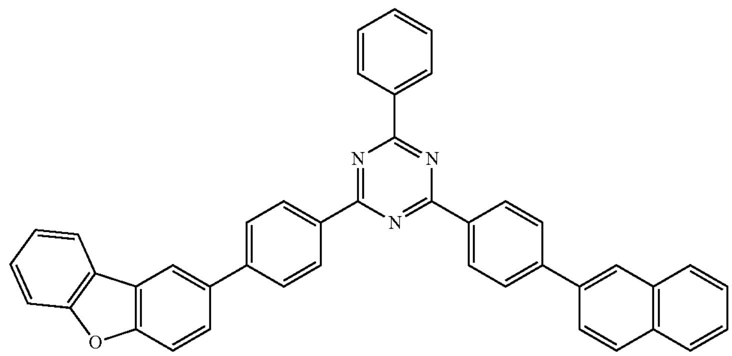
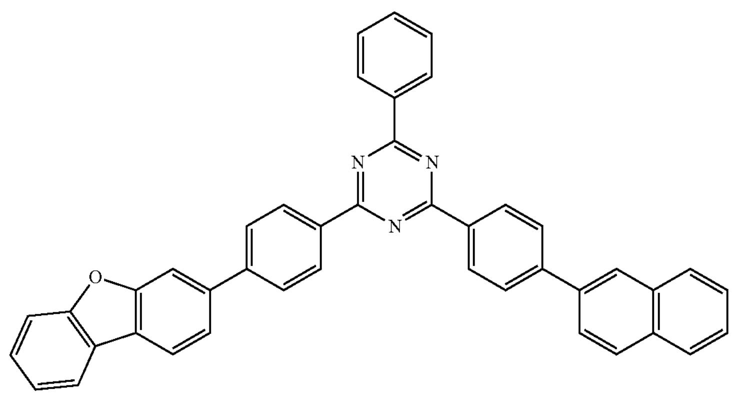
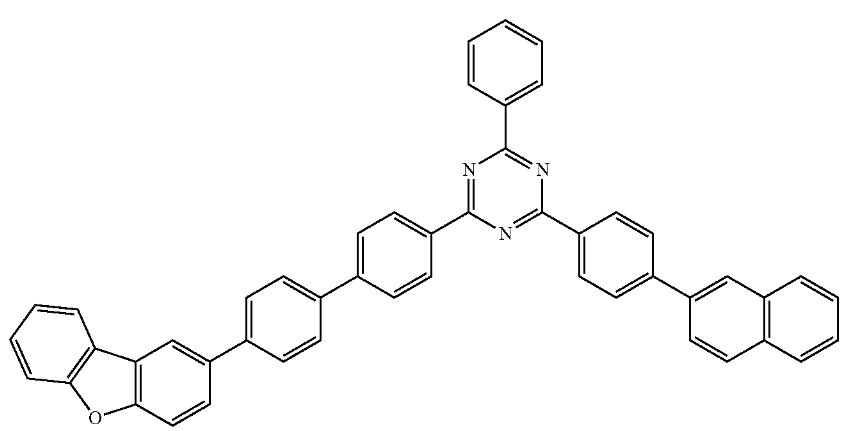

-continued
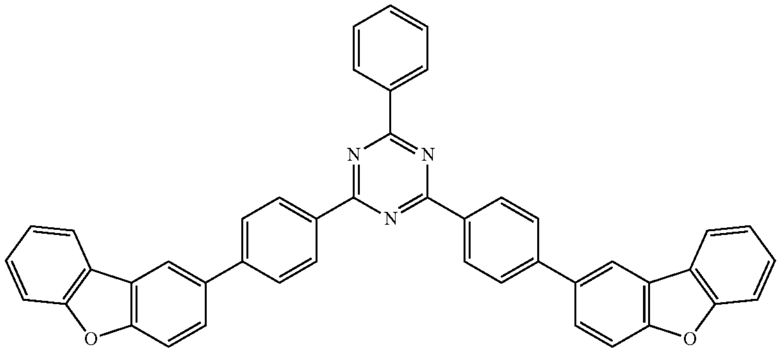
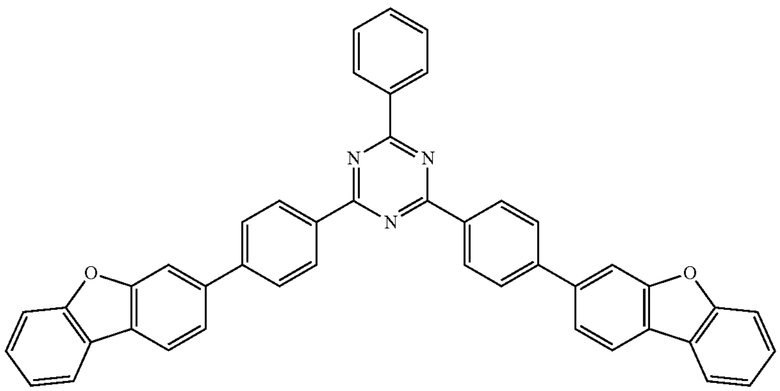
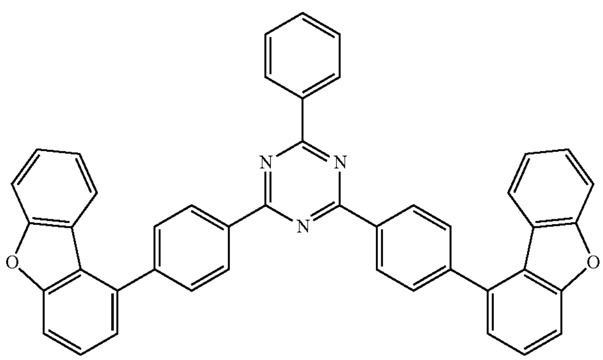
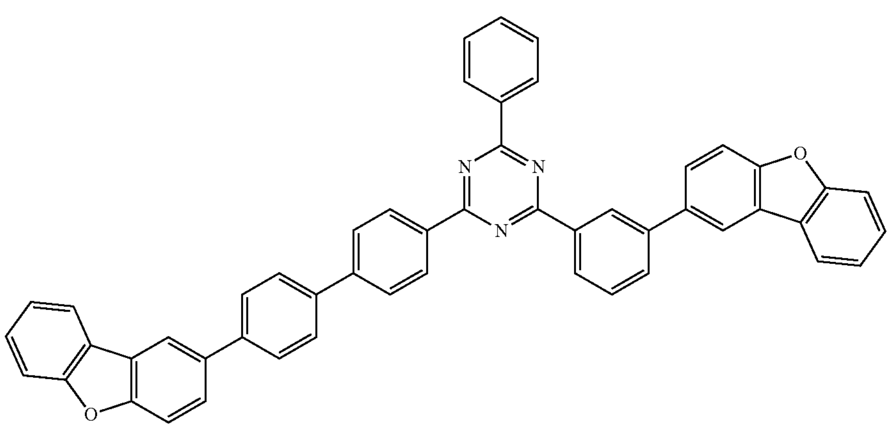

-continued
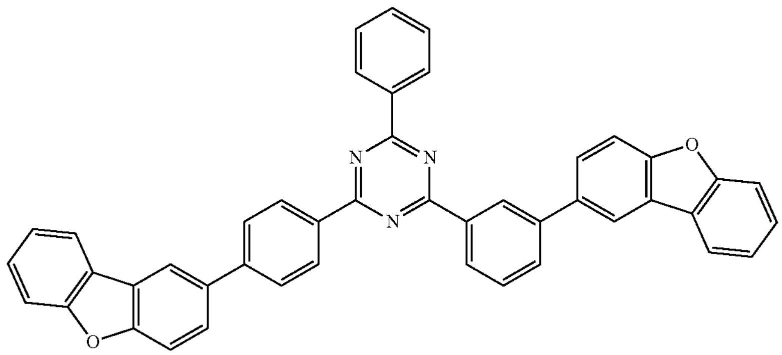
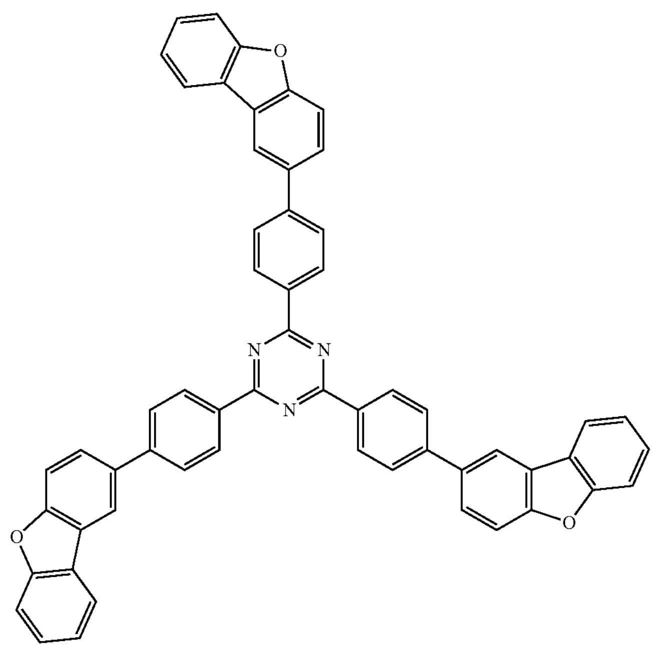
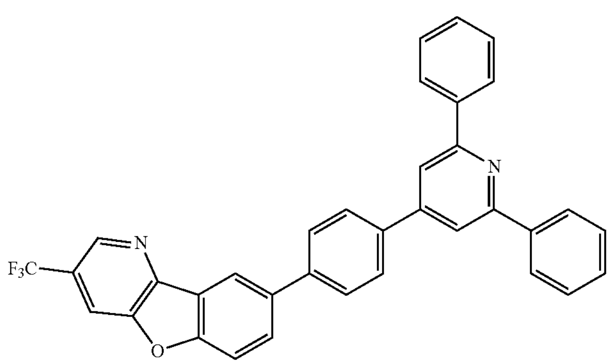
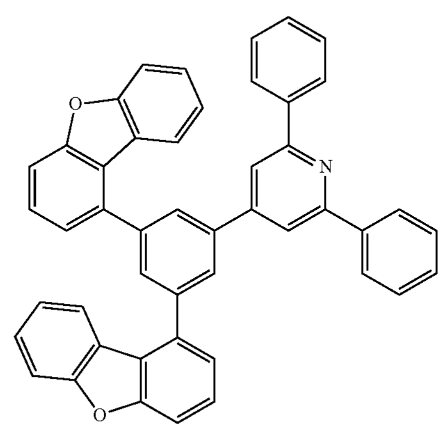

-continued
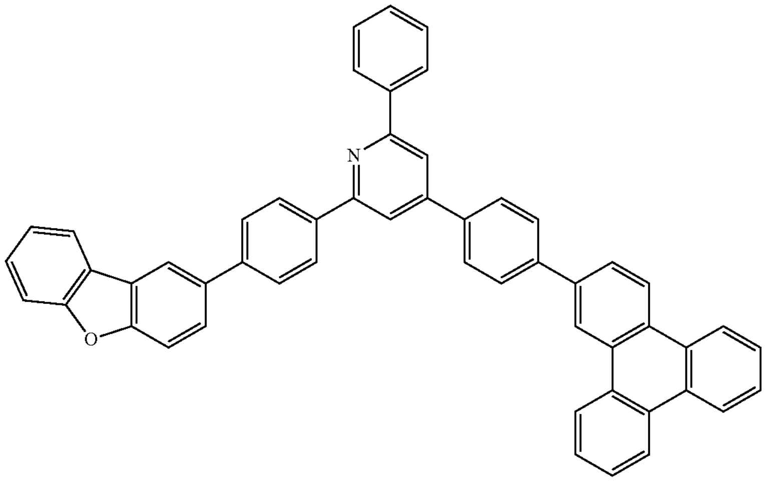
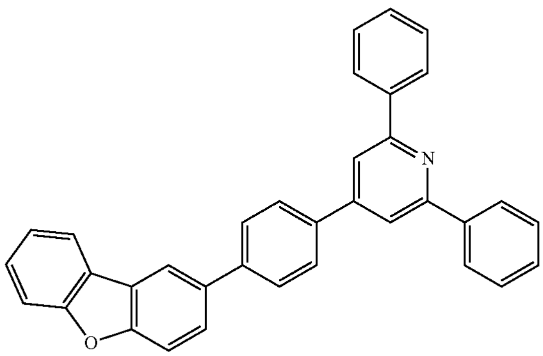
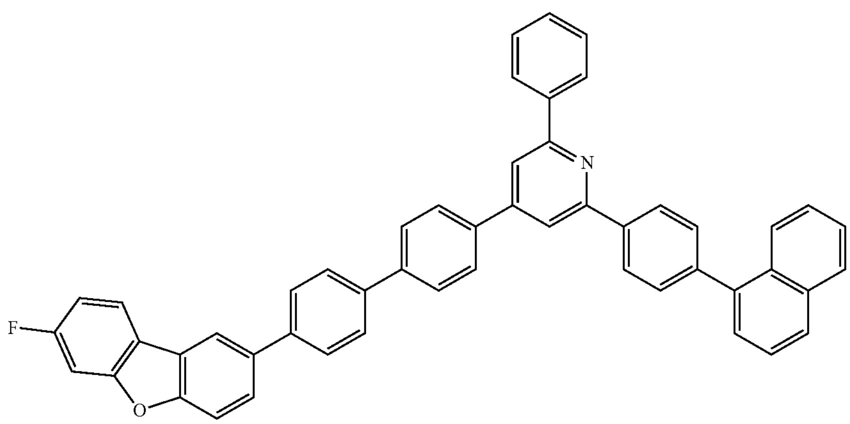
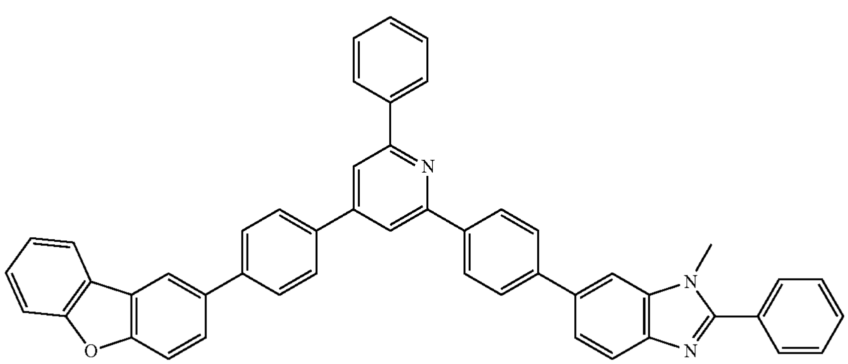

-continued
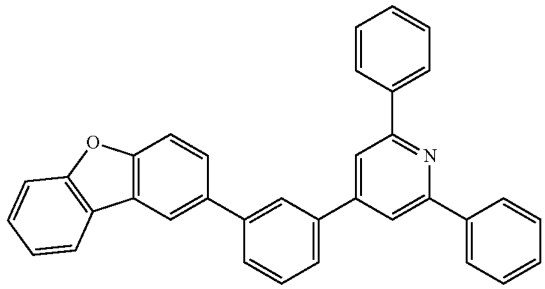
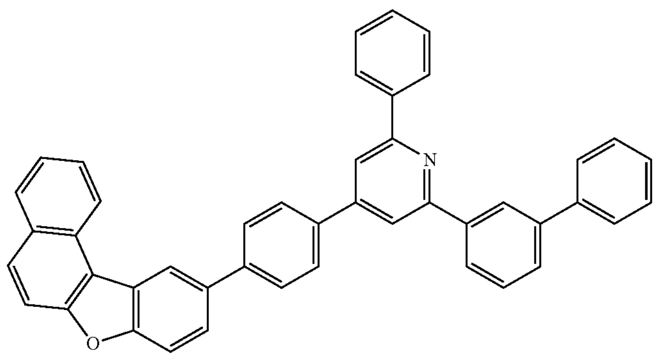
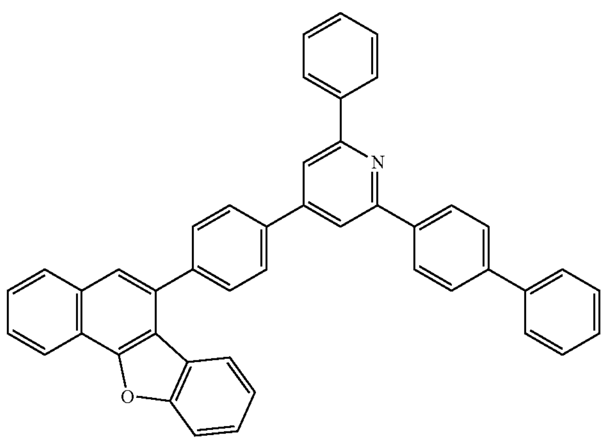
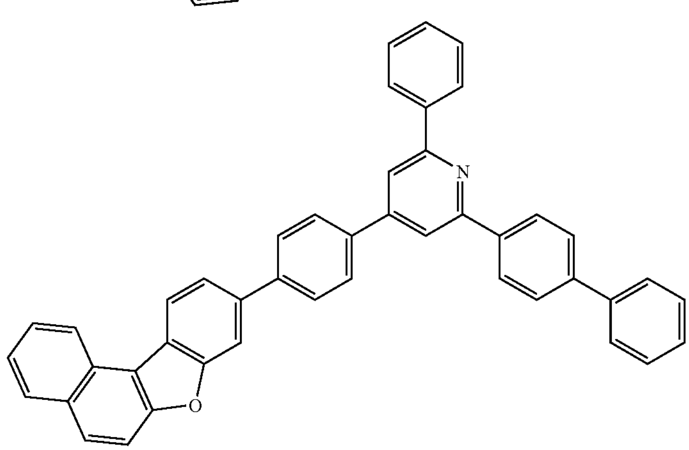

-continued
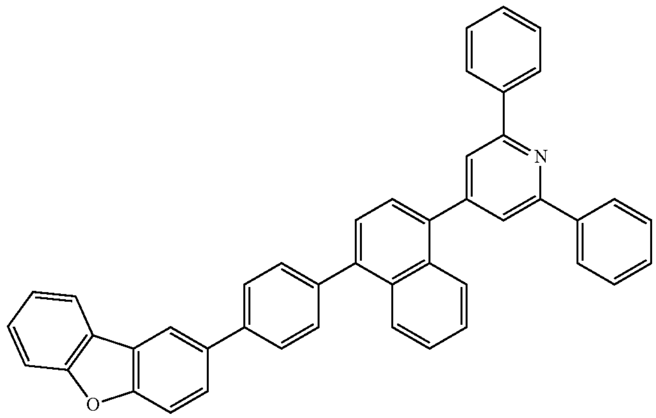
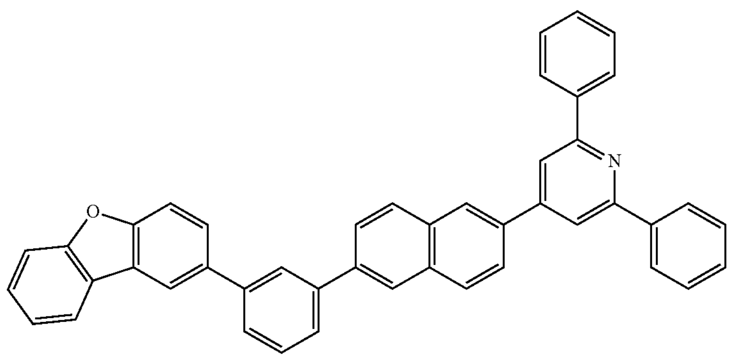
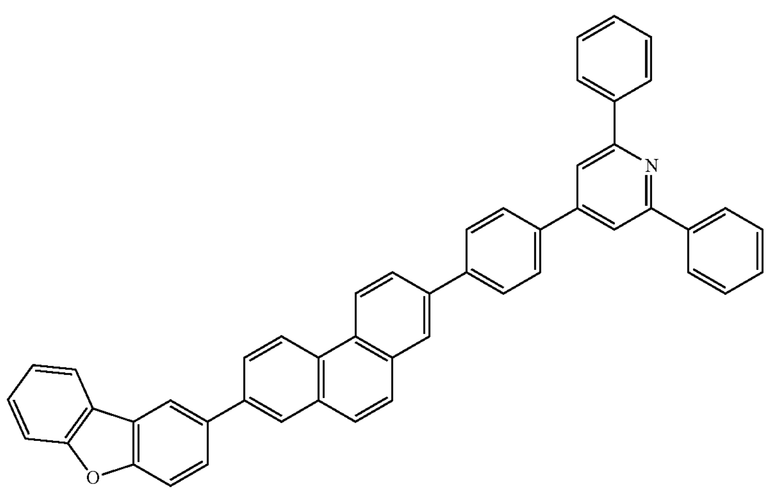 [SMILES: c1ccc(-c2cc(-c3ccc(-c4ccc5c(ccc6cc(-c7ccc8oc9ccccc9c8c7)ccc65)c4)cc3)cc(-c3ccccc3)n2)cc1]

-continued
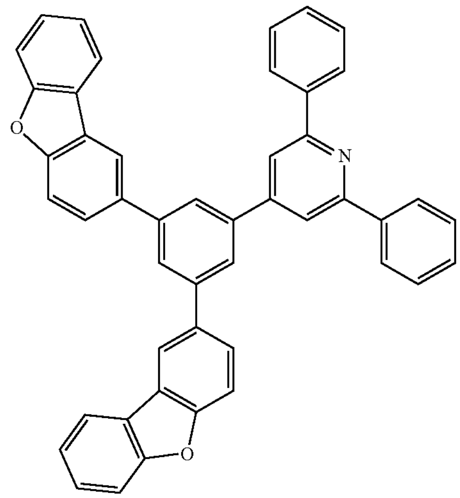
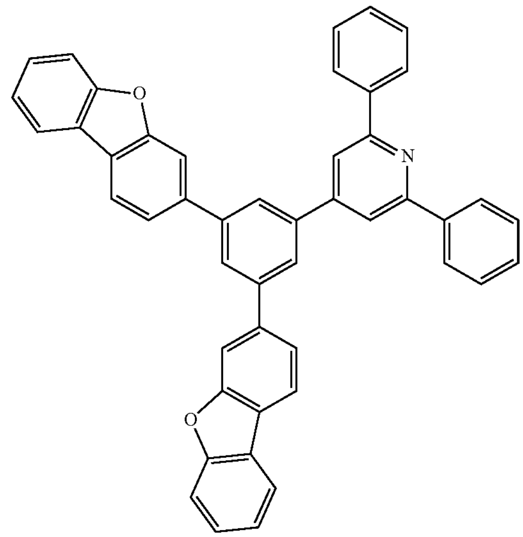
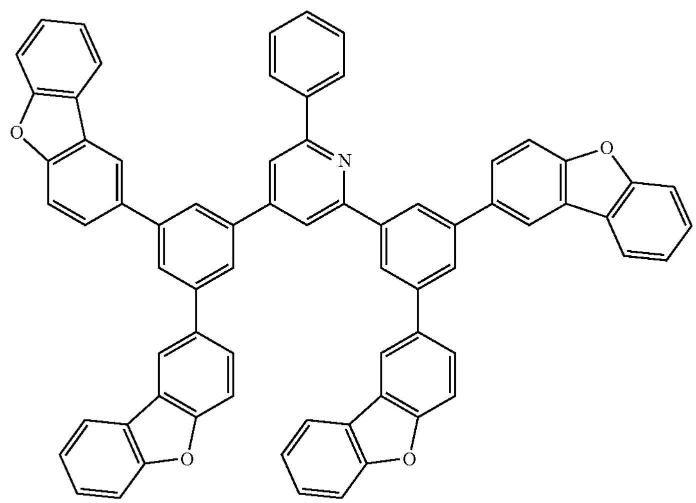
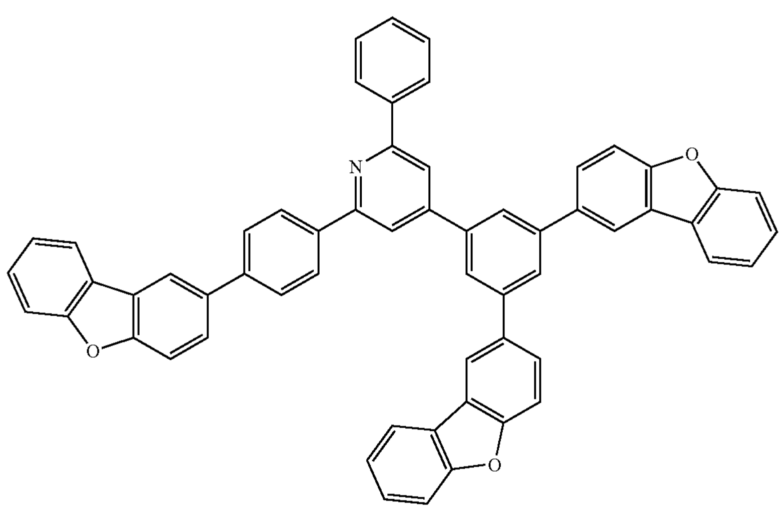 [SMILES: c1ccc(-c2cc(-c3cc(-c4ccc5oc6ccccc6c5c4)cc(-c4ccc5oc6ccccc6c5c4)c3)cc(-c3ccc(-c4ccc5oc6ccccc6c5c4)cc3)n2)cc1]

-continued
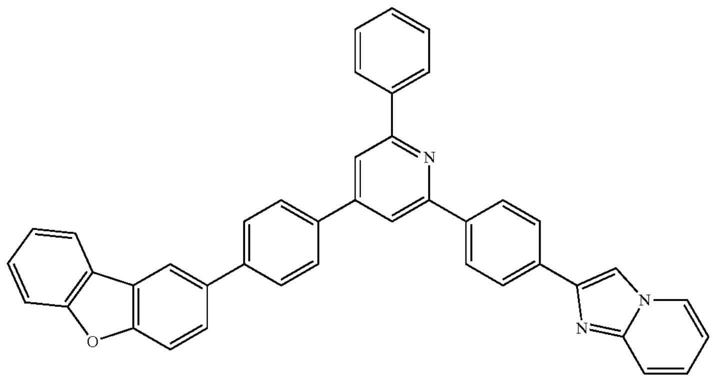
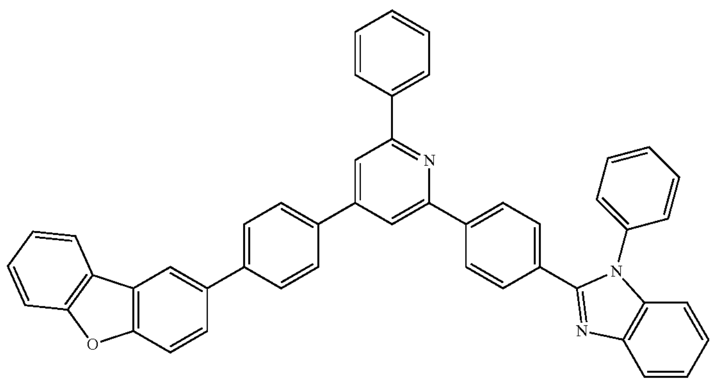
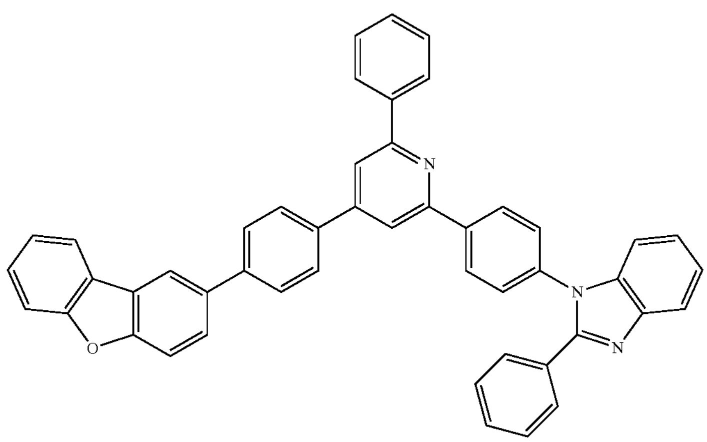
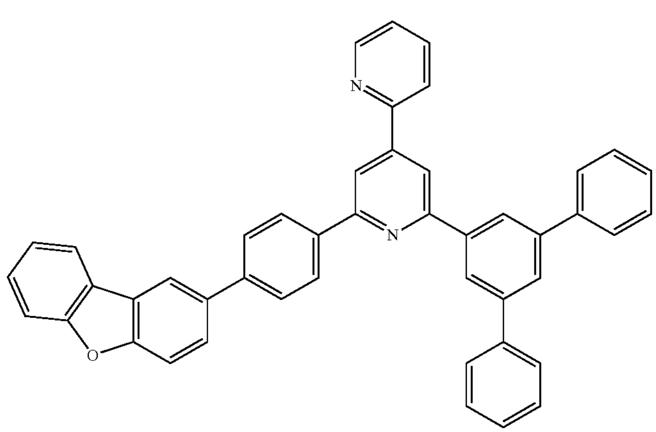

-continued
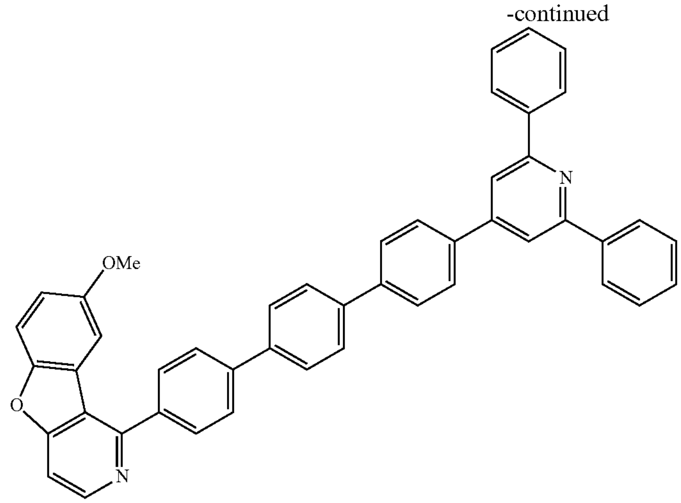
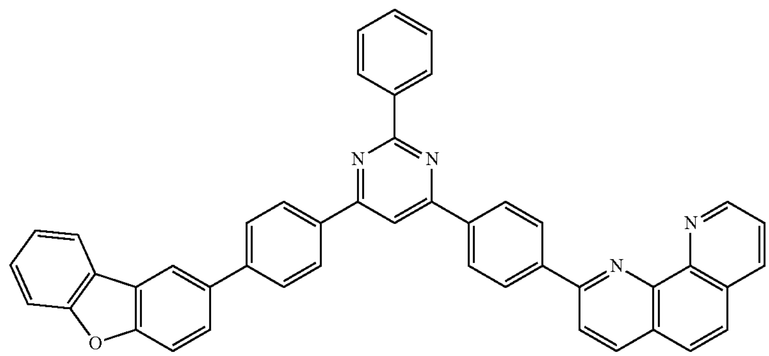
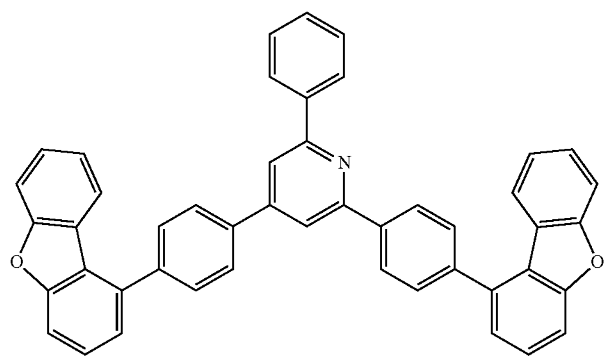
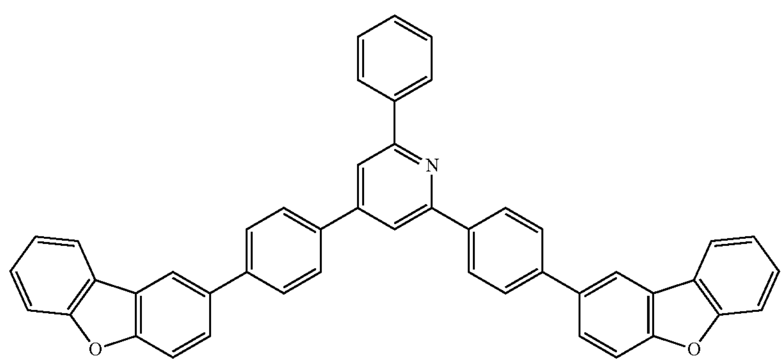

-continued
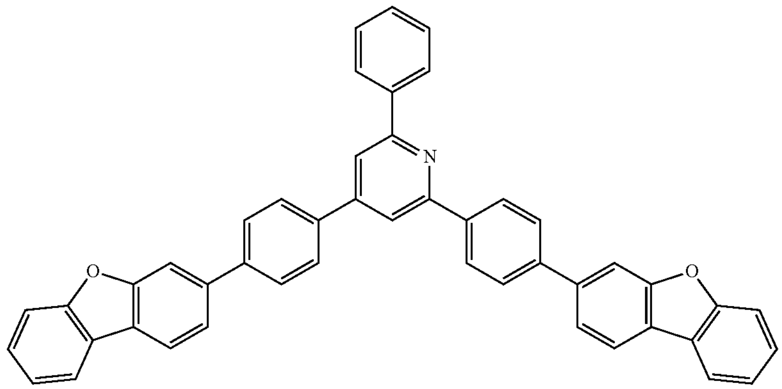
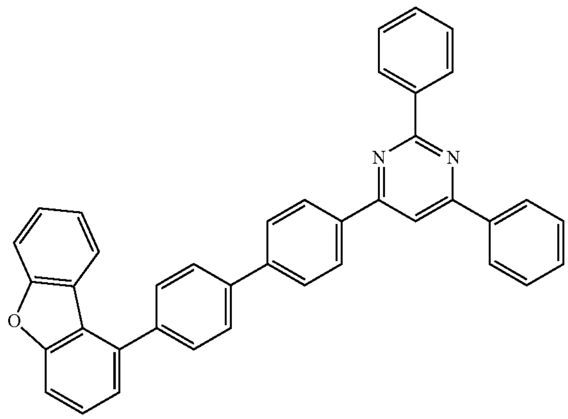
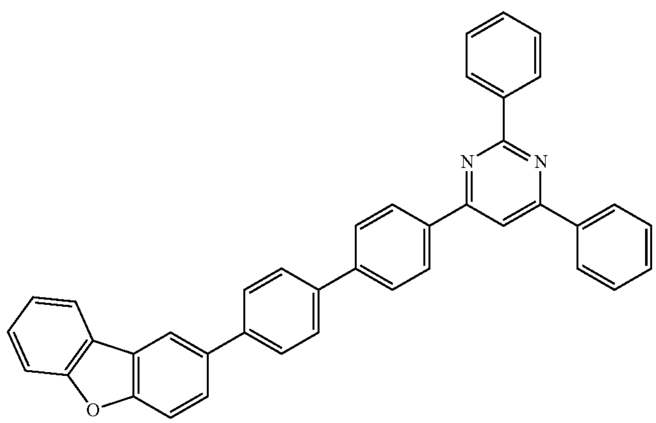
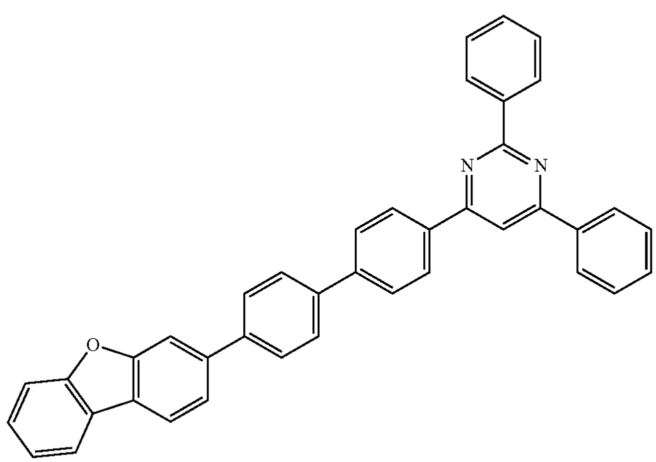

-continued
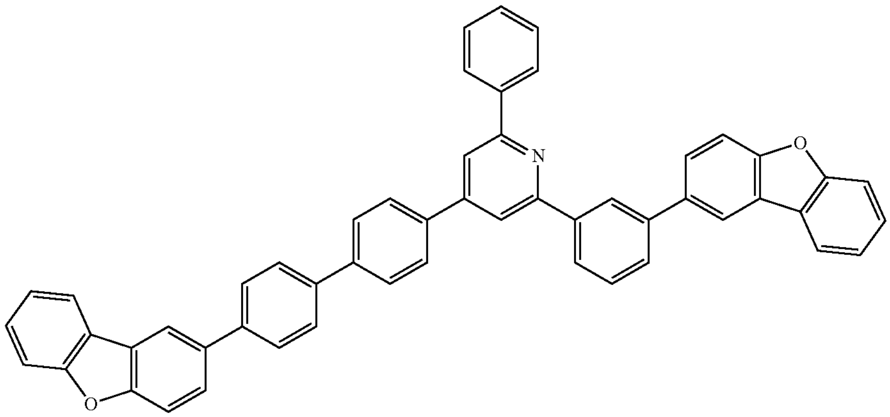 [SMILES: c1ccc(-c2cc(-c3ccc(-c4ccc(-c5ccc6oc7ccccc7c6c5)cc4)cc3)cc(-c3cccc(-c4ccc5oc6ccccc6c5c4)c3)n2)cc1]
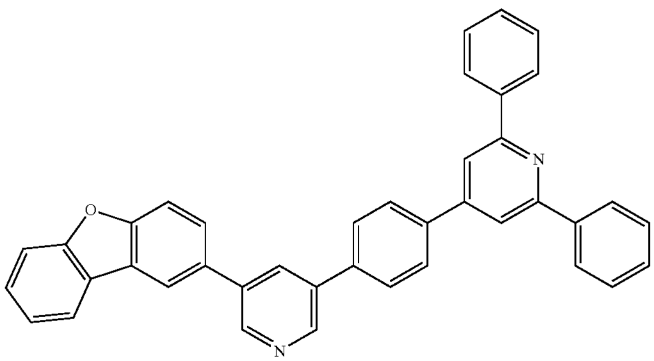
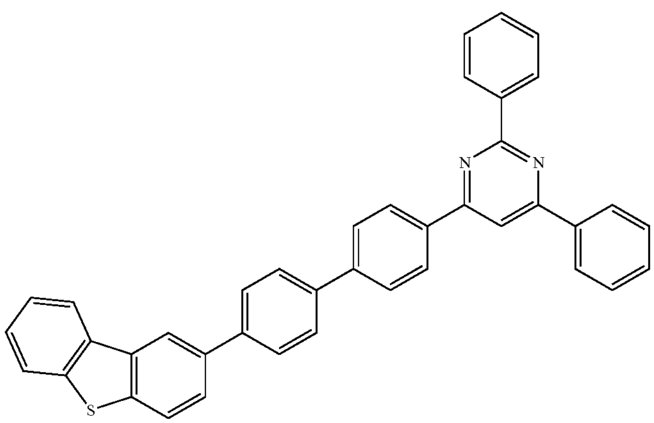
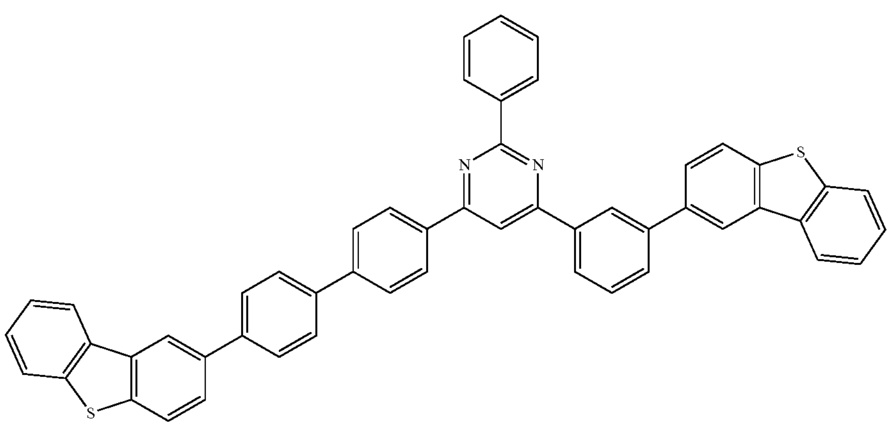

-continued
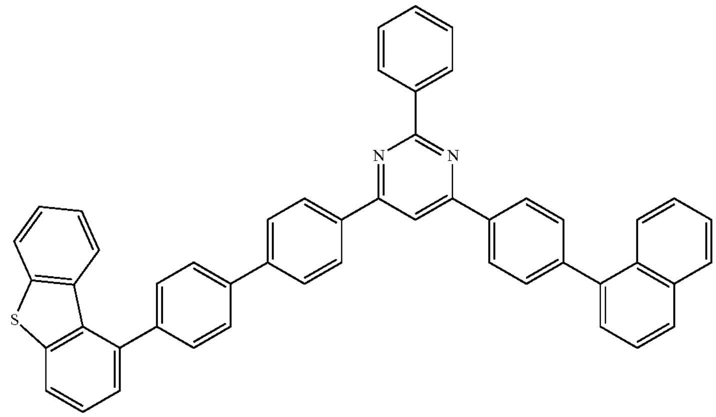
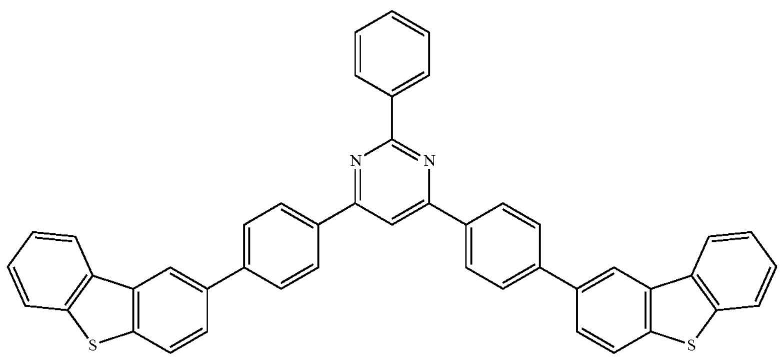 [SMILES: c1ccc(-c2nc(-c3ccc(-c4ccc5sc6ccccc6c5c4)cc3)cc(-c3ccc(-c4ccc5sc6ccccc6c5c4)cc3)n2)cc1]
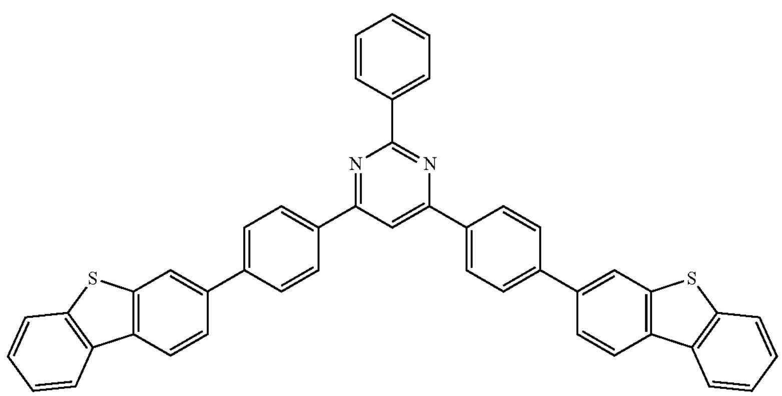
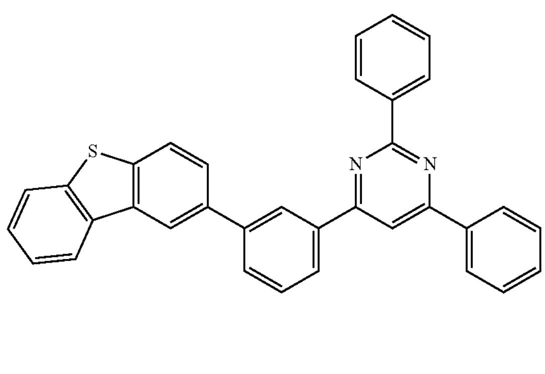

-continued
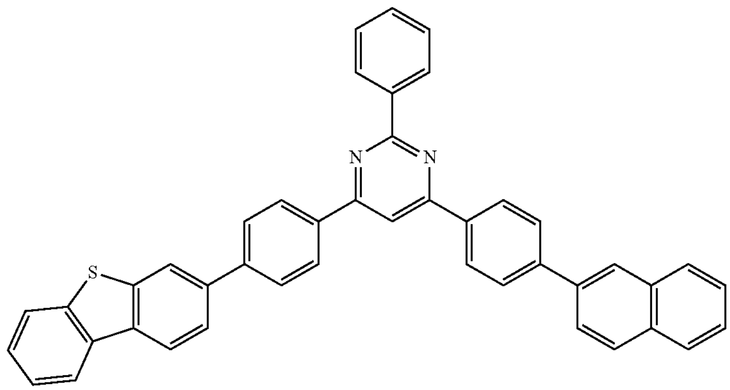
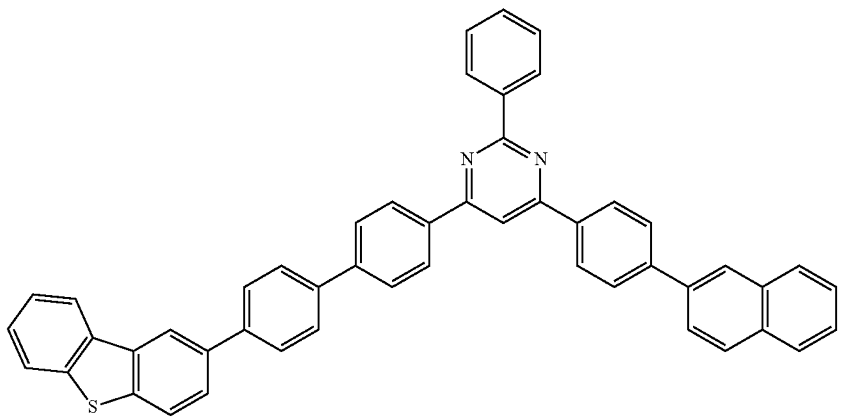
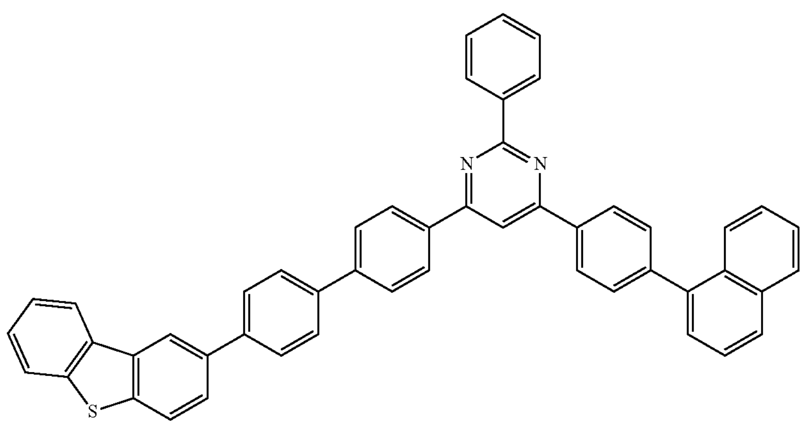 [SMILES: c1ccc(-c2nc(-c3ccc(-c4ccc(-c5ccc6sc7ccccc7c6c5)cc4)cc3)cc(-c3ccc(-c4cccc5ccccc45)cc3)n2)cc1]
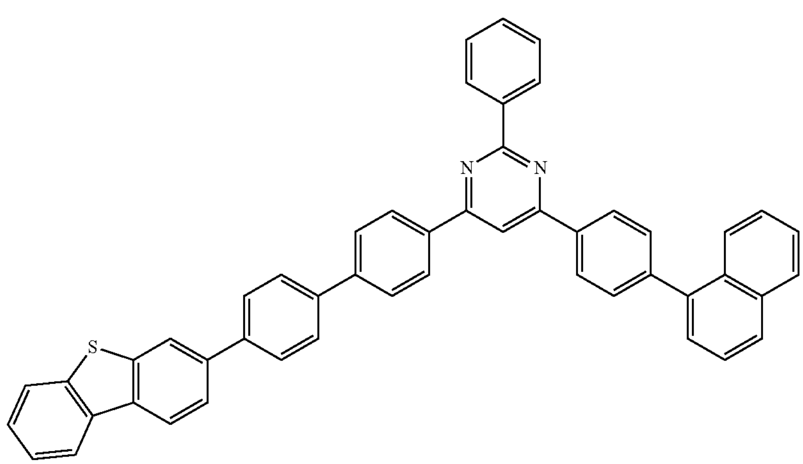

-continued
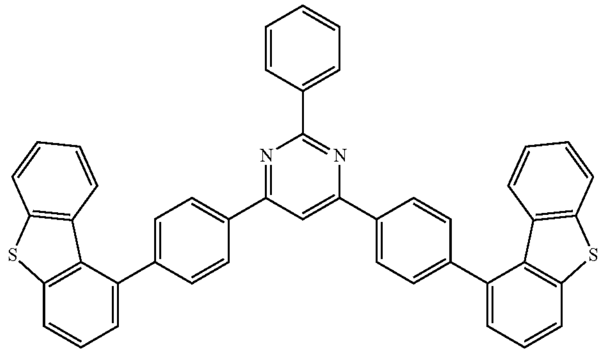
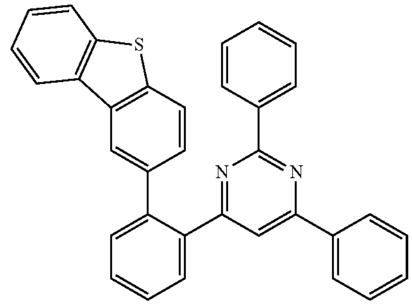
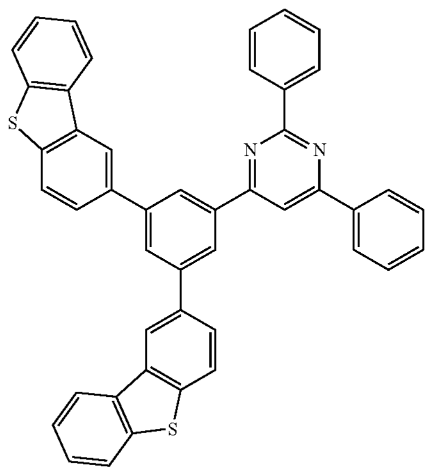
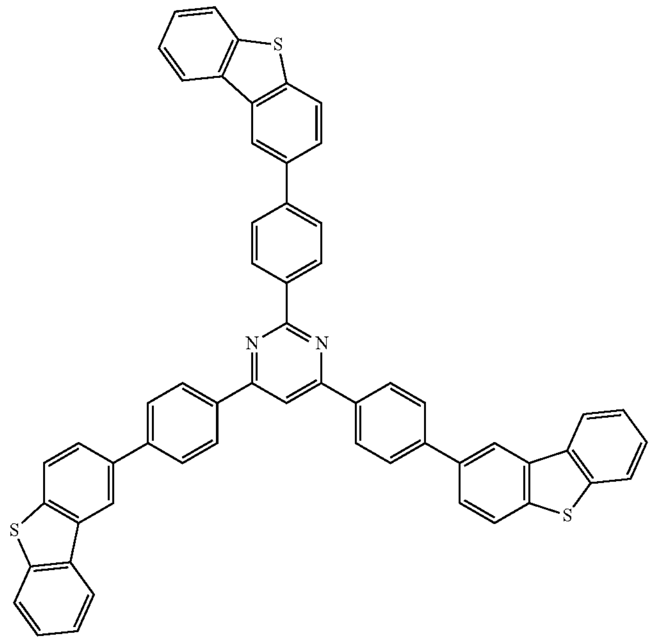
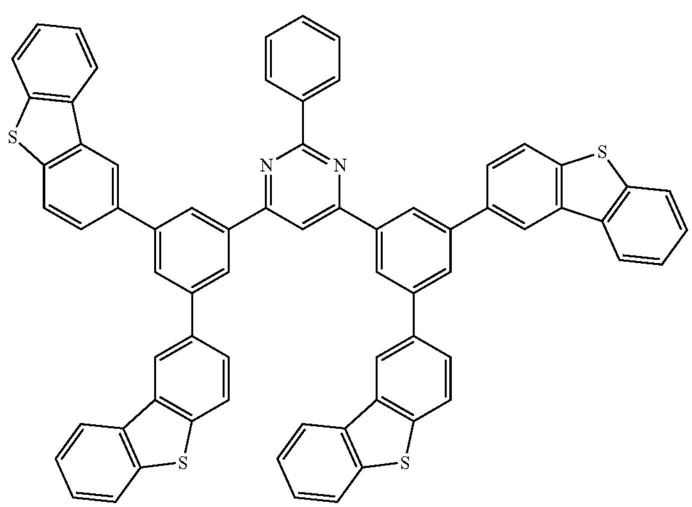

-continued
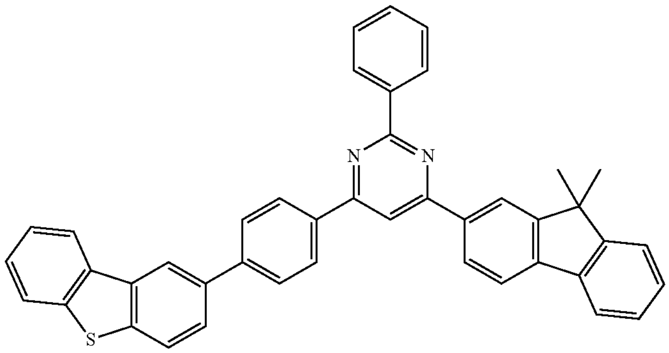
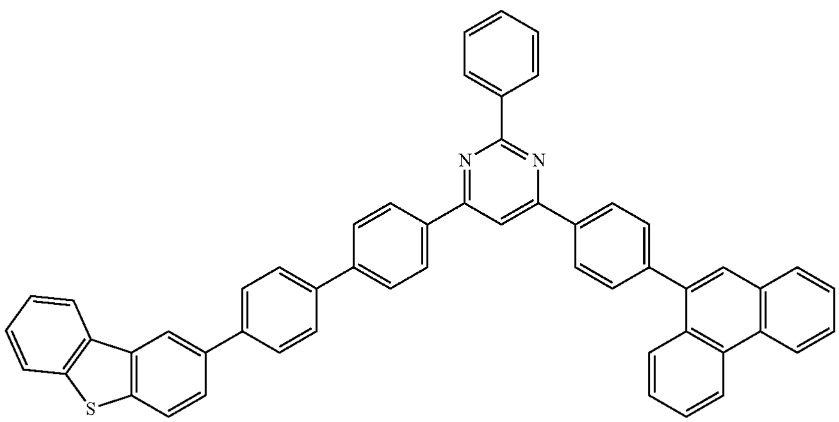
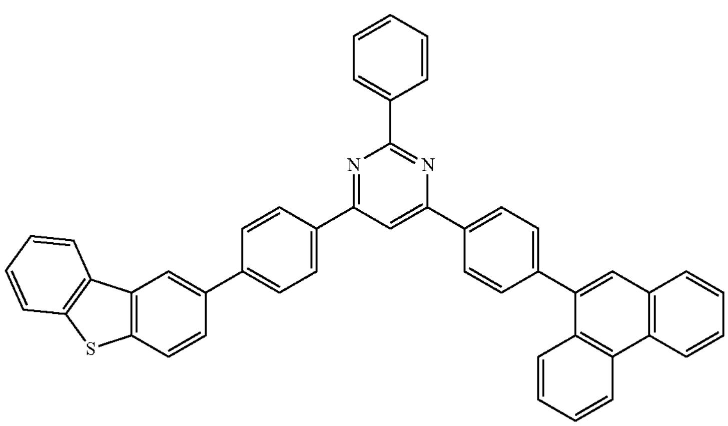
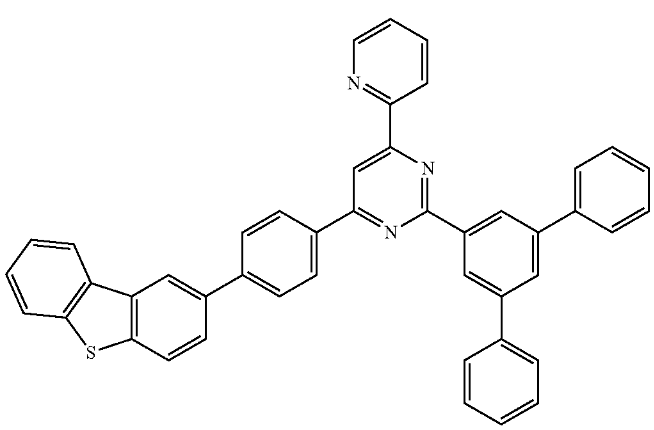

-continued
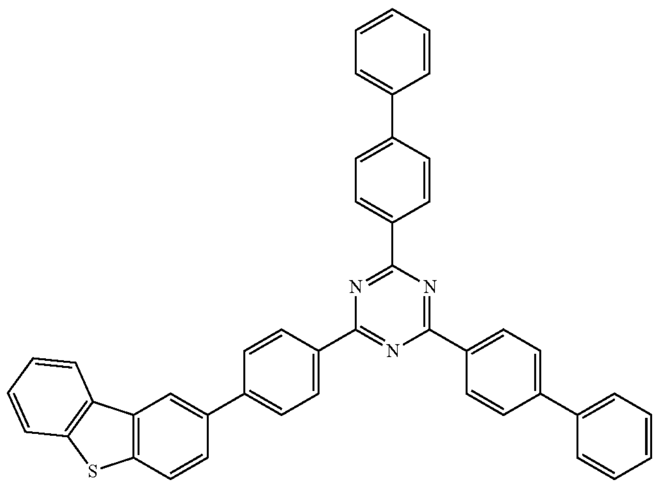
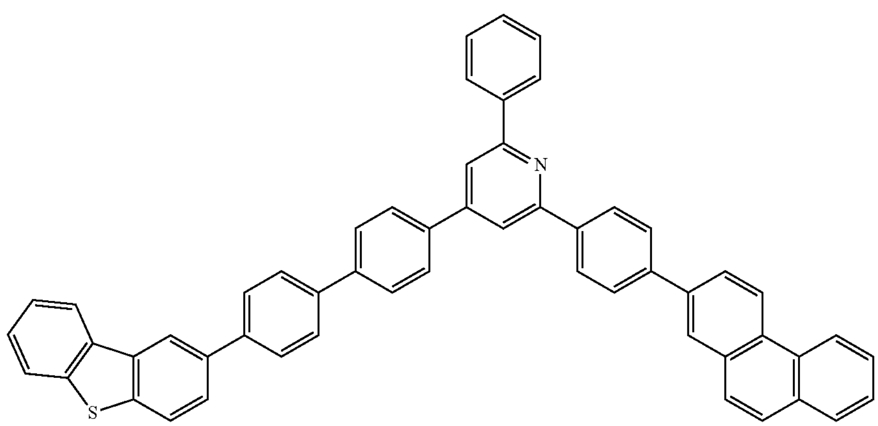
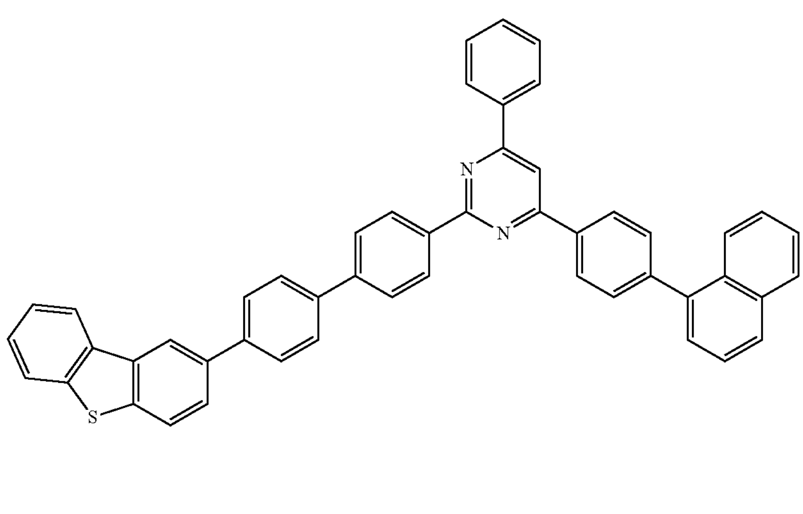

-continued
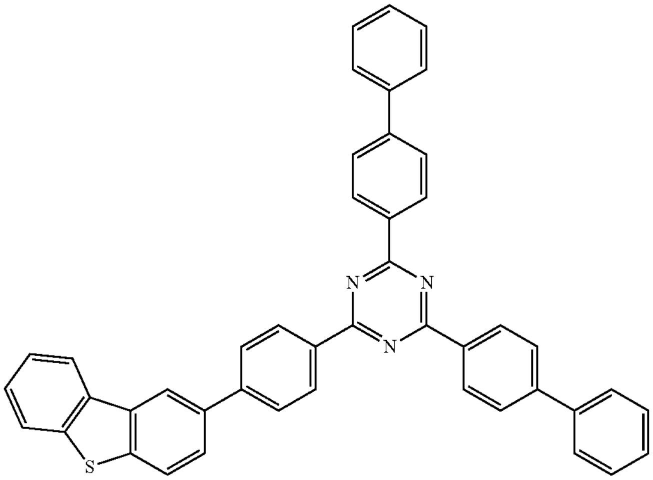
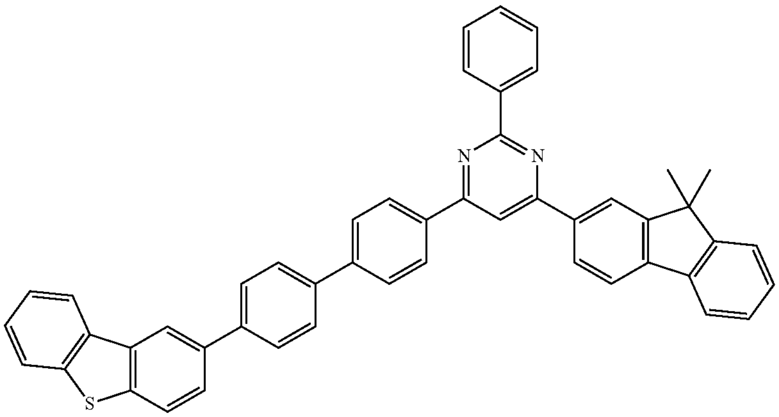
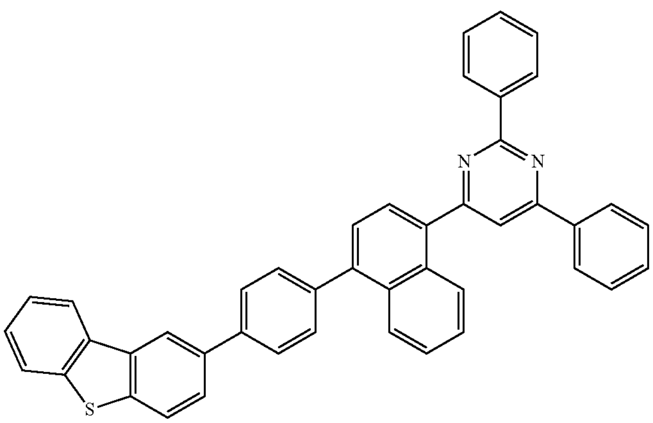
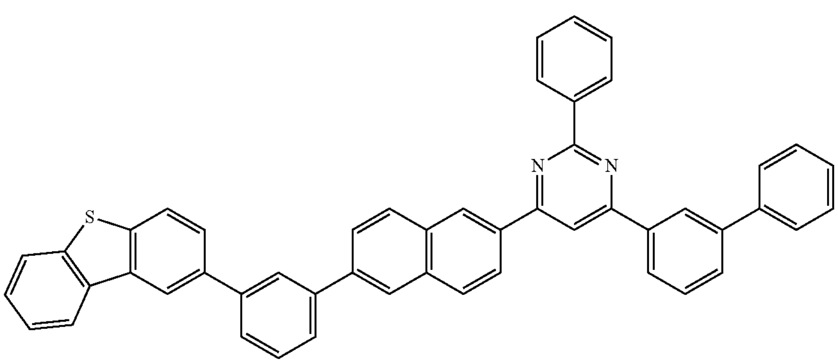

-continued
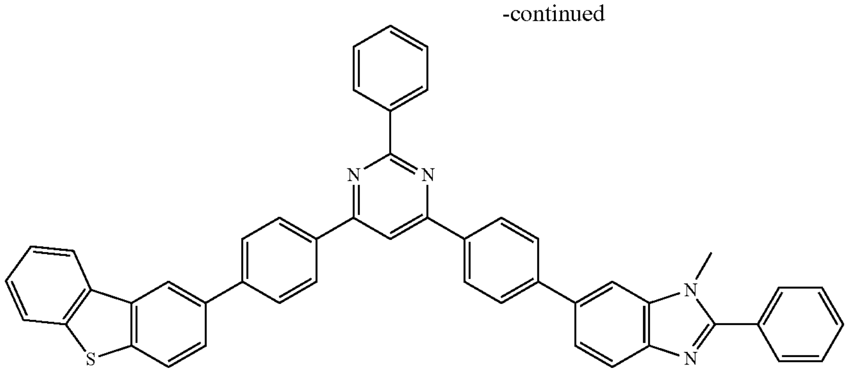
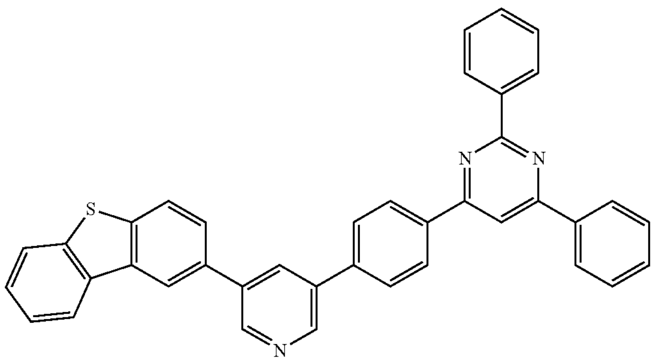
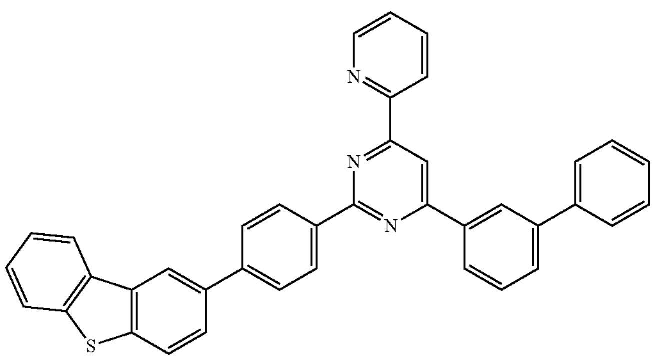
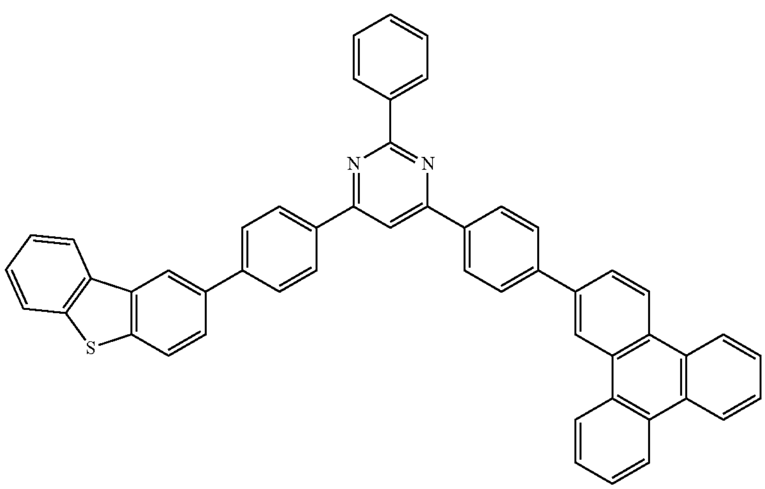 [SMILES: c1ccc(-c2nc(-c3ccc(-c4ccc5sc6ccccc6c5c4)cc3)cc(-c3ccc(-c4ccc5c6ccccc6c6ccccc6c5c4)cc3)n2)cc1]

-continued
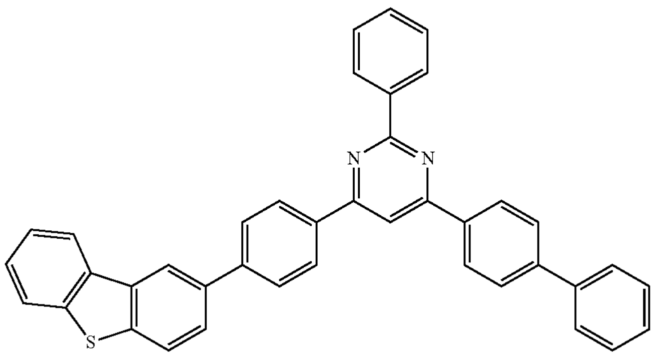
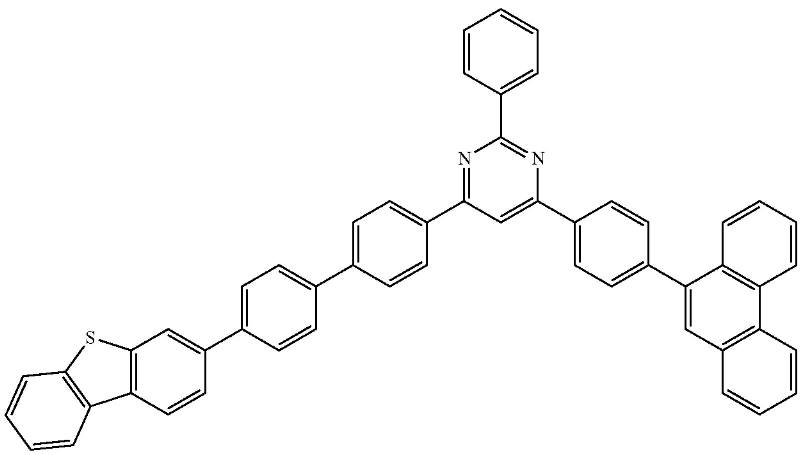
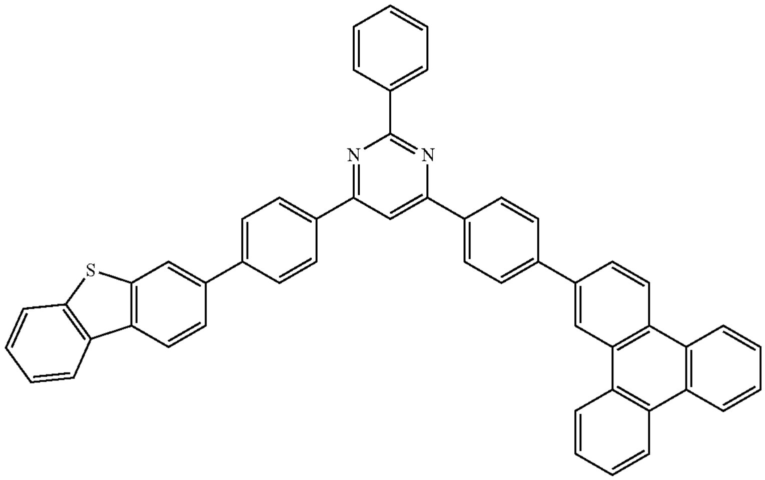

-continued
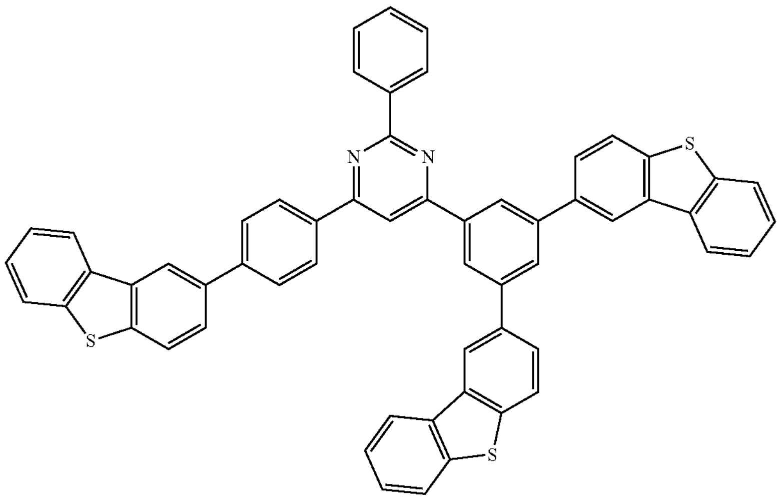
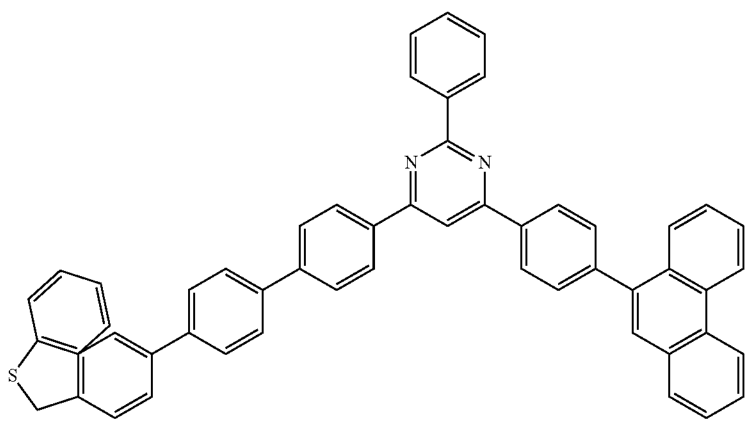
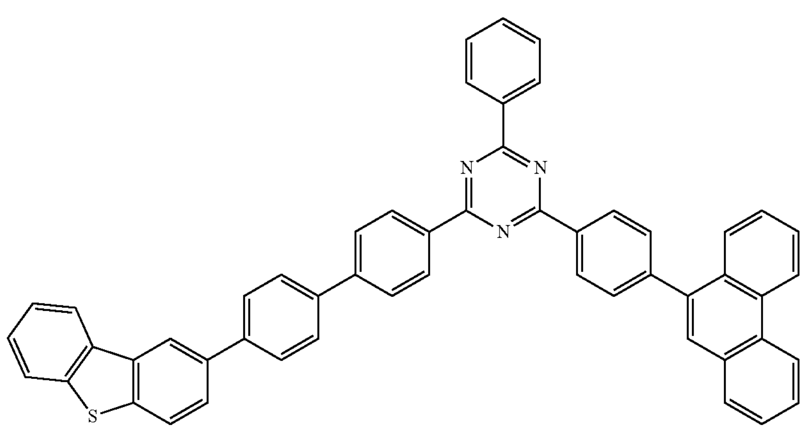

-continued
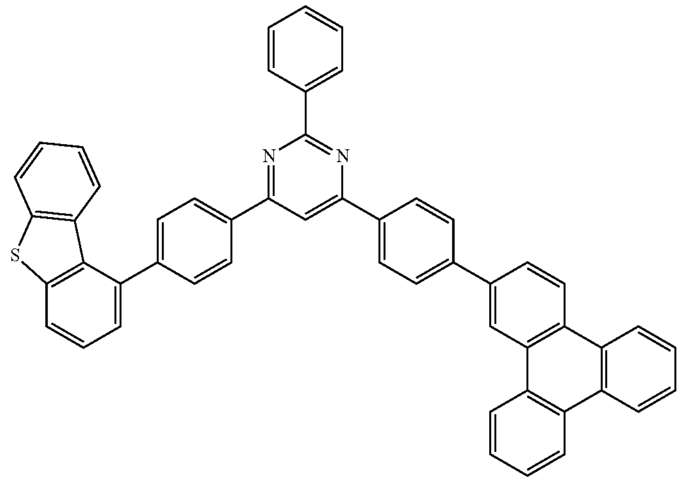
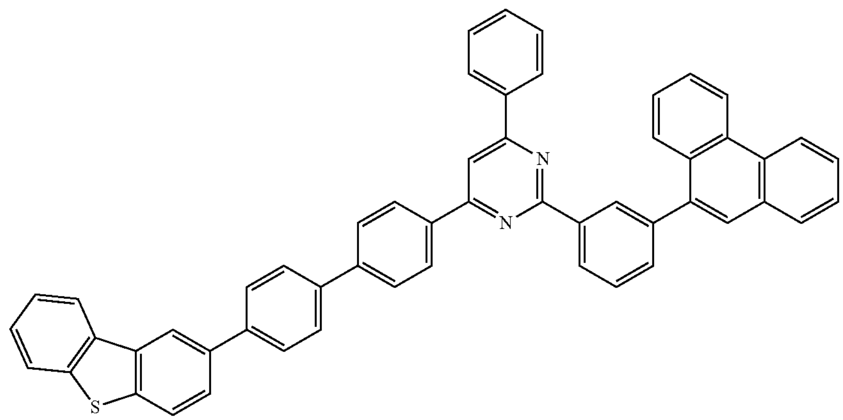
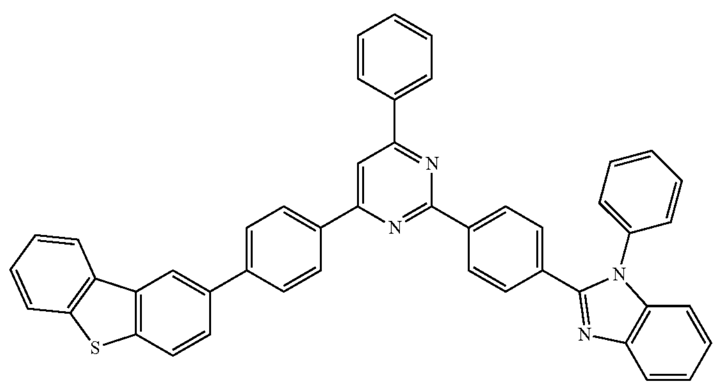
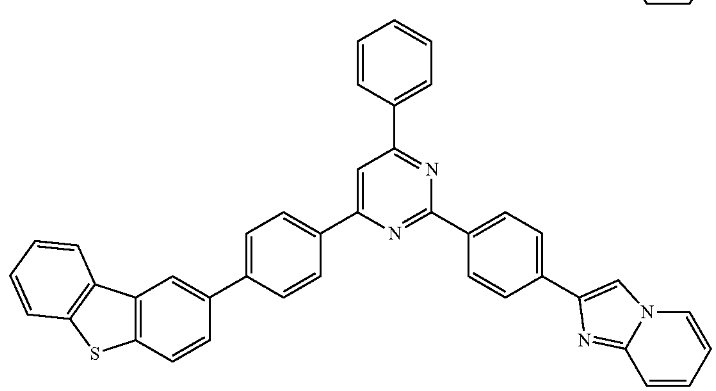

-continued
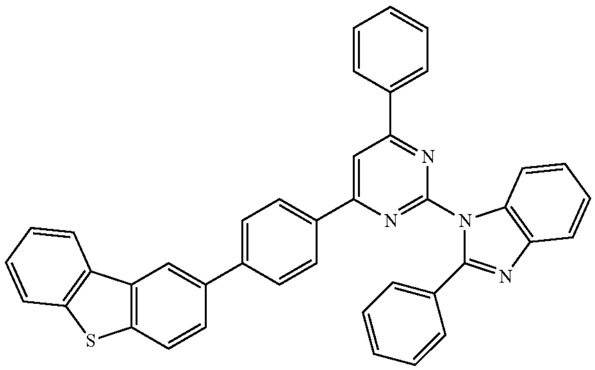
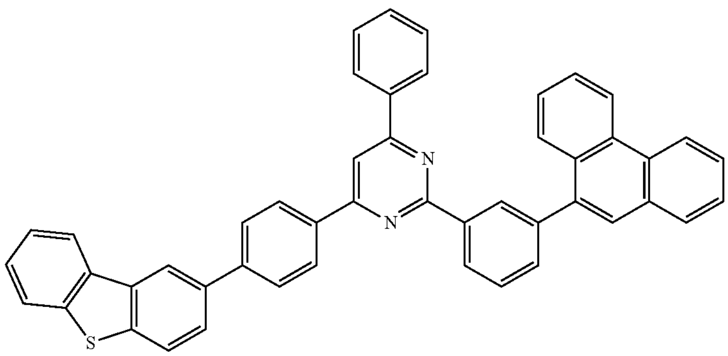
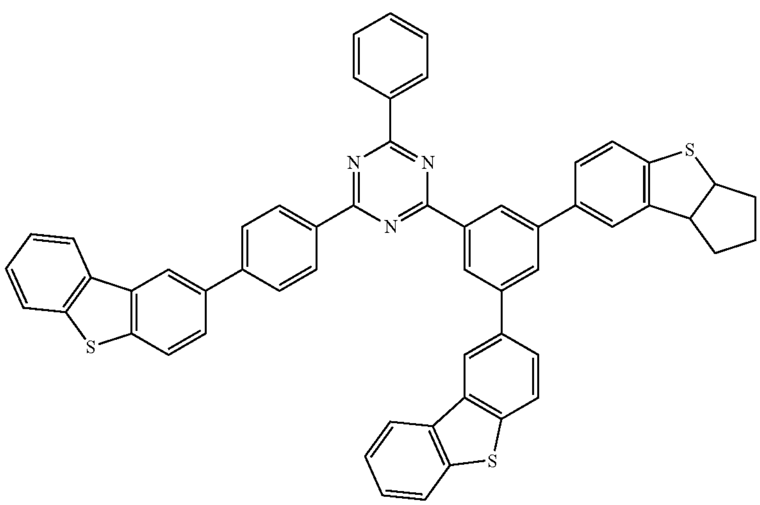
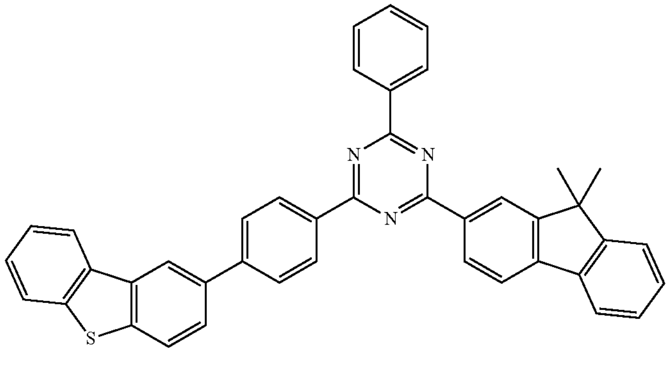

-continued
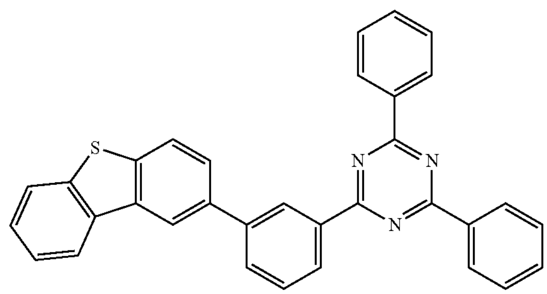
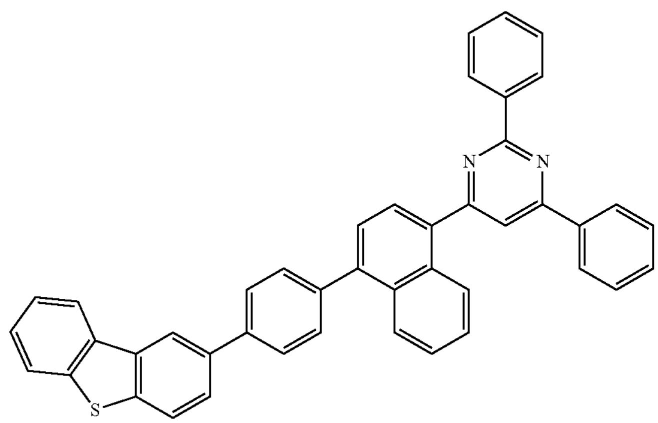
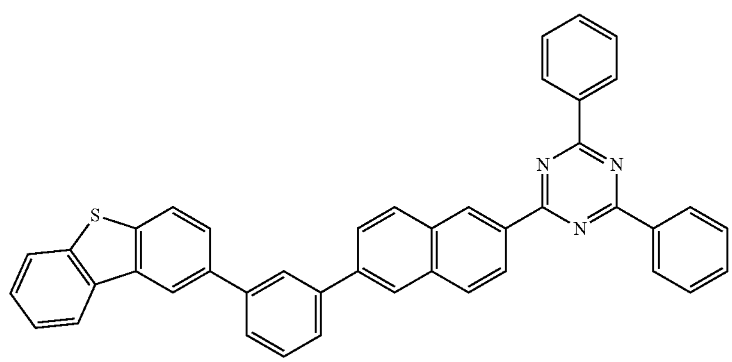
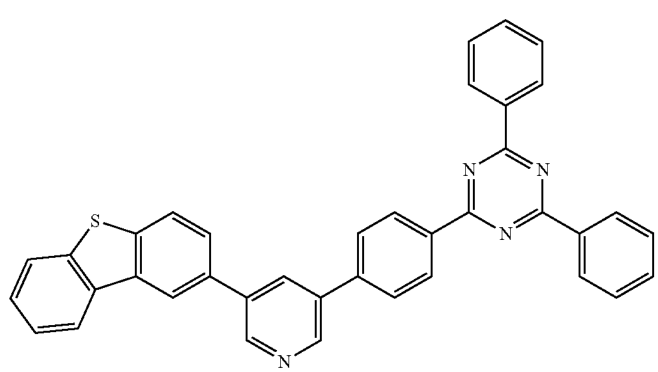

-continued
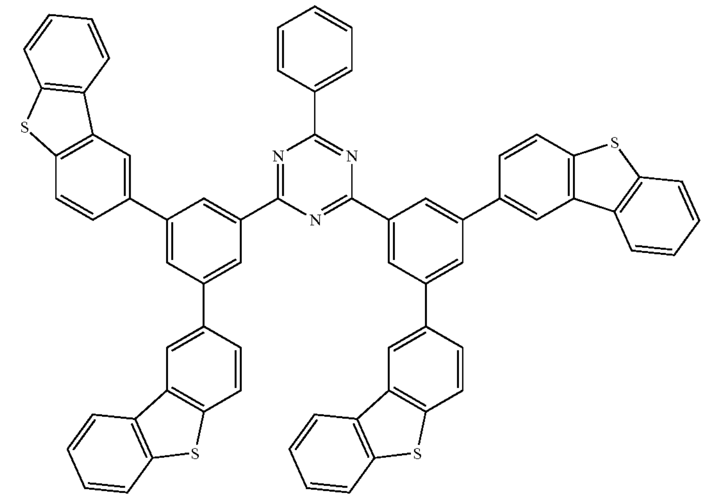
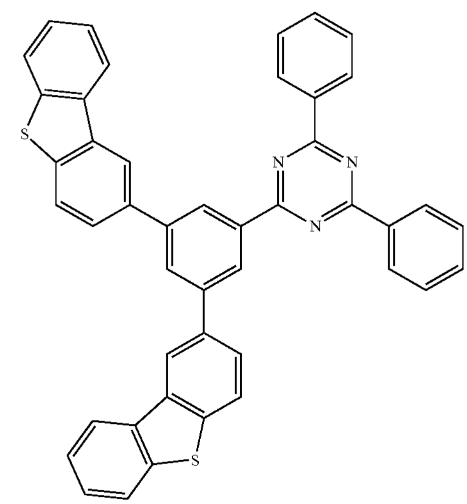
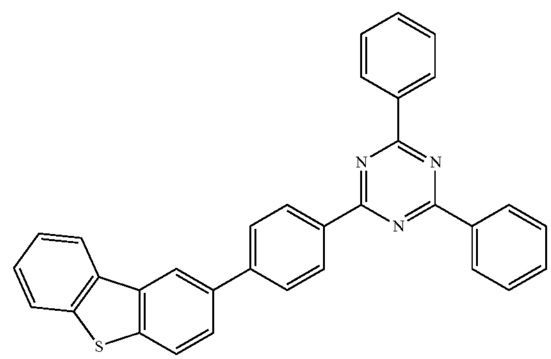
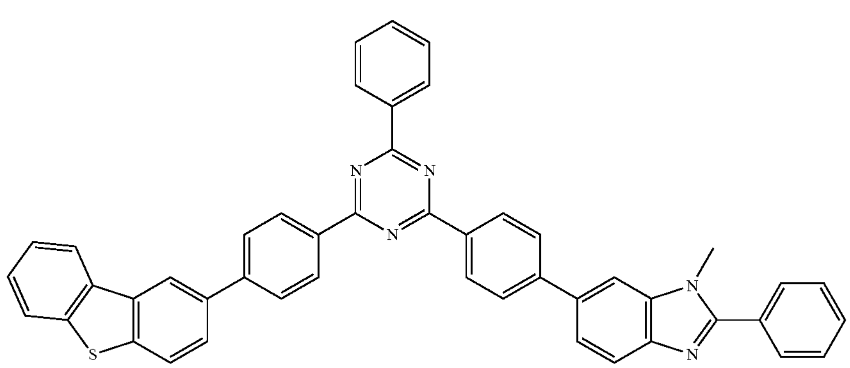

-continued
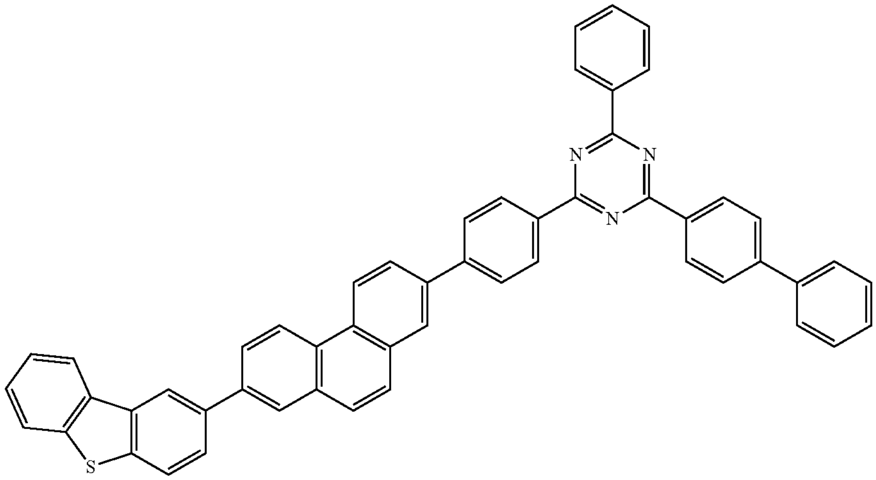 [SMILES: c1ccc(-c2ccc(-c3nc(-c4ccccc4)nc(-c4ccc(-c5ccc6c(ccc7cc(-c8ccc9sc%10ccccc%10c9c8)ccc76)c5)cc4)n3)cc2)cc1]
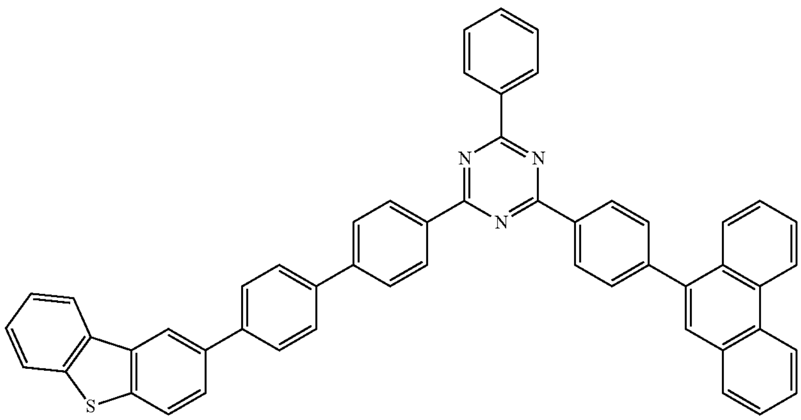
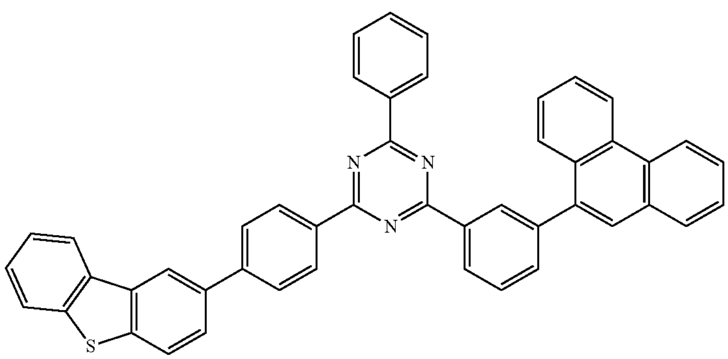
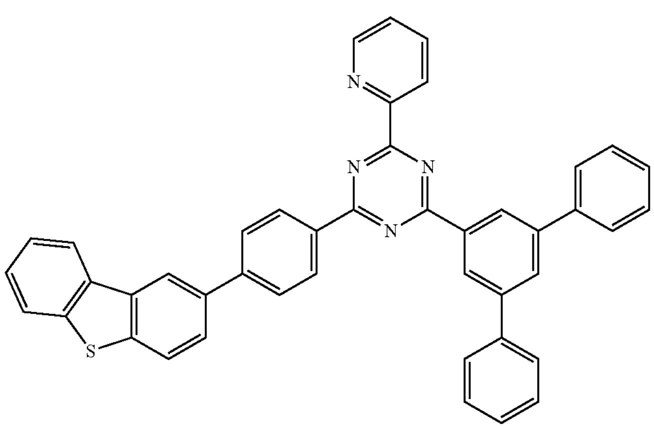

-continued
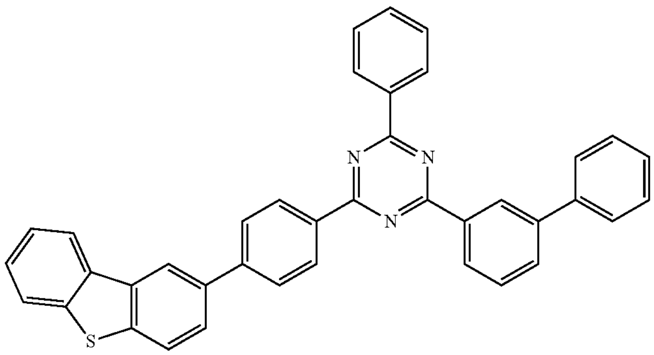
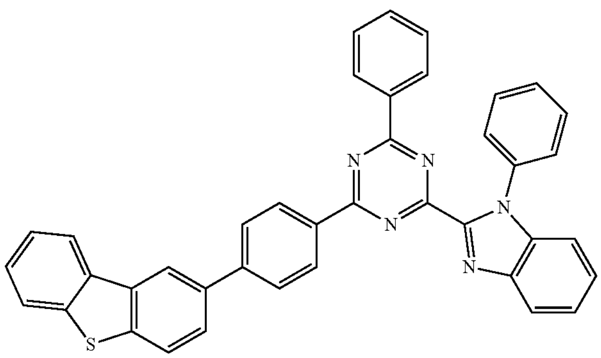
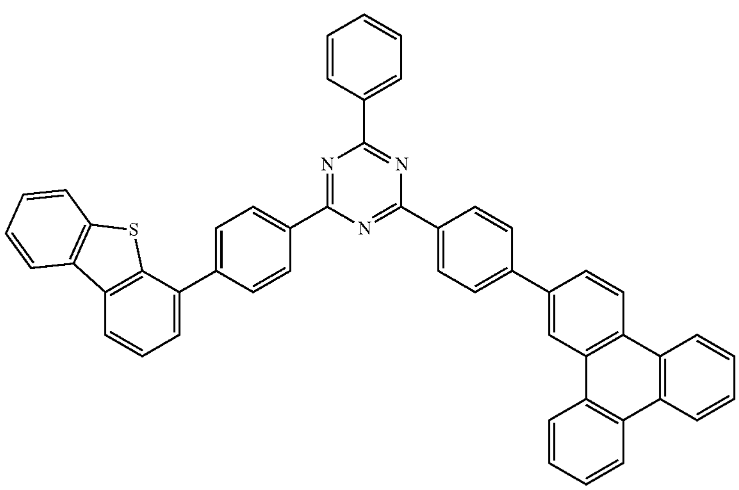
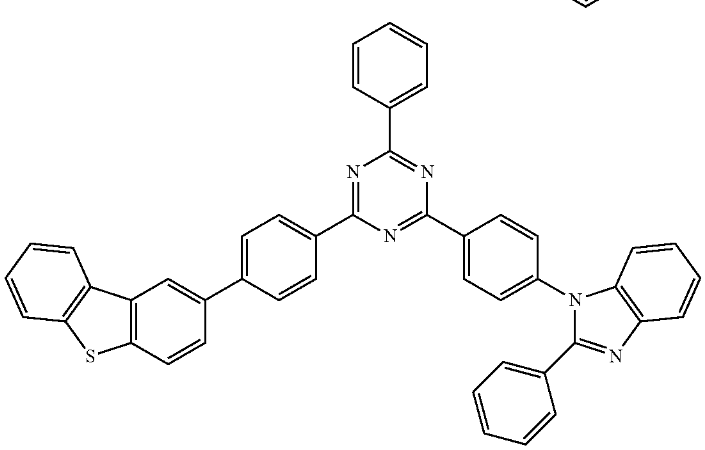

-continued
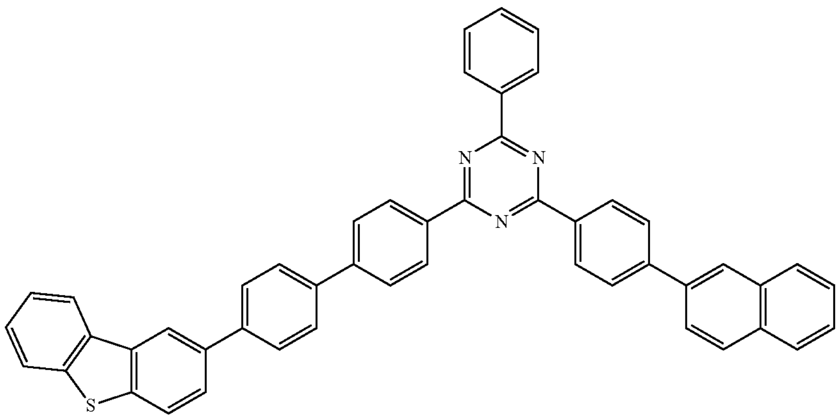
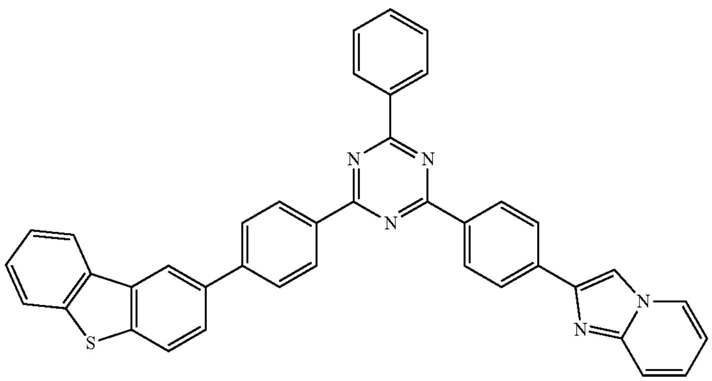
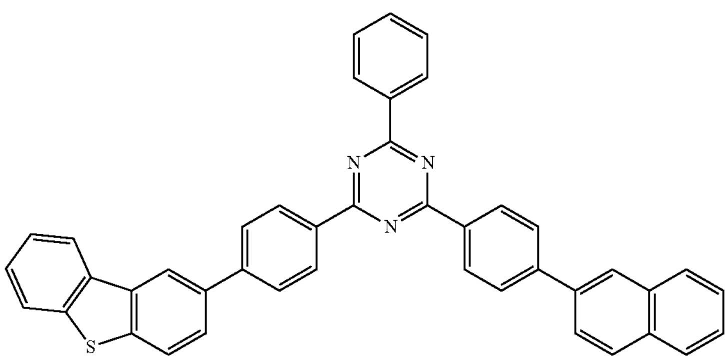
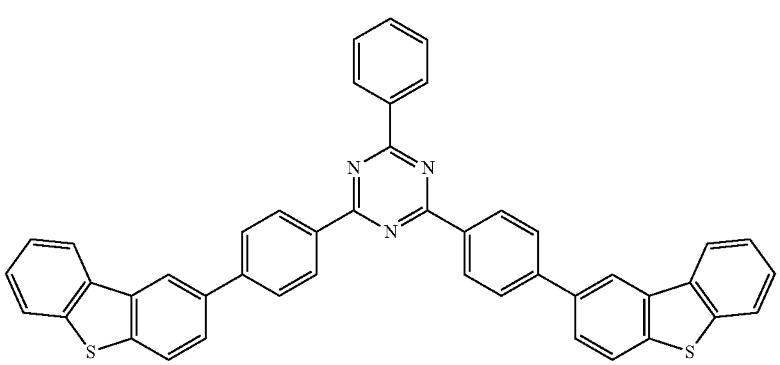

-continued
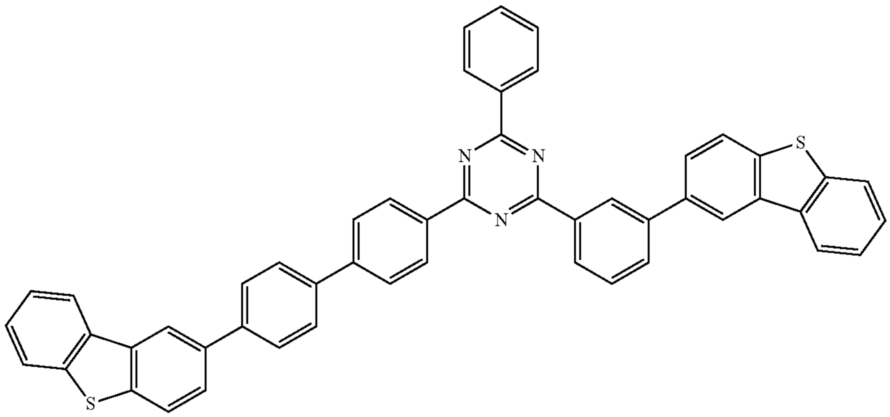
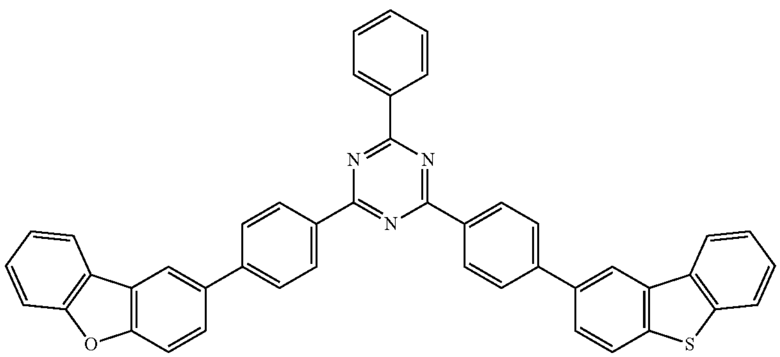
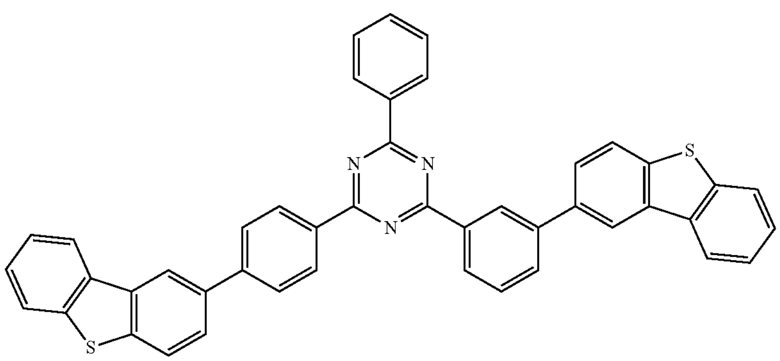 [SMILES: c1ccc(-c2nc(-c3ccc(-c4ccc5sc6ccccc6c5c4)cc3)nc(-c3cccc(-c4ccc5sc6ccccc6c5c4)c3)n2)cc1]
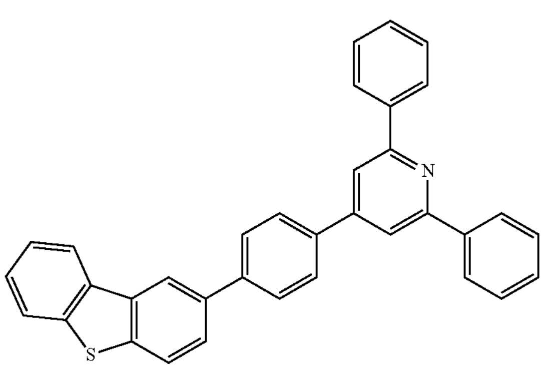

-continued
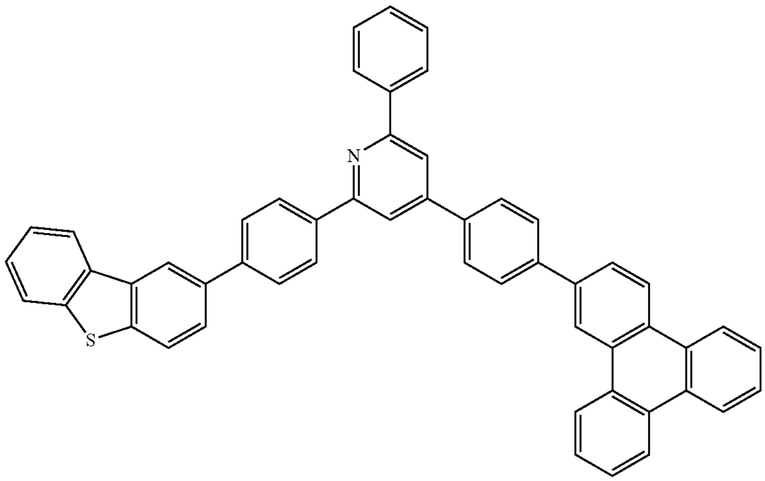
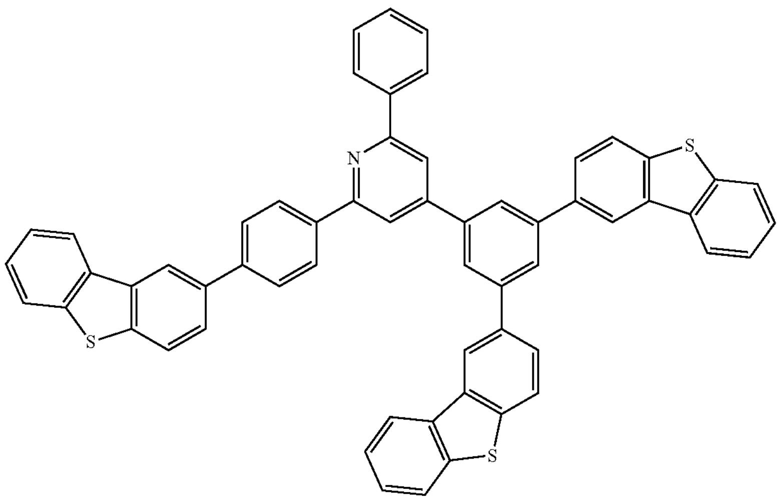
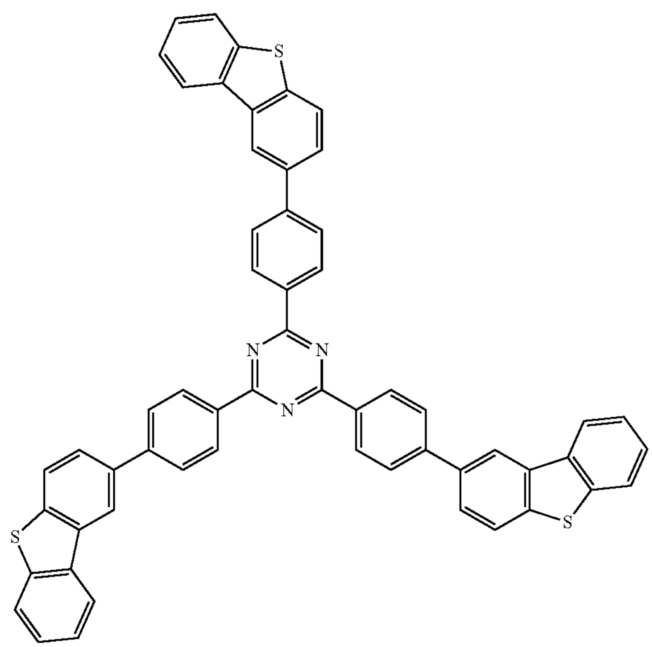
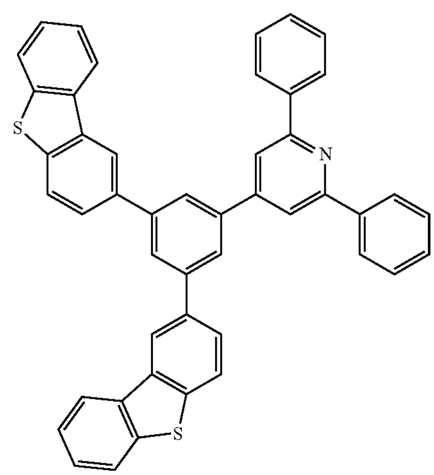

-continued
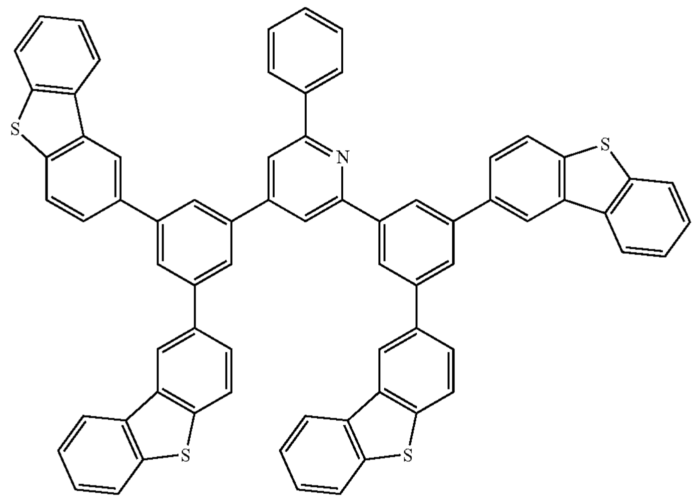
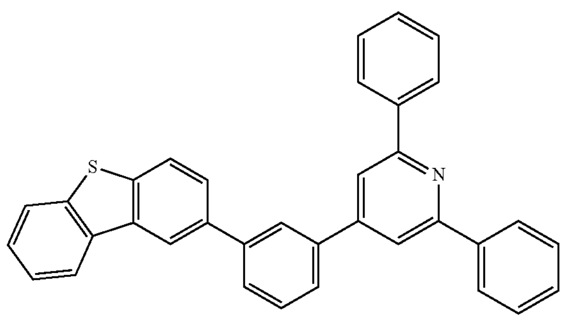
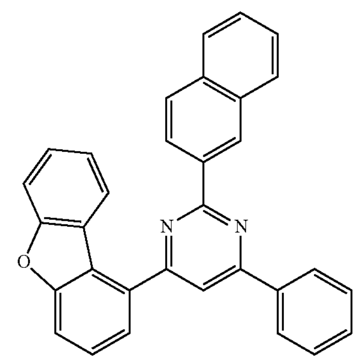
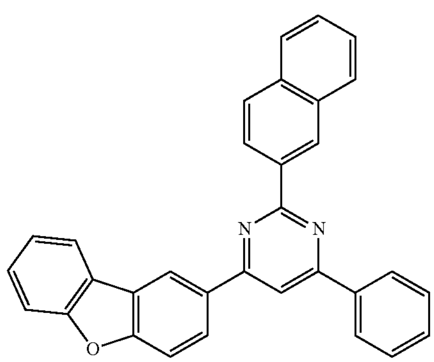
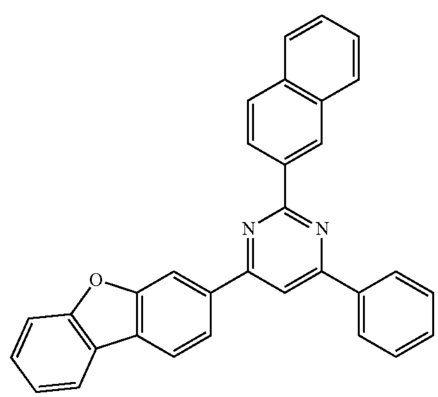
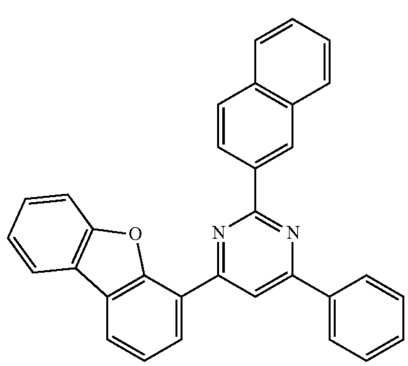
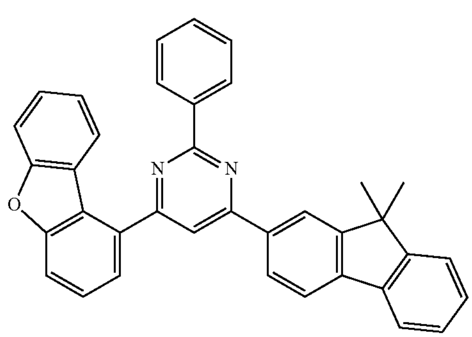

-continued
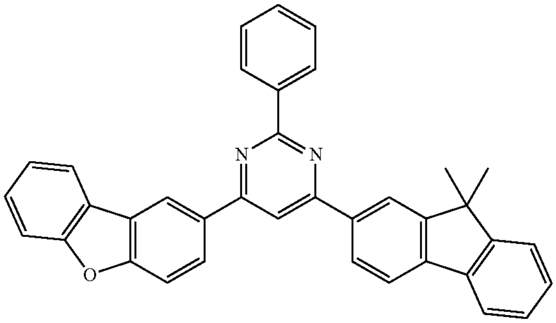
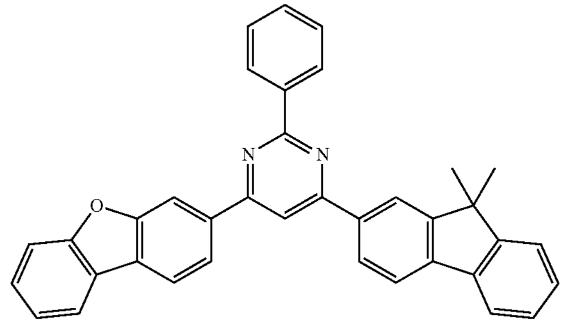
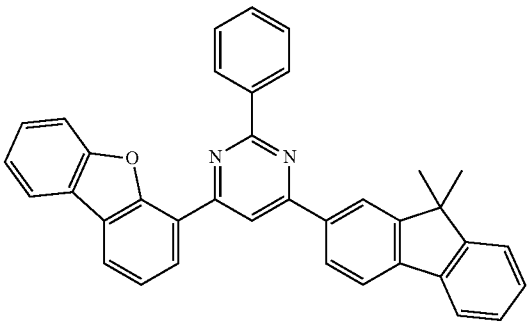
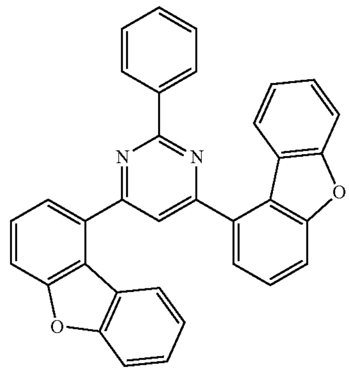
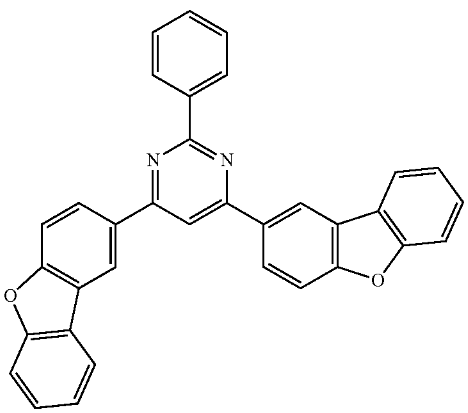
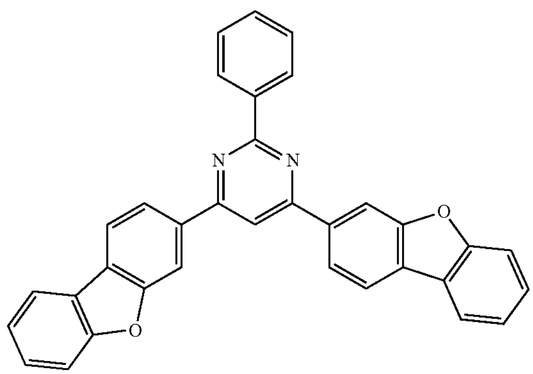
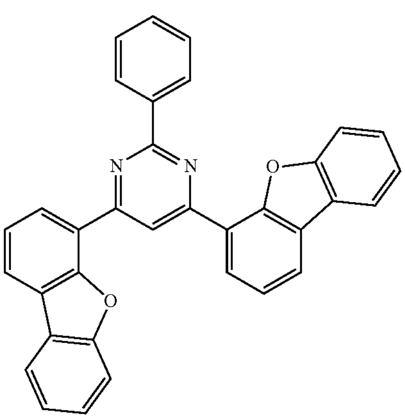
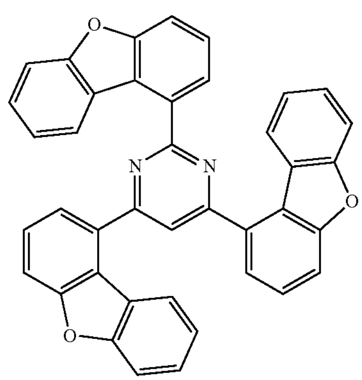

-continued
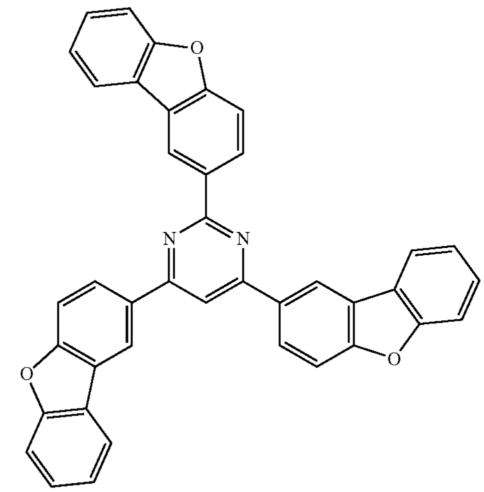
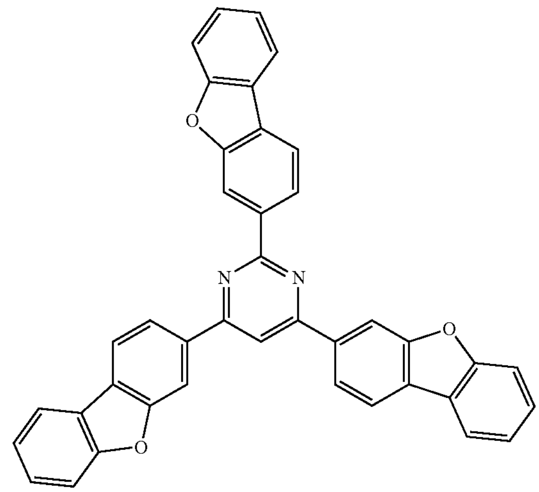
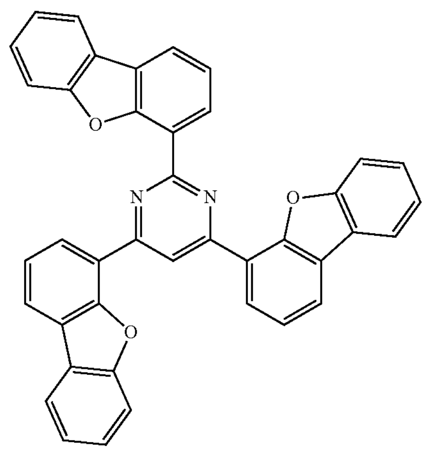
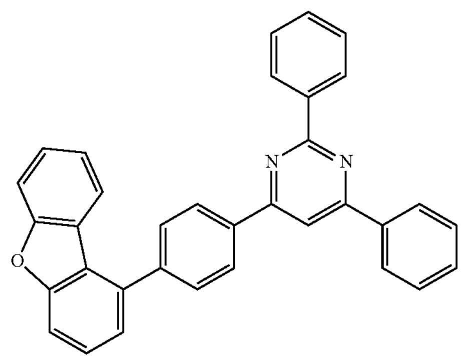
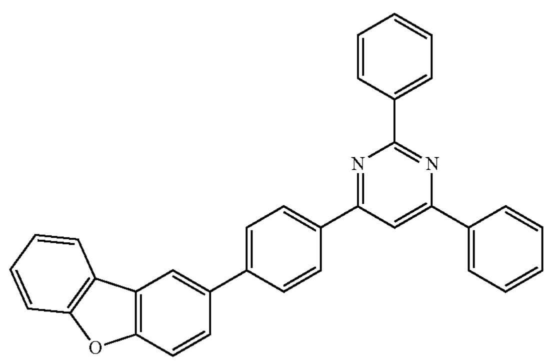
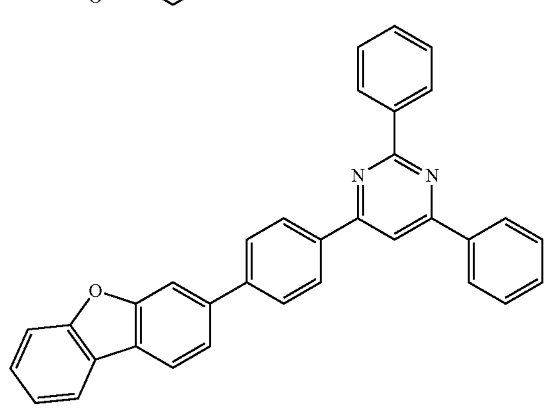
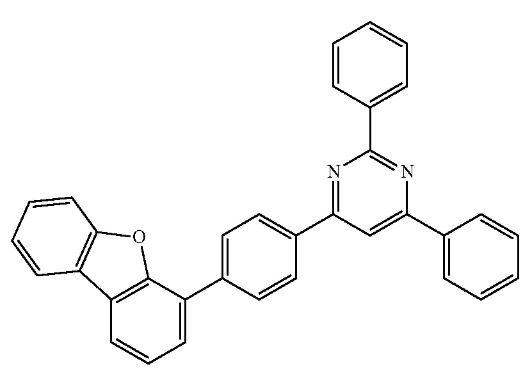

-continued
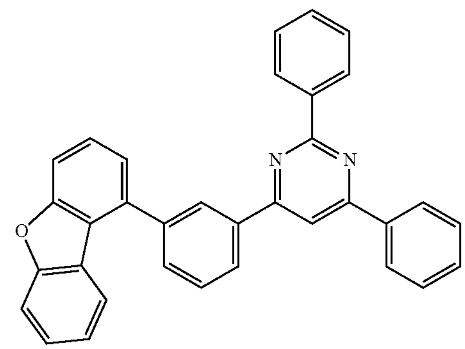
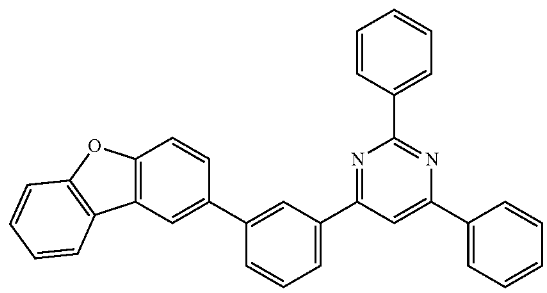
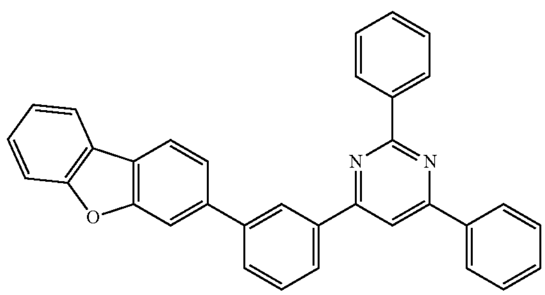
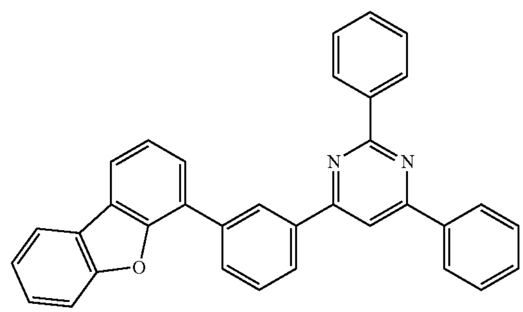
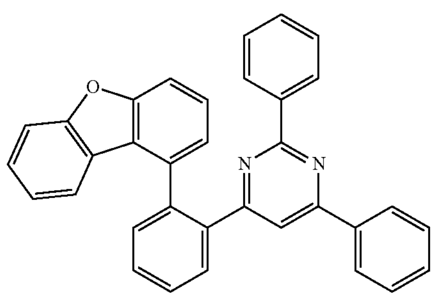
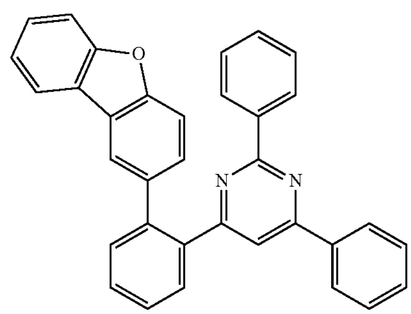
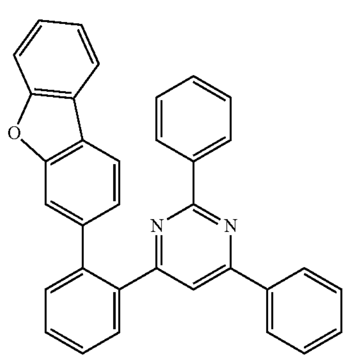
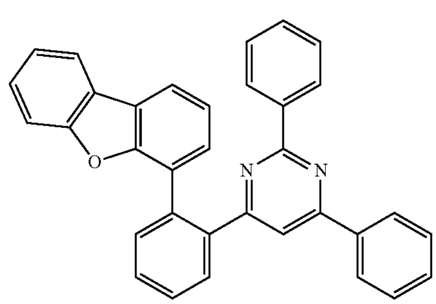

-continued
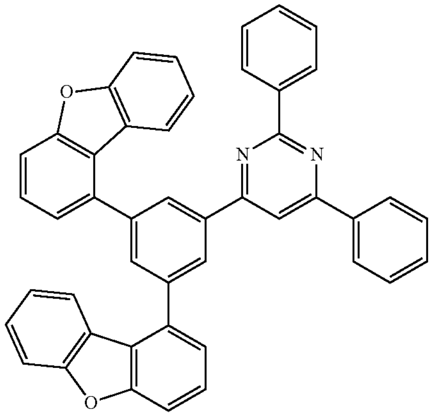
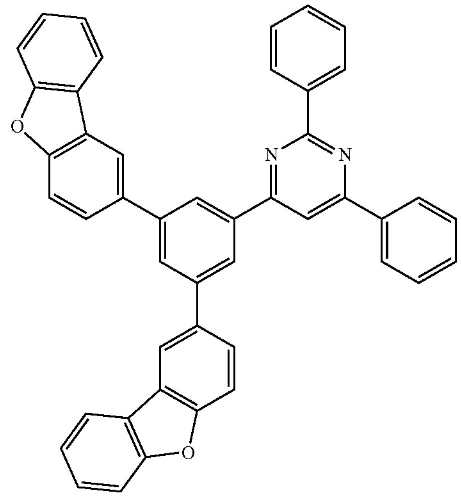
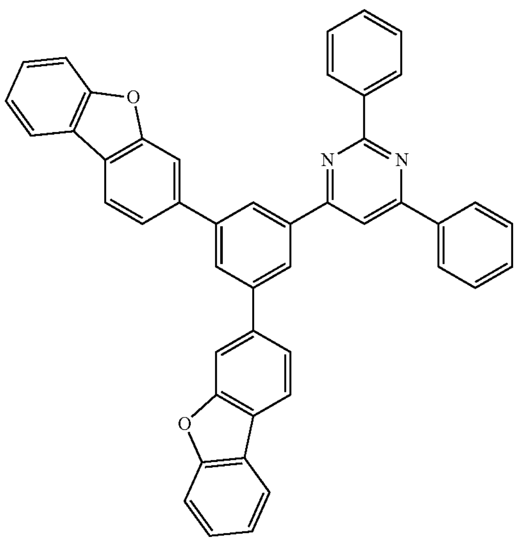
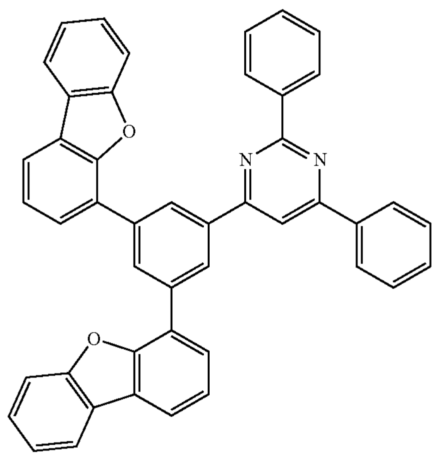
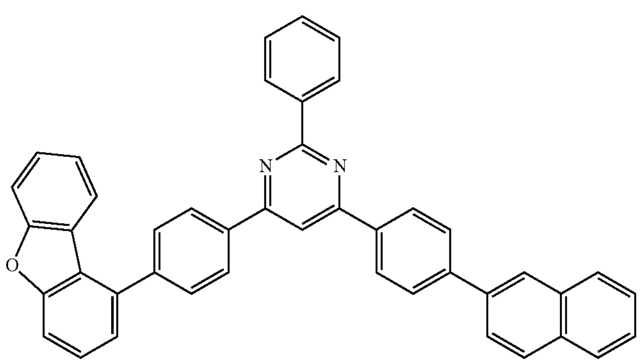

-continued
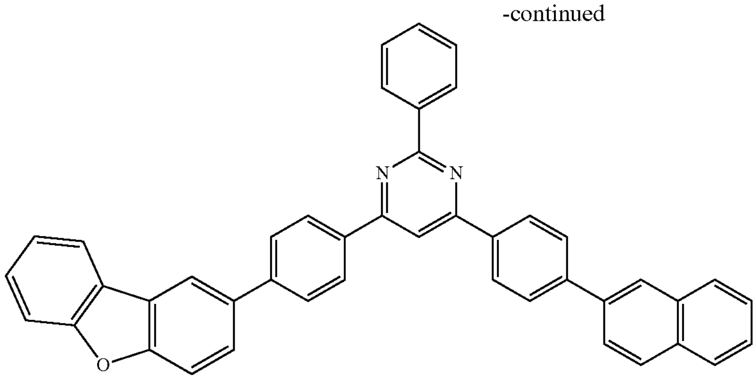
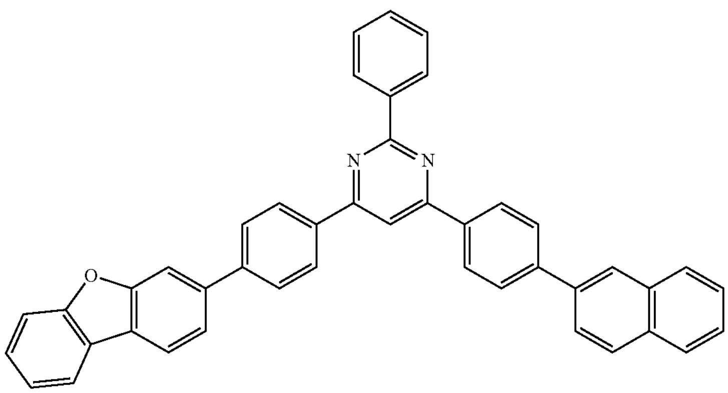
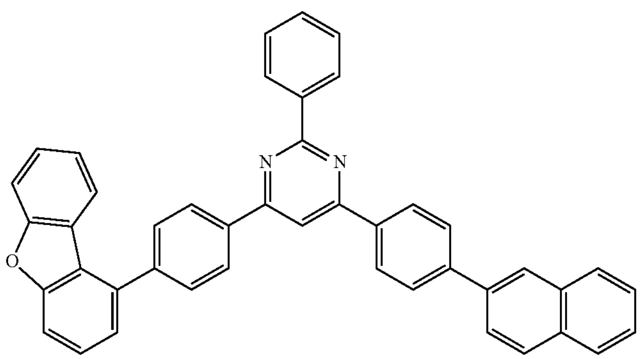
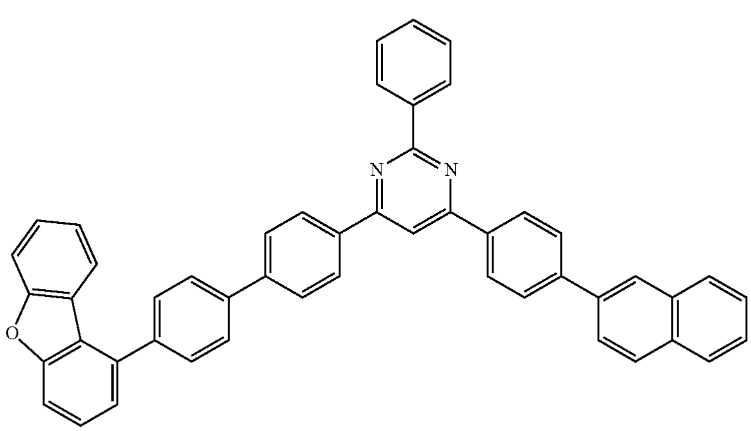

-continued
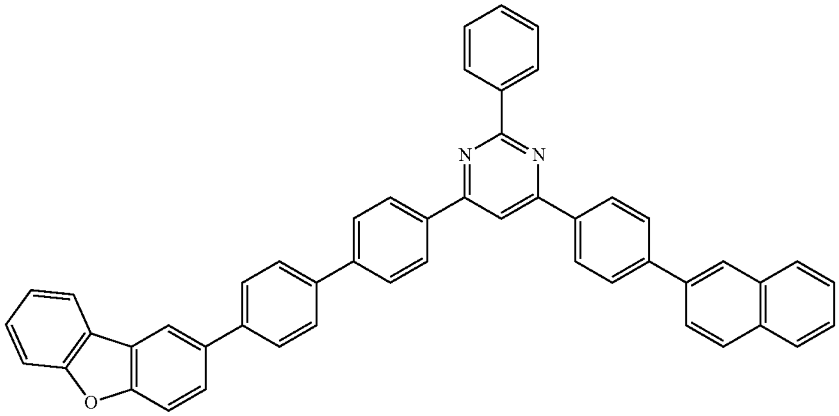
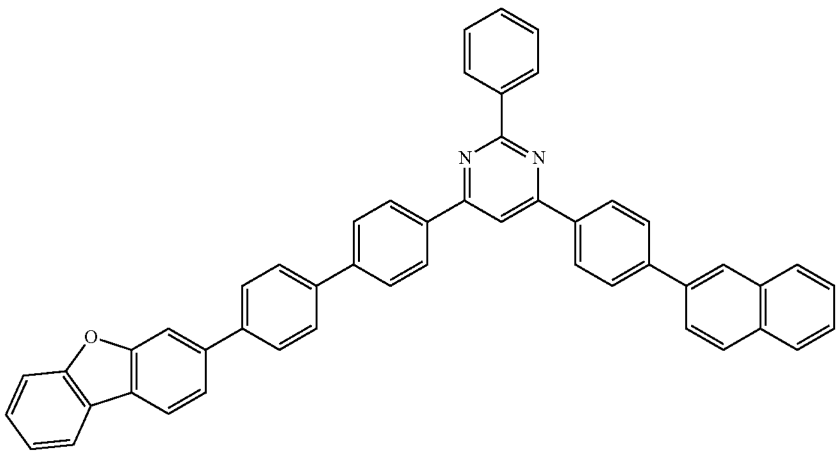
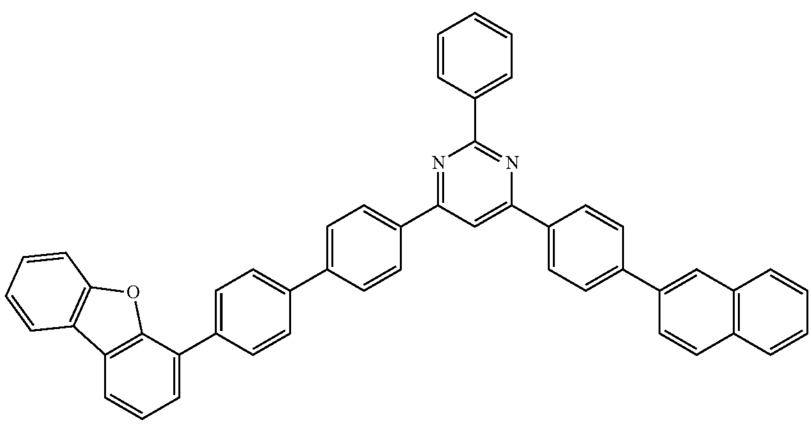
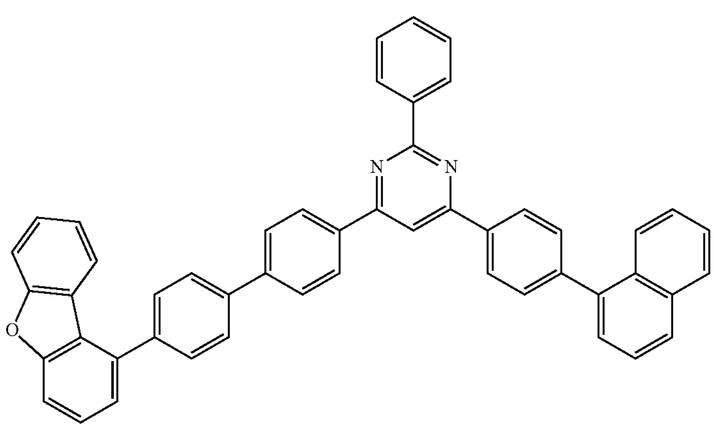

-continued
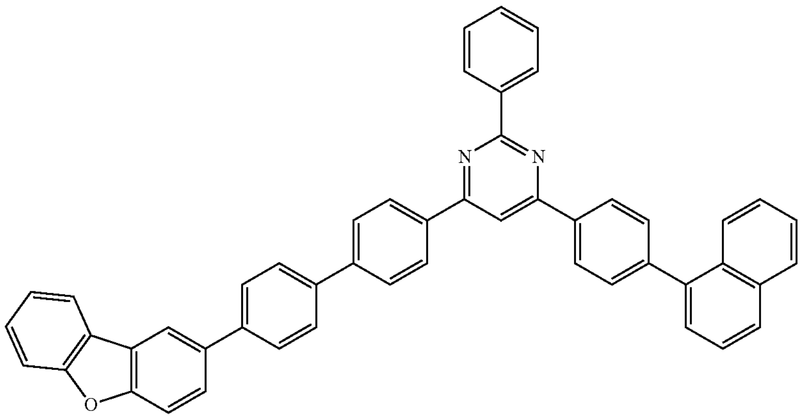
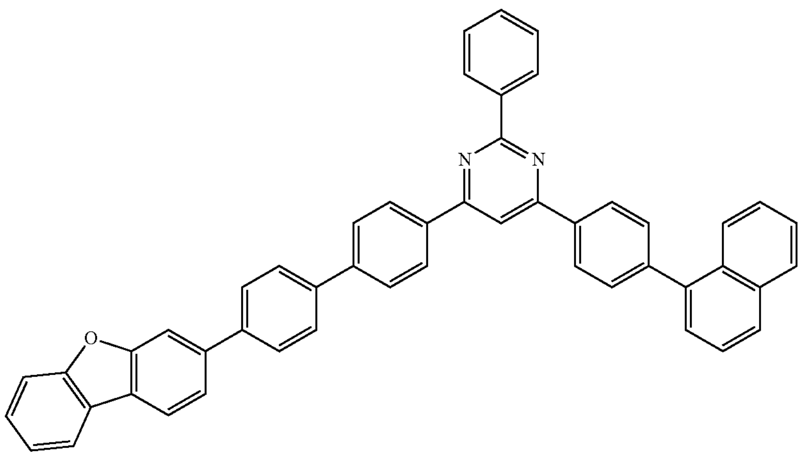
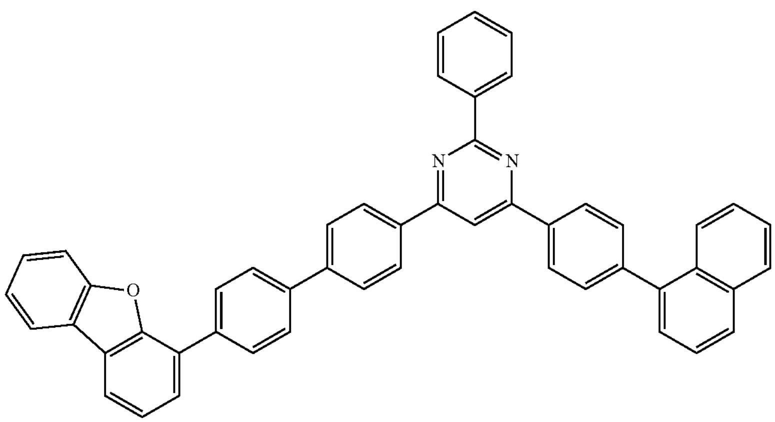
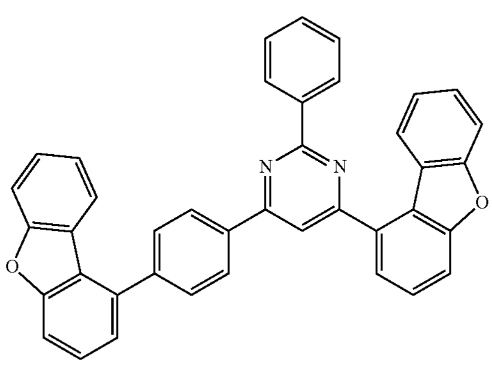 [SMILES: c1ccc(-c2nc(-c3ccc(-c4cccc5oc6ccccc6c45)cc3)cc(-c3cccc4oc5ccccc5c34)n2)cc1]

-continued
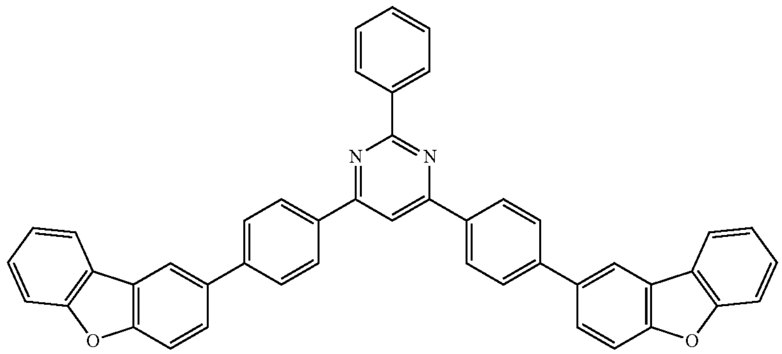
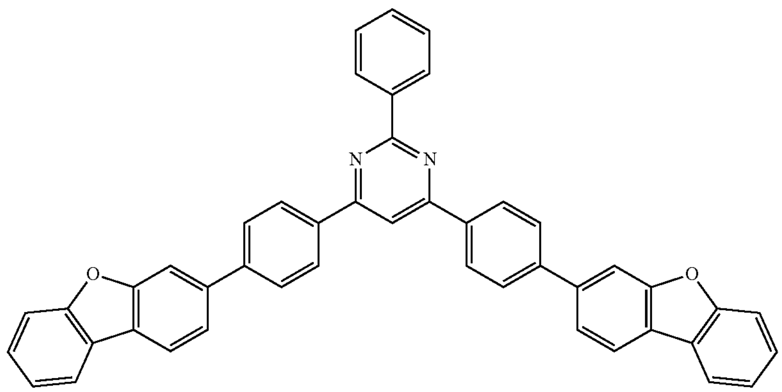
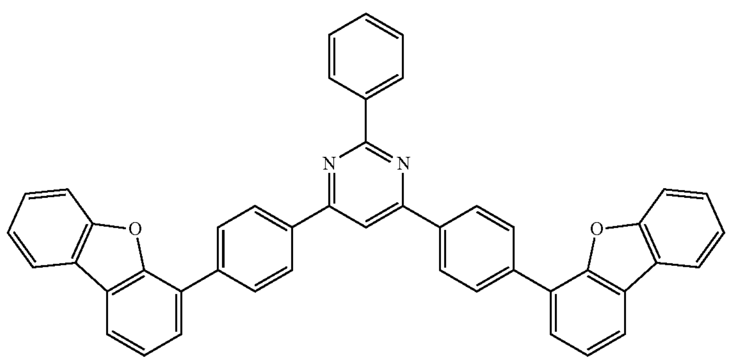
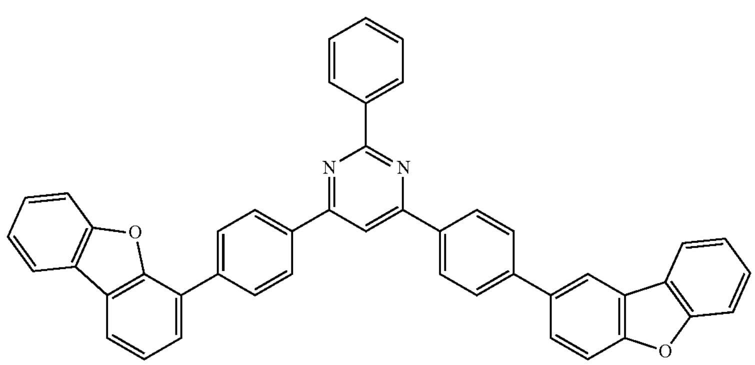

-continued
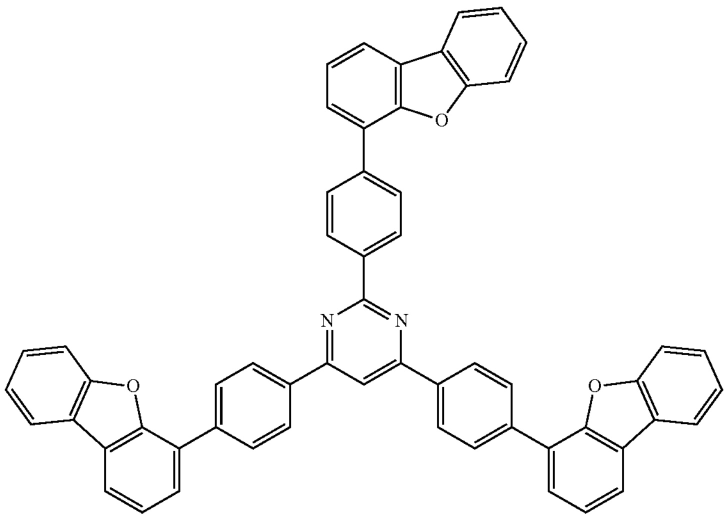
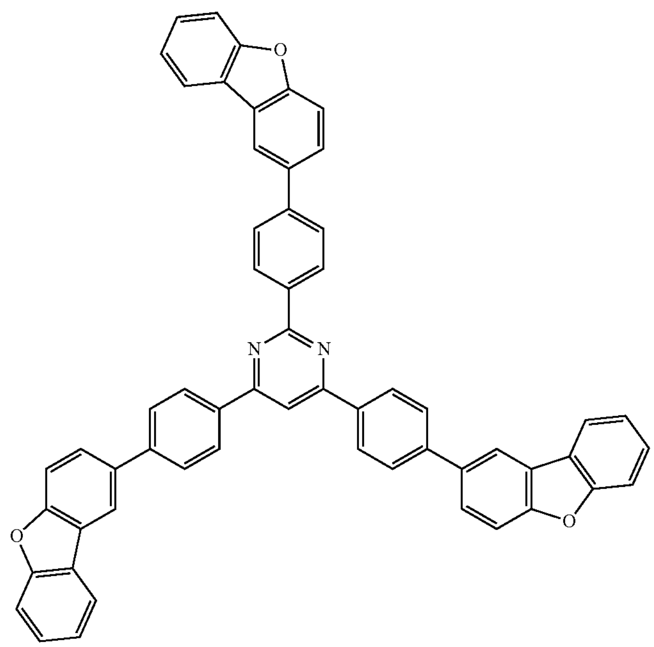
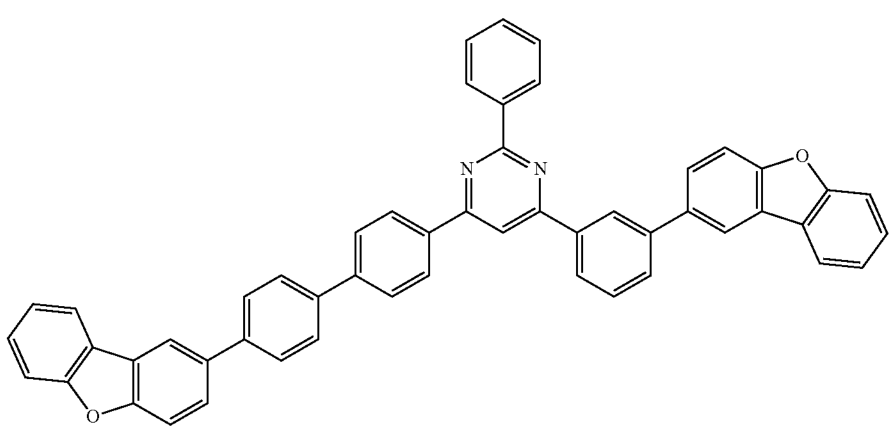

-continued
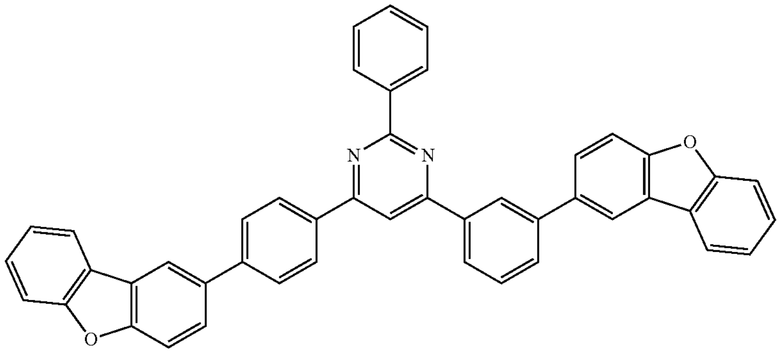
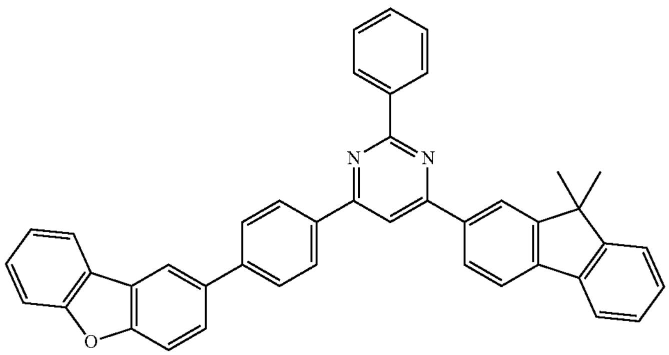
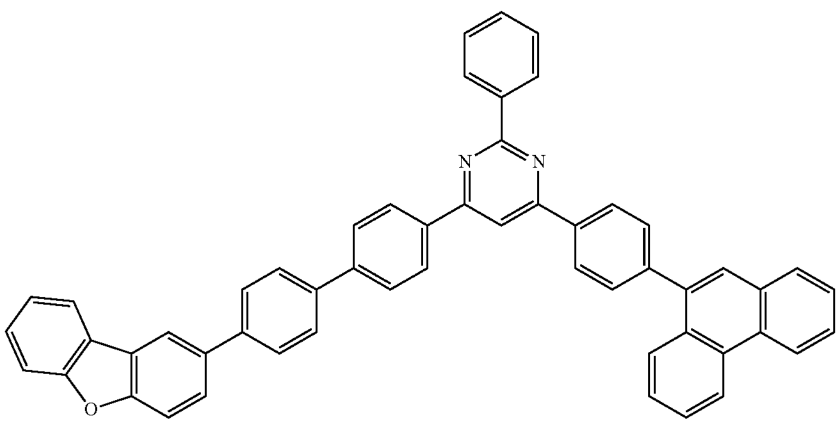
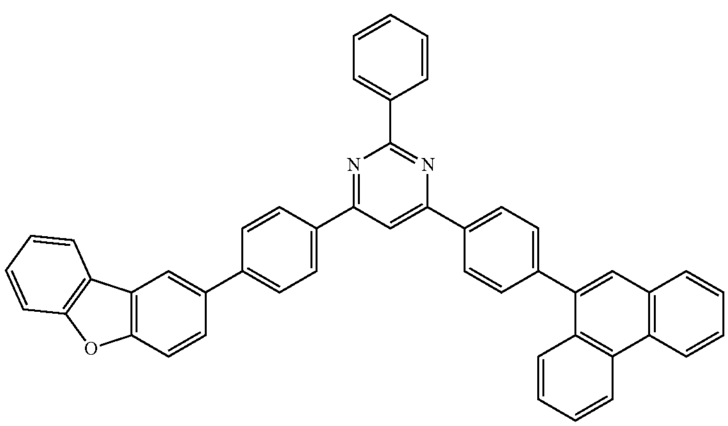

-continued
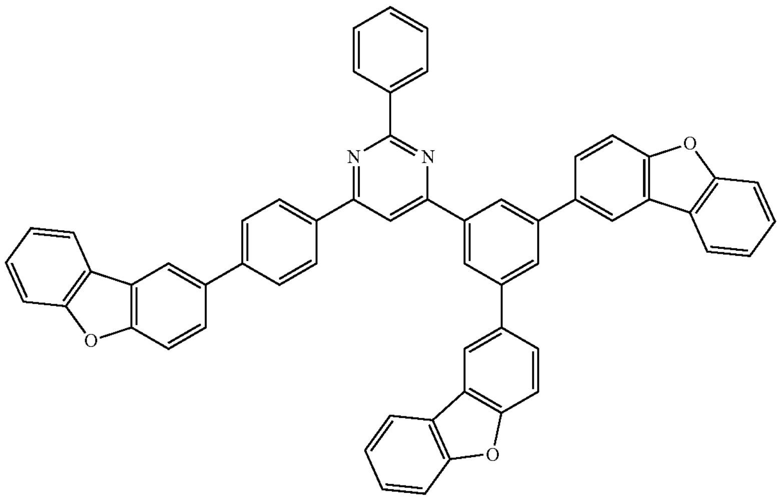
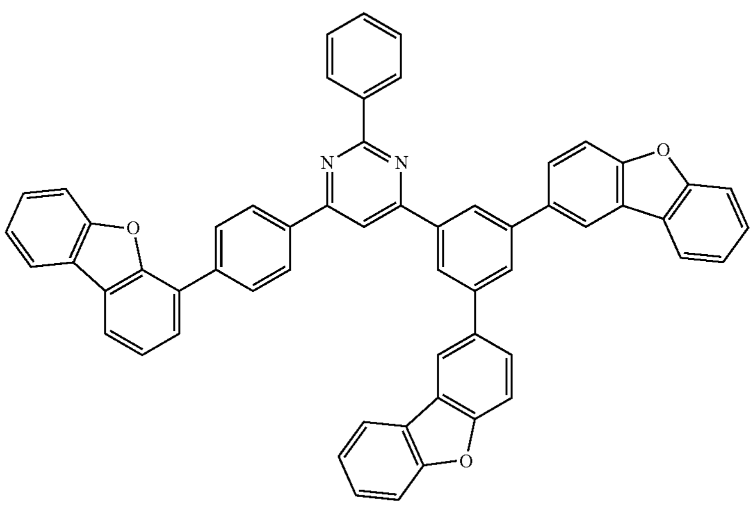
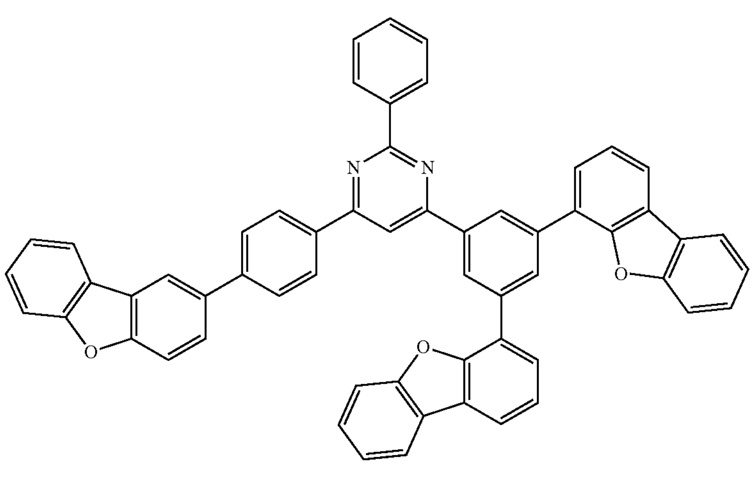

-continued
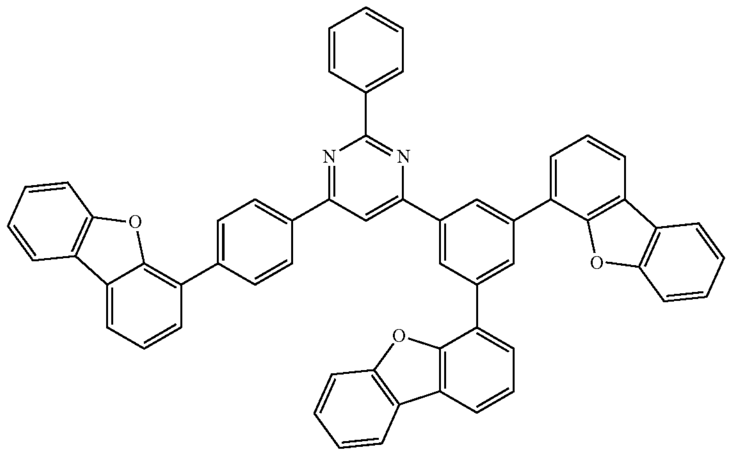
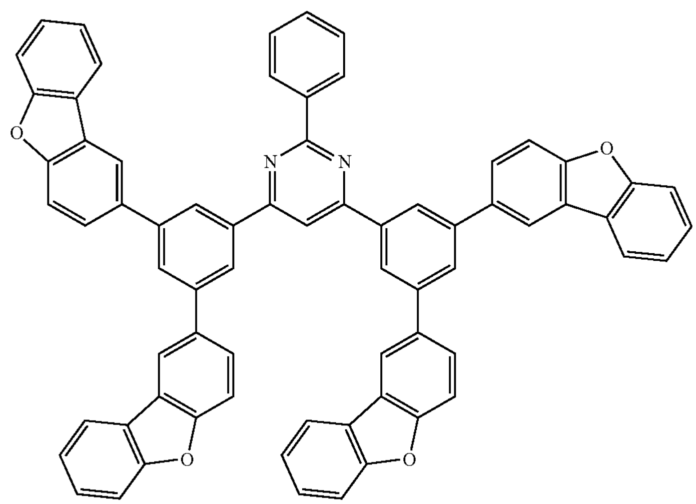
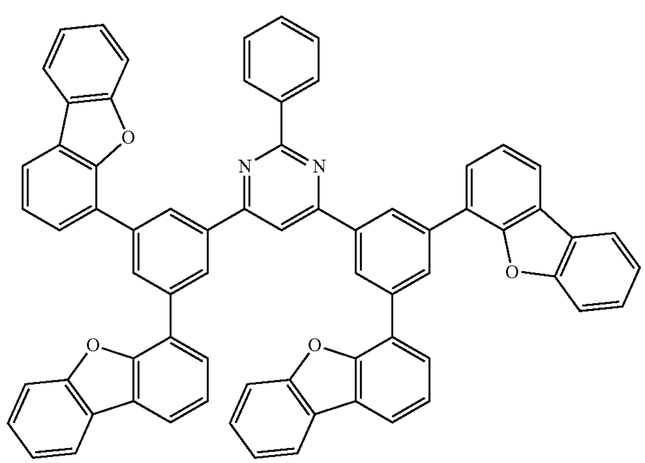

-continued
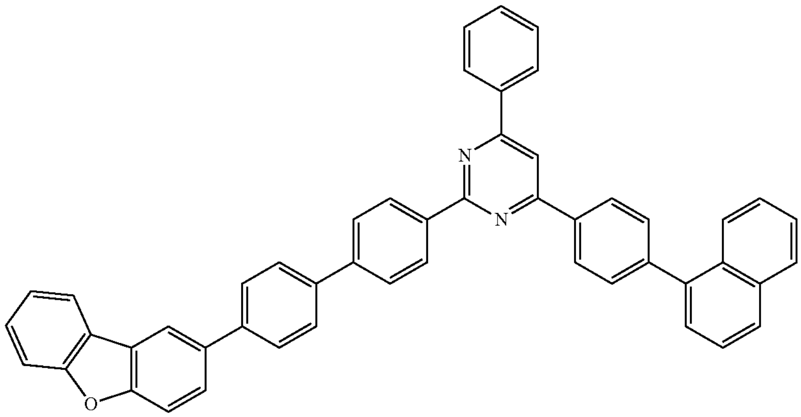
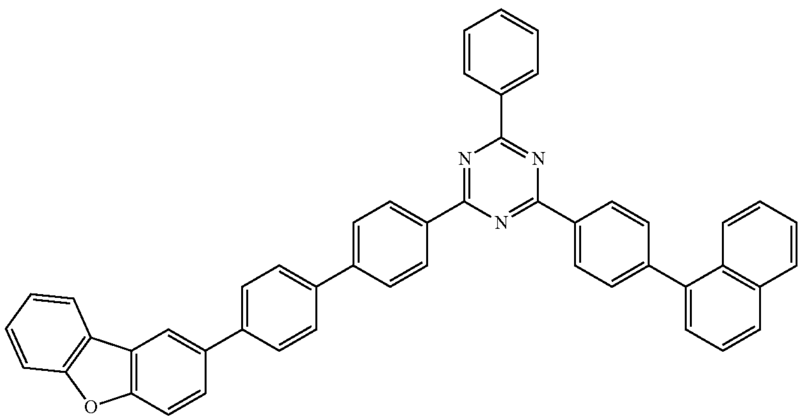
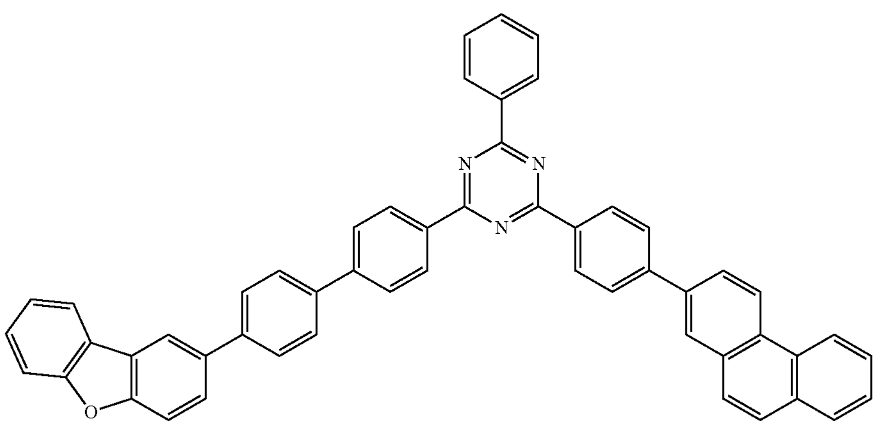
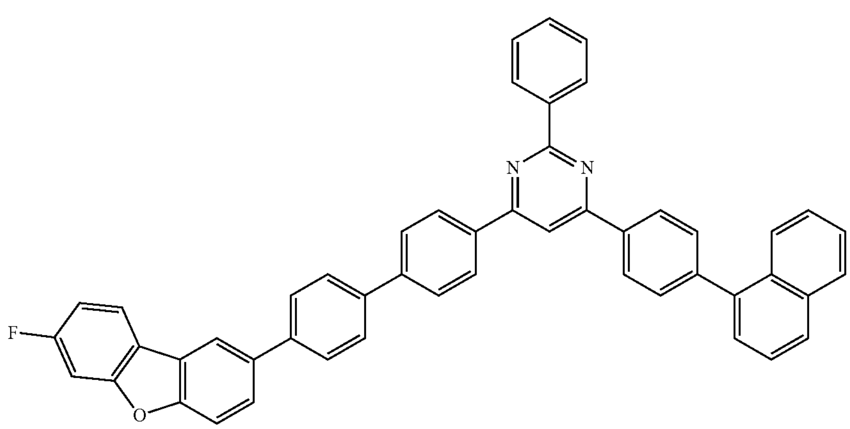

-continued
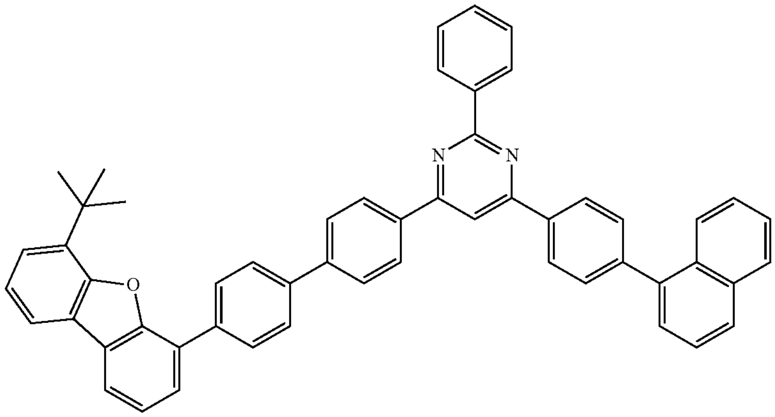
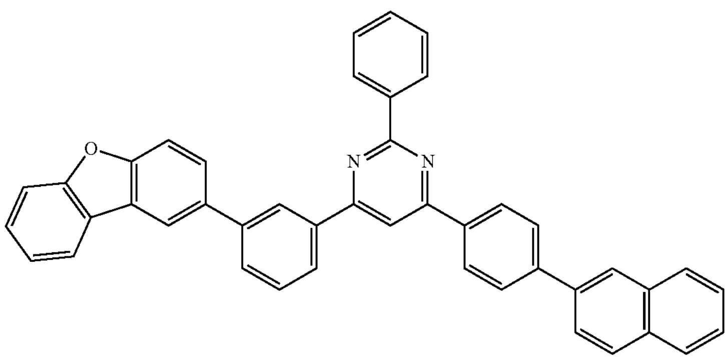
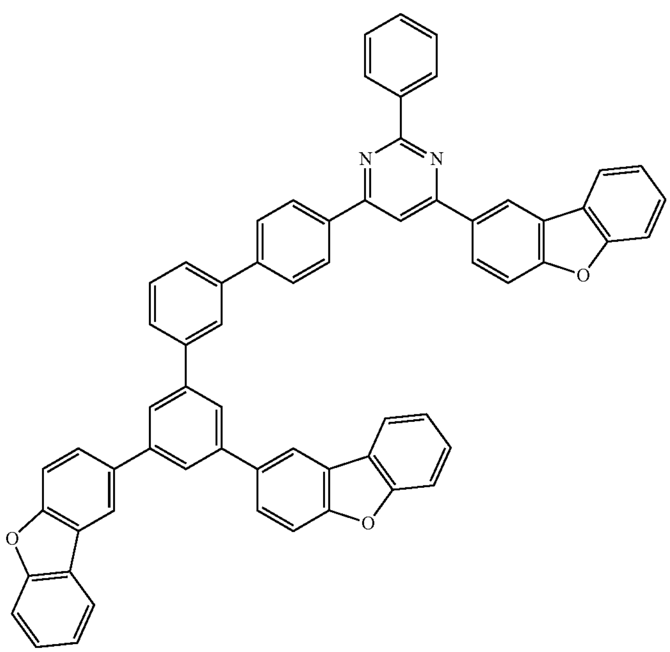

-continued
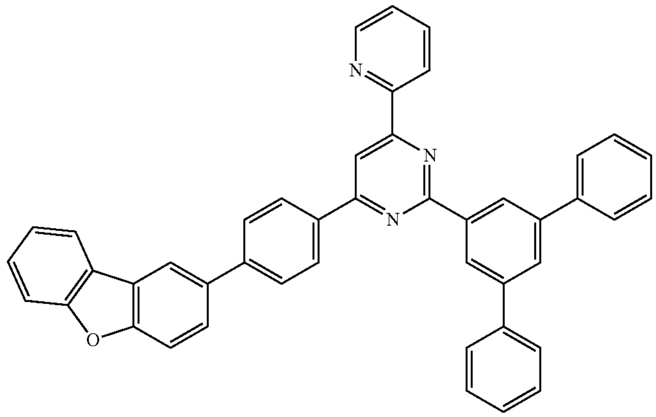
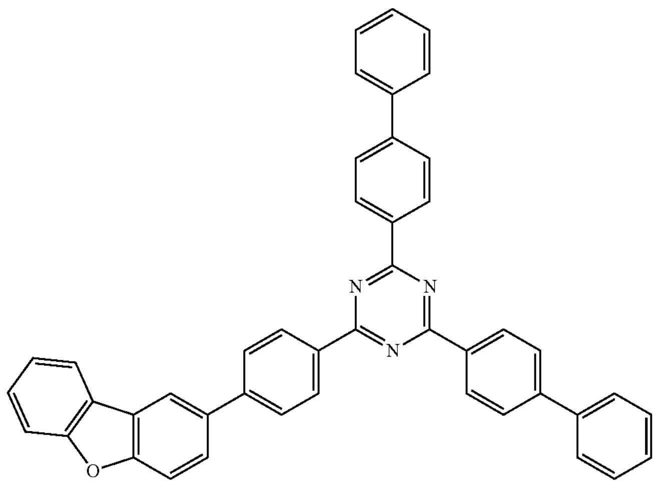
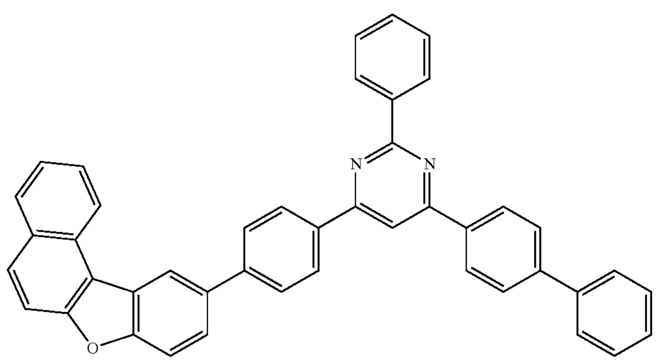
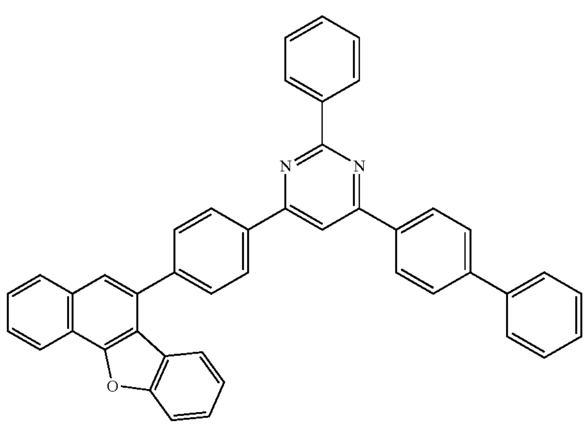

-continued
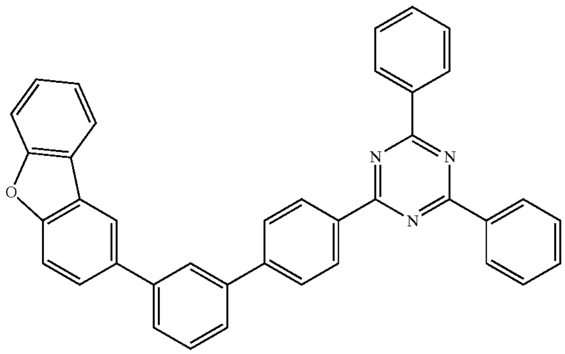
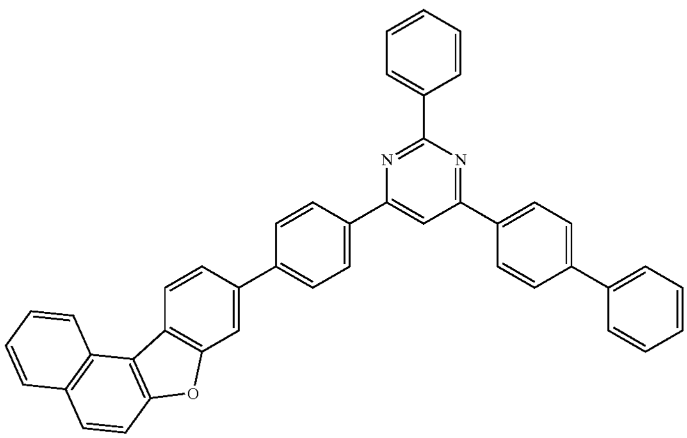
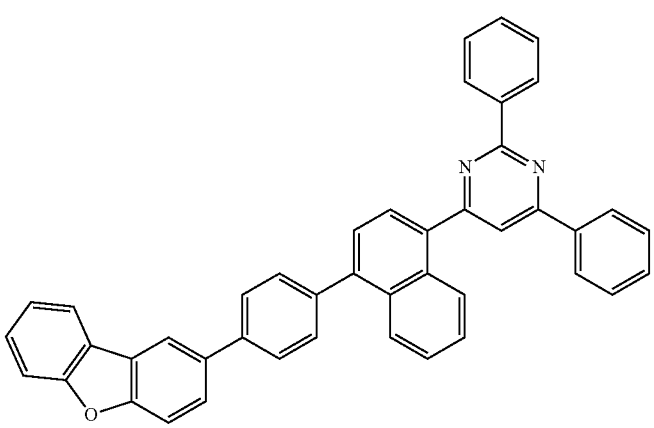
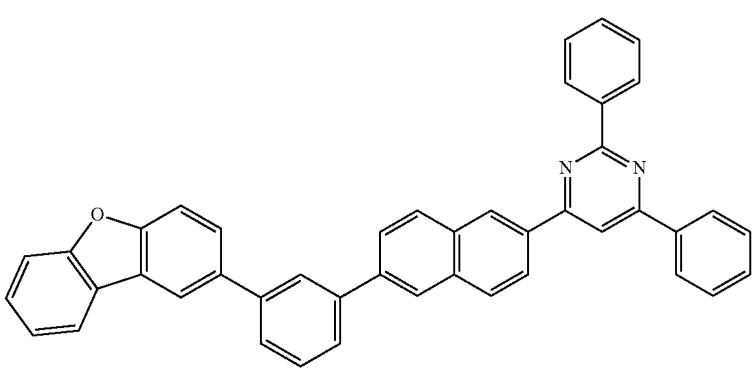

-continued
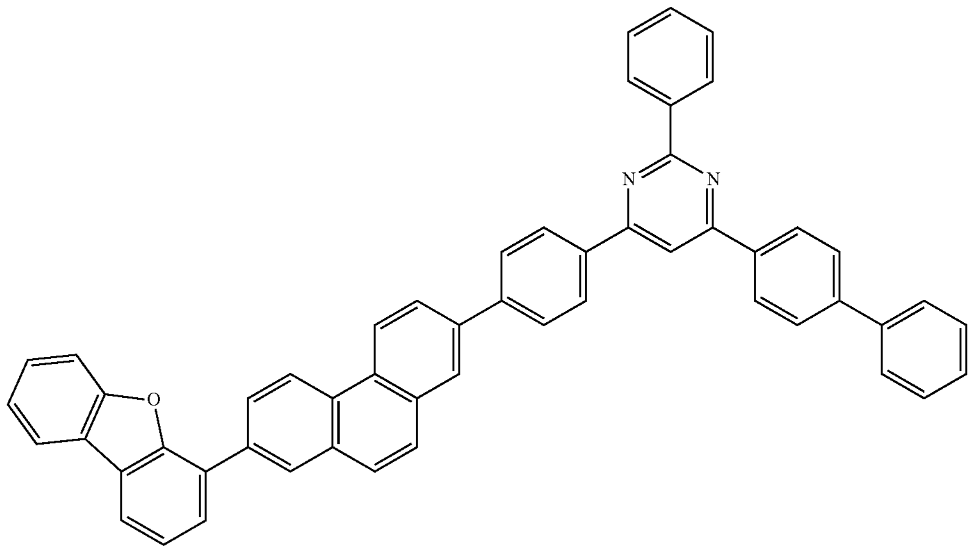
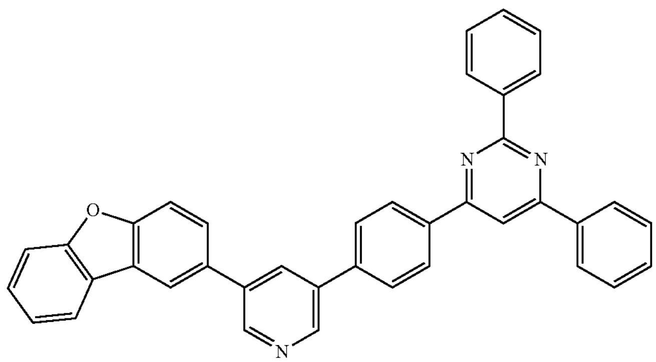
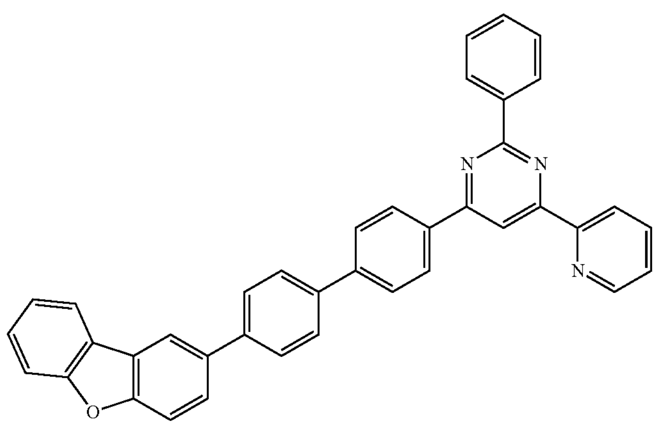
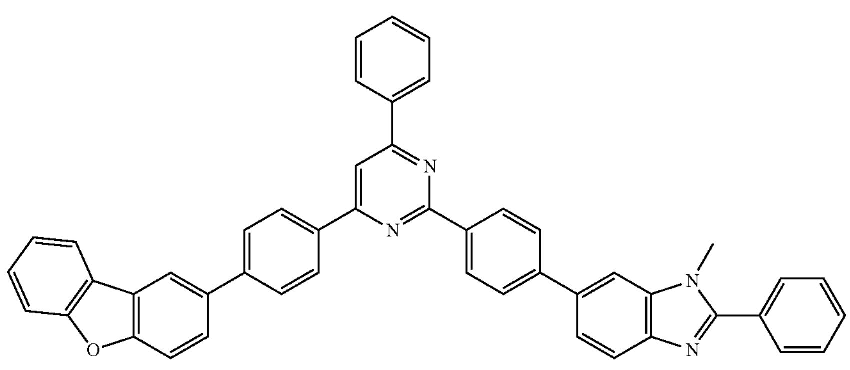

-continued
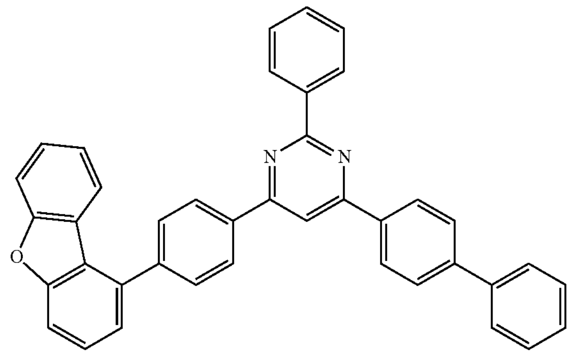
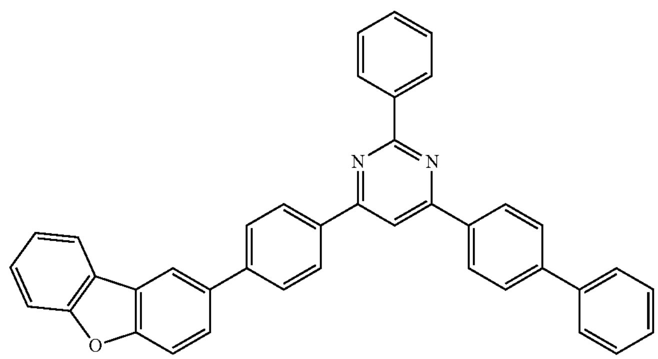
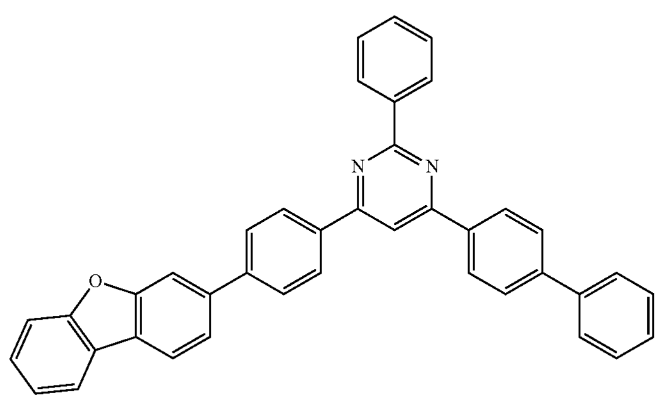
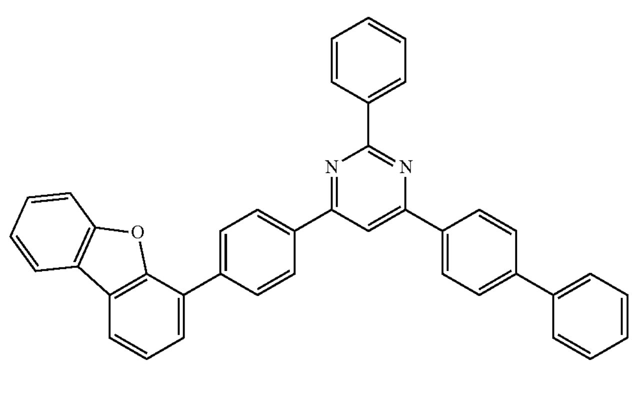

-continued
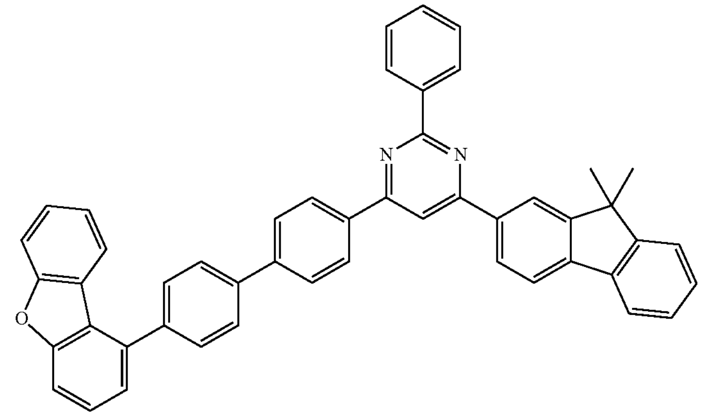
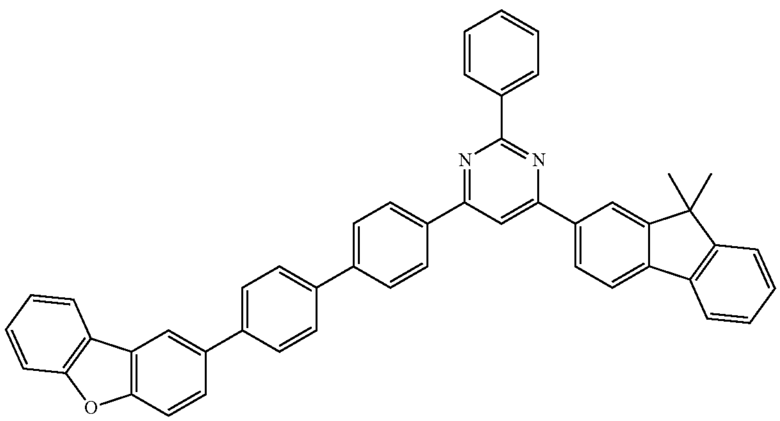 [SMILES: CC1(C)c2ccccc2-c2ccc(-c3cc(-c4ccc(-c5ccc(-c6ccc7oc8ccccc8c7c6)cc5)cc4)nc(-c4ccccc4)n3)cc21]
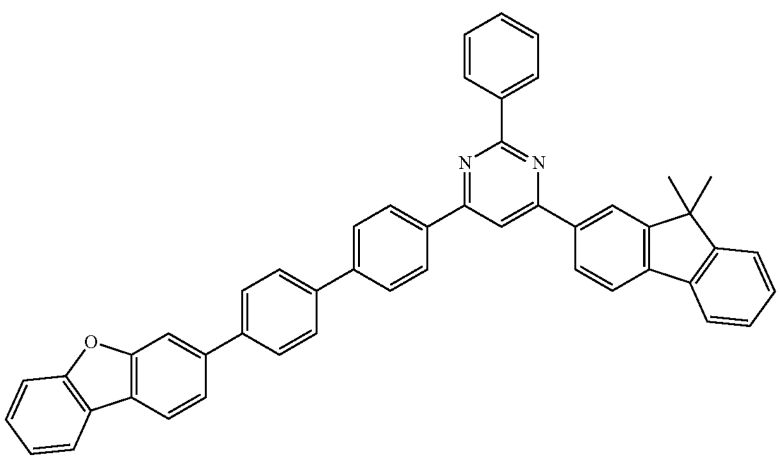
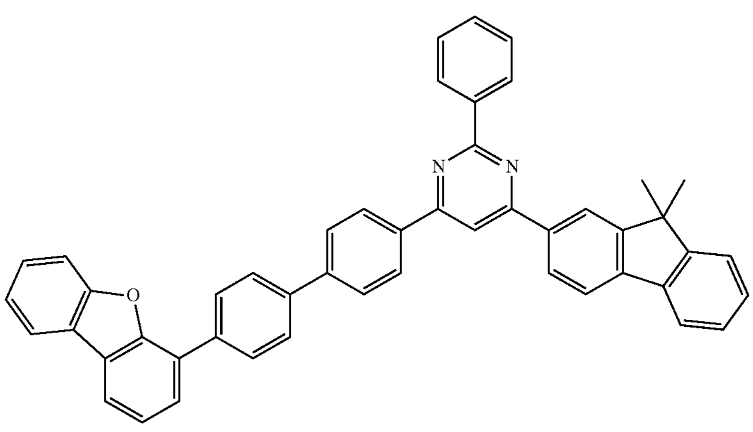

-continued
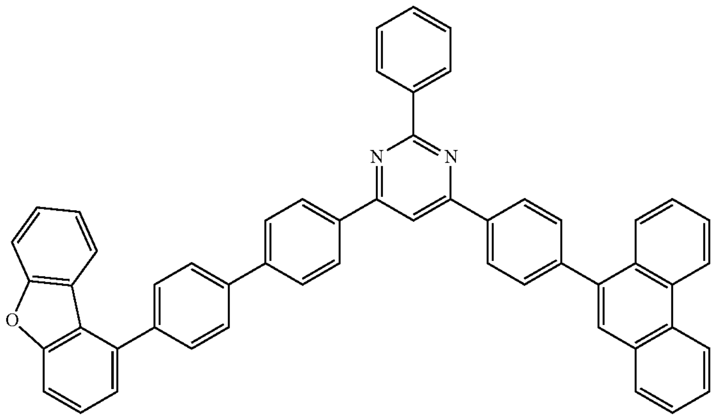
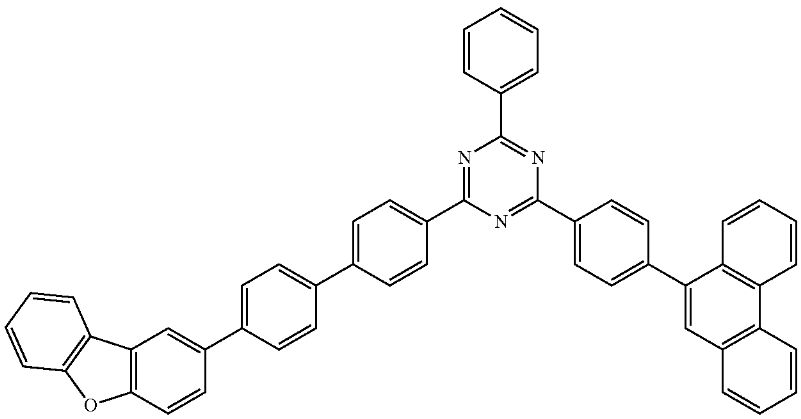
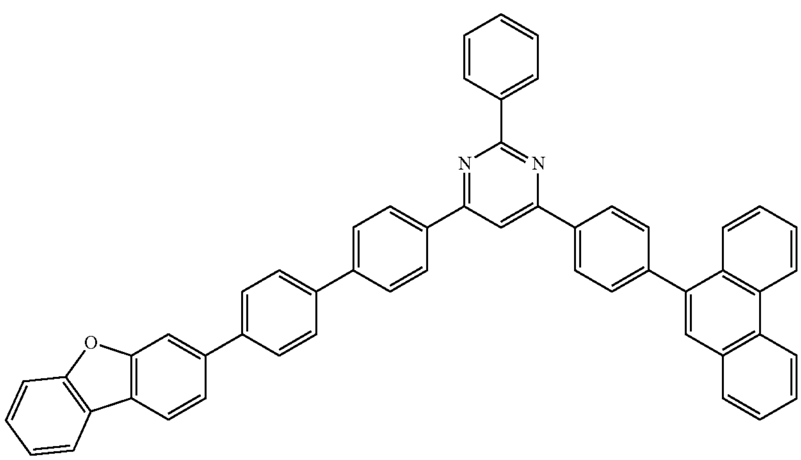 [SMILES: c1ccc(-c2nc(-c3ccc(-c4ccc(-c5ccc6c(c5)oc5ccccc56)cc4)cc3)cc(-c3ccc(-c4cc5ccccc5c5ccccc45)cc3)n2)cc1]
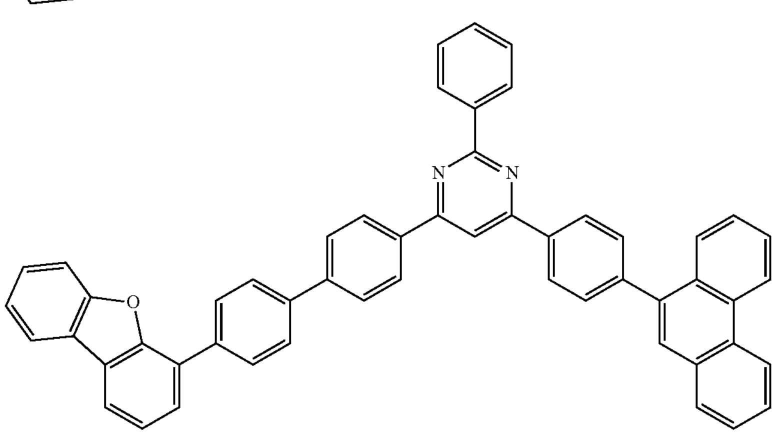

-continued
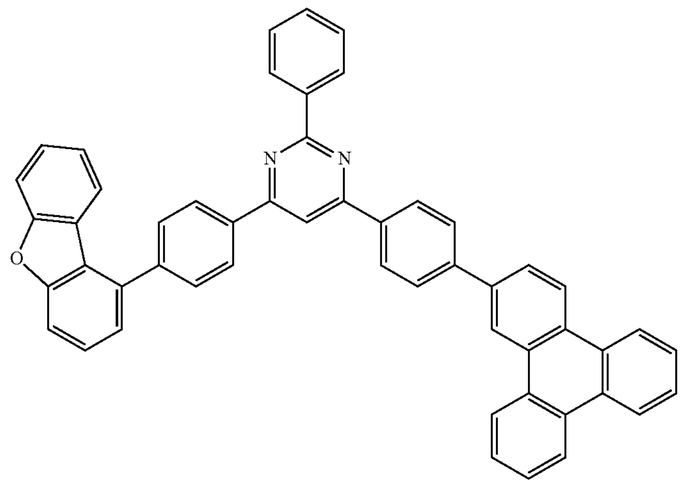
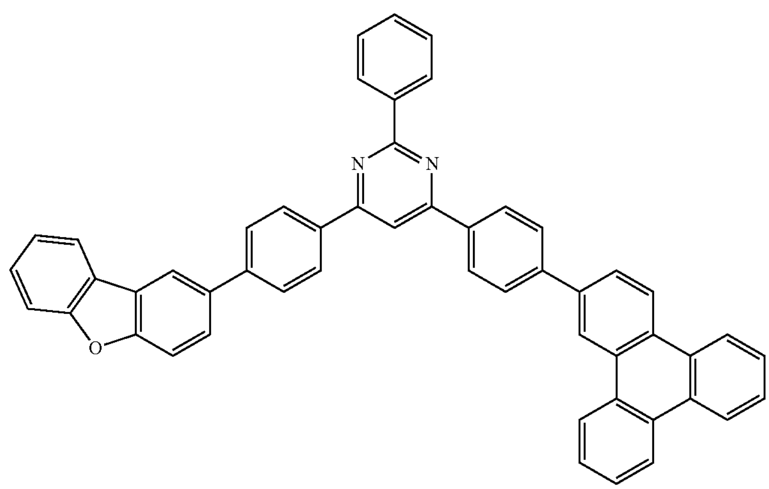
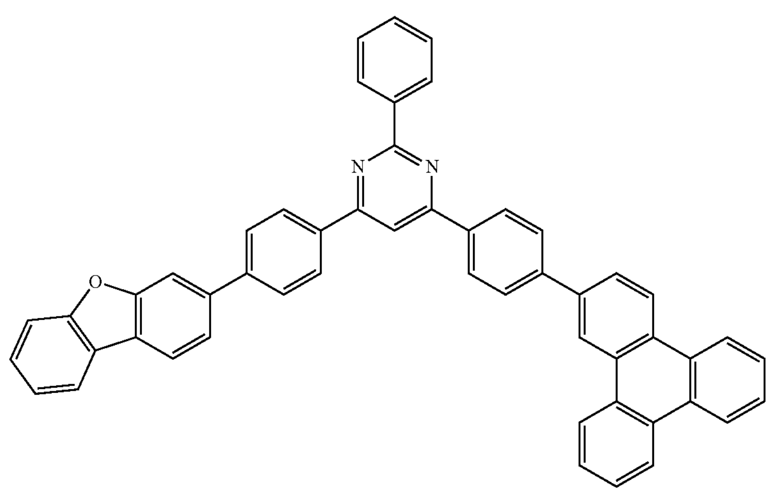

-continued
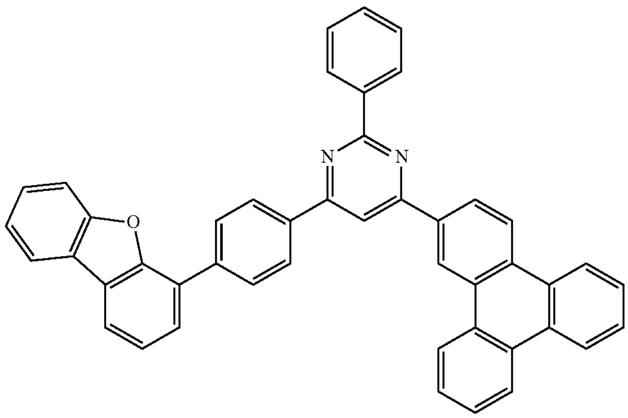
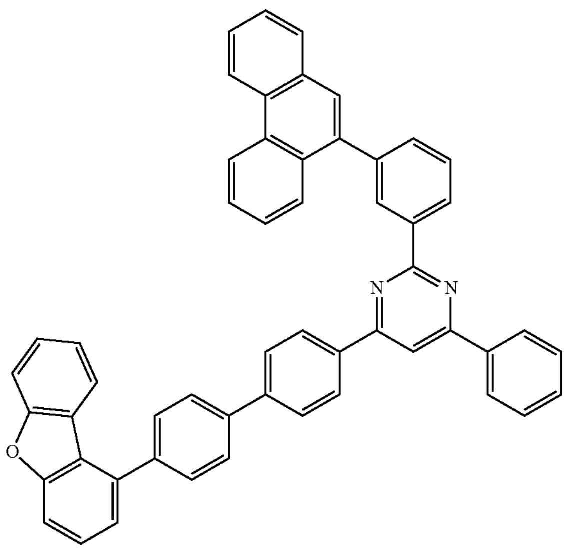
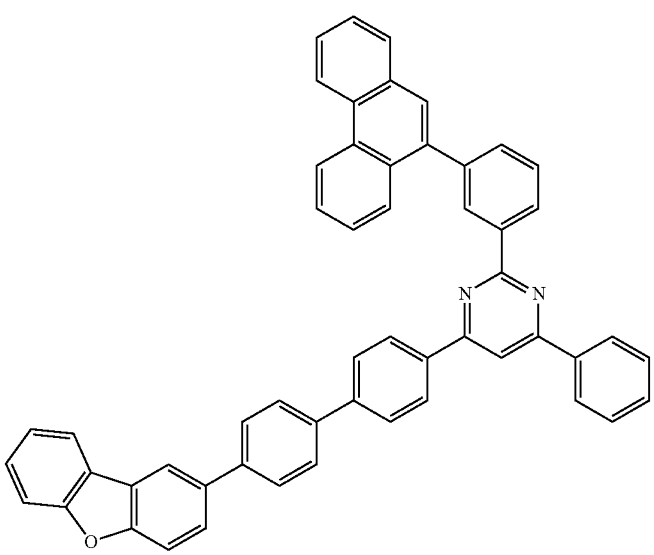

-continued
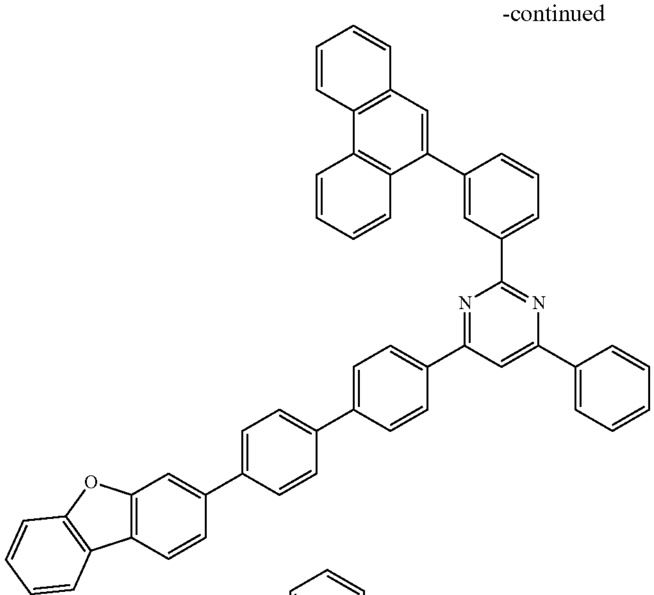
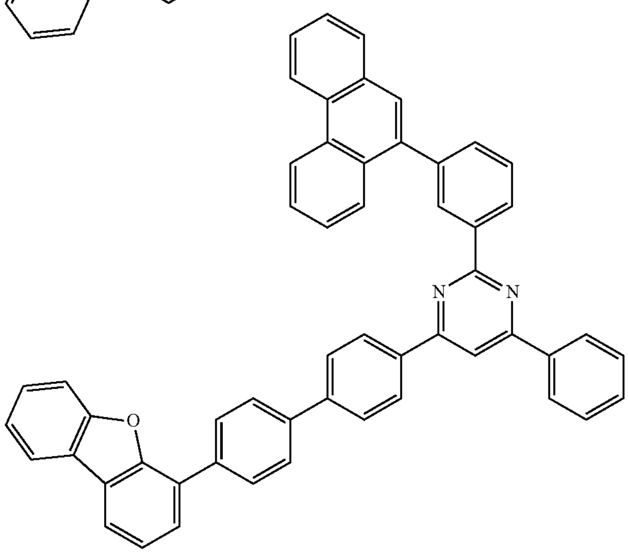
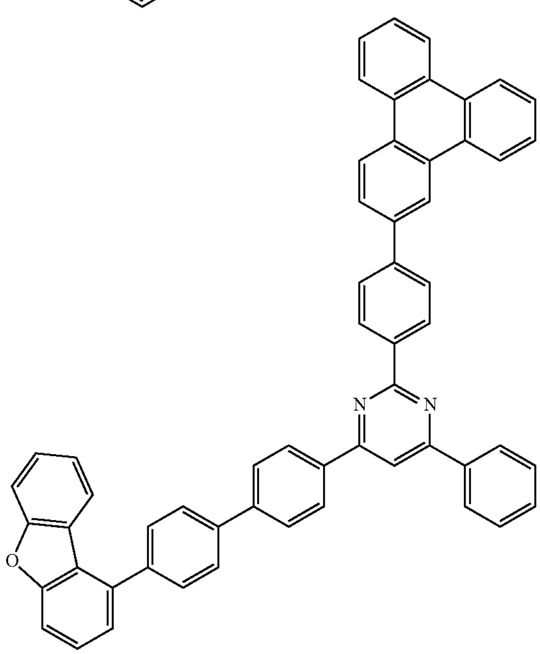

-continued
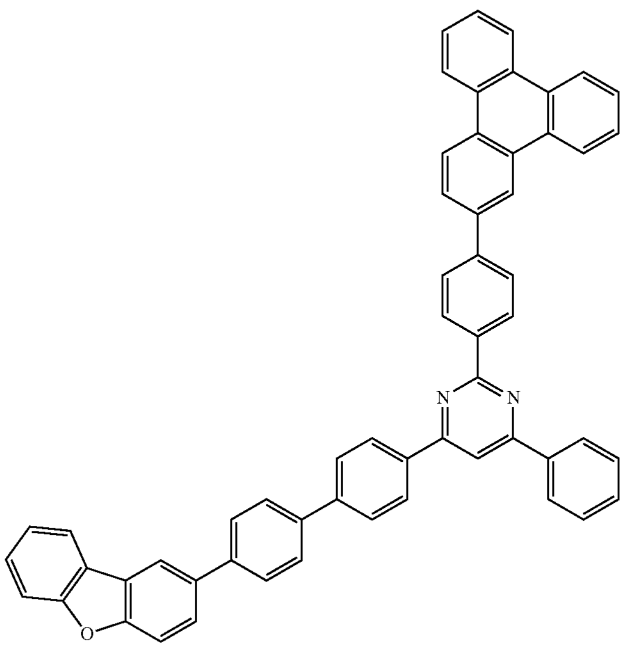
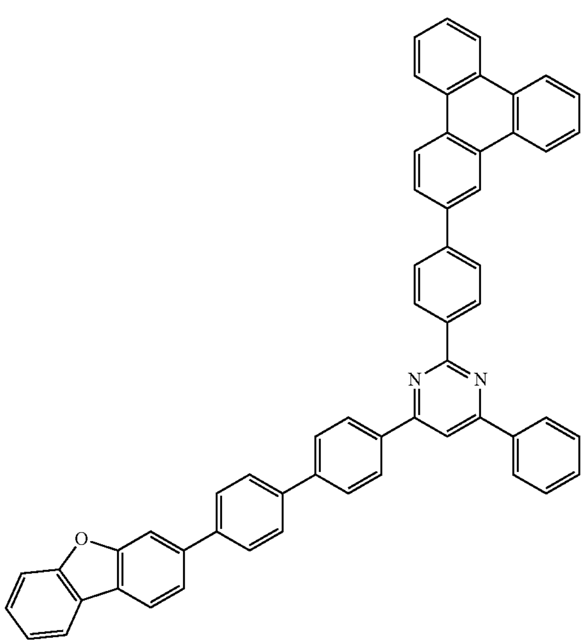 [SMILES: c1ccc(-c2cc(-c3ccc(-c4ccc(-c5ccc6c(c5)oc5ccccc56)cc4)cc3)nc(-c3ccc(-c4ccc5c6ccccc6c6ccccc6c5c4)cc3)n2)cc1]

-continued
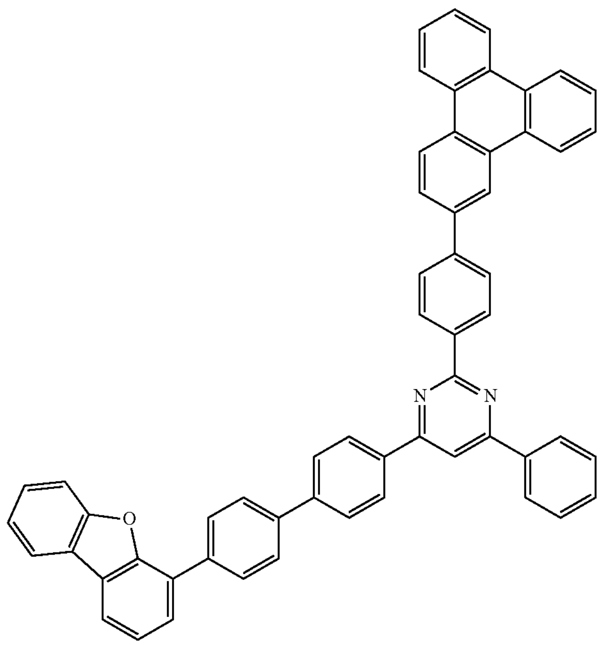
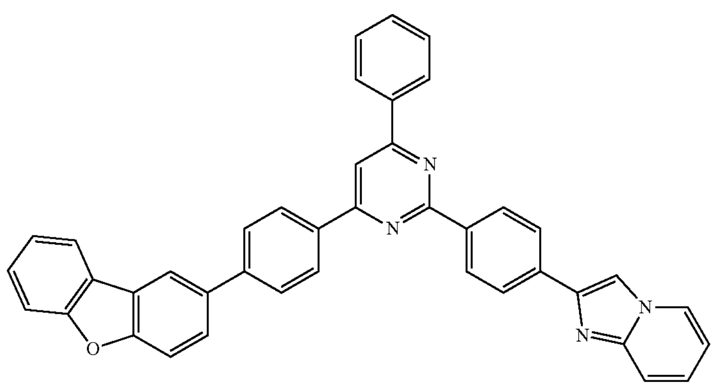
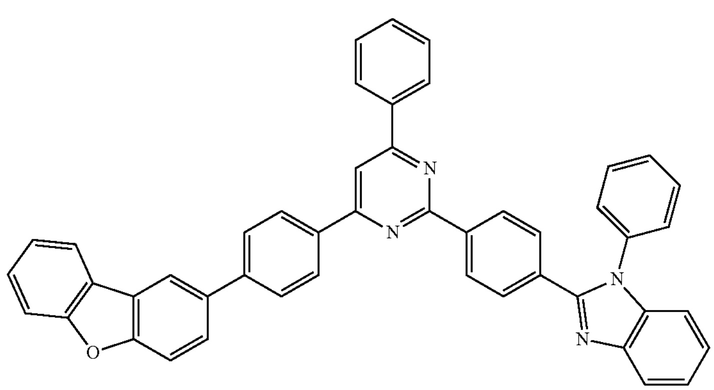

-continued
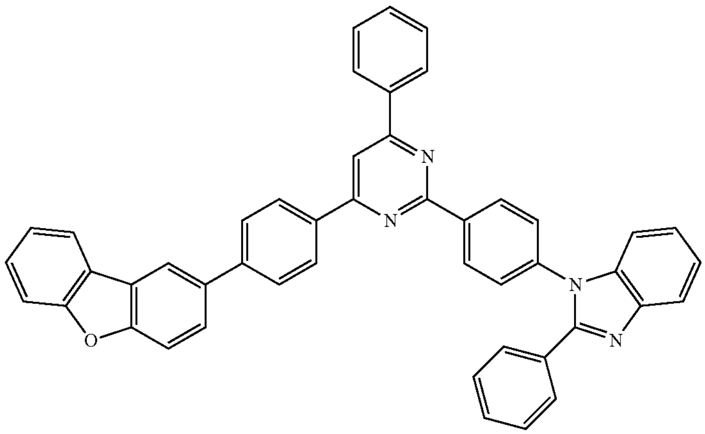
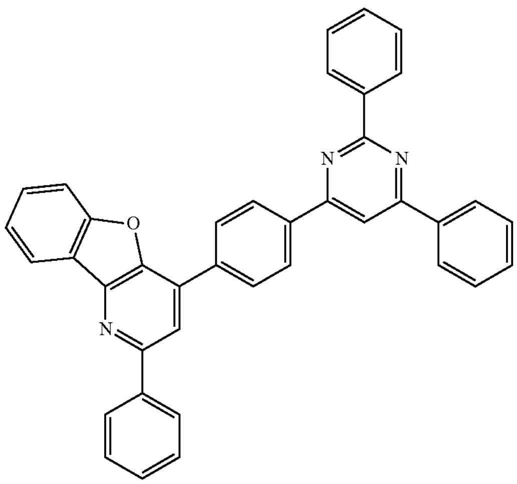
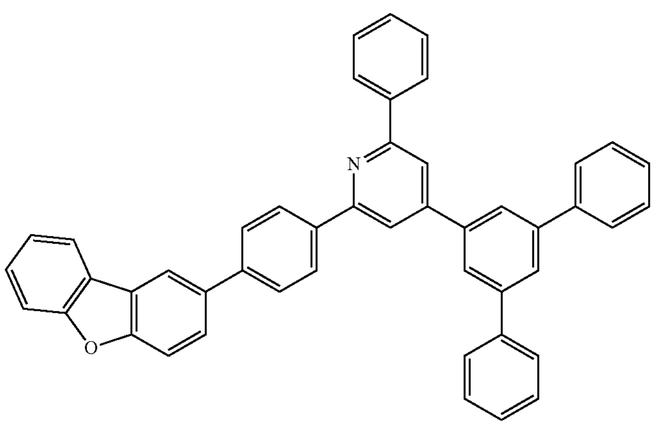
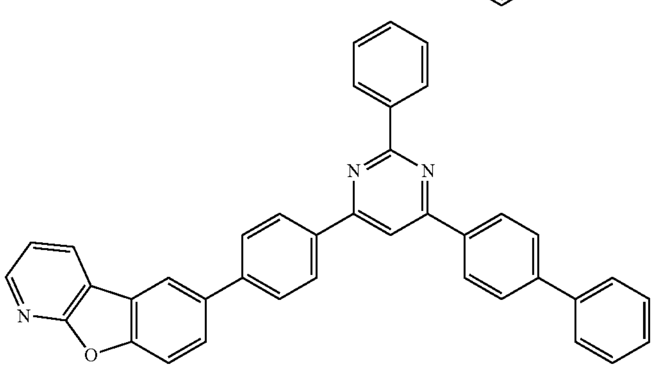

-continued
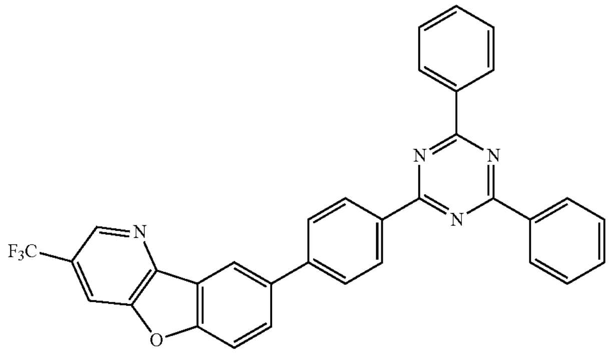 [SMILES: FC(F)(F)c1cnc2c(c1)oc1ccc(-c3ccc(-c4nc(-c5ccccc5)nc(-c5ccccc5)n4)cc3)cc12]
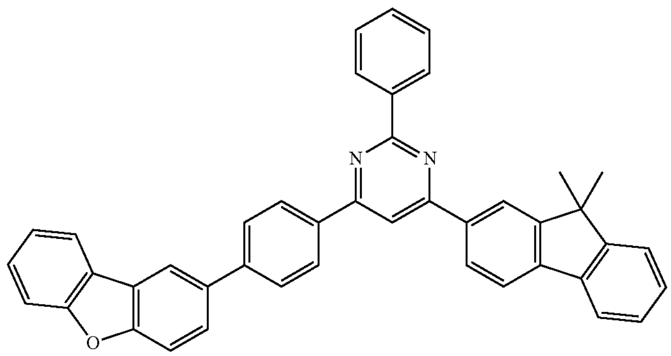
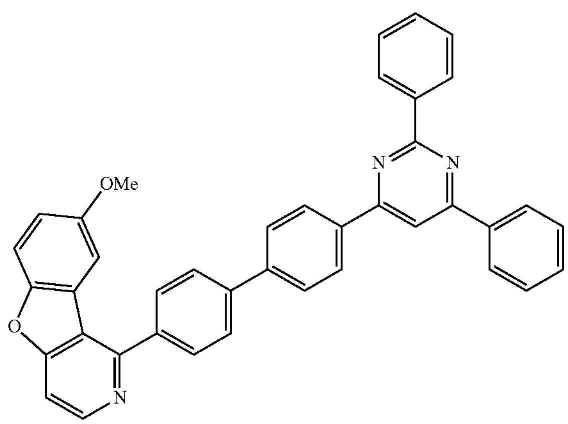
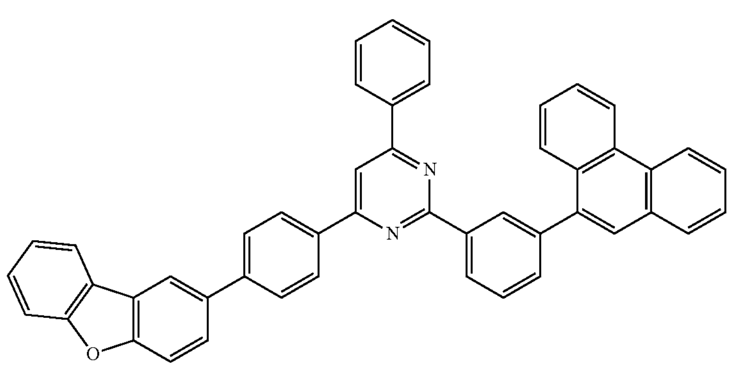

-continued
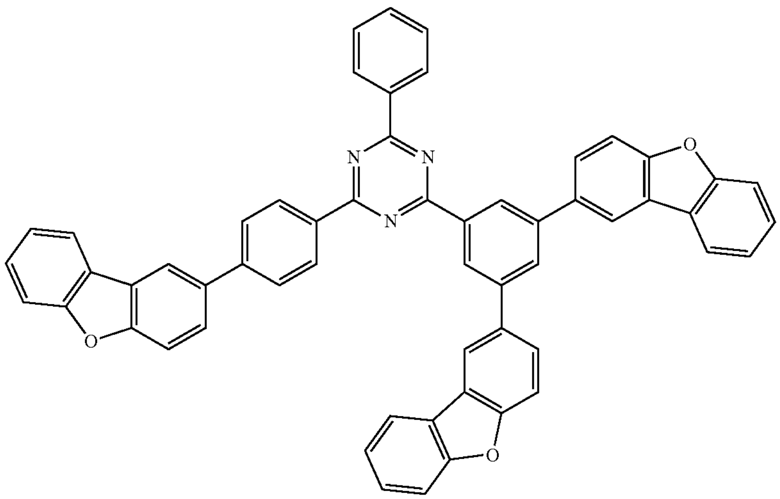
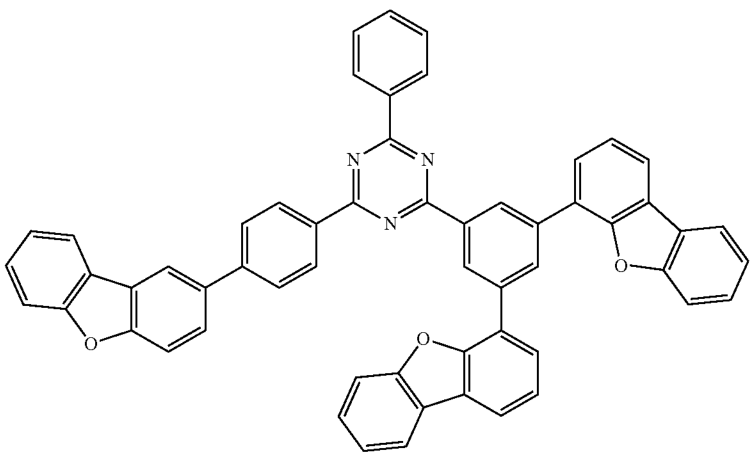
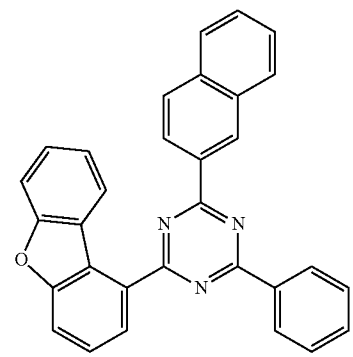
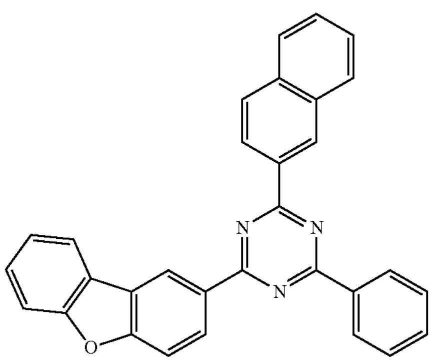
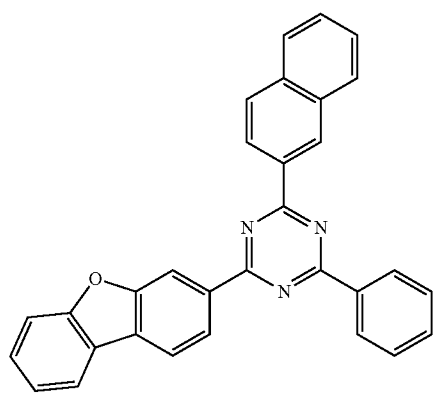
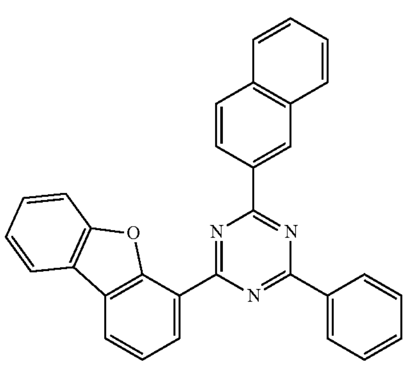
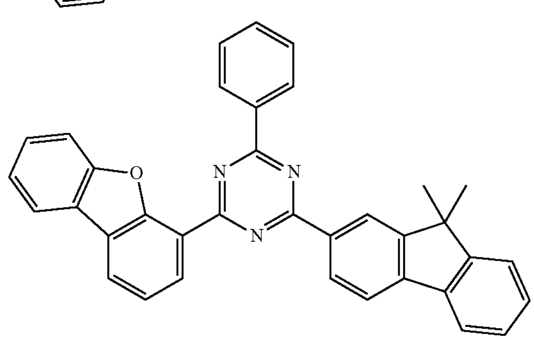

-continued
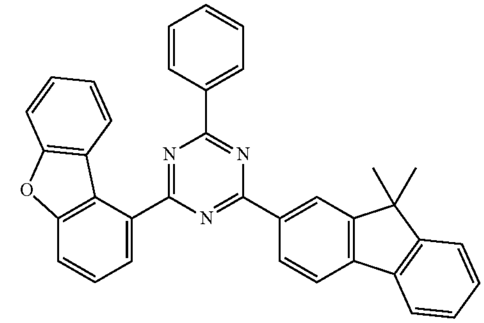
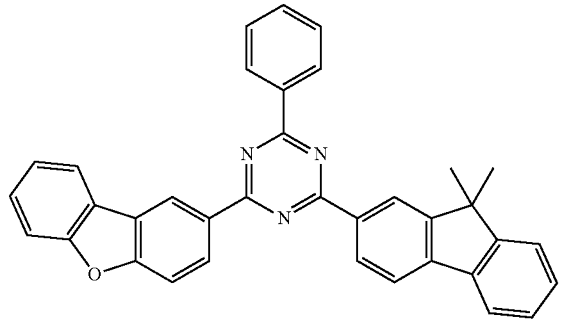
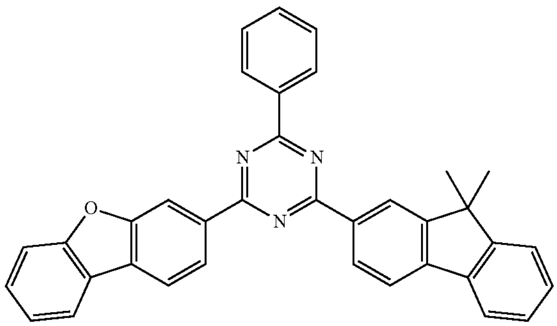
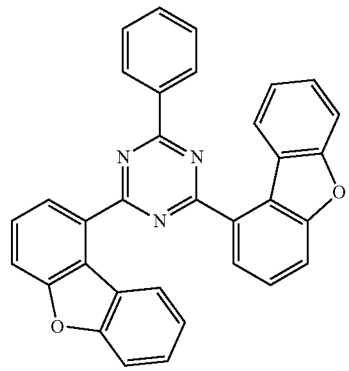
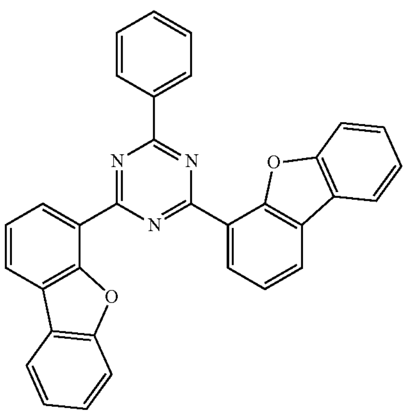
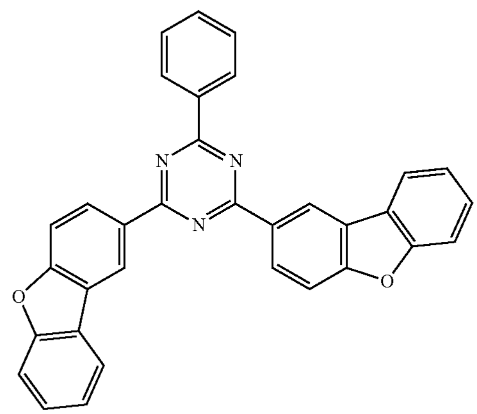
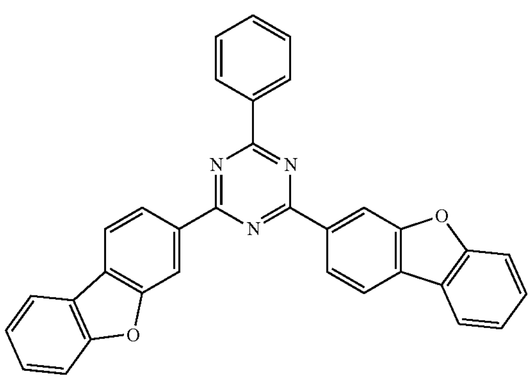
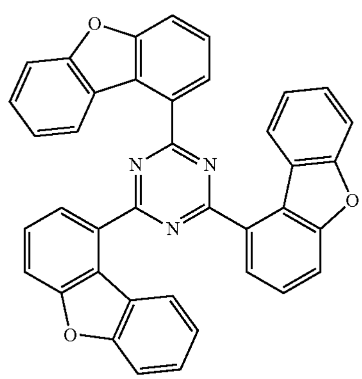

-continued
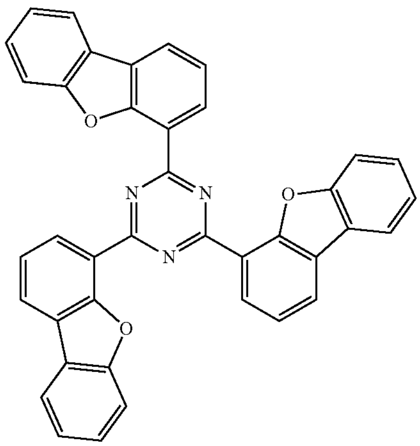
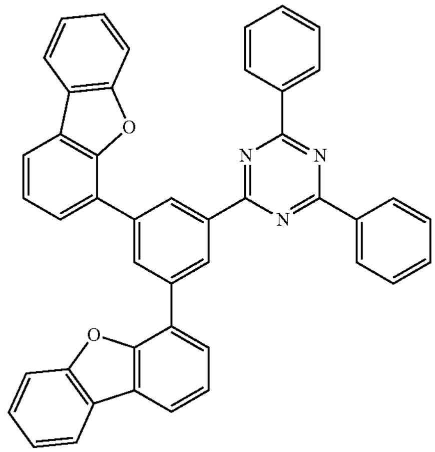
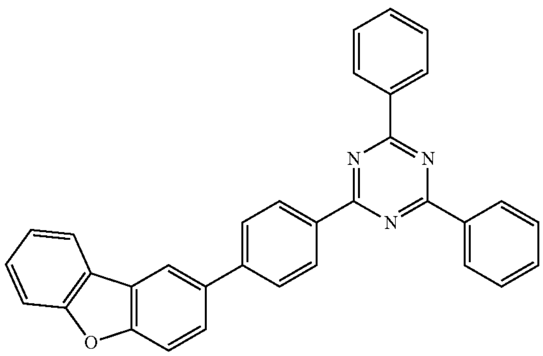
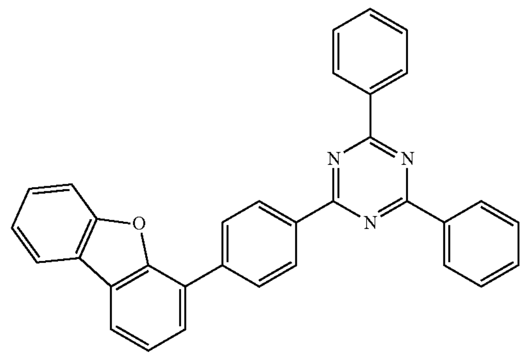
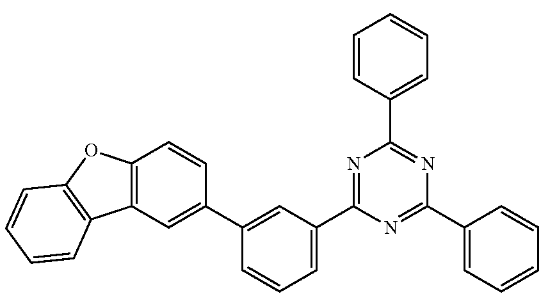
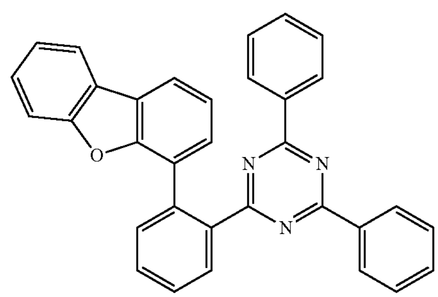
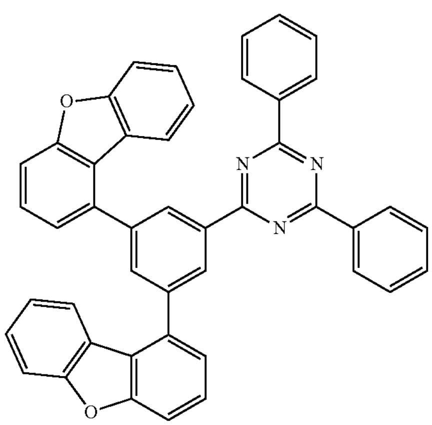
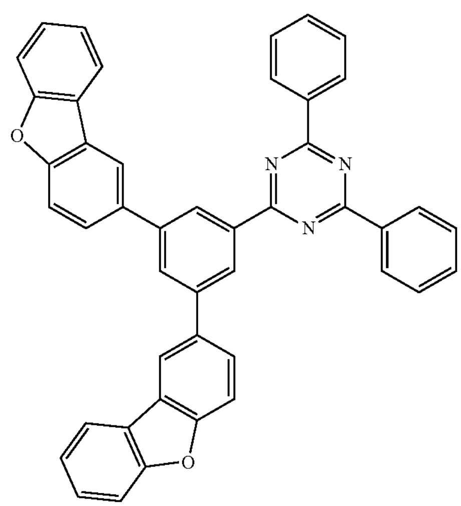

-continued
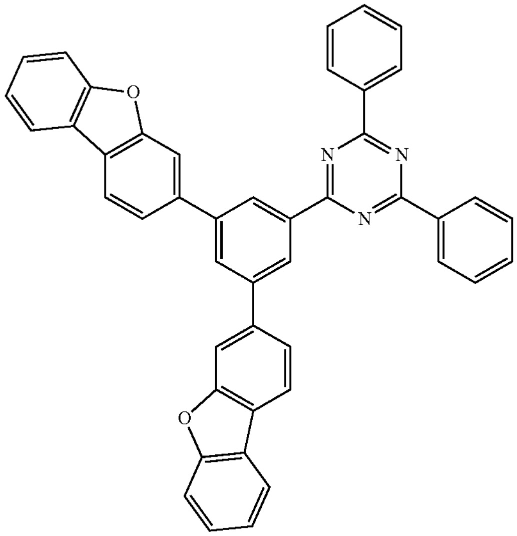
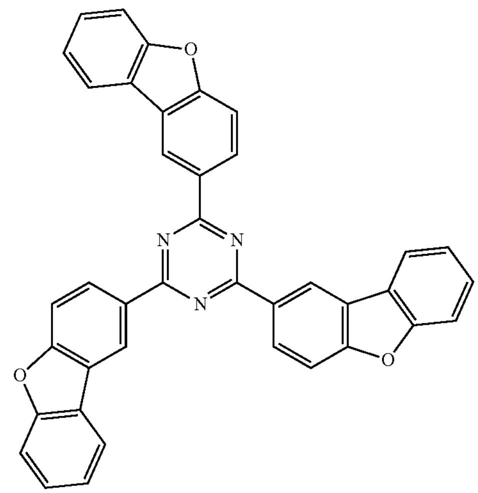
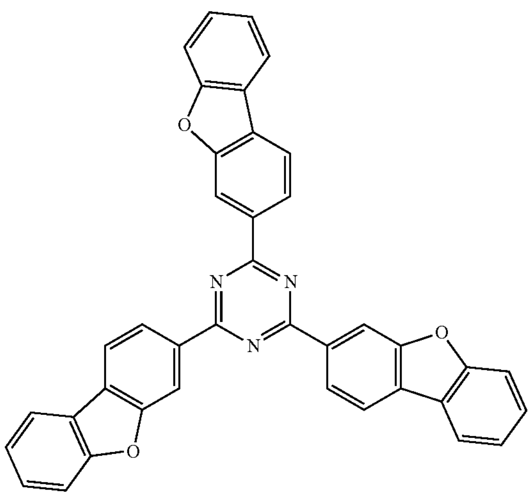
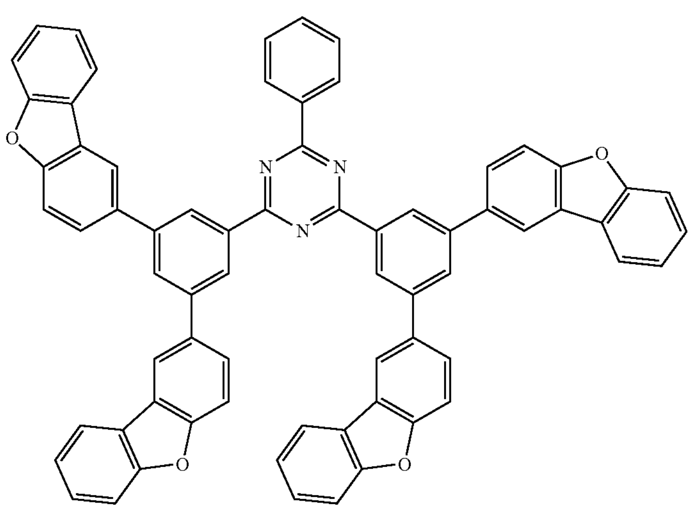

-continued
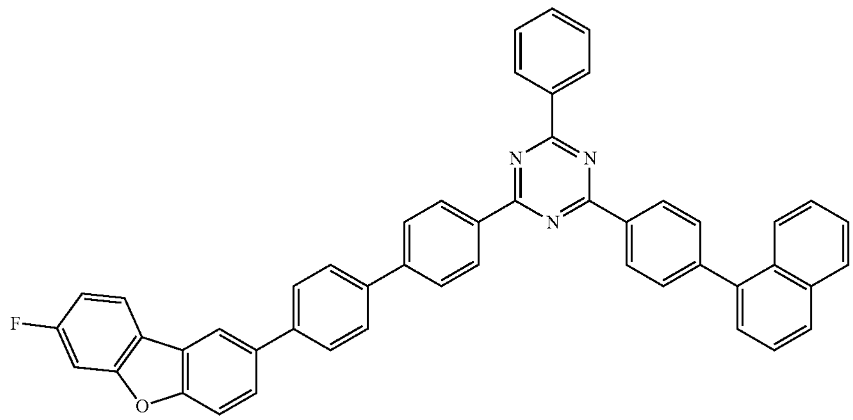
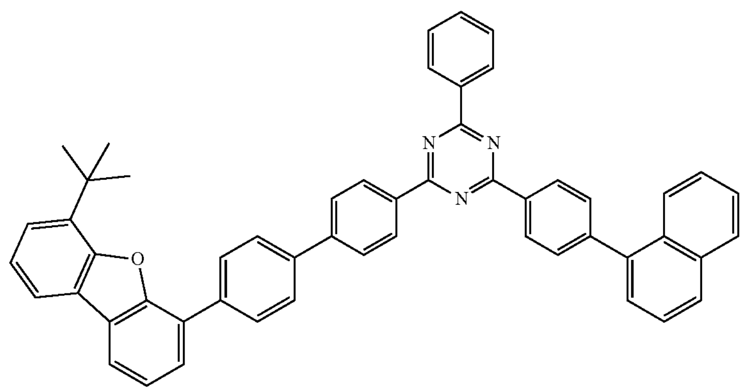
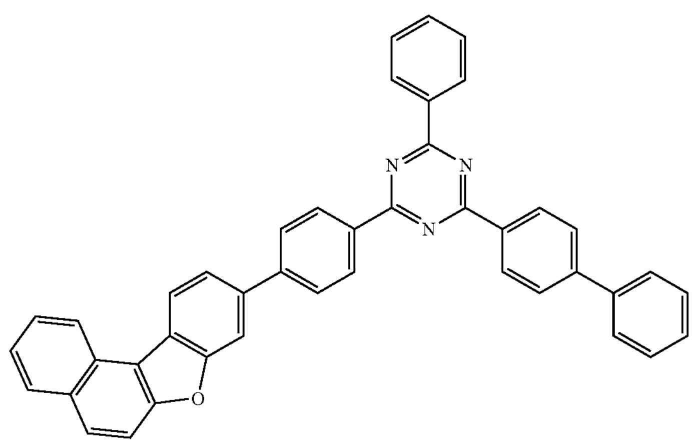
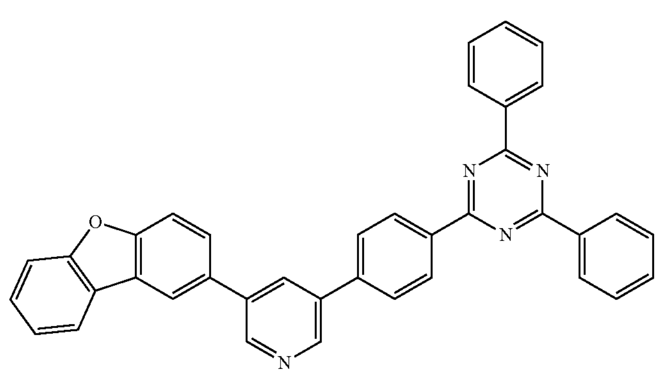

-continued
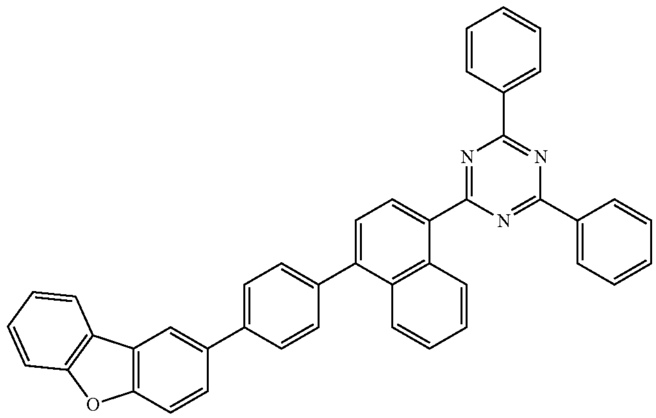
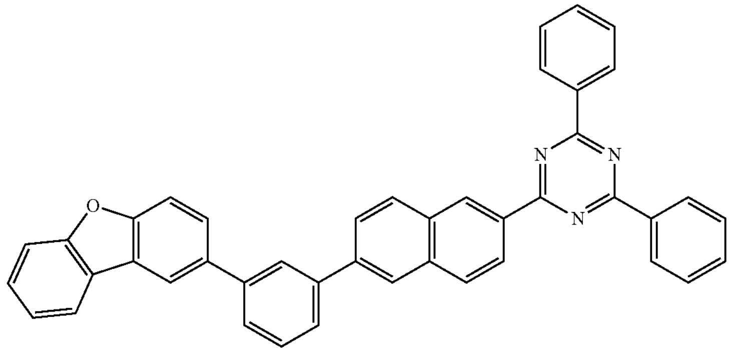
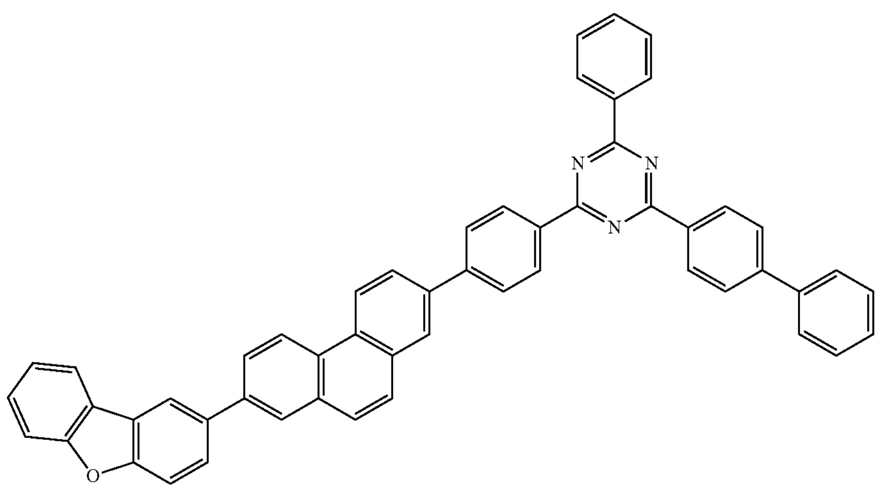
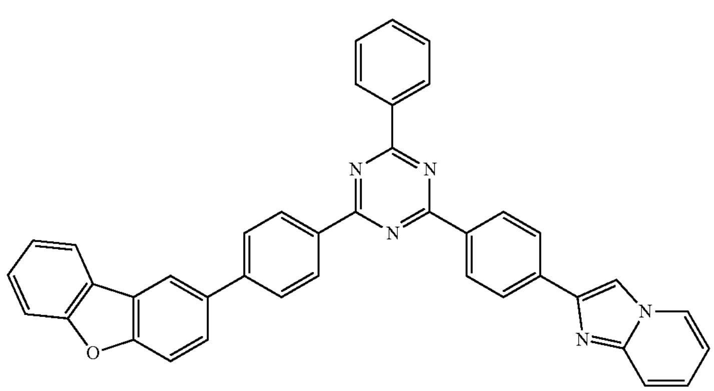

-continued
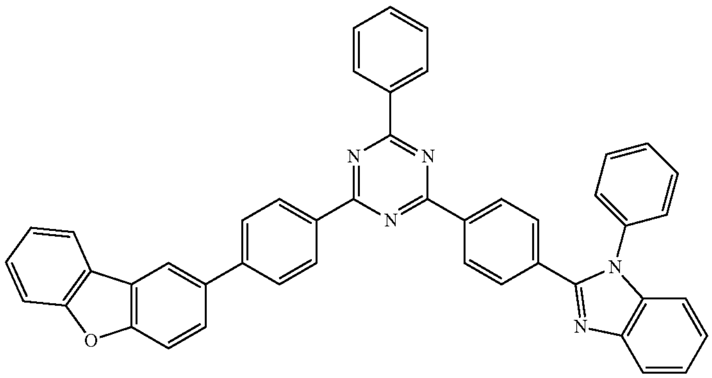
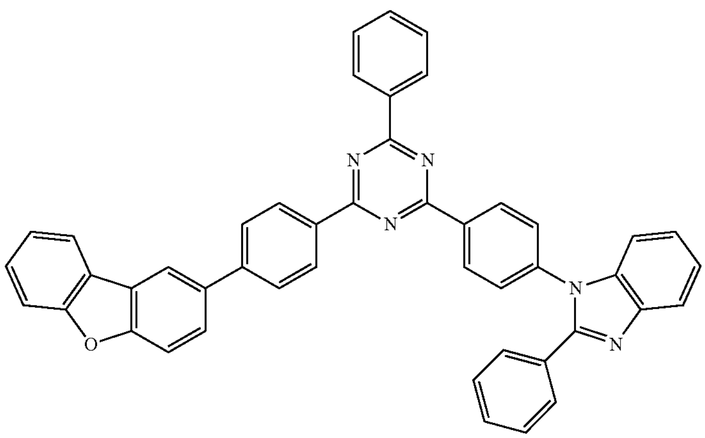
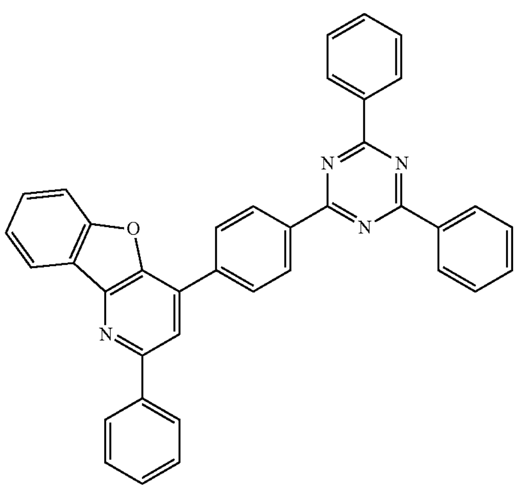
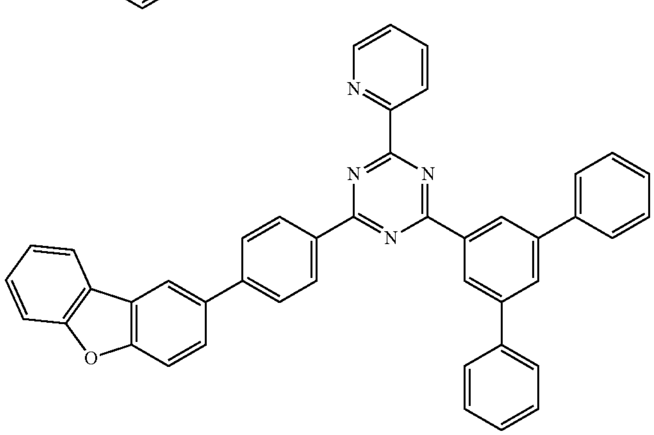

-continued
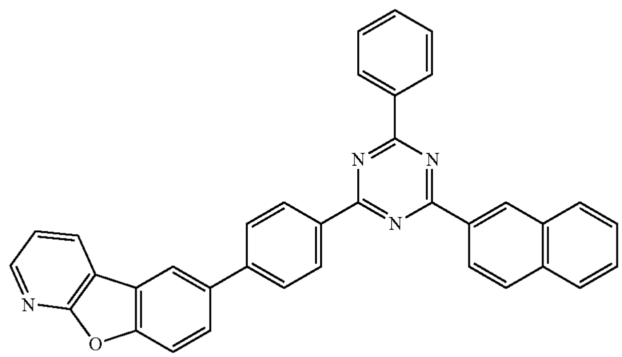
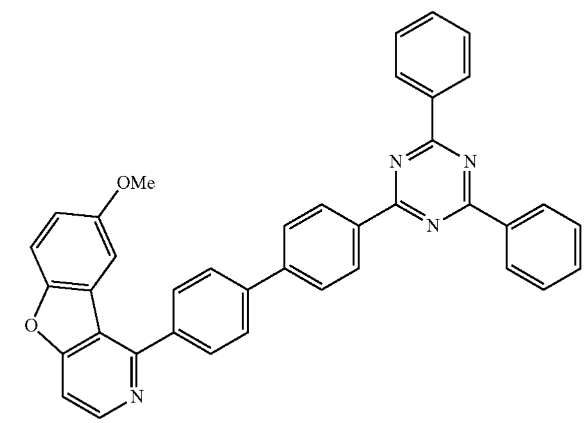
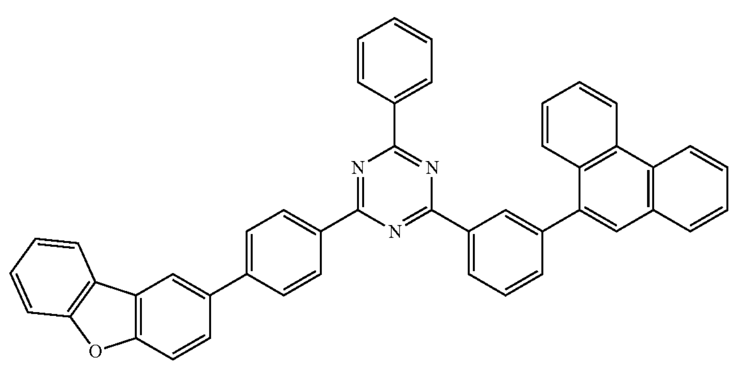
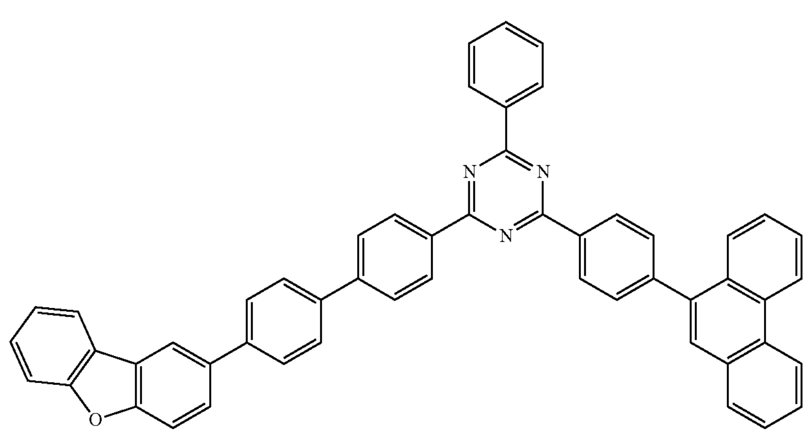

-continued
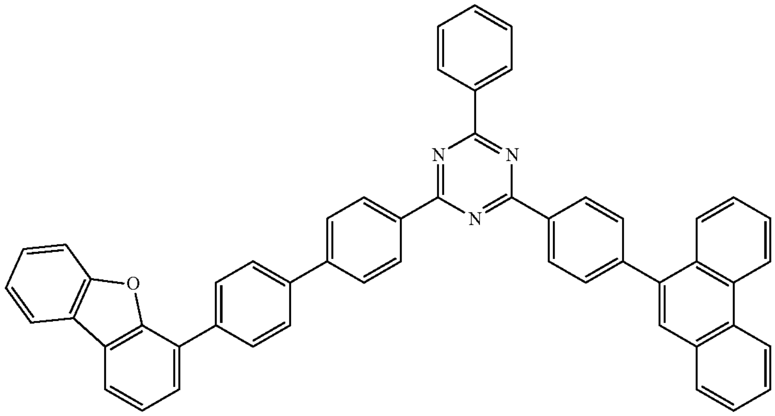
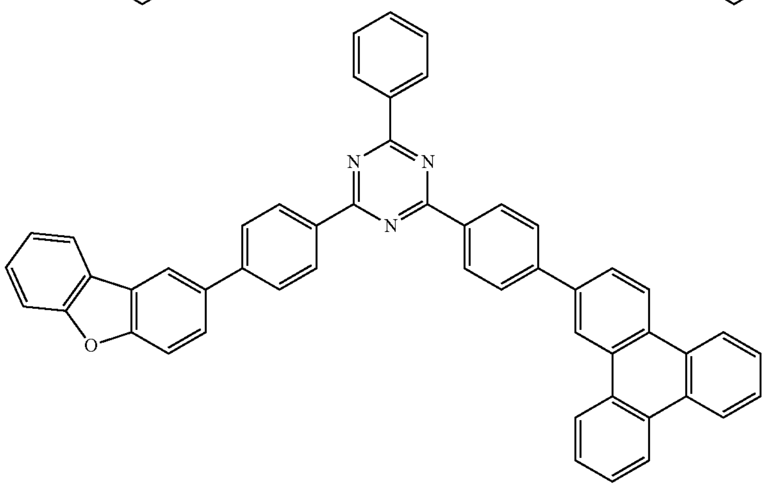
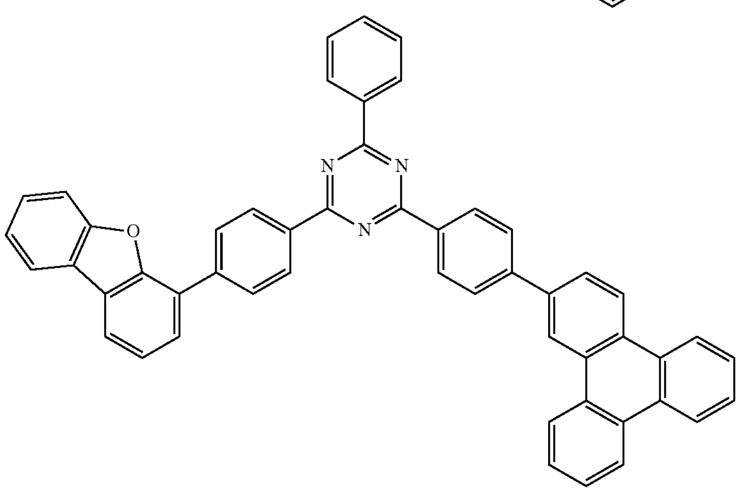
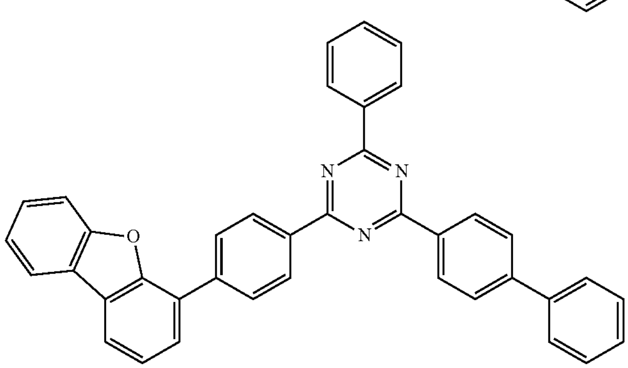

-continued
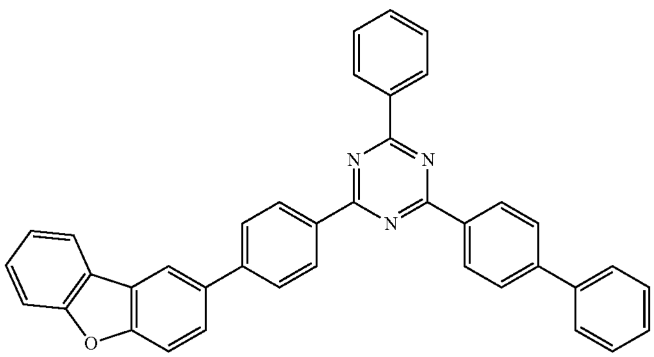
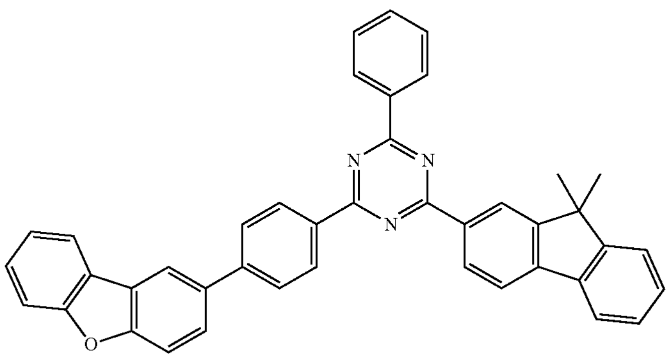
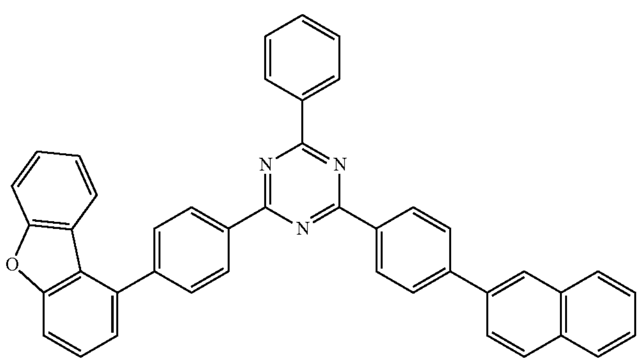
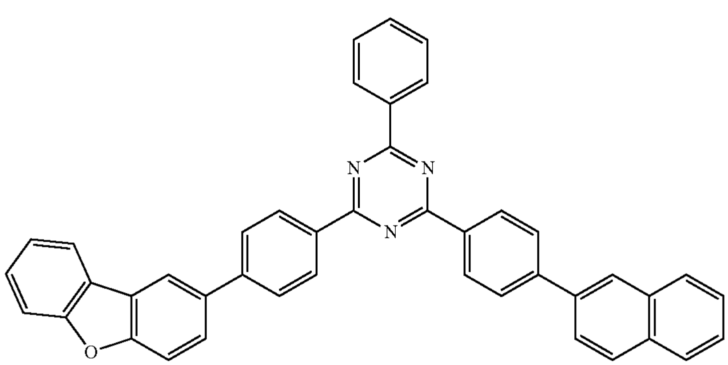

-continued
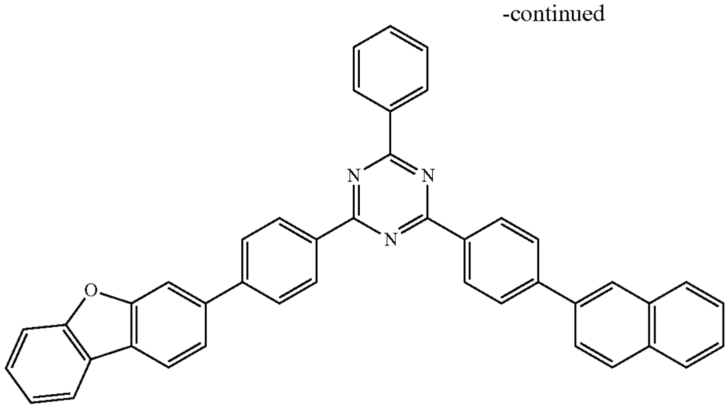
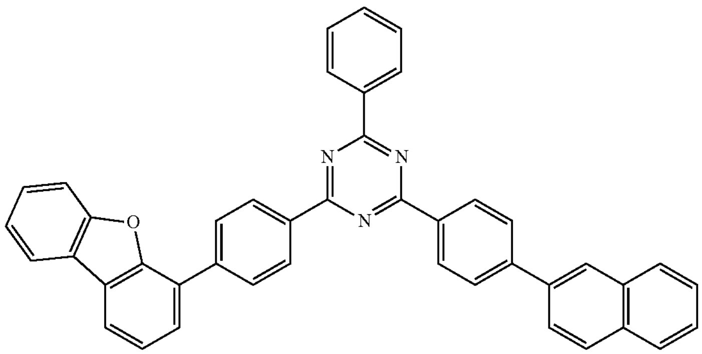
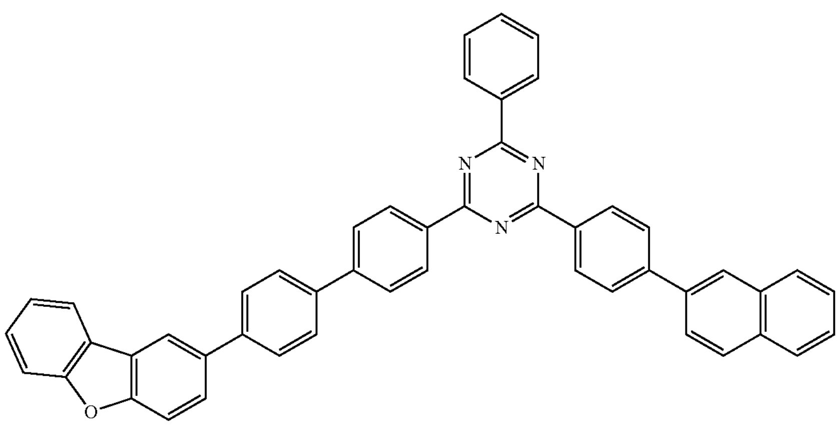
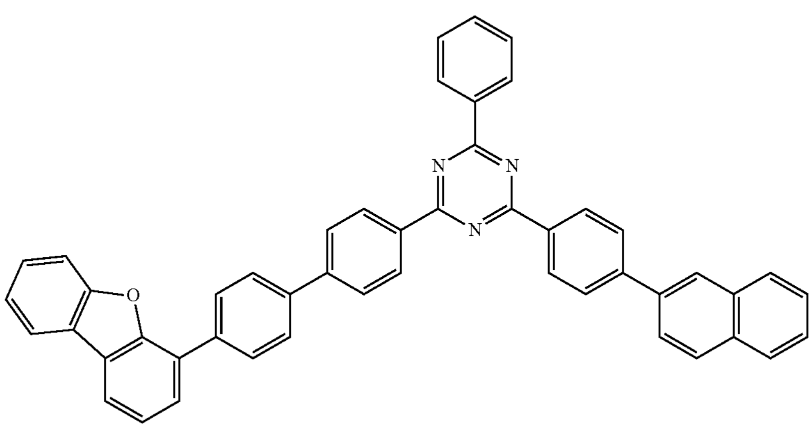

-continued
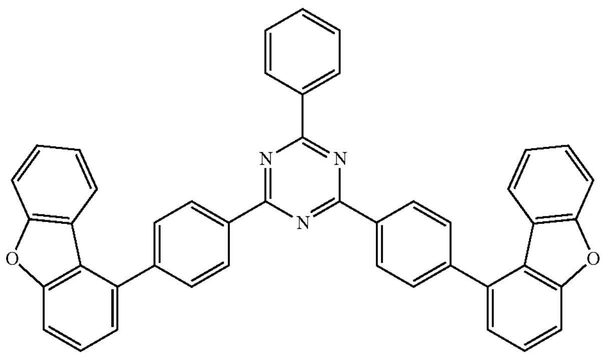
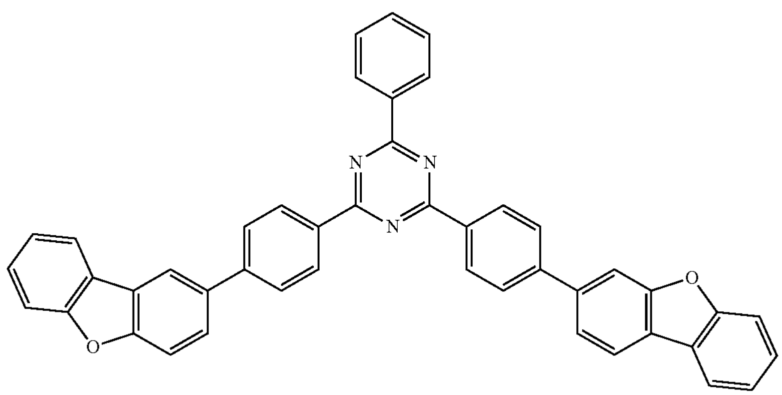
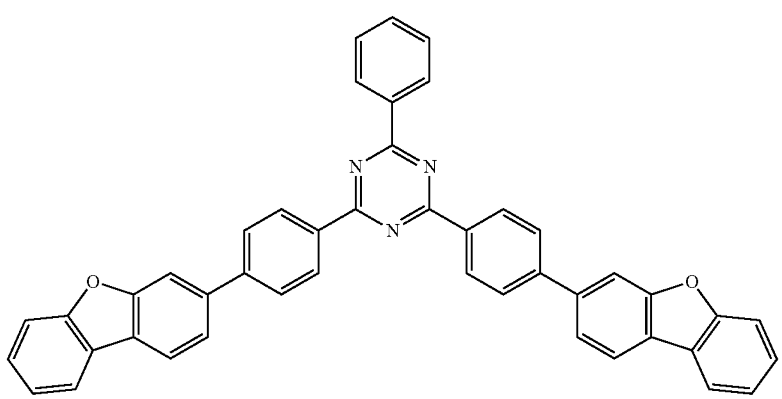

-continued
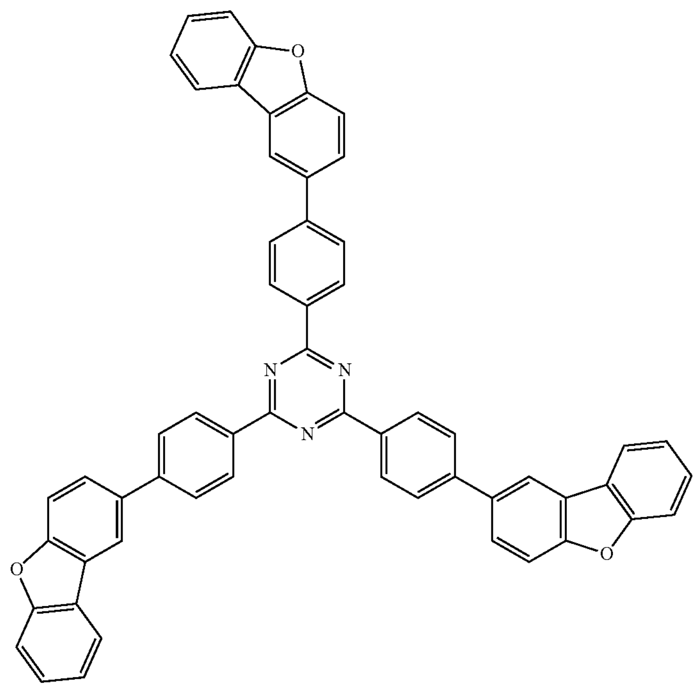
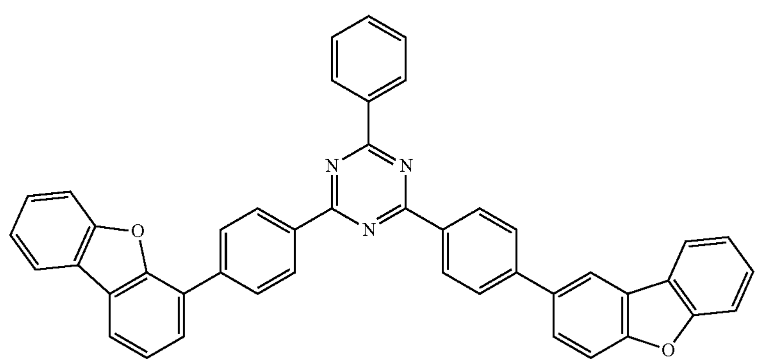
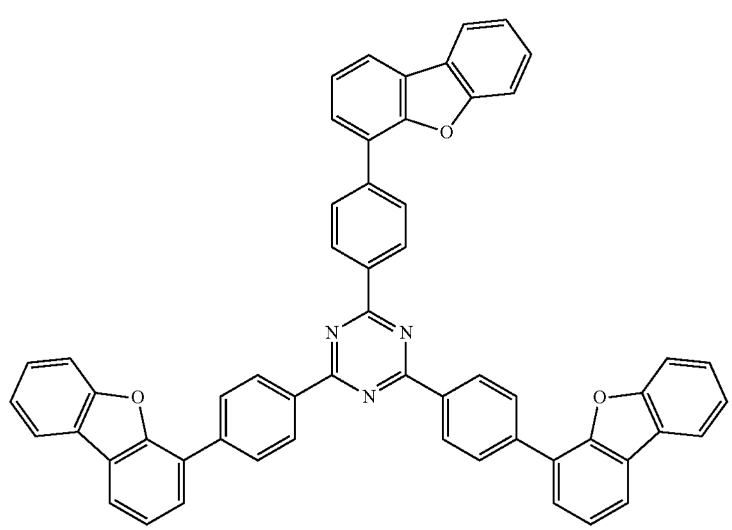

-continued
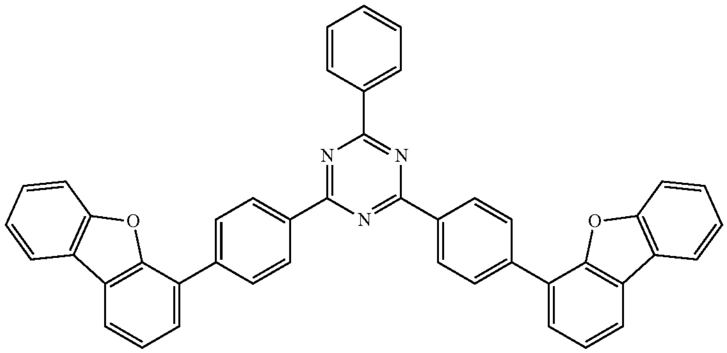
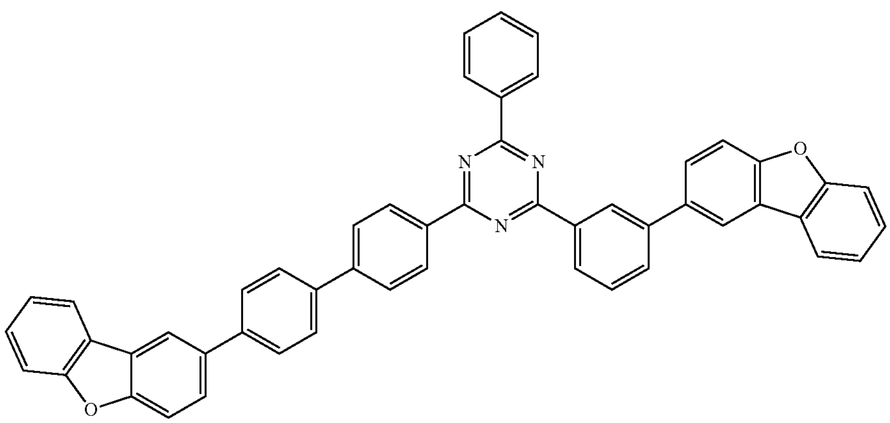
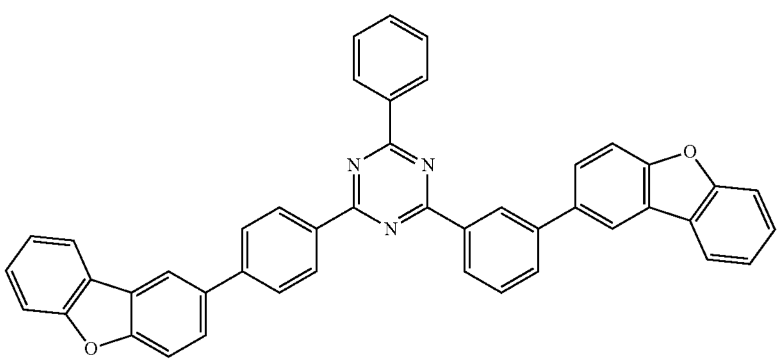
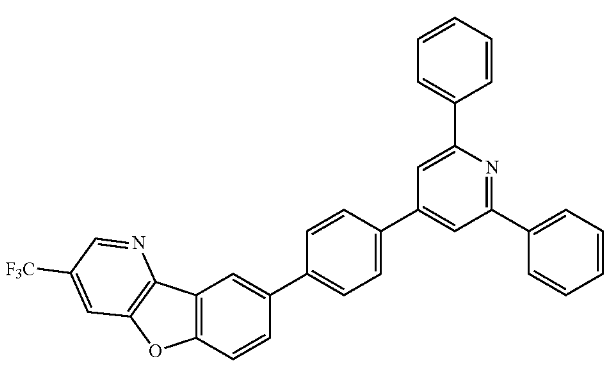

-continued
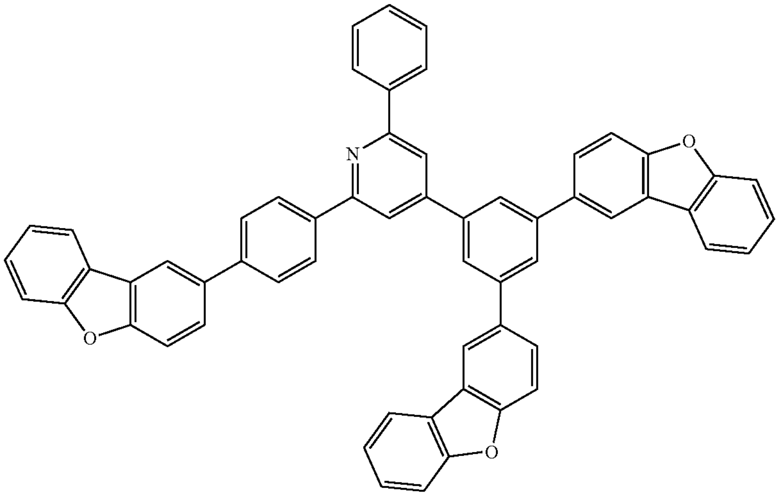
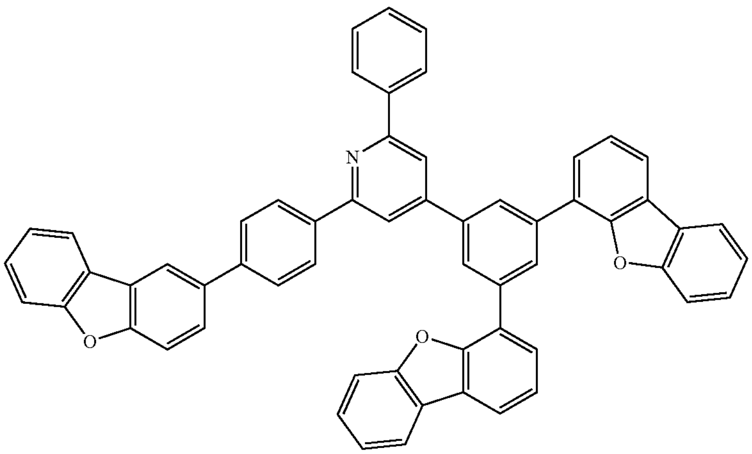
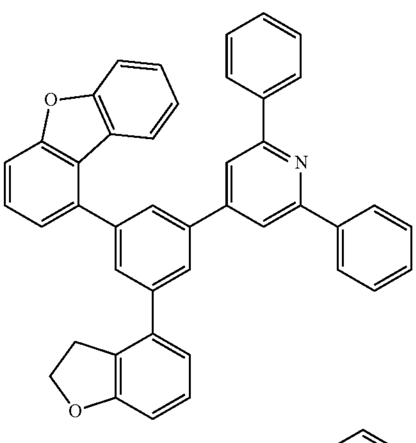
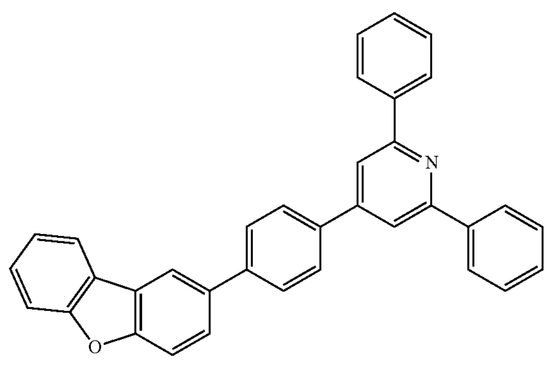
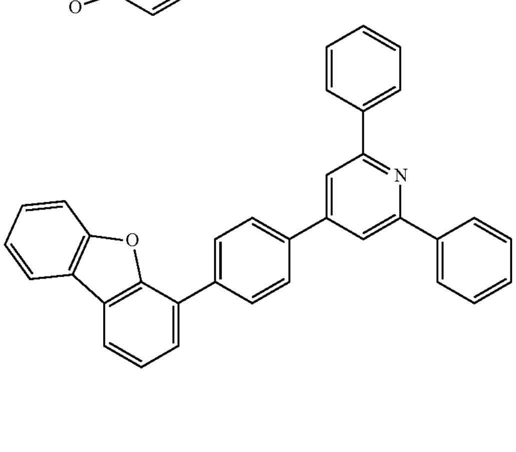
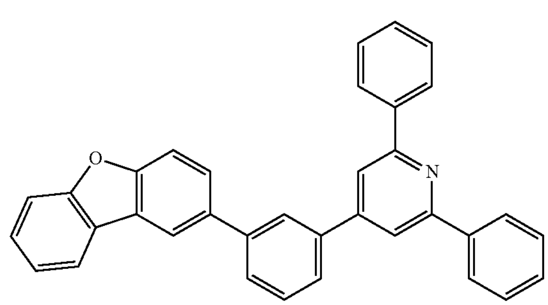

-continued
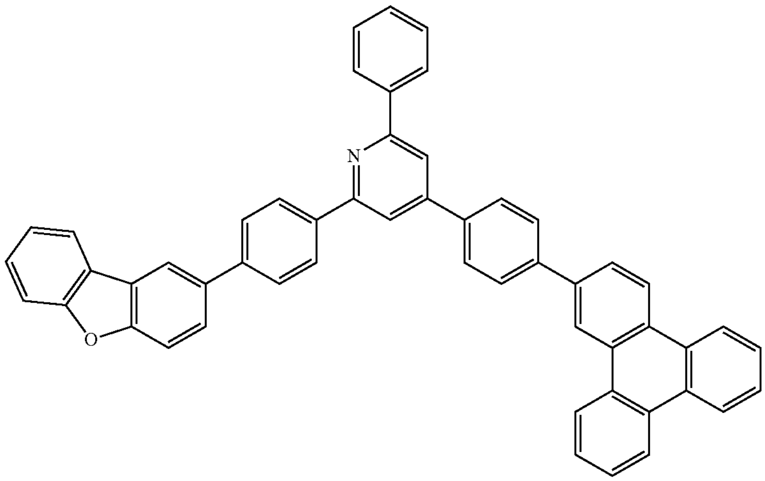 [SMILES: c1ccc(-c2cc(-c3ccc(-c4ccc5c6ccccc6c6ccccc6c5c4)cc3)cc(-c3ccc(-c4ccc5oc6ccccc6c5c4)cc3)n2)cc1]
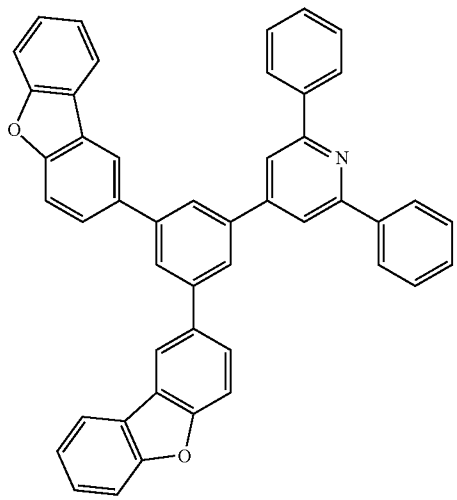
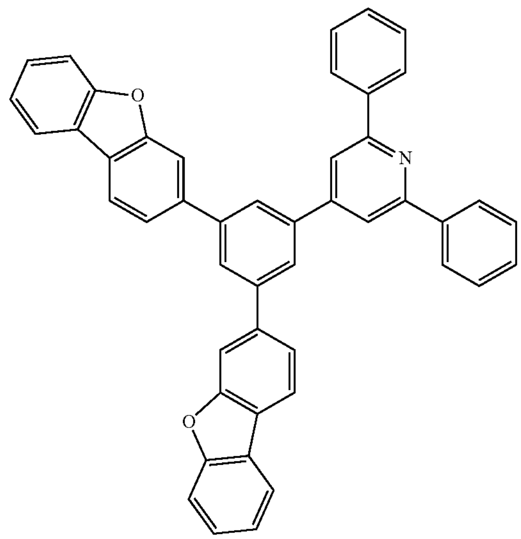
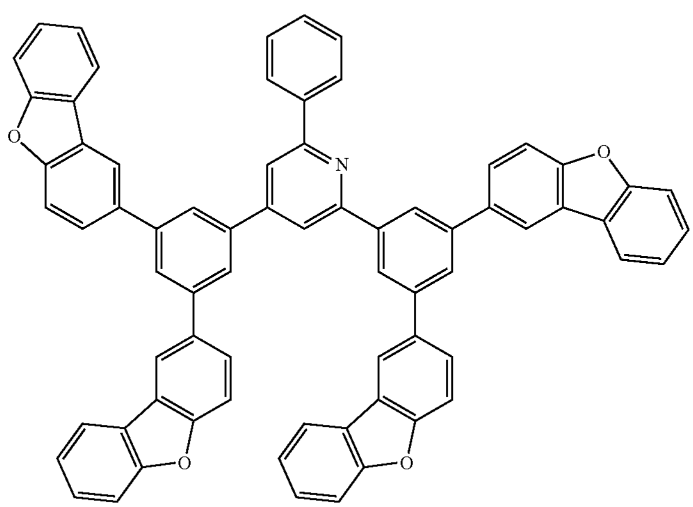

-continued
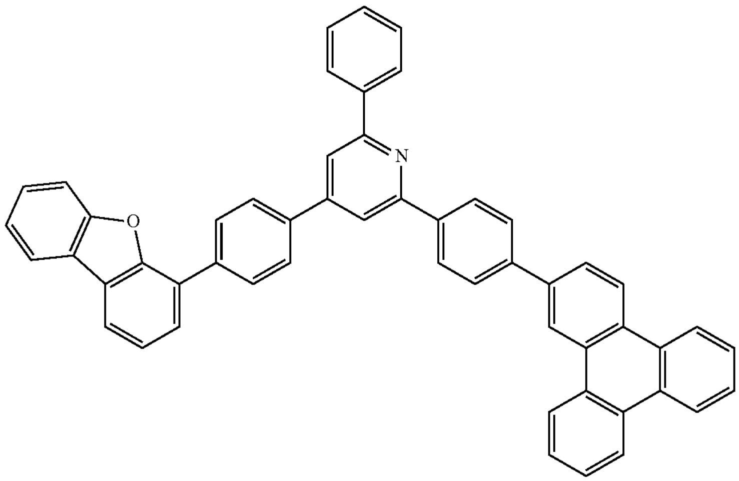
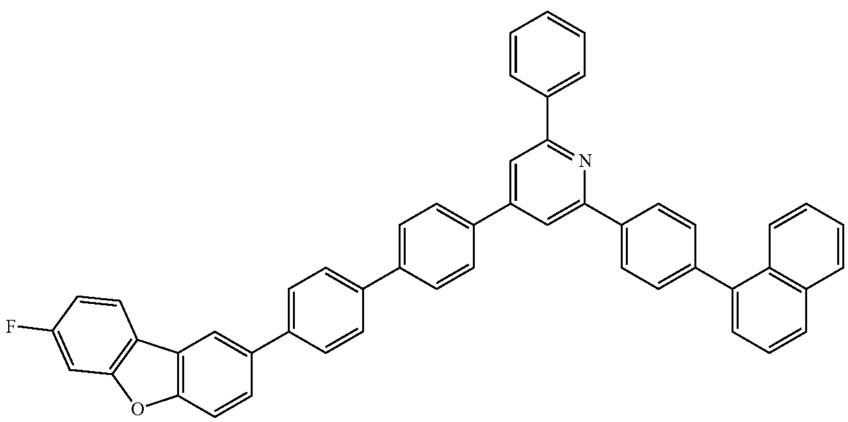
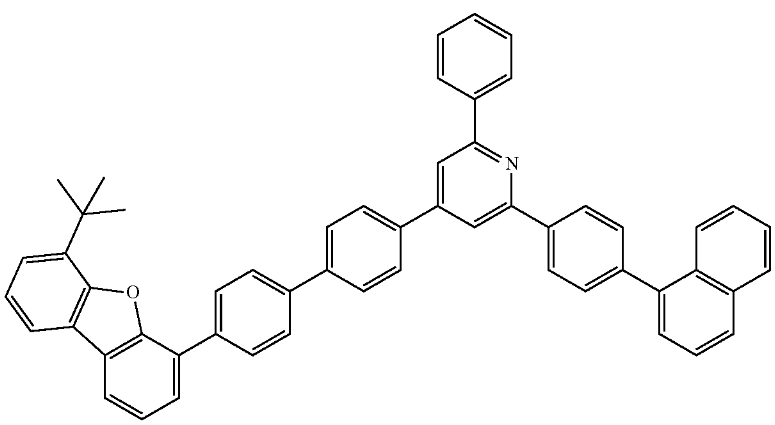
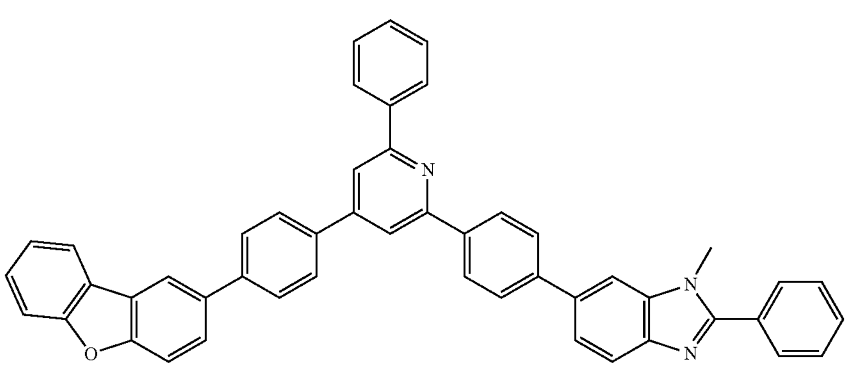

-continued
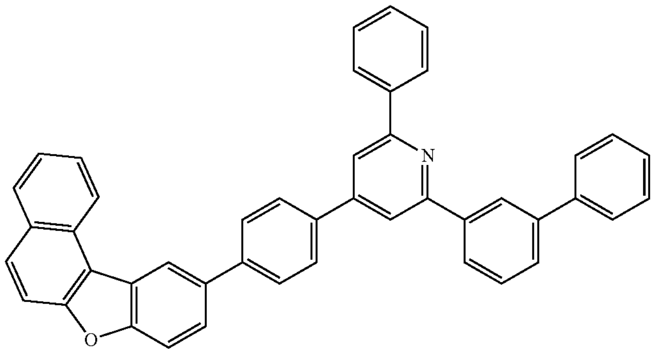
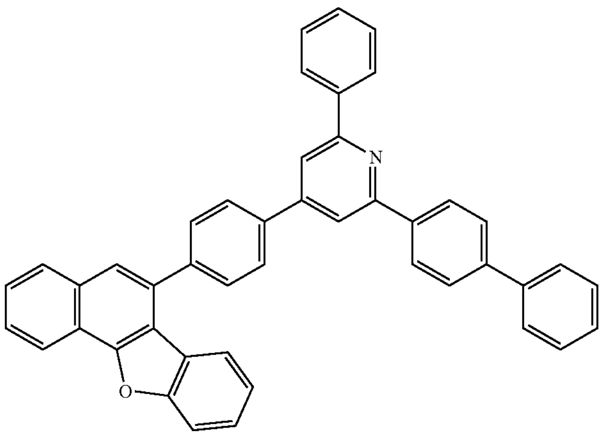
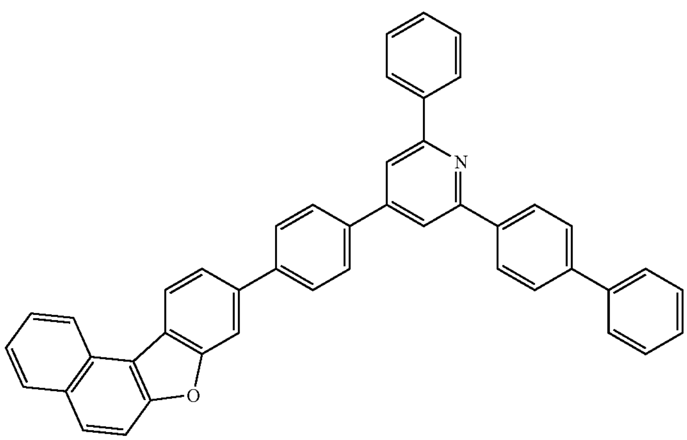
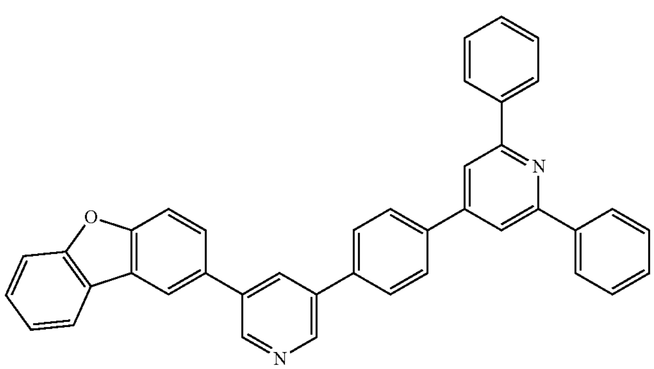

-continued
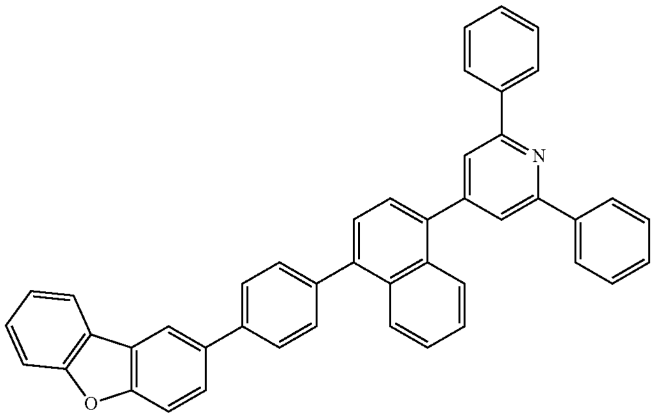
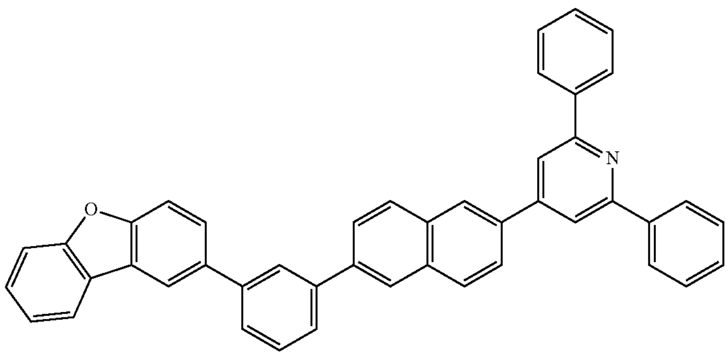
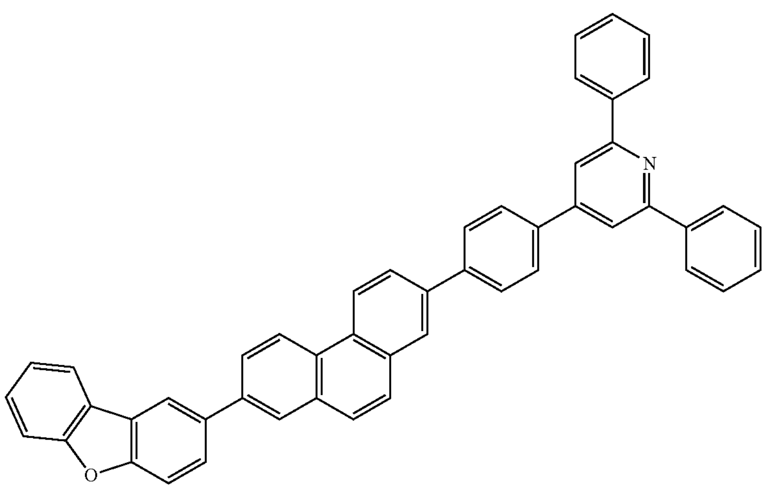
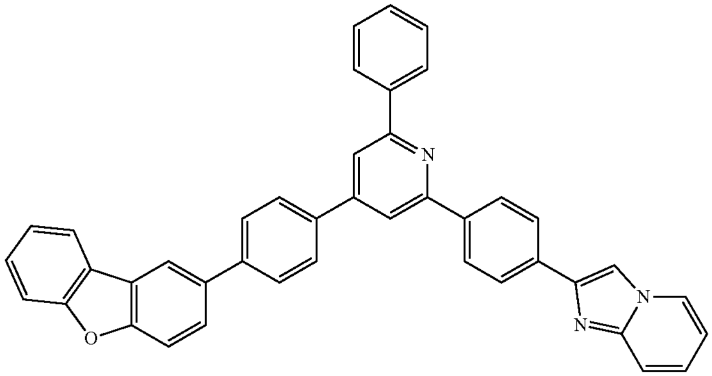

-continued
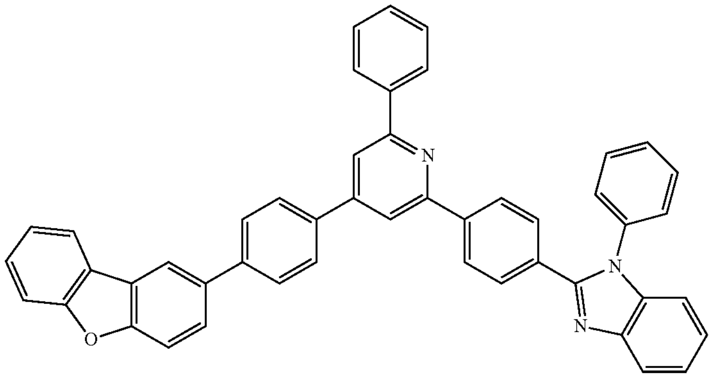
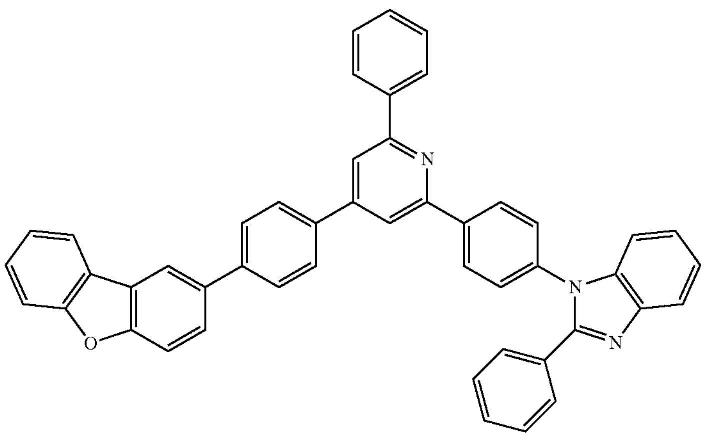
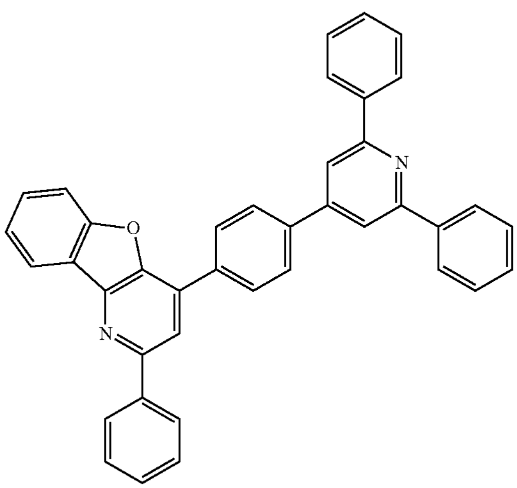
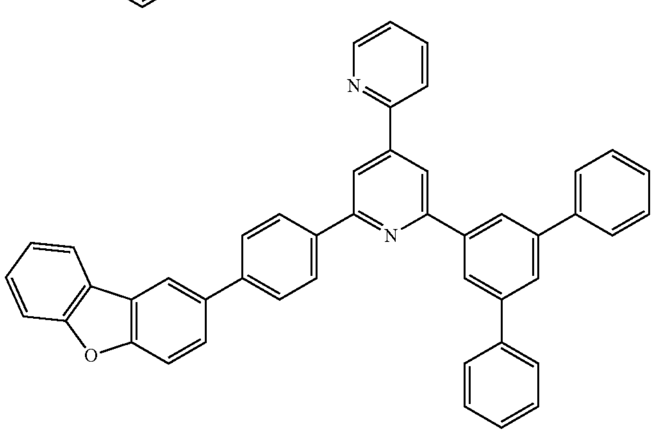

-continued
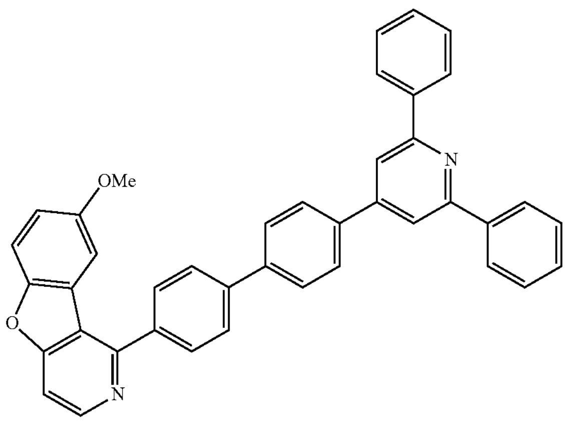
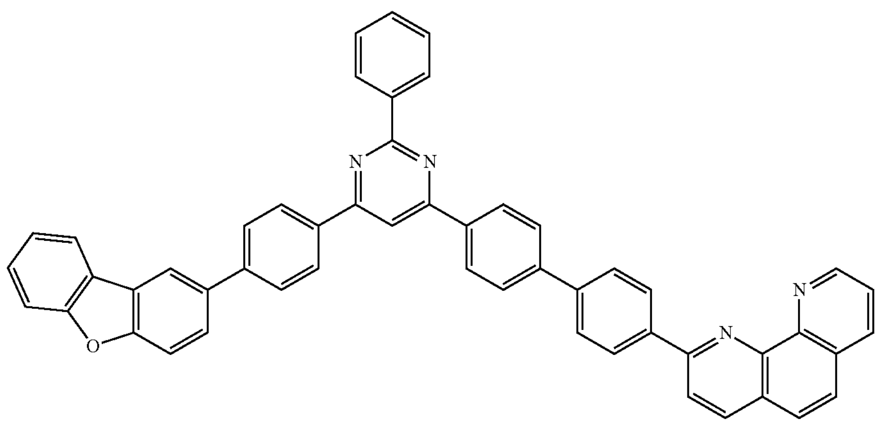
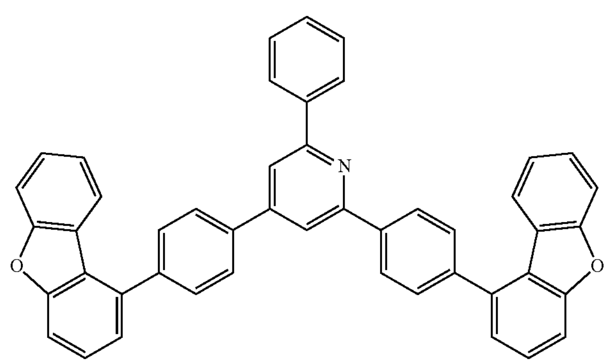
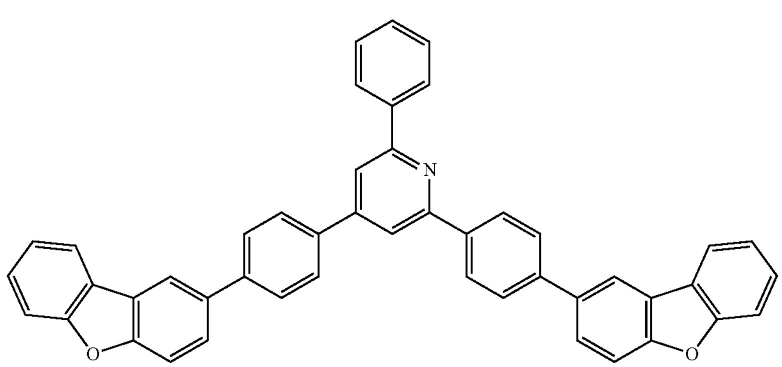

-continued
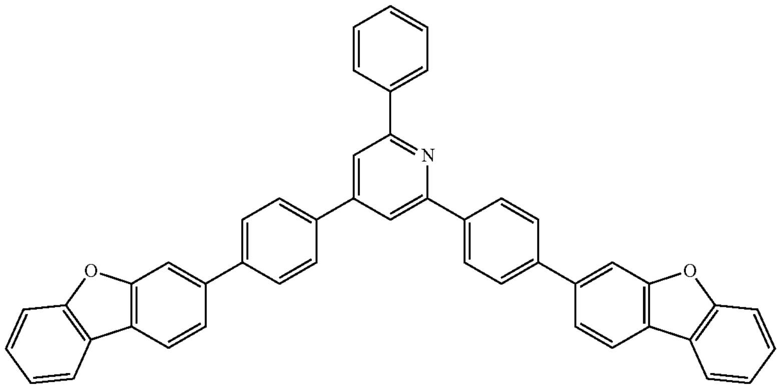
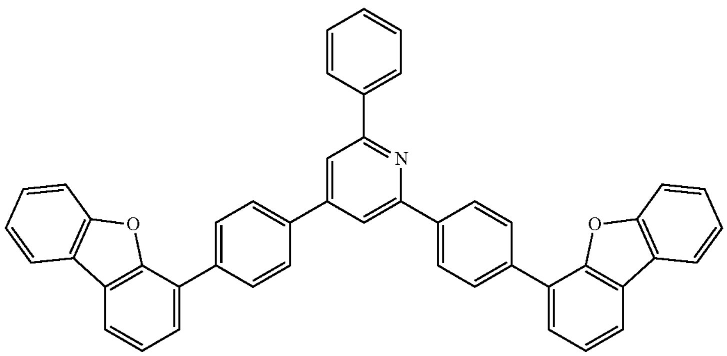 [SMILES: c1ccc(-c2cc(-c3ccc(-c4cccc5c4oc4ccccc45)cc3)cc(-c3ccc(-c4cccc5c4oc4ccccc45)cc3)n2)cc1]
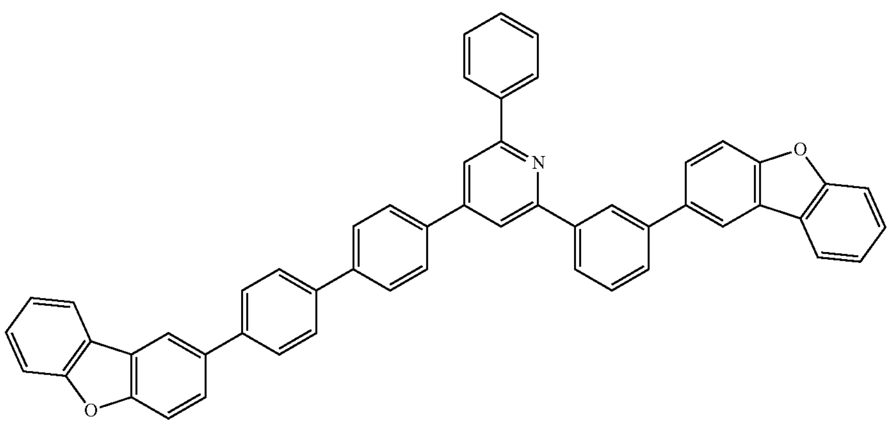
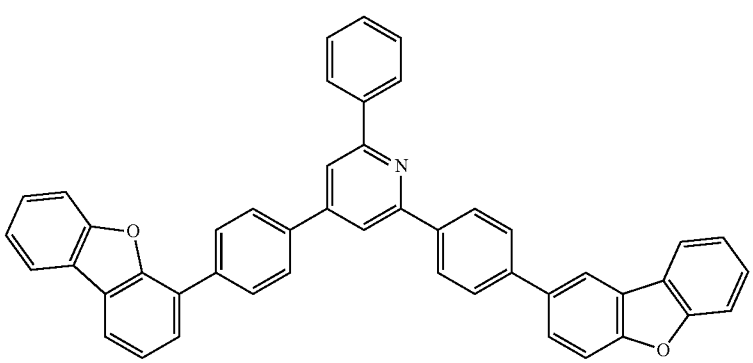

-continued
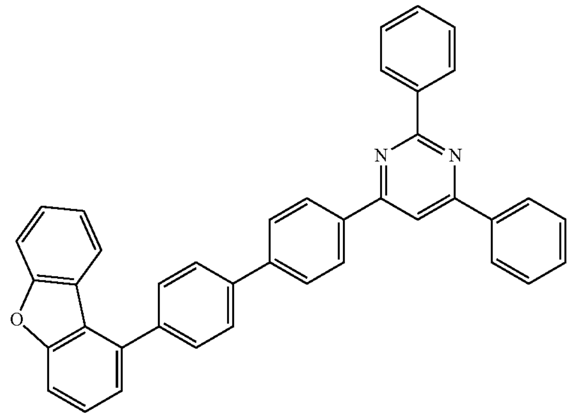
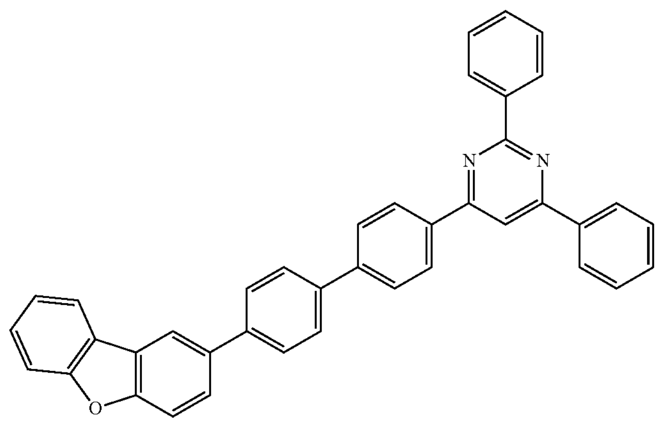
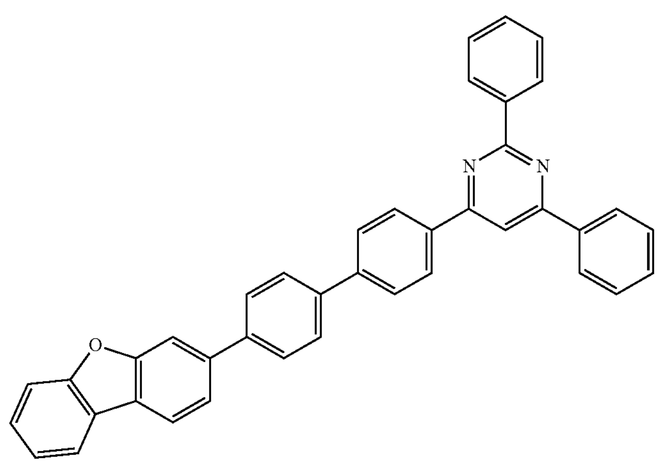
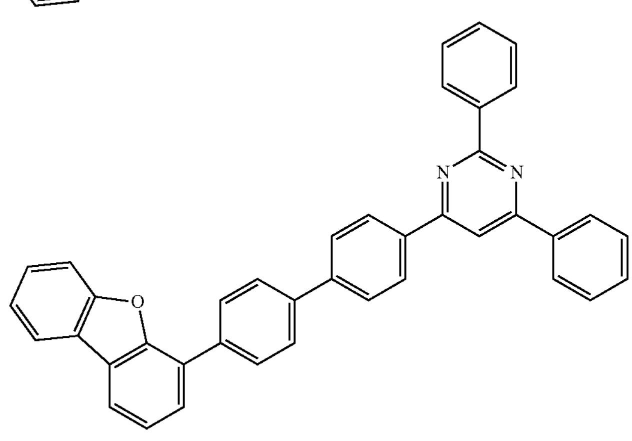
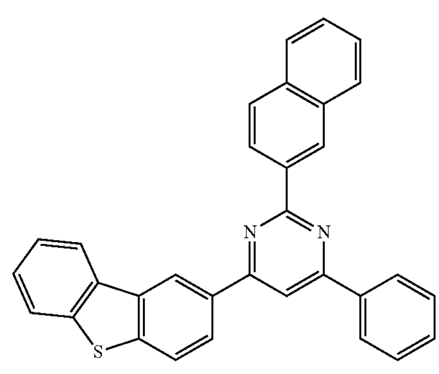

-continued
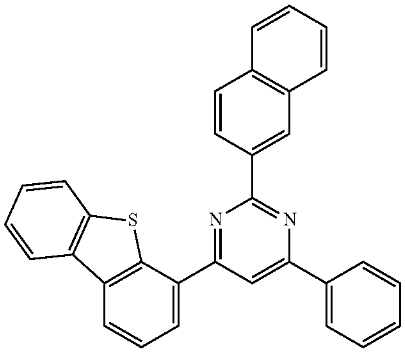
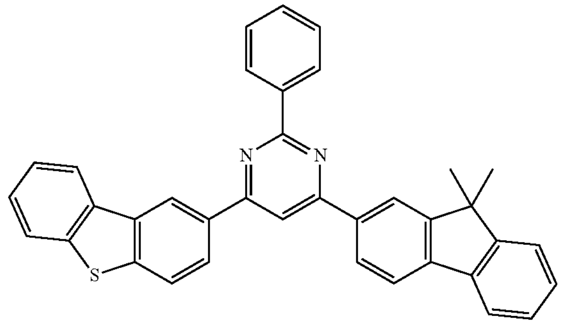
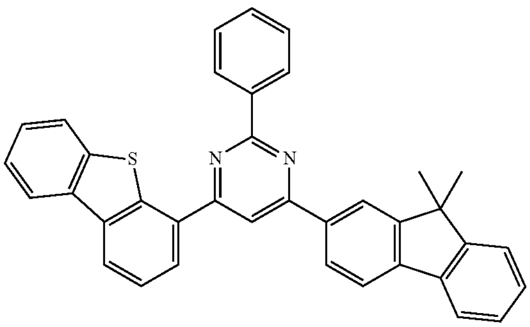
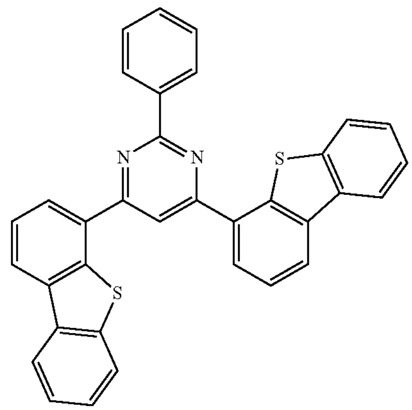
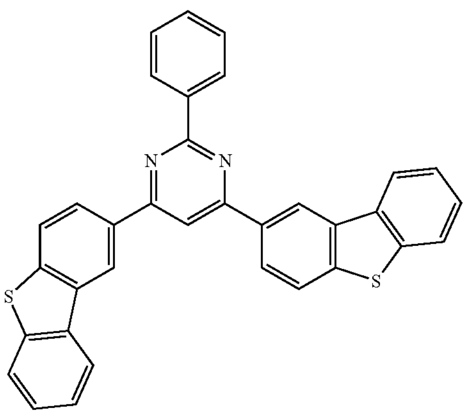
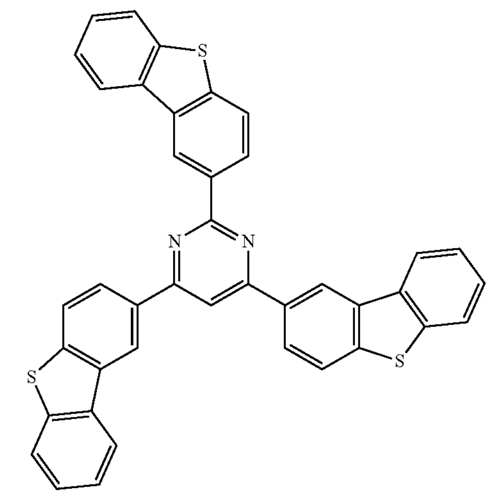
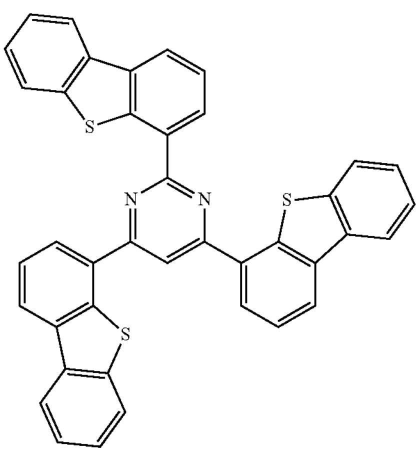
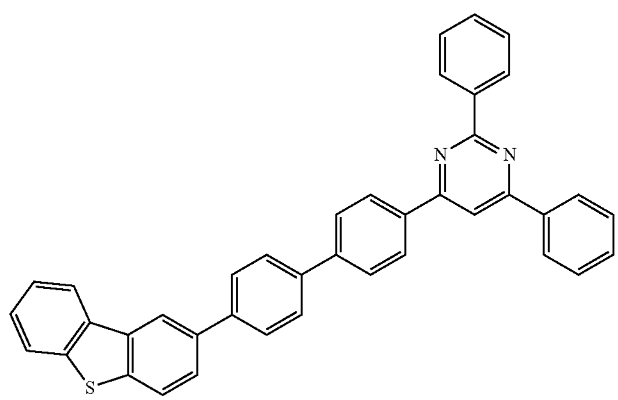

-continued
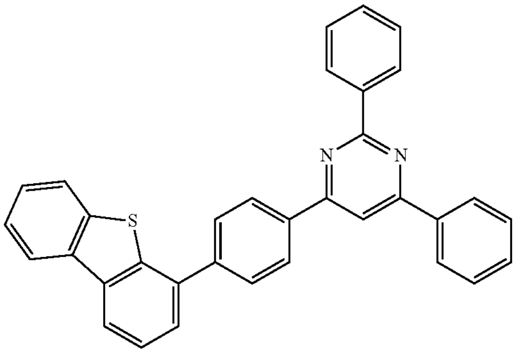
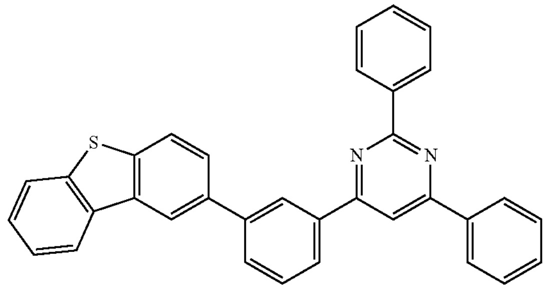
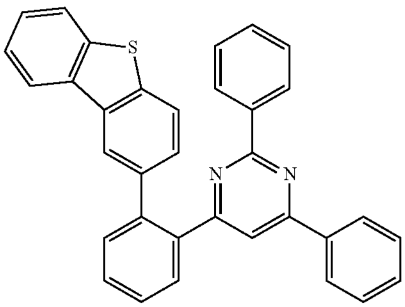
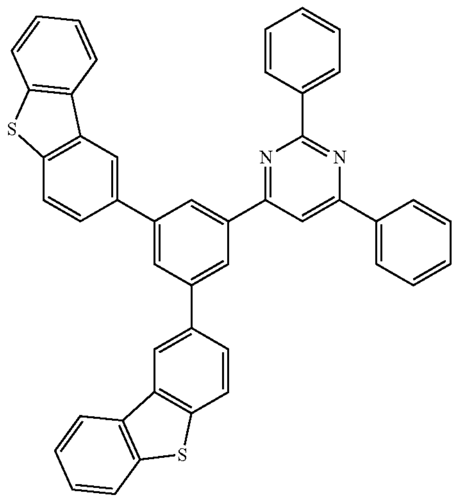
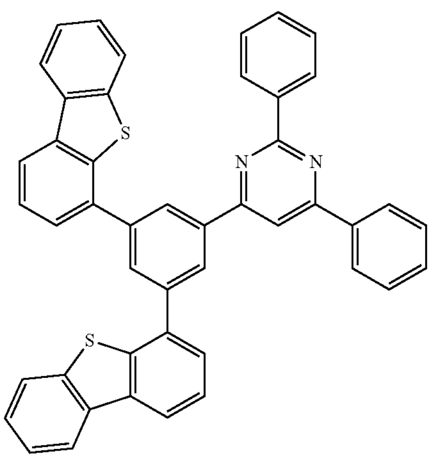
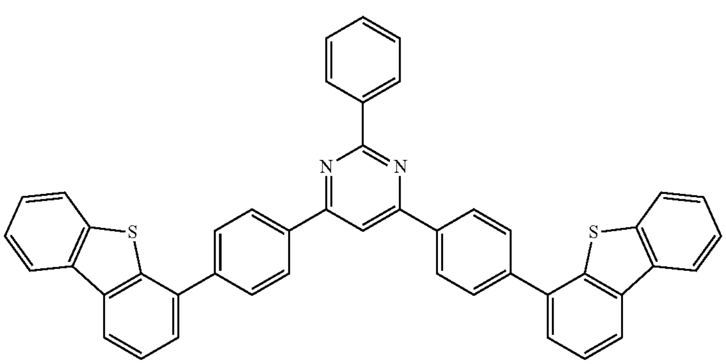

-continued
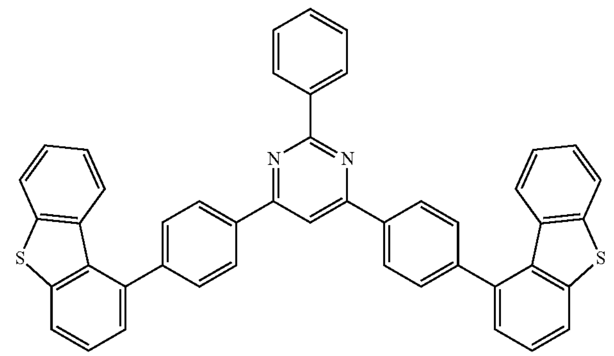
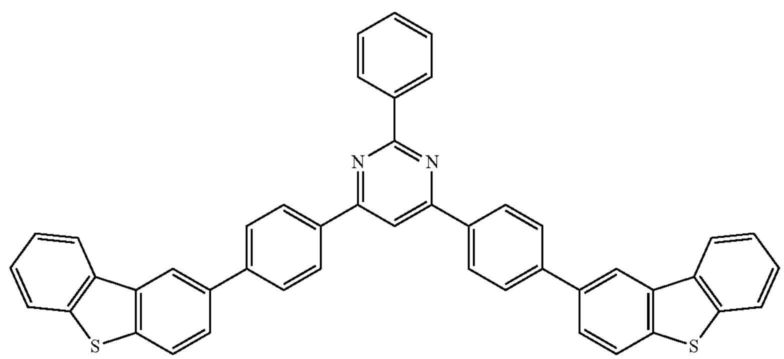
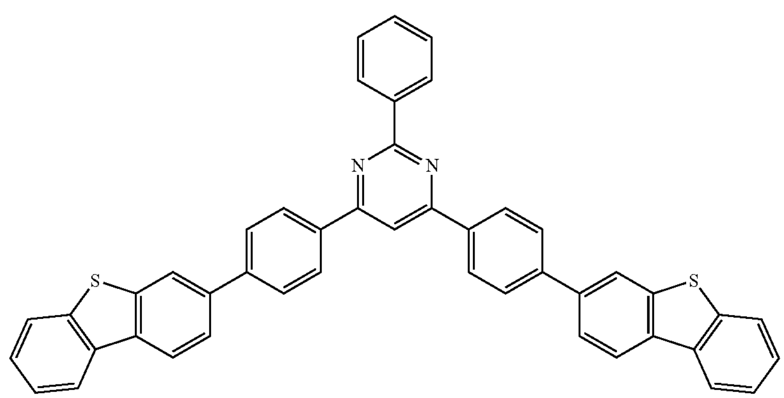
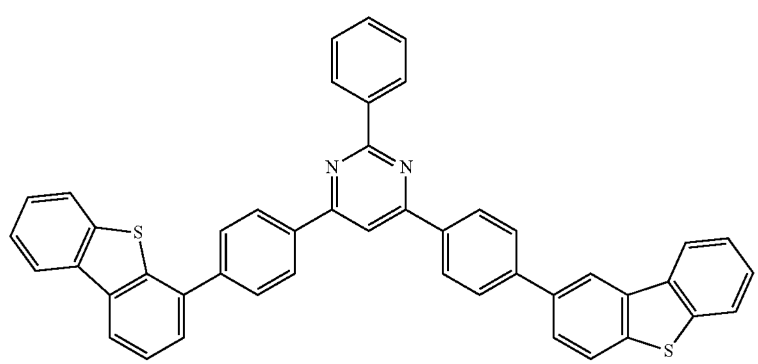

-continued
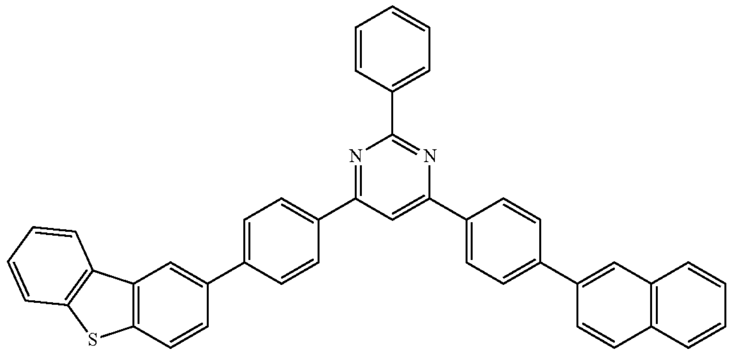
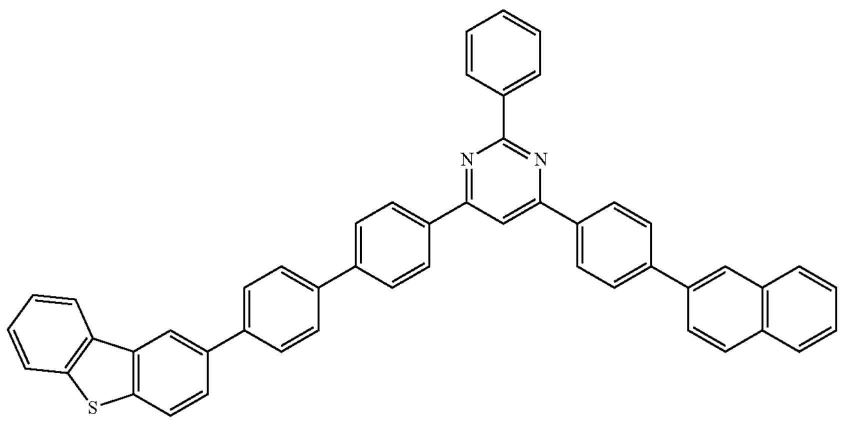
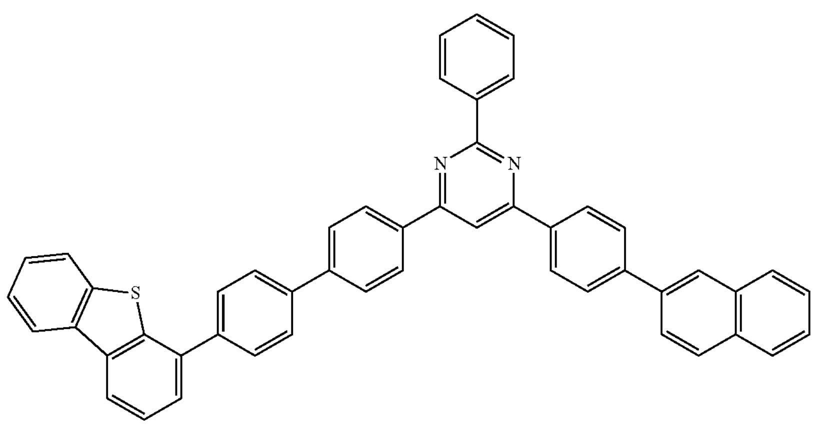 [SMILES: c1ccc(-c2nc(-c3ccc(-c4ccc(-c5cccc6c5sc5ccccc56)cc4)cc3)cc(-c3ccc(-c4ccc5ccccc5c4)cc3)n2)cc1]
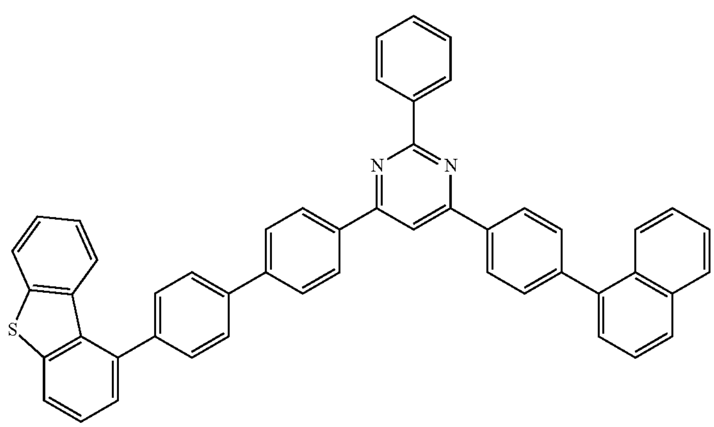

-continued
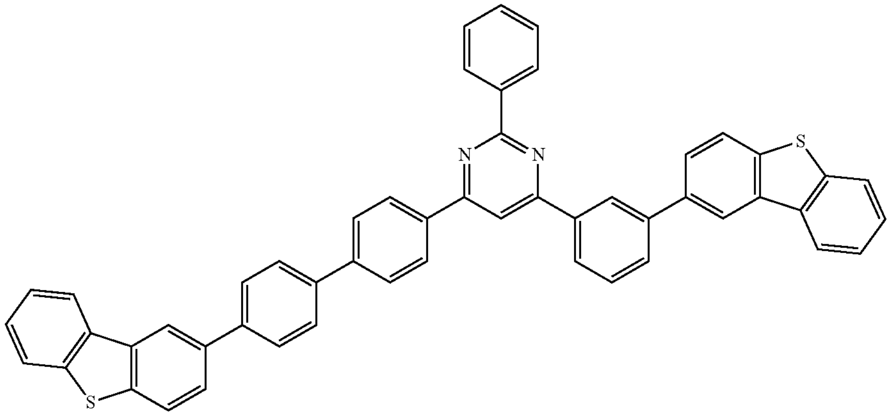
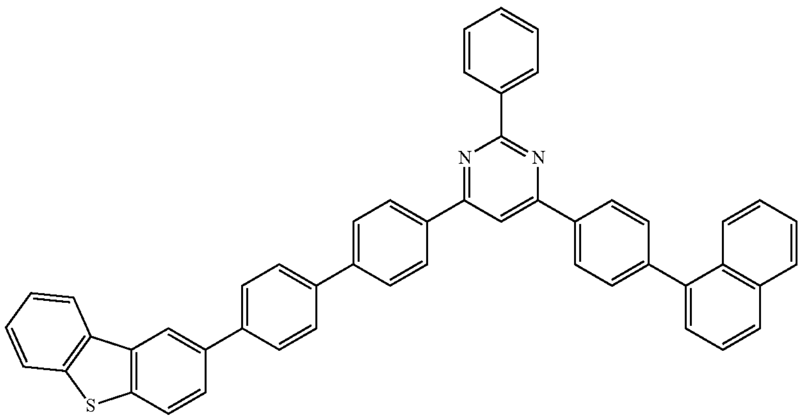
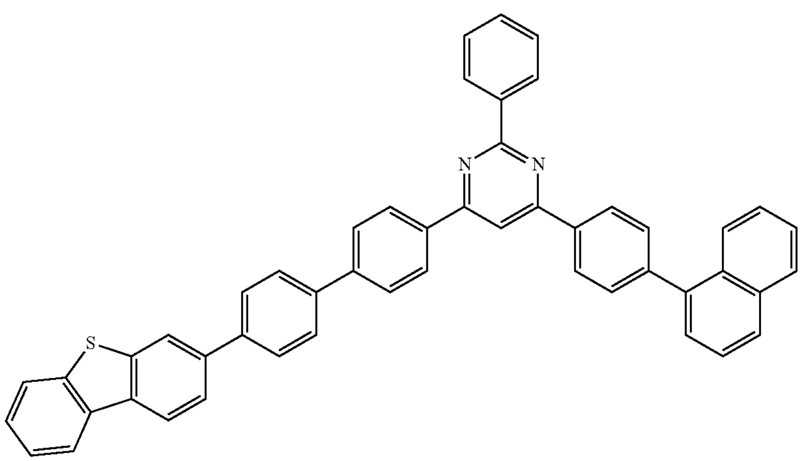
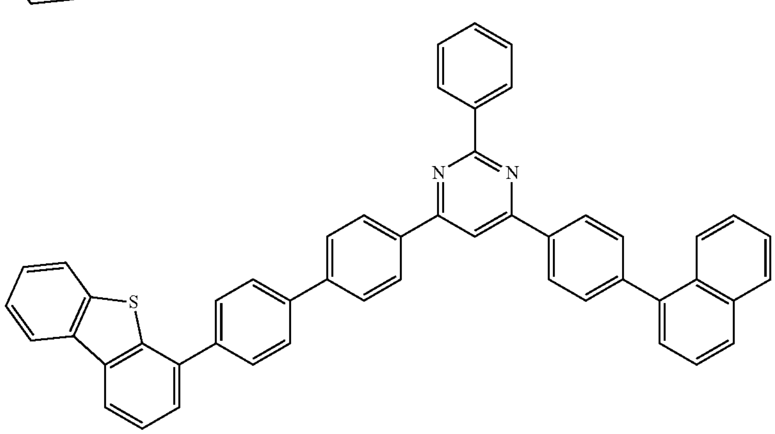

-continued
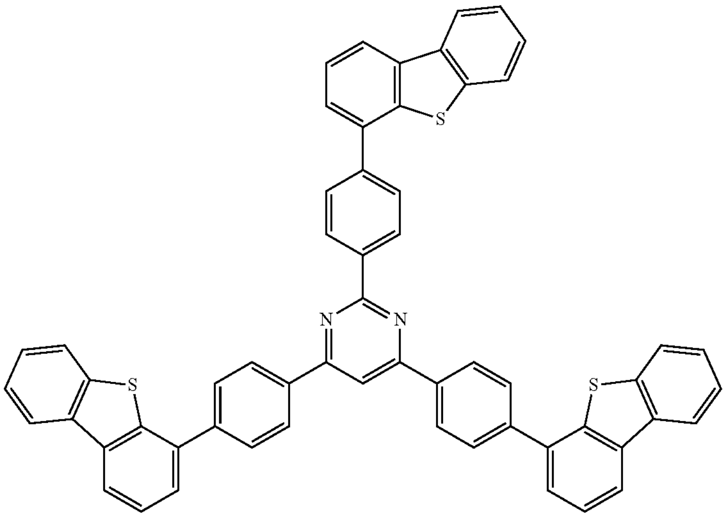
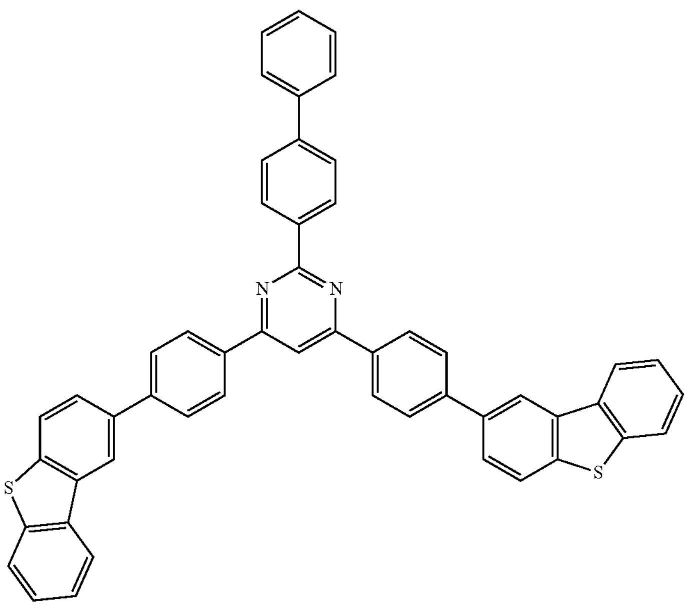
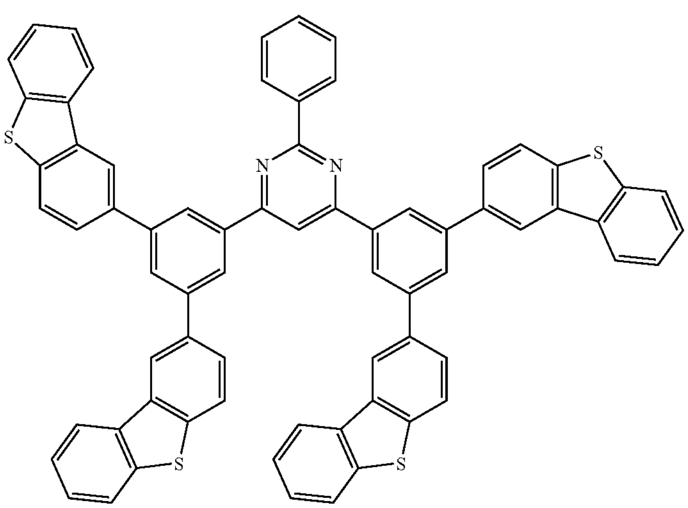

-continued
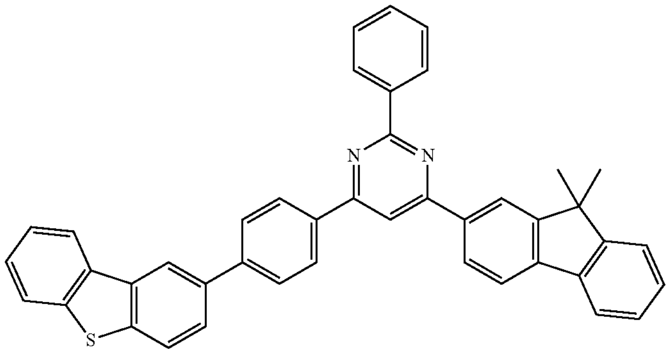
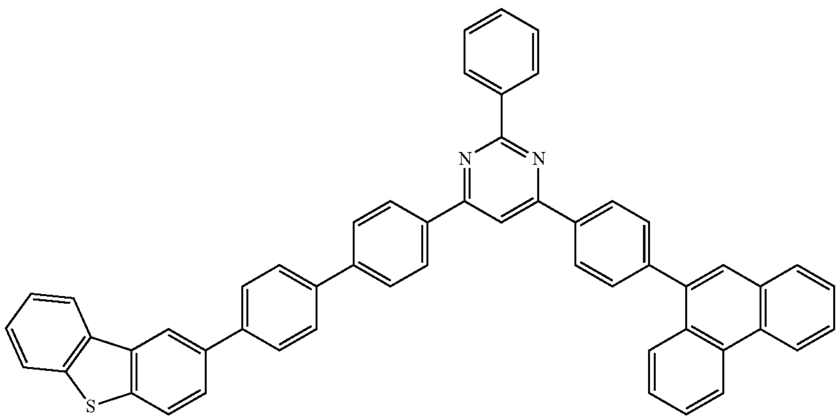
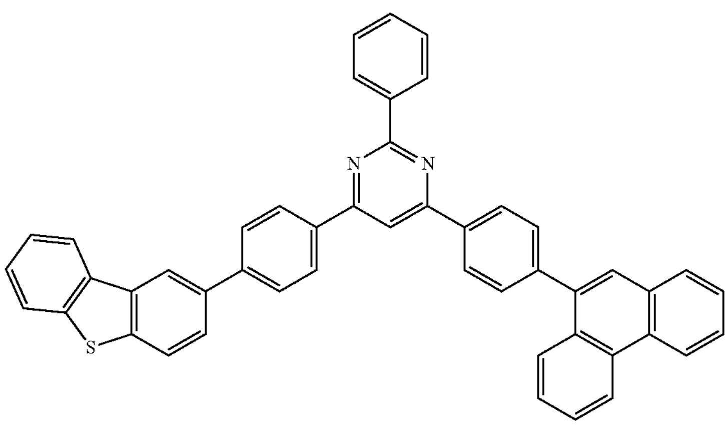
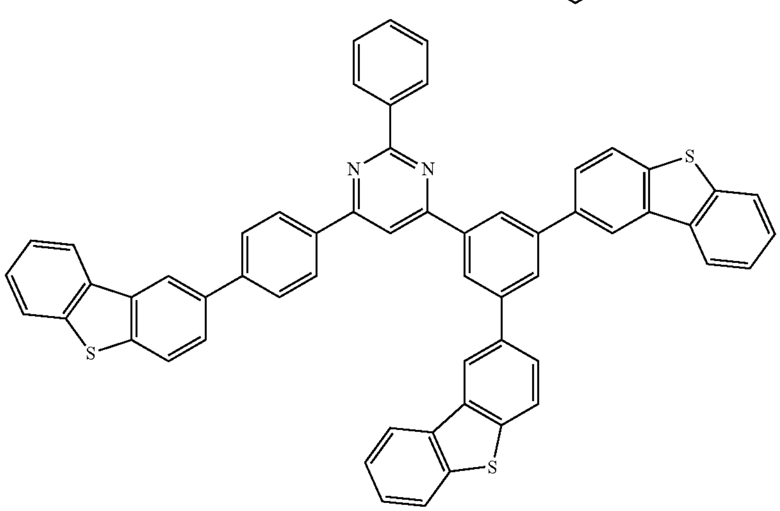

-continued
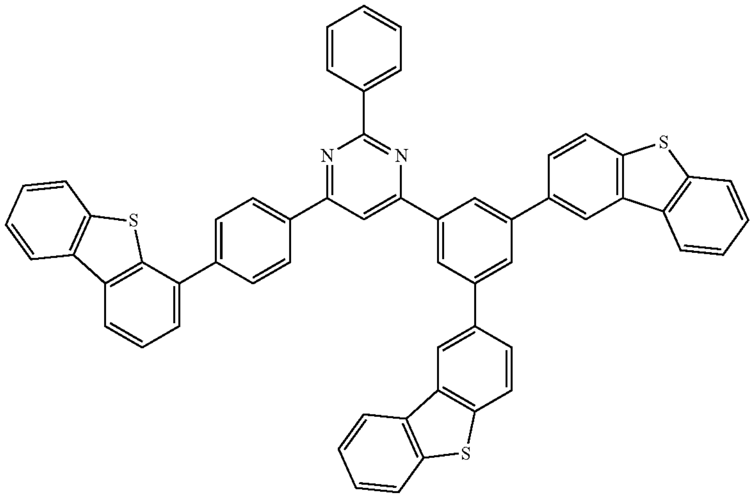
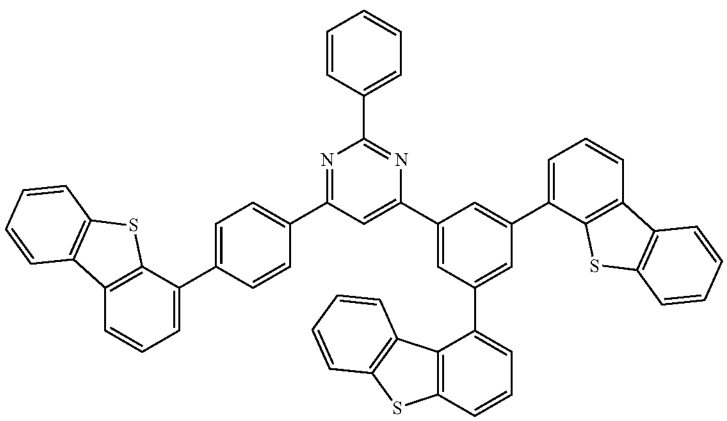
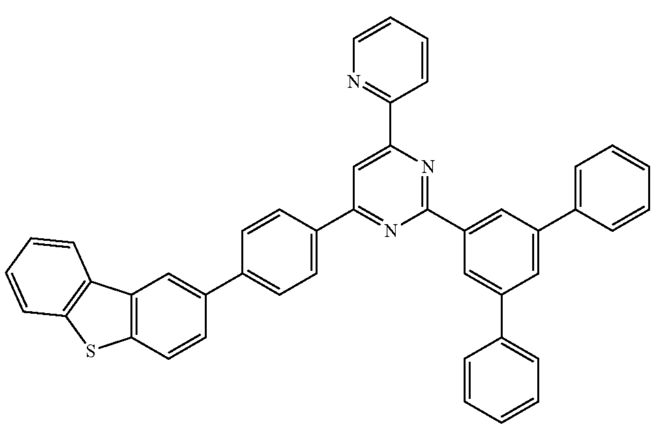

-continued
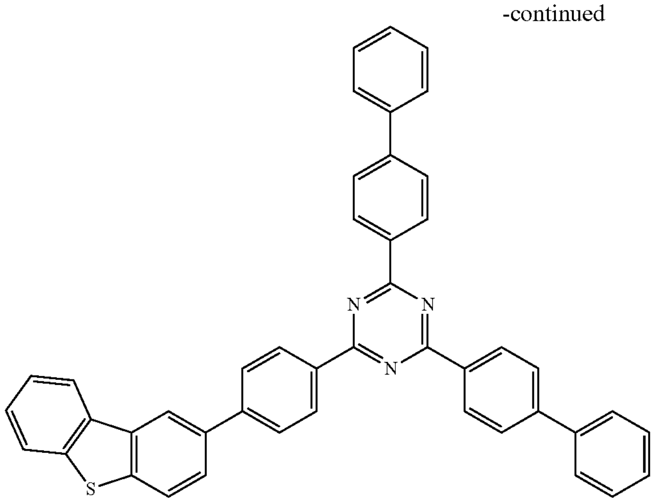
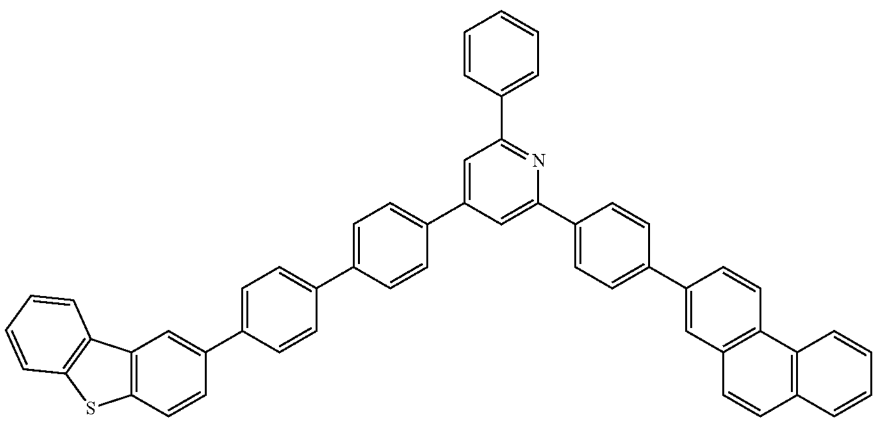
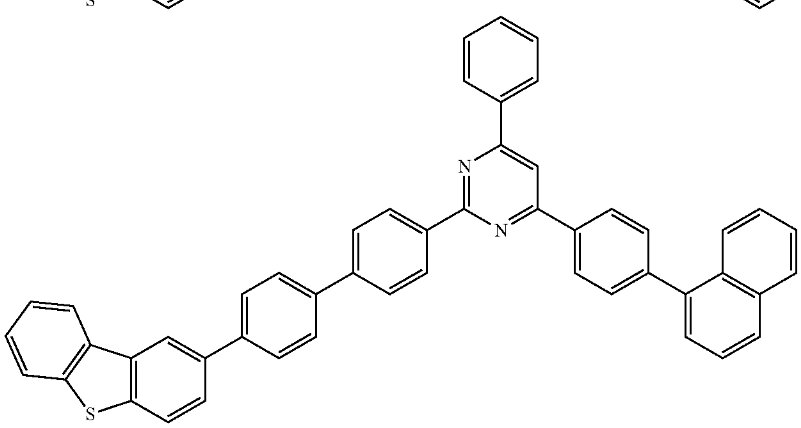
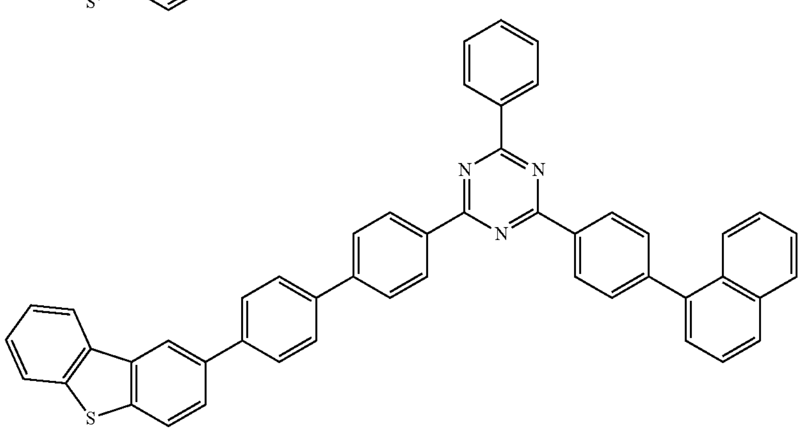

-continued
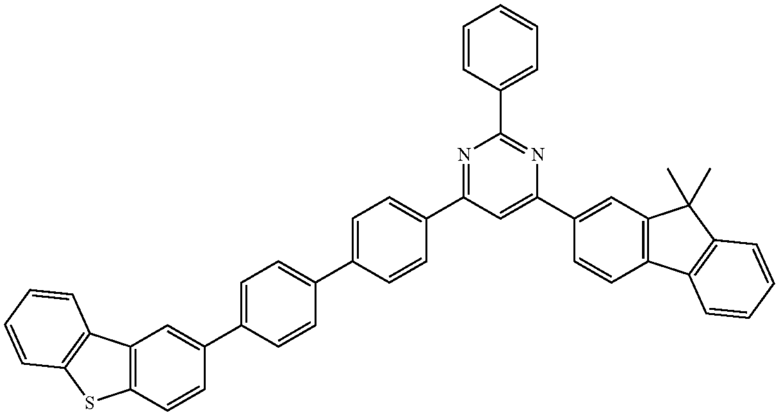
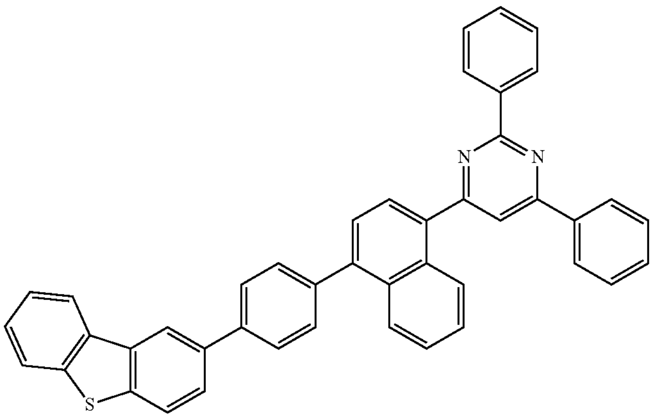
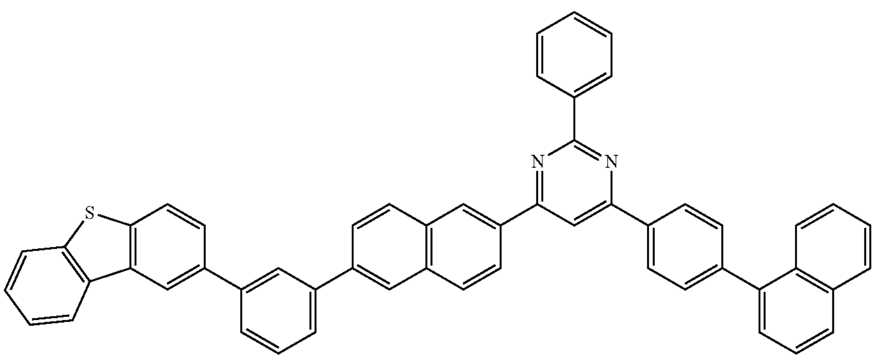
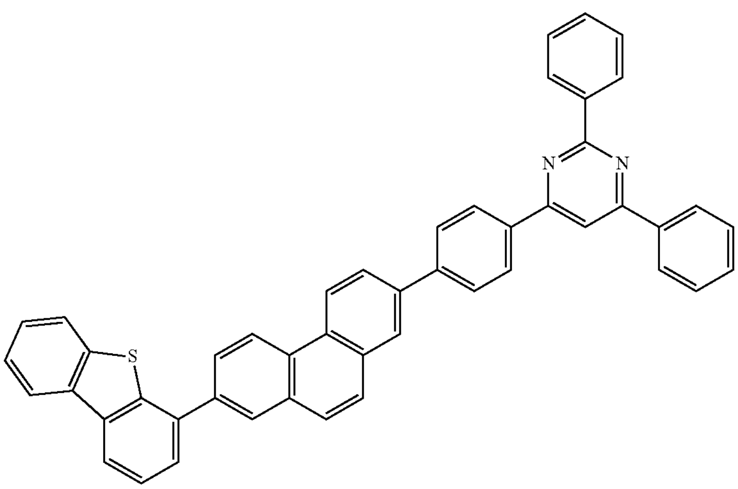

-continued
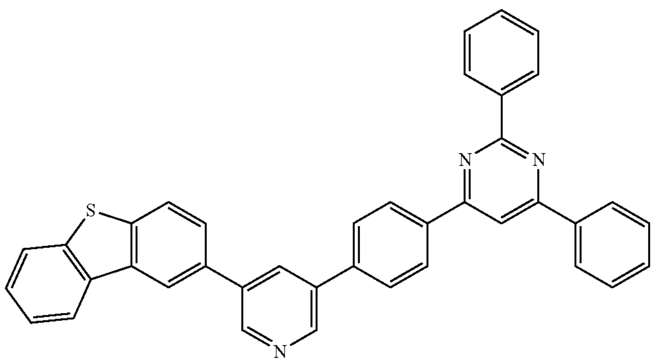
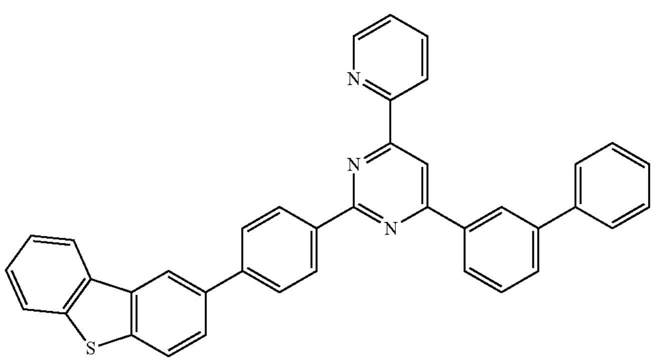 [SMILES: c1ccc(-c2cccc(-c3cc(-c4ccccn4)nc(-c4ccc(-c5ccc6sc7ccccc7c6c5)cc4)n3)c2)cc1]
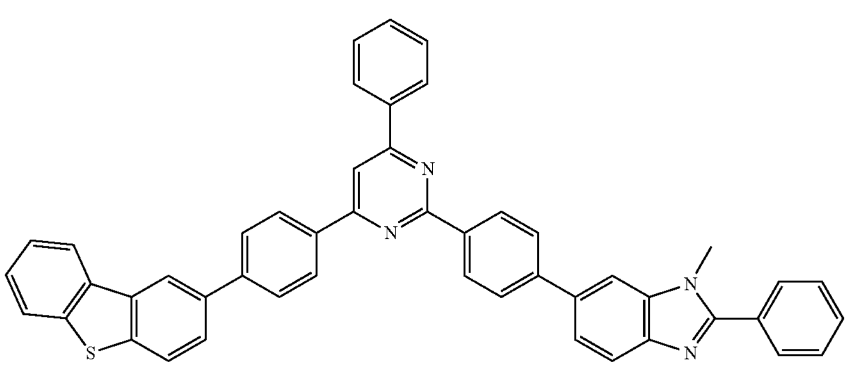
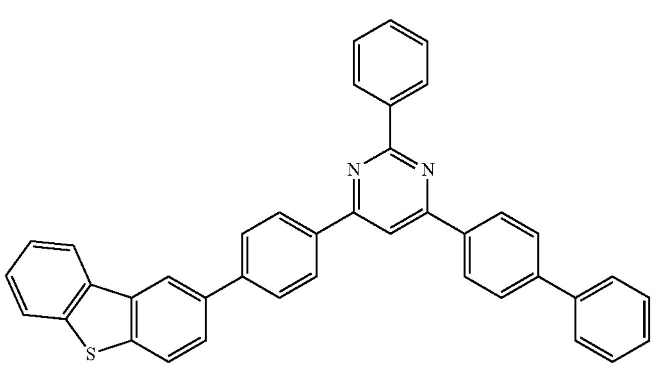

-continued
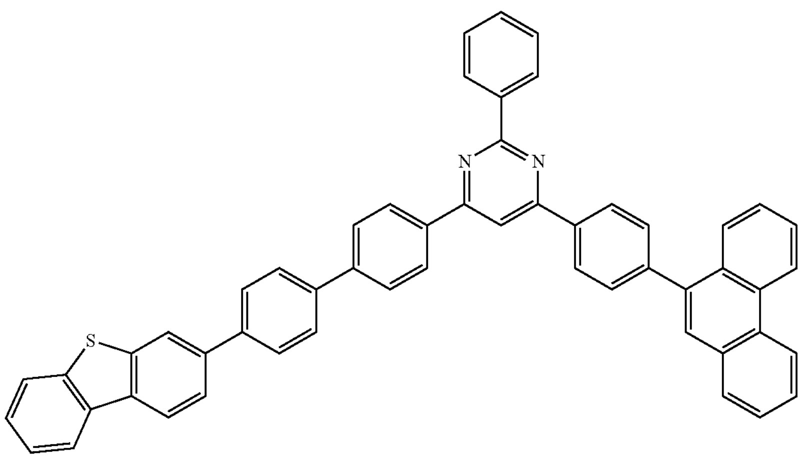
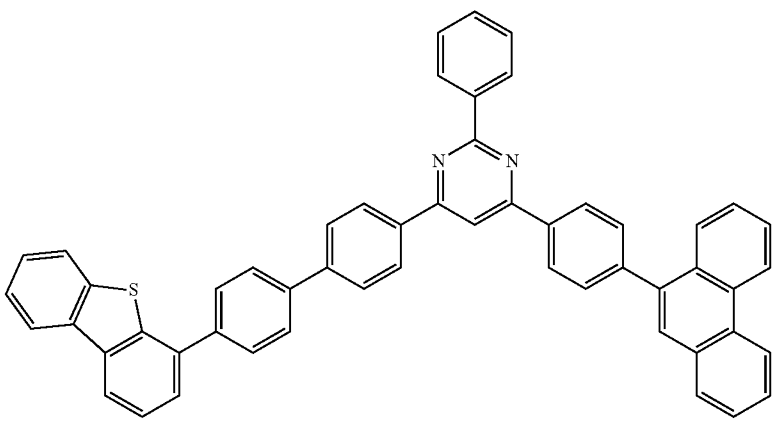
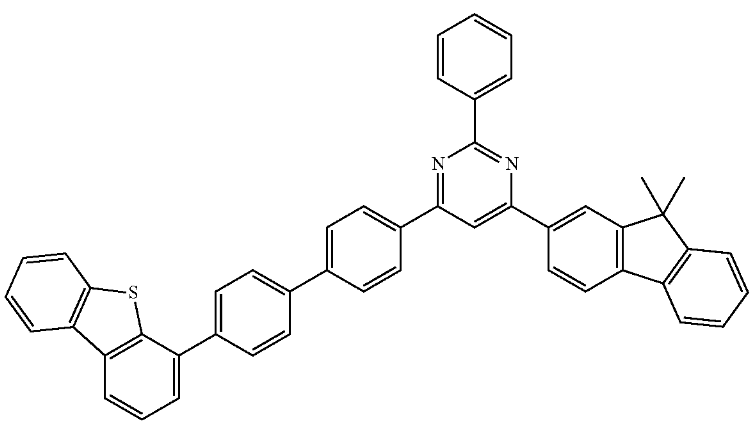
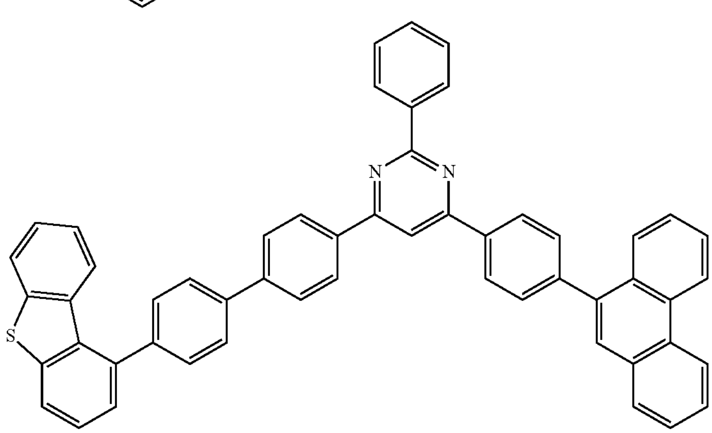

-continued
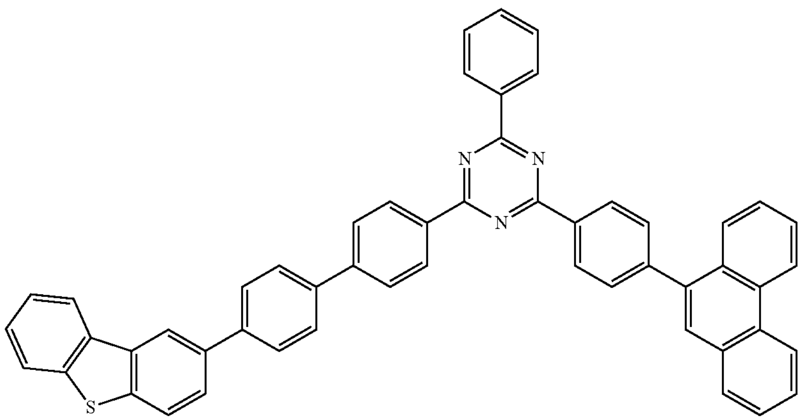
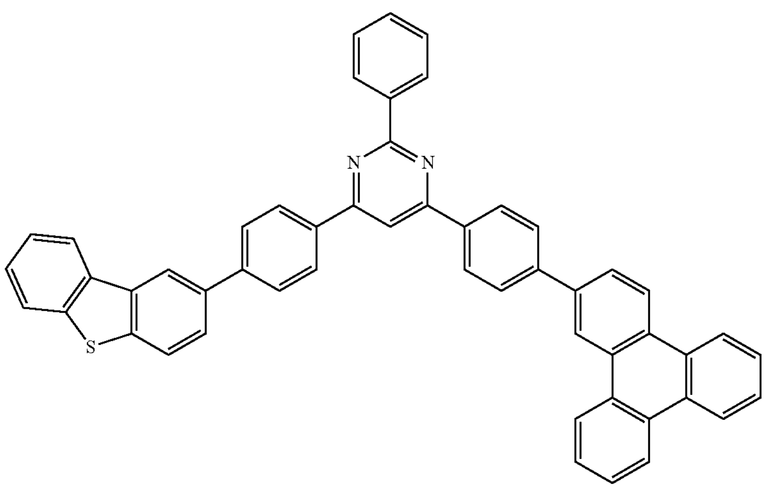
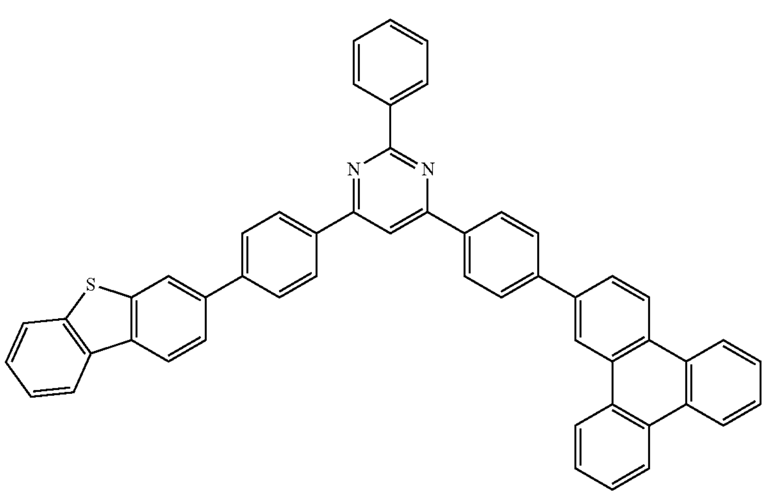

-continued
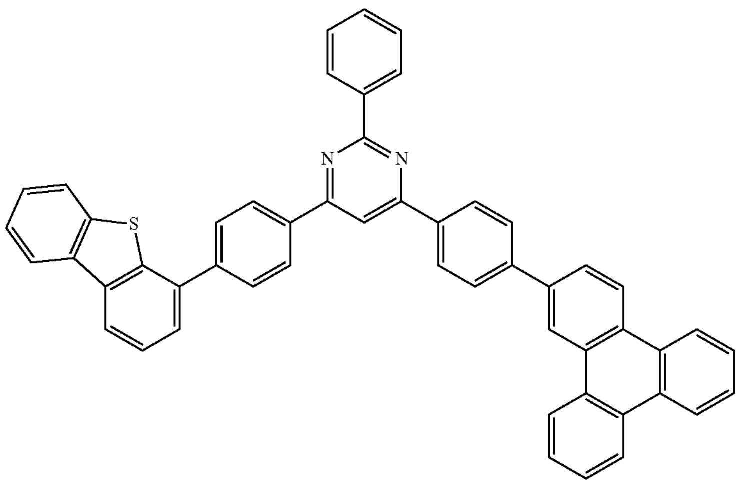
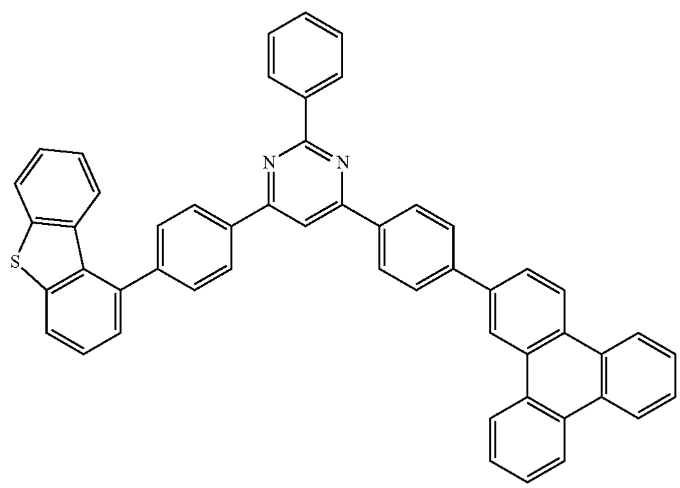
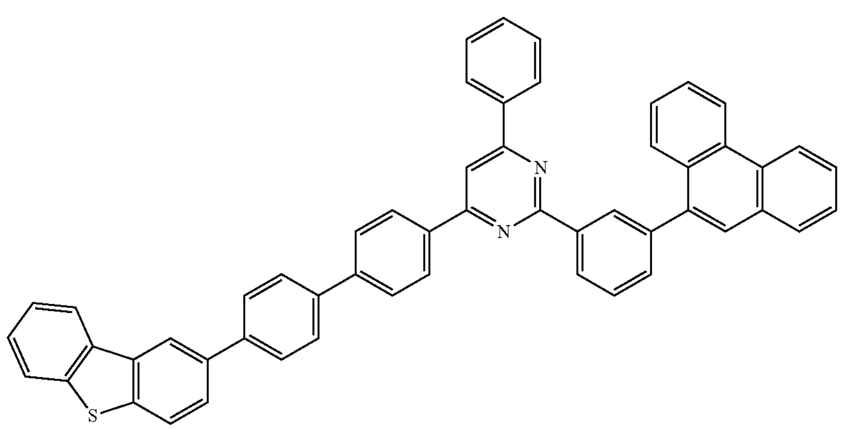

-continued
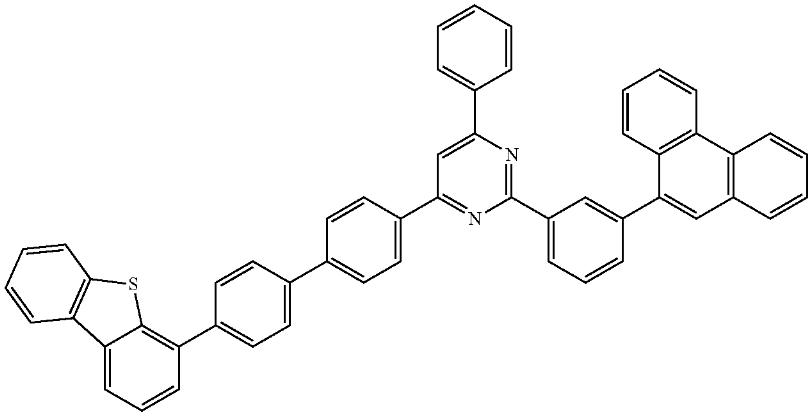
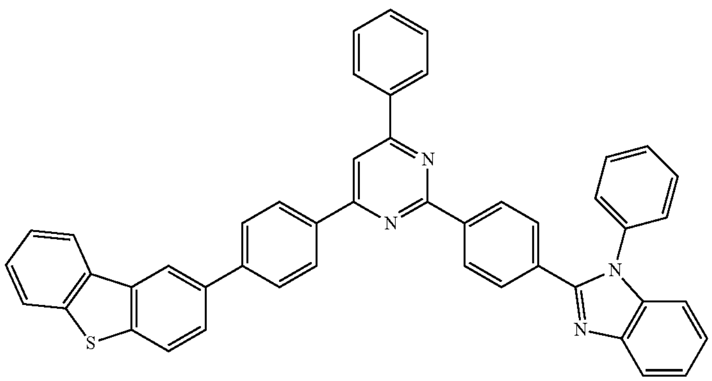
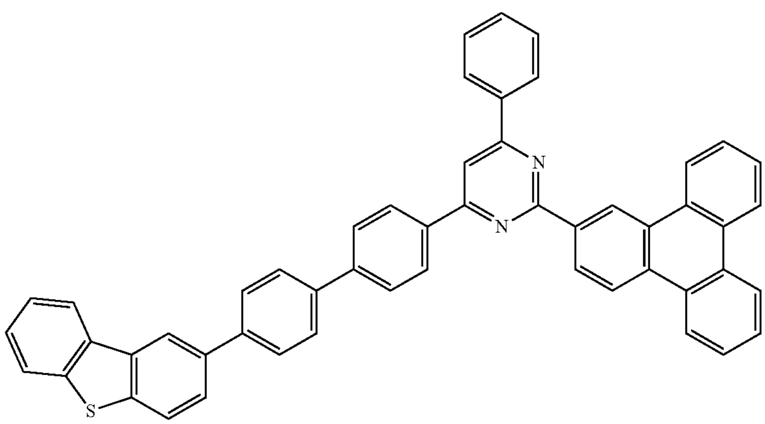
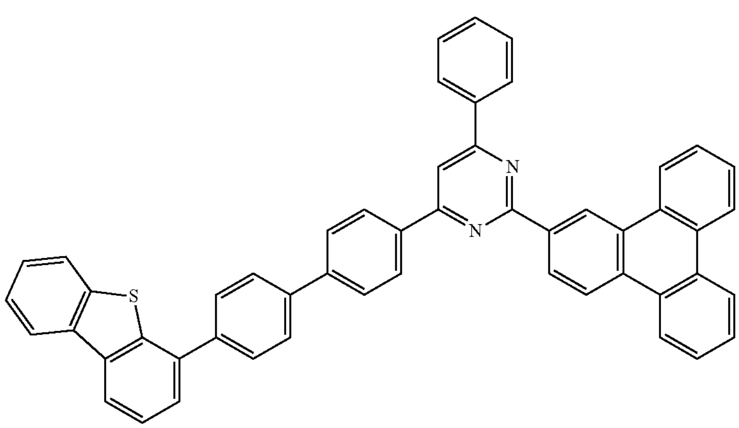

-continued
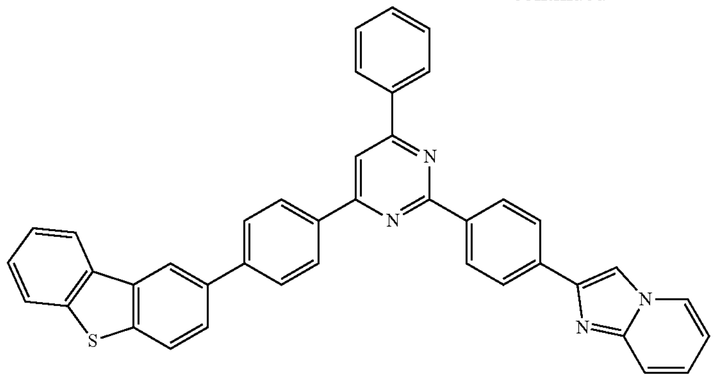
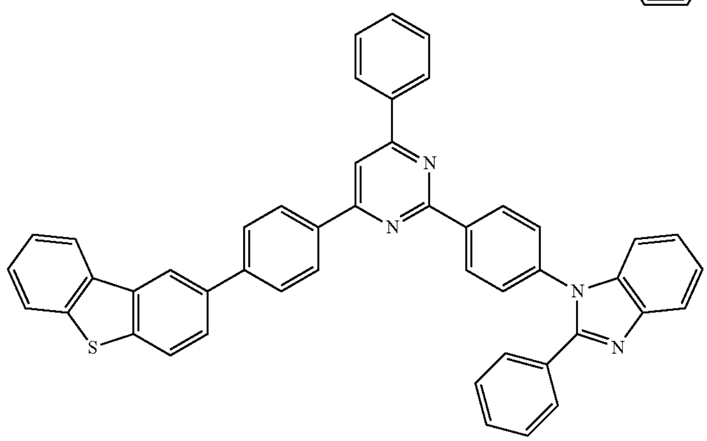
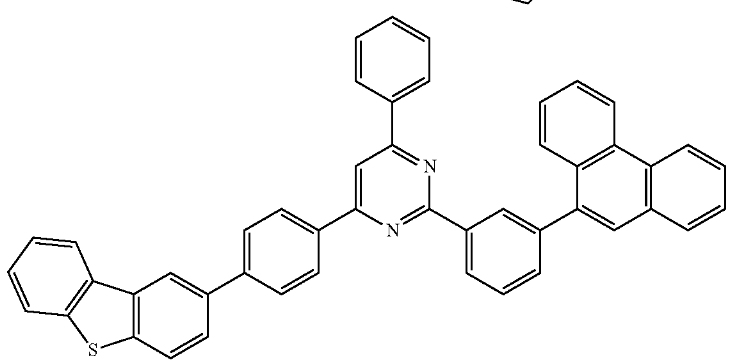
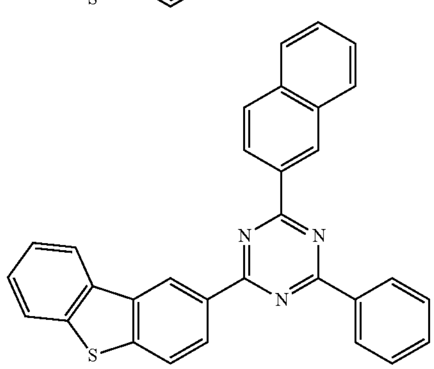
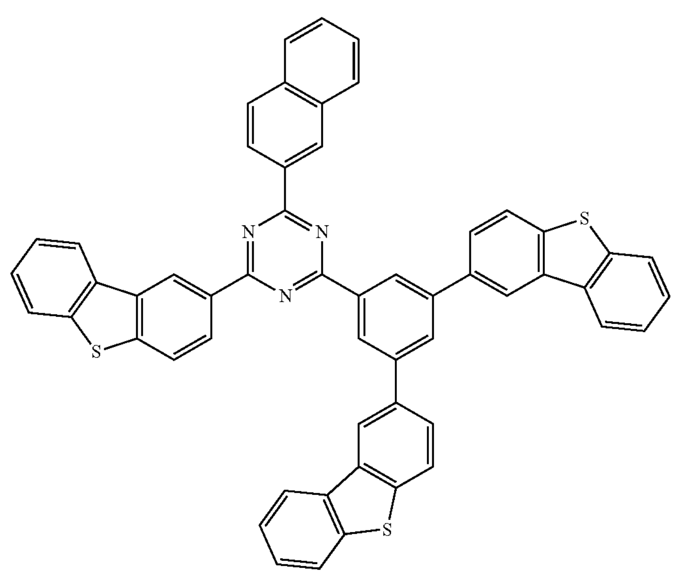

-continued
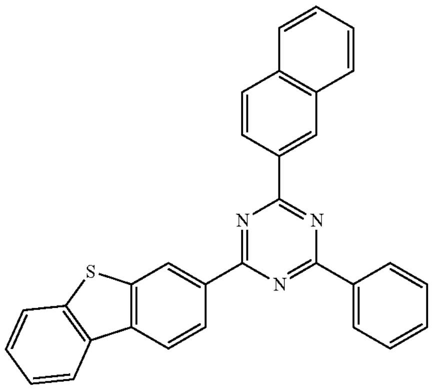
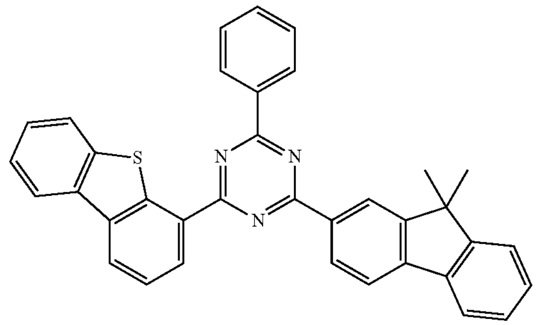
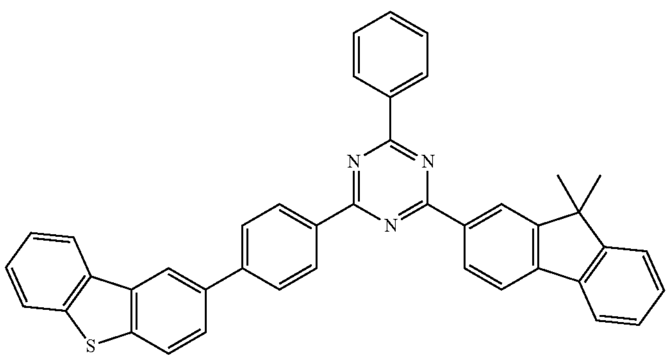
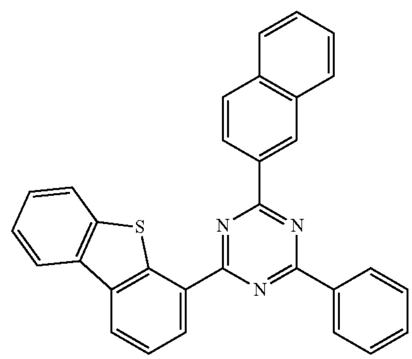
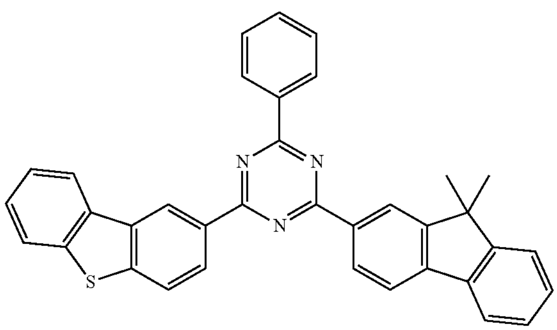
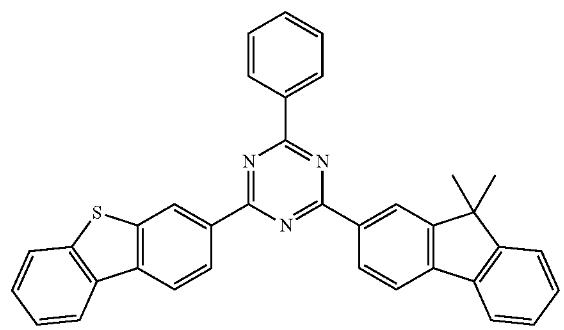
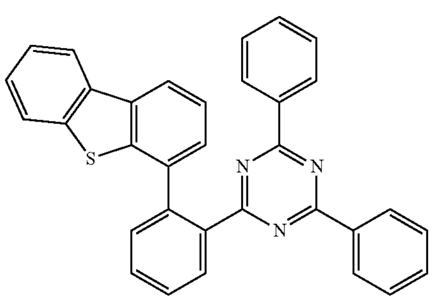
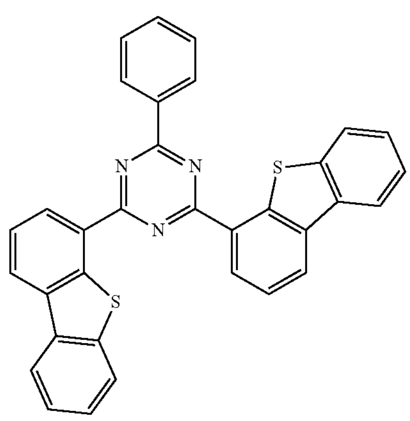

-continued
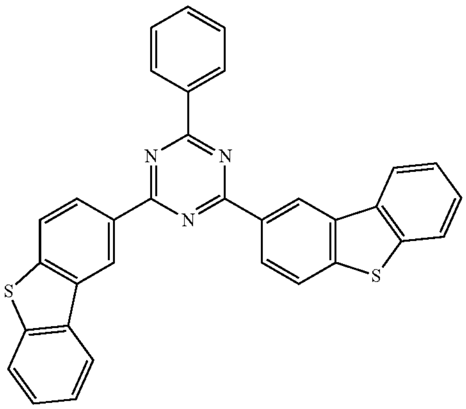
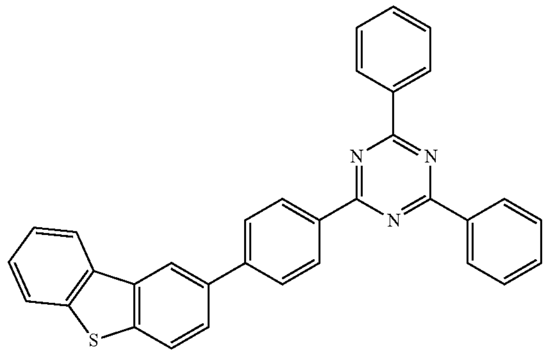
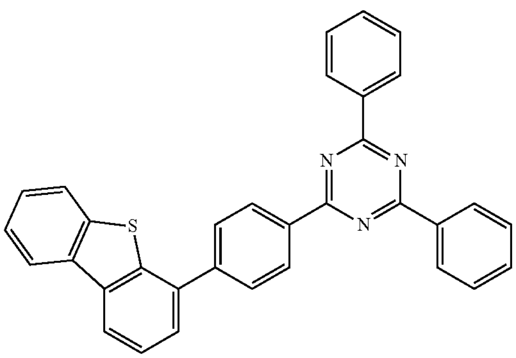
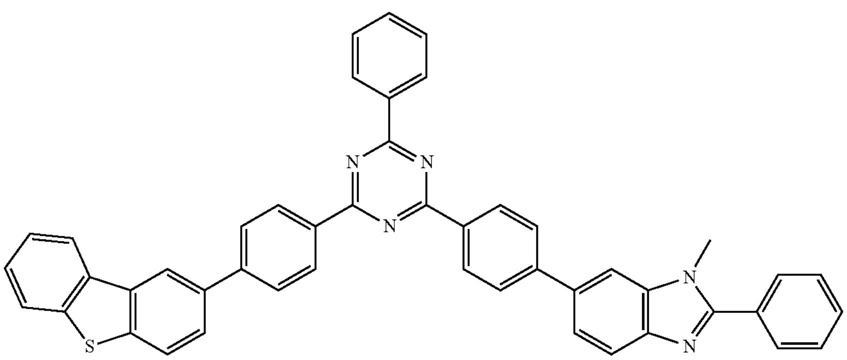
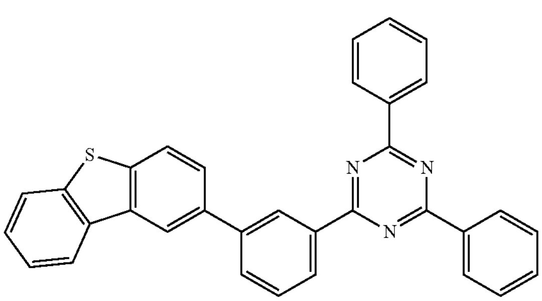

-continued
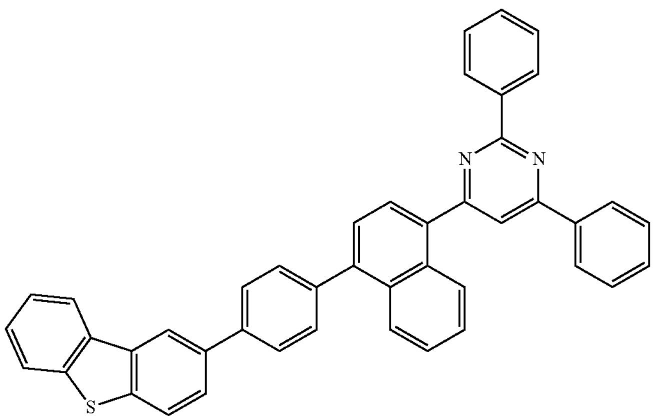
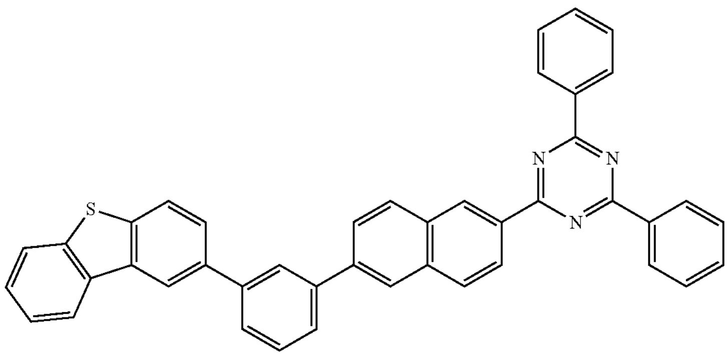
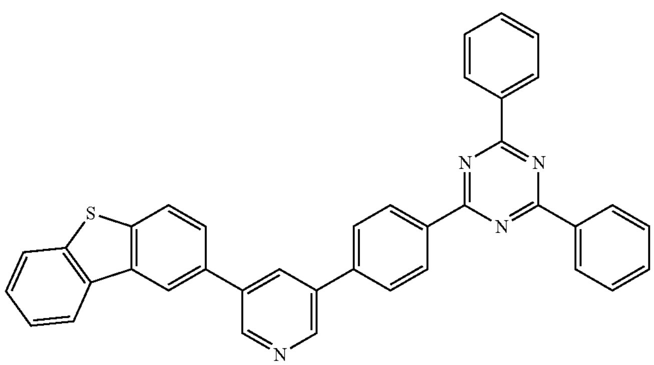
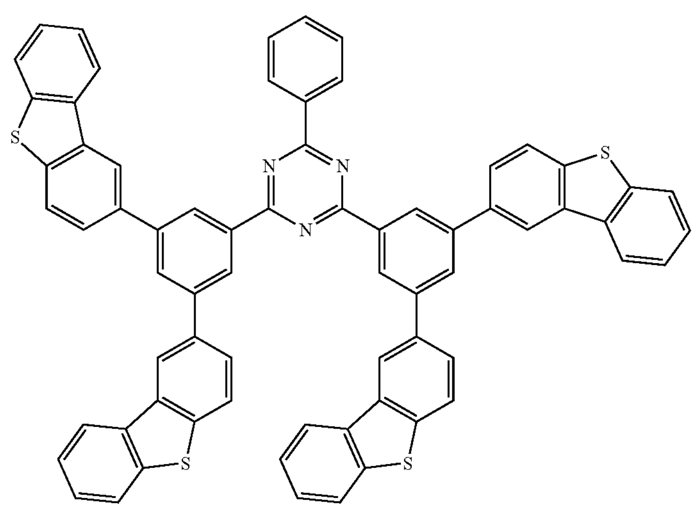

-continued
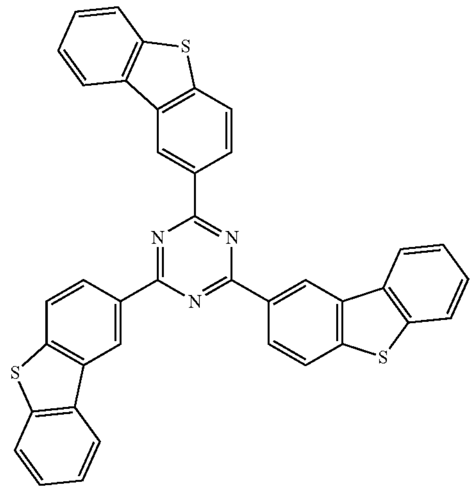
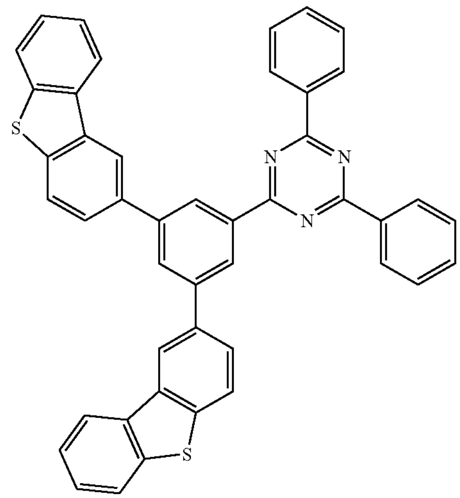
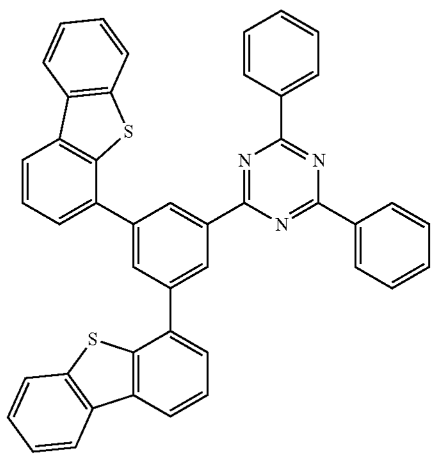
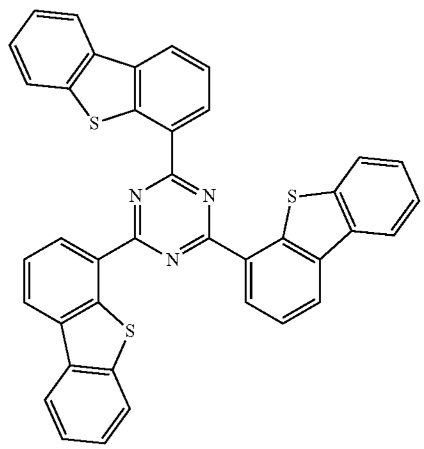
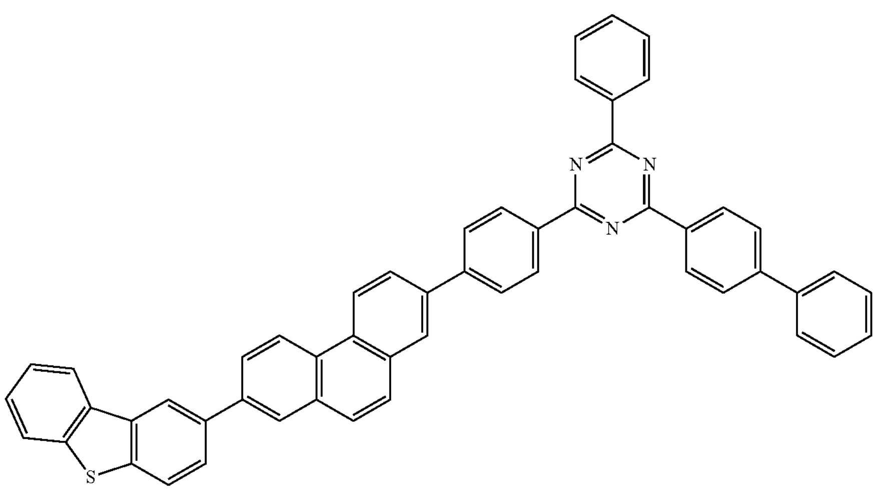

-continued
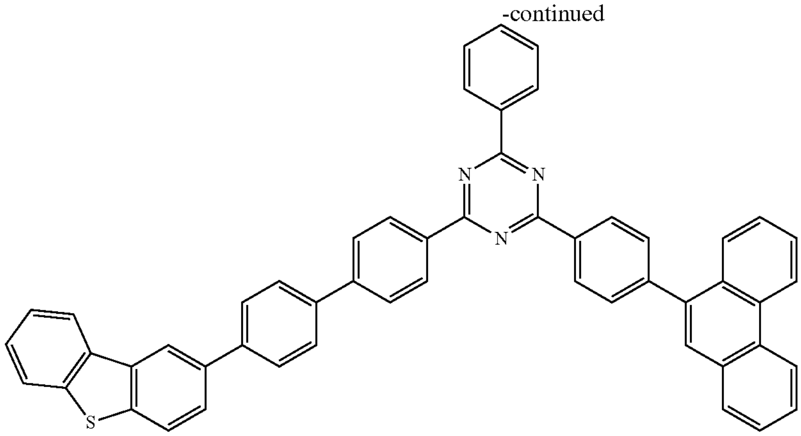
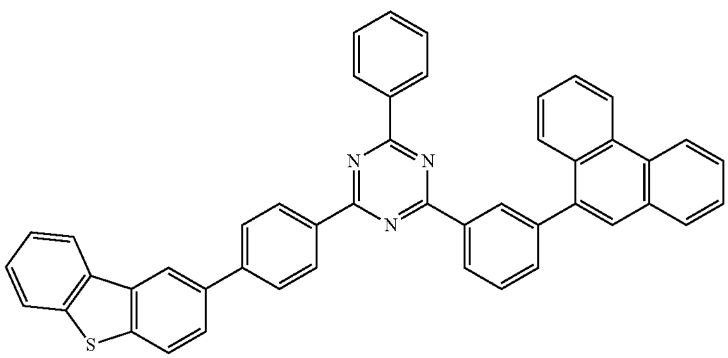
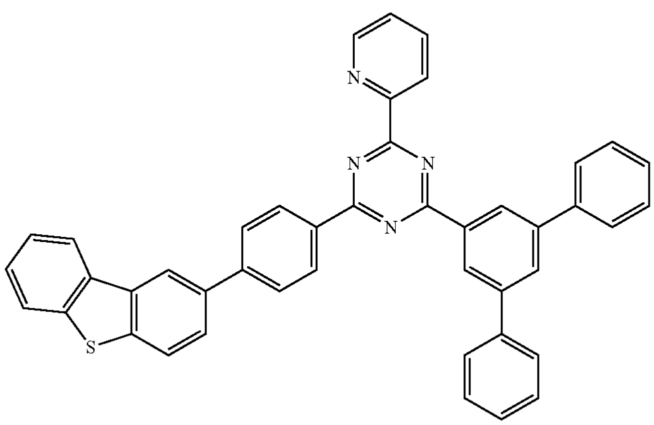
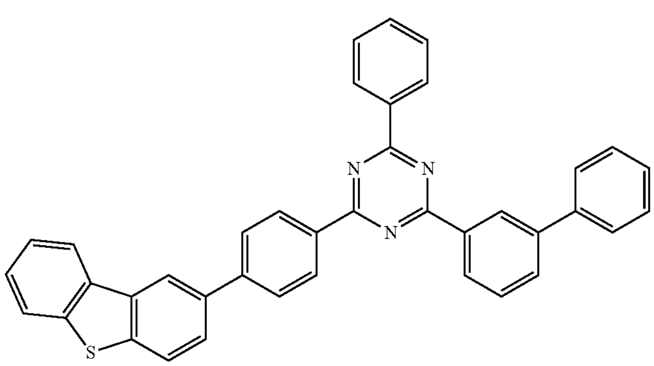

-continued
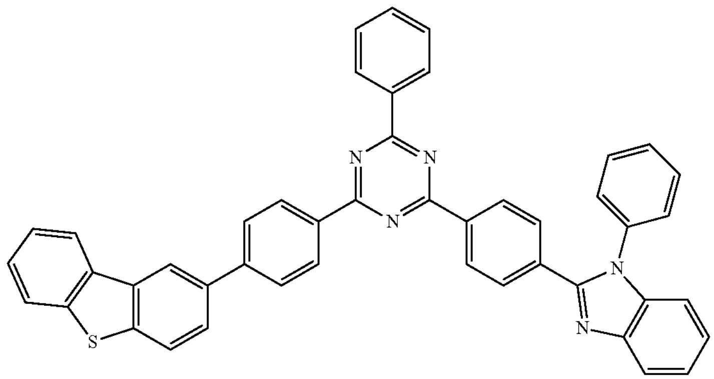
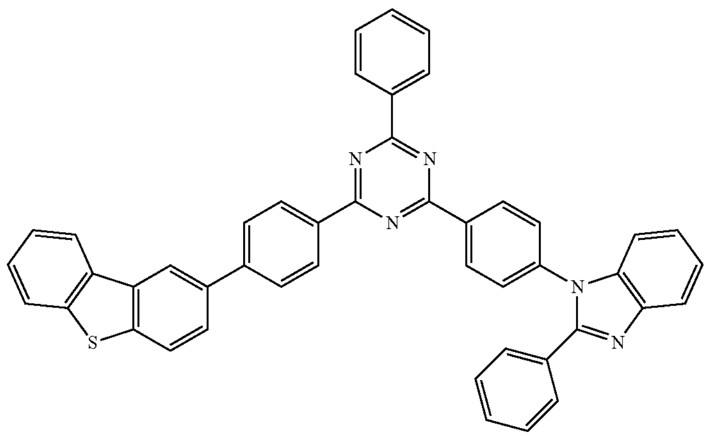 [SMILES: c1ccc(-c2nc(-c3ccc(-c4ccc5sc6ccccc6c5c4)cc3)nc(-c3ccc(-n4c(-c5ccccc5)nc5ccccc54)cc3)n2)cc1]
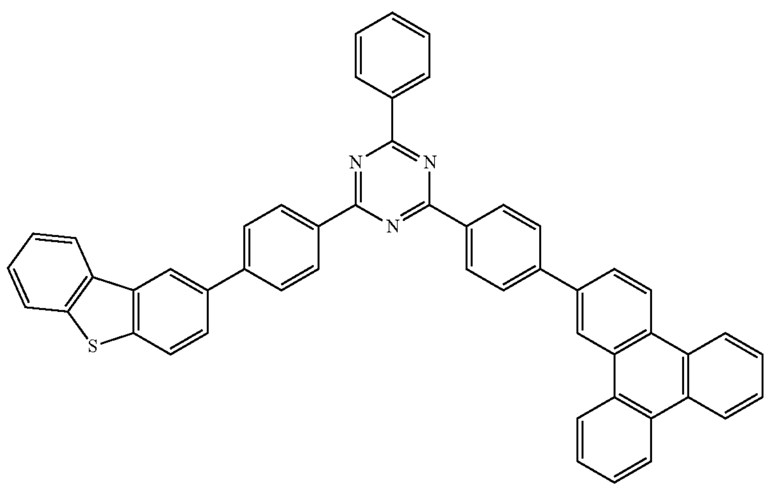
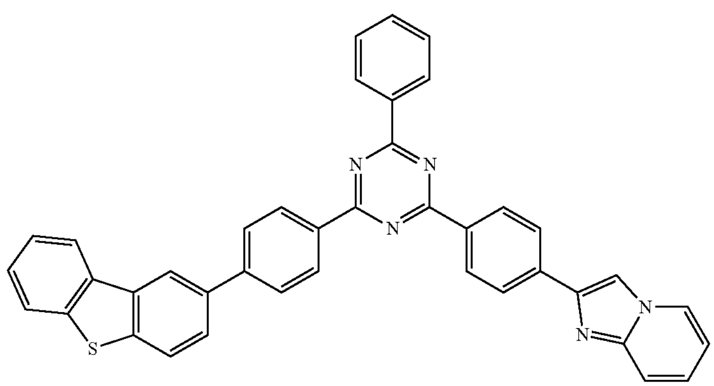

-continued
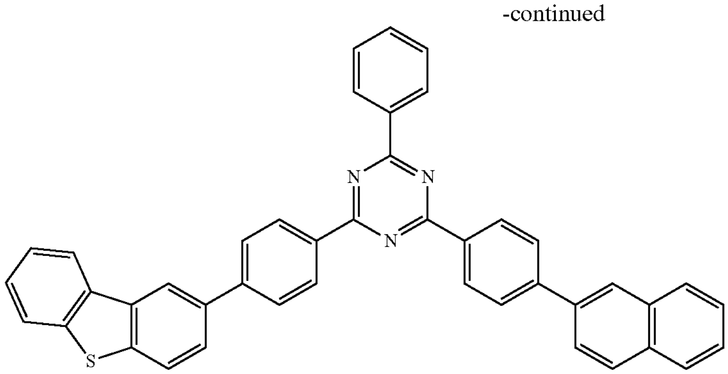
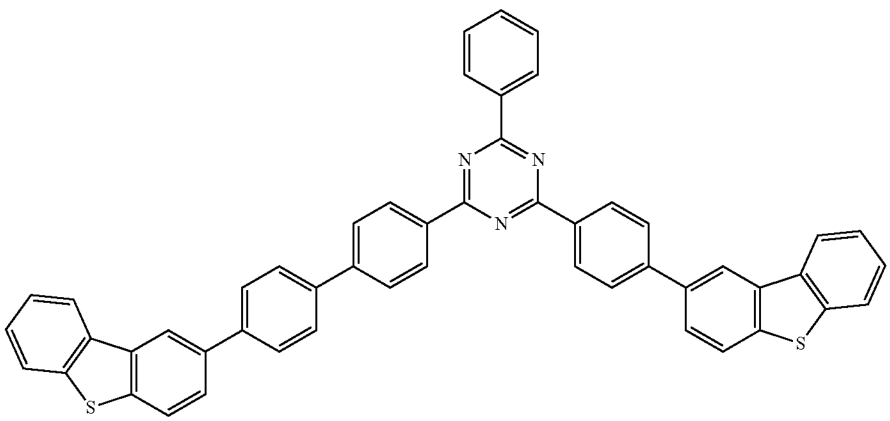
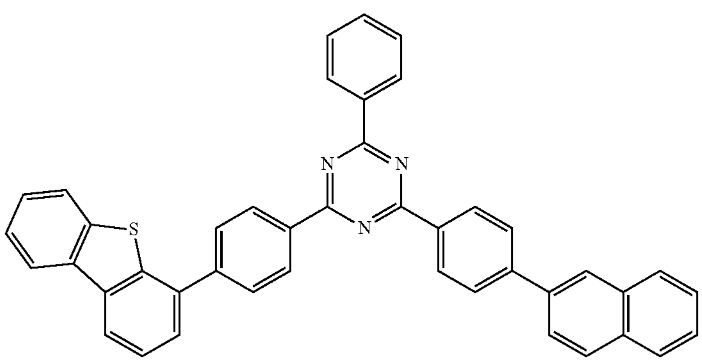 [SMILES: c1ccc(-c2nc(-c3ccc(-c4ccc5ccccc5c4)cc3)nc(-c3ccc(-c4cccc5c4sc4ccccc45)cc3)n2)cc1]
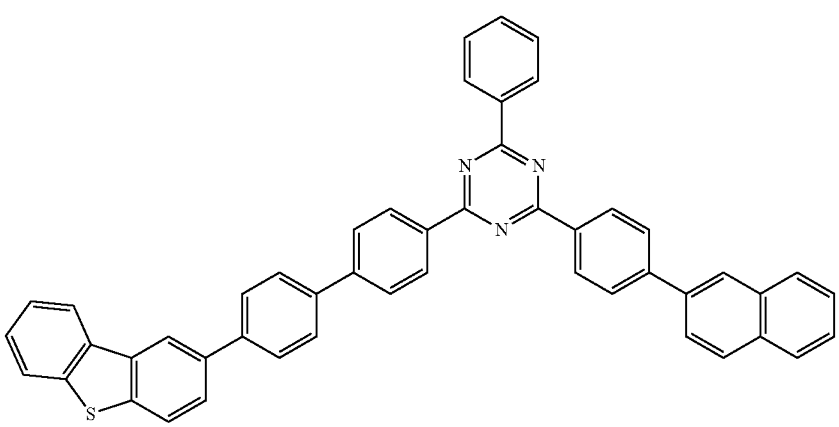

-continued
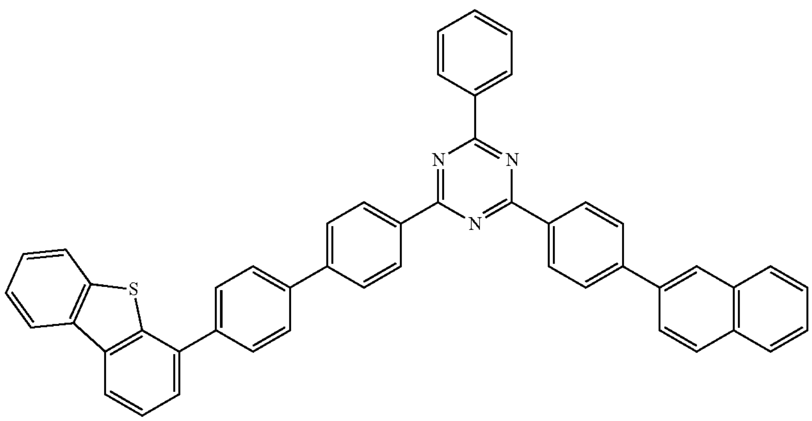
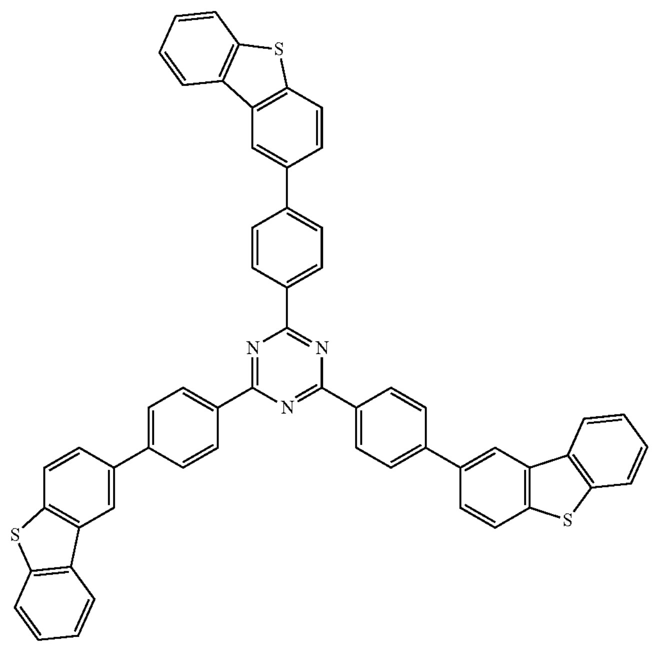
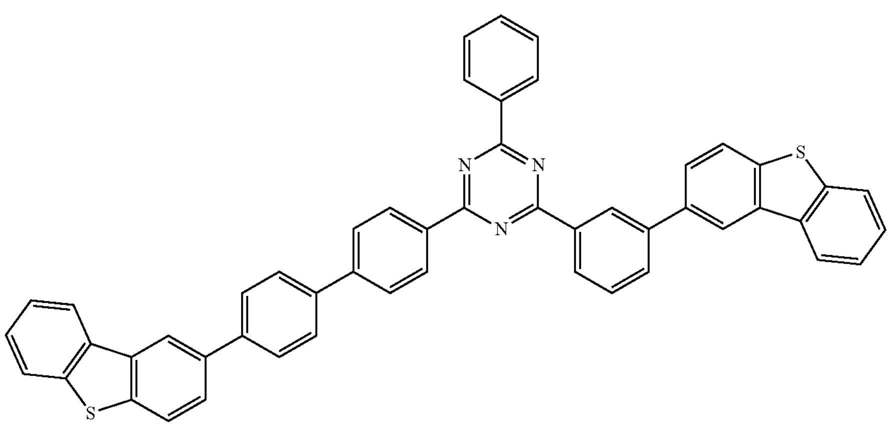

-continued
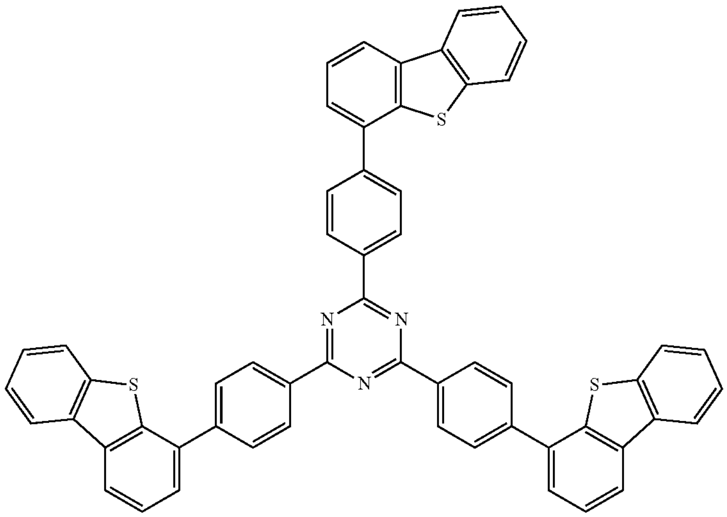
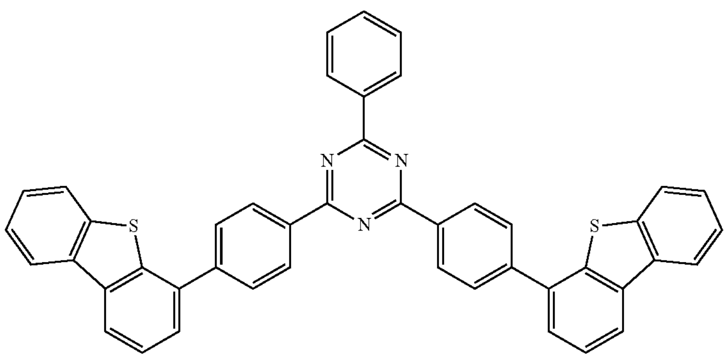
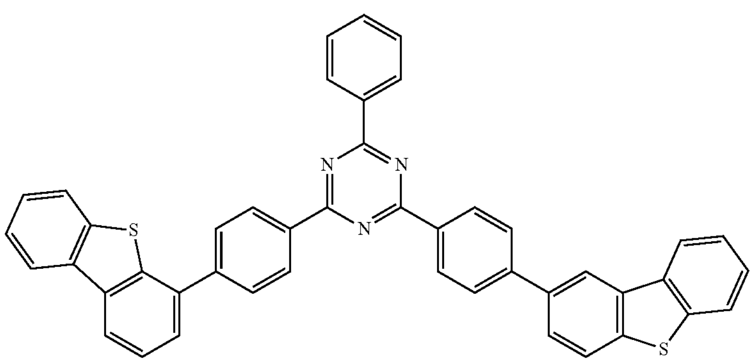
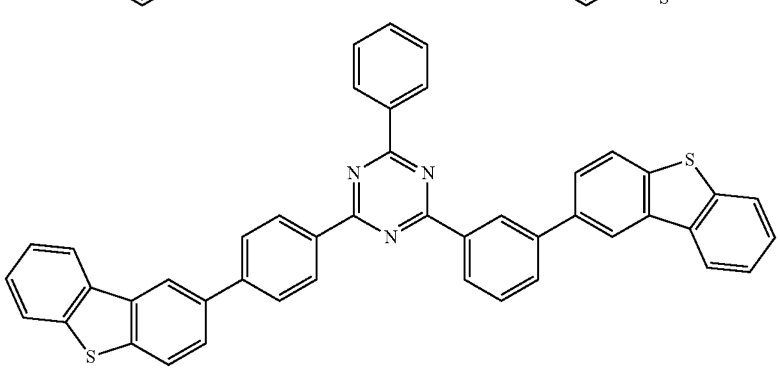

-continued
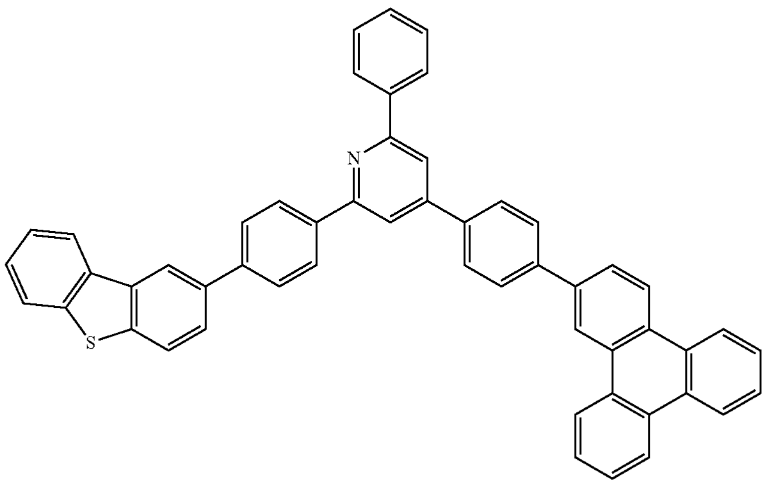
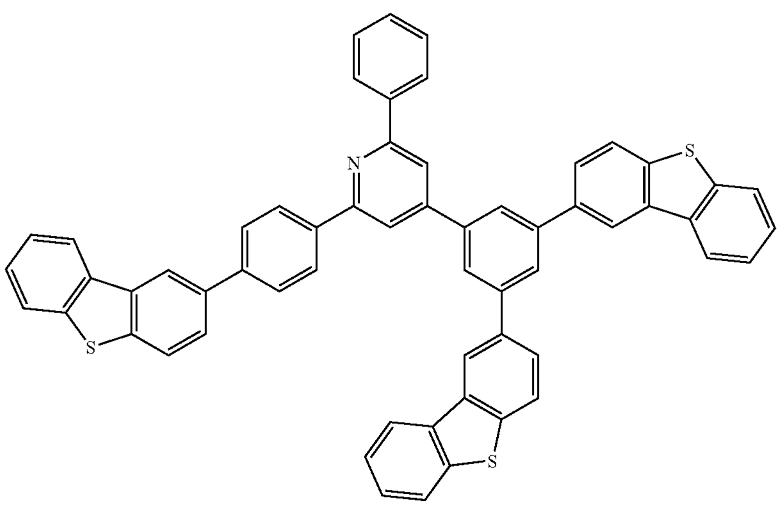
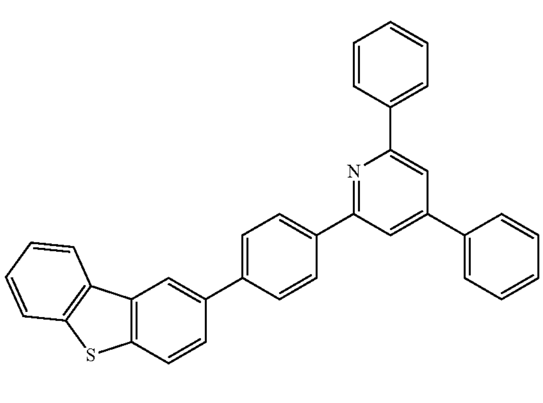
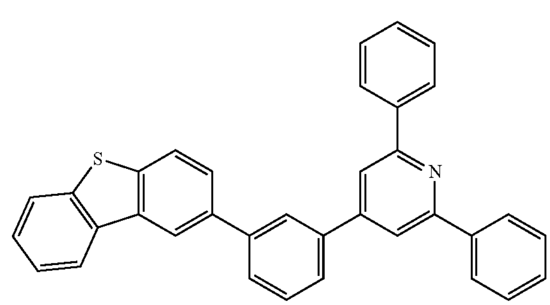

-continued
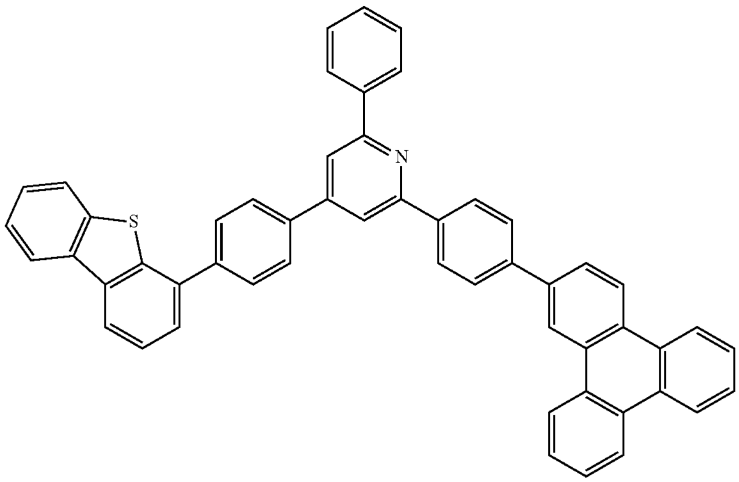
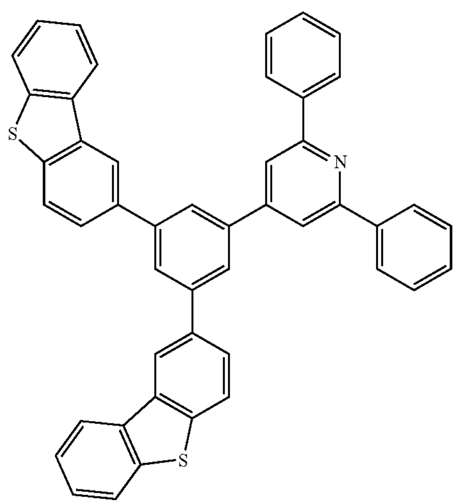
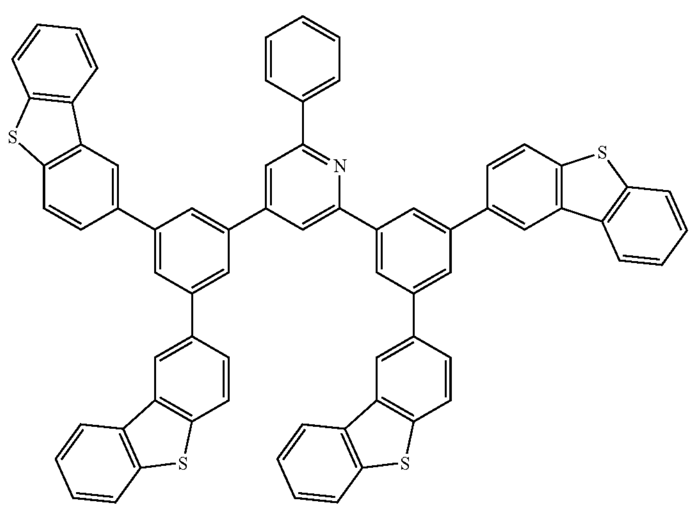

-continued
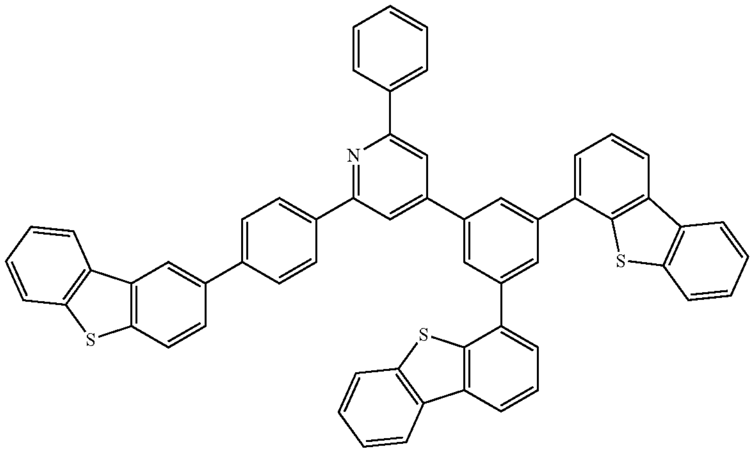 [SMILES: c1ccc(-c2cc(-c3cc(-c4cccc5c4sc4ccccc45)cc(-c4cccc5c4sc4ccccc45)c3)cc(-c3ccc(-c4ccc5sc6ccccc6c5c4)cc3)n2)cc1]
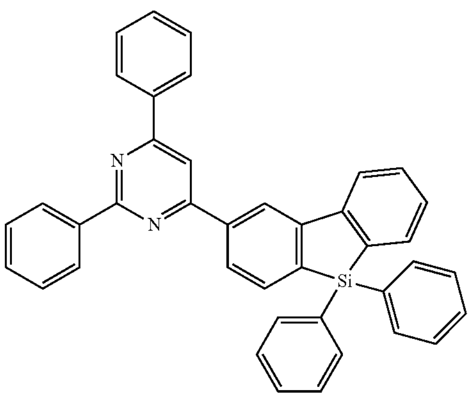
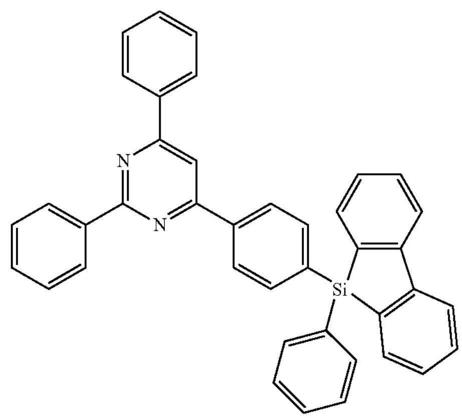
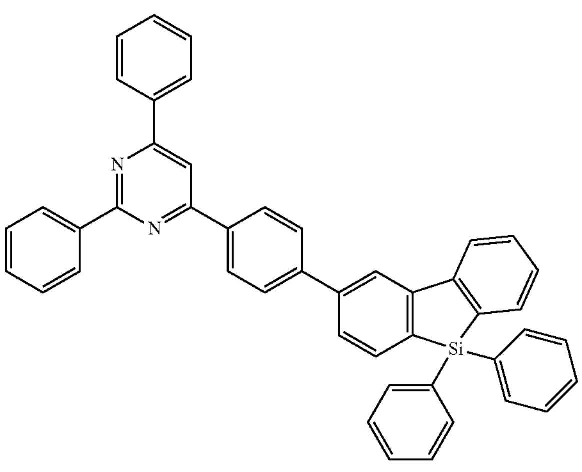

-continued
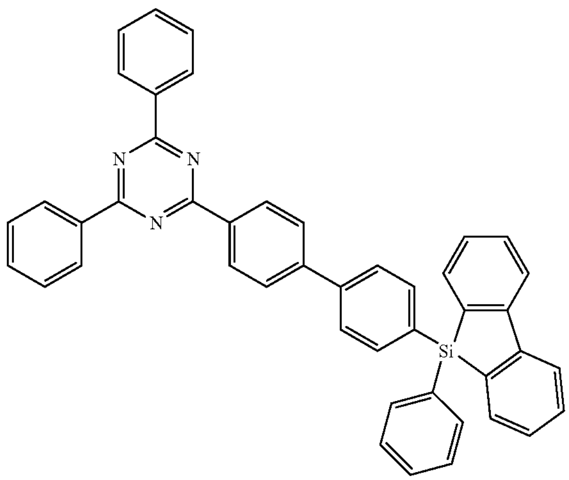
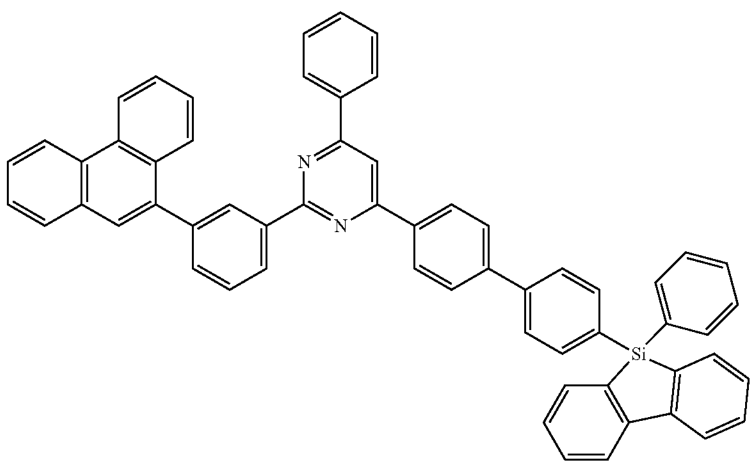
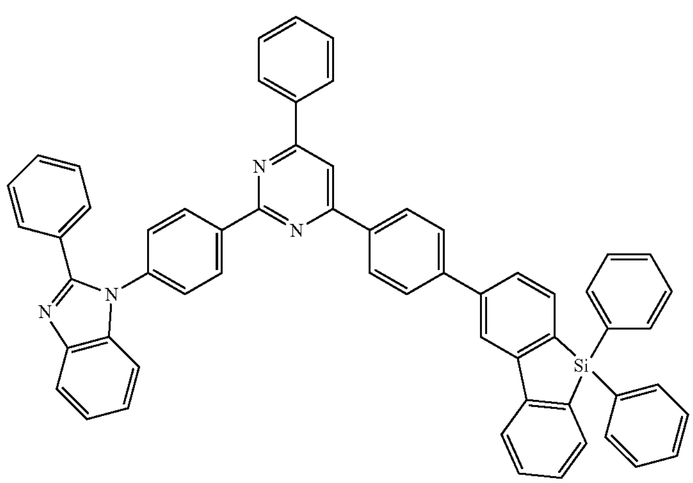

-continued
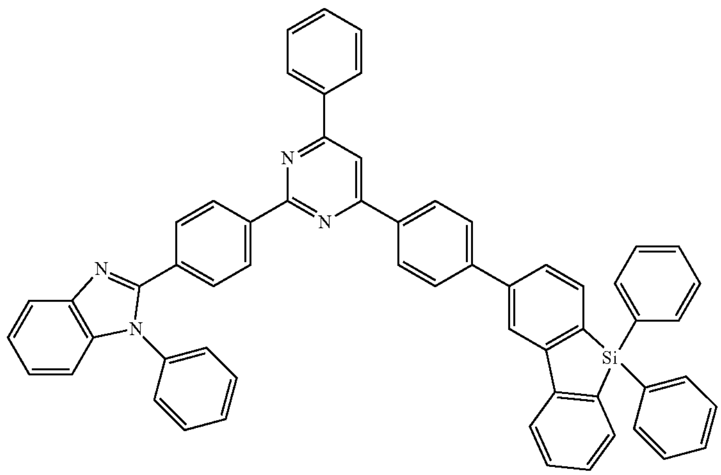
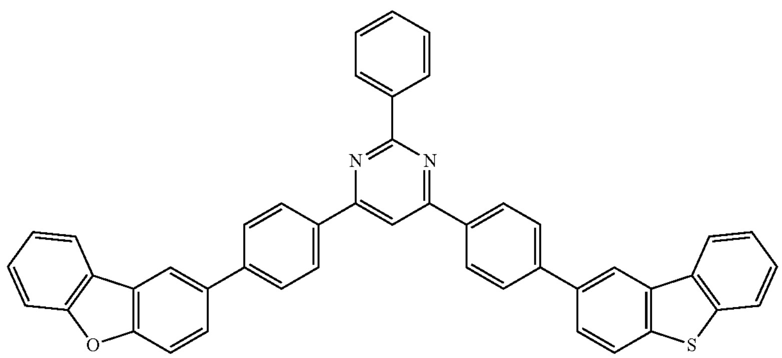
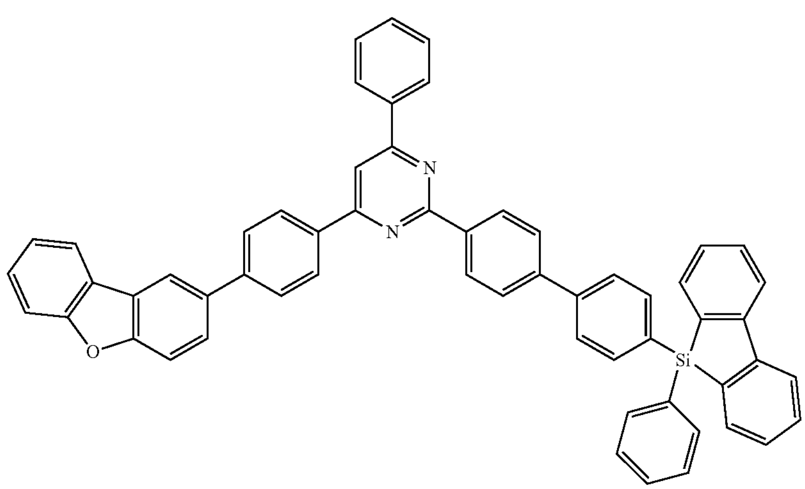

-continued

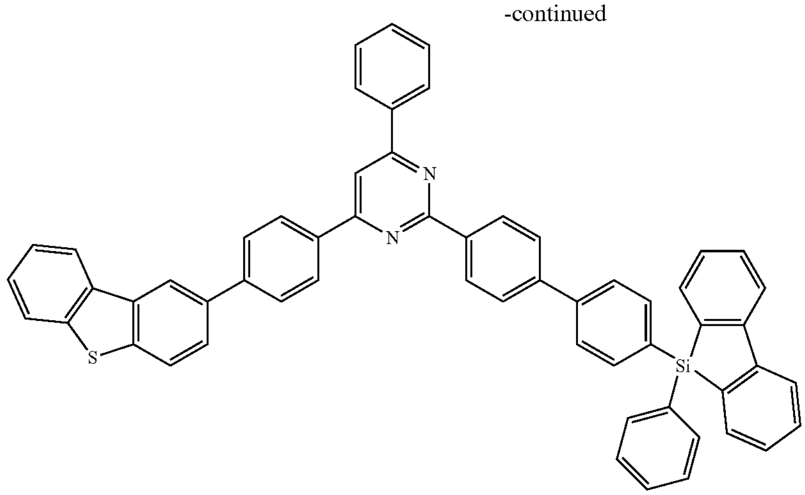

Second Host Material

As the second host material used in the organic EL device of this exemplary embodiment, a compound represented by a formula (4) below may be used.

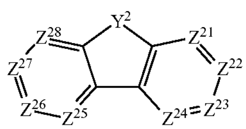

(4)

In the formula (4), $Y^2$ is represented by a formula (4-B) below.

In the formula (4), one of $Z^{21}$ to $Z^{28}$ is a carbon atom to be bonded to $L^{211}$ in the following formula (5), or a pair of adjacent ones of $Z^{21}$ to $Z^{28}$ are carbon atoms to be bonded to b and c in one of the following formulae (6-1) to (6-4) to form a fused ring.

$Z^{21}$ to $Z^{28}$ which are not bonded to $L^{211}$, b and c are $CR^{21}$. $R^{21}$ represents the same as $R^1$ of the formula (1). A plurality of $R^{21}$ are mutually the same or different.

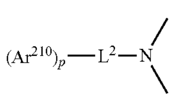

(4-B)

In the formula (4-B), $Ar^{210}$ is a substituted or unsubstituted aromatic hydrocarbon group having 6 to 30 ring carbon atoms or a substituted or unsubstituted heterocyclic group having 5 to 30 ring atoms.

p is an integer of 1 to 3. When p is 2 or more, a plurality of $Ar^{210}$ are mutually the same or different.

$L^2$ represents a single bond or a linking group. The linking group in $L^2$ is a substituted or unsubstituted aromatic hydrocarbon group having 6 to 30 ring carbon atoms, a substituted or unsubstituted polyvalent heterocyclic group having 5 to 30 ring atoms, or a polyvalent multiple linking group provided by bonding two or three groups selected from the aromatic hydrocarbon group and the heterocyclic group.

In the multiple linking group, the aromatic hydrocarbon group and the heterocyclic group forming the multiple linking group may be mutually the same or different and may be mutually bonded to form a ring.

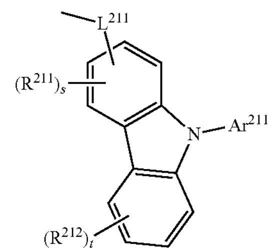

(5)

In the formula (5), $L^{211}$ is a single bond or a linking group which is bonded to one of $Z^{21}$ to $Z^{28}$ in the formula (4).

The linking group in $L^{211}$ is a substituted or unsubstituted divalent or trivalent aromatic hydrocarbon group having 6 to 30 ring carbon atoms, a substituted or unsubstituted divalent or trivalent heterocyclic group having 5 to 30 ring atoms, or a divalent or trivalent multiple linking group provided by bonding two or three groups selected from the aromatic hydrocarbon group and the heterocyclic group.

In the multiple linking group, the aromatic hydrocarbon group and the heterocyclic group forming the multiple linking group may be mutually the same or different and may be mutually bonded to form a ring.

$Ar^{211}$ is a substituted or unsubstituted aromatic hydrocarbon group having 6 to 30 ring carbon atoms or a substituted or unsubstituted heterocyclic group having 5 to 30 ring atoms.

$R^{211}$ and $R^{212}$ represent the same as $R^1$ of the formula (1).

s is 3 and t is 4. A plurality of $R^{211}$ and $R^{212}$ are mutually the same or different.

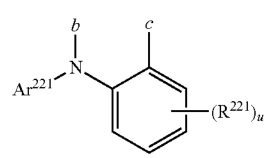

(6-1)

-continued (6-2)

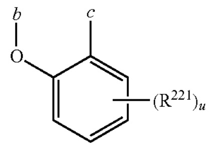

(6-3)

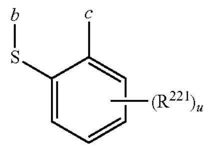

(6-4)

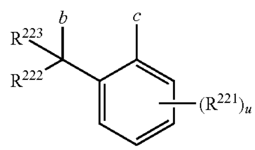

In the formulae (6-1) to (6-4), b and c are bonded to one of the pairs of adjacent ones of $Z^{21}$ to $Z^{28}$ in the formula (4) to form a fused ring.

$Ar^{221}$ is a substituted or unsubstituted aromatic hydrocarbon group having 6 to 30 ring carbon atoms or a substituted or unsubstituted heterocyclic group having 5 to 30 ring atoms.

$R^{221}$ to $R^{223}$ represent the same as $R^1$ of the formula (1).

u is 4. A plurality of $R^{221}$ are mutually the same or different.

Adjacent ones of $R^{221}$ may be bonded to each other to form a ring.

In the formula (4-B), $Ar^{210}$ is preferably a substituted or unsubstituted fused aromatic hydrocarbon group having 14 to 30 ring carbon atoms or a substituted or unsubstituted heterocyclic group having 5 to 30 ring atoms, more preferably a substituted or unsubstituted heterocyclic group having 5 to 30 ring atoms. $Ar^{210}$ is more preferably represented by a formula (4-B1) below.

(4-B1)

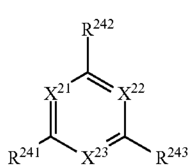

In the formula (4-B1), two or three of $X^{21}$ to $X^{23}$ are preferably nitrogen atoms.

One of $R^{241}$ to $R^{243}$ is a single bond to be bonded to $L^2$. $R^{241}$ to $R^{243}$ which are not bonded to $L^2$ are a substituted or unsubstituted aromatic hydrocarbon group having 6 to 30 ring carbon atoms.

In the formula (4), one of $Z^{21}$ to $Z^{28}$ is preferably a carbon atom to be bonded to $L^{211}$ in the formula (5).

In the formulae (4), when $Y^2$ is an oxygen atom, one pair of the adjacent ones of $Z^{21}$ to $Z^{28}$ are carbon atoms to be bonded to b and c in the following formulae (6-1) to (6-4) to form a fused ring.

The compound represented by the formula (4) is preferably a compound represented by one of the following formulae (51) to (55).

(51)

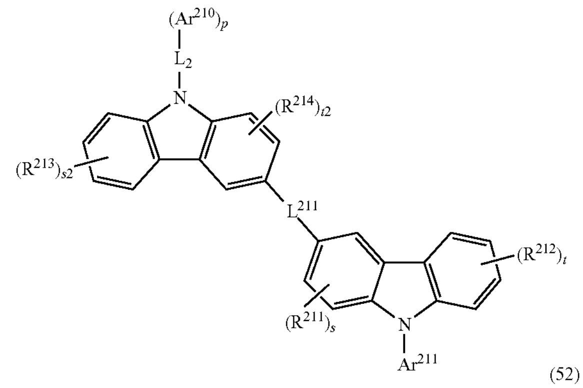

(52)

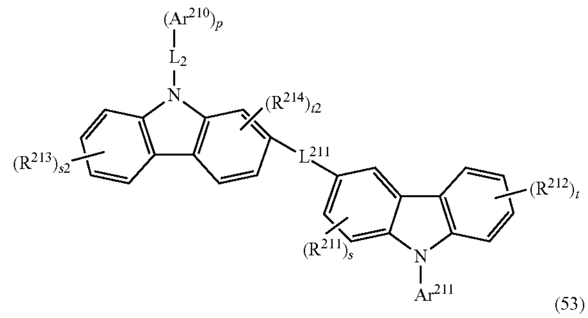

(53)

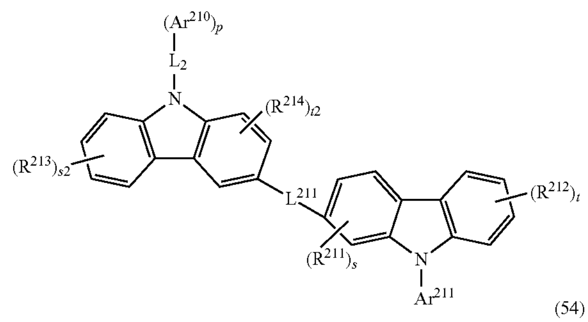

(54)

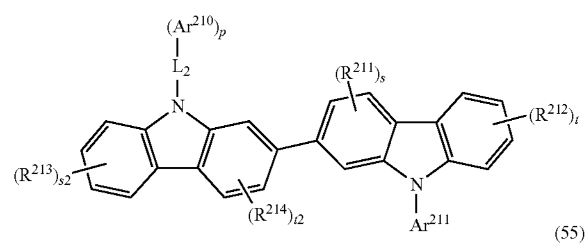

(55)

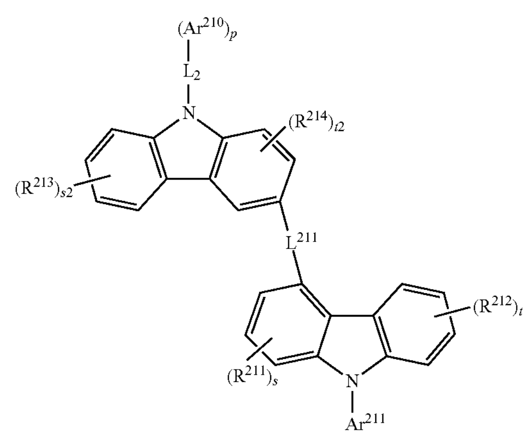

In the formulae (51) to (55), $Ar^{210}$, $L^2$ and p respectively represent the same as $Ar^{210}$, $L^2$ and p of the formula (4-B). When p is 2 or more, a plurality of $Ar^{210}$ are the same or different.

$R^{213}$ and $R^{214}$ represent the same as $R^1$ of the formula (1). A plurality of $R^{213}$ and $R^{214}$ are mutually the same or different.

s2 is 4 and t2 is 3.

$Ar^{211}$, $L^{211}$, $R^{211}$, $R^{212}$, s and t respectively represent the same as $Ar^{211}$, $L^{211}$, $R^{211}$, $R^{212}$, s and t of the formula (5).

The compound represented by the formula (4) is preferably a compound represented by one of formulae (7) to (9) below.

(7)

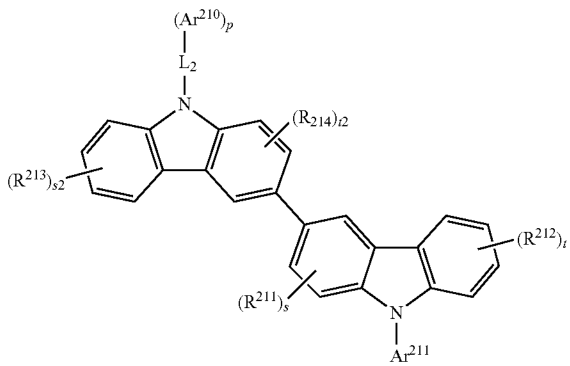

(8)

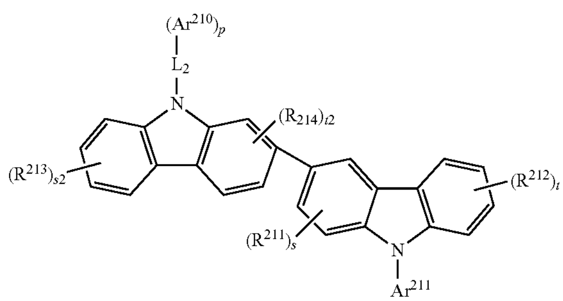

(9)

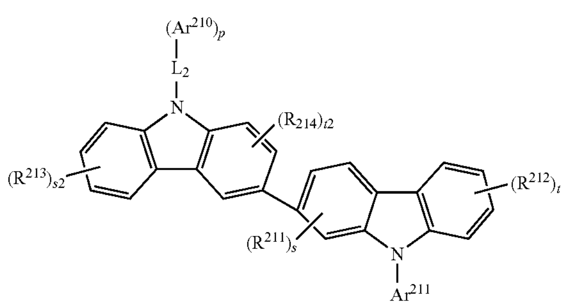

In the formulae (7) to (9), $Ar^{210}$, $L^2$ and p represent the same as $Ar^{210}$, $L^2$ and p of the formula (4-B). When p is 2 or more, a plurality of $Ar^{210}$ are the same or different.

$R^{213}$ and $R^{214}$ represent the same as $R^1$ of the formula (1). A plurality of $R^{213}$ and $R^{214}$ are mutually the same or different.

s2 is 4 and t2 is 3.

$Ar^{211}$, $R^{211}$, $R^{212}$, s and t represent the same as $Ar^{211}$, $R^{211}$, $R^{212}$, s and t of the formula (5).

The compound represented by the formula (4) is also preferably a compound represented by one of formulae (10) to (27) below.

(10)

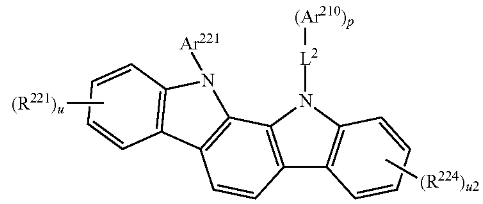

(11)

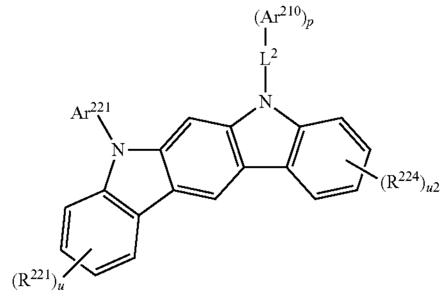

(12)

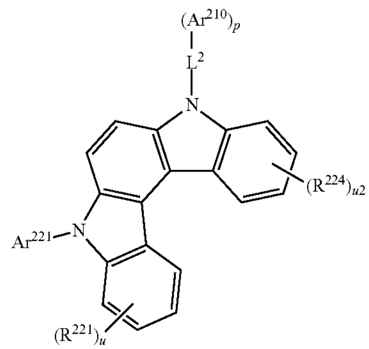

(13)

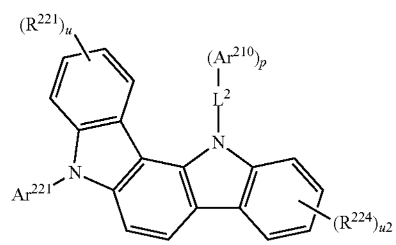

(14)

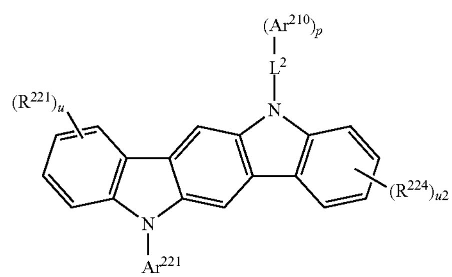

(15)

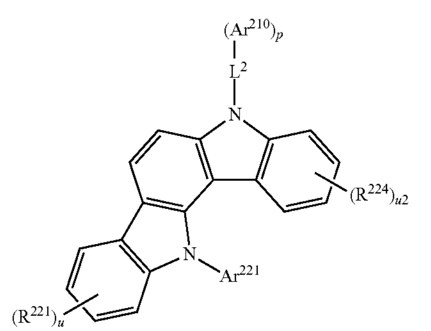

-continued
(16)
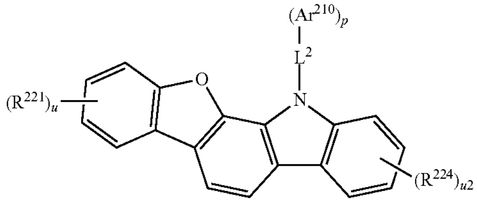
(17)
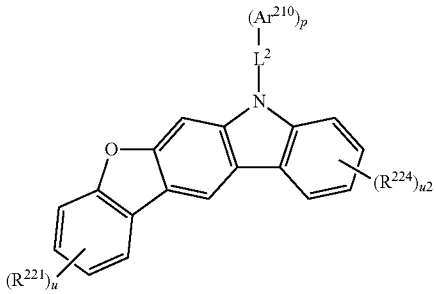
(18)
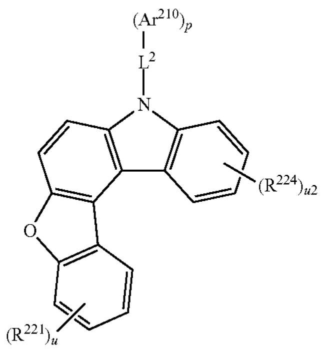
(19)
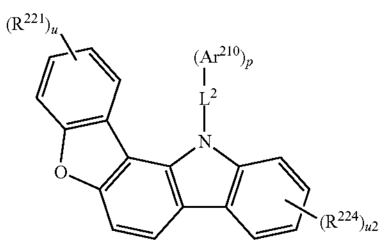
(20)
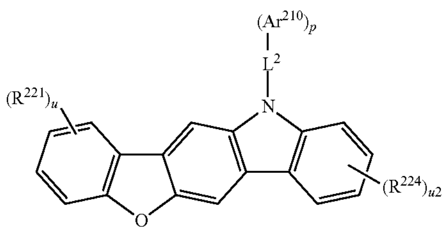
(21)
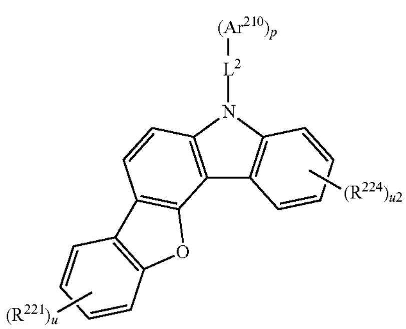
-continued
(22)
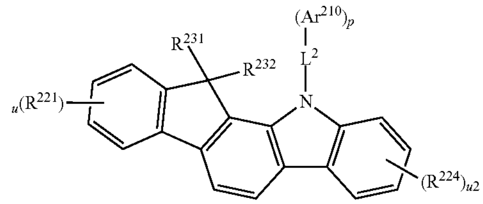
(23)
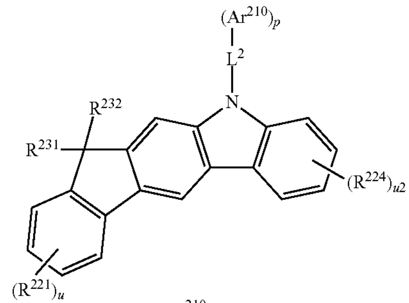
(24)
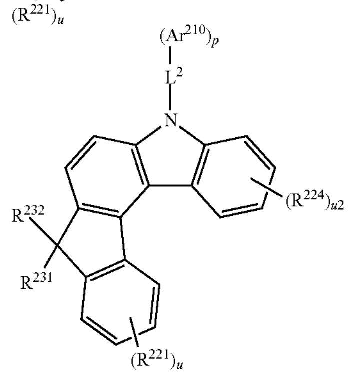
(25)
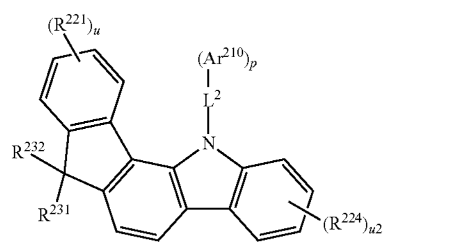
(26)
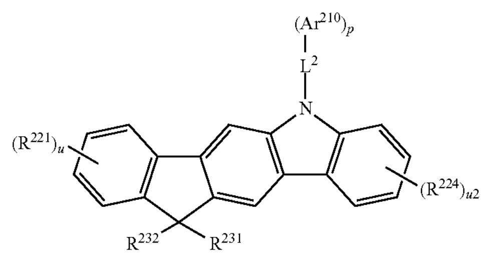
(27)
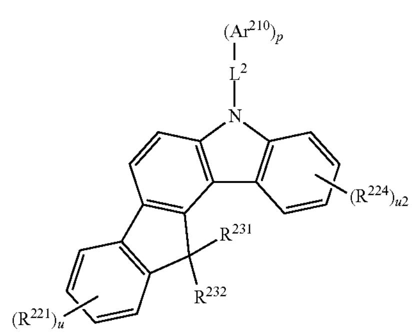

In the formulae (10) to (27), $Ar^{210}$, $L^2$ and p represent the same as $Ar^{210}$, $L^2$ and p of the formula (4-B). When p is 2 or more, a plurality of $Ar^{210}$ are the same or different.

$Ar^{221}$ is a substituted or unsubstituted aromatic hydrocarbon group having 6 to 30 ring carbon atoms or a substituted or unsubstituted heterocyclic group having 5 to 30 ring atoms.

$R^{221}$, $R^{224}$, $R^{231}$ and $R^{232}$ represent the same as $R^1$ of the formula (1).

u and u2 are 4. A plurality of $R^{221}$ and $R^{224}$ are mutually the same or different.

Adjacent ones of $R^{221}$, adjacent one of $R^{224}$, and $R^{231}$ and $R^{232}$ may respectively be bonded to each other to form a ring.

The compound represented by the formula (4) is more preferably a compound represented by the formulae (22) to (27) among the formulae (10) to (27).

Examples of each of the substituents described in the formulae (4) to (5), (6-1) to (6-4), (7) to (27), (4-B) and (4-B1) are the same as the examples of each of the substituents described in the formulae (1) to (3), (1-1) to (1-6) and (2-1) to (2-4).

In the formulae (4) to (5), (6-1) to (6-4), (7) to (27), (4-B) and (4-B1), examples of a substituent in a "substituted or unsubstituted" are the same as described above.

Specific examples of the compound represented by the formula (4) are shown below, but the compound represented by the formula (4) is not limited thereto.

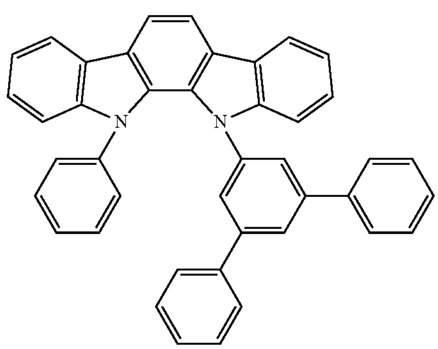

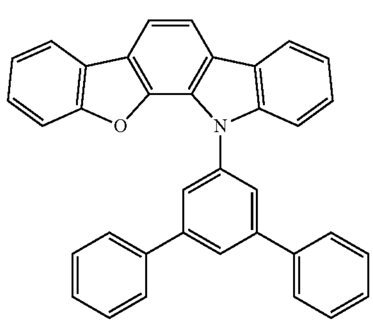

-continued

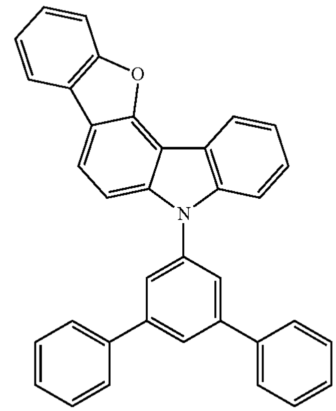

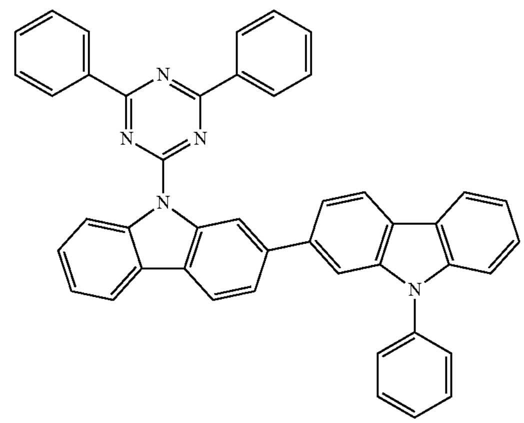

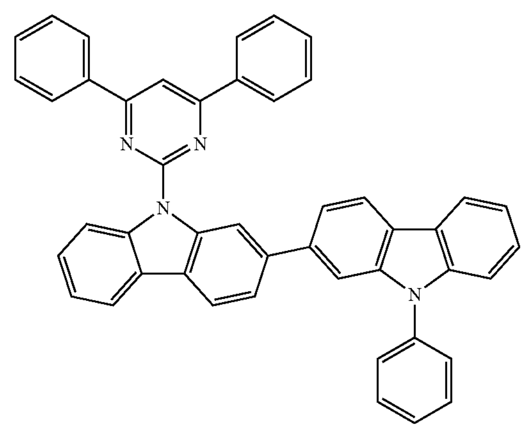

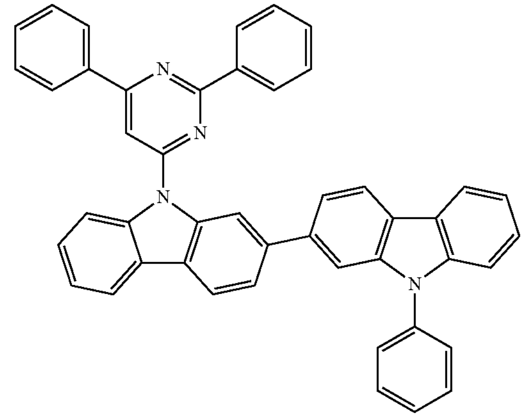

-continued
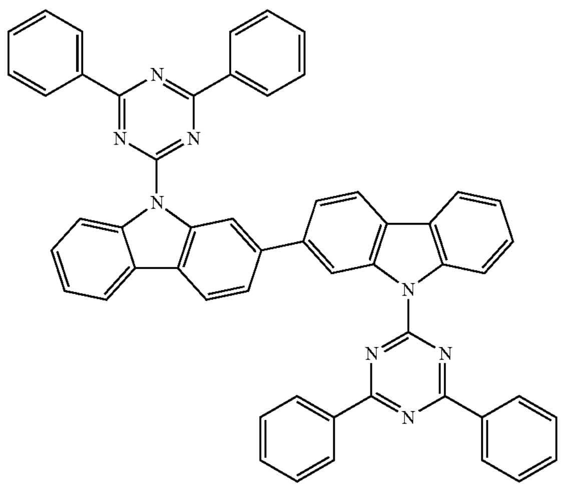
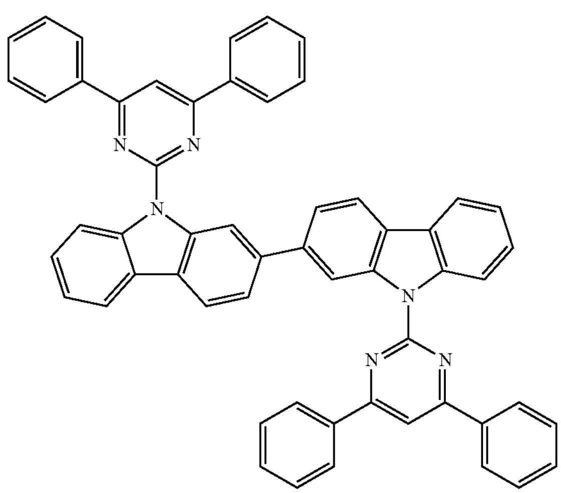
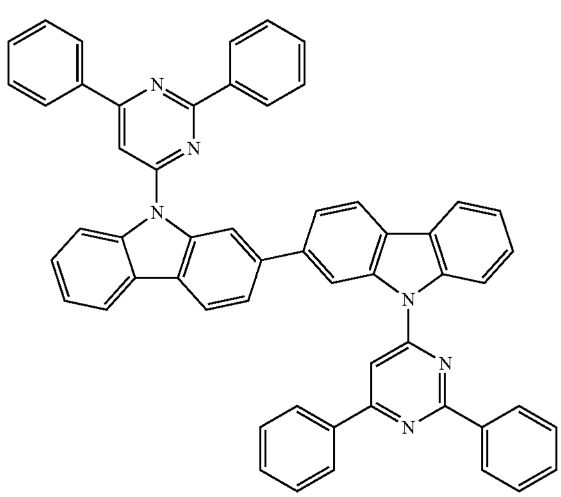
-continued
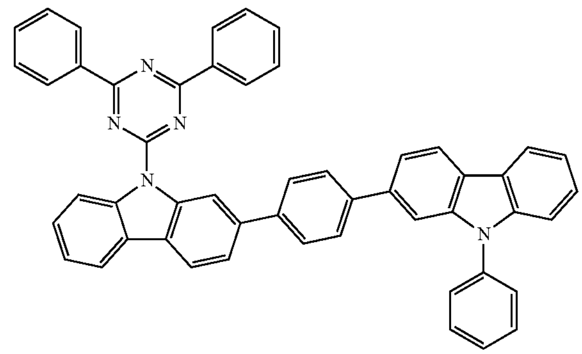
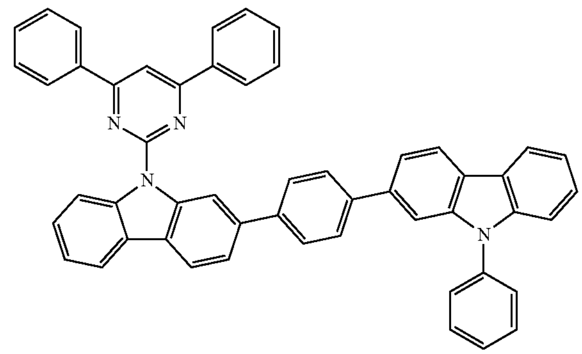
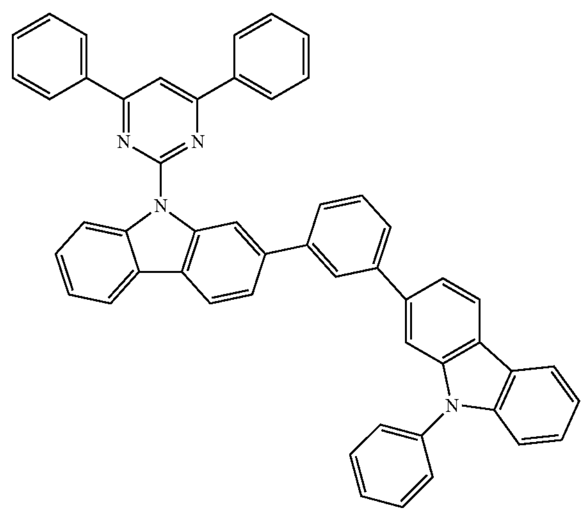
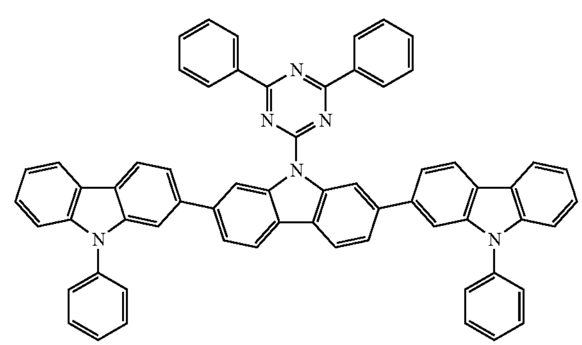

-continued
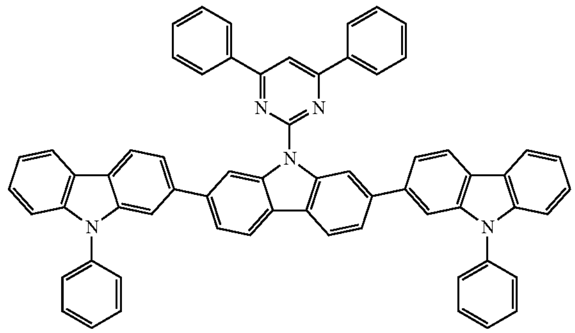
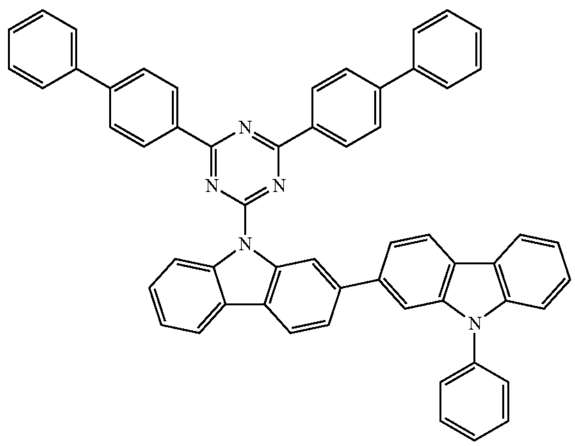
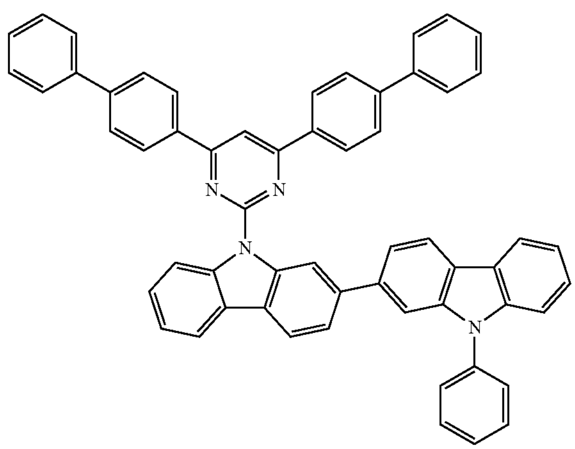
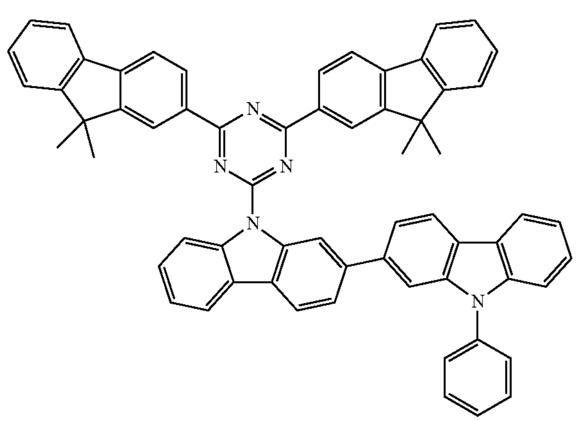
-continued
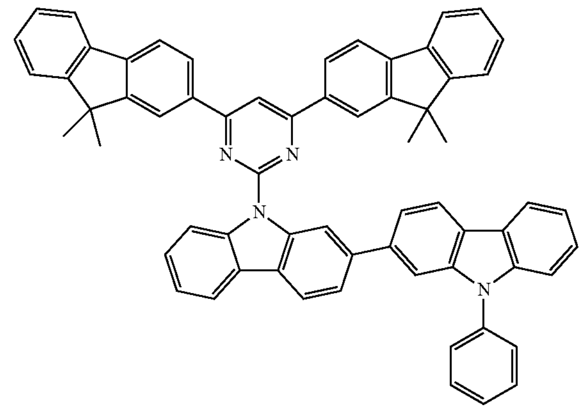
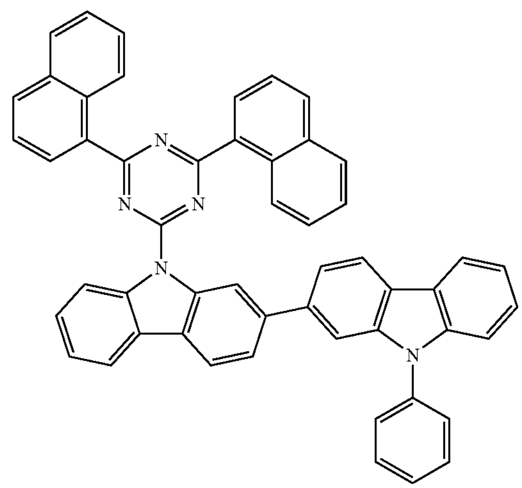
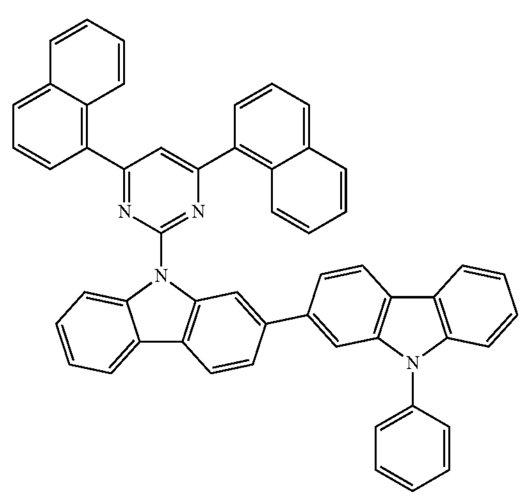

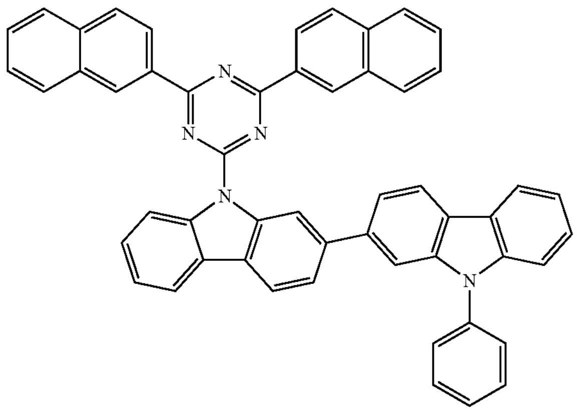
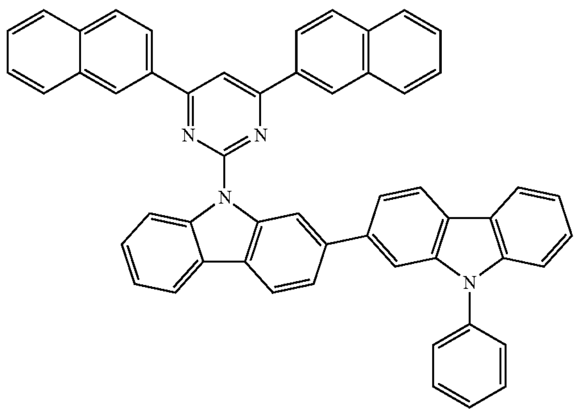
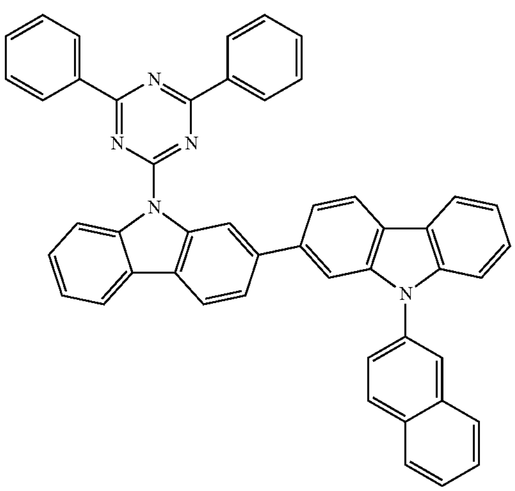
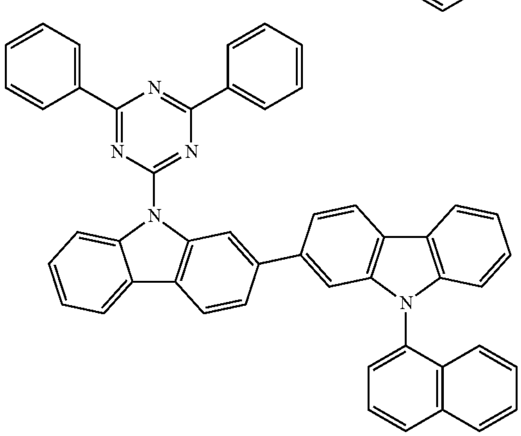
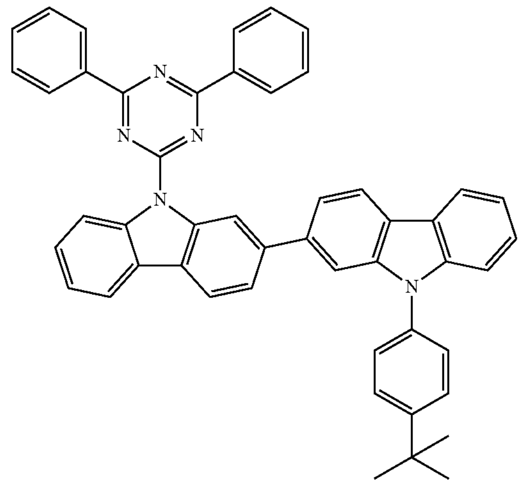
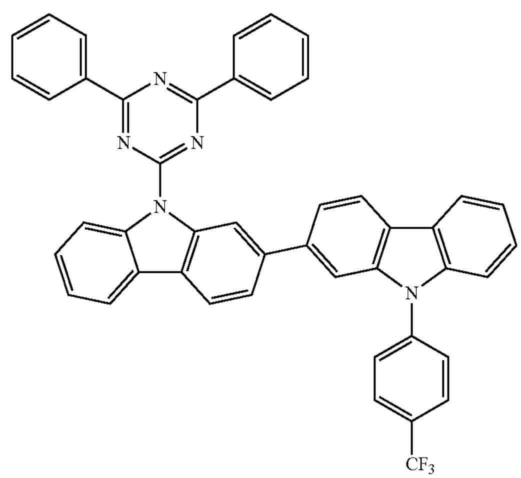
CF3
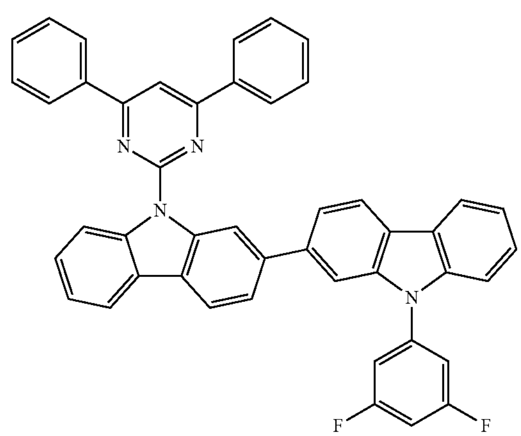
F
F -continued
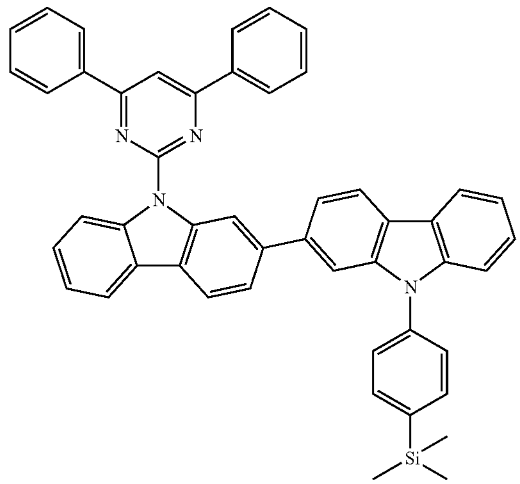
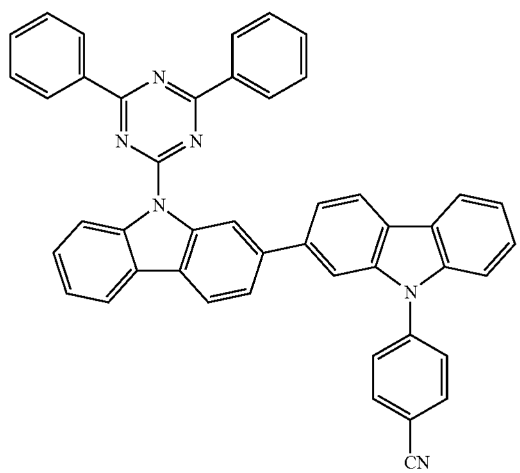
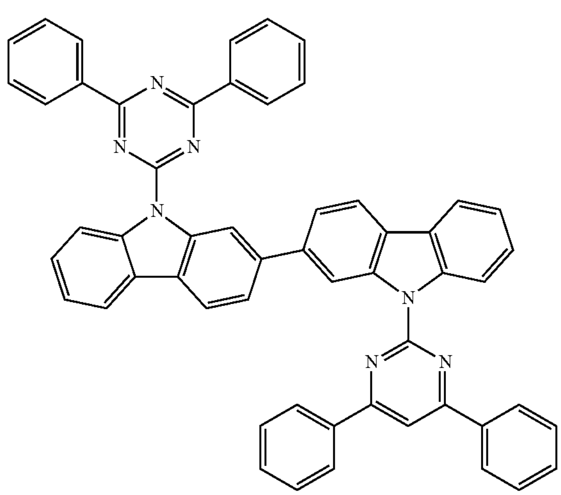
-continued
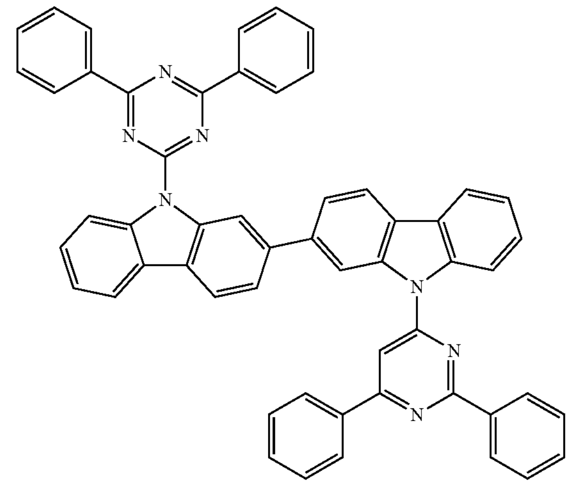
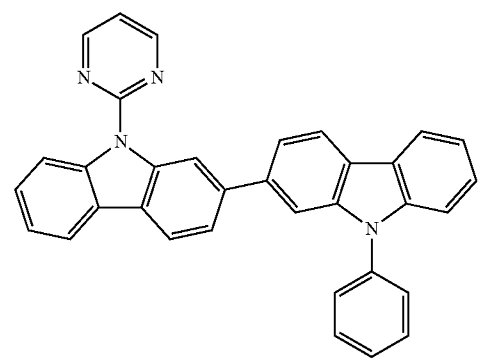
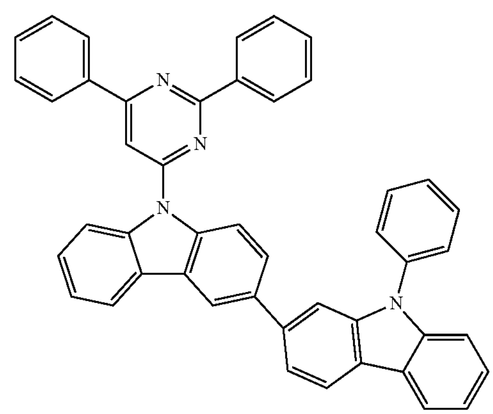
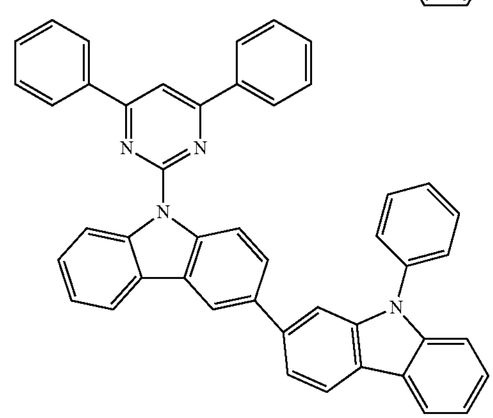

-continued
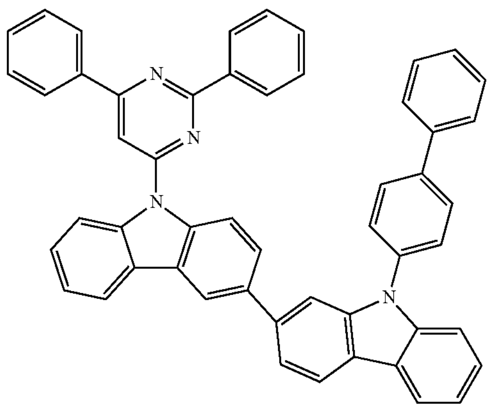
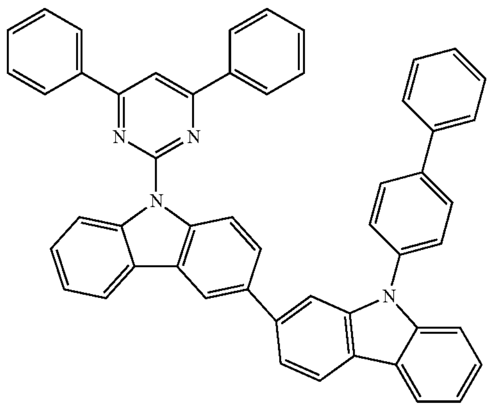
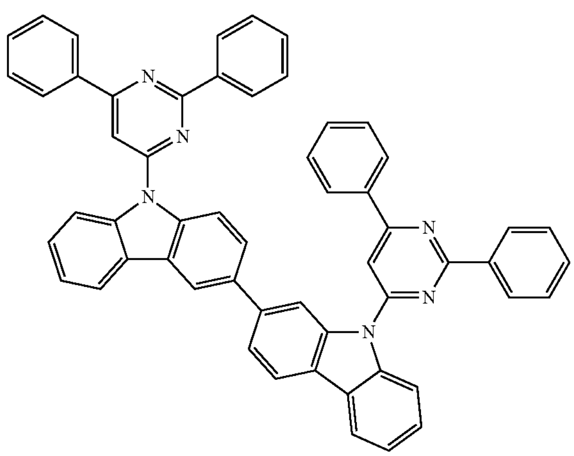
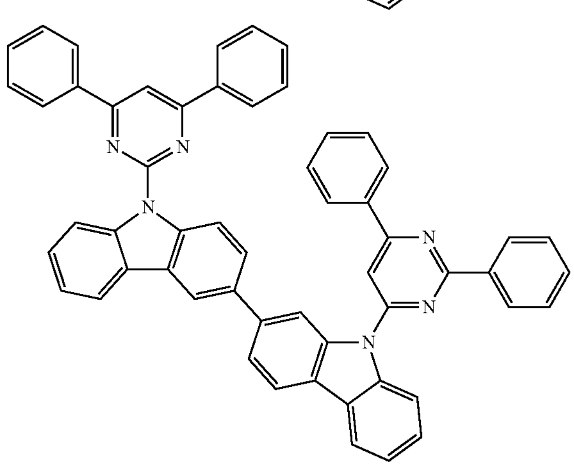
-continued
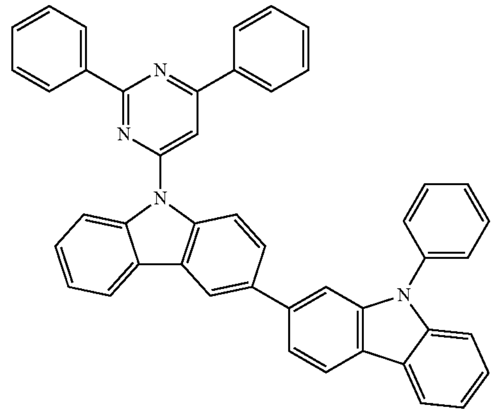
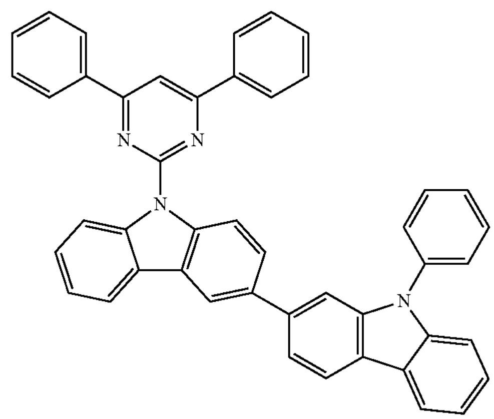
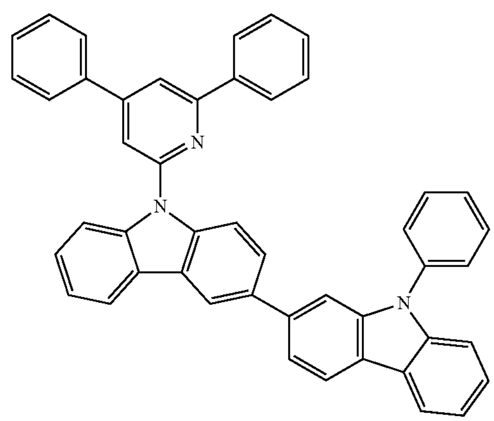
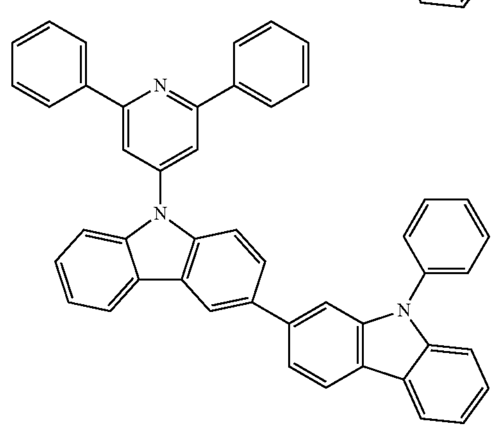

-continued
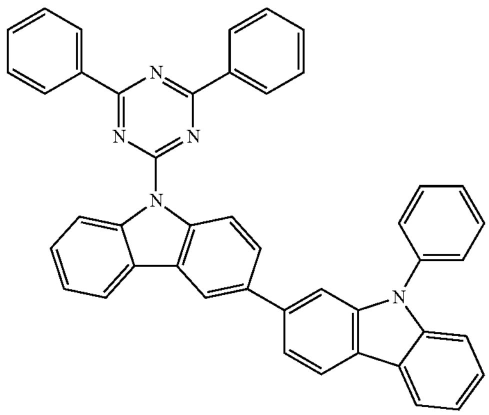
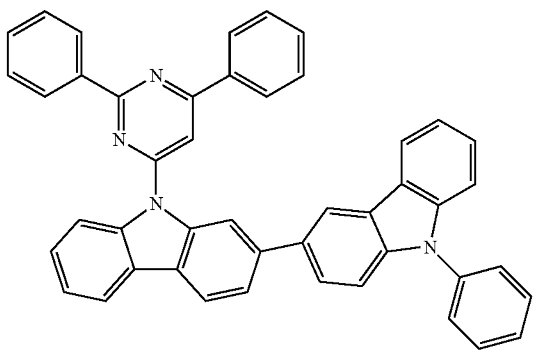
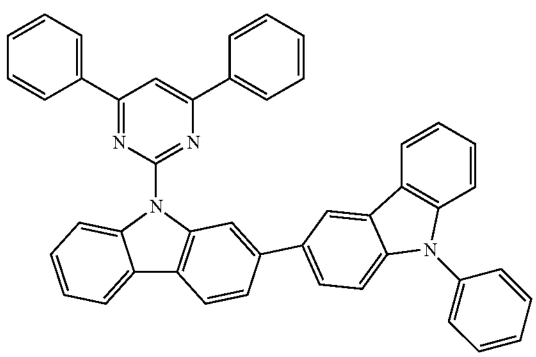
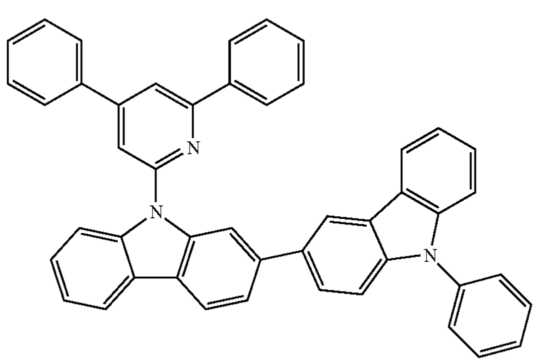
-continued
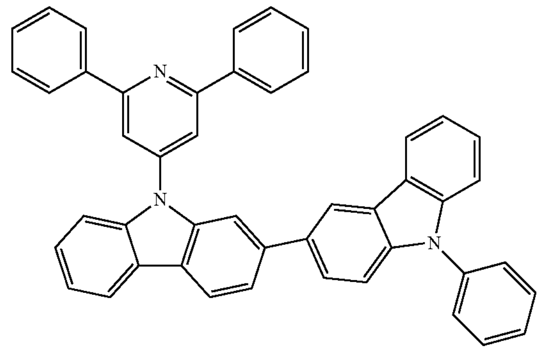
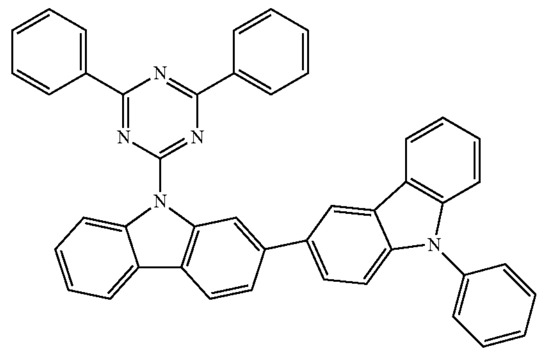
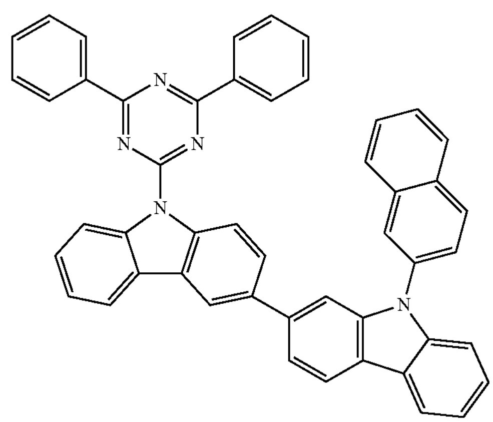
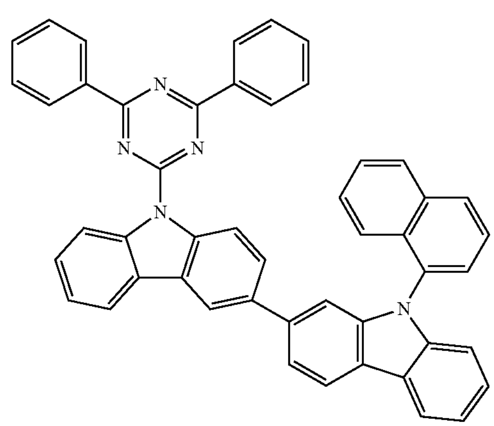

-continued
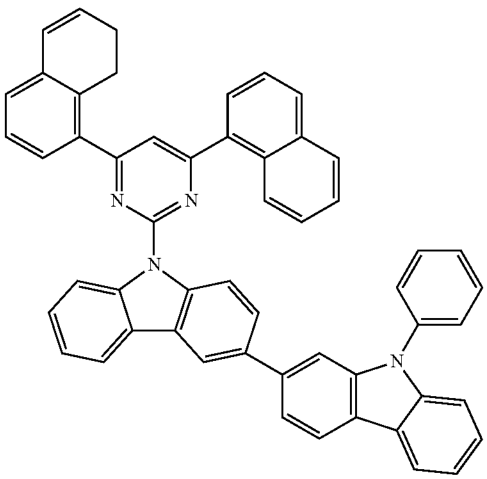
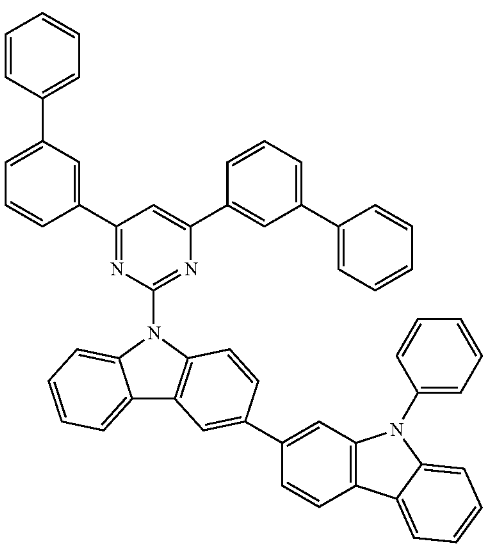
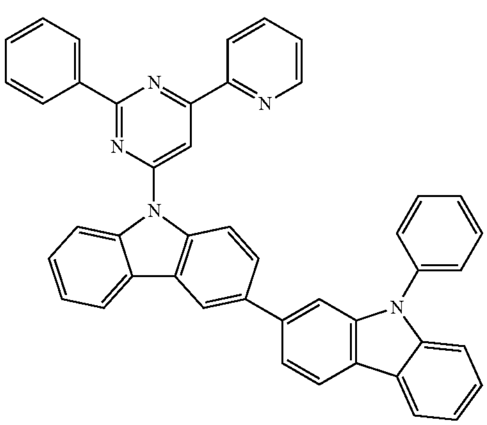
-continued
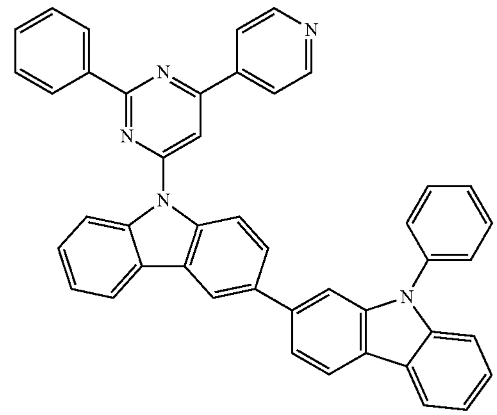
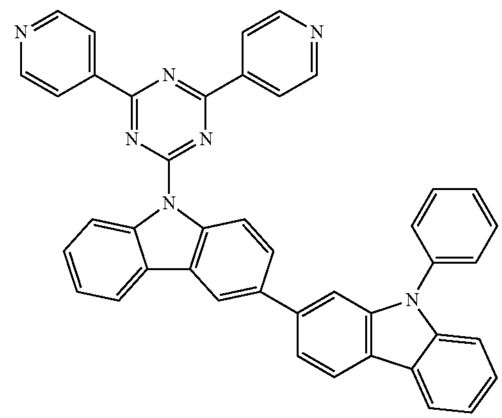
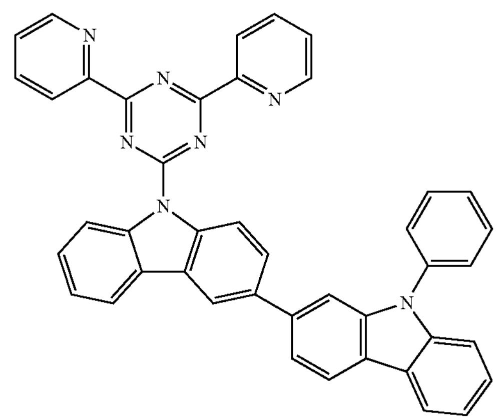
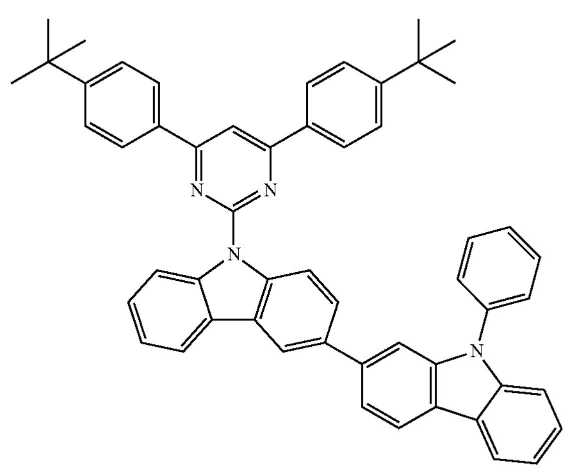

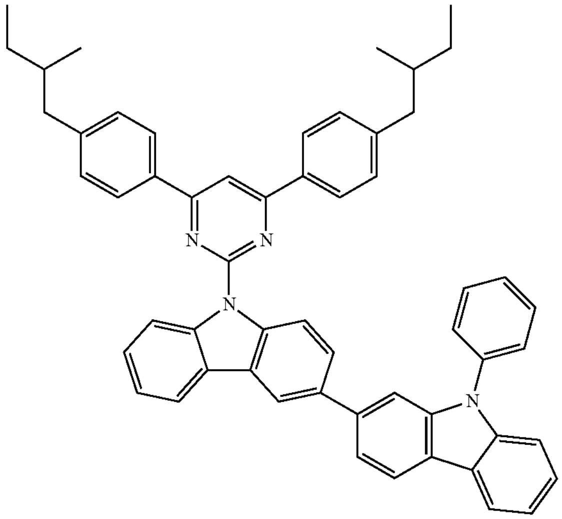
N
N
N
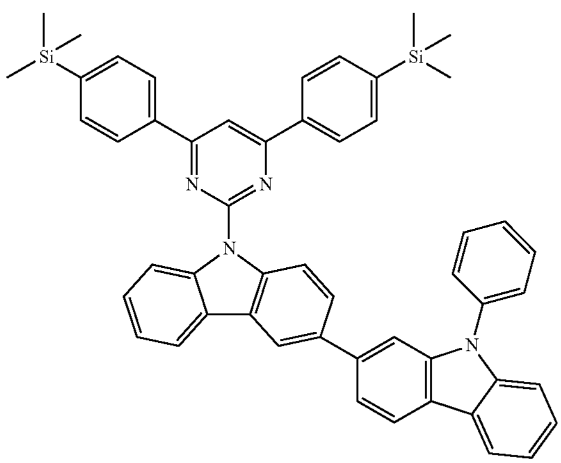
Si
Si
N
N
N
N
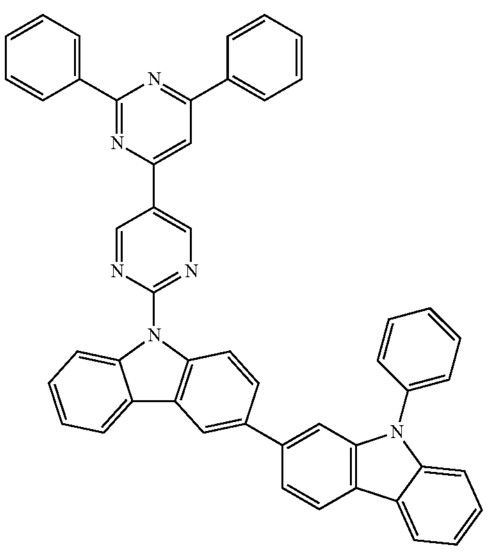
N
N
N
N
N
N
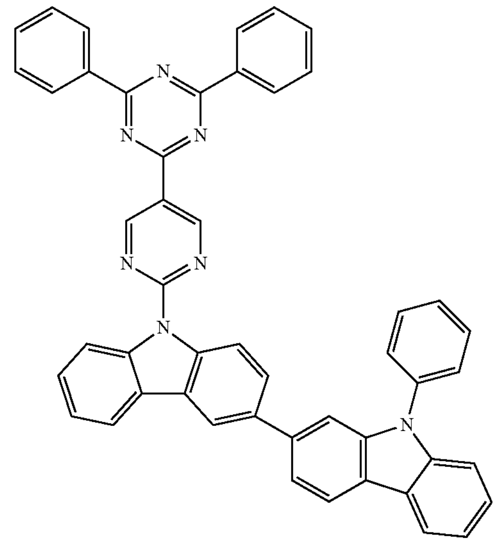
N
N
N
N
N
N
N
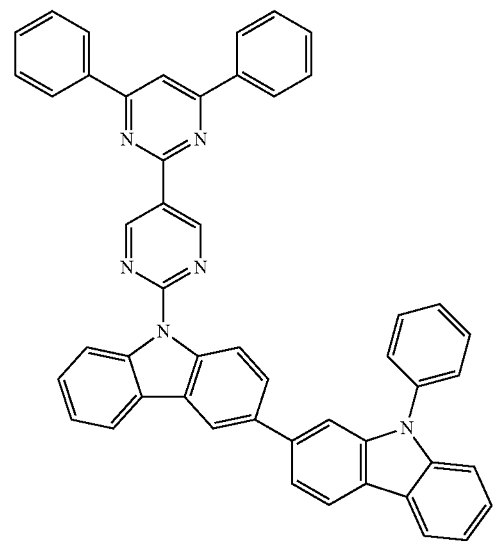
N
N
N
N
N
N
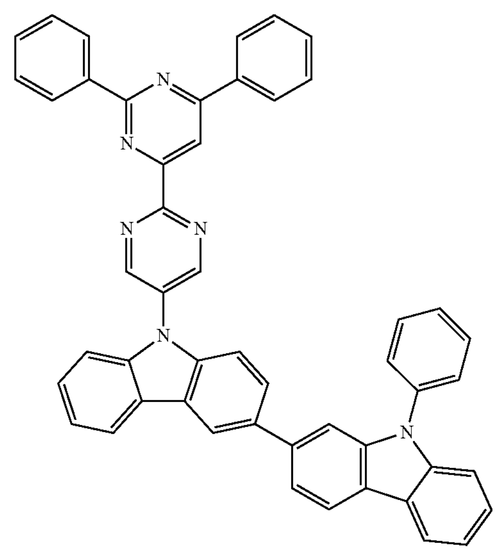
N
N
N
N
N
N

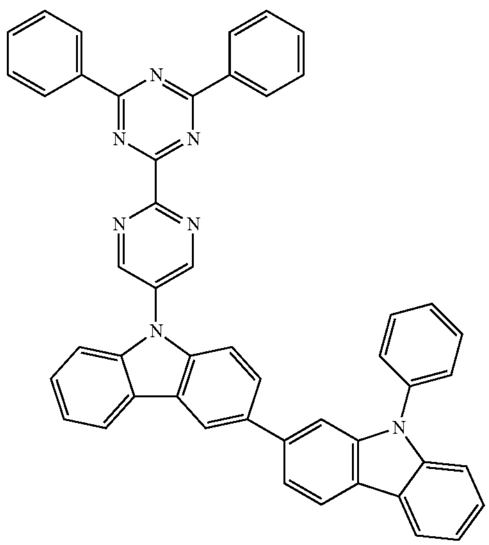
N
N
N
N
N
N
N
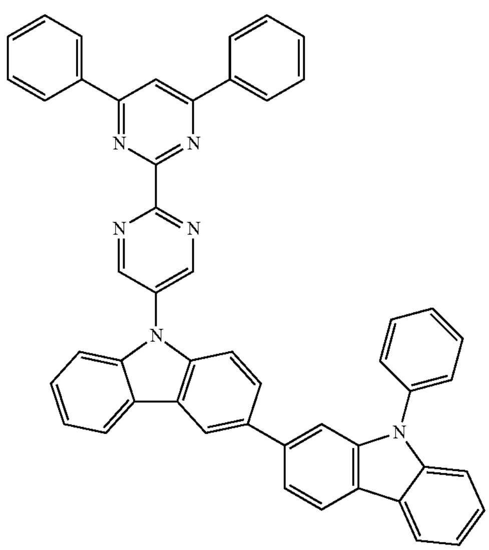
N
N
N
N
N
N
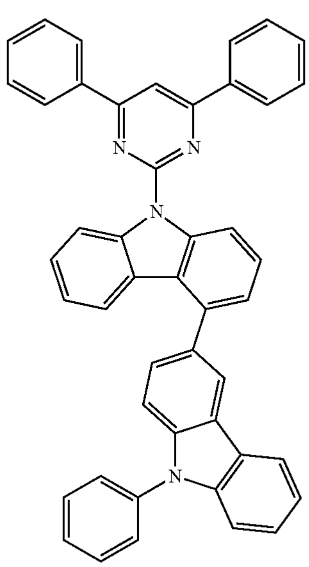
N
N
N
N
N
N
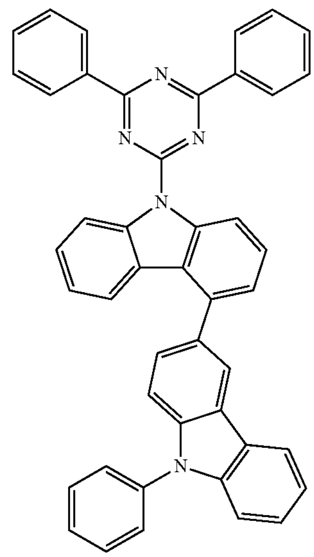
N
N
N
N
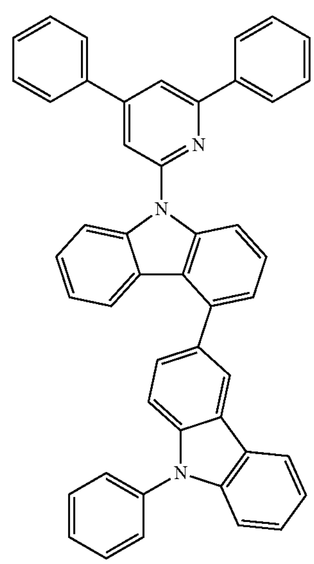
N
N
N
N
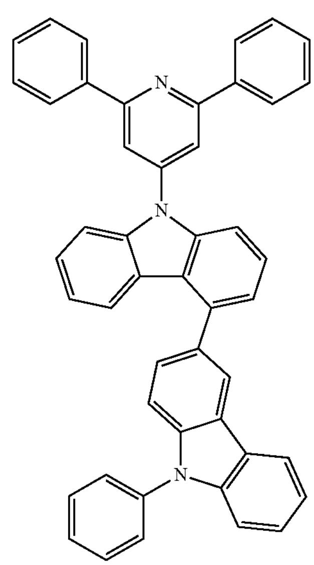
N
N
N

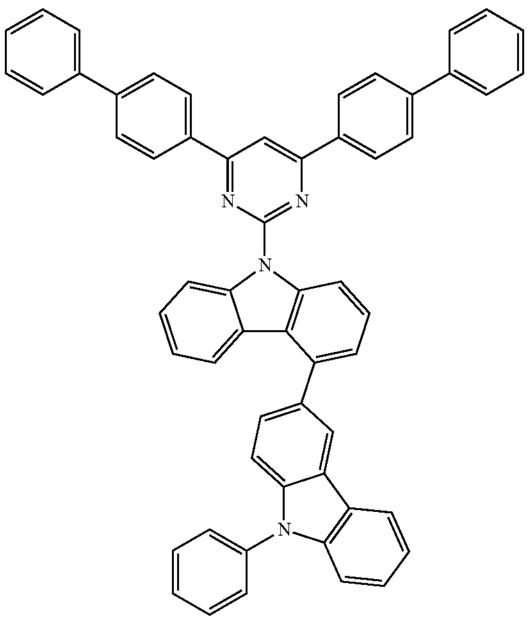
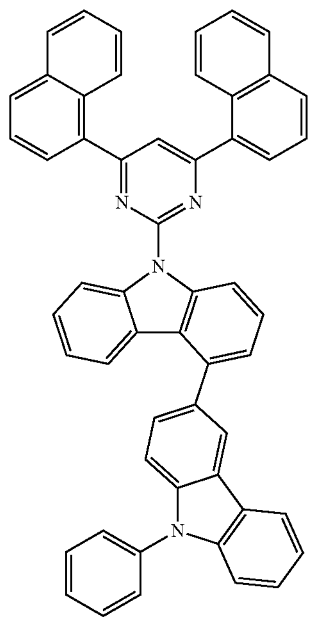
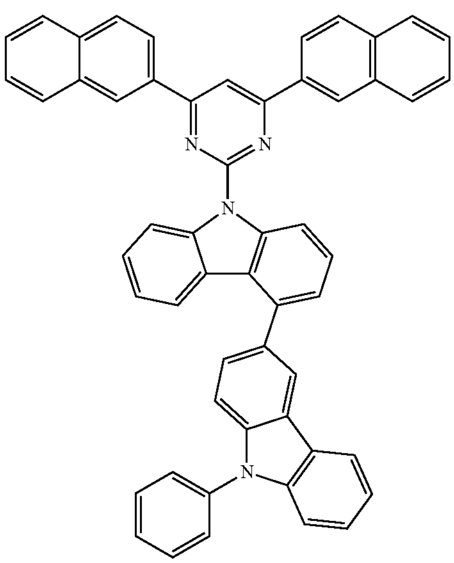
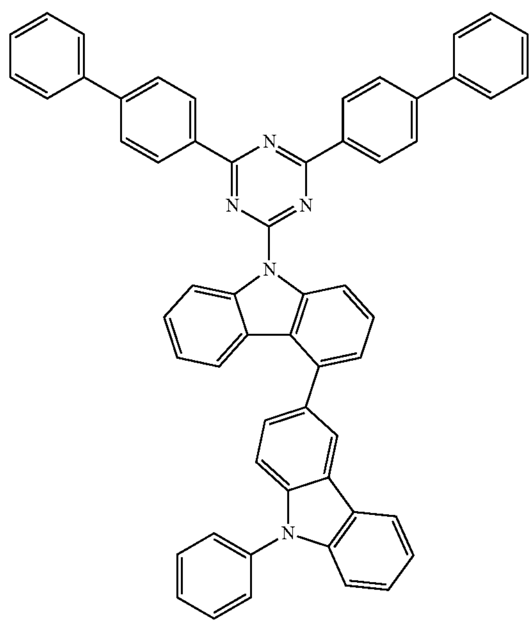

-continued
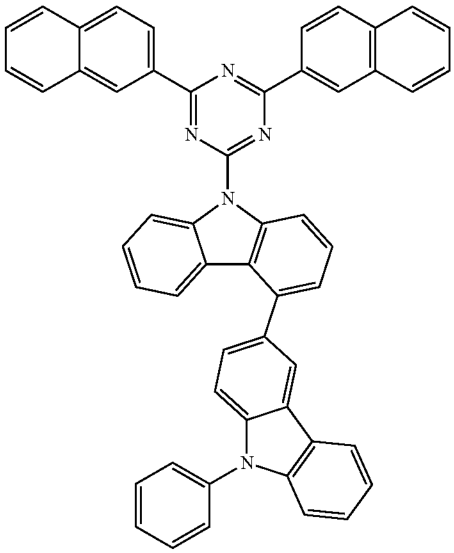
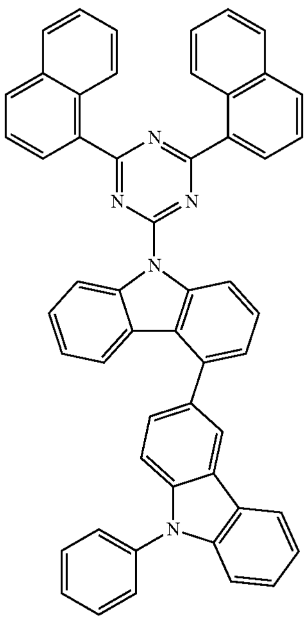
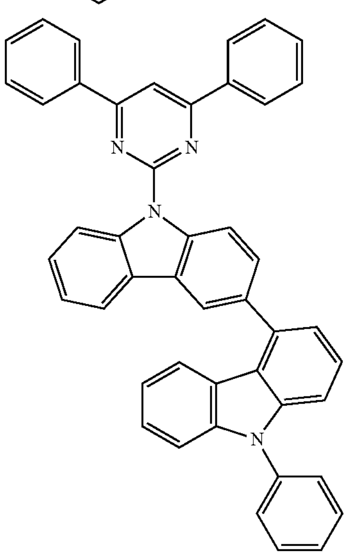
-continued
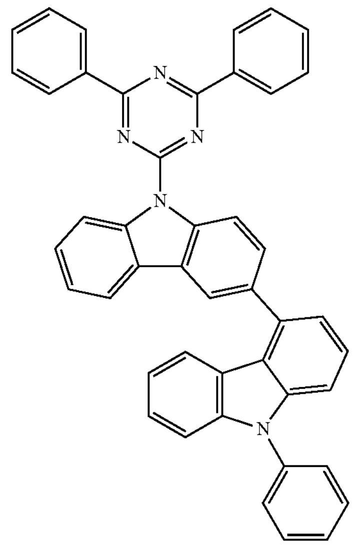
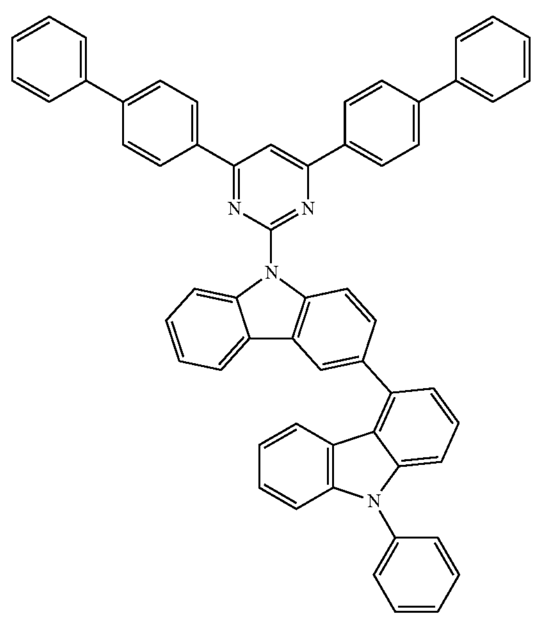

-continued
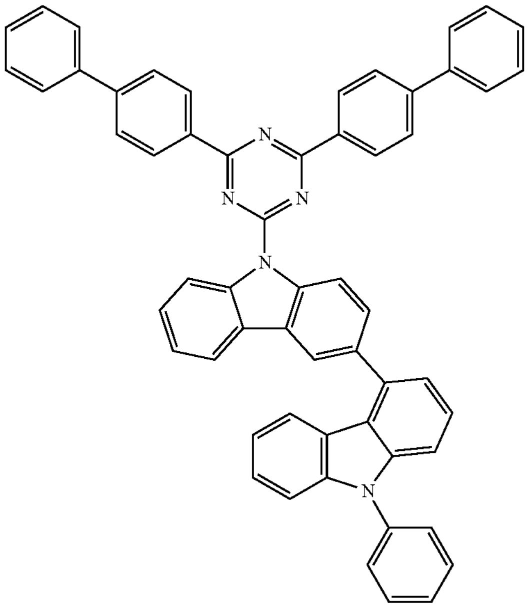
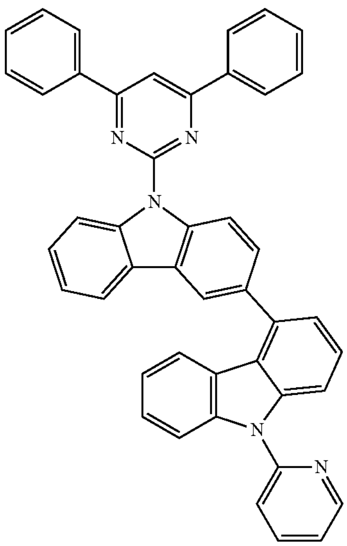
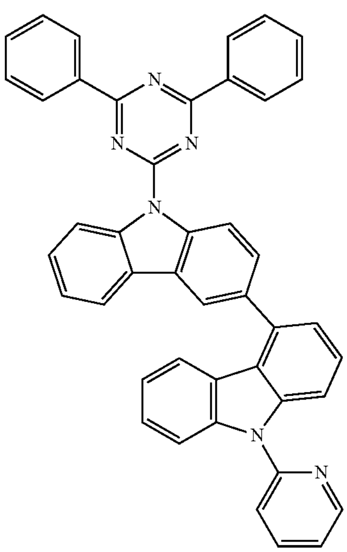
-continued
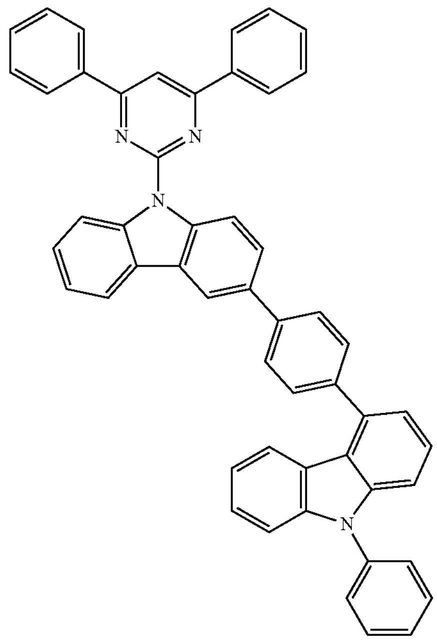
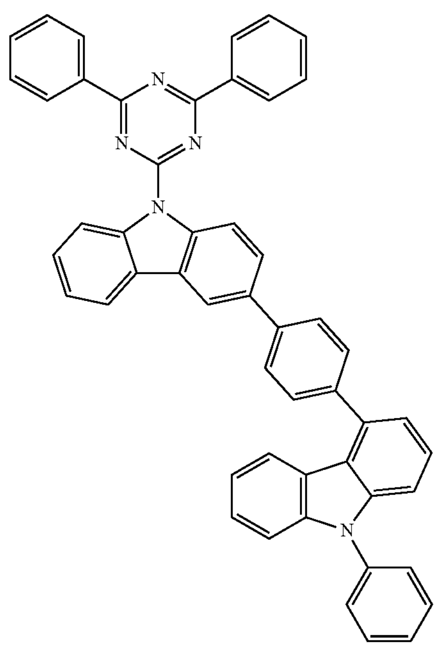

-continued
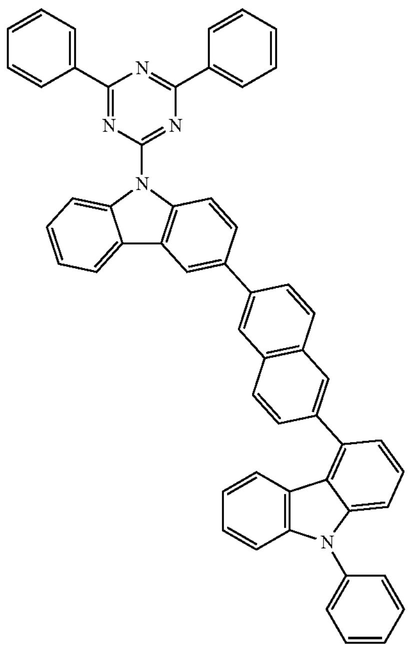
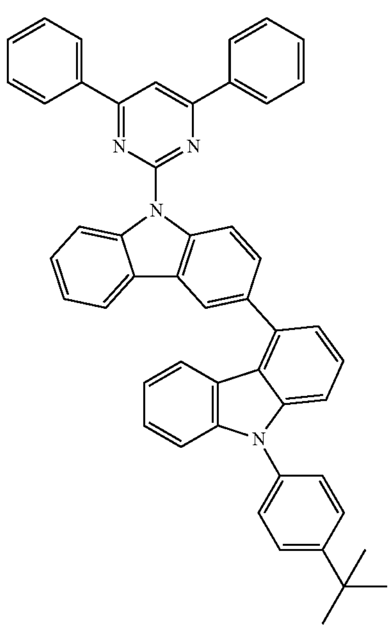
-continued
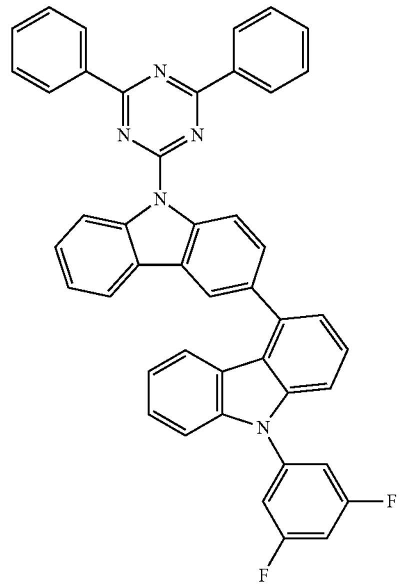
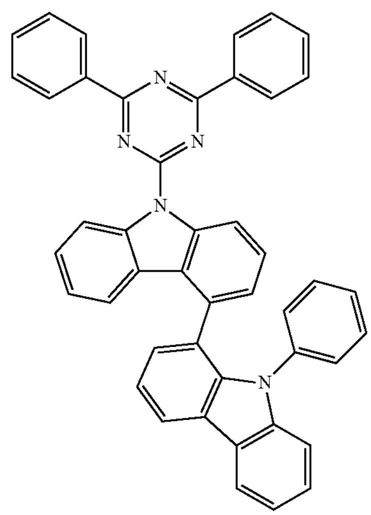
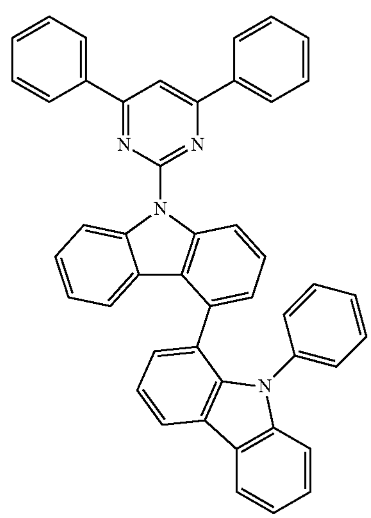

-continued
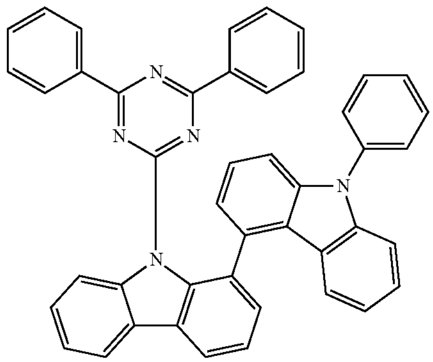
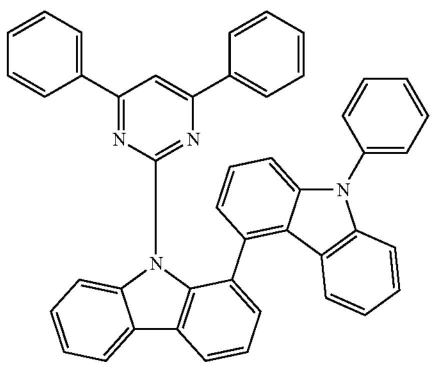
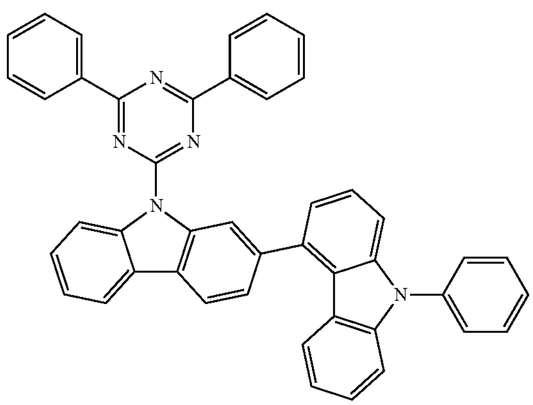
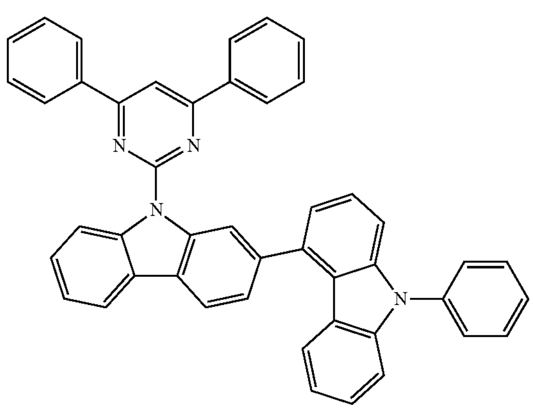
-continued
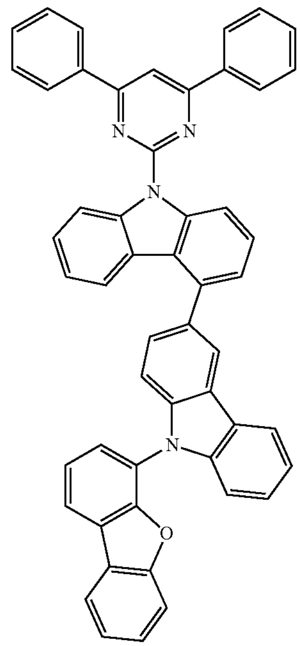
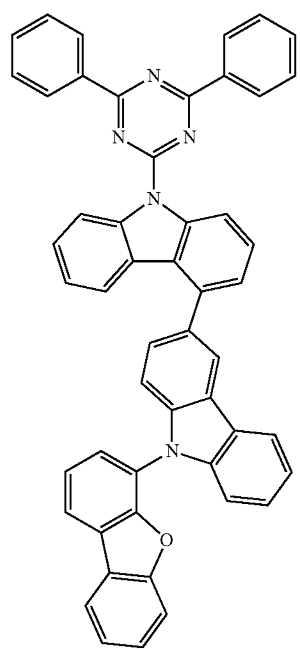

-continued
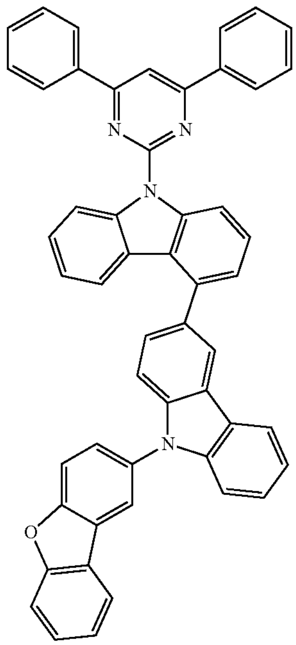
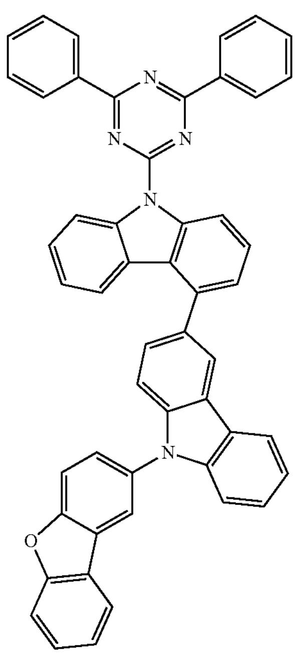
-continued
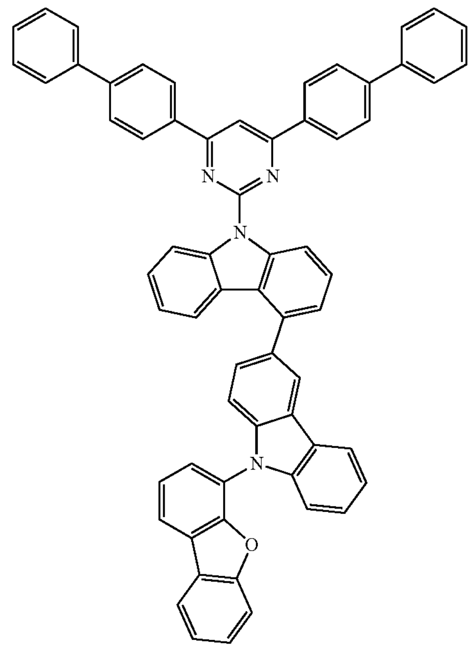
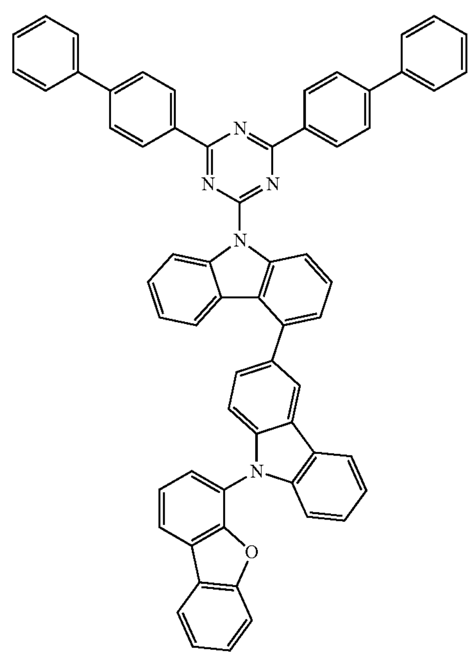

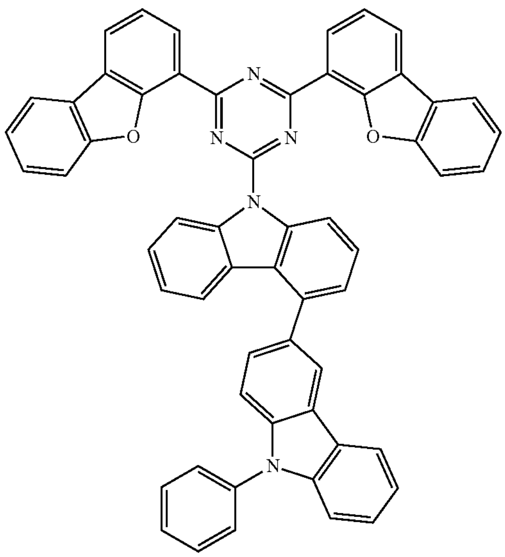
N
N
N
O
O
N
N
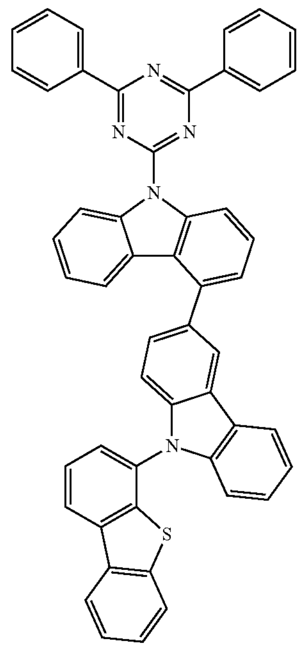
N
N
N
N
N
S
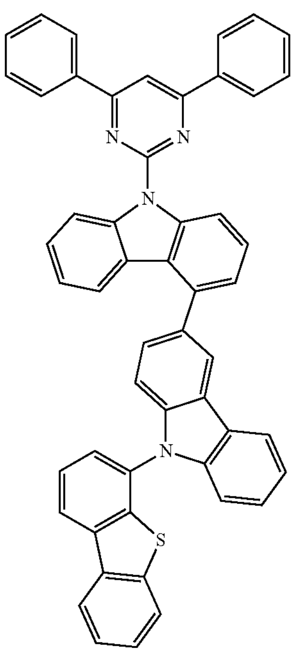
N
N
N
N
S
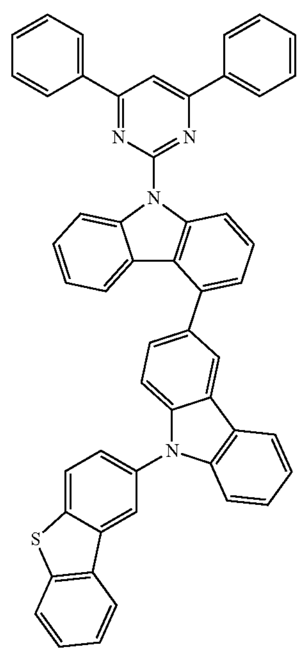
N
N
N
N
S -continued
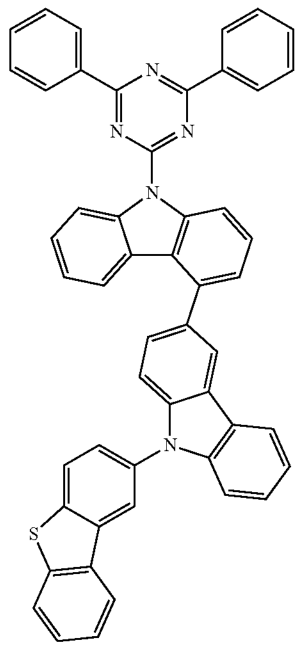
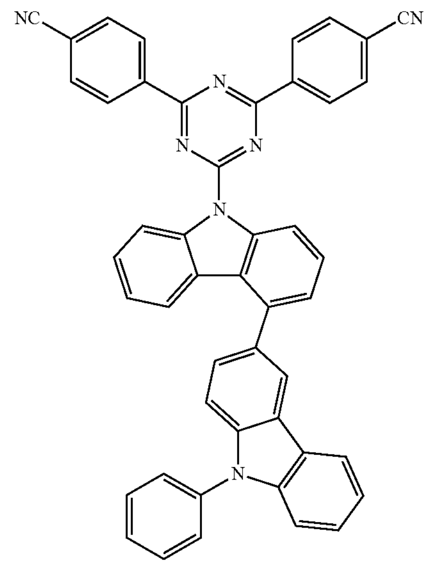
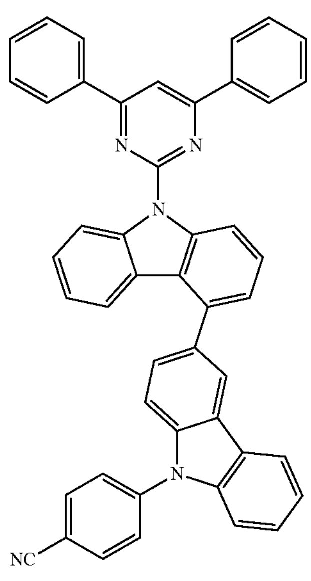
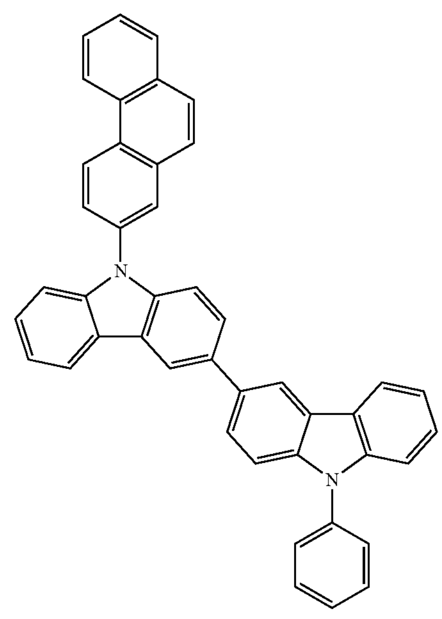

-continued
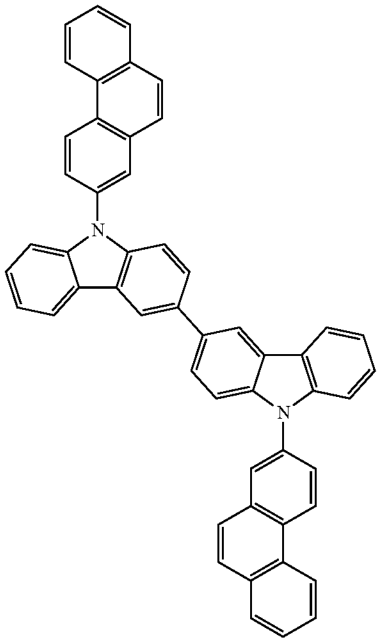
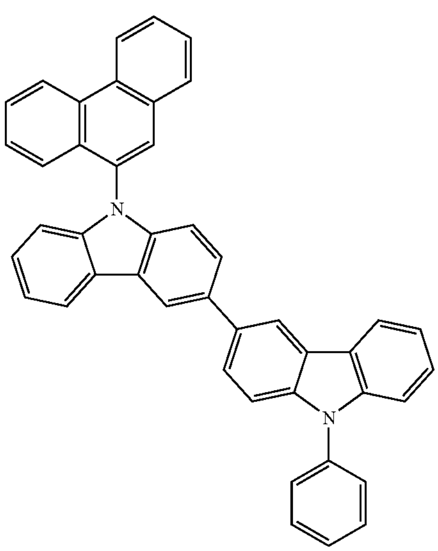
-continued
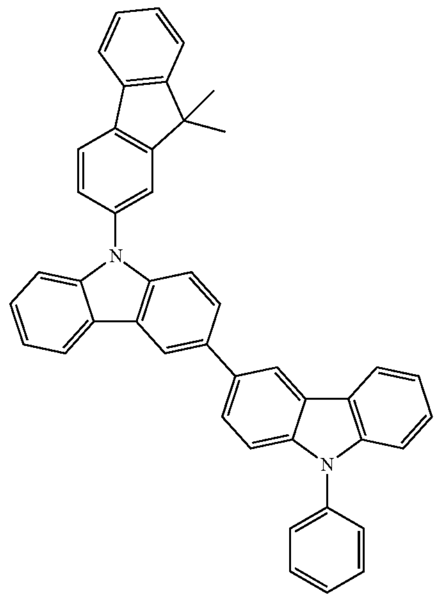
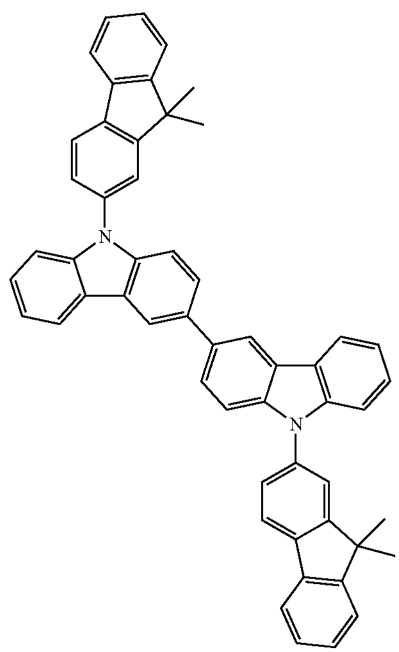

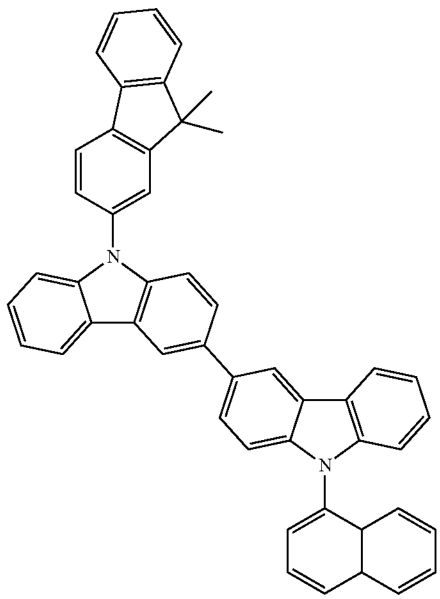
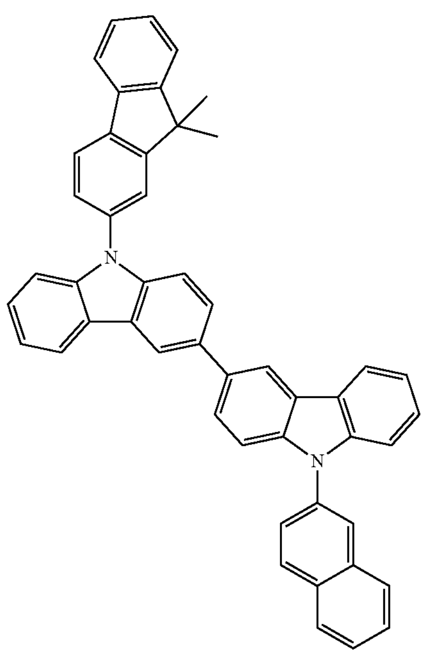
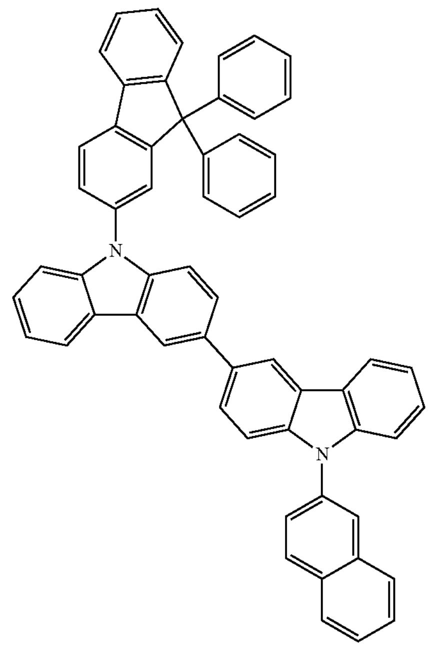
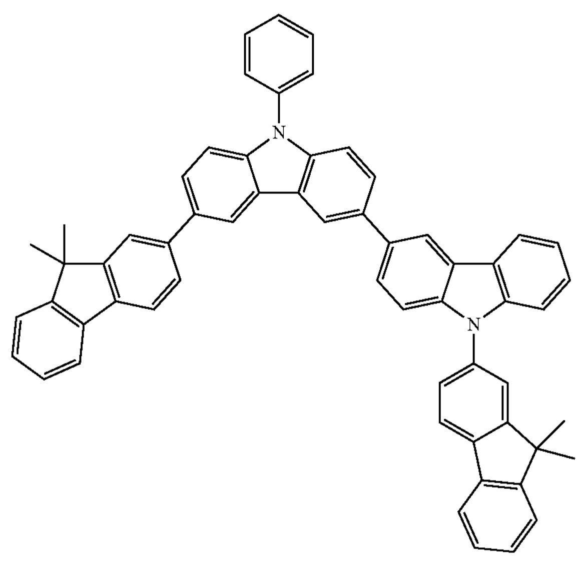

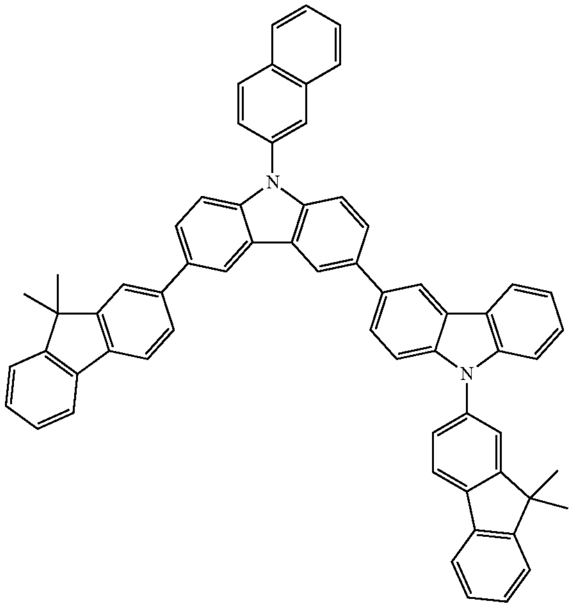
N
N
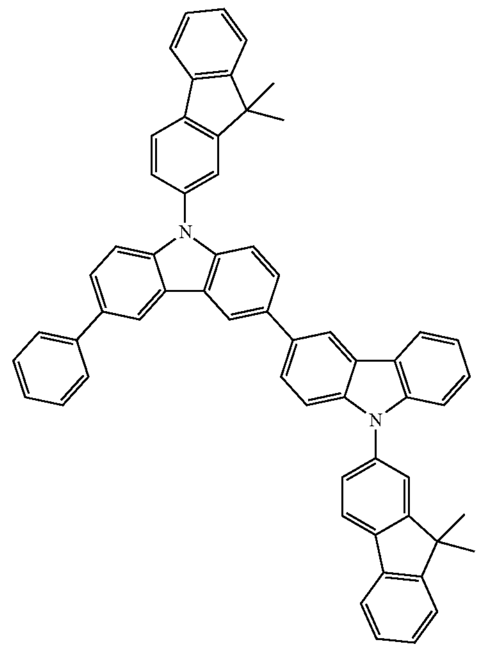
N
N
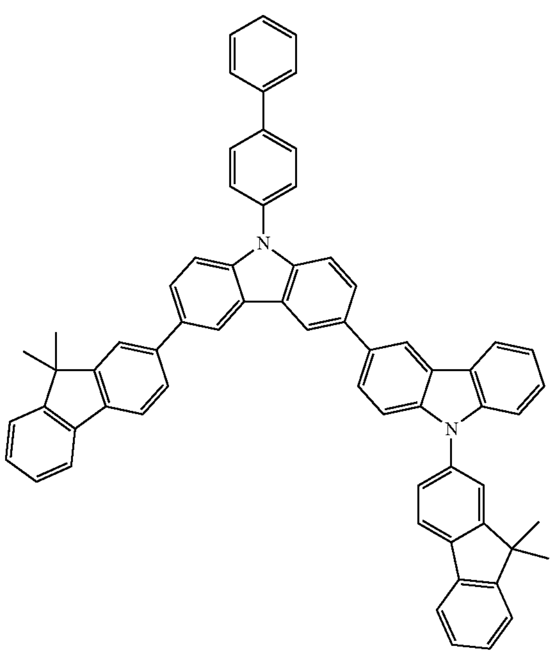
N
N
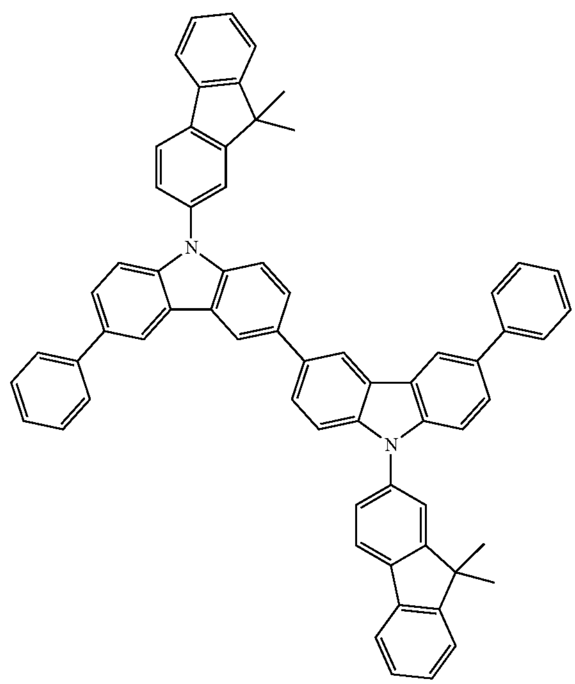
N
N

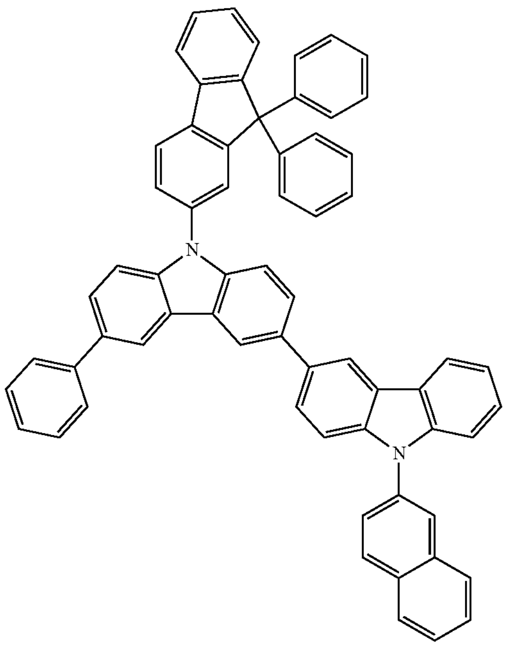
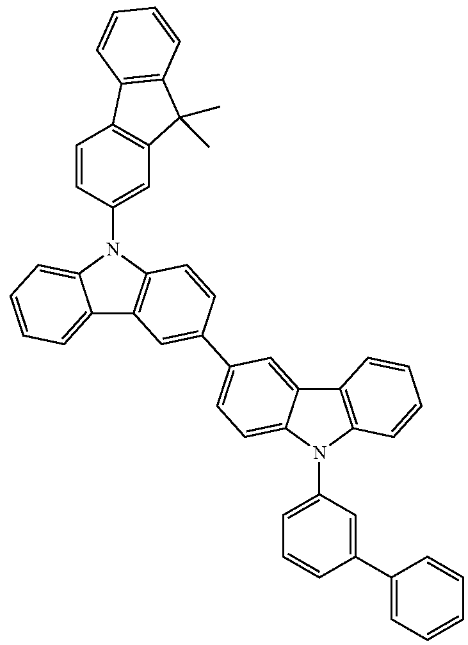
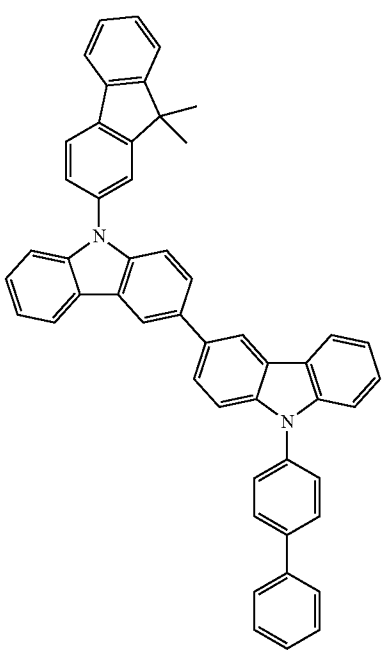
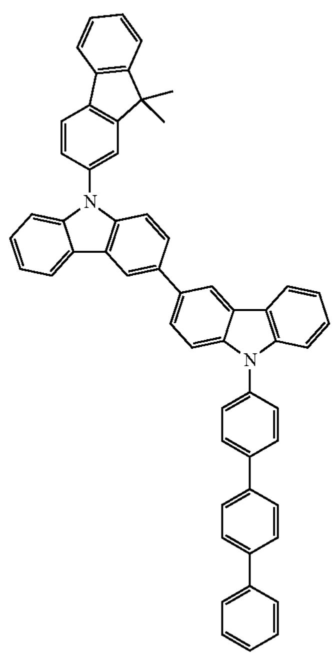

-continued
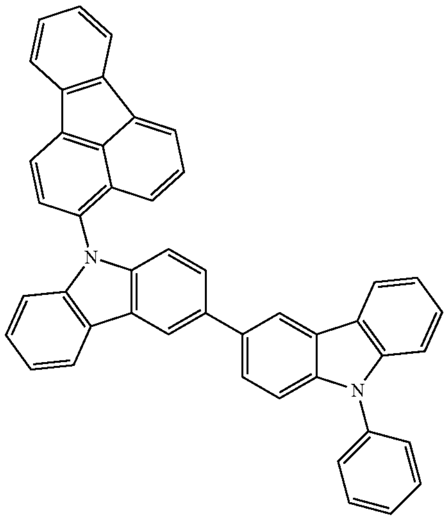
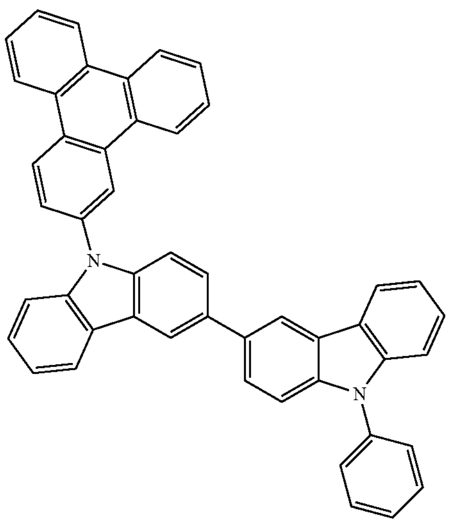
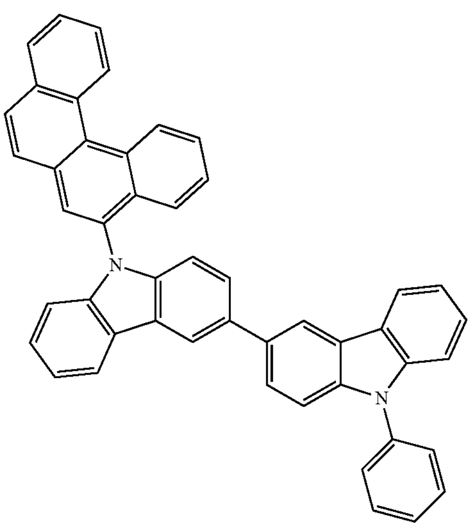
-continued
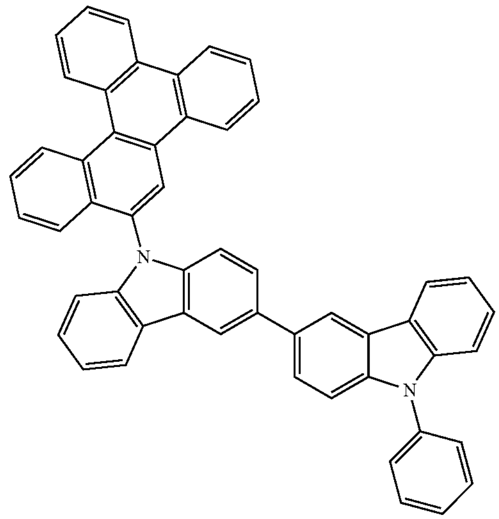
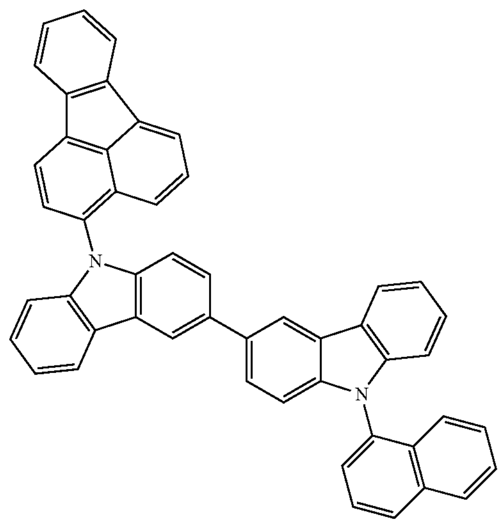
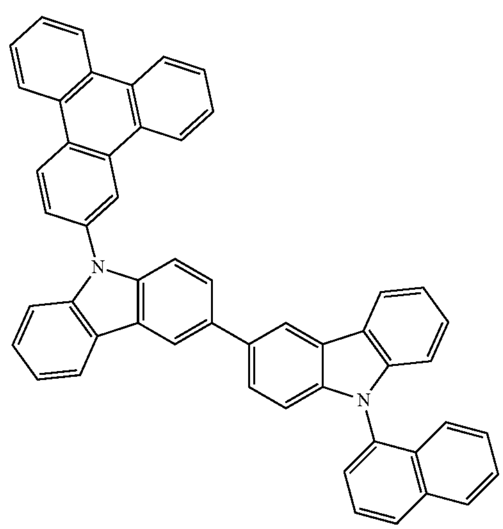

-continued
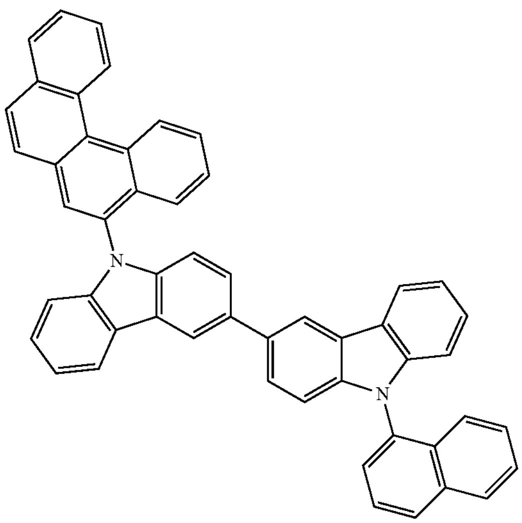
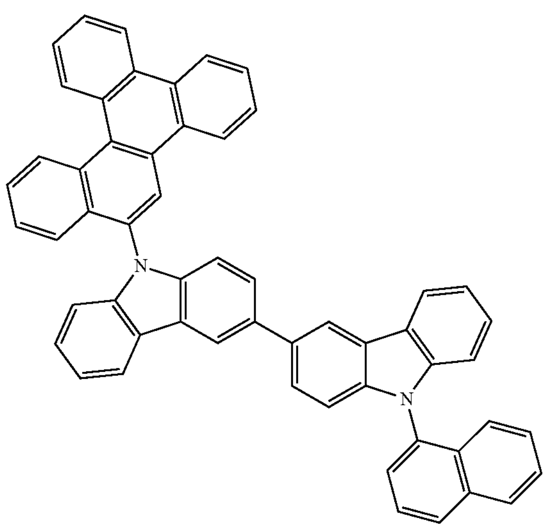
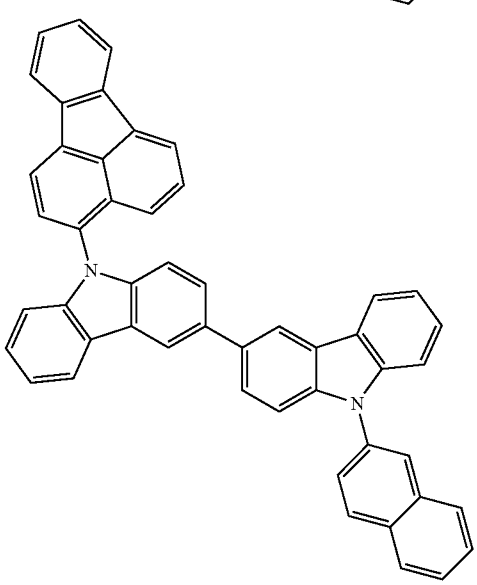
-continued
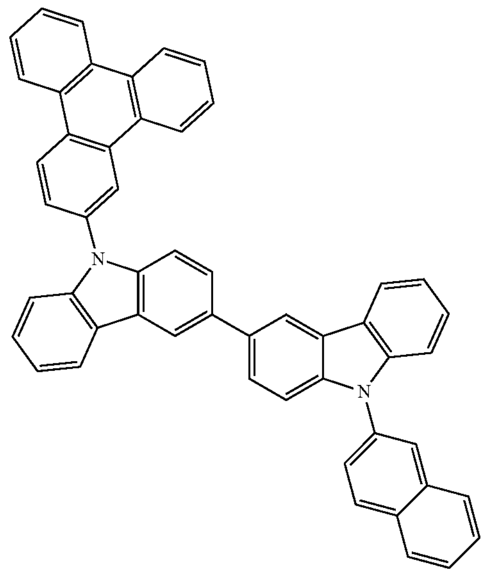
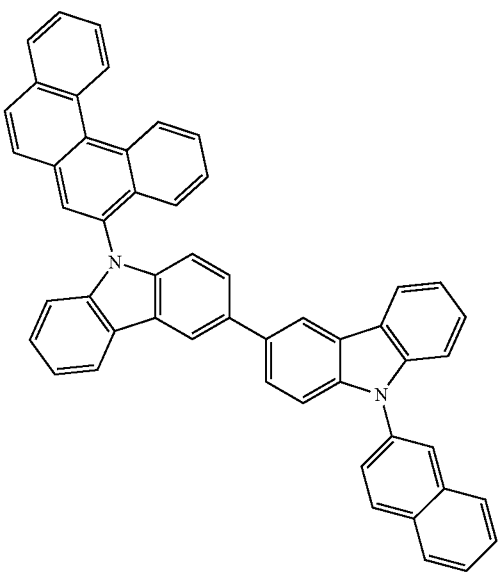
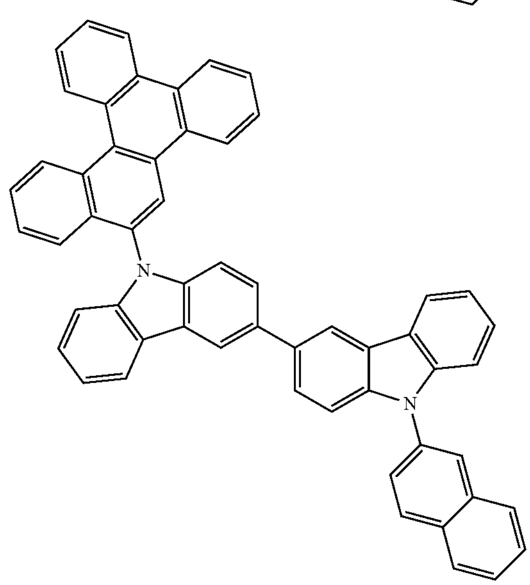

-continued
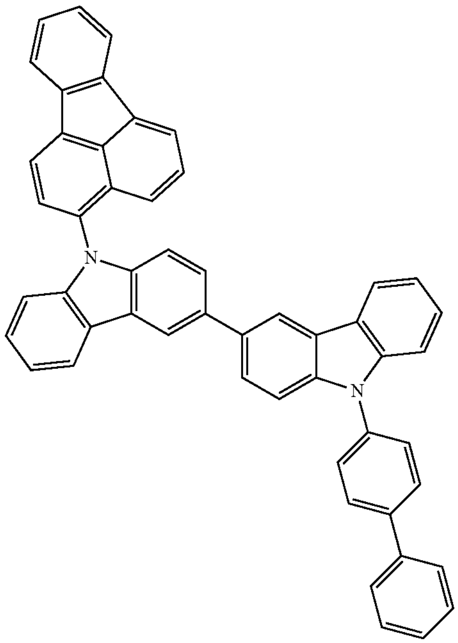
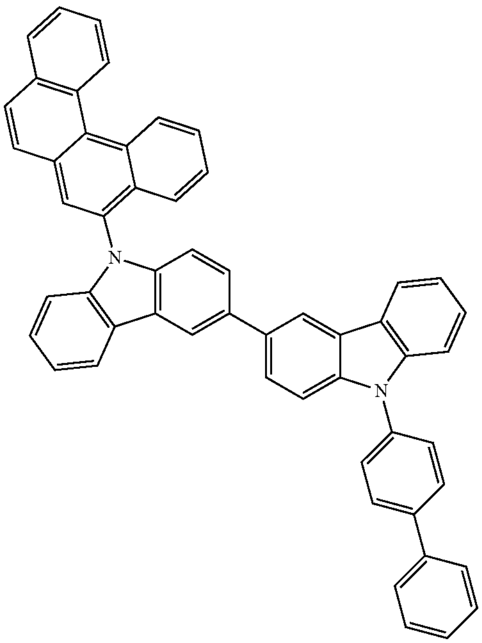
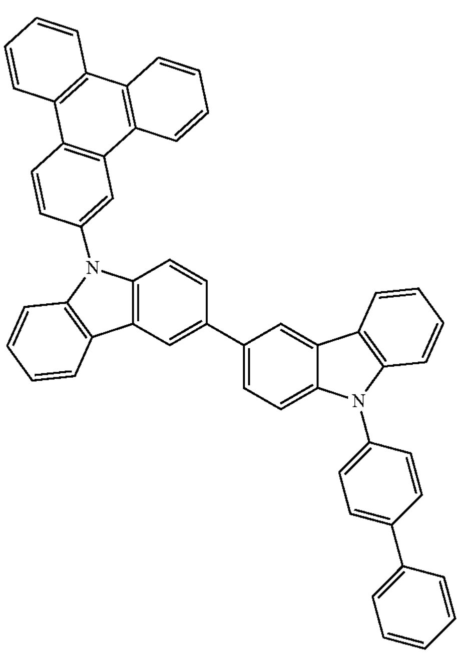
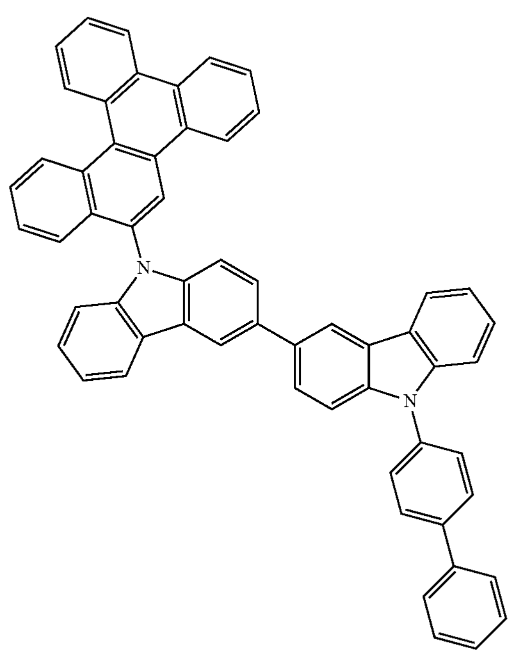

-continued
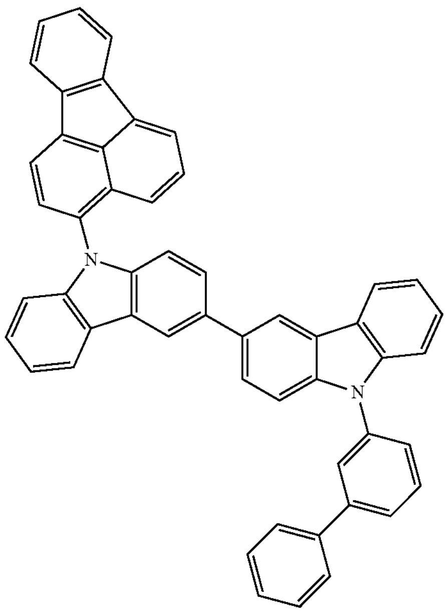
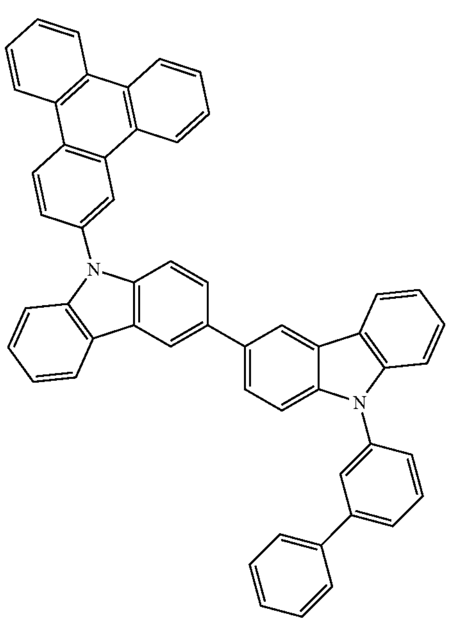
-continued
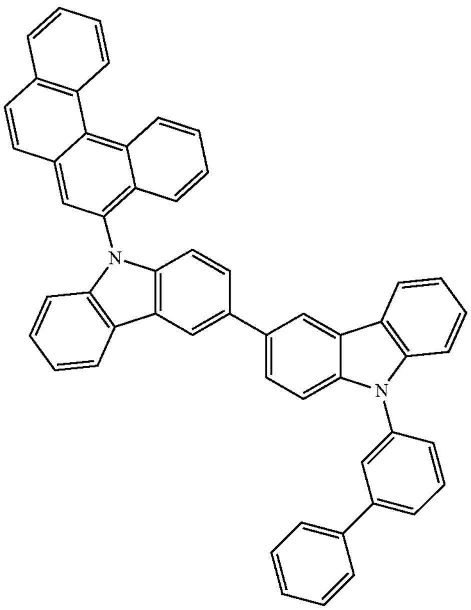
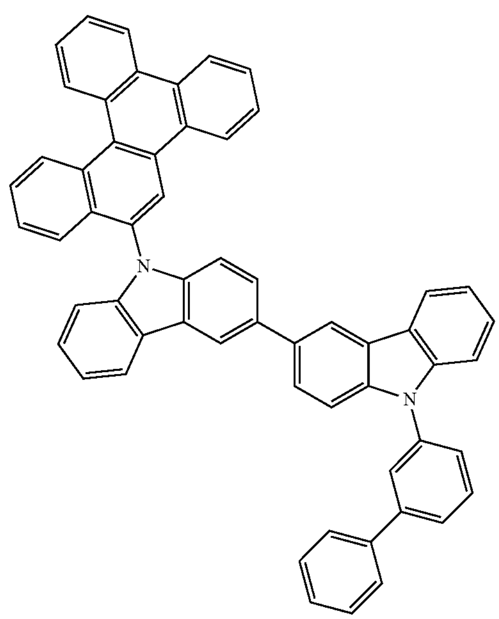

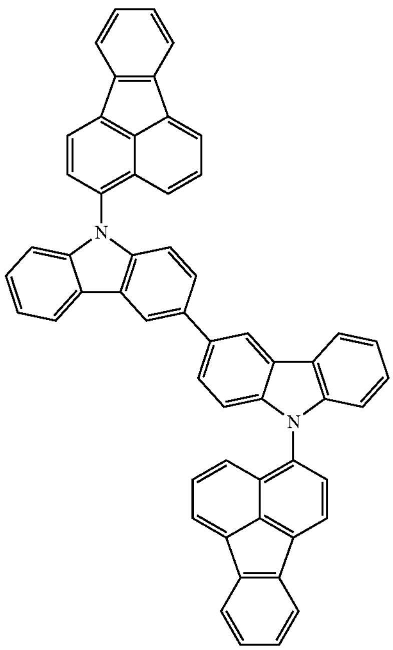
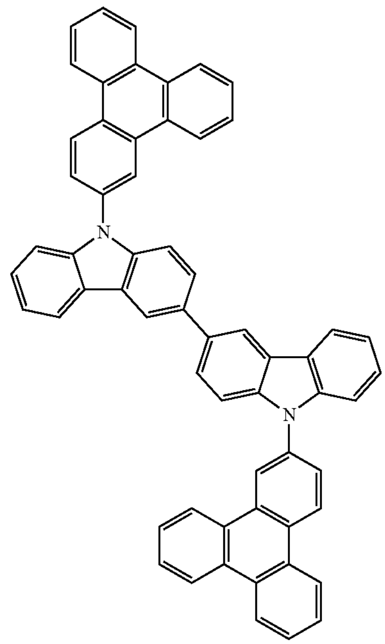
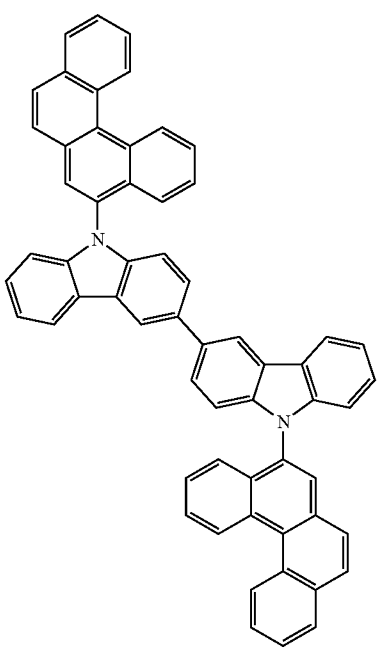 [SMILES: c1ccc2c(c1)ccc1cc(-n3c4ccccc4c4cc(-c5ccc6c(c5)c5ccccc5n6-c5cc6ccc7ccccc7c6c6ccccc56)ccc43)c3ccccc3c12]
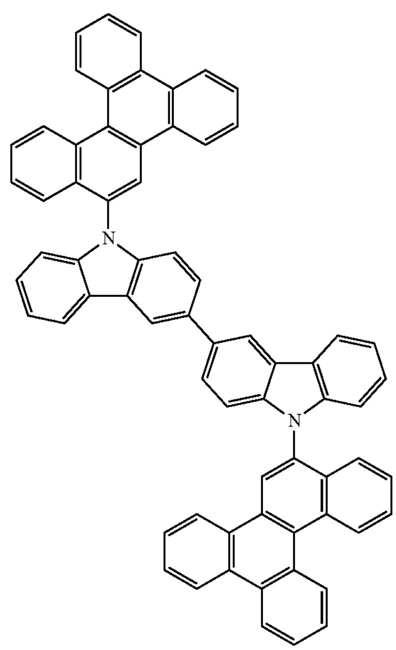

-continued
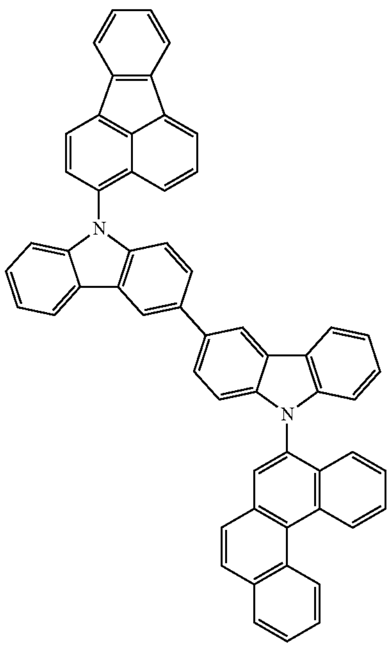
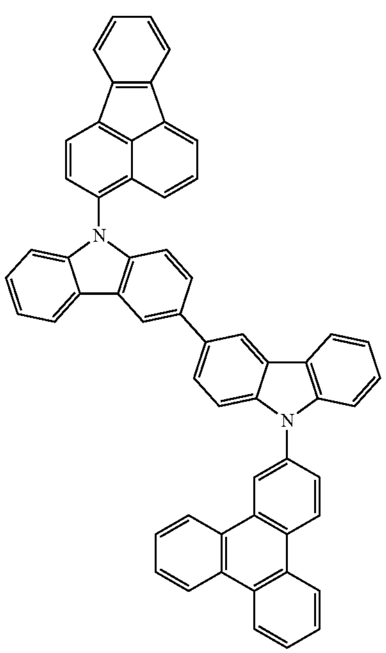
-continued
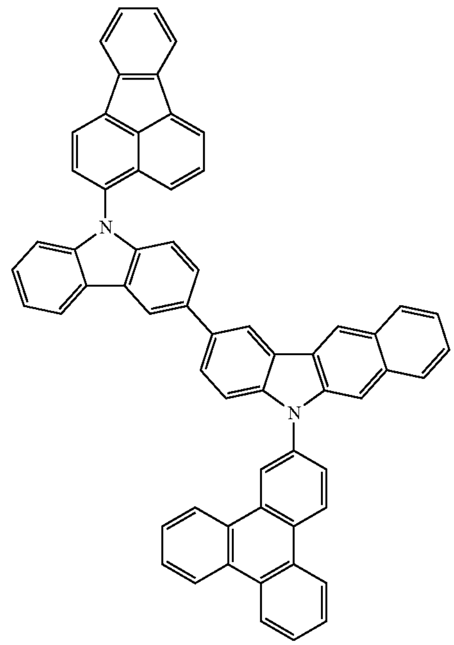
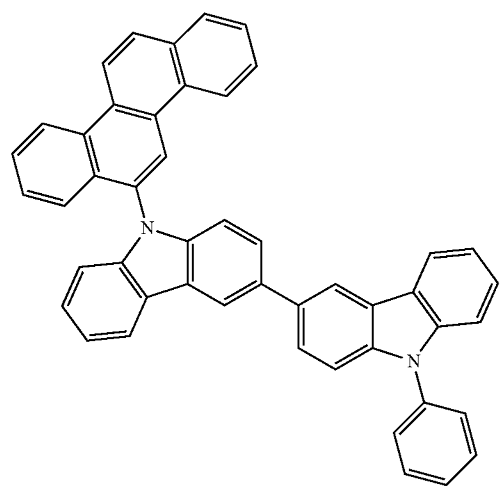
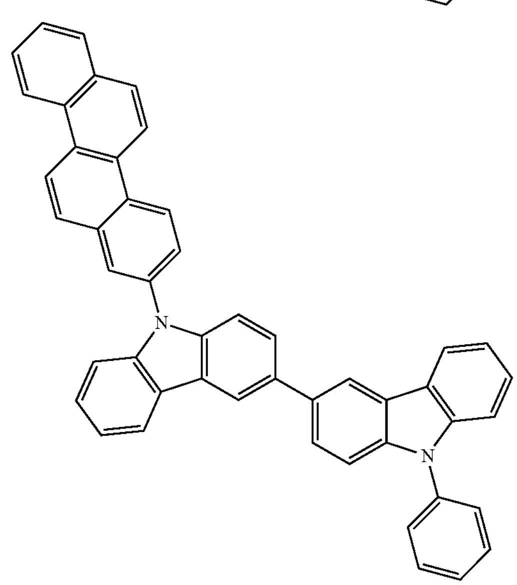

-continued
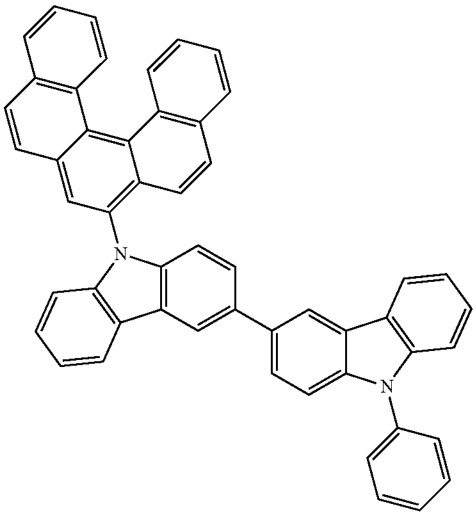
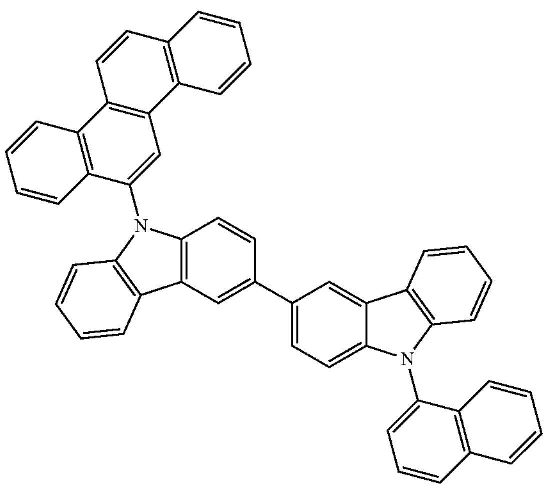
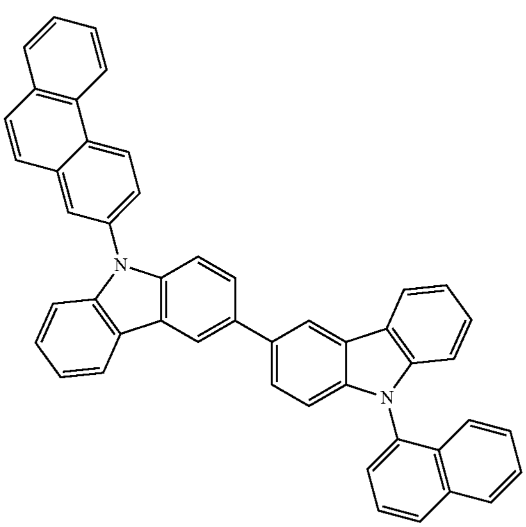
-continued
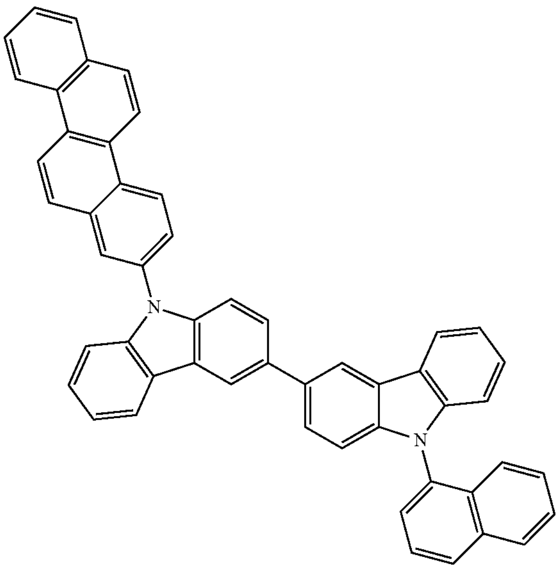
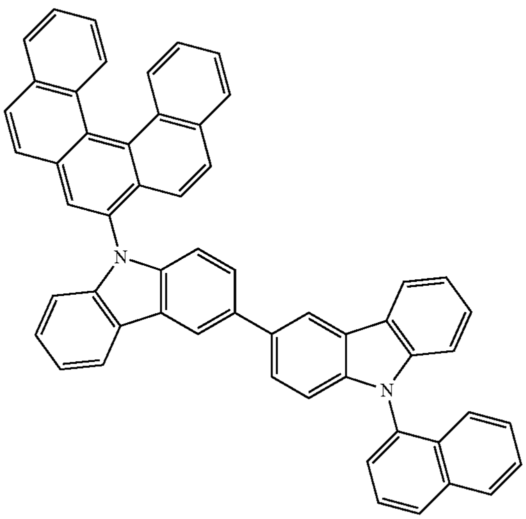
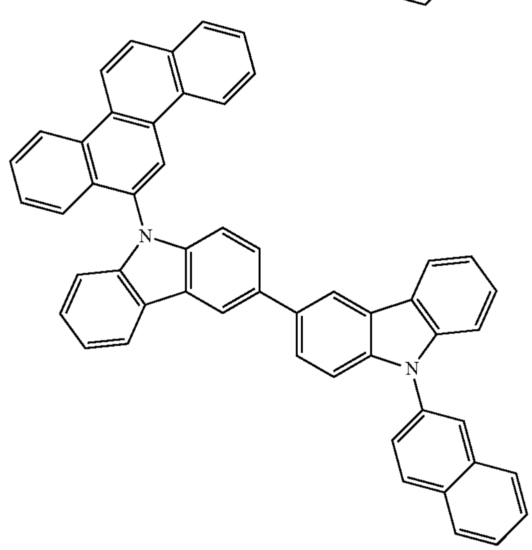

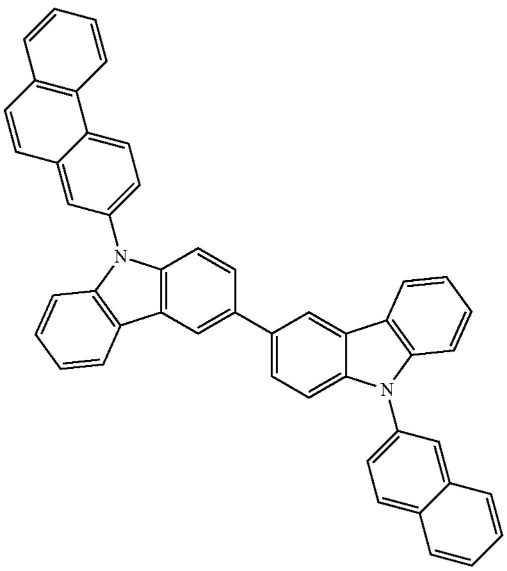
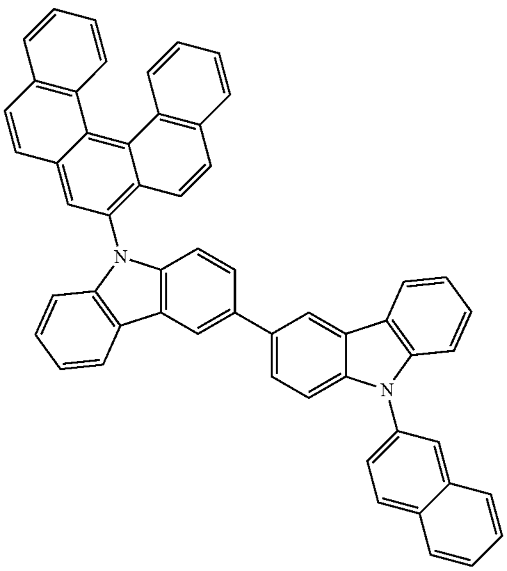
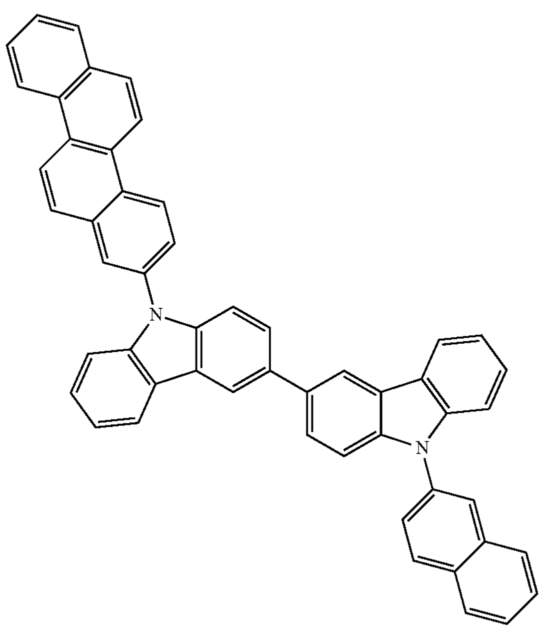
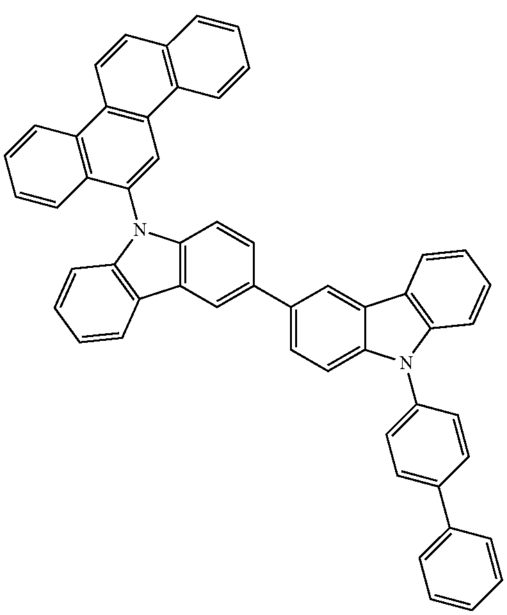

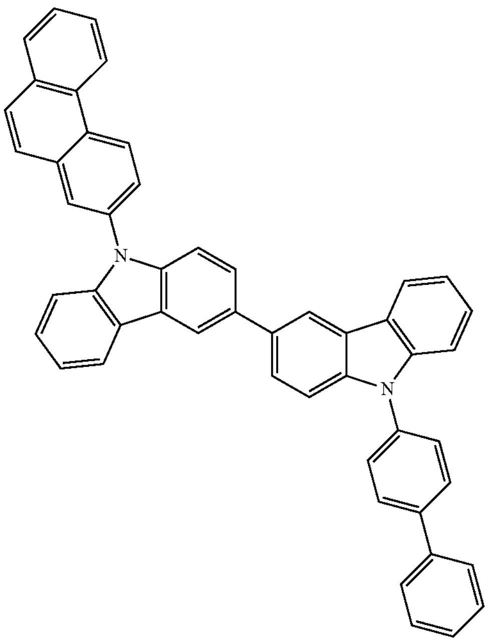
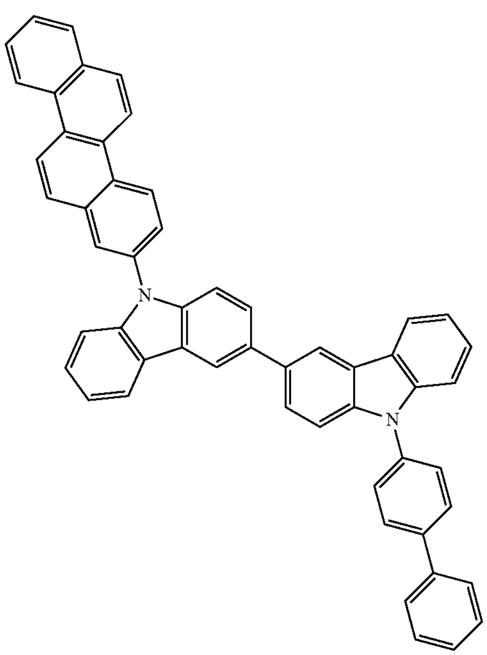
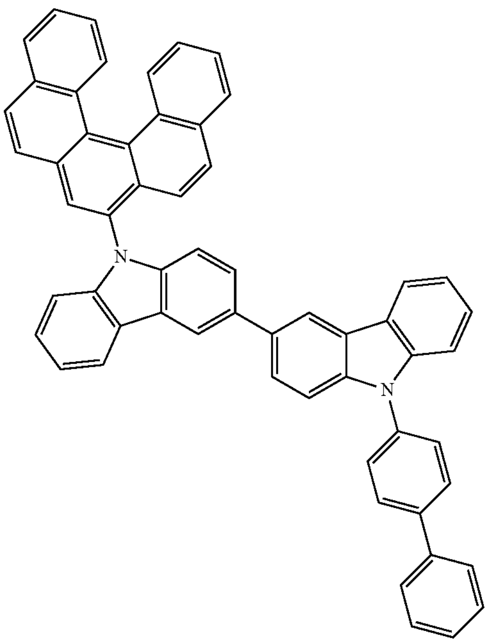
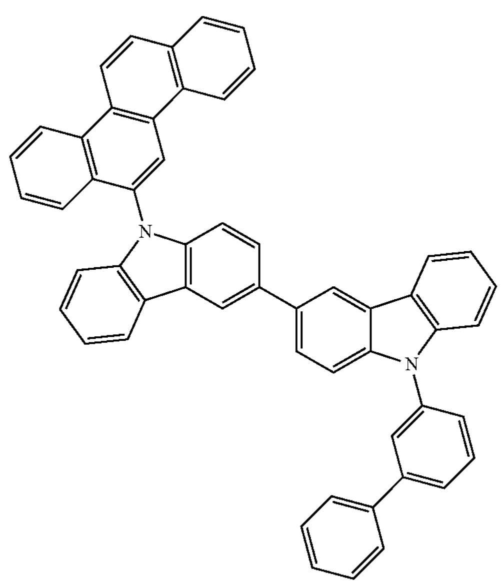

-continued
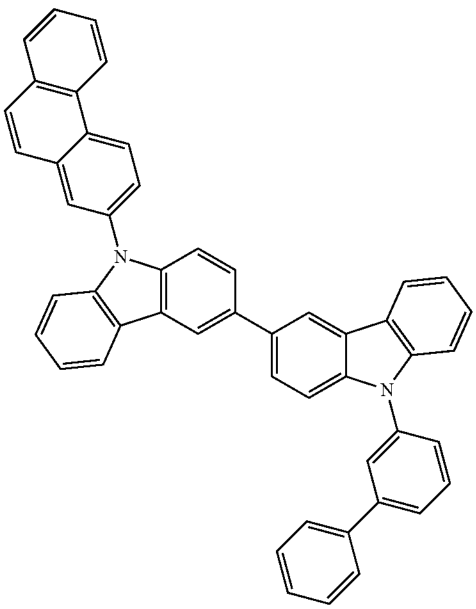
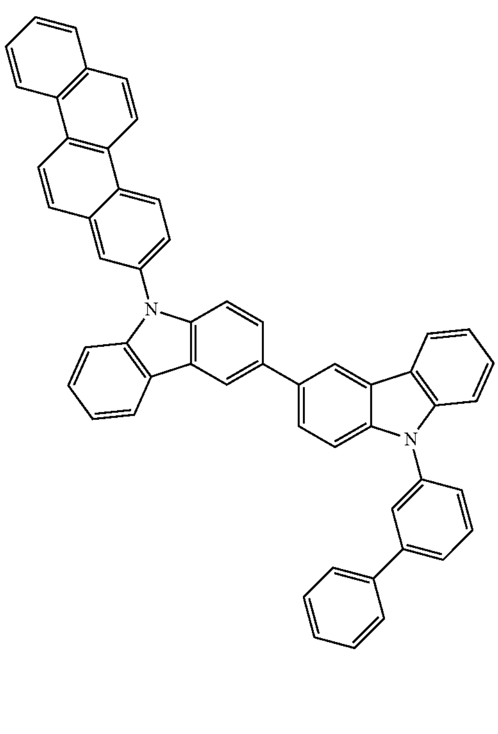
-continued
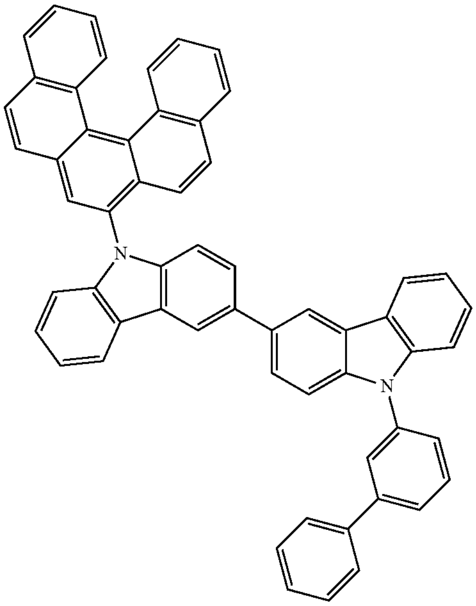
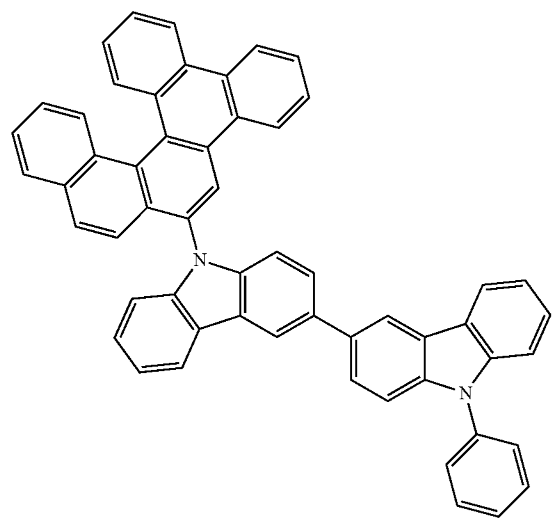
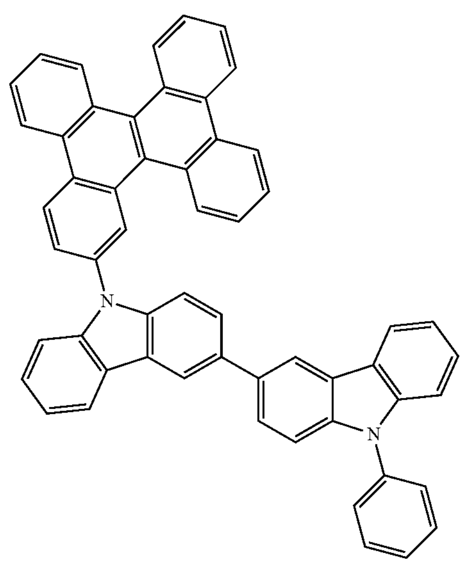

-continued
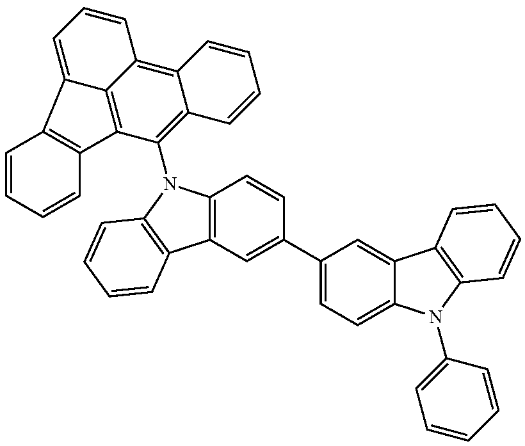
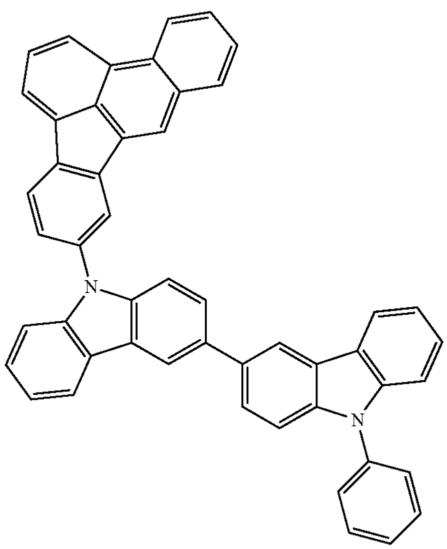
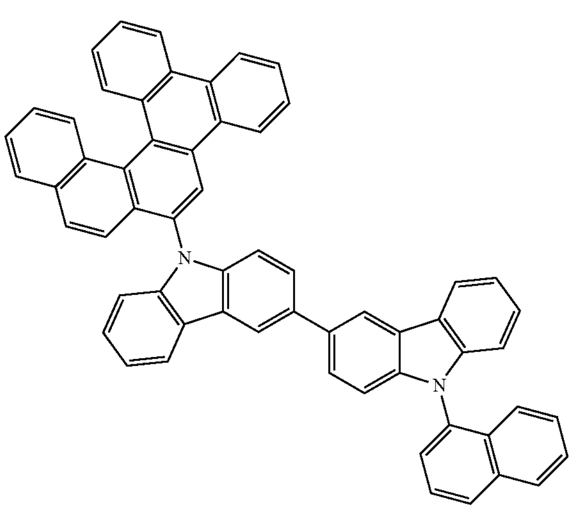
-continued
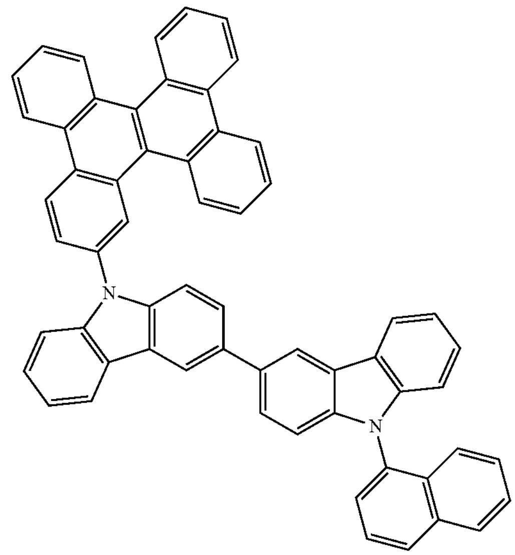
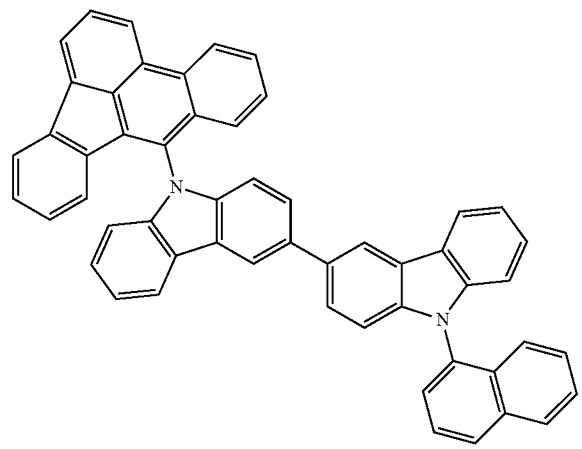
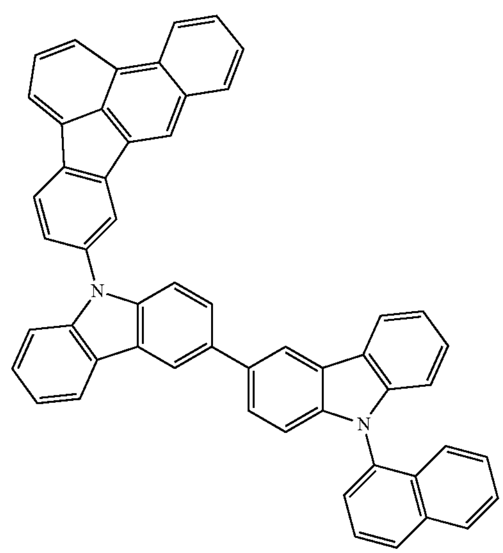

-continued
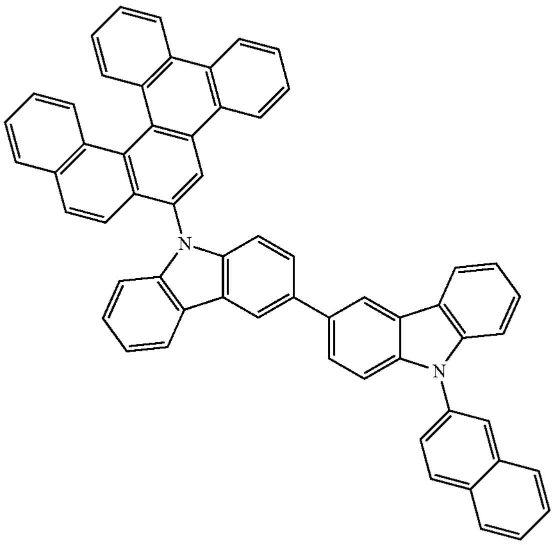
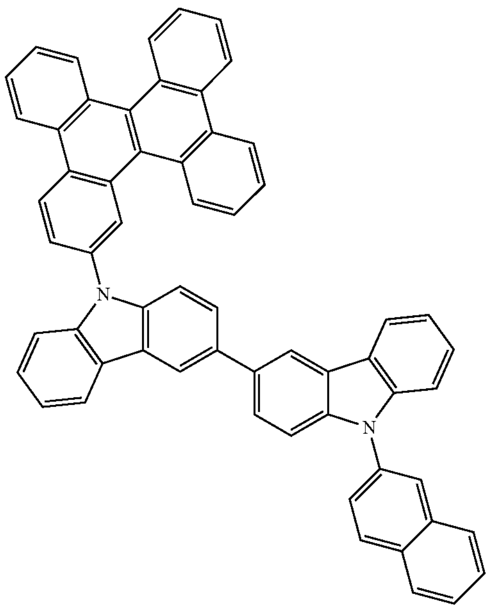
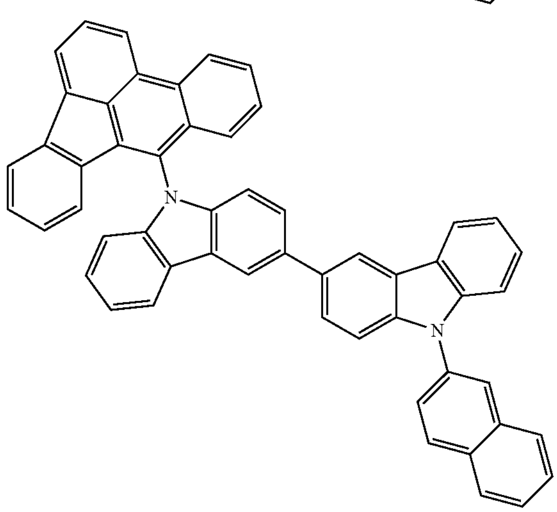
-continued
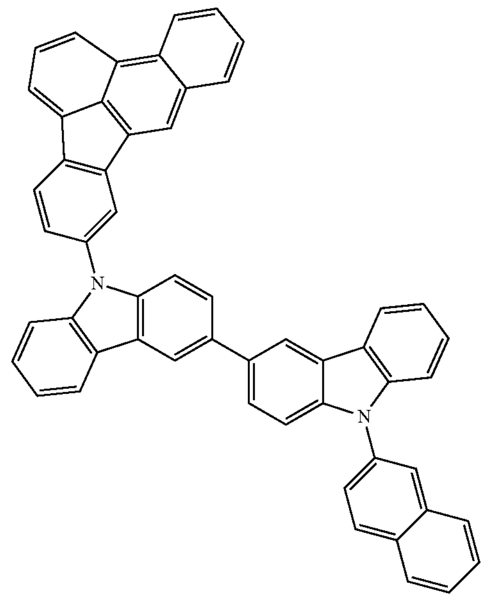
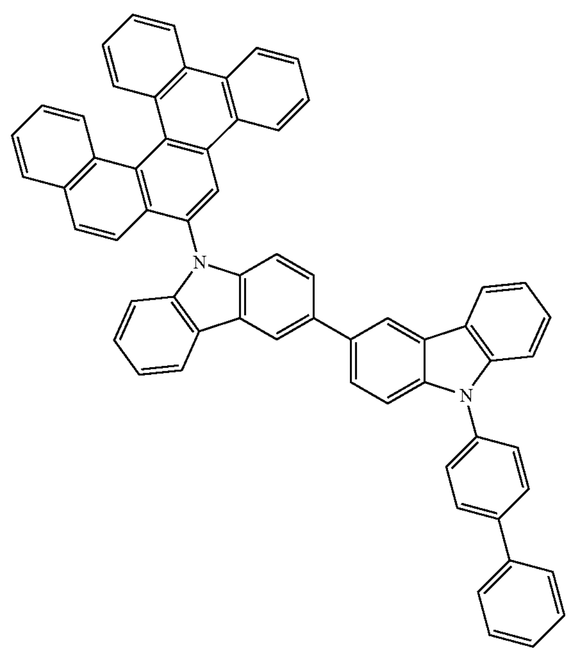

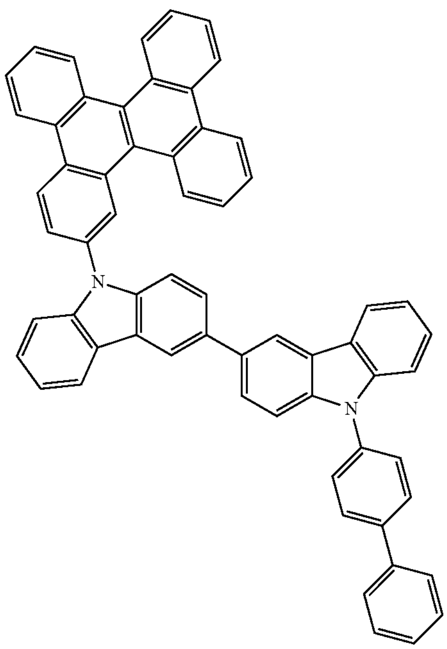
N
N
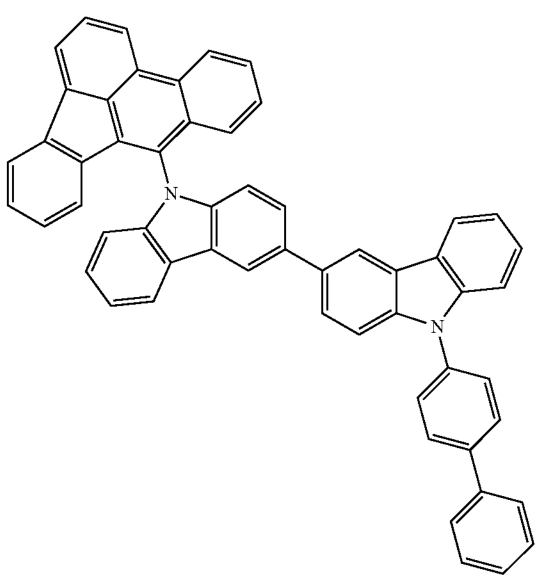
N
N
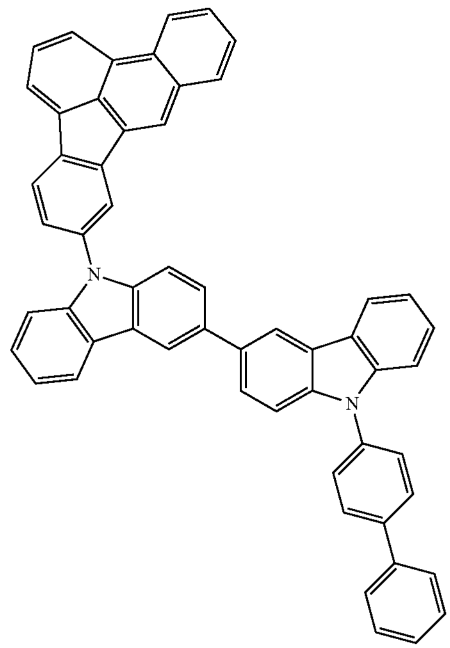
N
N
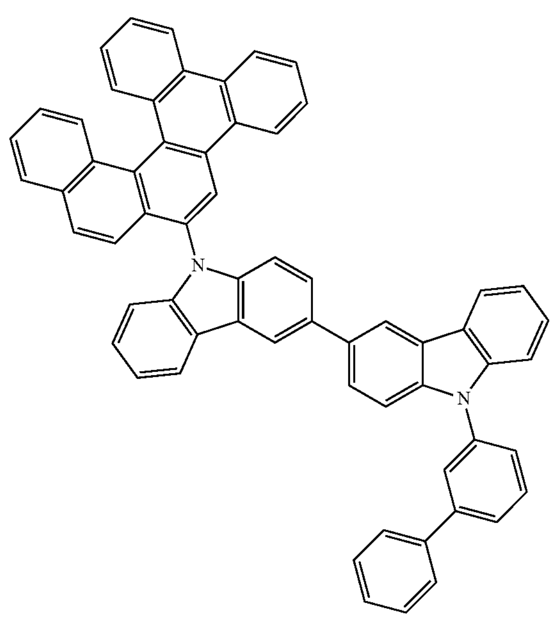
N
N

-continued
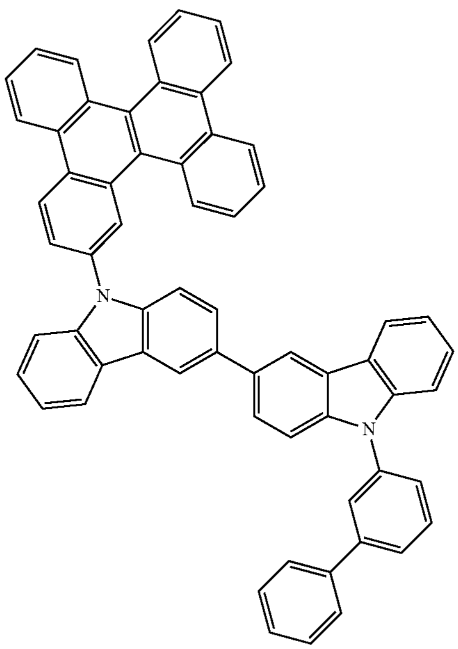
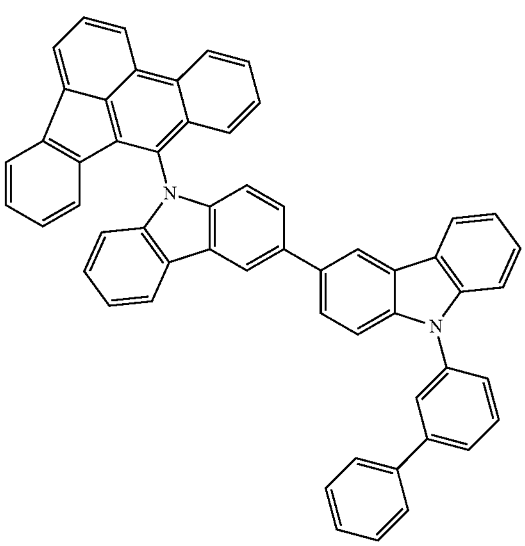
-continued
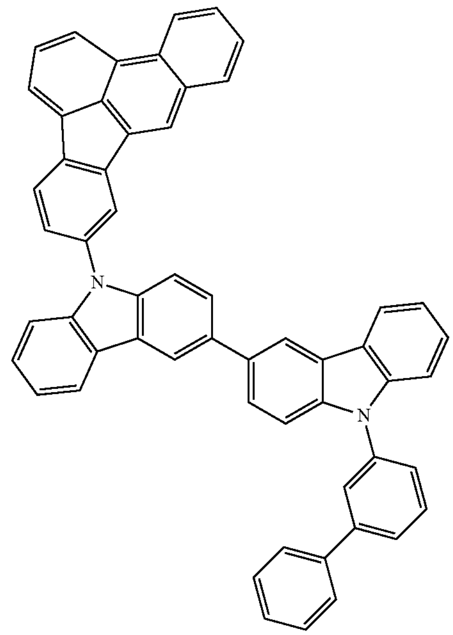
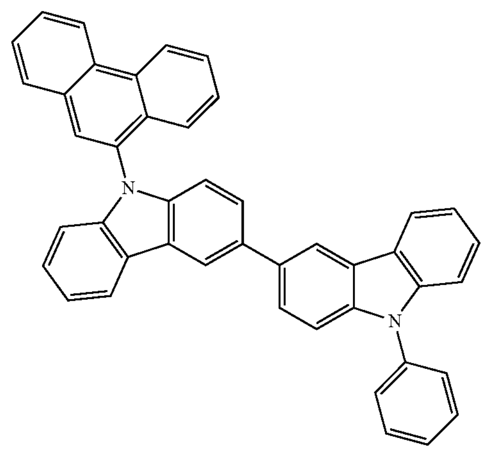
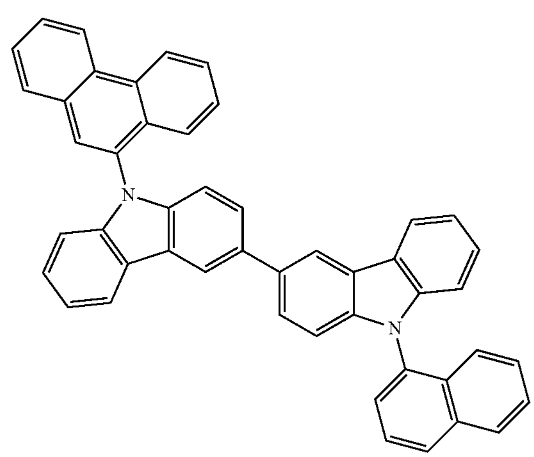

-continued
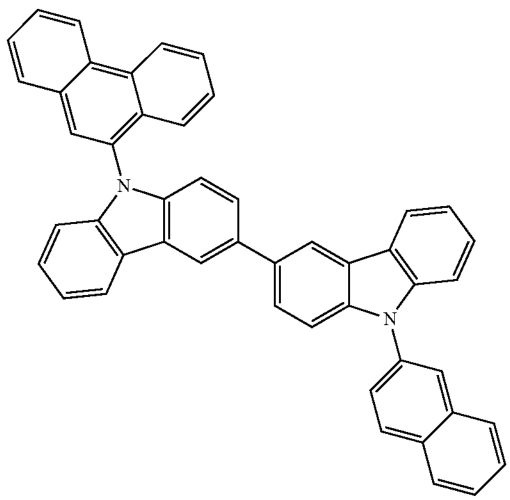
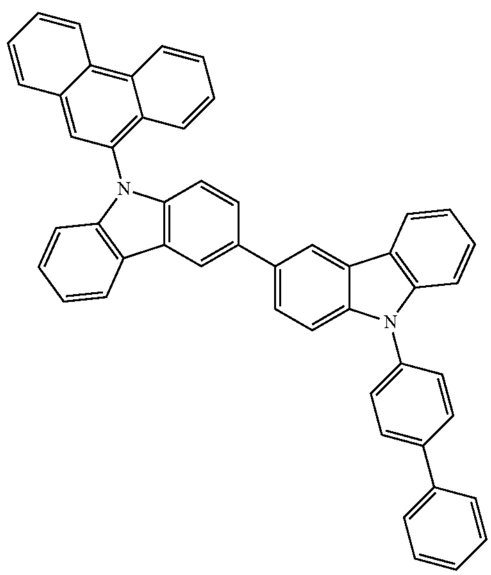
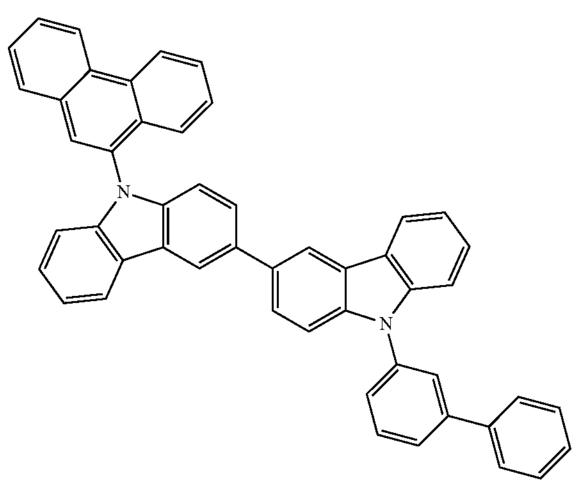
-continued
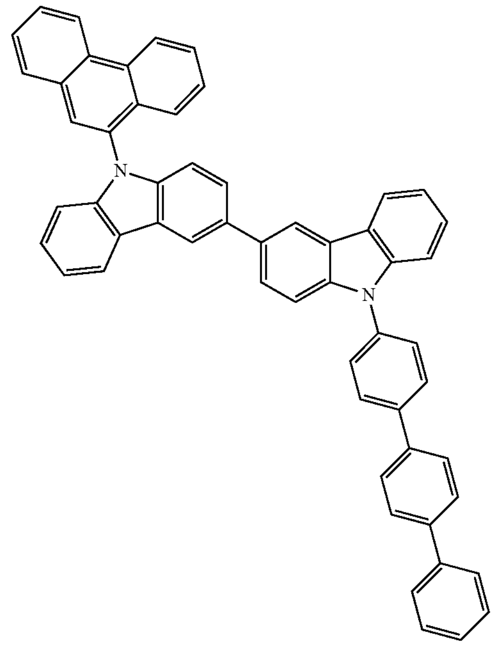
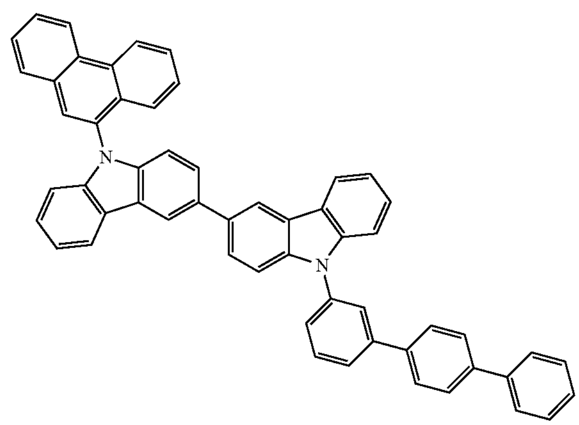
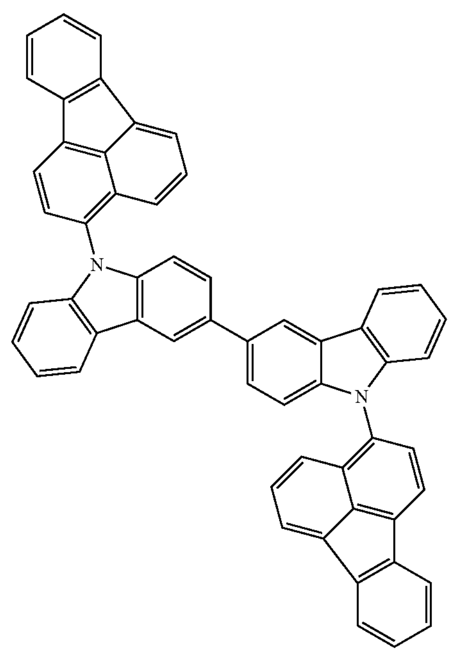

-continued
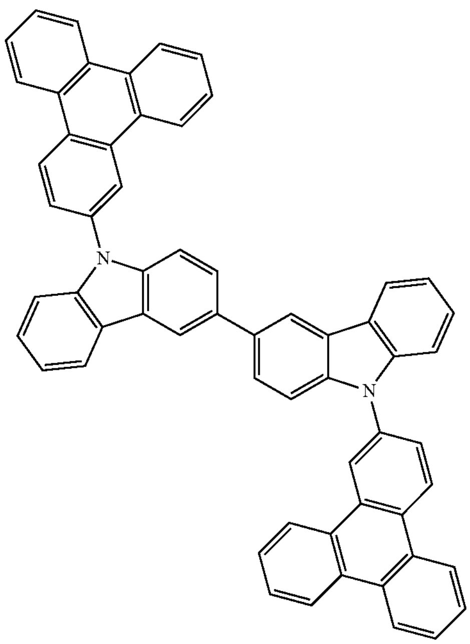
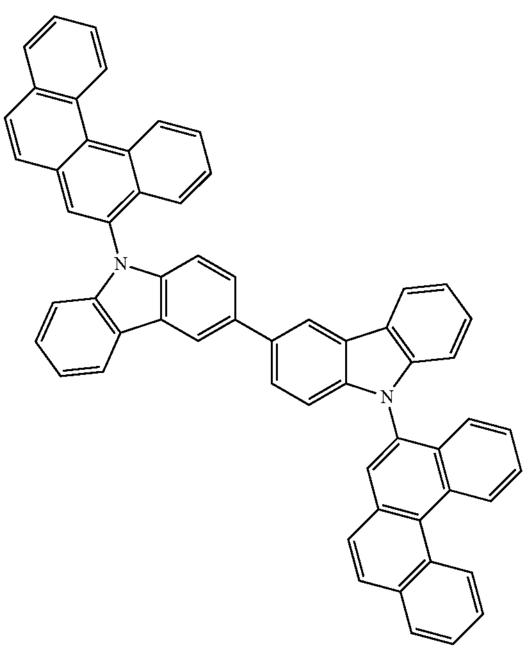
-continued
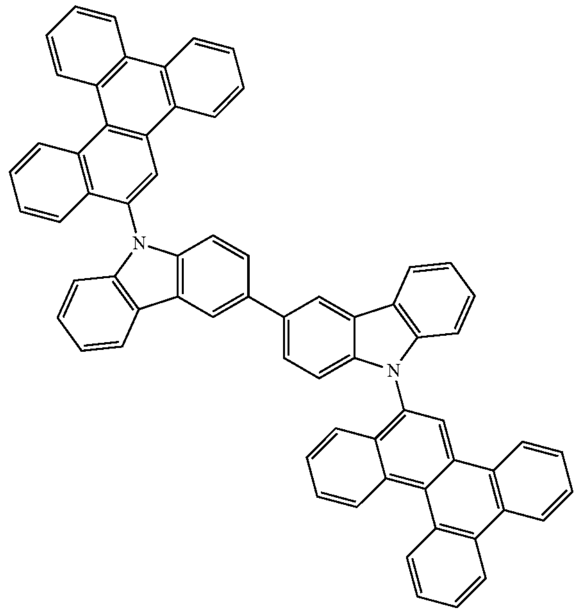
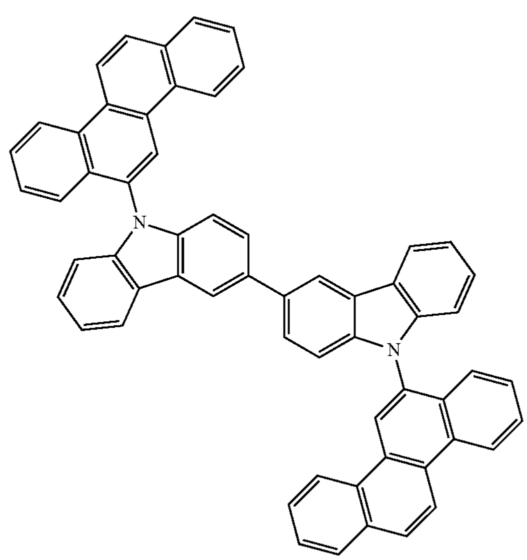

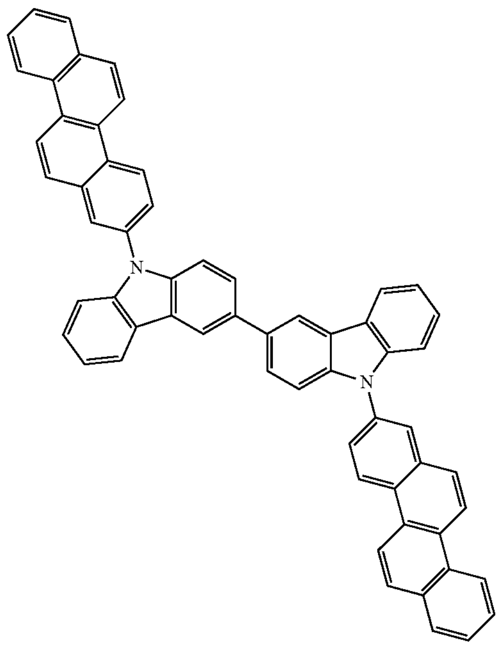
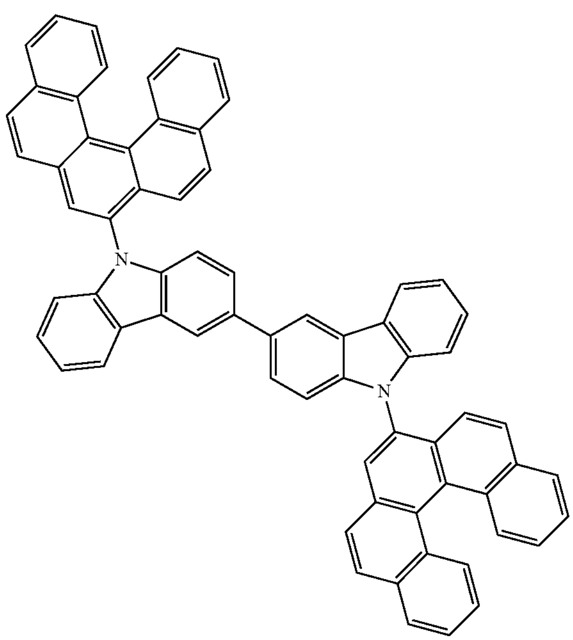
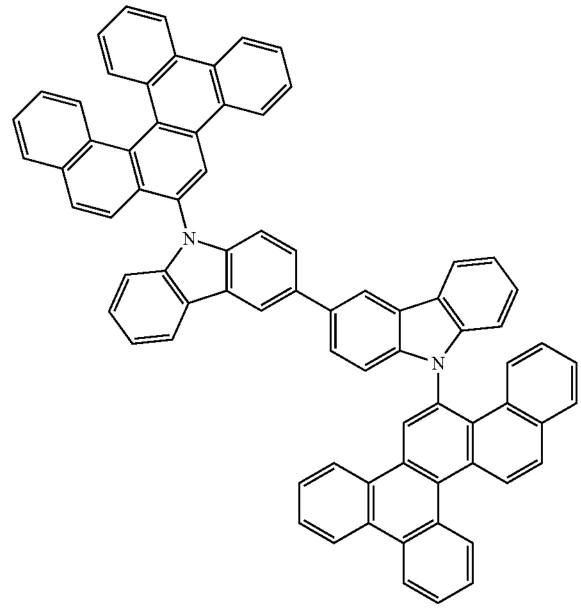
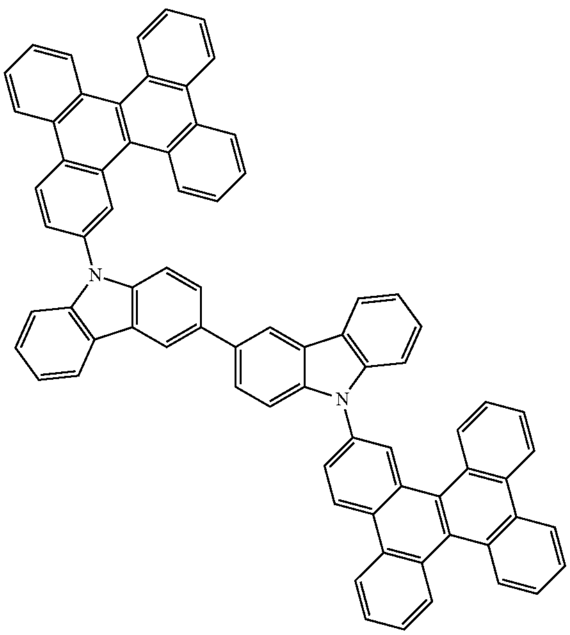
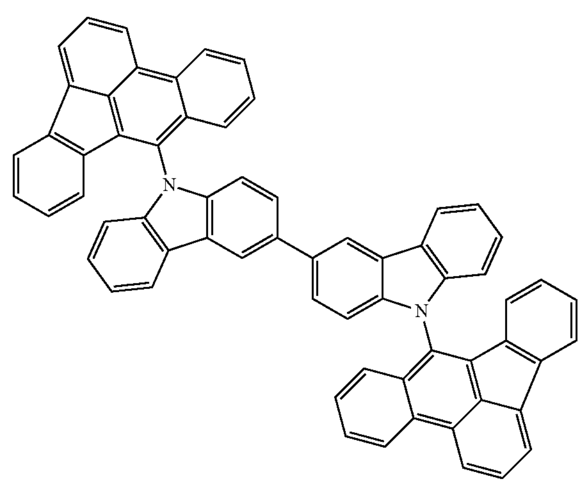

-continued
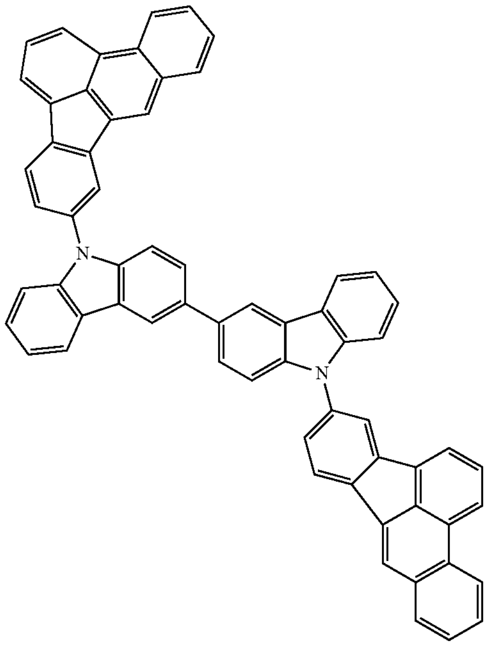
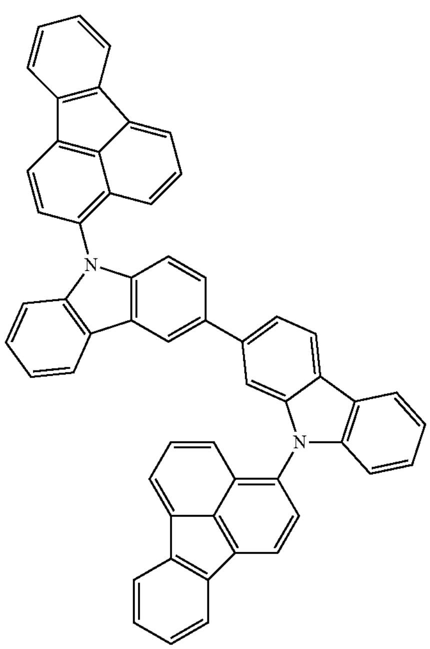
-continued
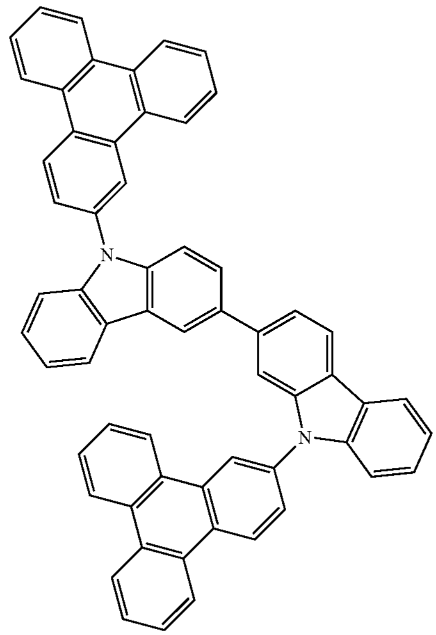
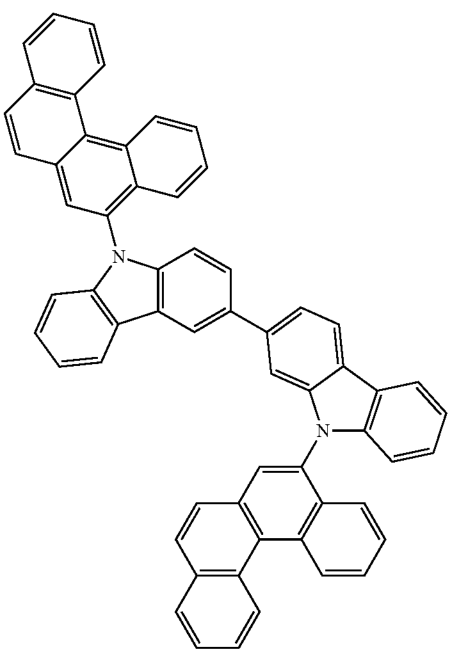

-continued
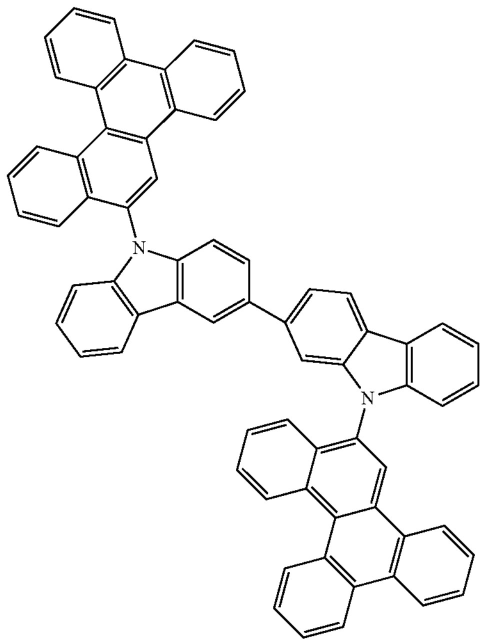
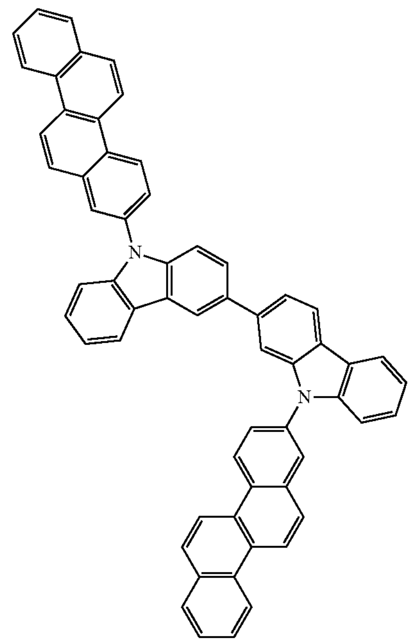
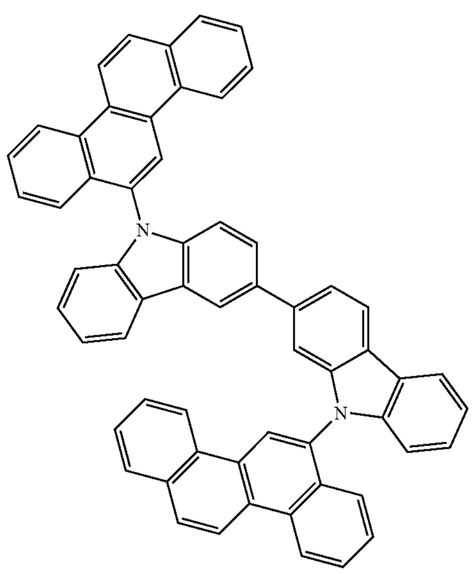
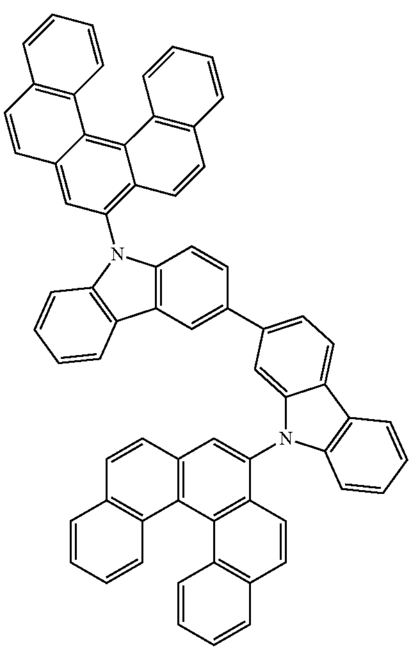
-continued

-continued
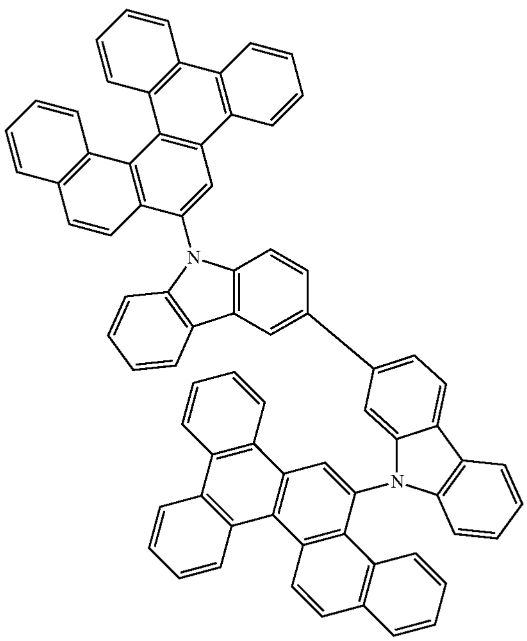
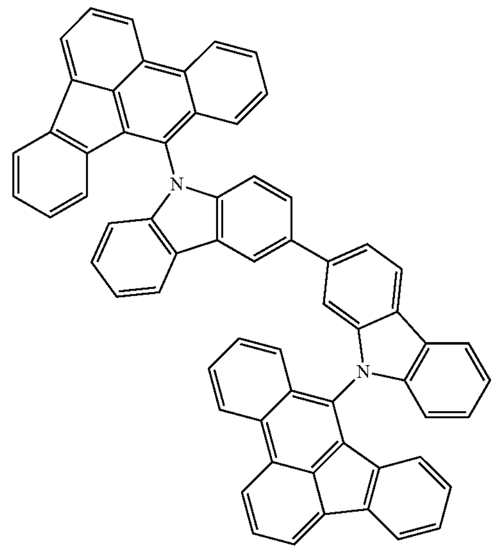
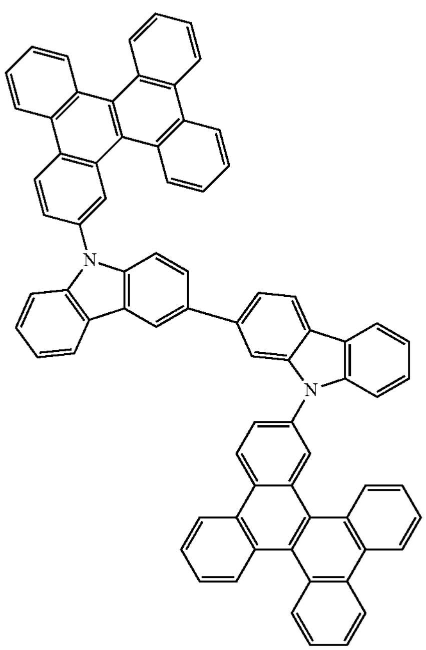
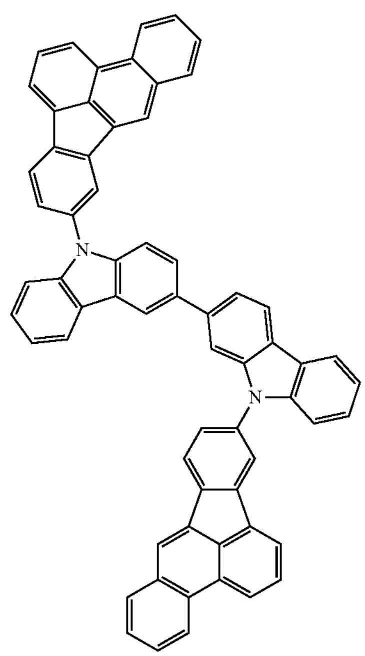

-continued
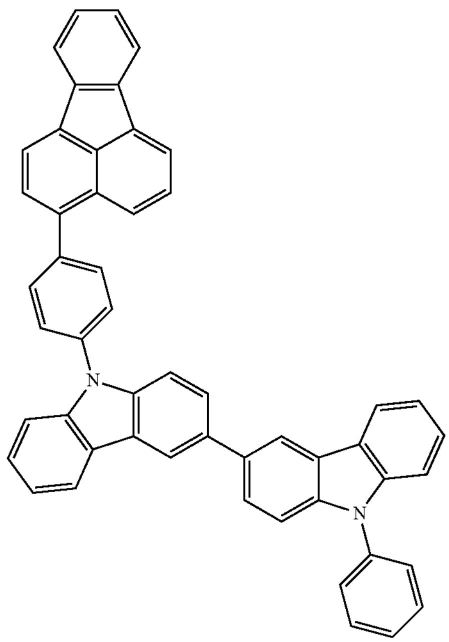
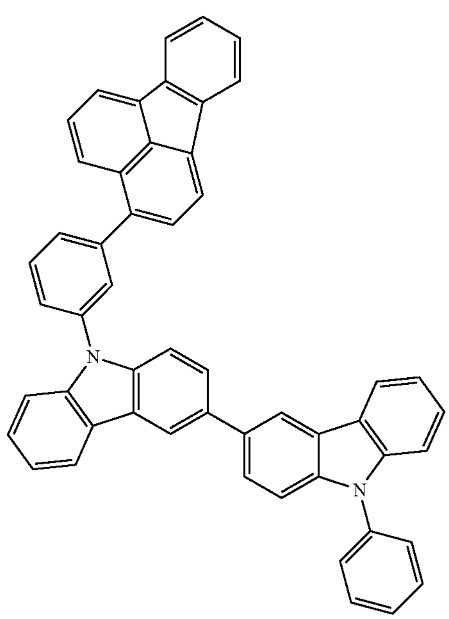
-continued
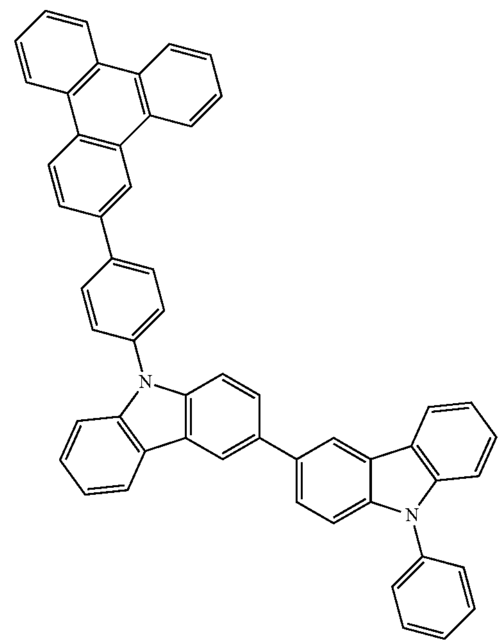
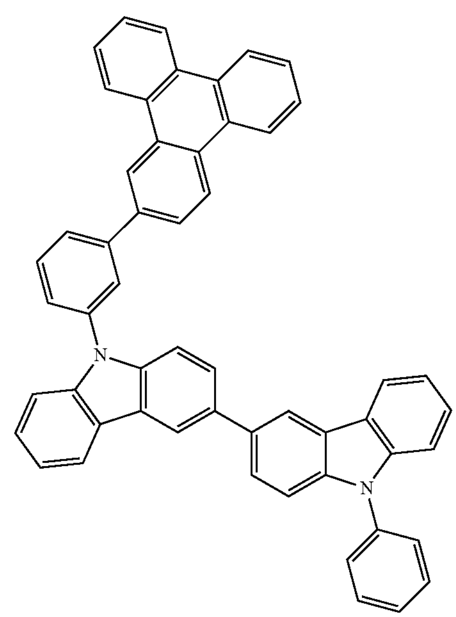

-continued
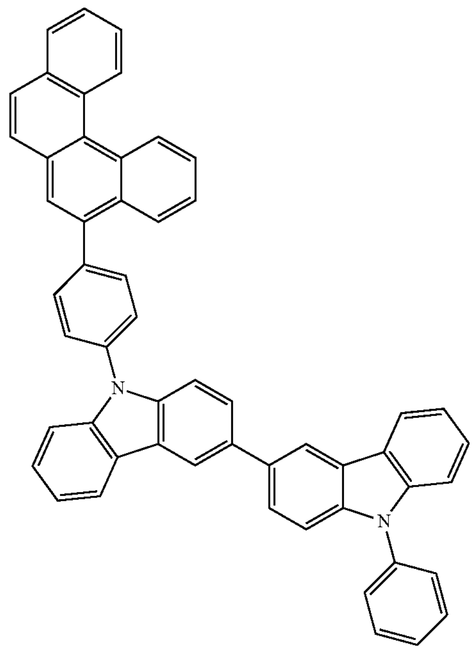
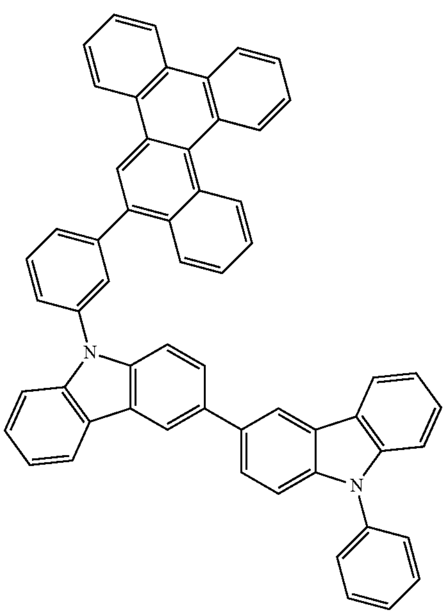
-continued
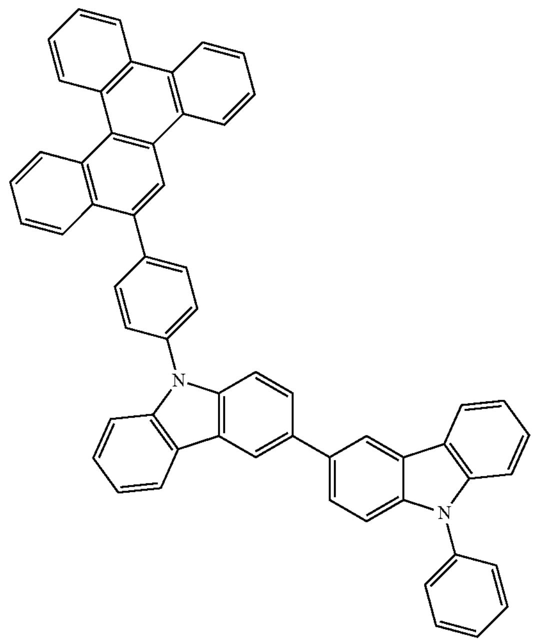
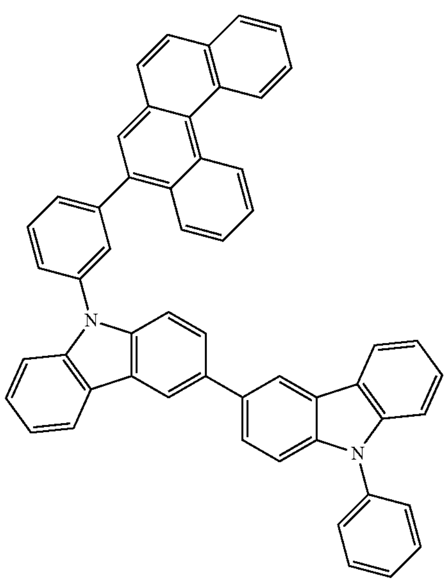

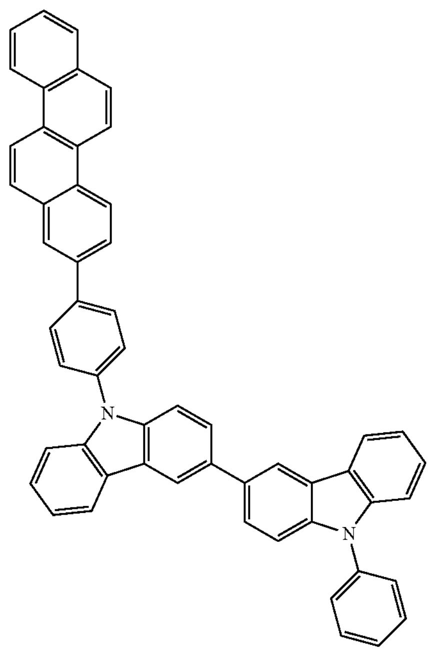
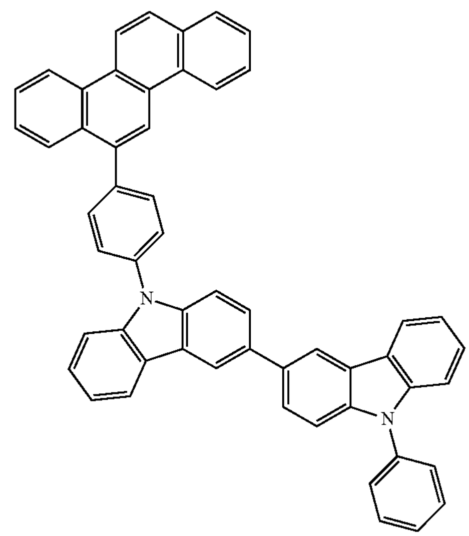
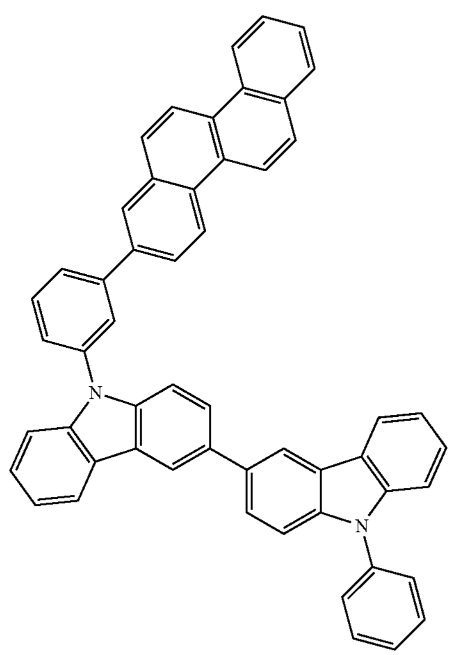
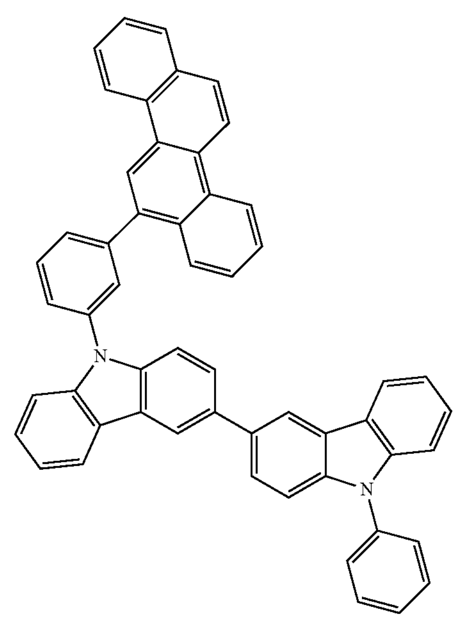

-continued
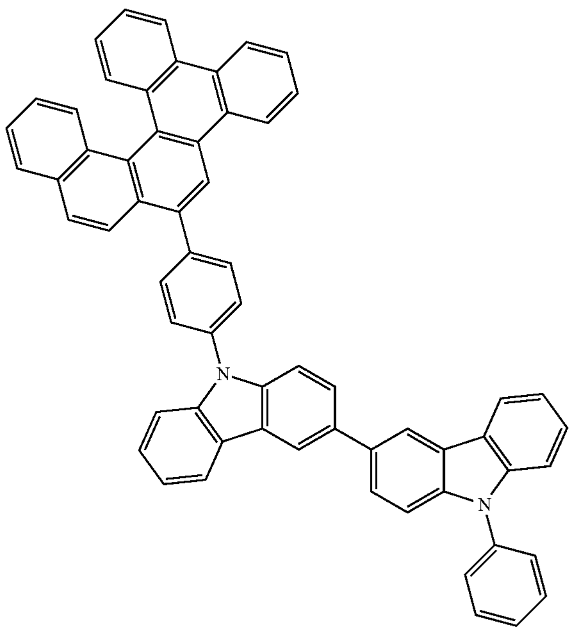
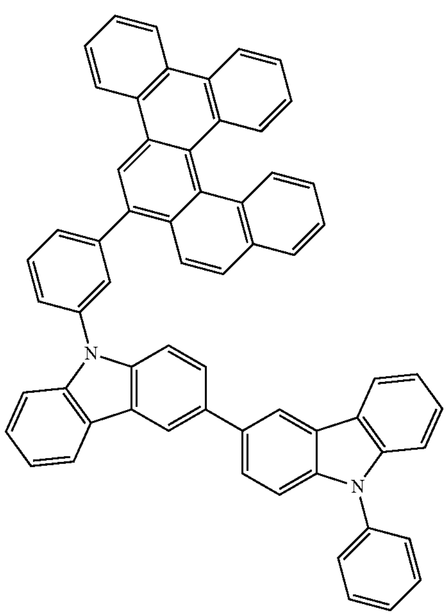
-continued
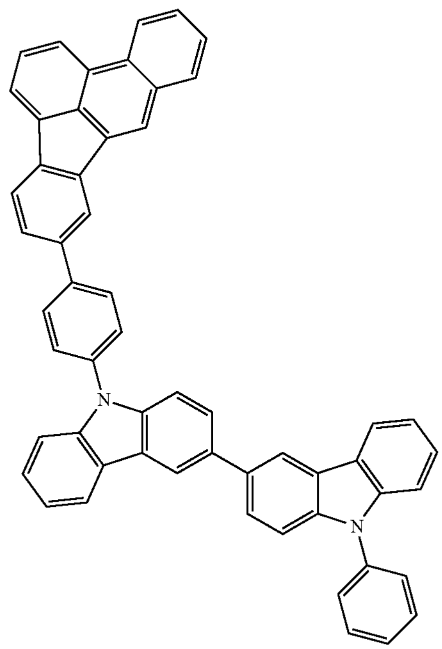
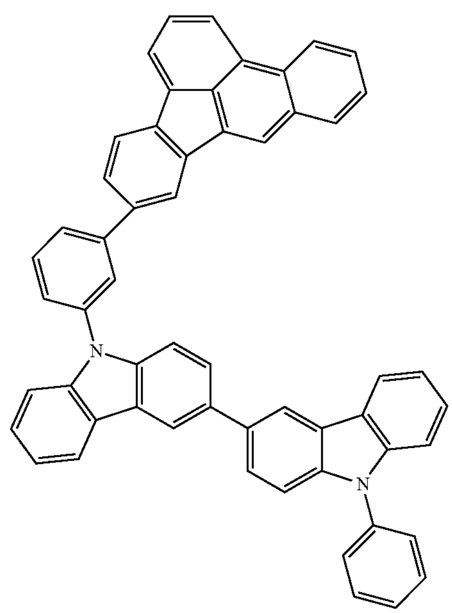

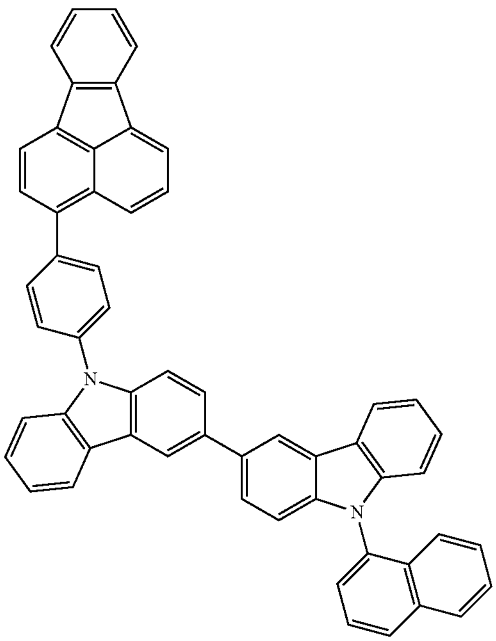
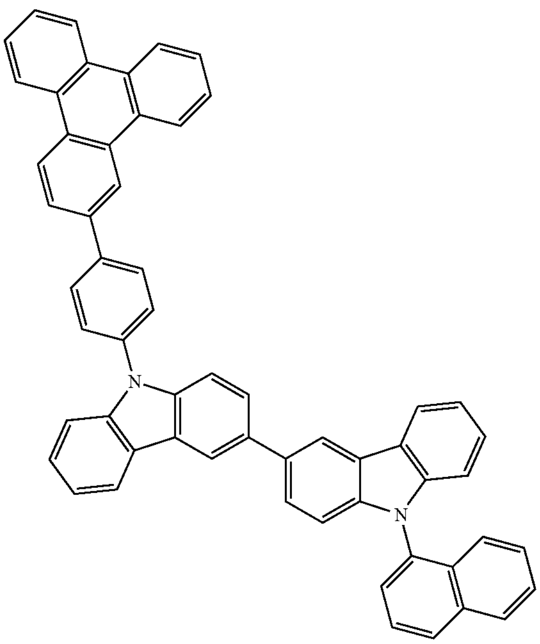
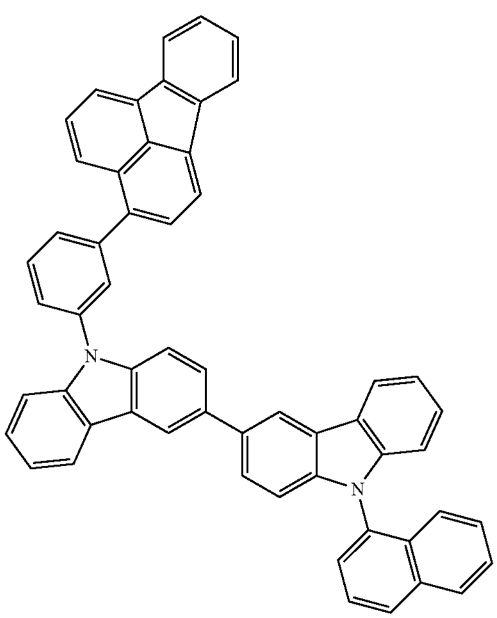
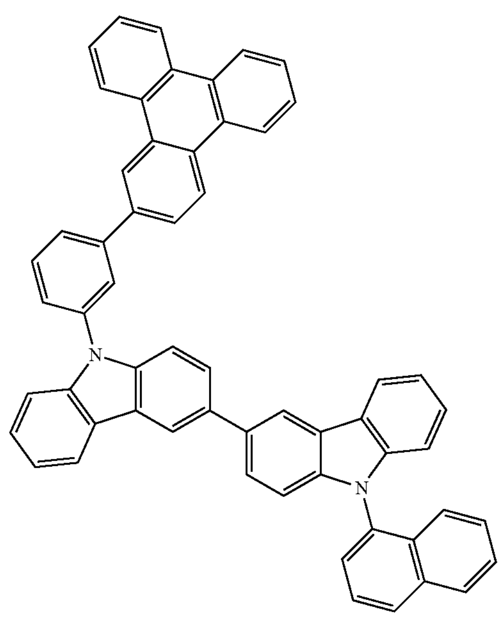

-continued
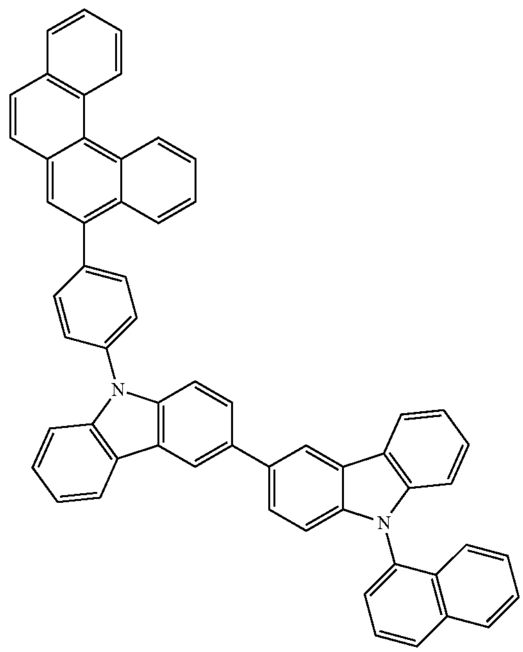
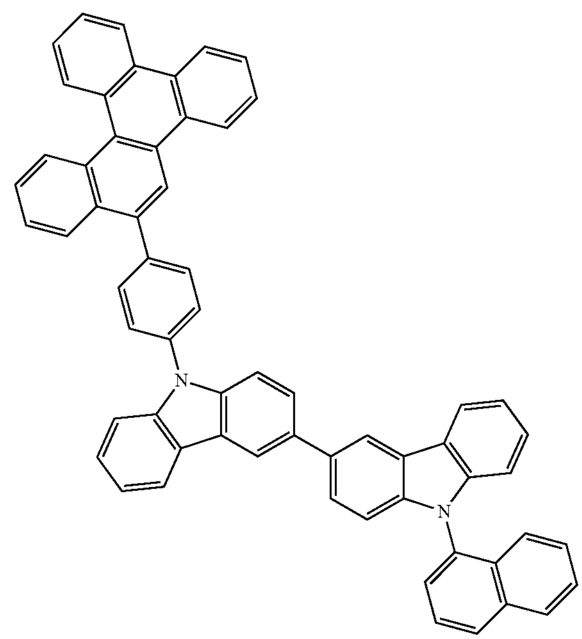
-continued
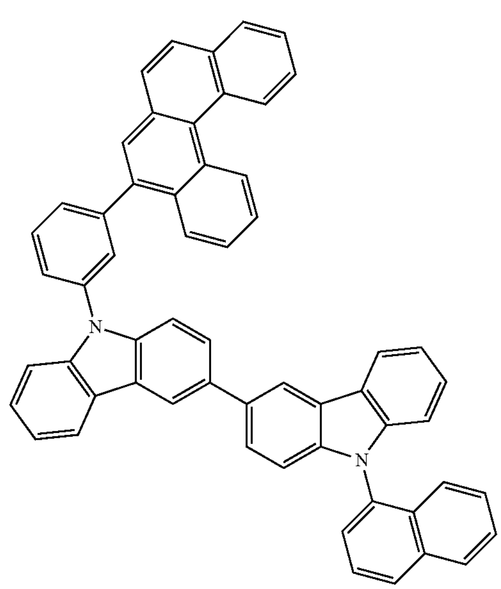
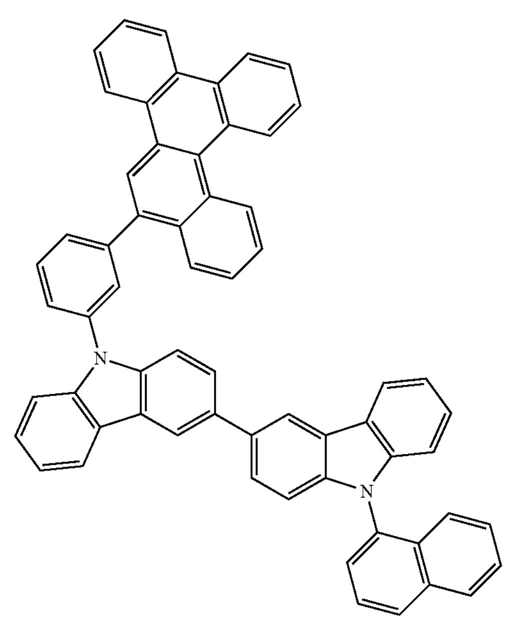

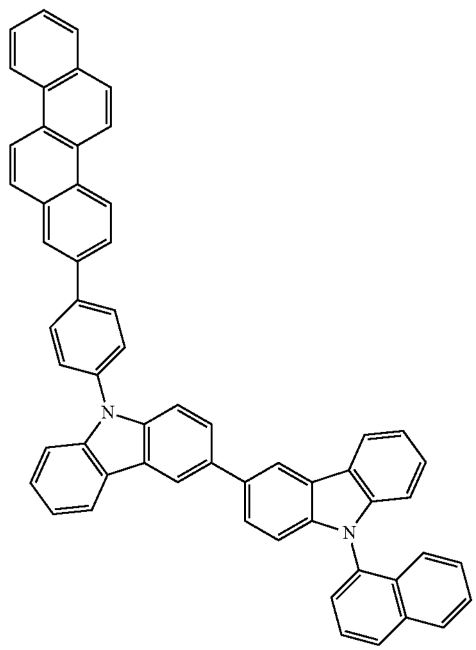
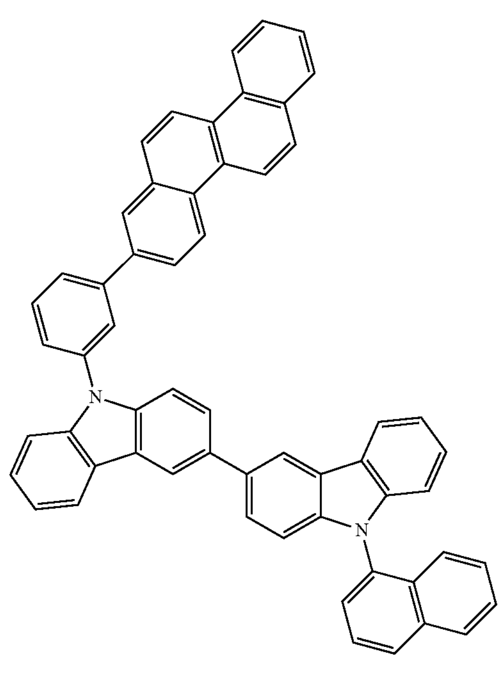
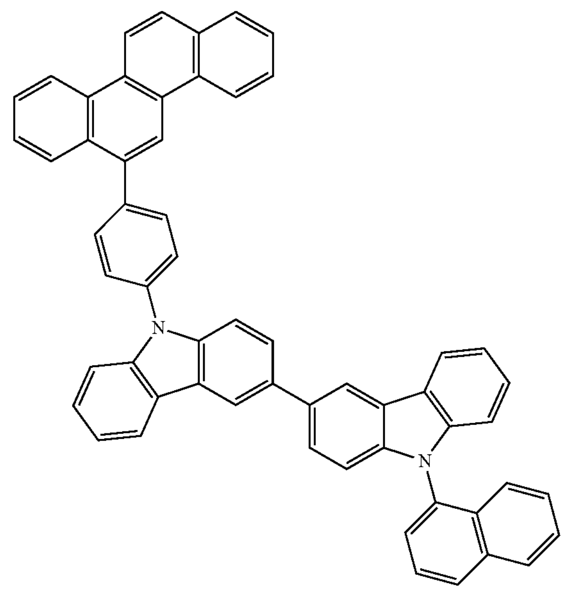
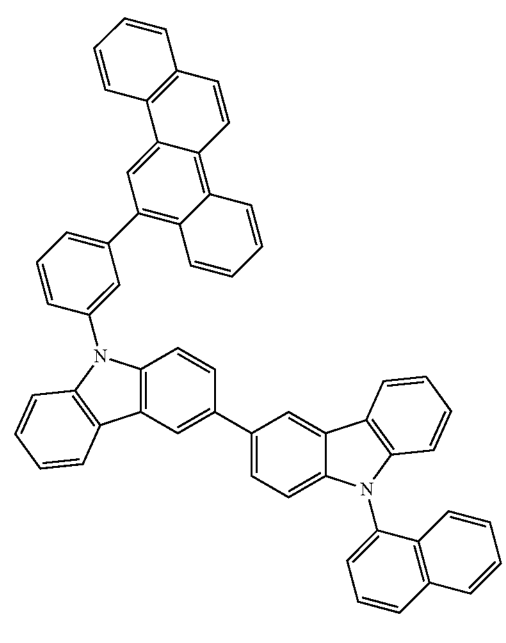

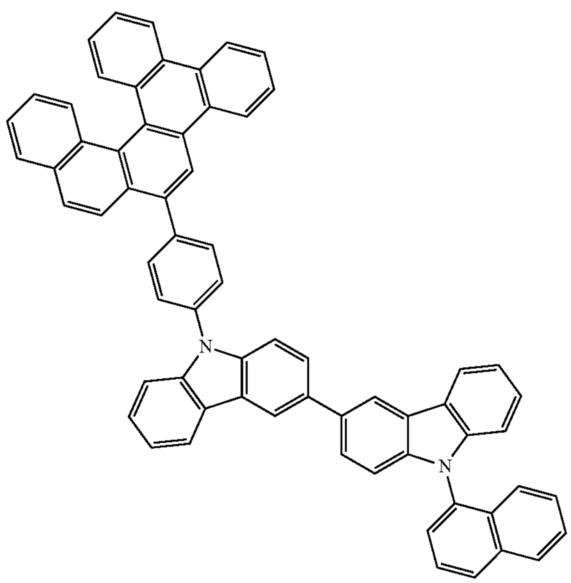
N
N
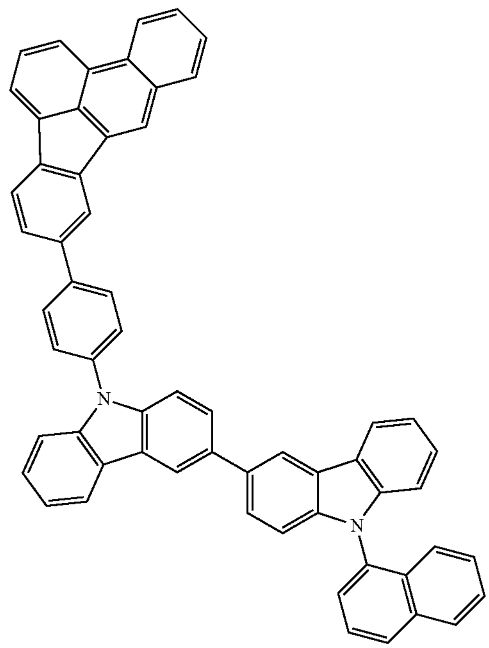
N
N
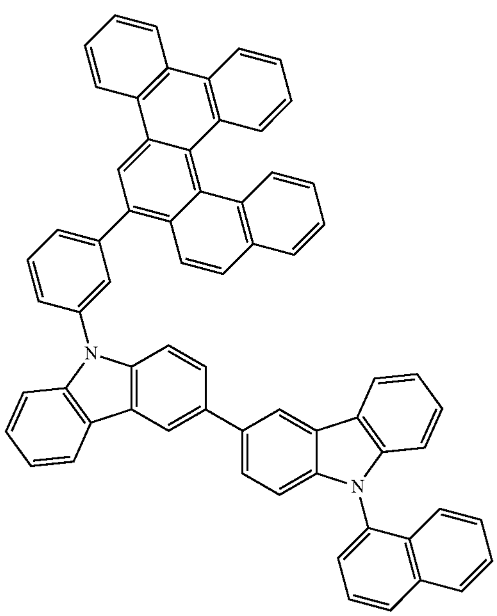
N
N
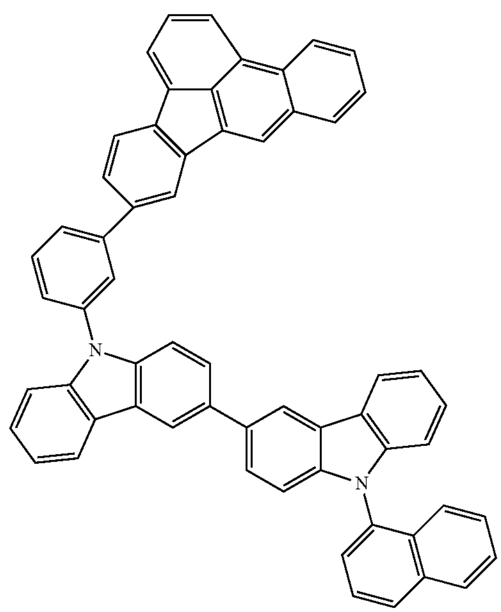
N
N

-continued
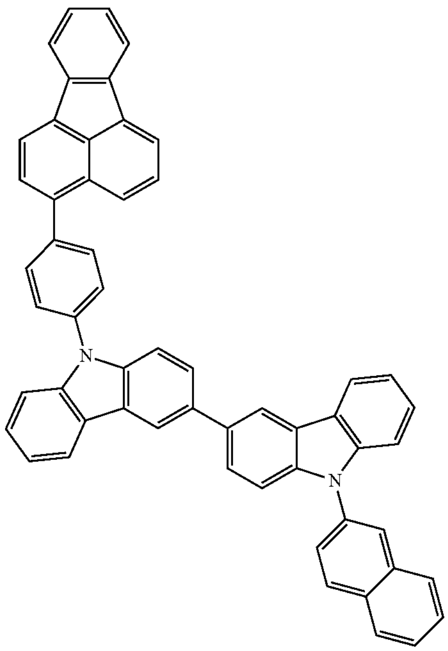
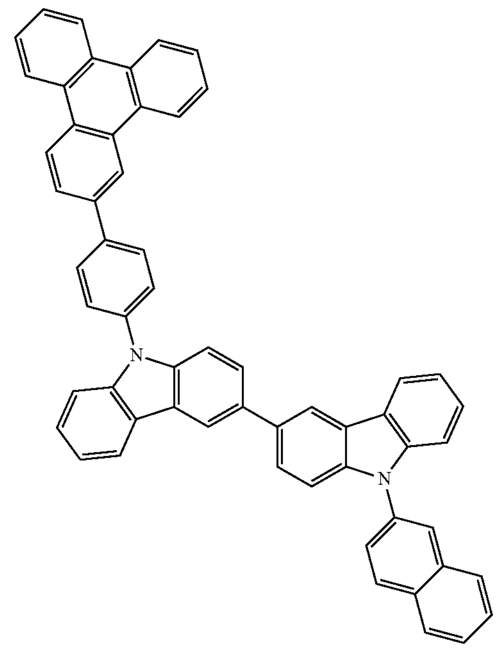
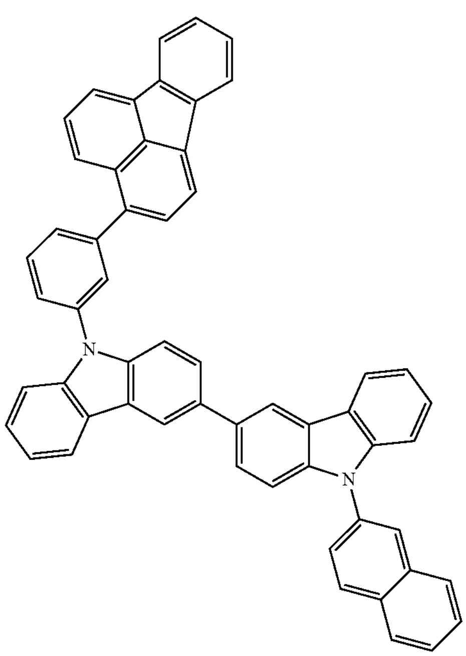
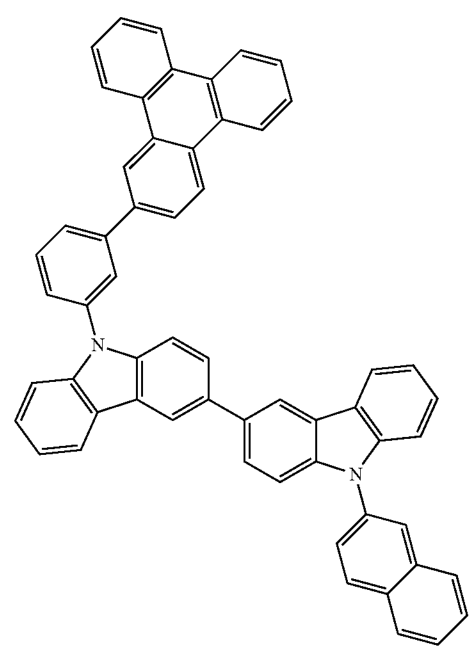
-continued

-continued
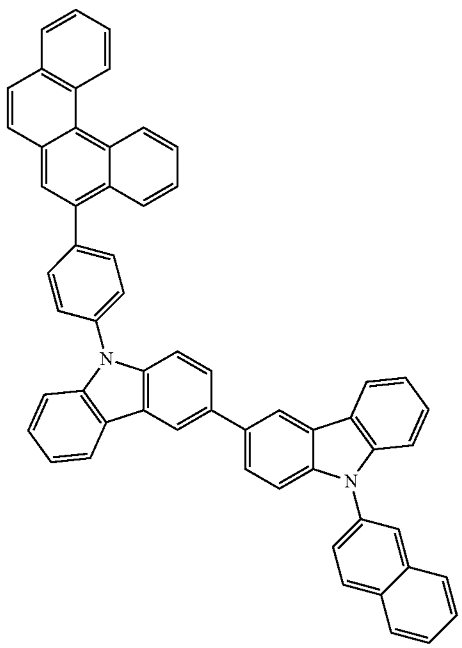
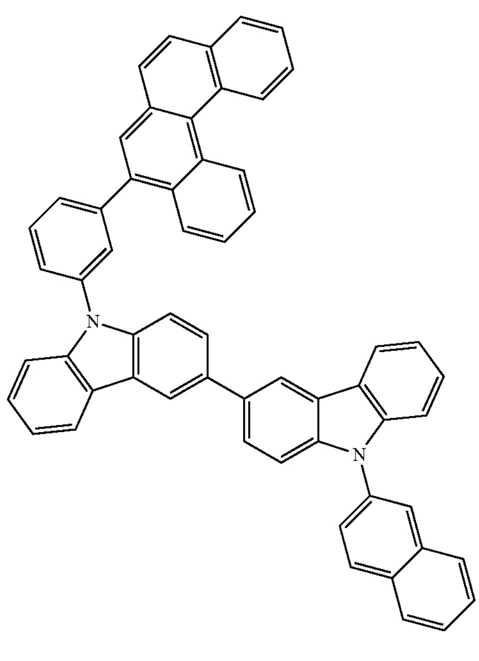
-continued
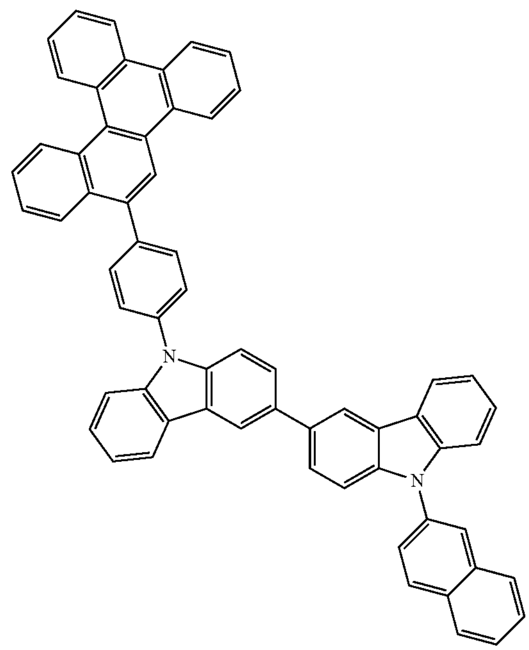
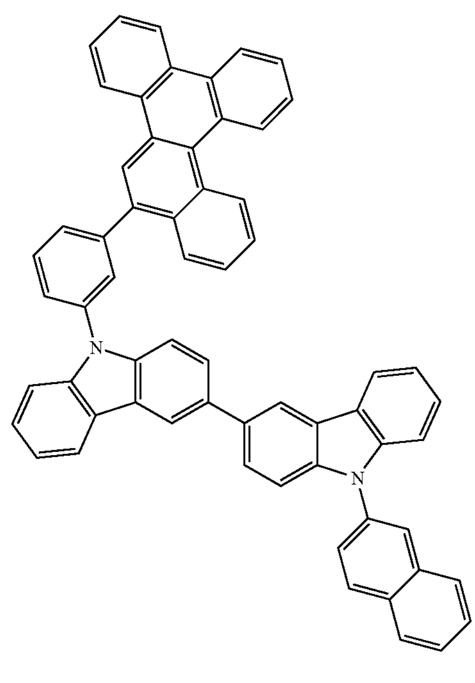

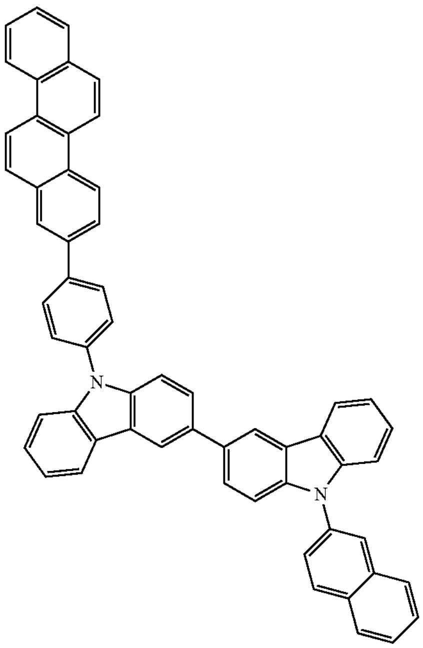
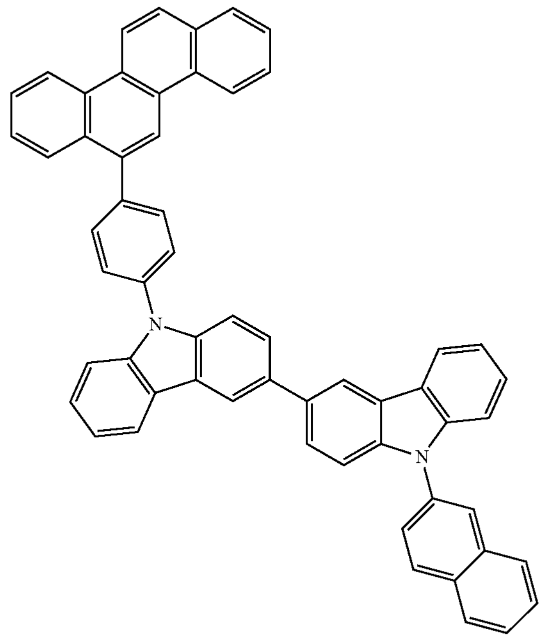
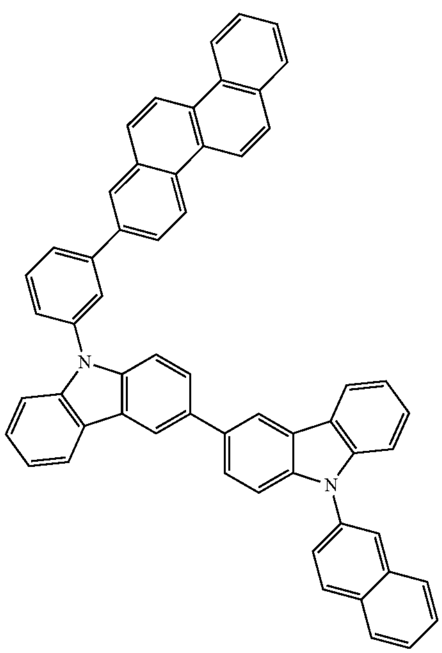
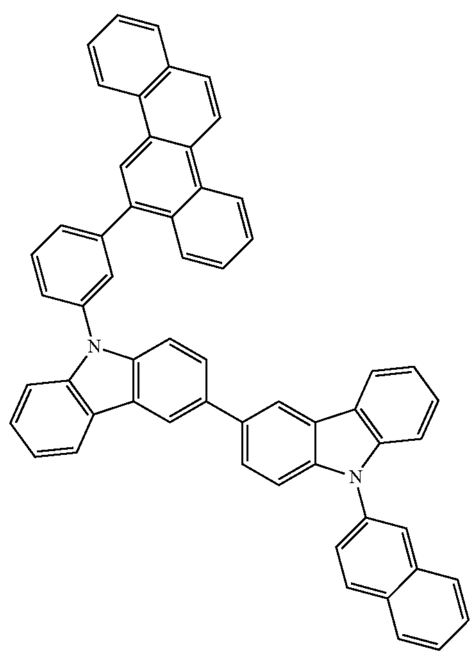

-continued
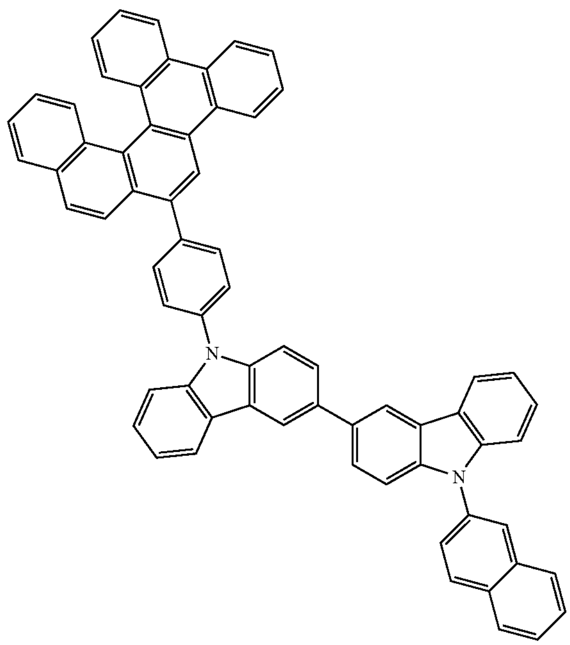
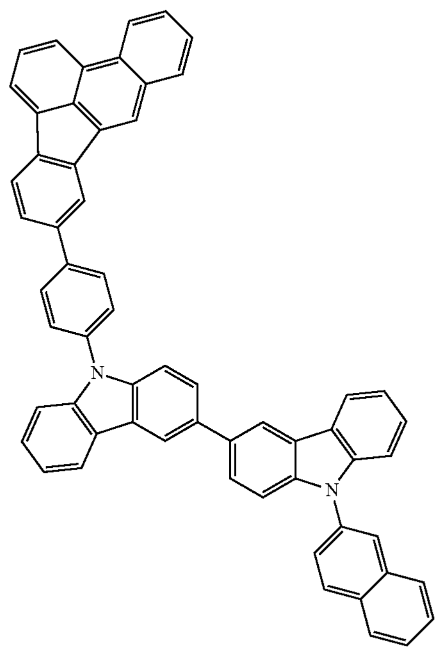
-continued
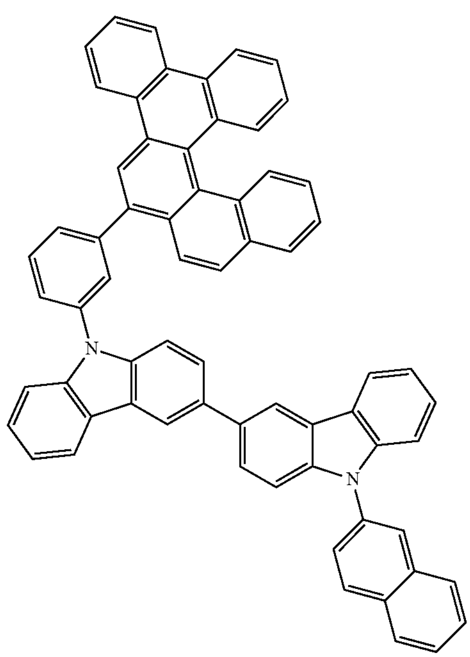
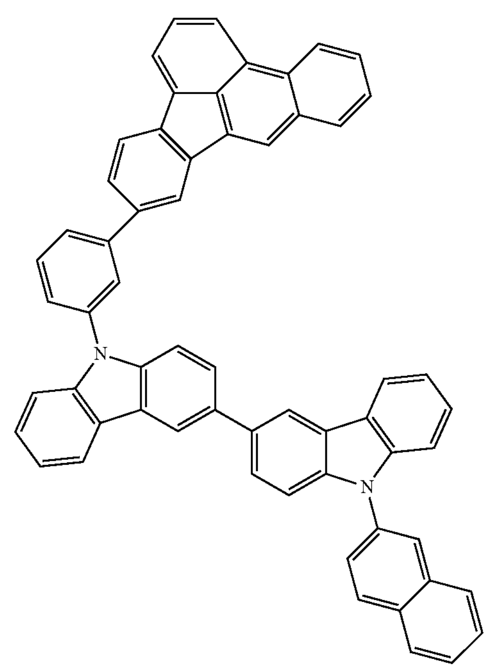

-continued
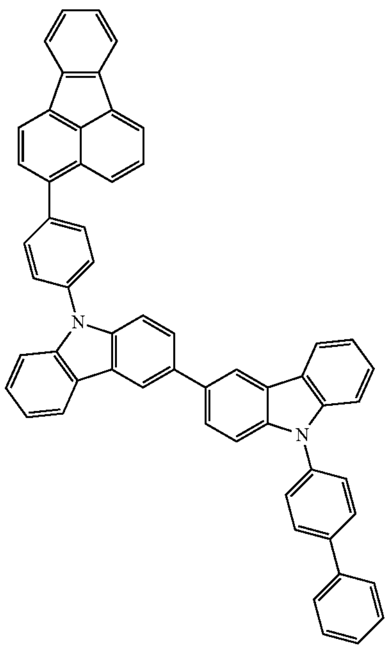
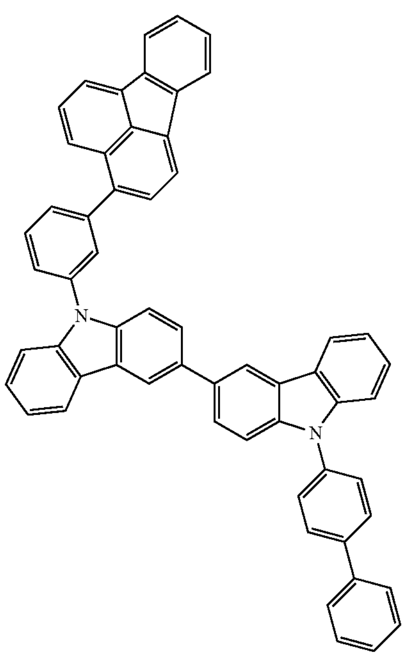
-continued
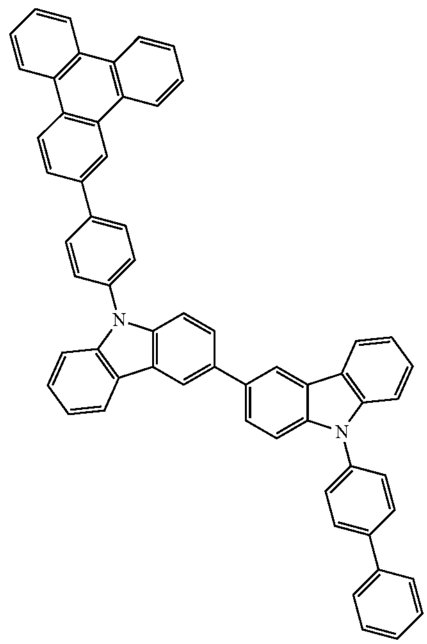
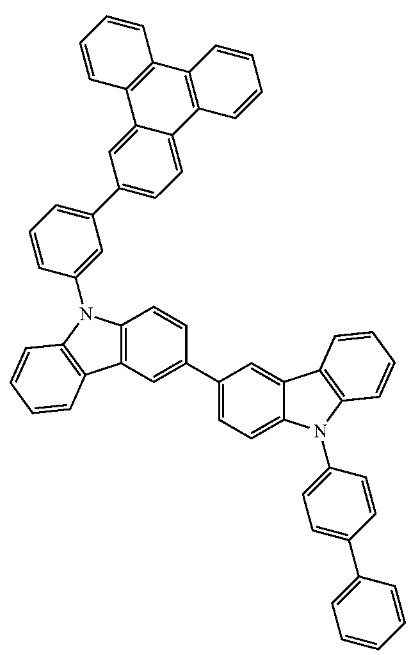

-continued
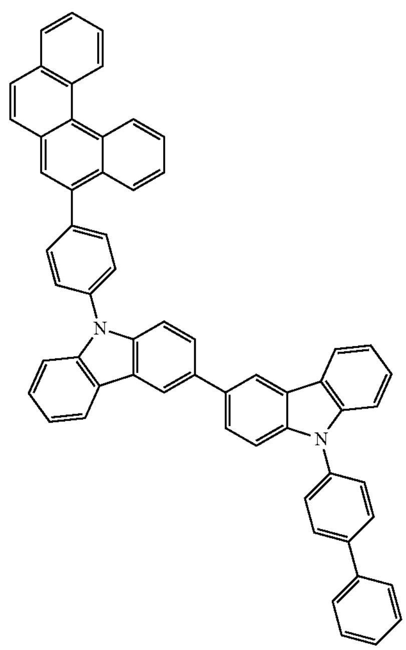
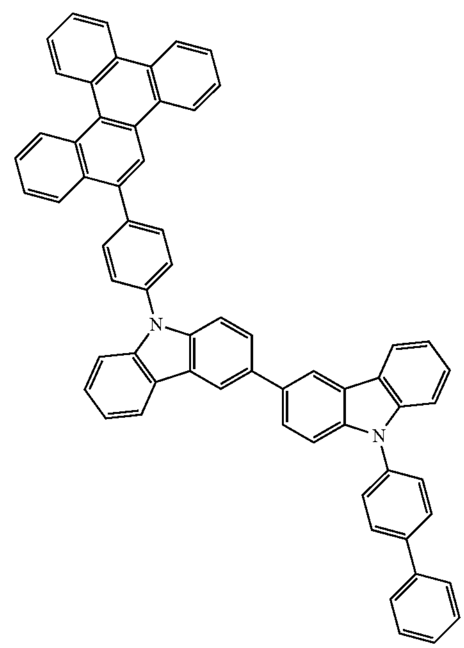
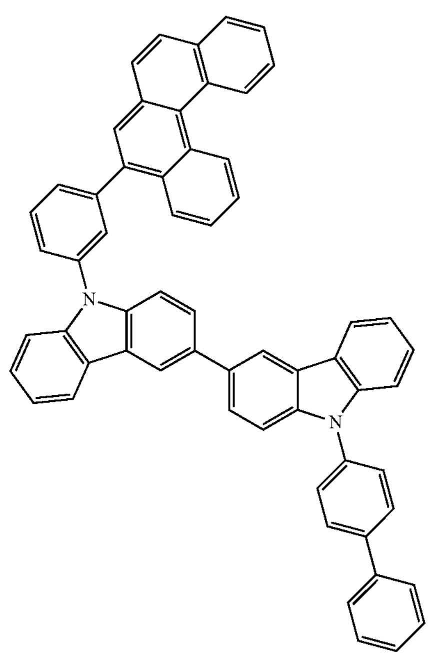
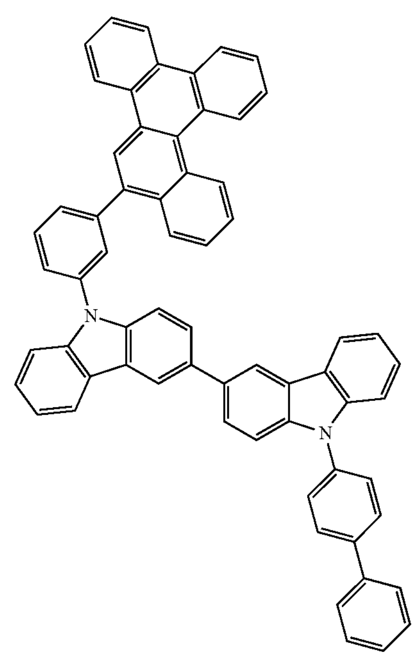
-continued

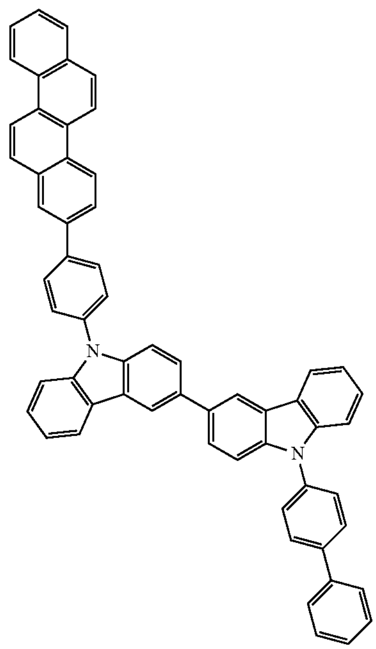
N
N
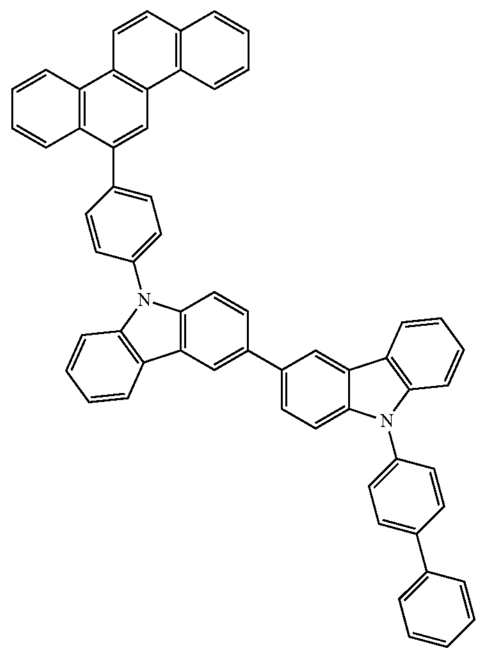
N
N
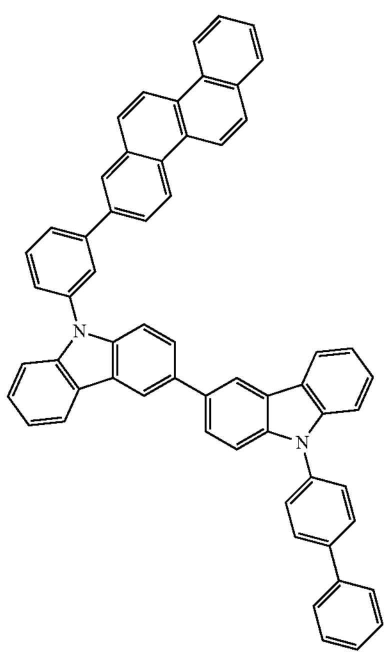
N
N
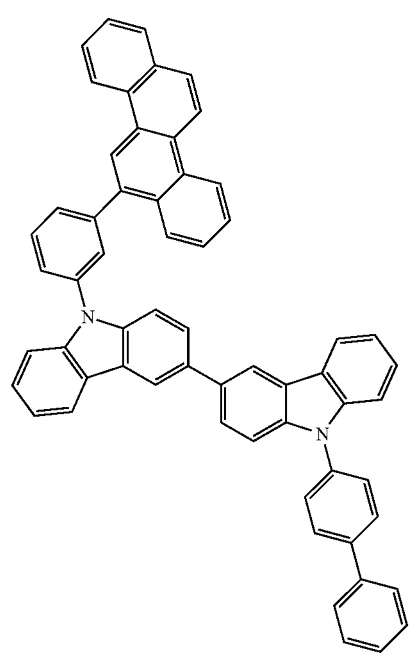
N
N

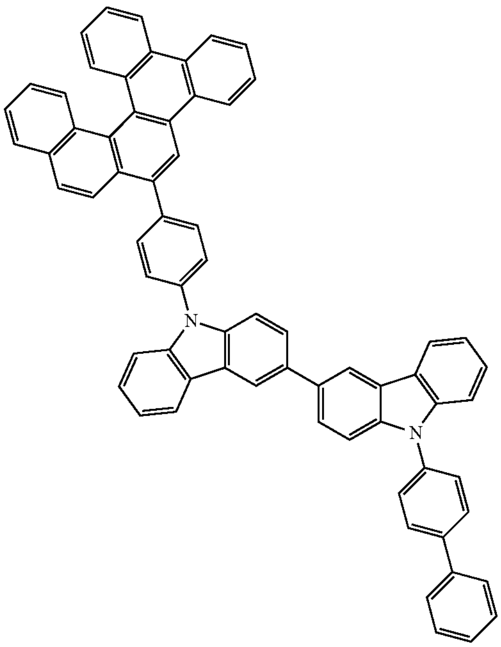
N
N
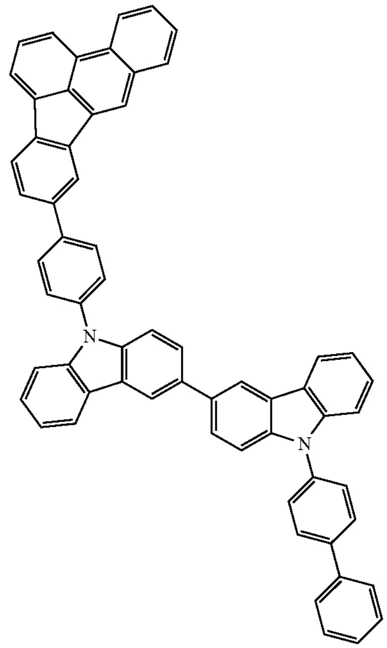
N
N
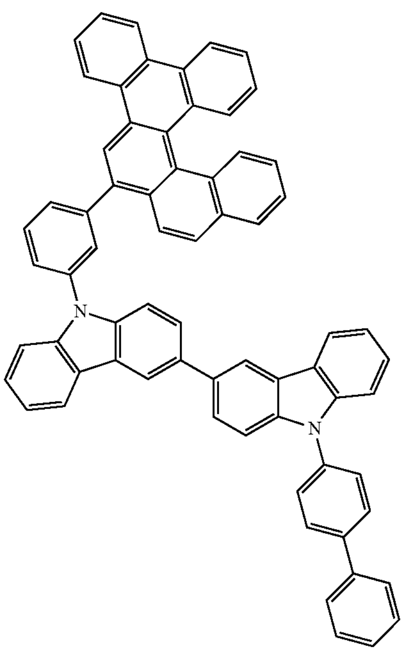
N
N
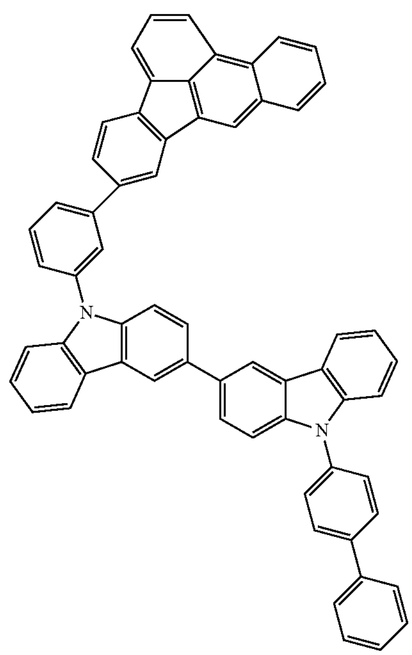
N
N

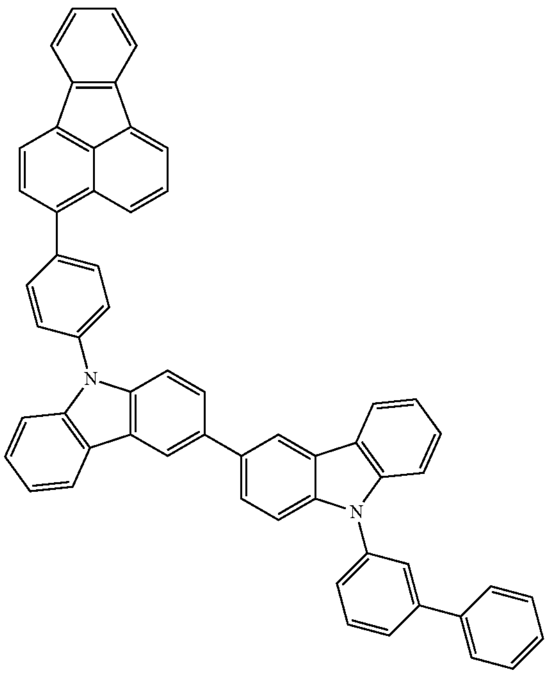
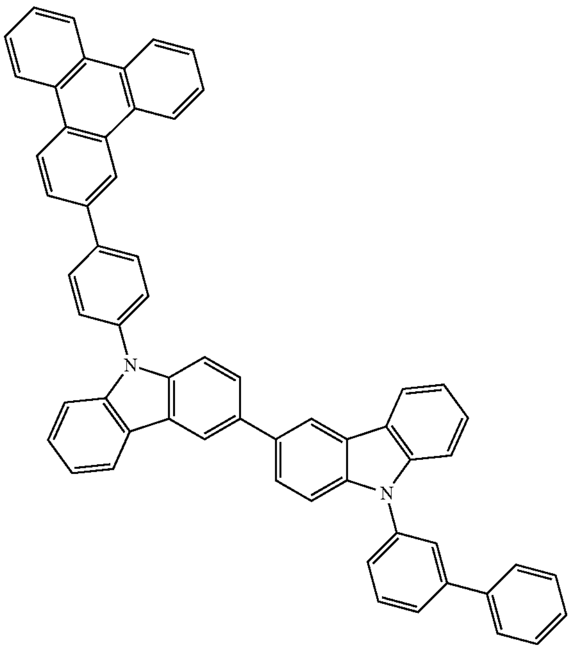
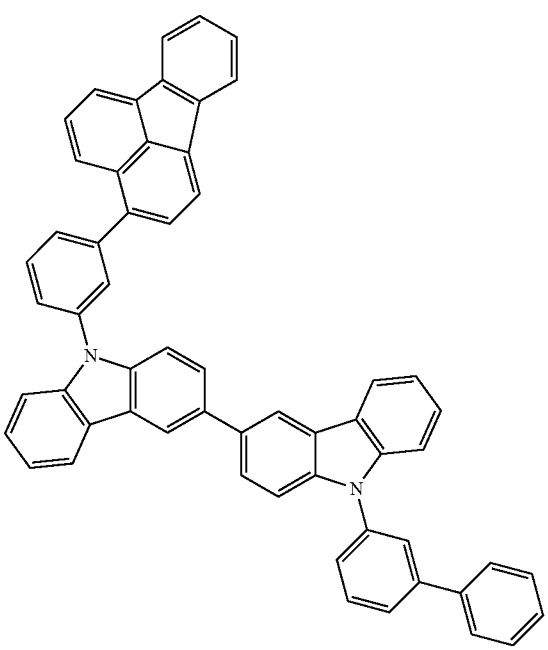
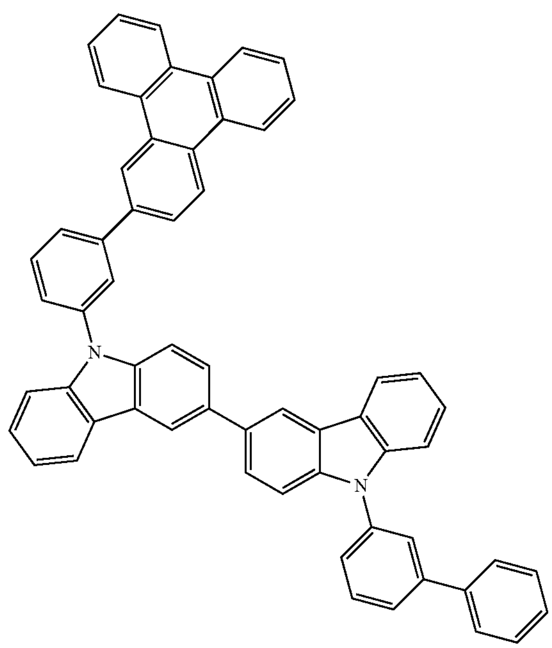

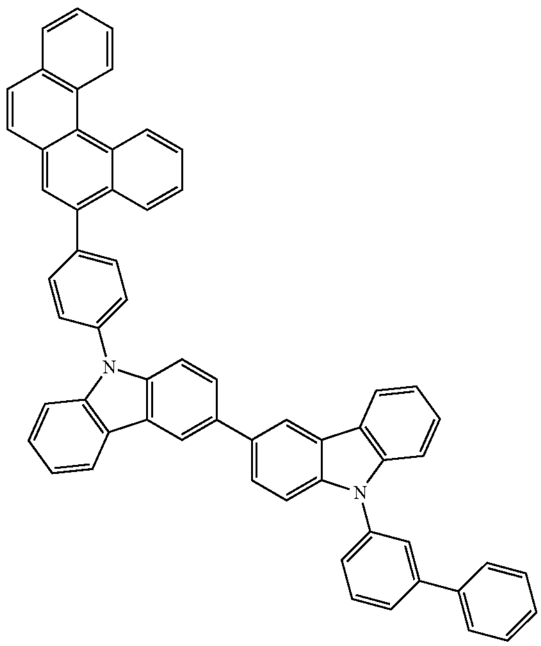
N
N
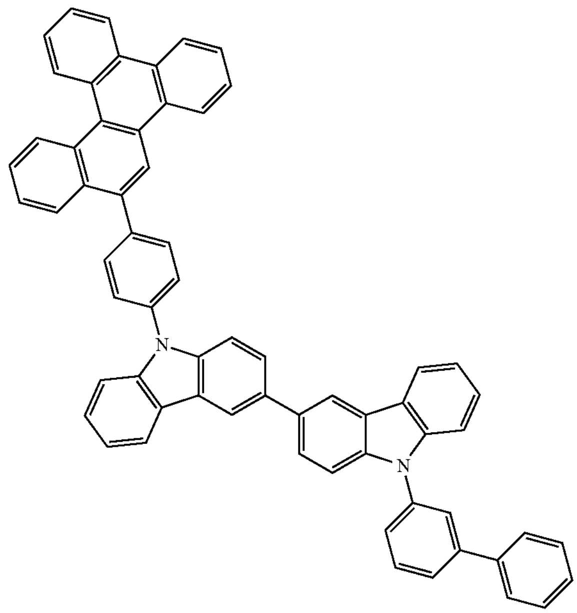
N
N
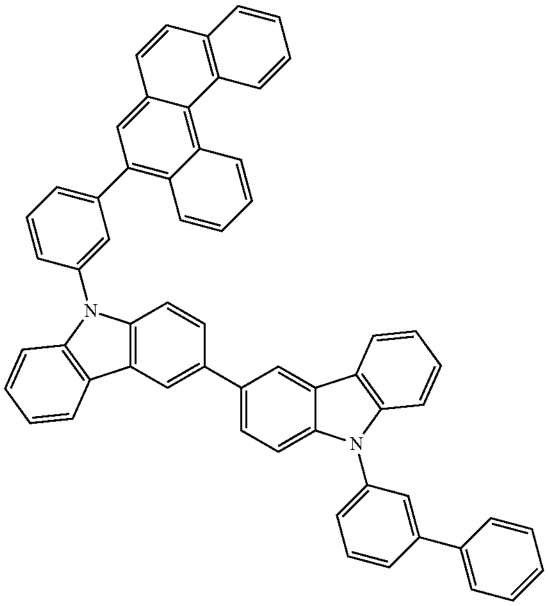
N
N
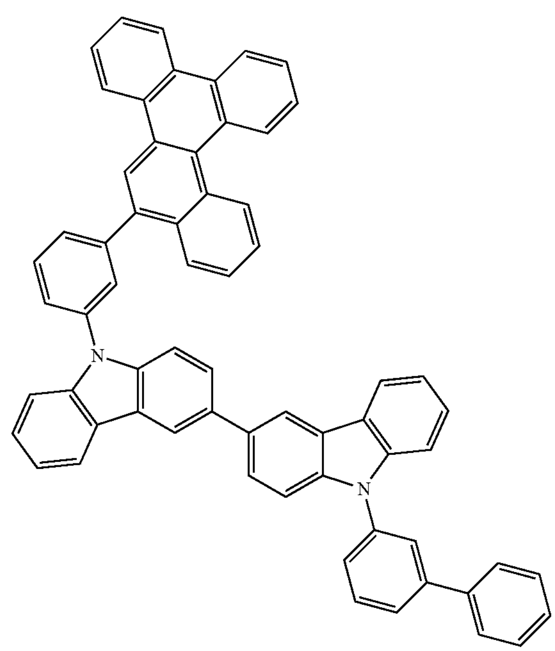
N
N

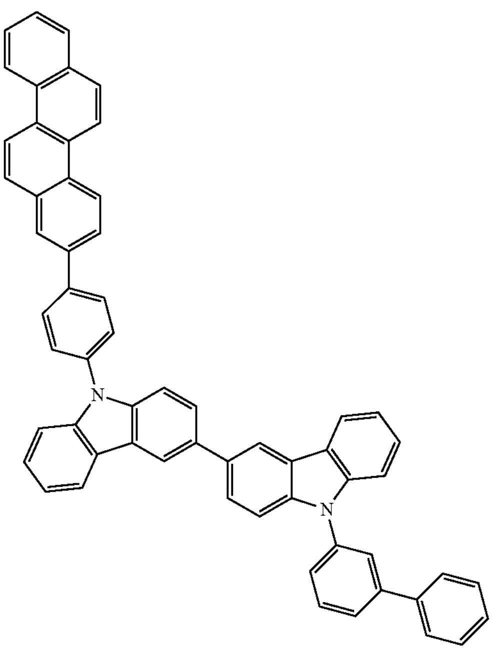
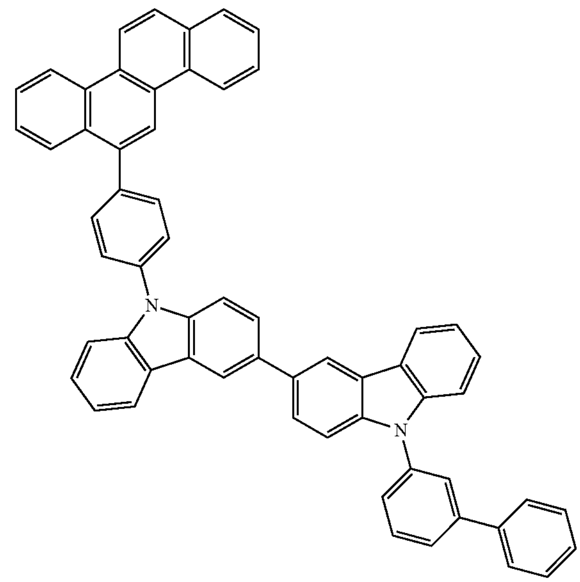
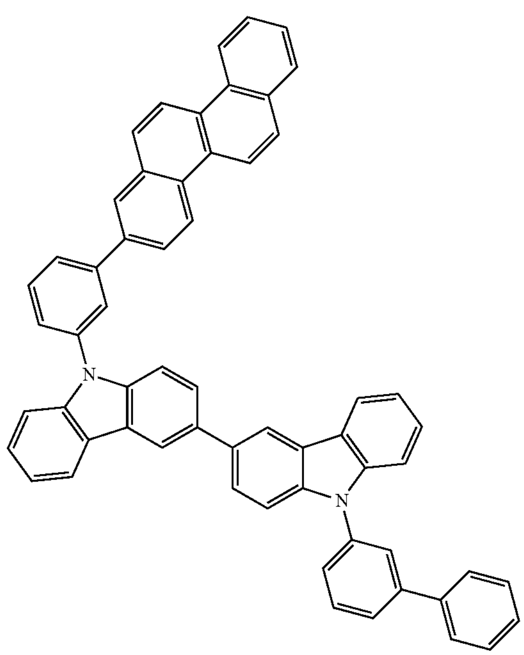
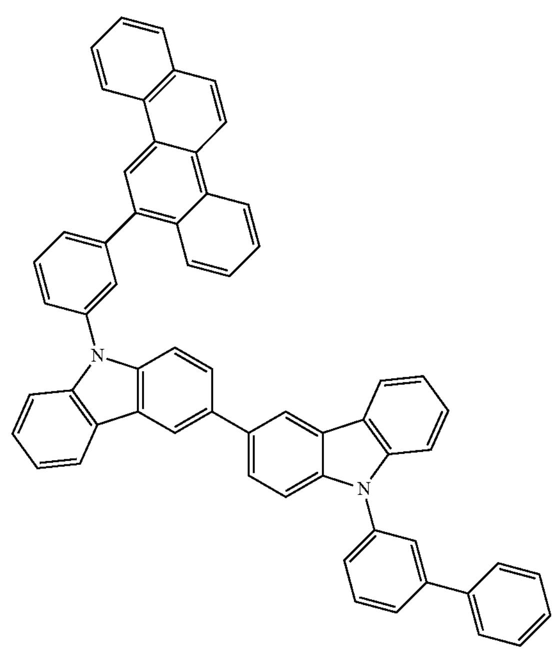

-continued
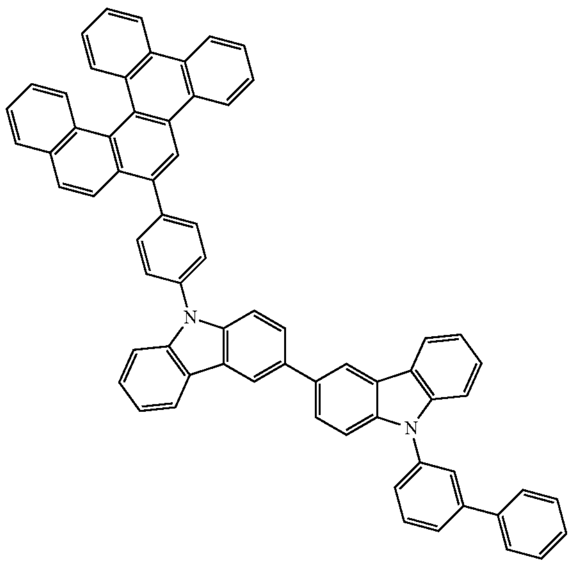
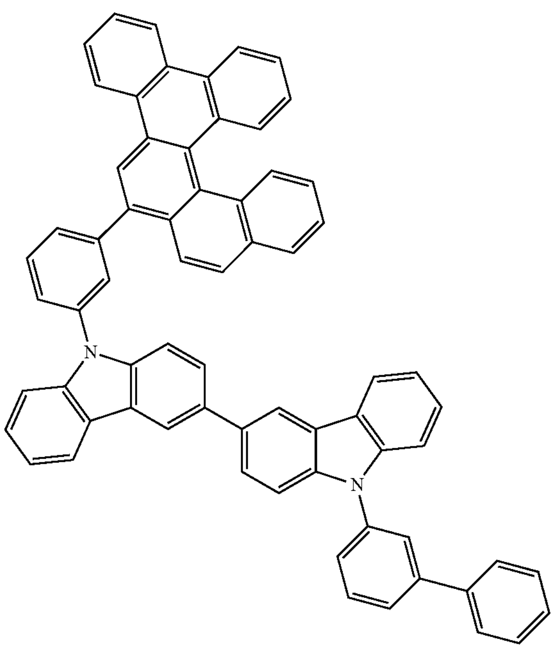
-continued
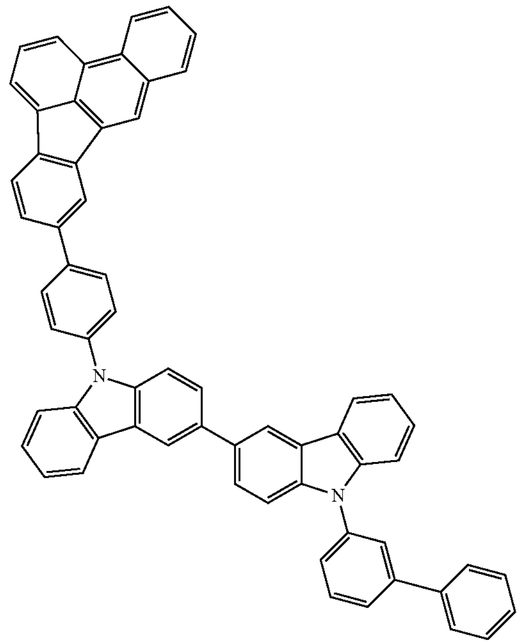
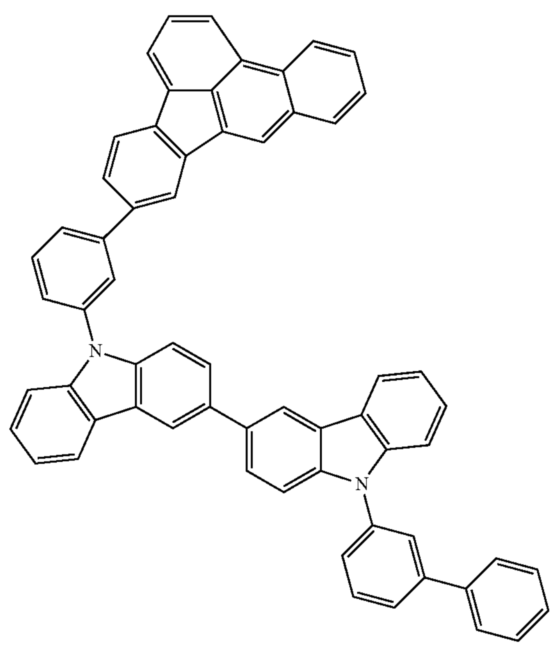

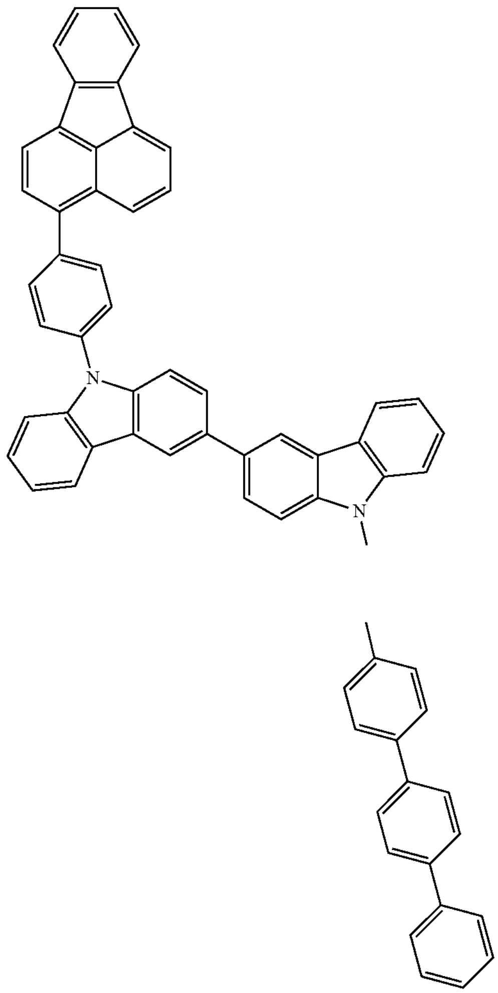
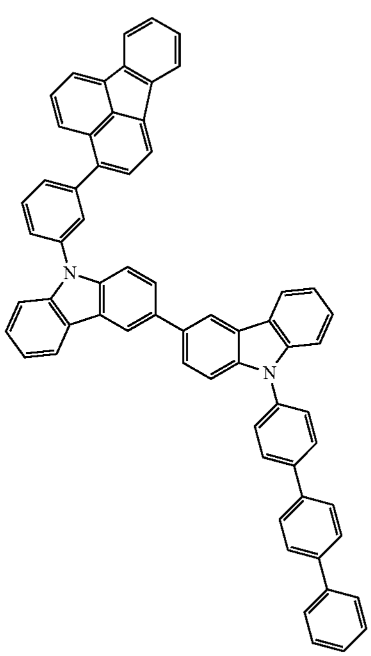
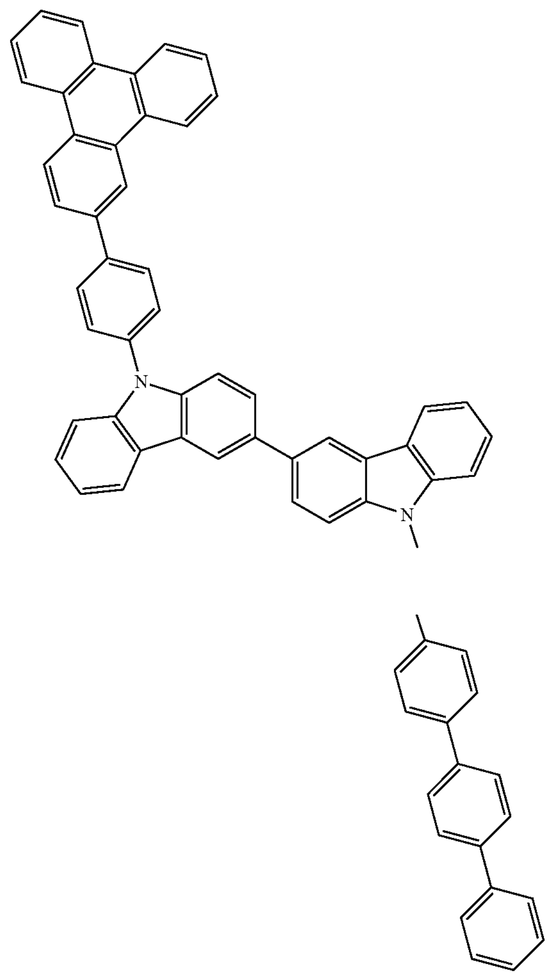
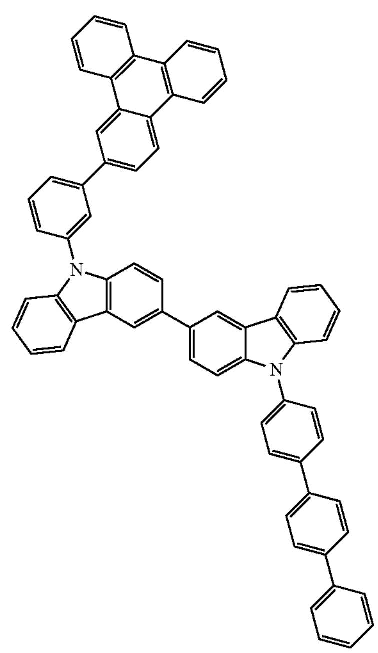

-continued
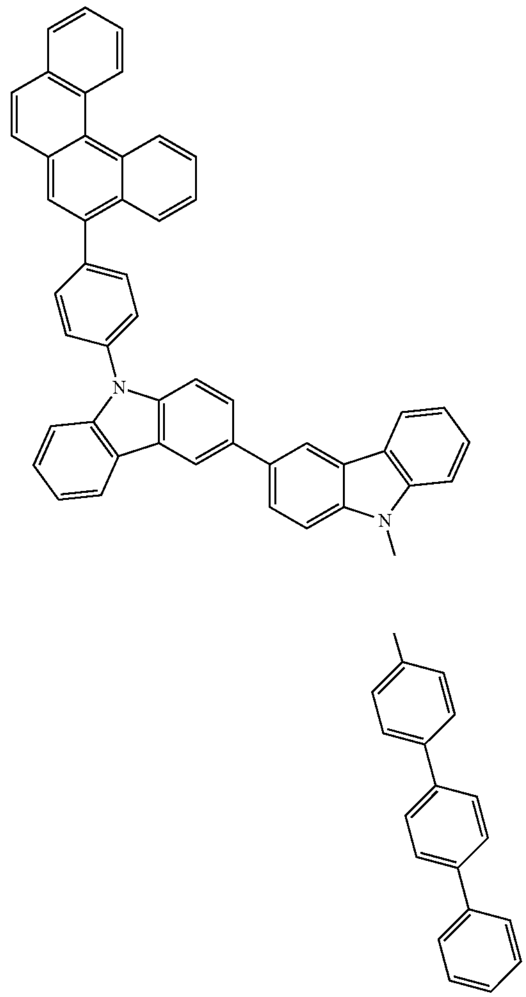
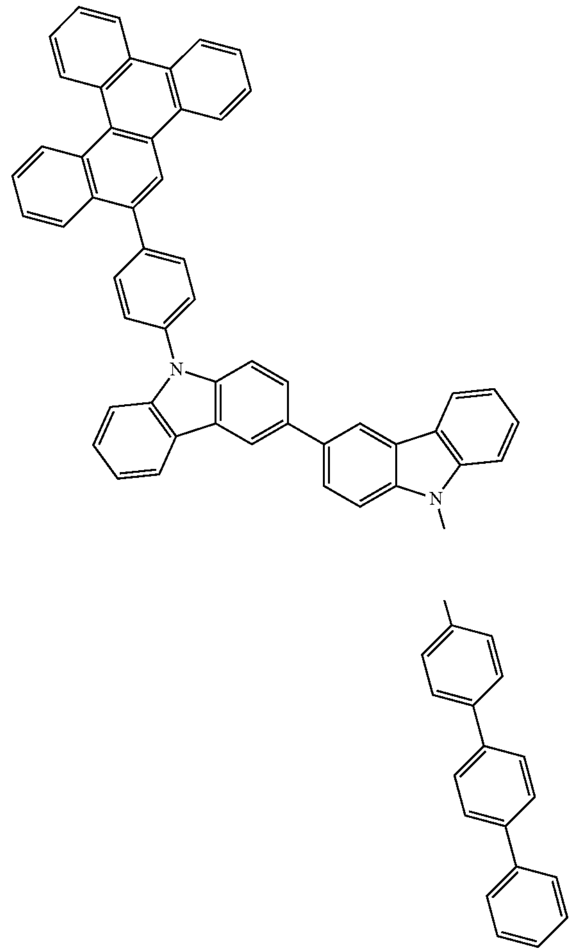
-continued
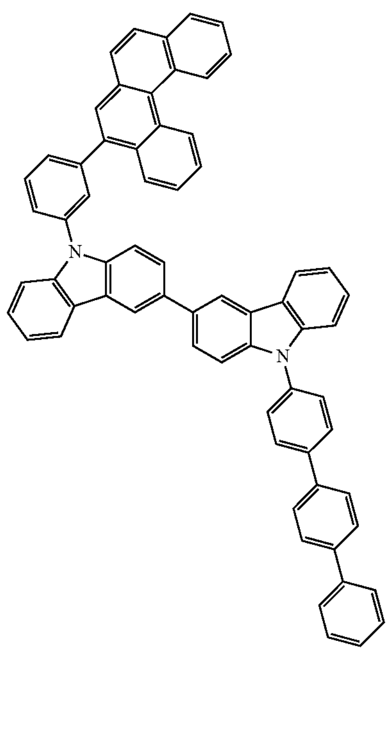
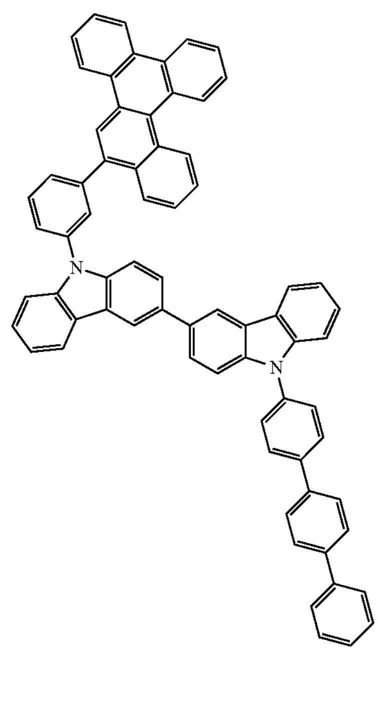

-continued
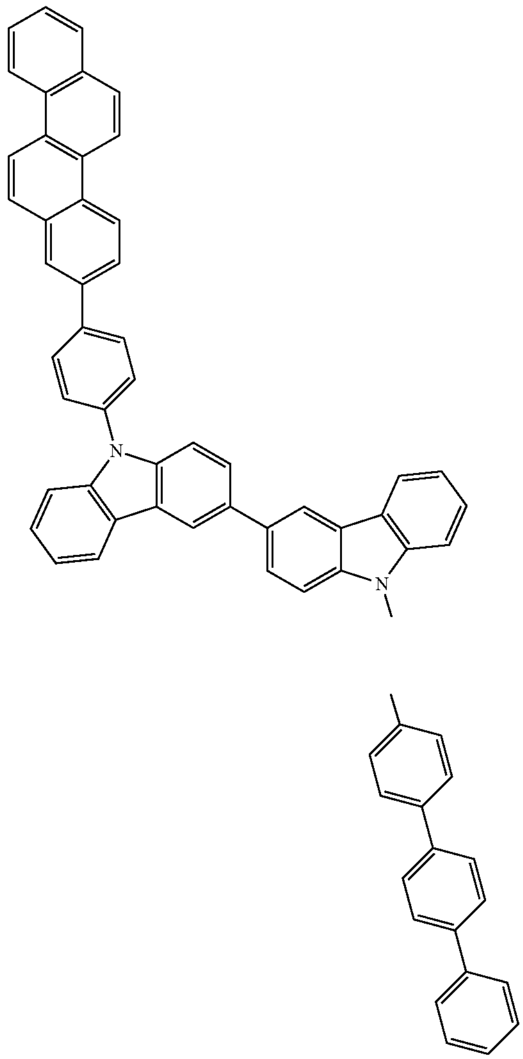
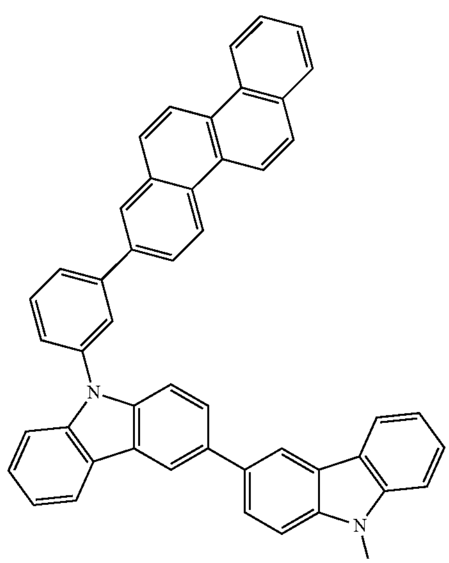
-continued
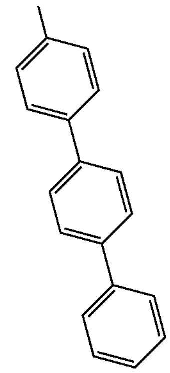
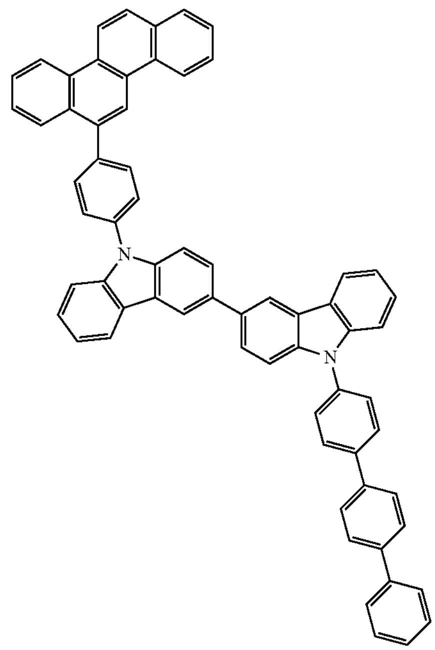
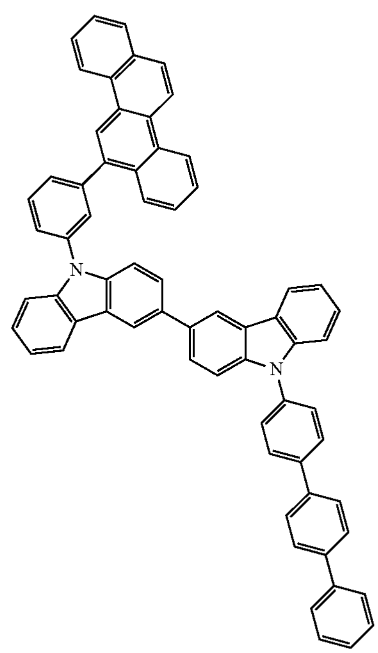

-continued
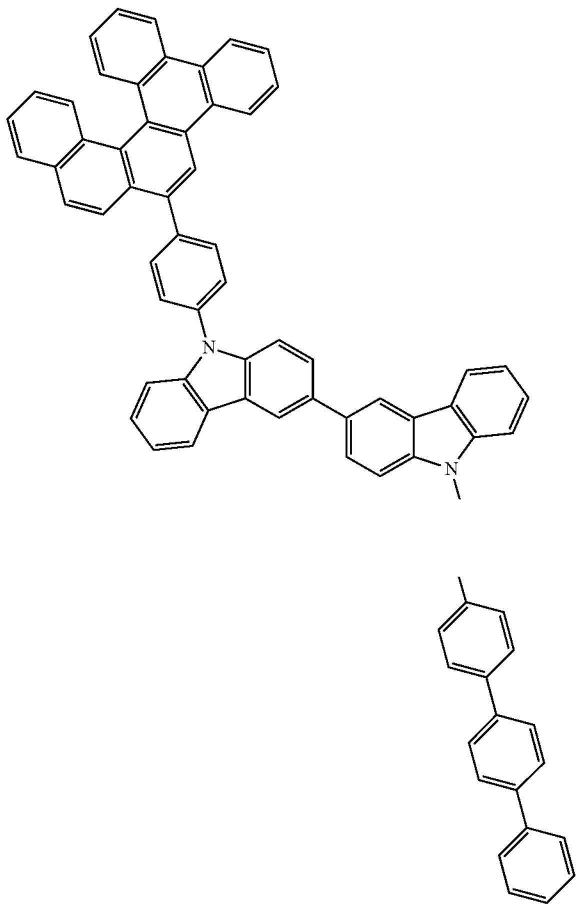
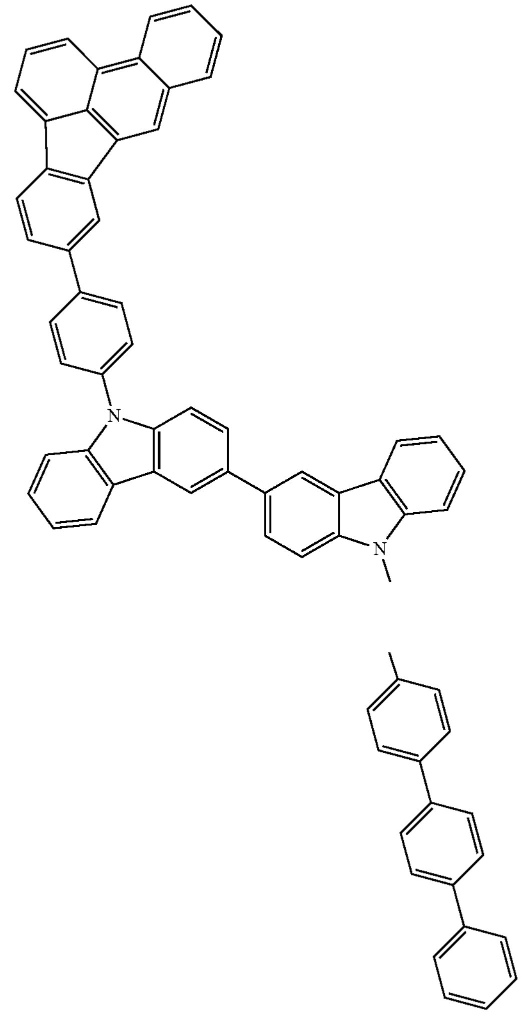
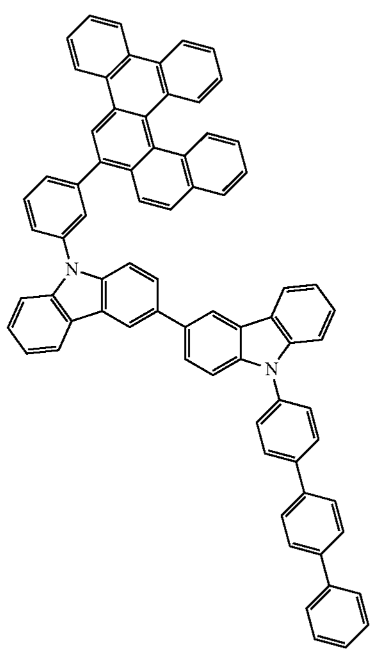
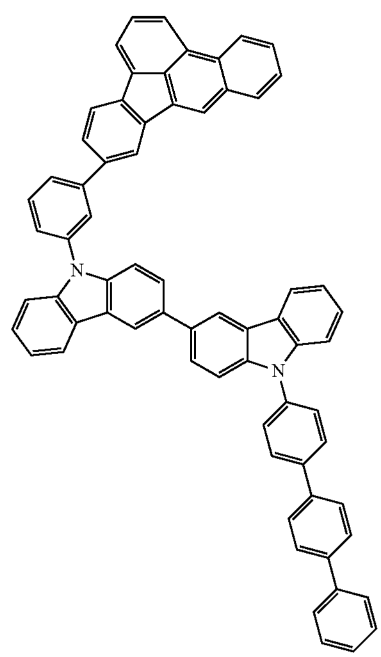

-continued
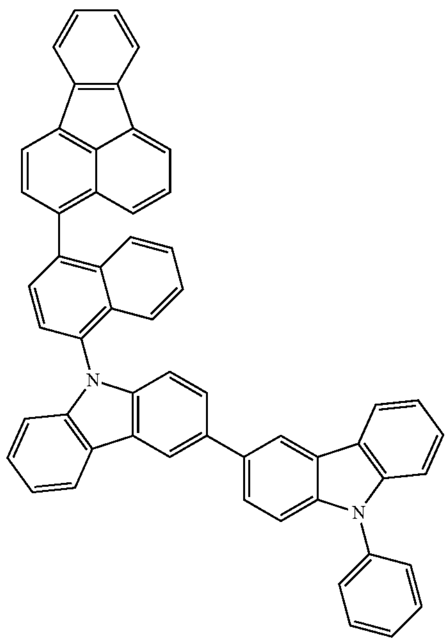
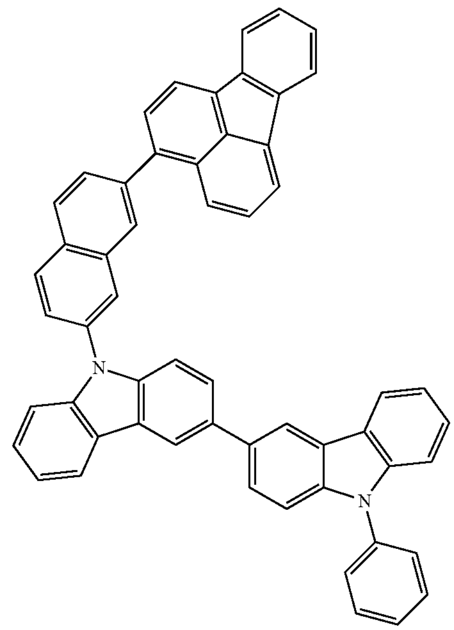
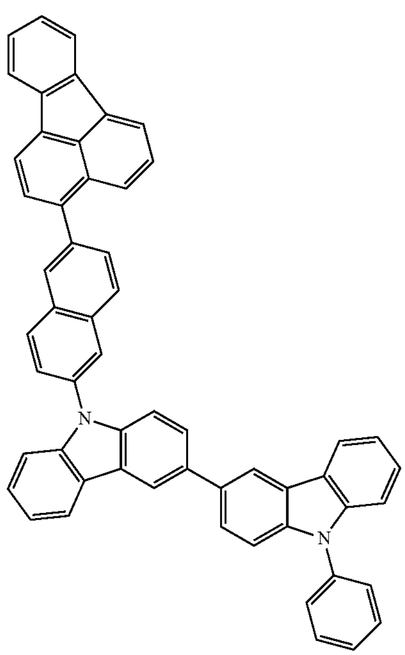
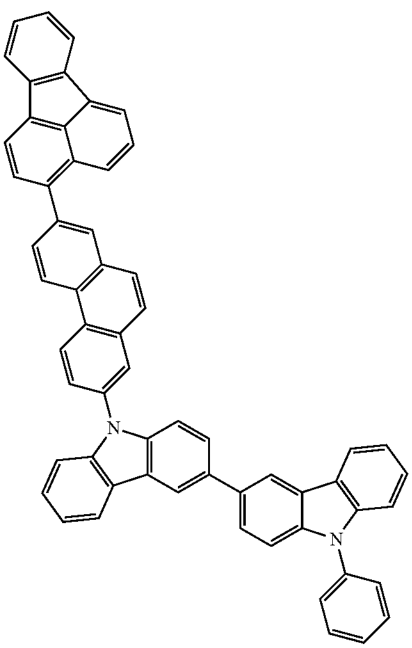

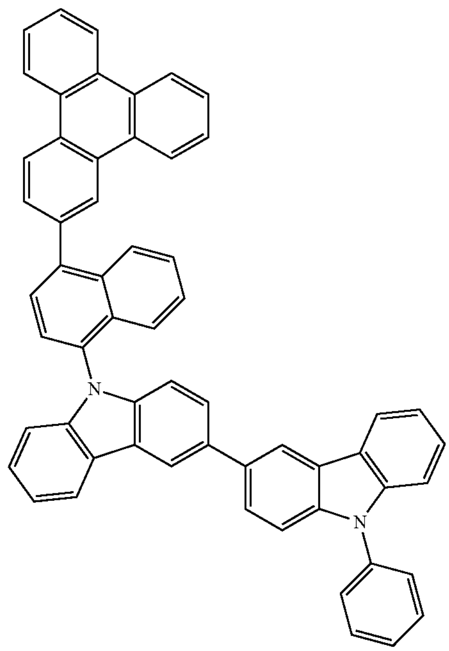
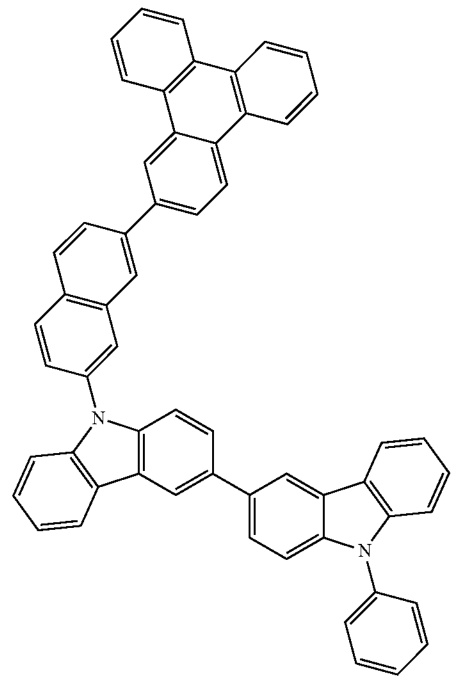
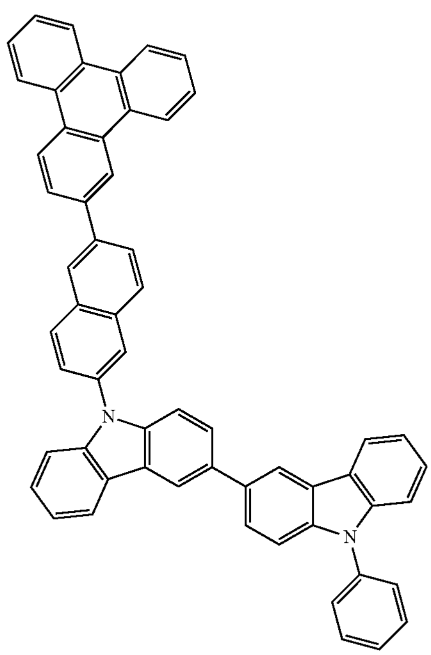
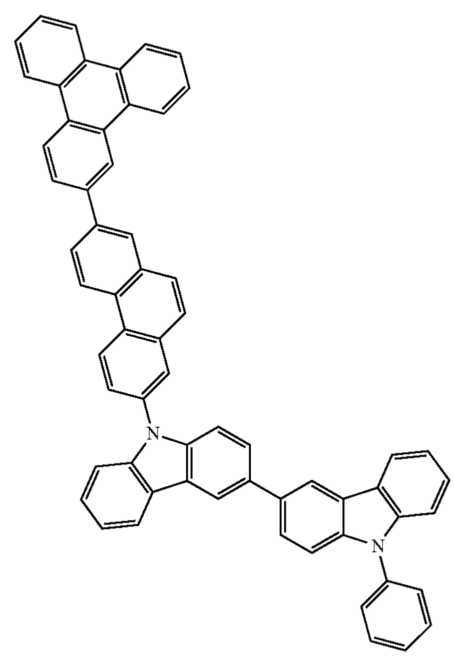

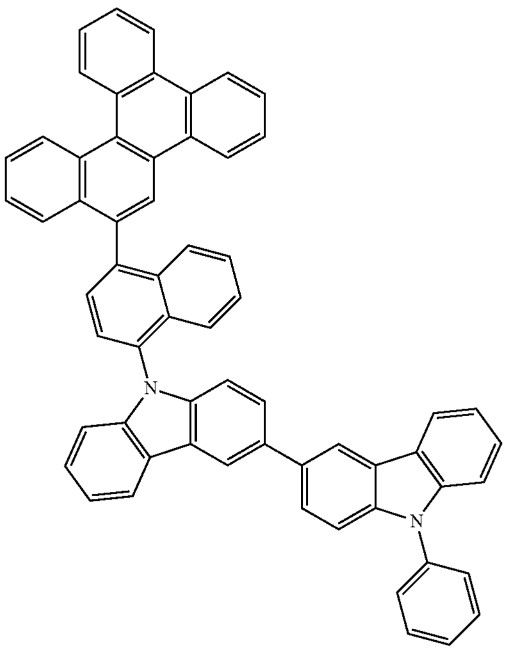
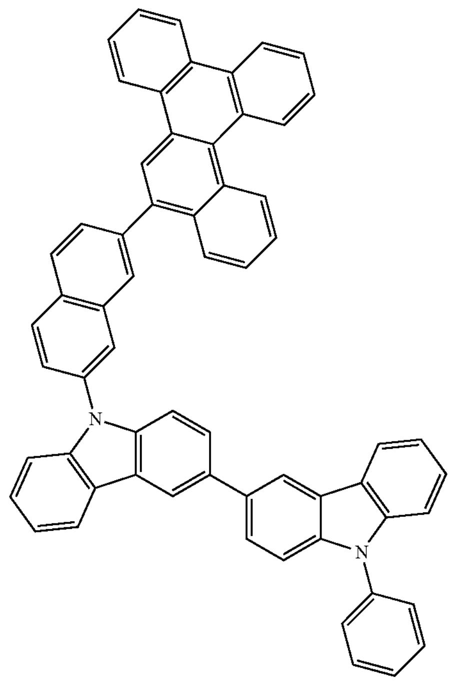
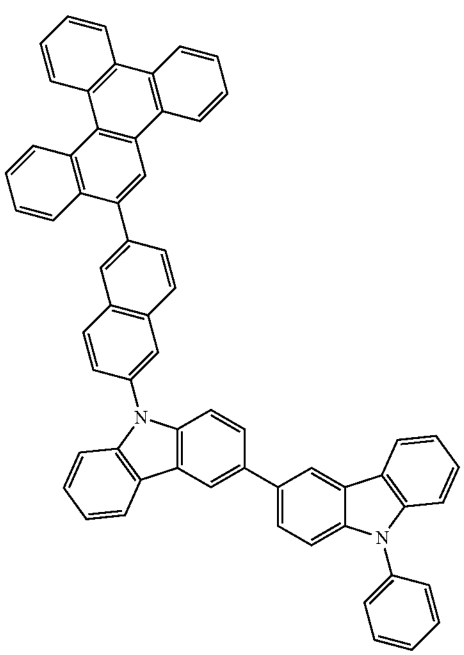
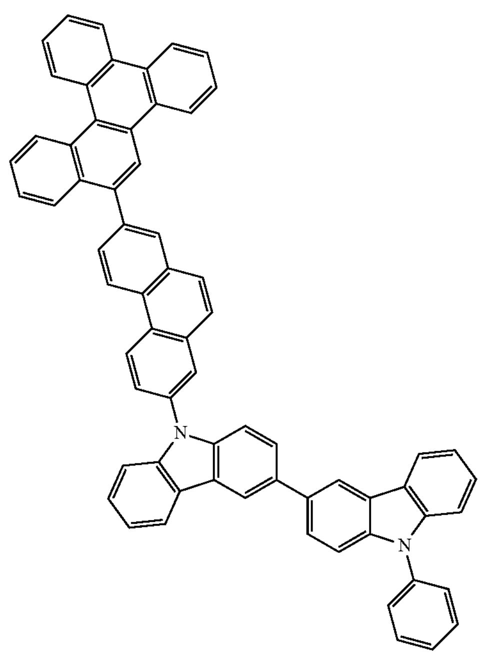
N
N

-continued
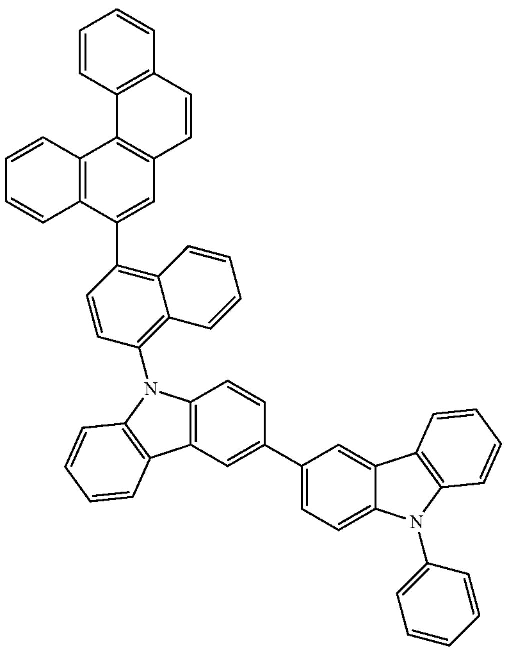
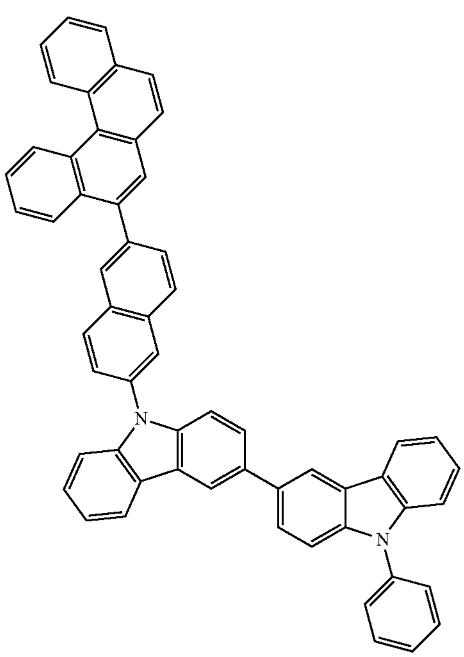
-continued
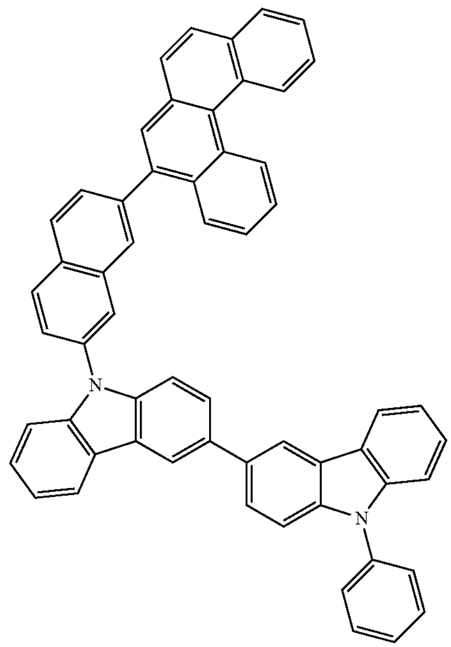
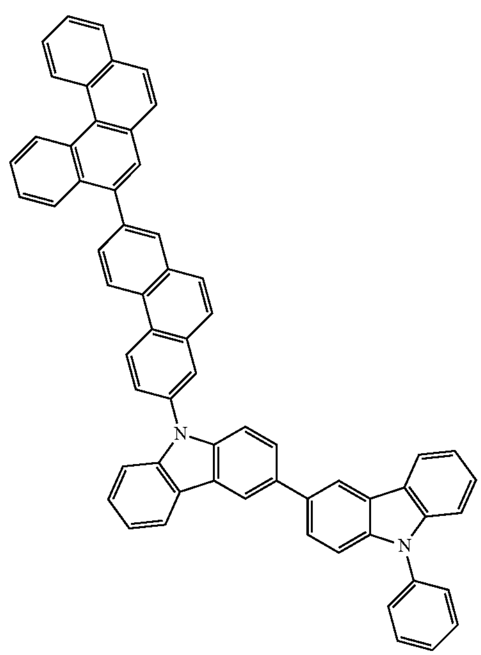

-continued
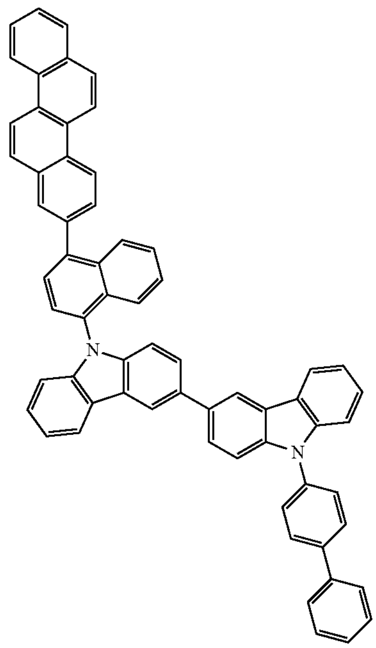
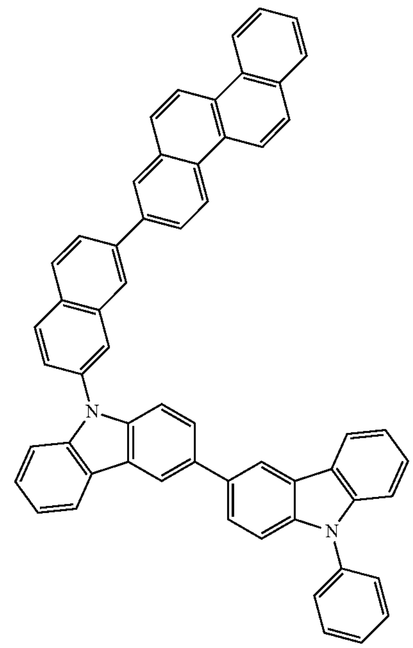
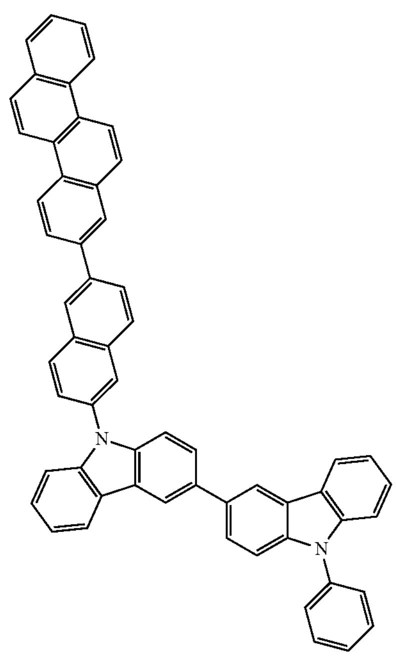
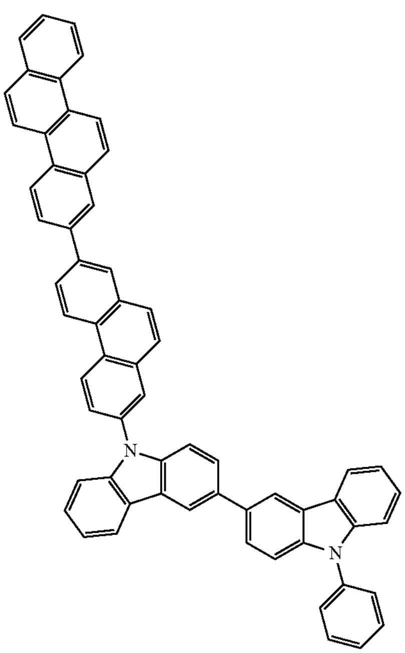

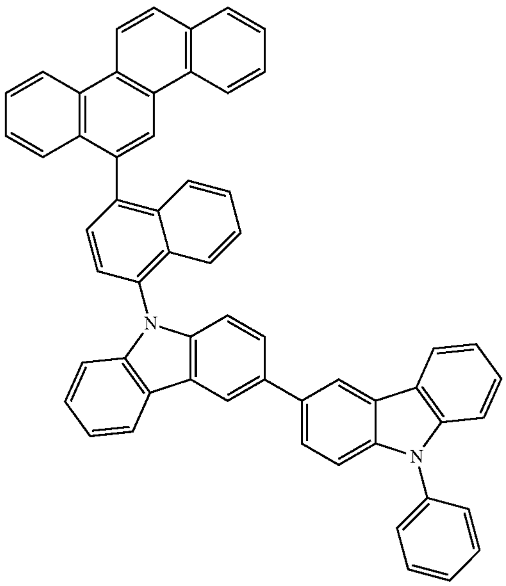
N
N
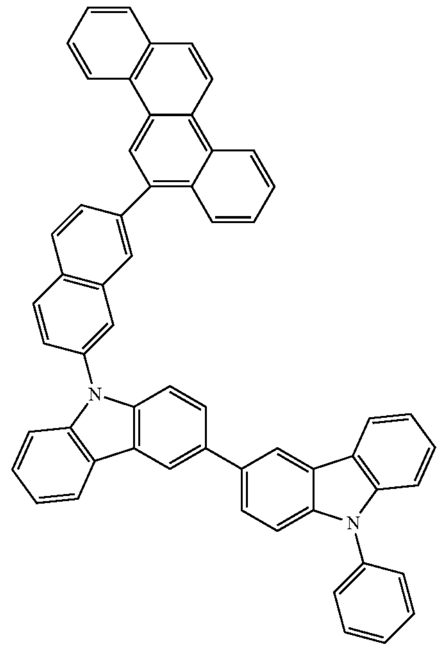
N
N
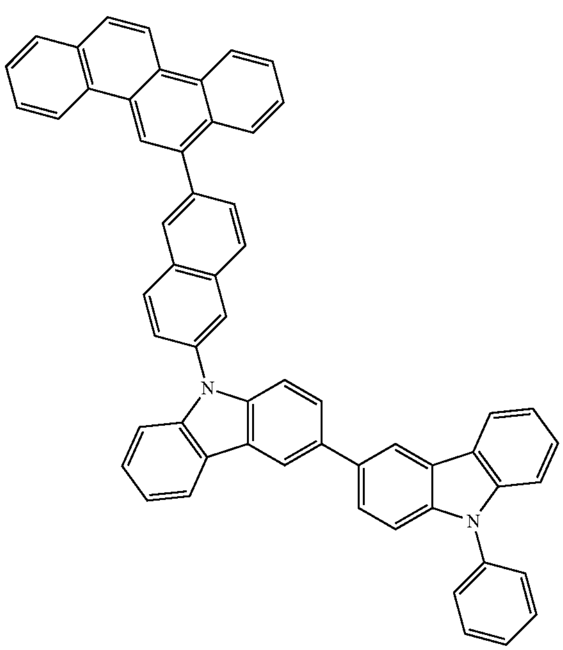
N
N
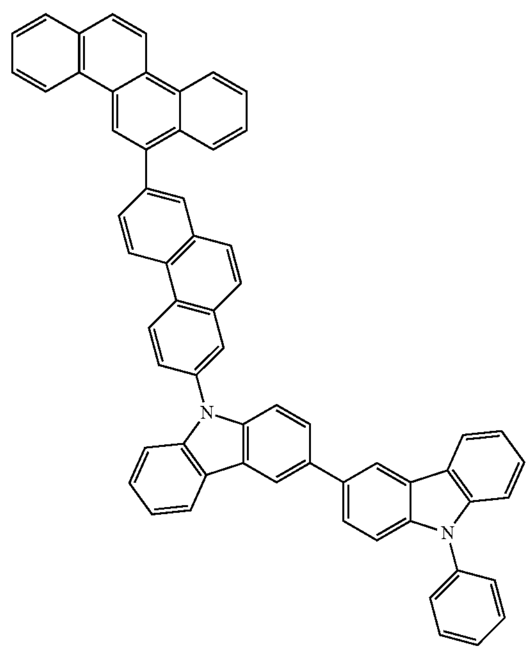
N
N

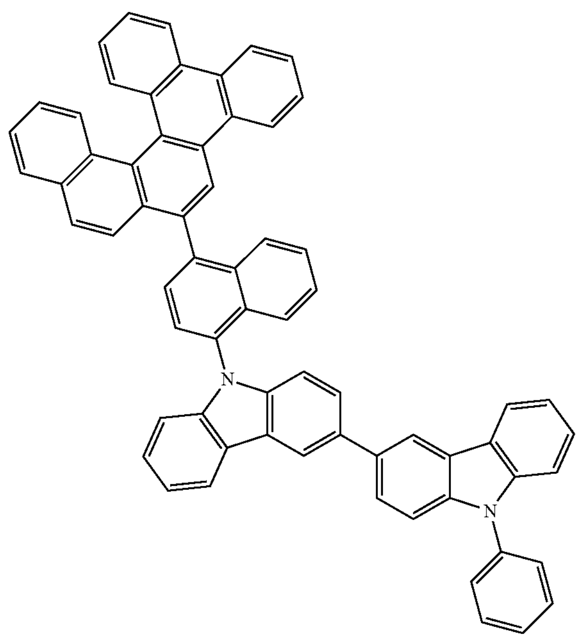
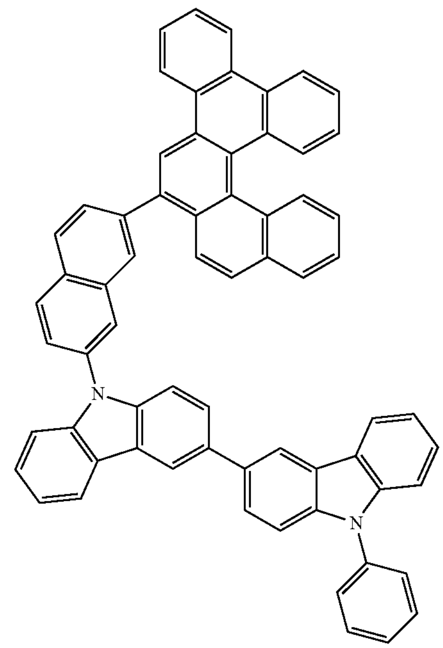
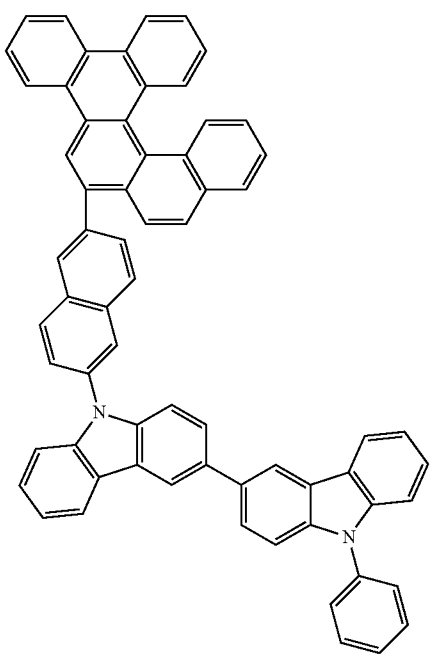
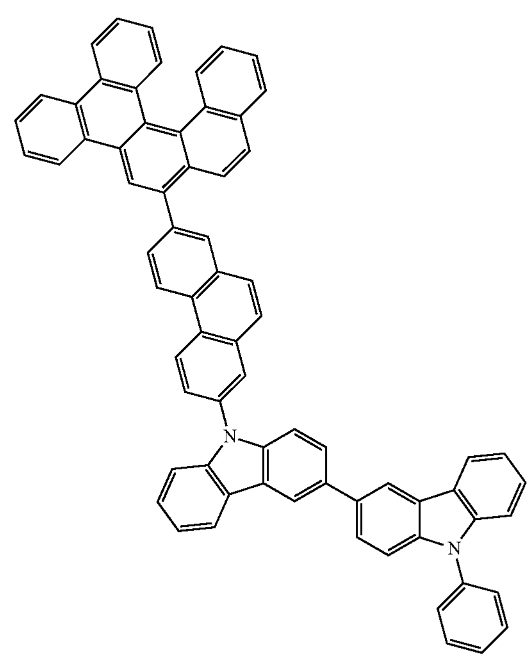

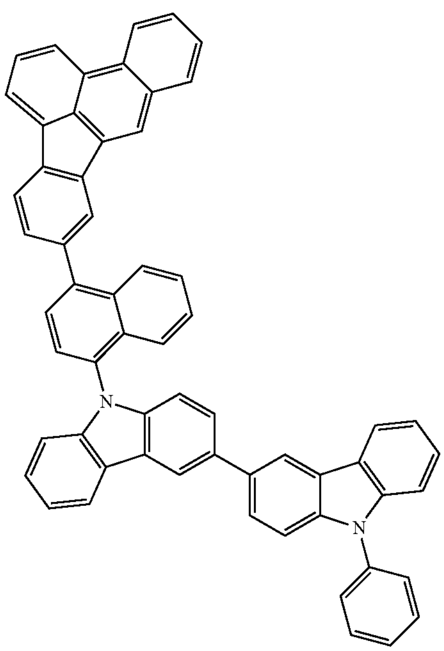
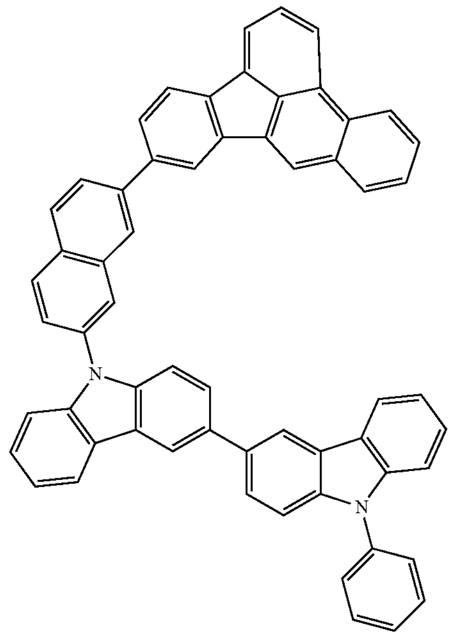
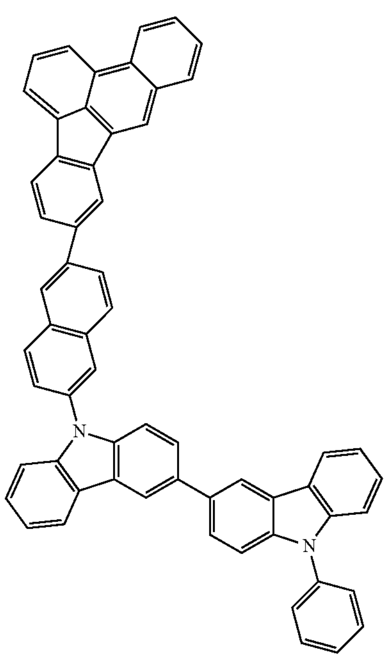
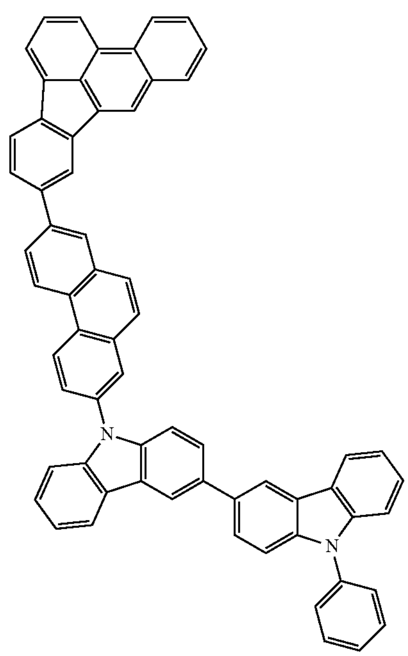

-continued
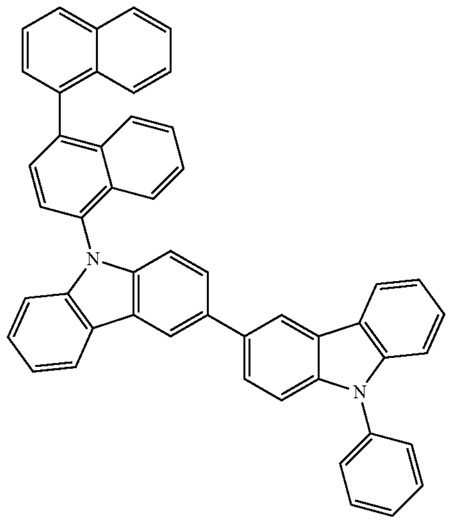
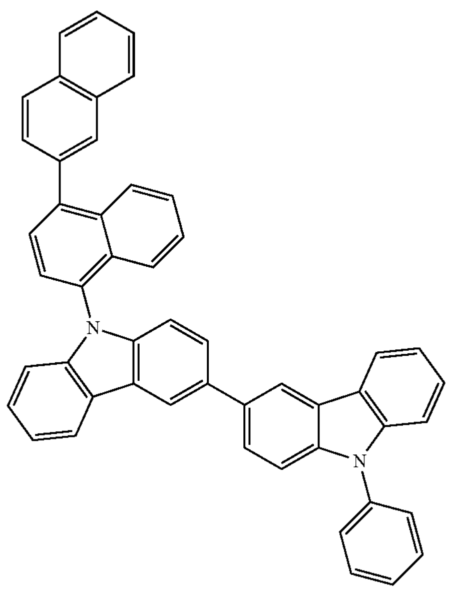
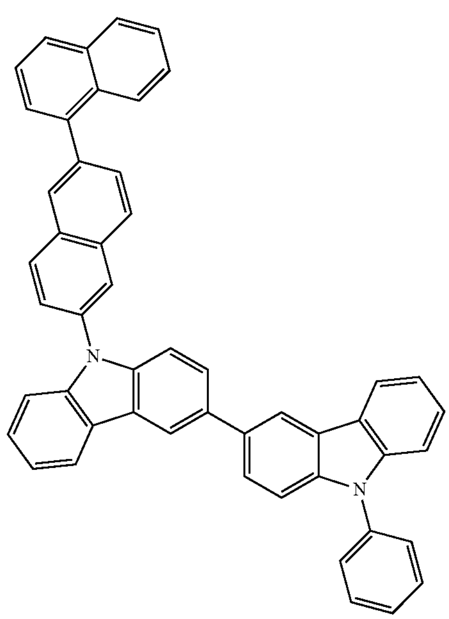
-continued
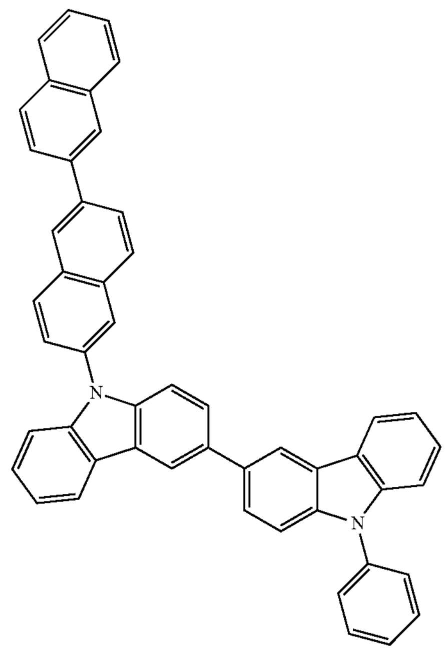
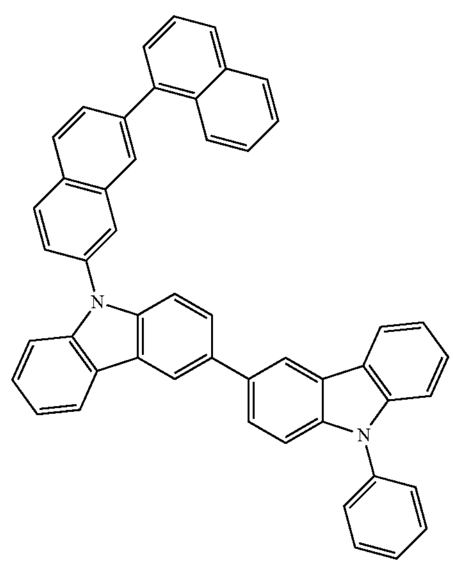

-continued
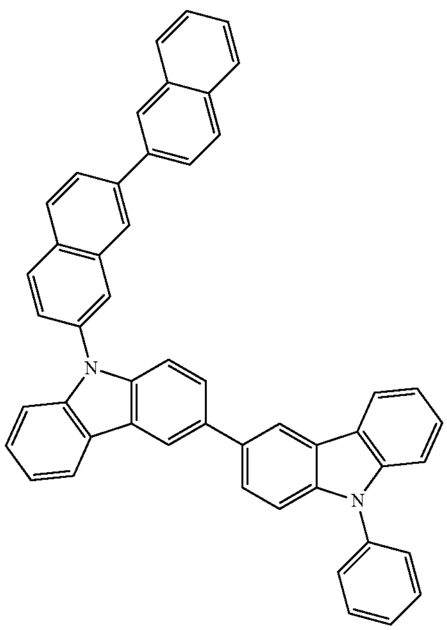
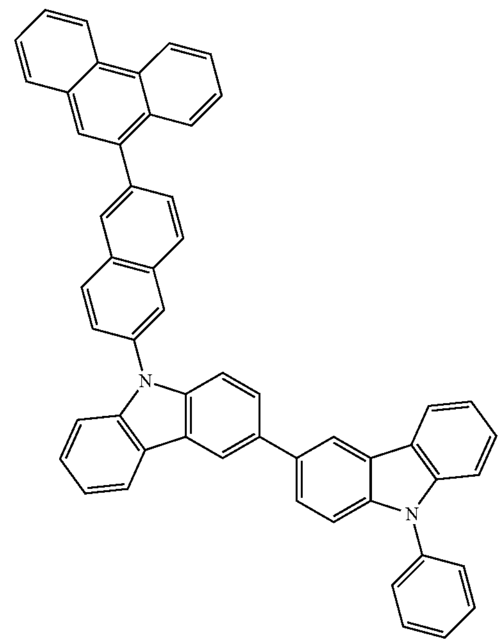
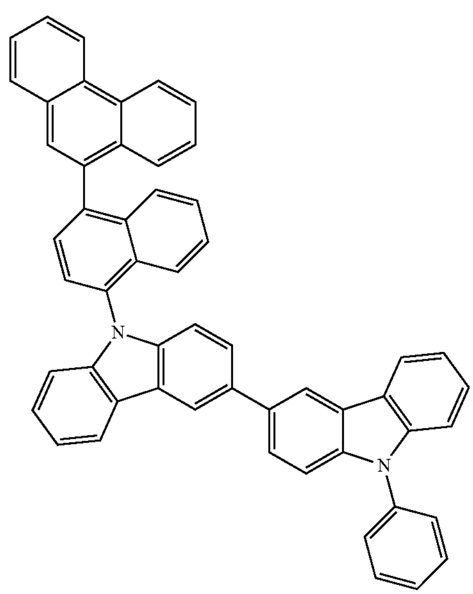
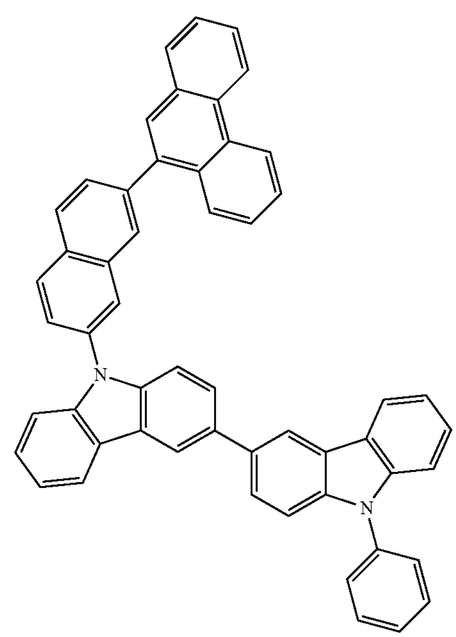
-continued

-continued
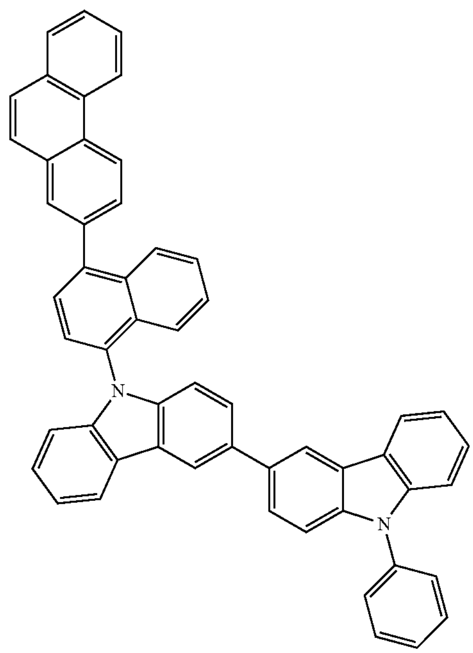
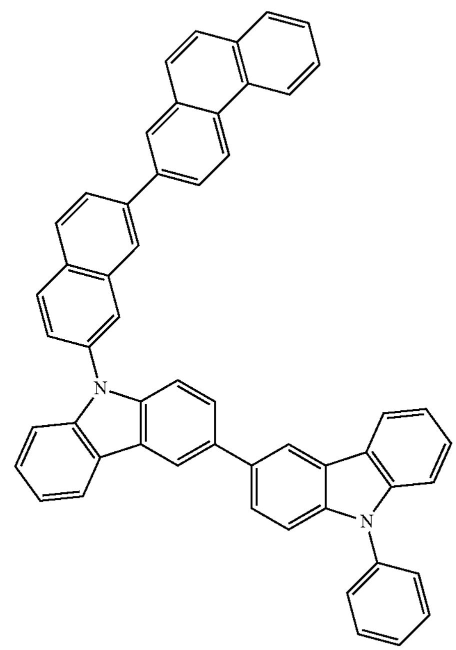
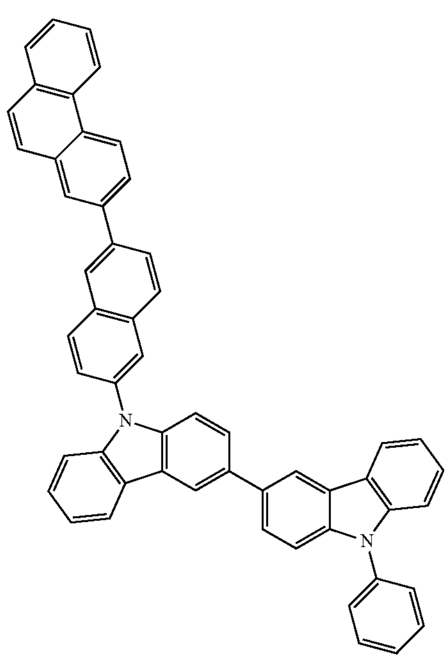
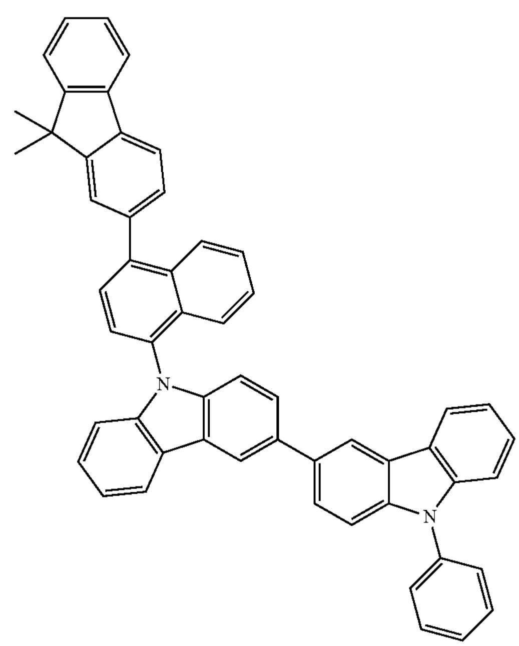

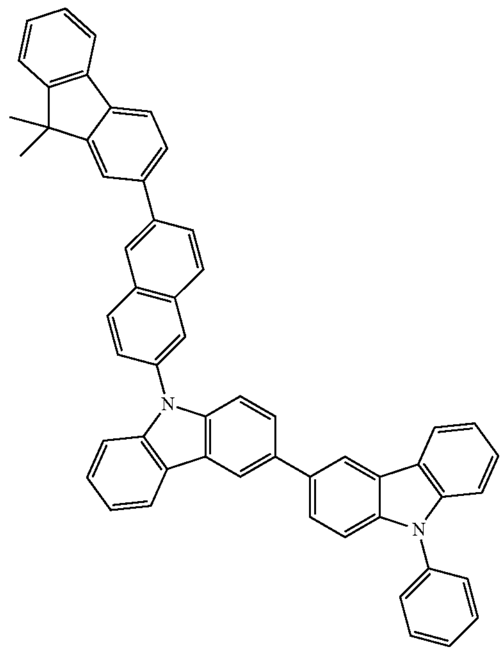
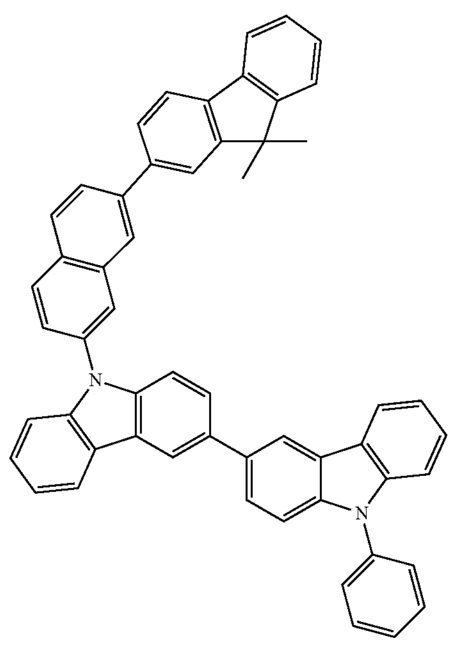
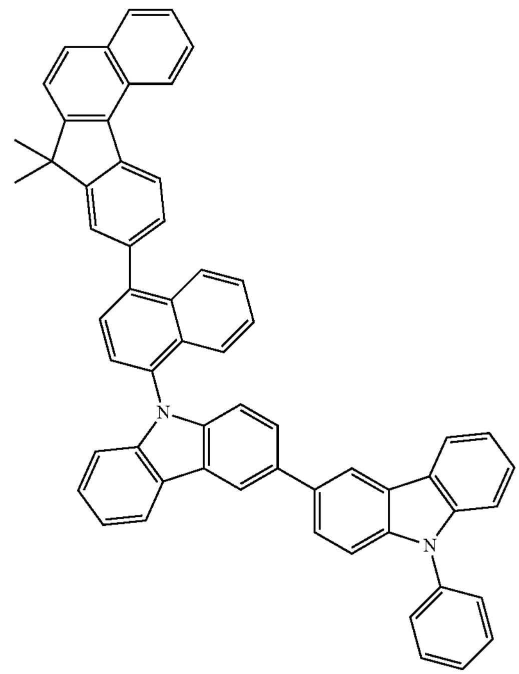
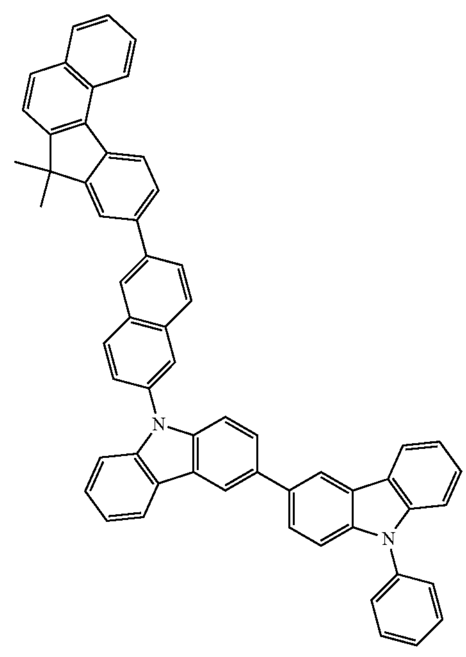

-continued
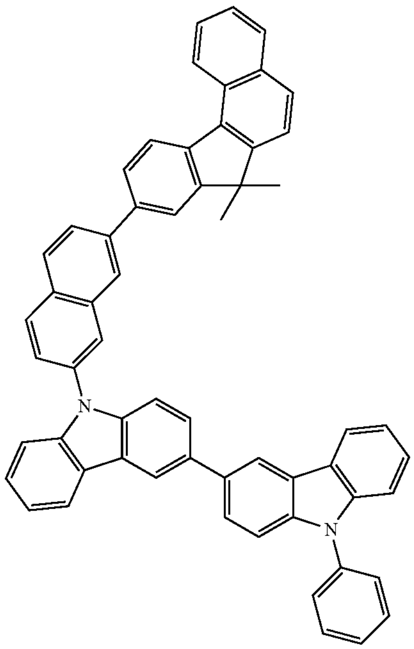
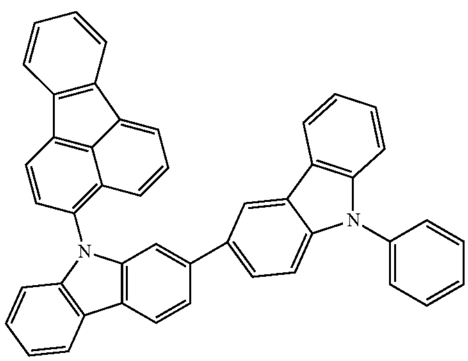
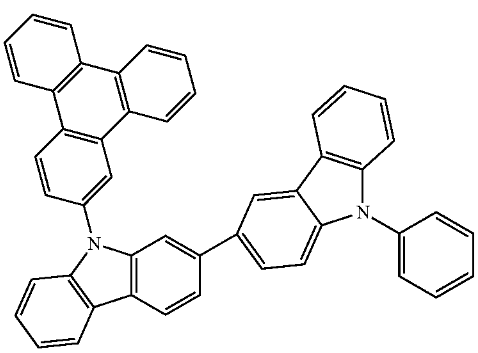
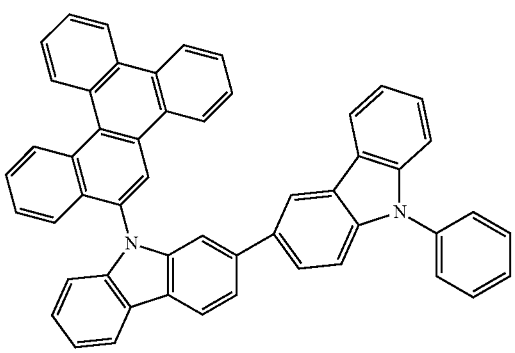
-continued
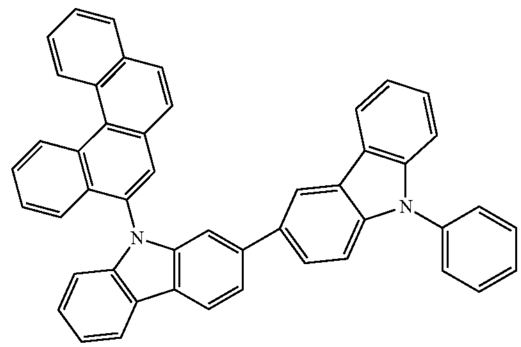
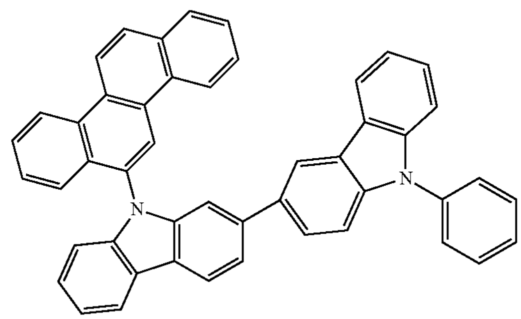
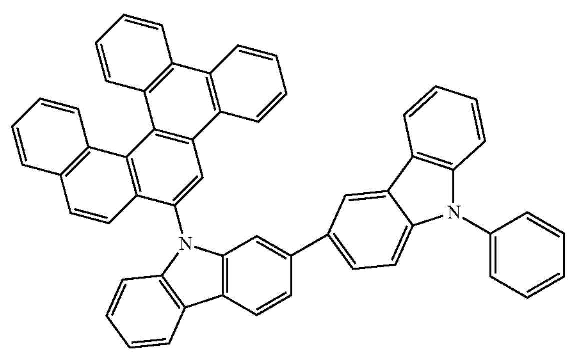
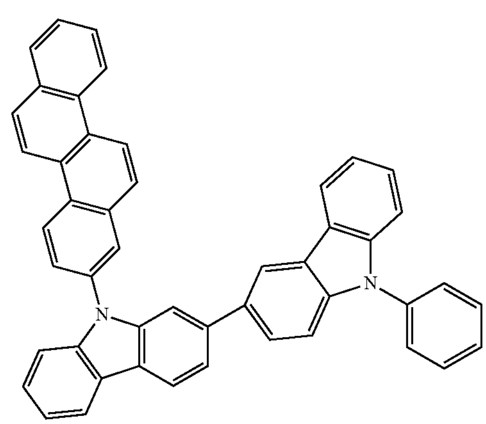

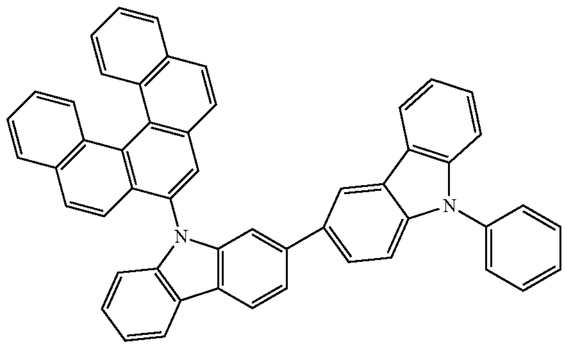
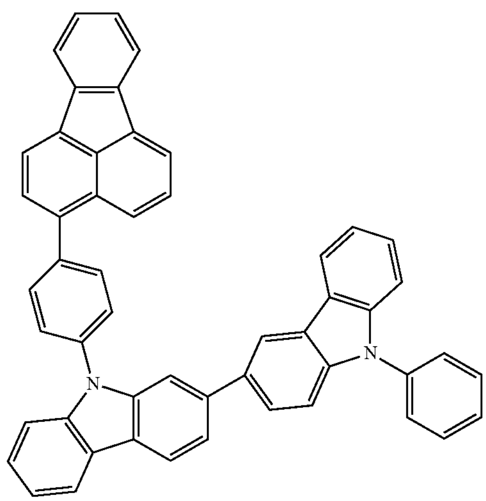
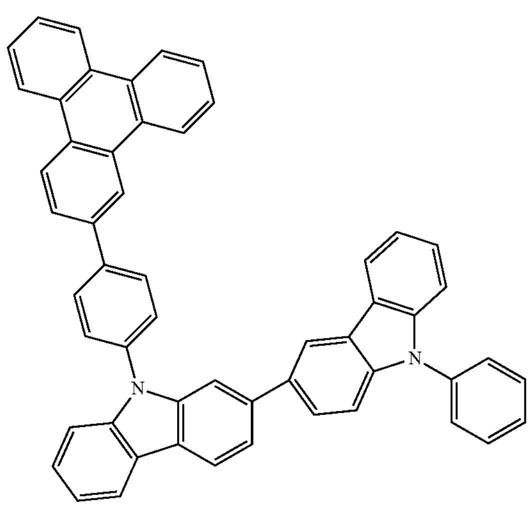
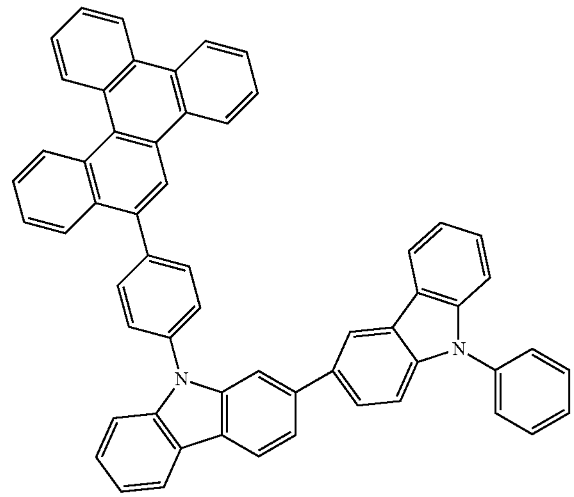
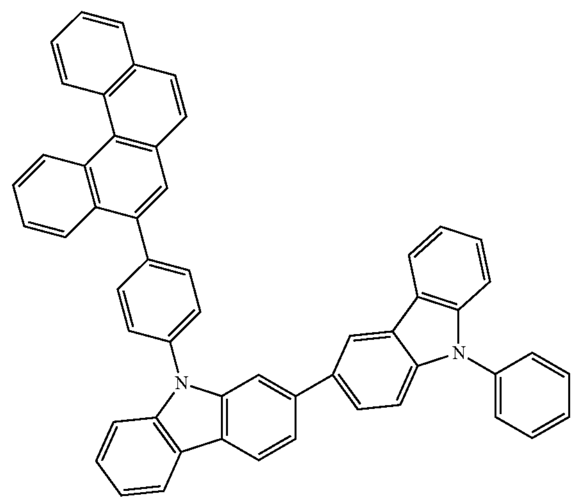
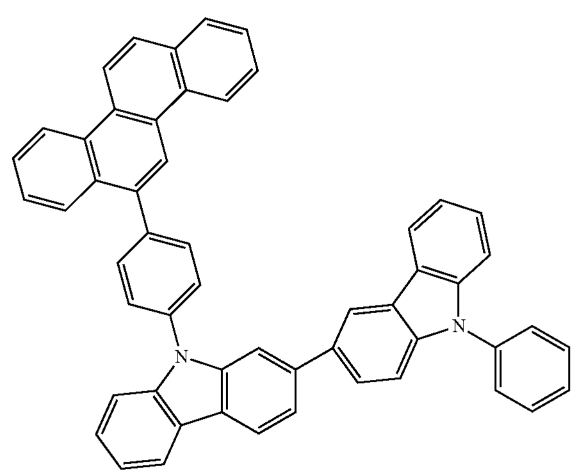

-continued
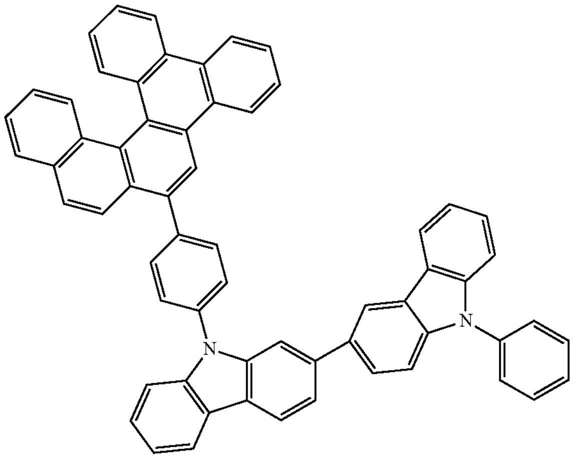
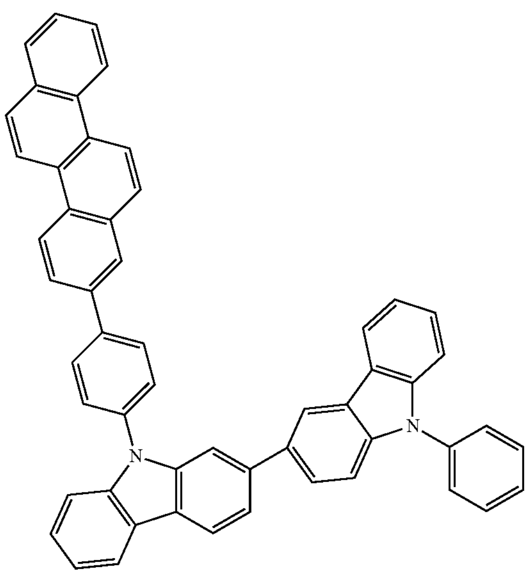
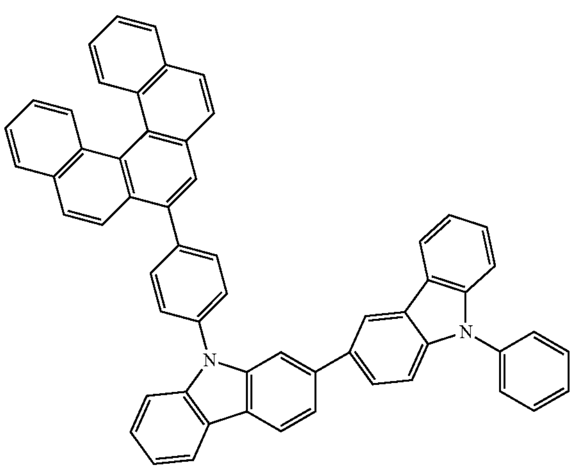
-continued
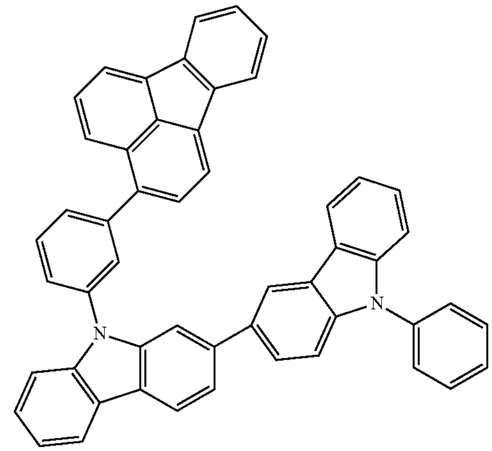
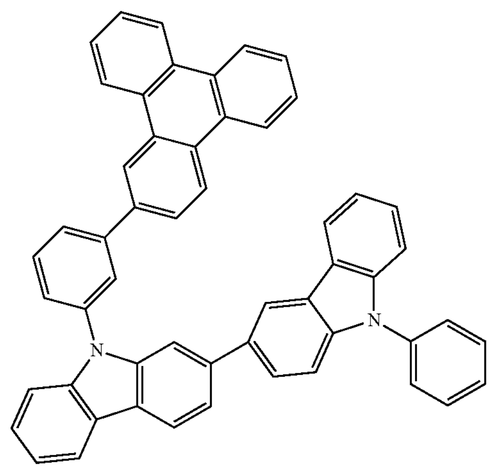
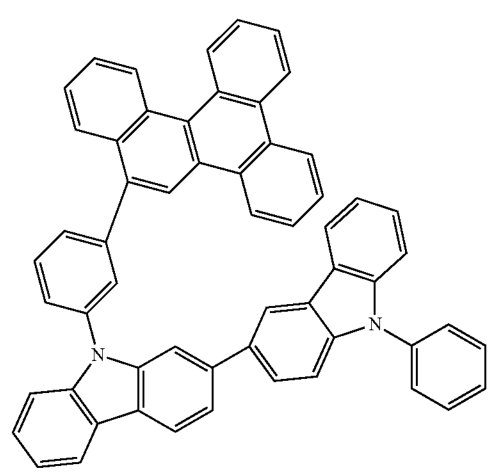

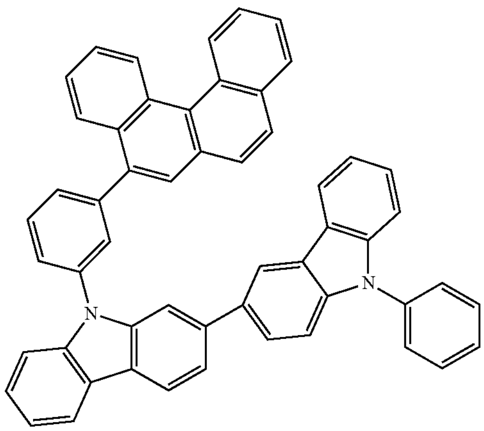
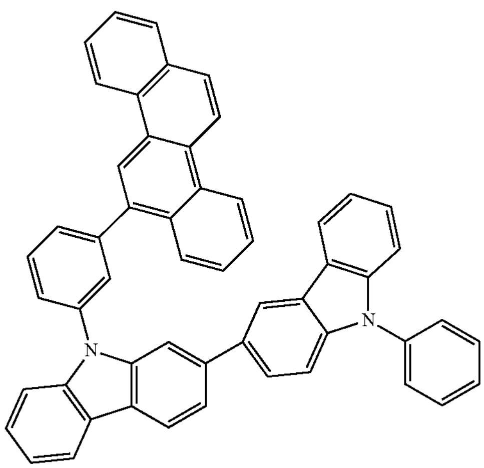
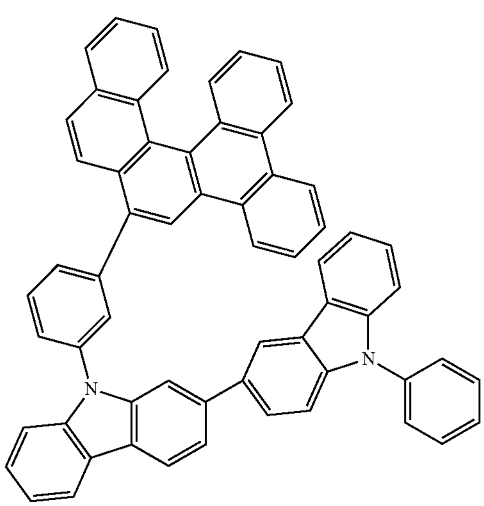
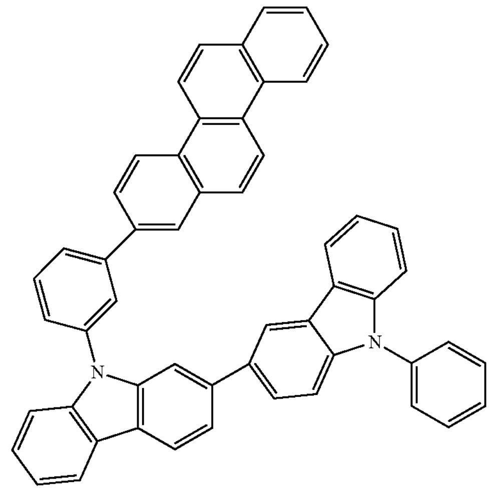
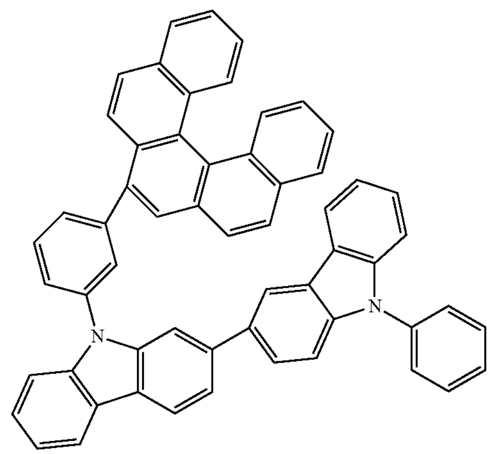
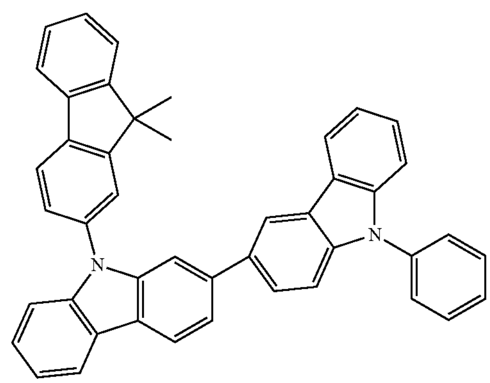
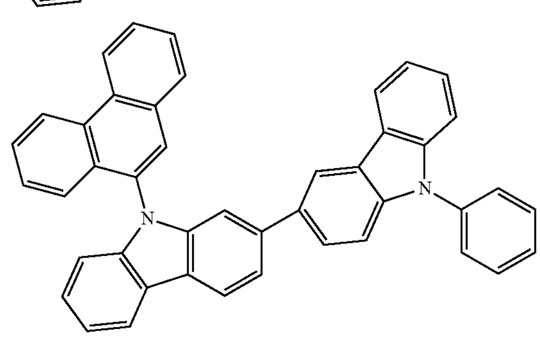

-continued
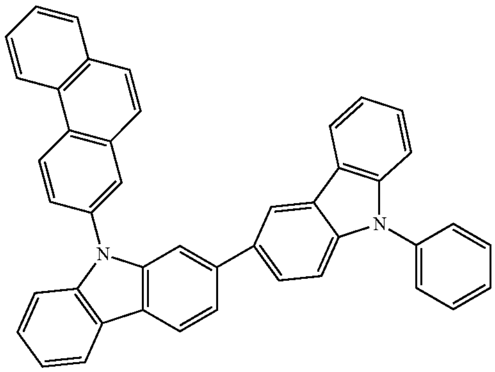
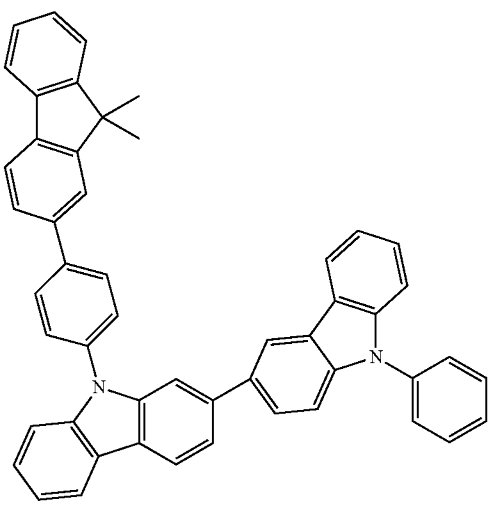
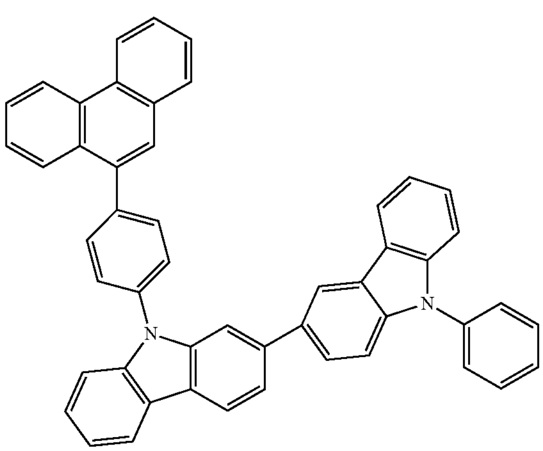
-continued
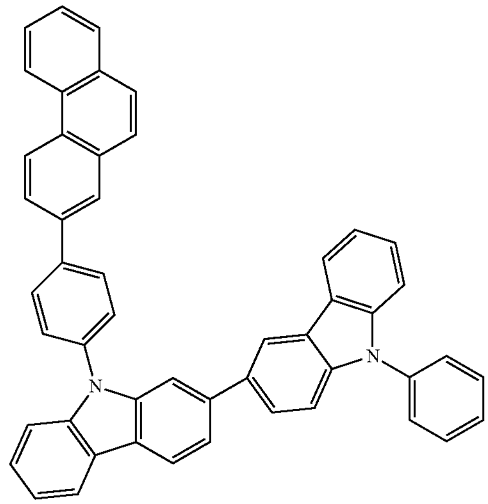
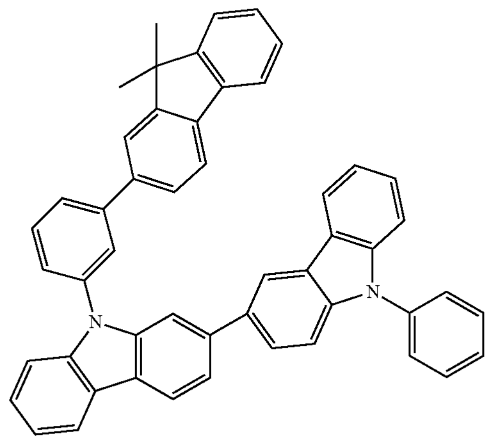
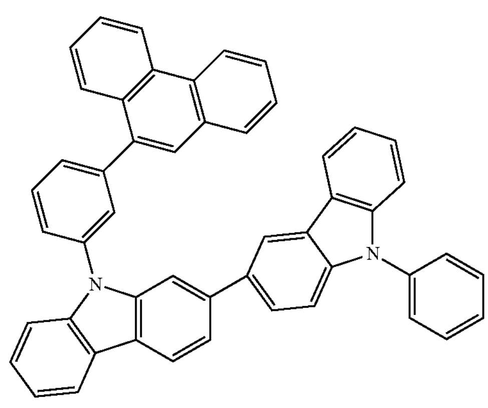

-continued
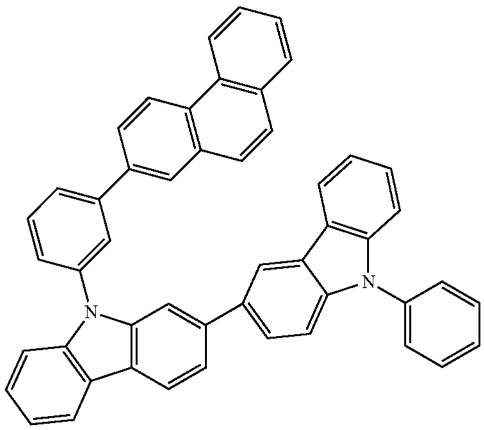
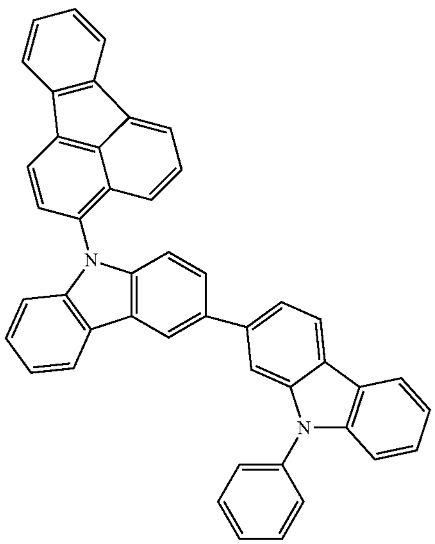
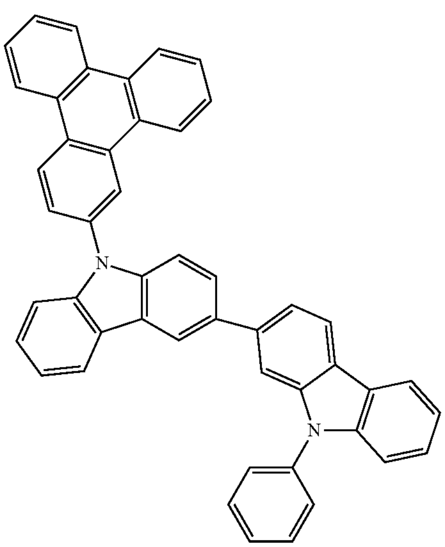
-continued
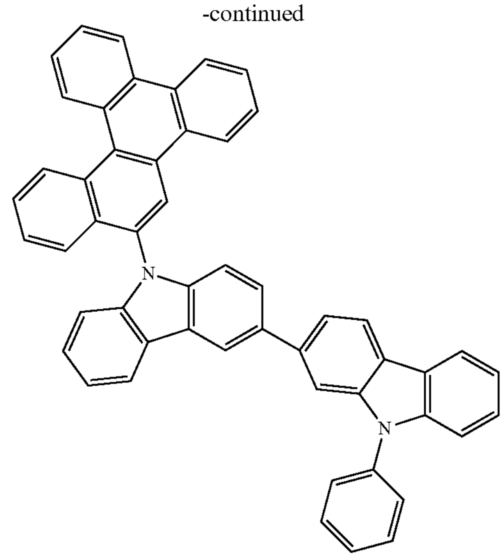
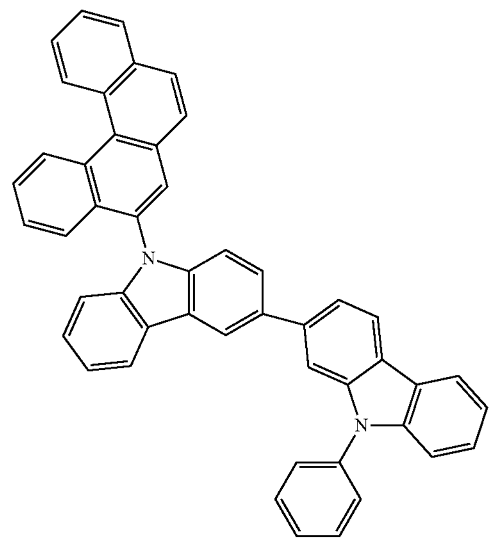
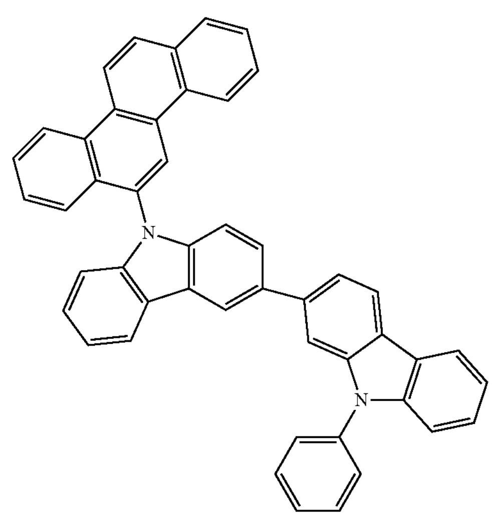

-continued
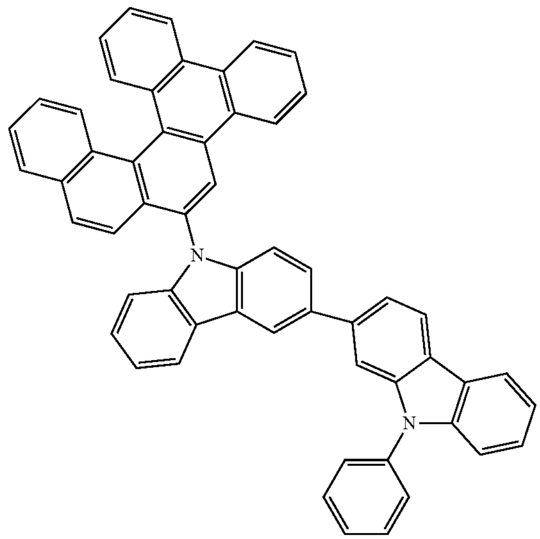
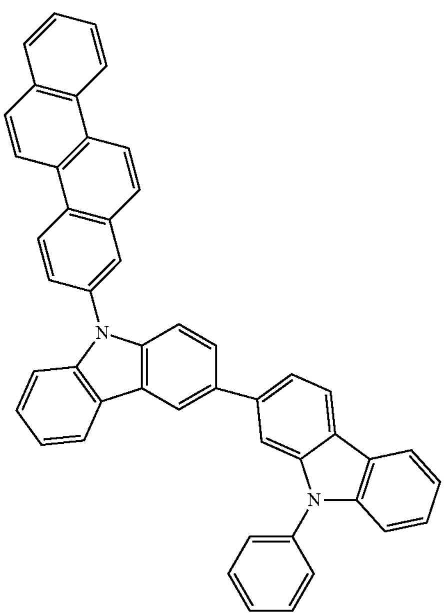
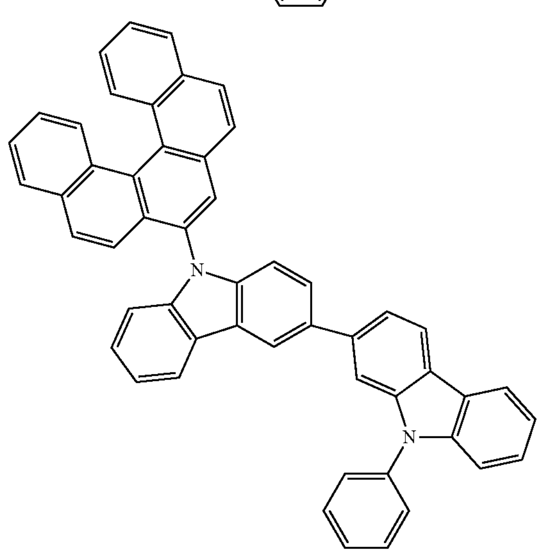
-continued
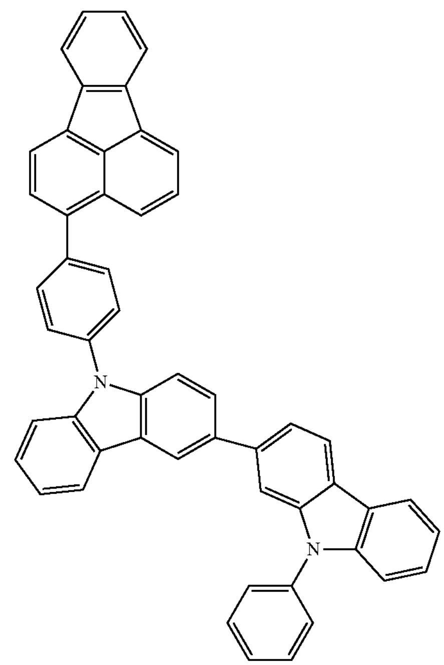
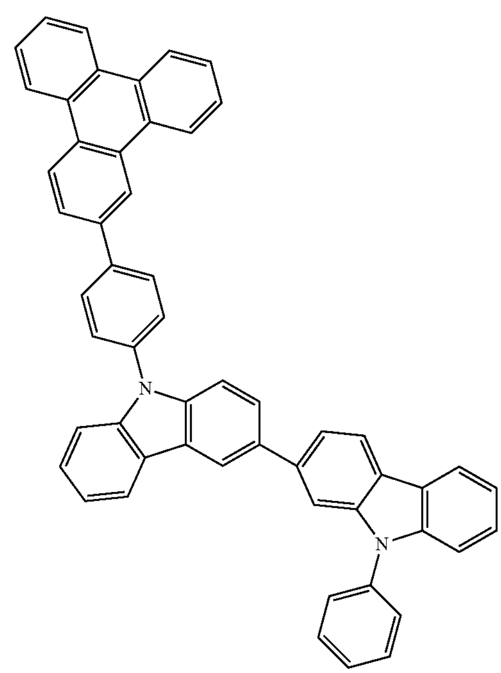

-continued
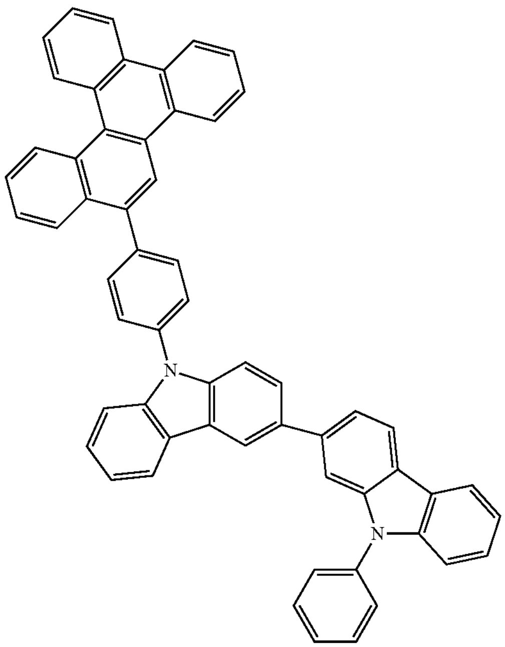
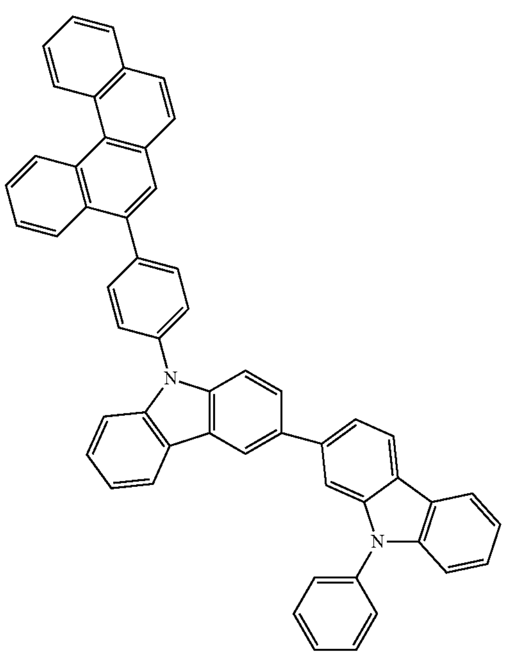
-continued
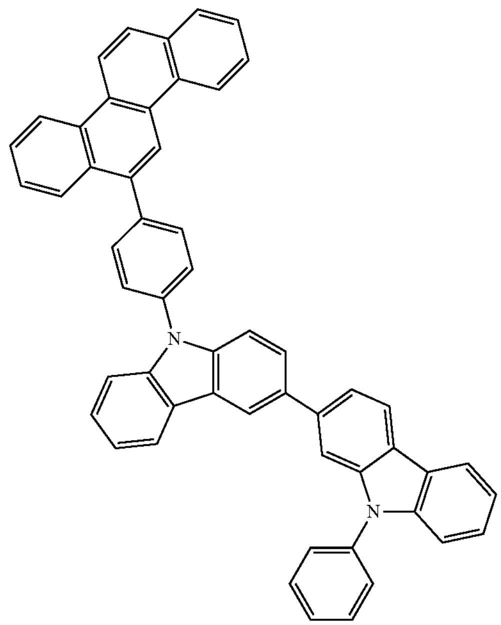
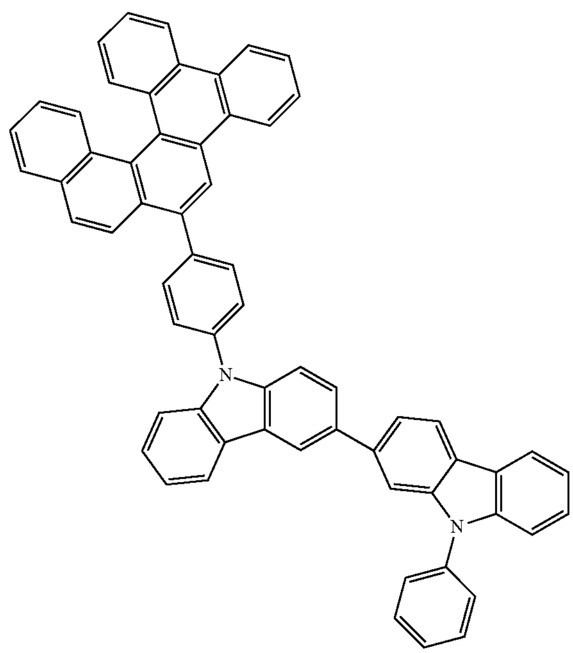

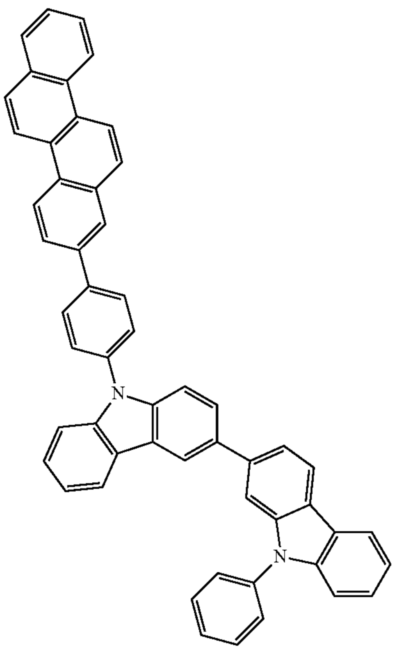
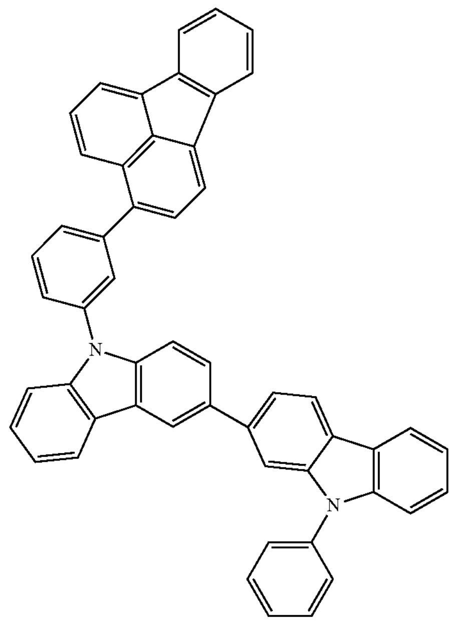
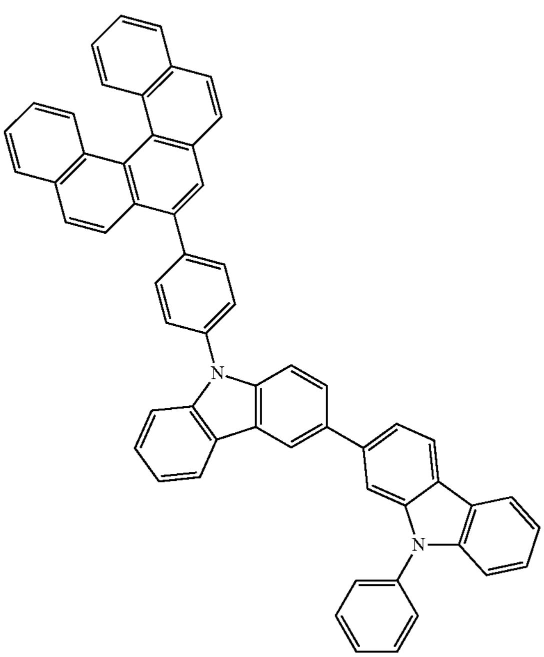
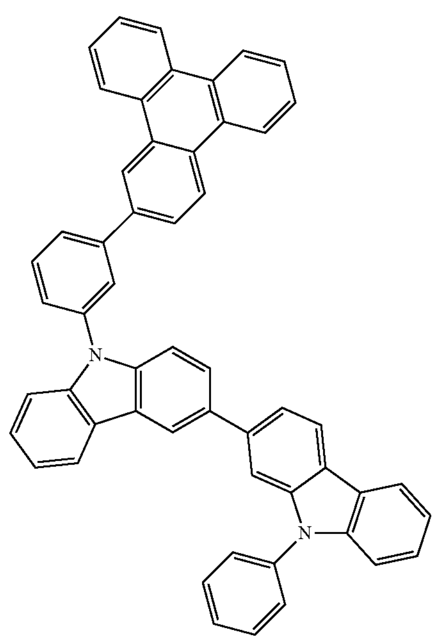
N
N

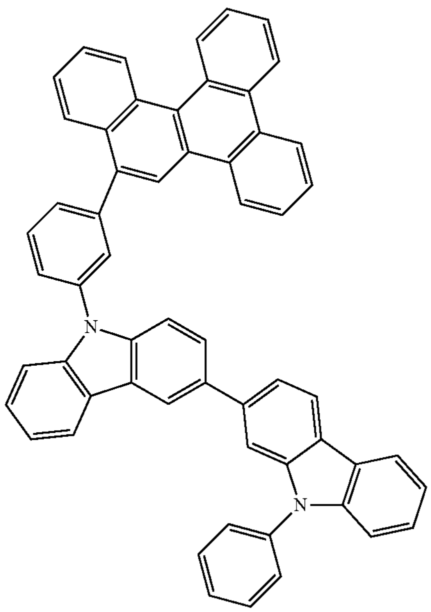
N
N
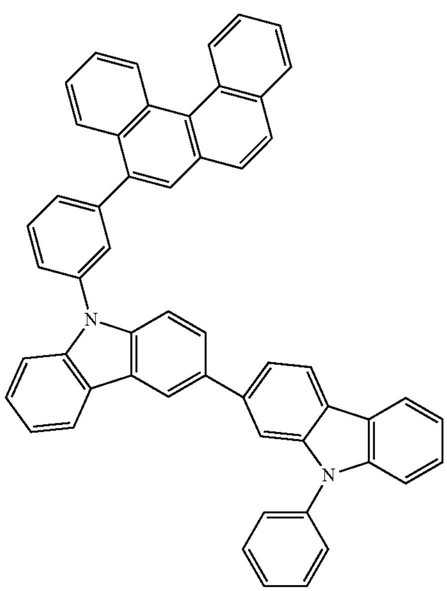
N
N
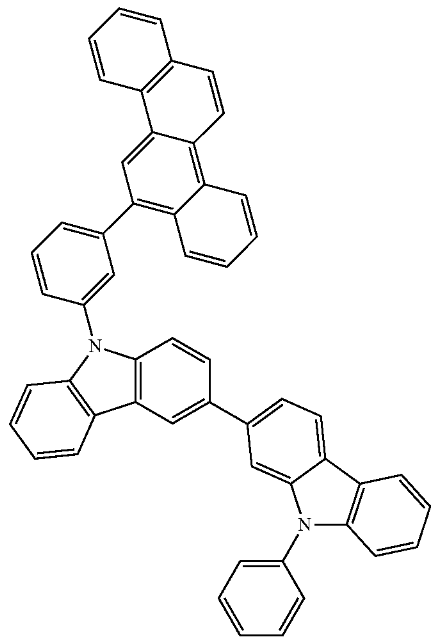
N
N
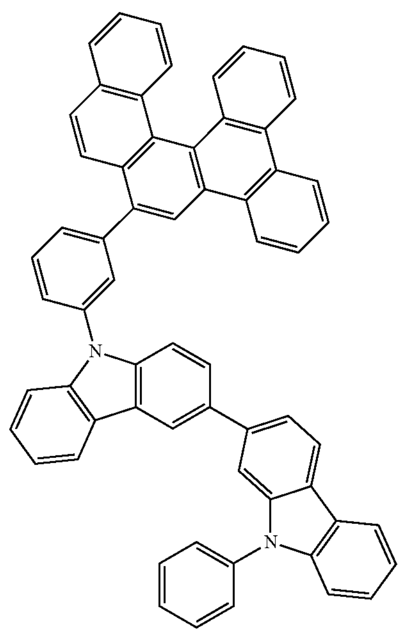
N
N

-continued
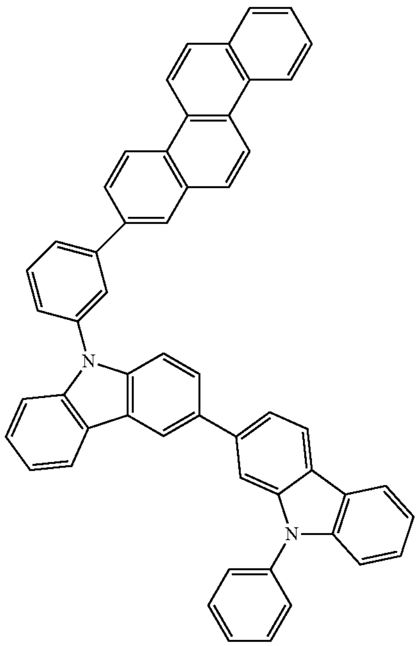
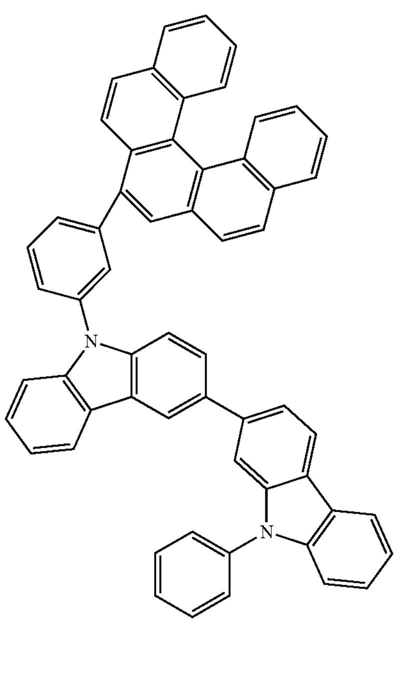
-continued
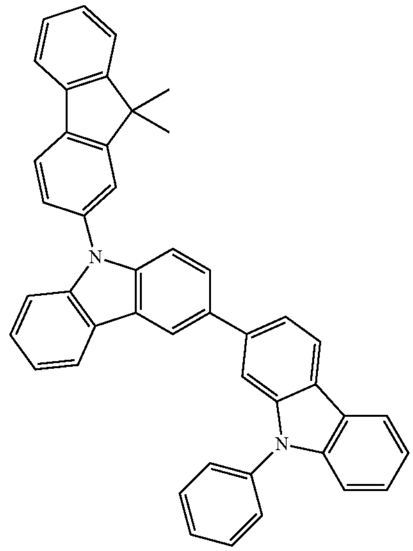
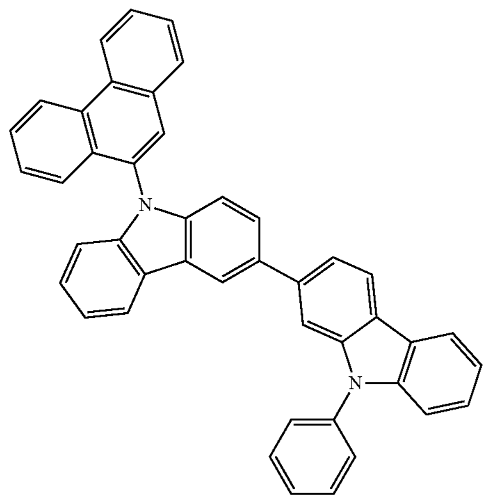
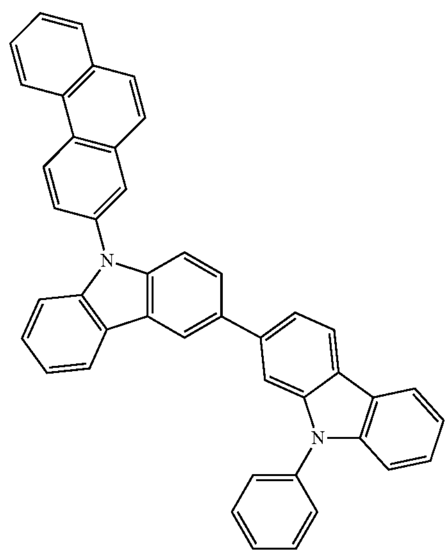

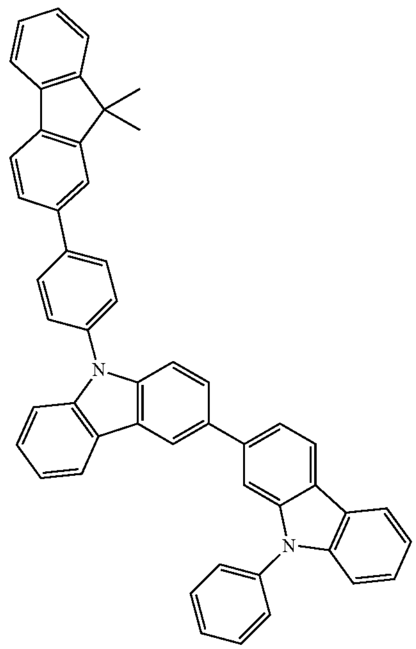
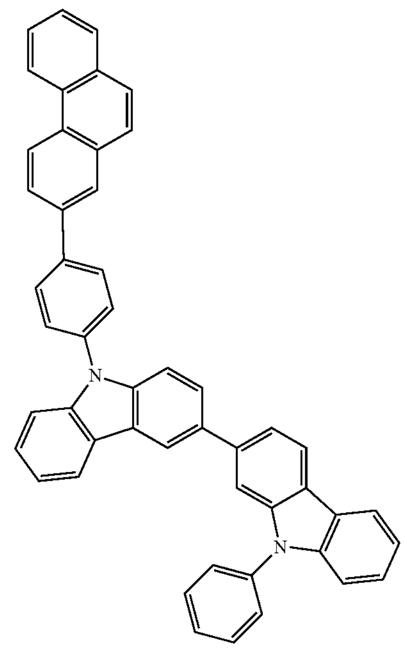
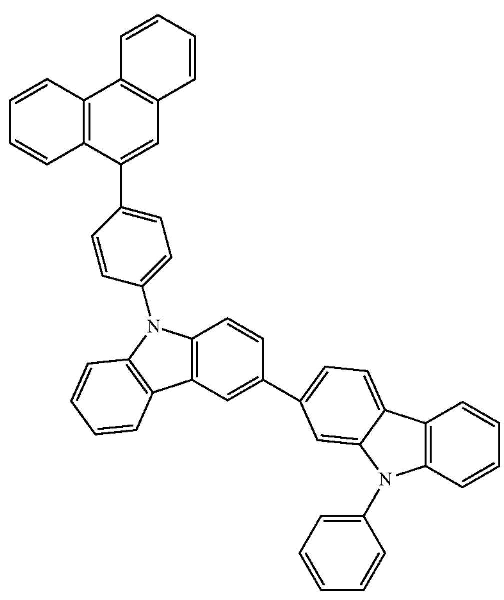
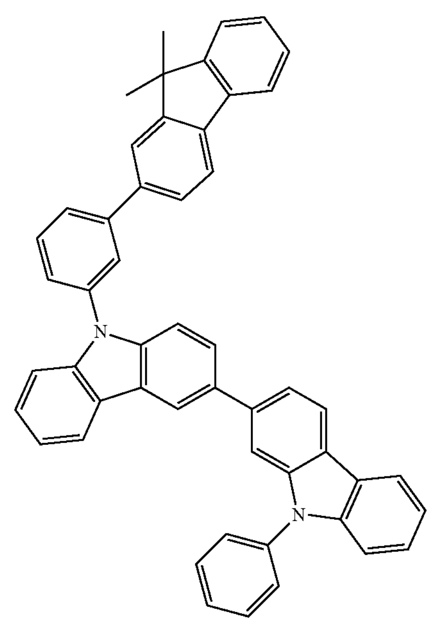

-continued
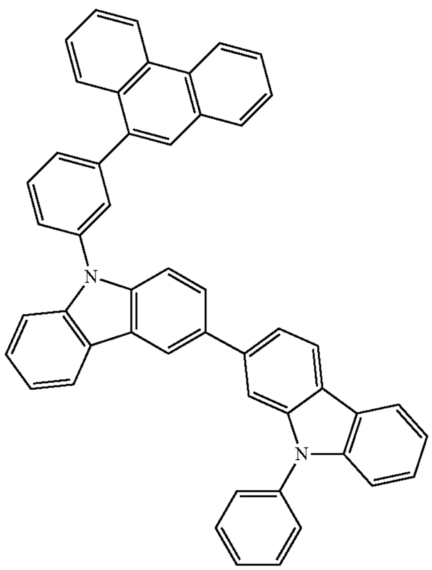
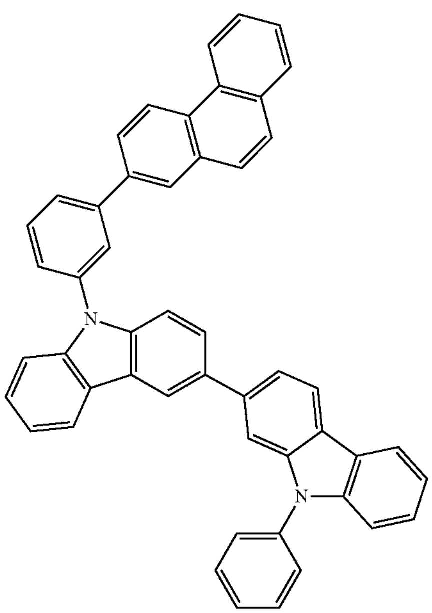
-continued
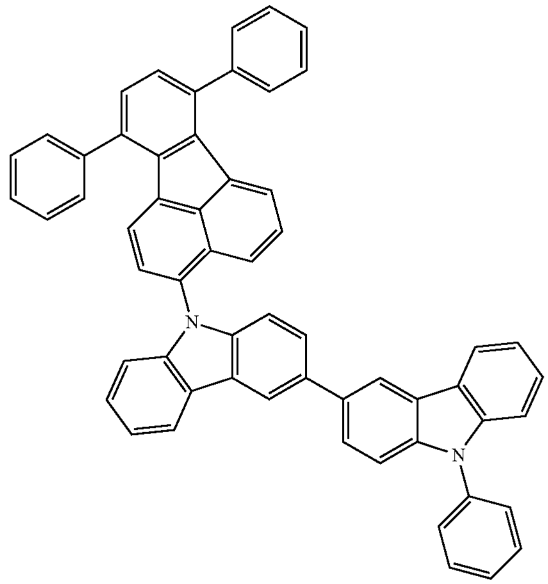
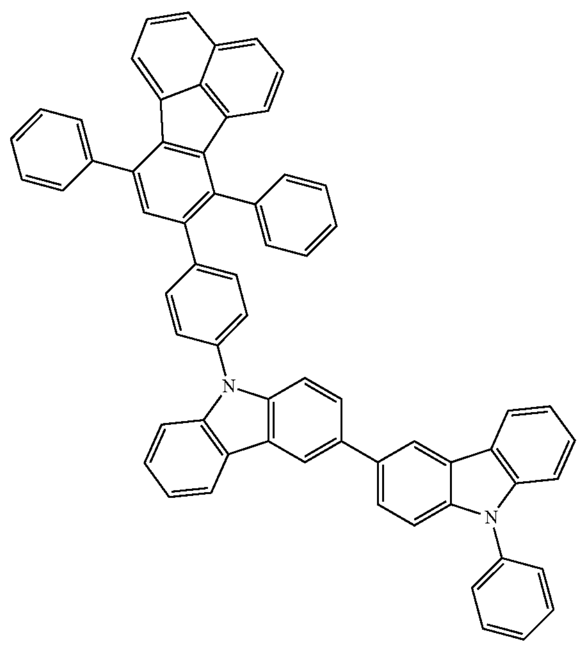

-continued
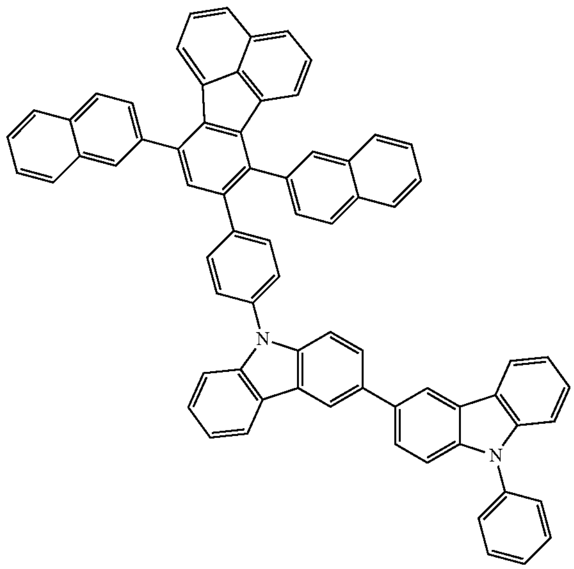
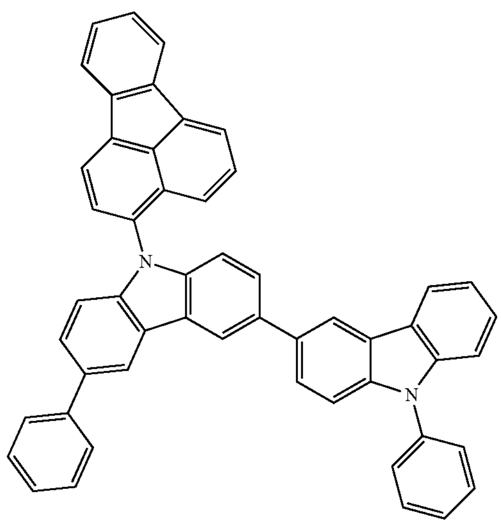
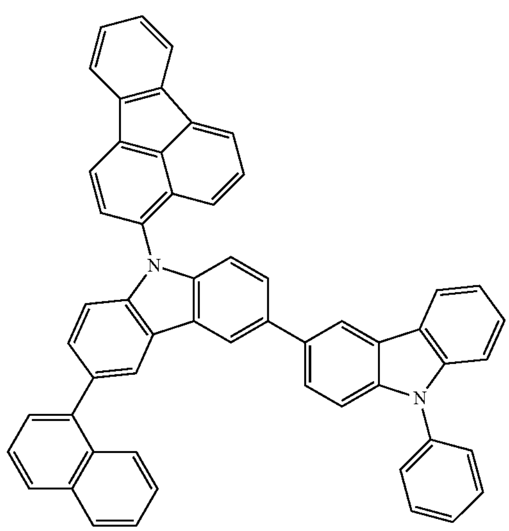
-continued
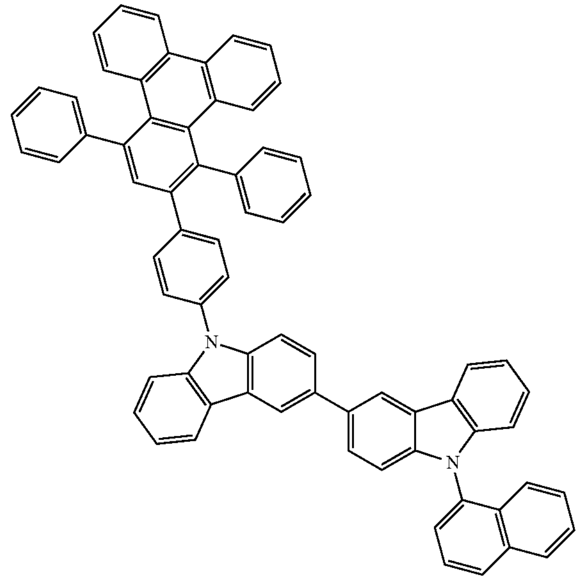
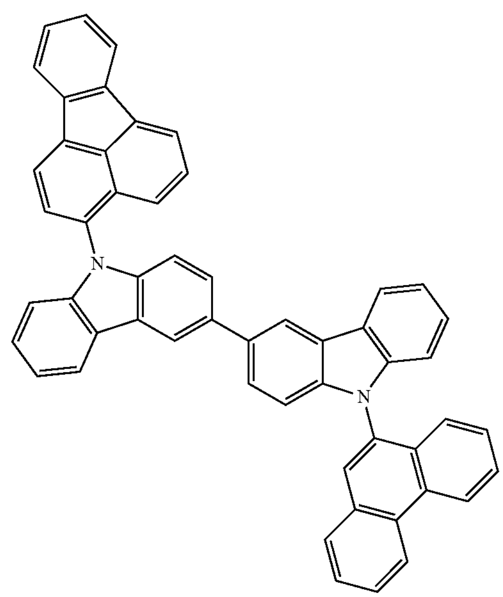

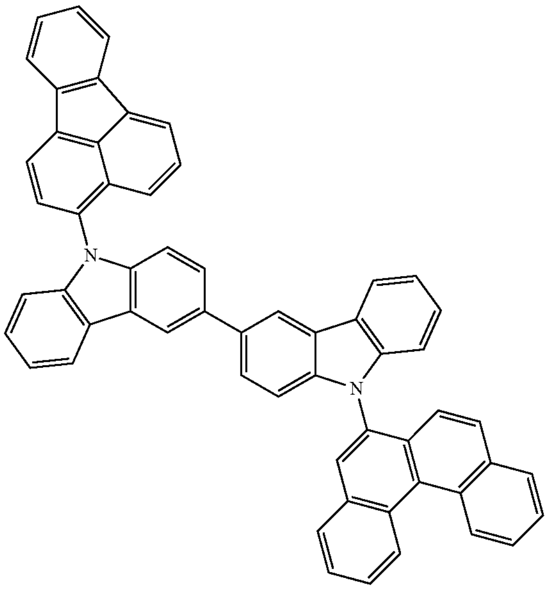
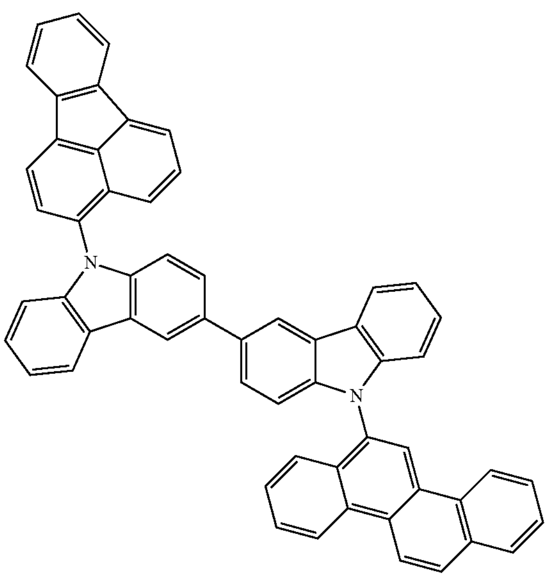
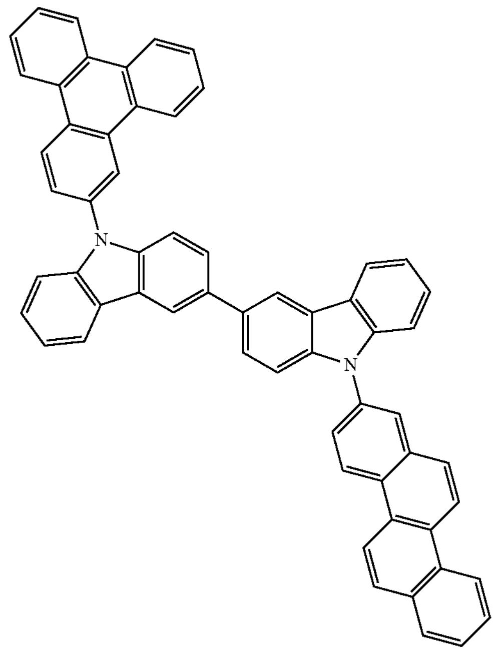
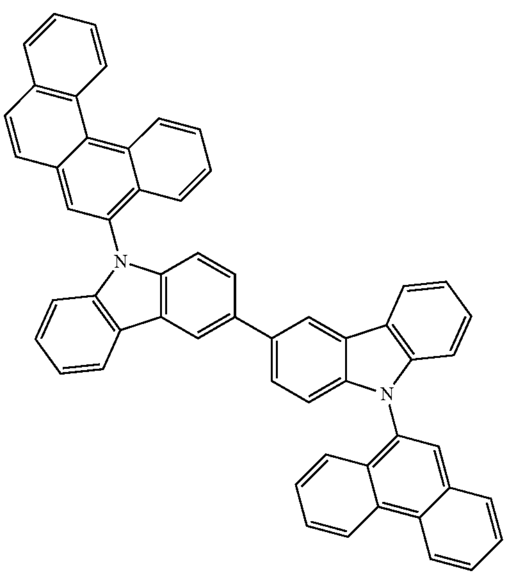

-continued
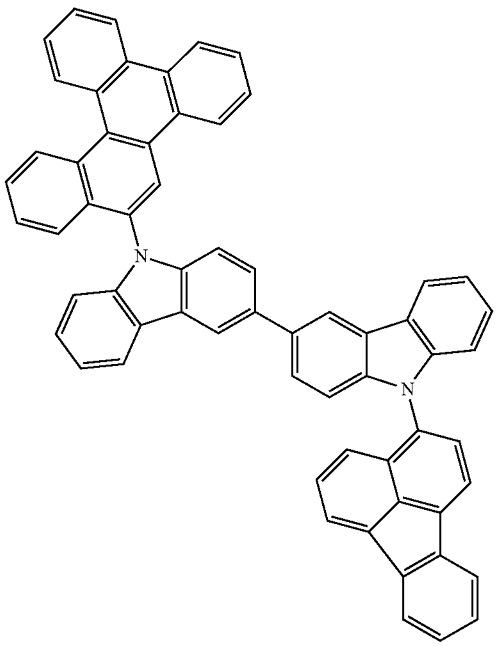
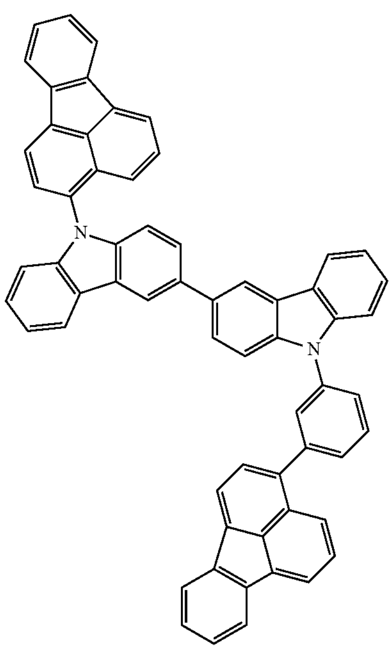
-continued
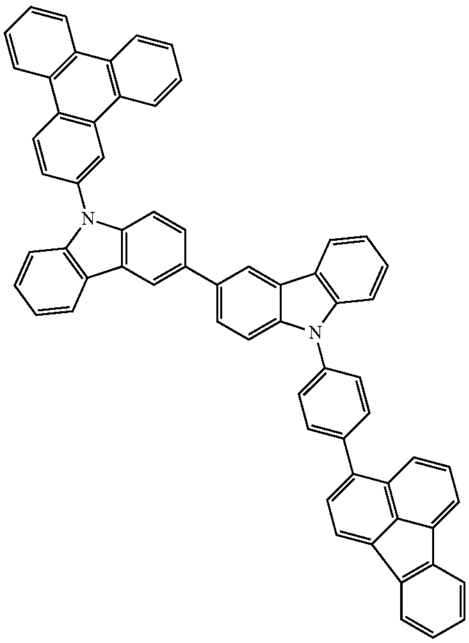
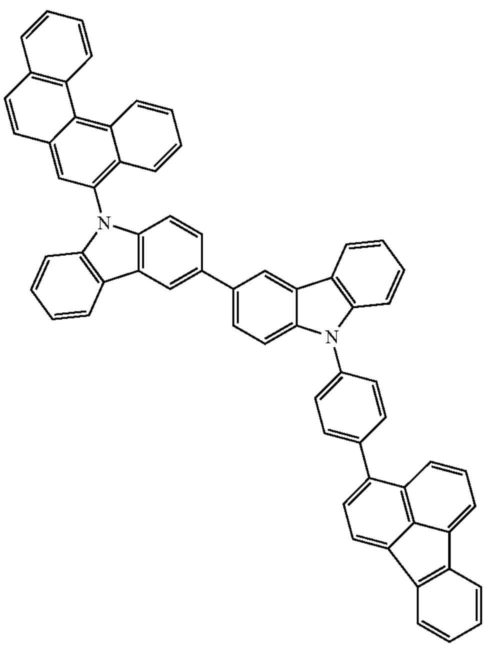
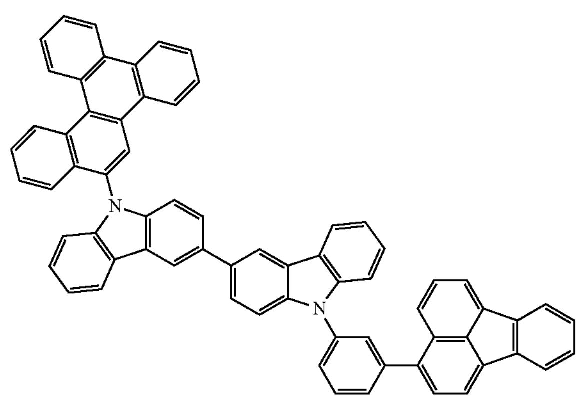

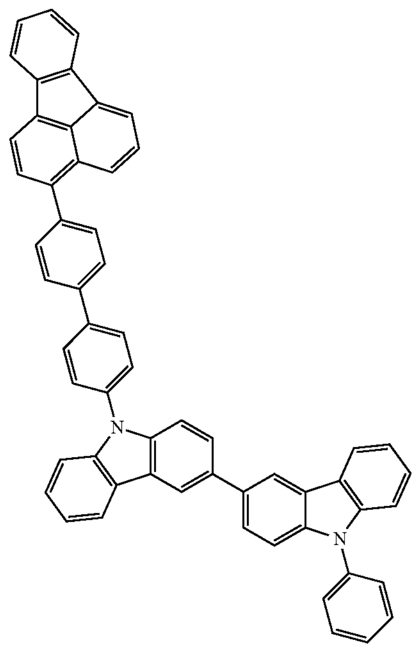
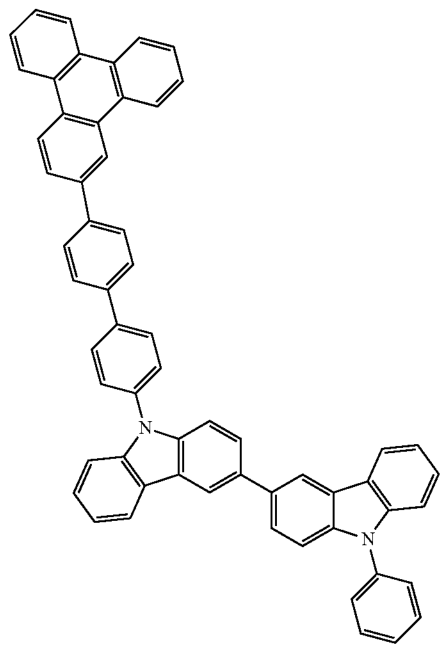
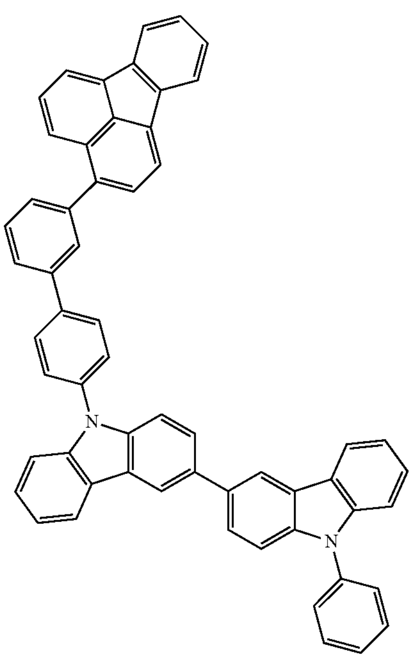
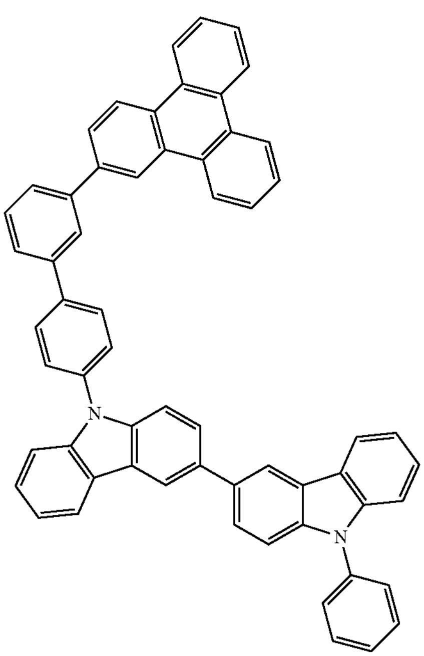

-continued
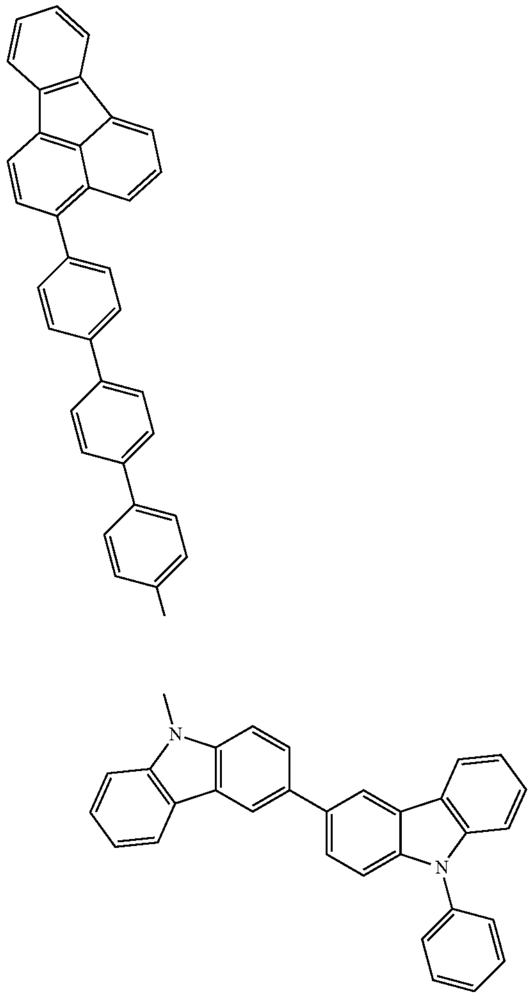
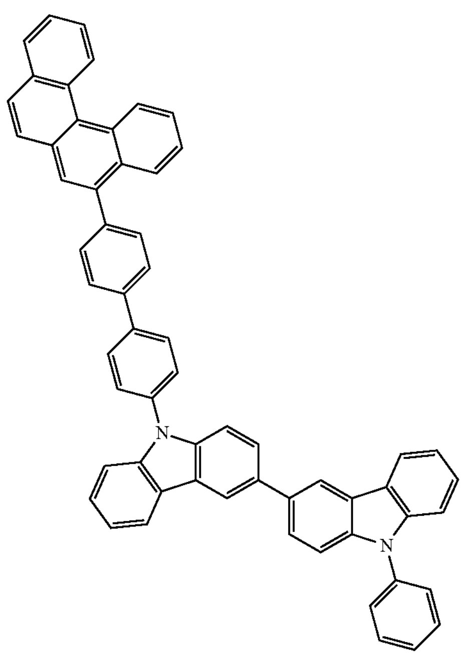
-continued
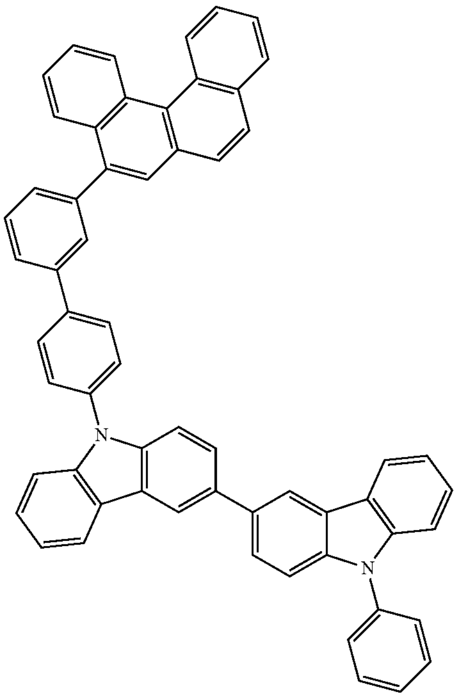 [SMILES: c1ccc(-n2c3ccccc3c3cc(-c4ccc5c(c4)c4ccccc4n5-c4ccc(-c5cccc(-c6cc7ccc8ccccc8c7c7ccccc67)c5)cc4)ccc32)cc1]
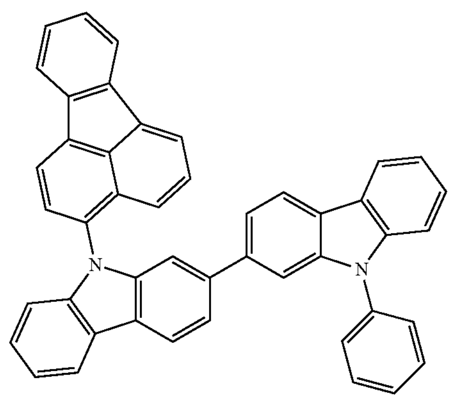
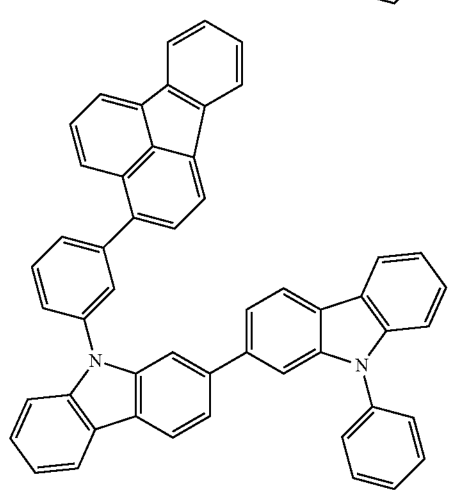

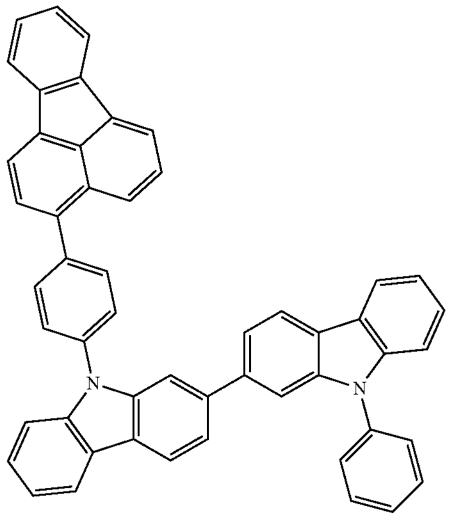
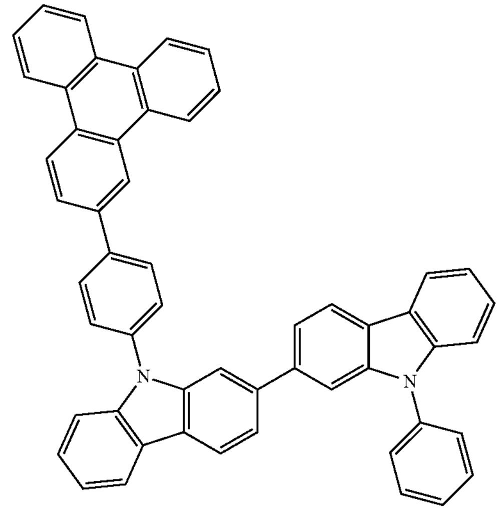
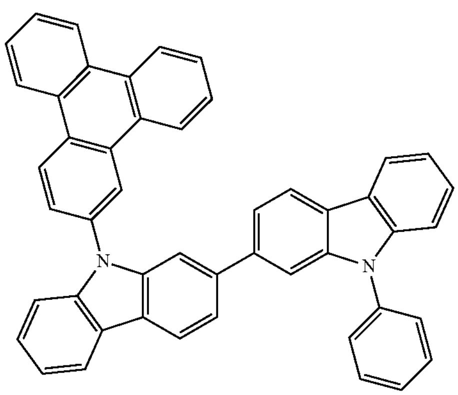
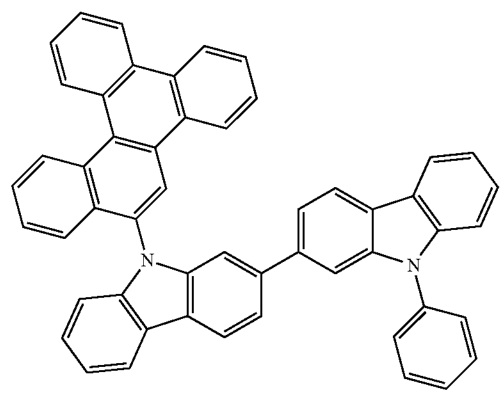
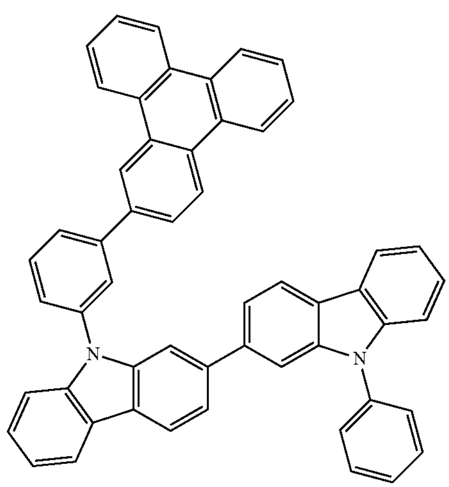
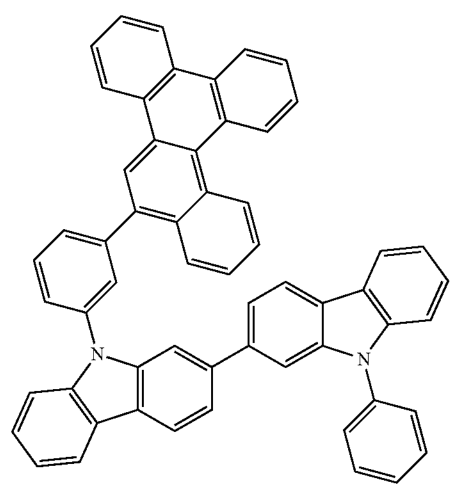

-continued
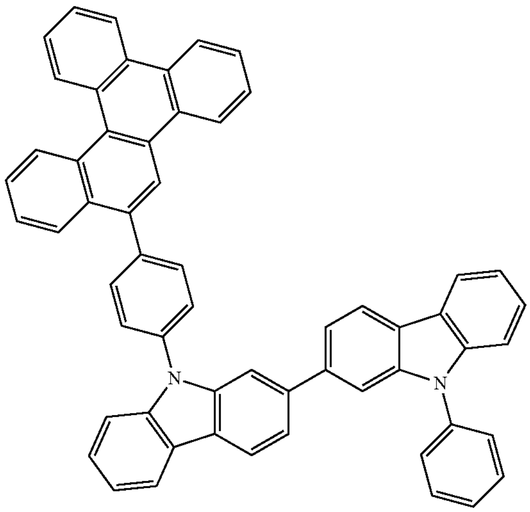
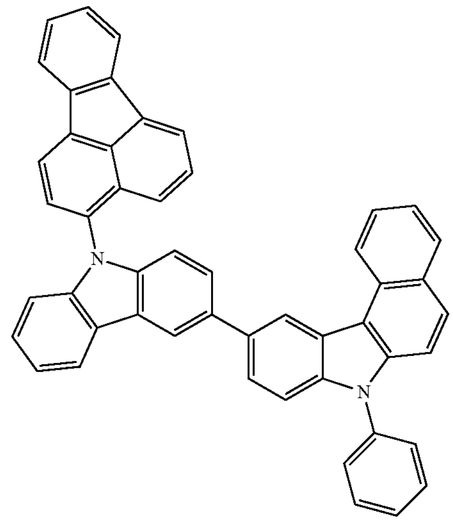
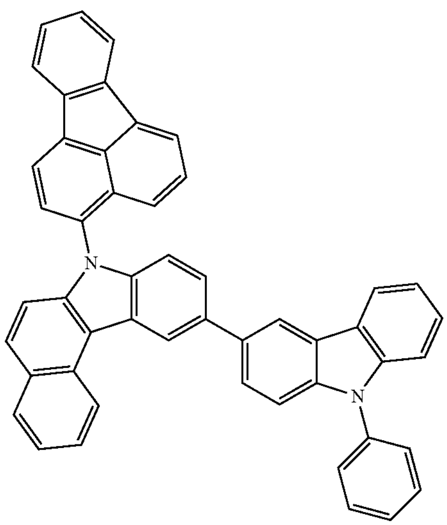
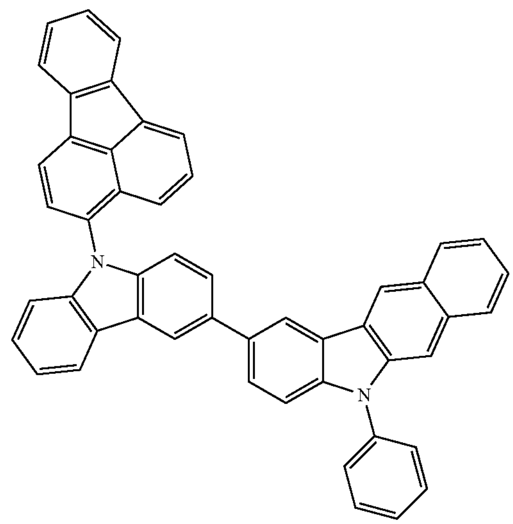
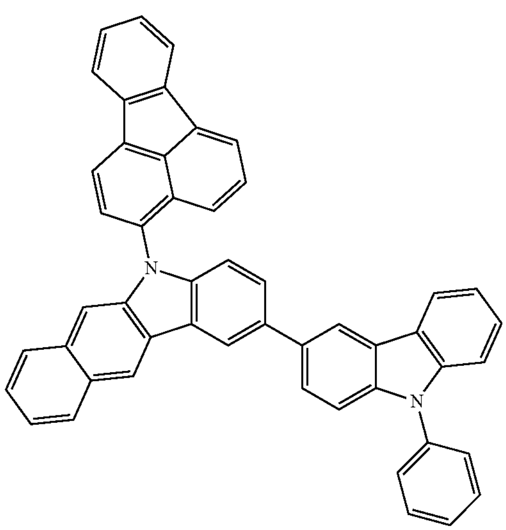
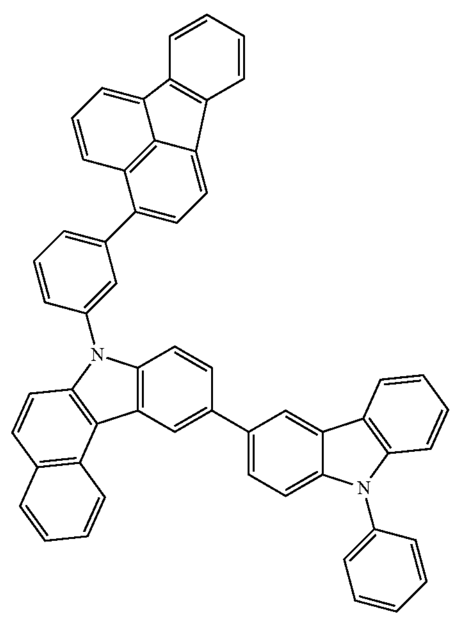

-continued
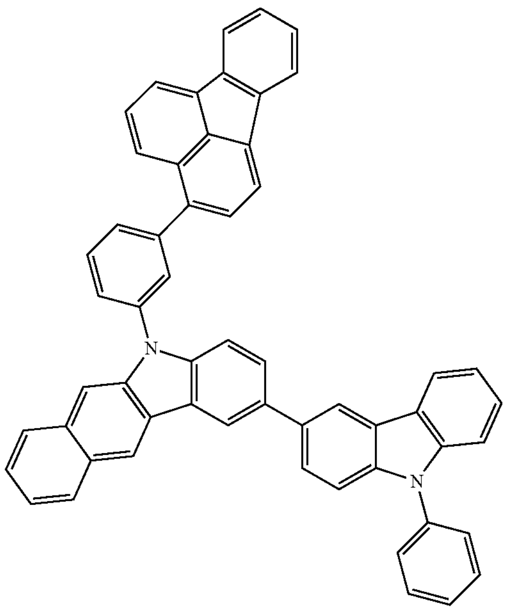
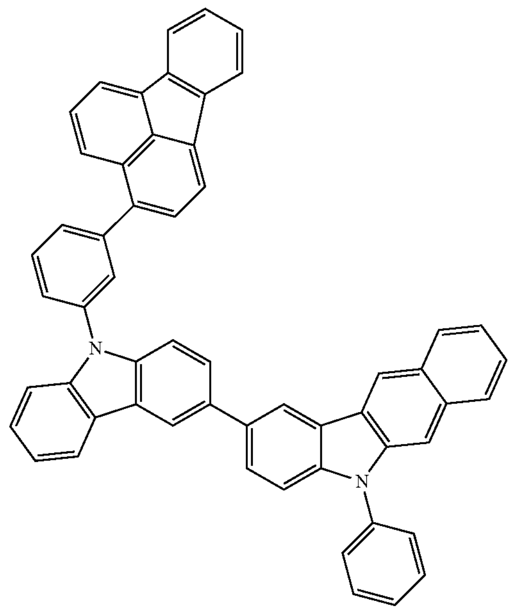
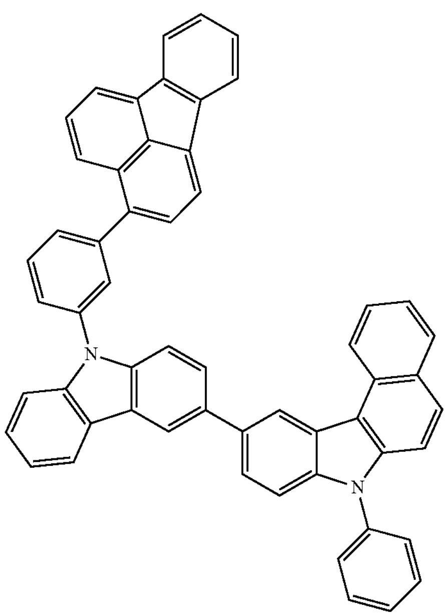
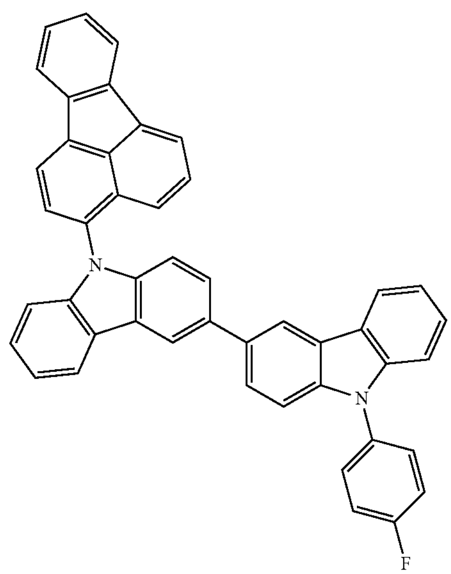

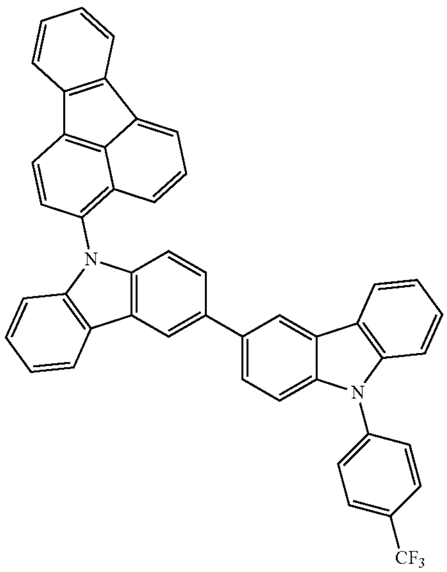
N
N
CF3
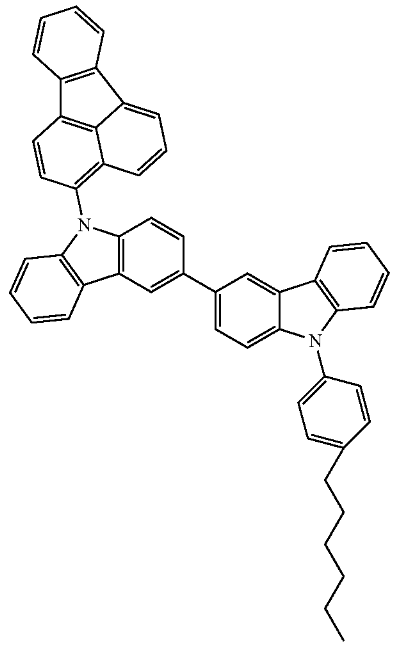
N
N
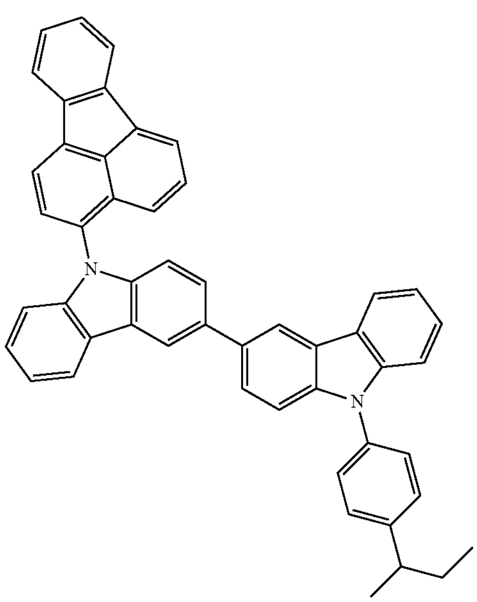
N
N
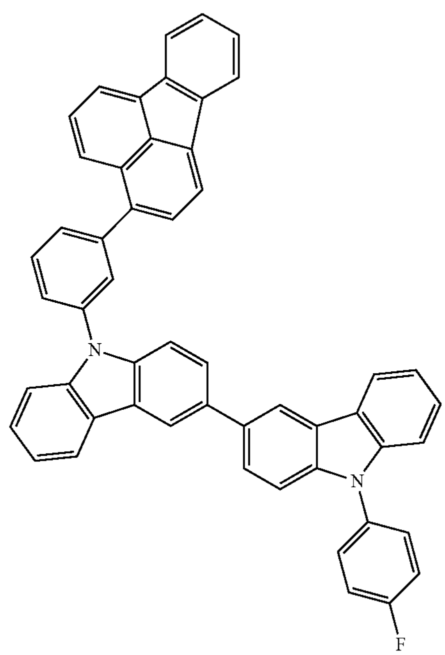
N
N
F

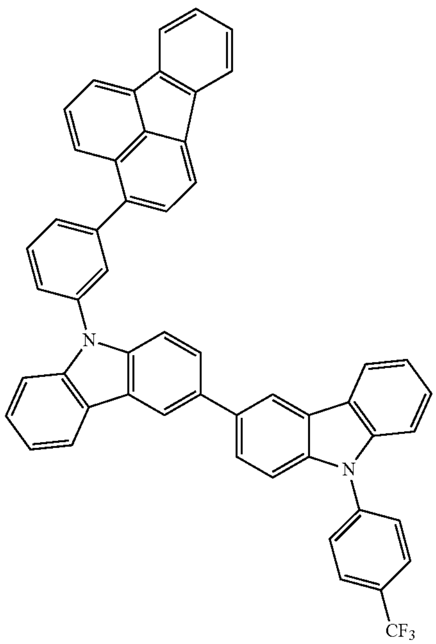
N
N
CF3
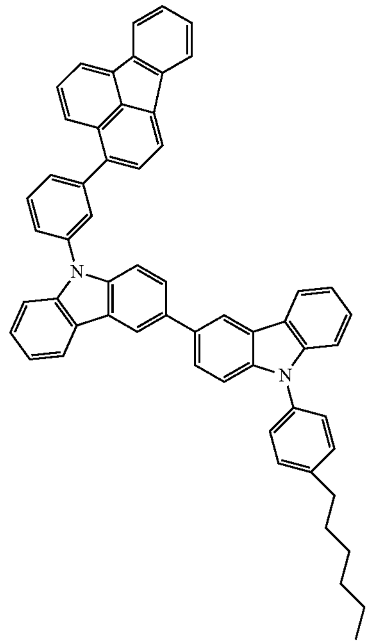
N
N
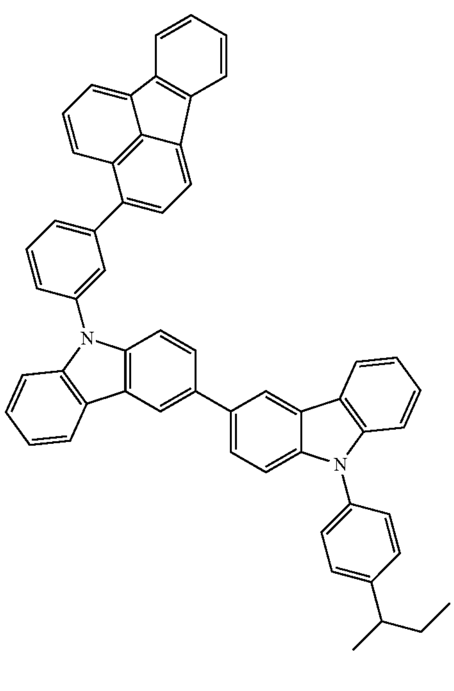
N
N
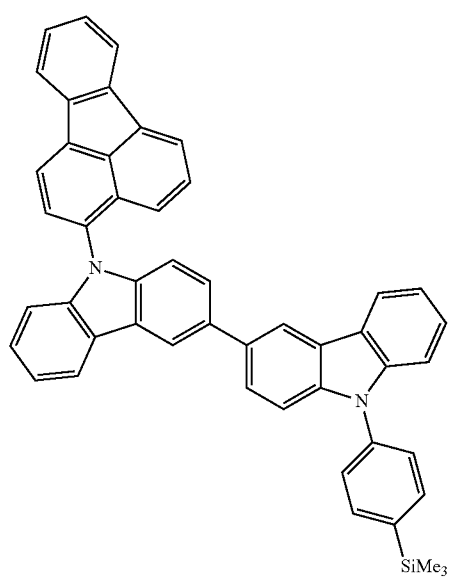
N
N
SiMe3

-continued
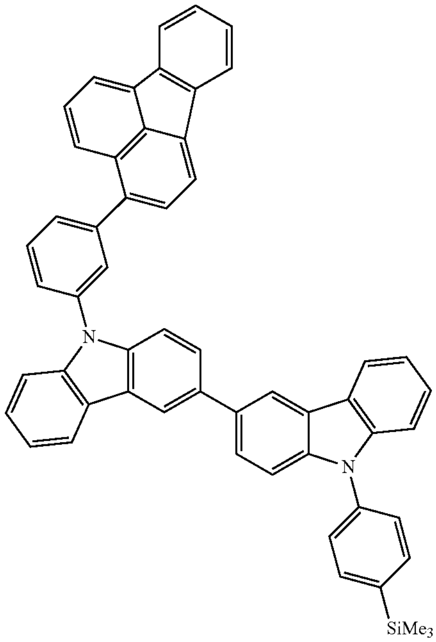
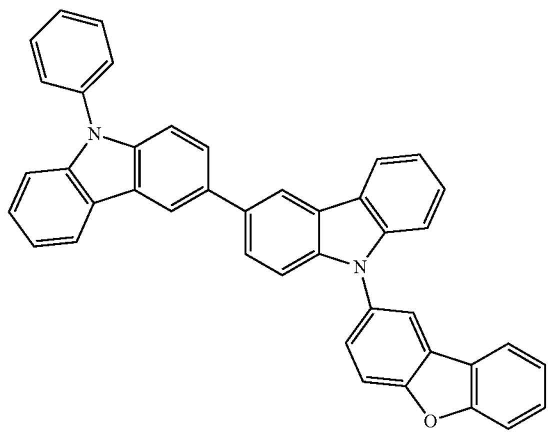
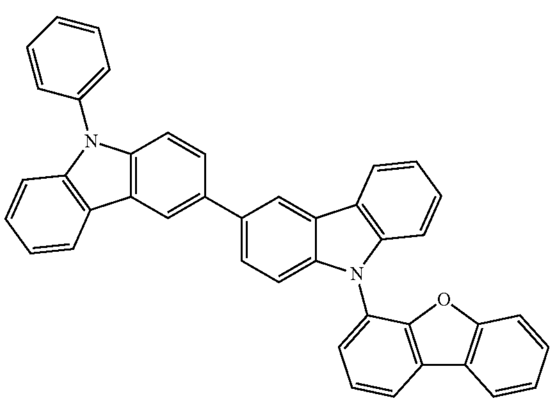
-continued
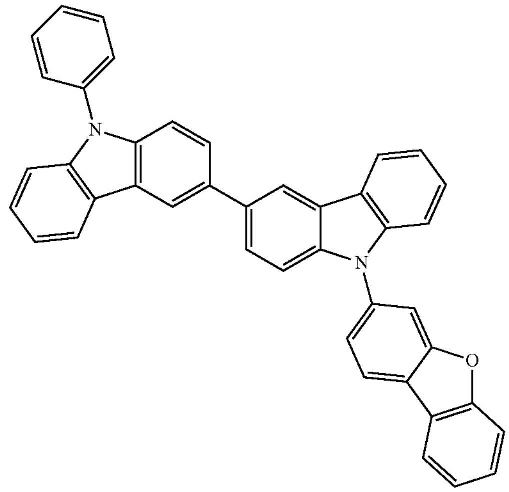
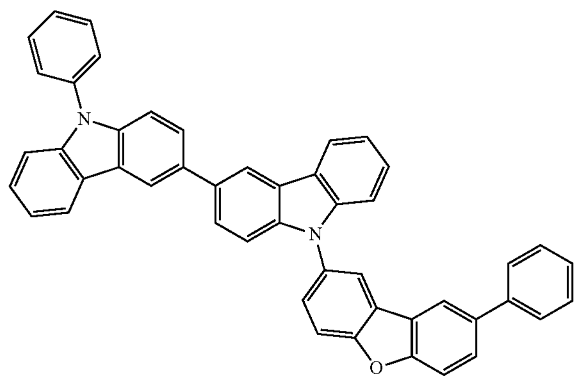
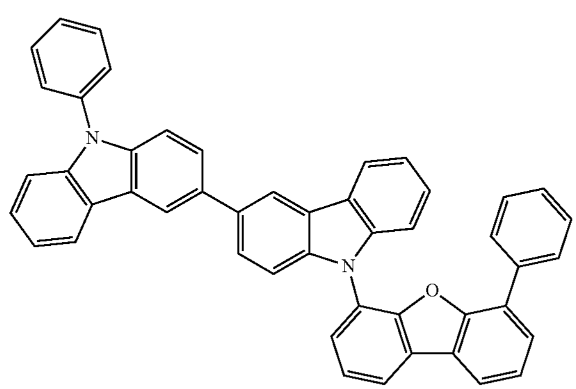

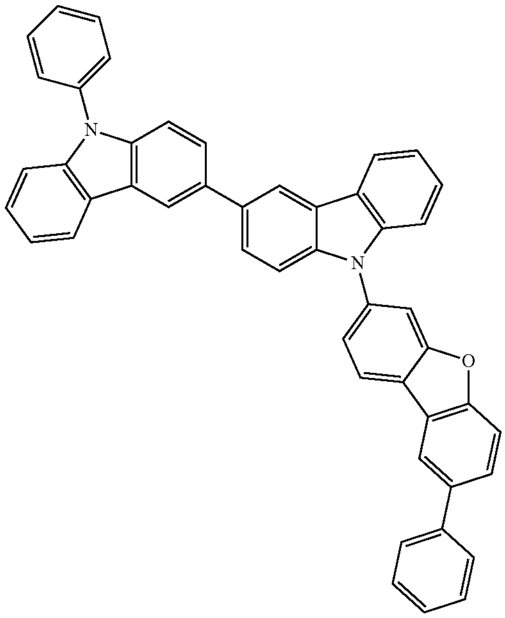
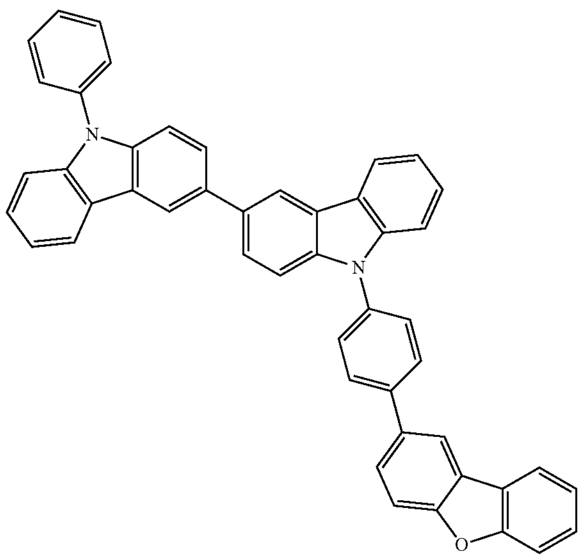
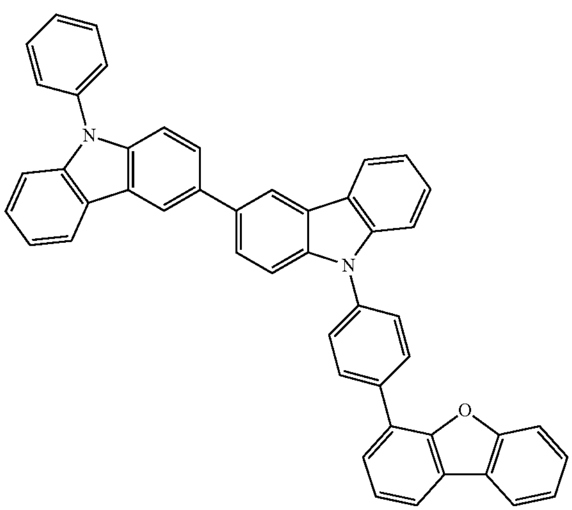
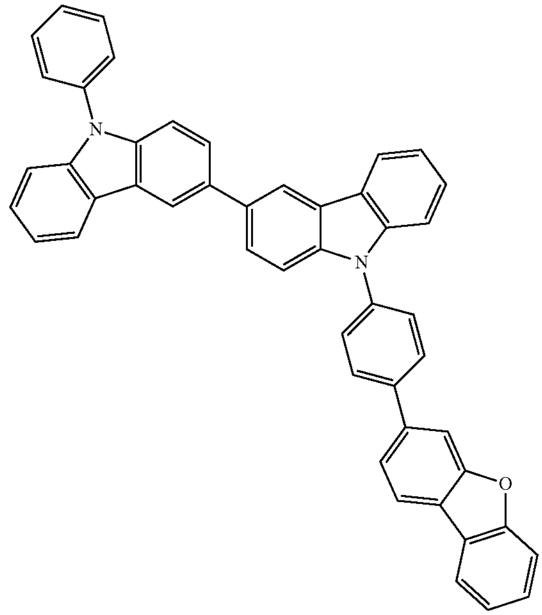
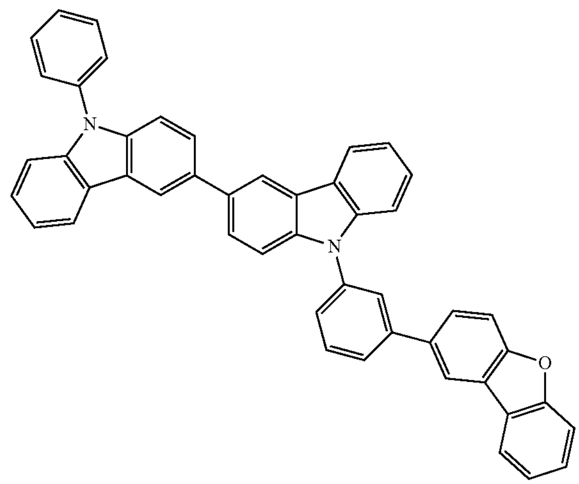
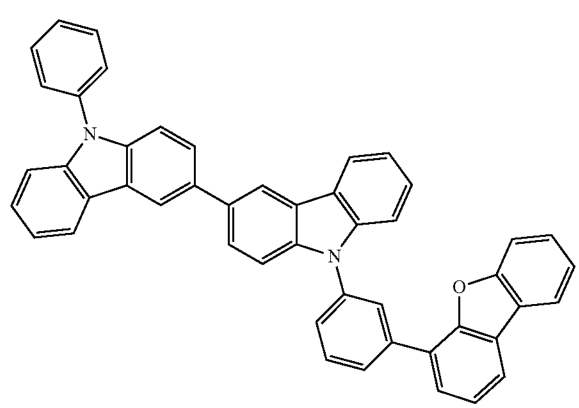
N
N
O -continued
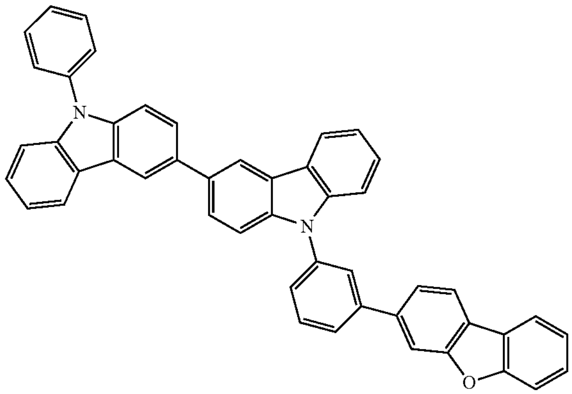
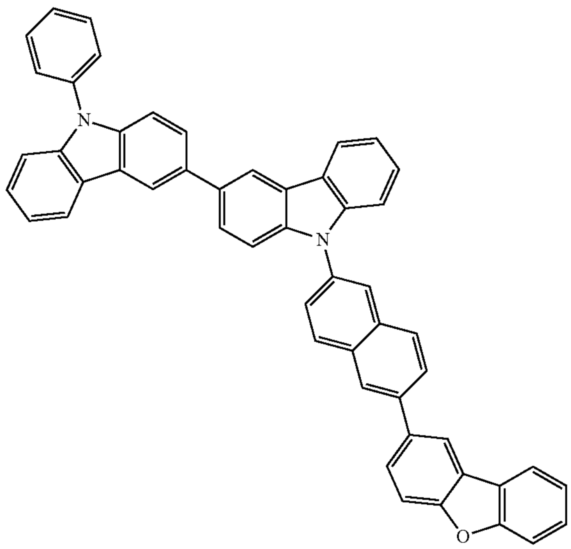
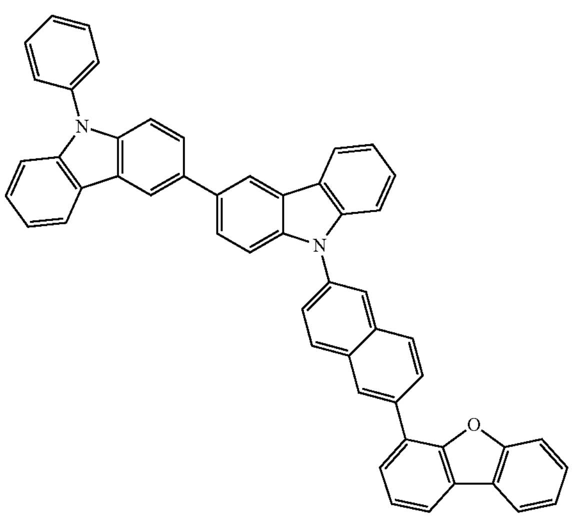
-continued
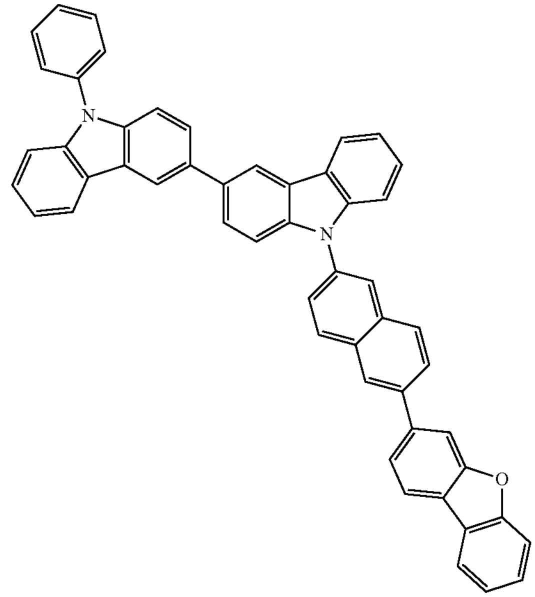
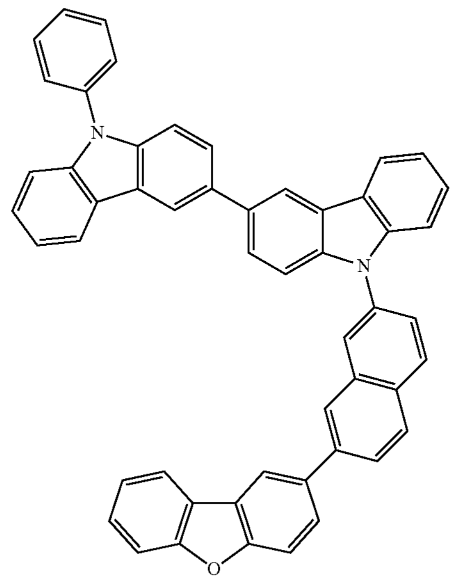
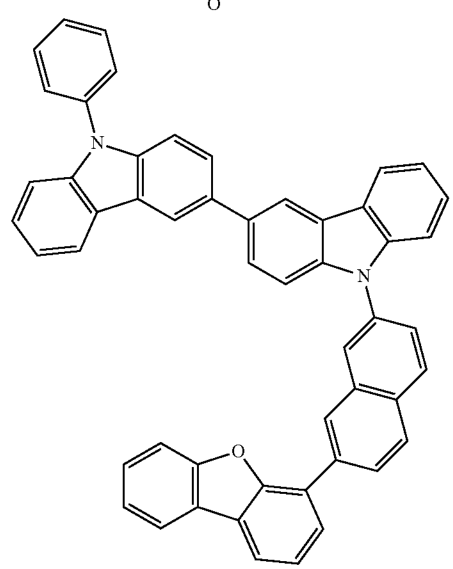

-continued
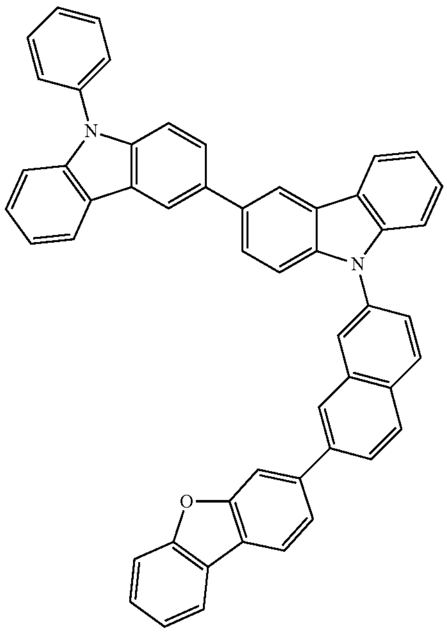
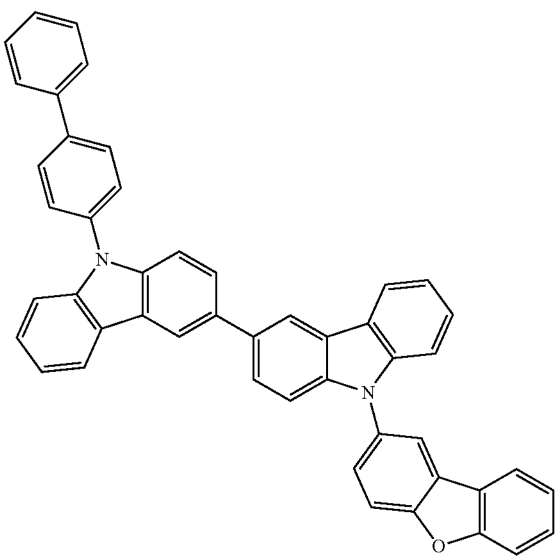
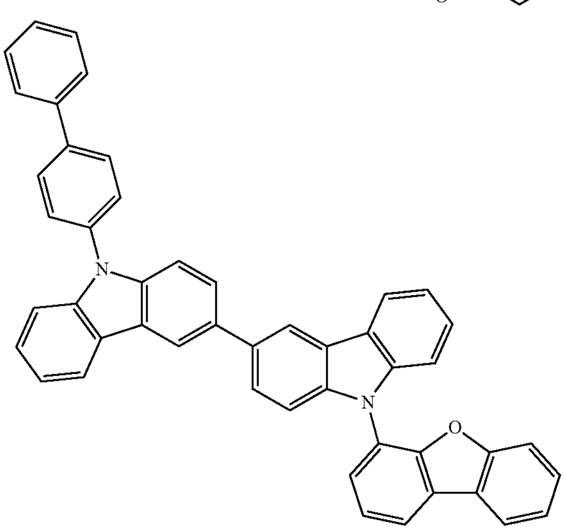
-continued
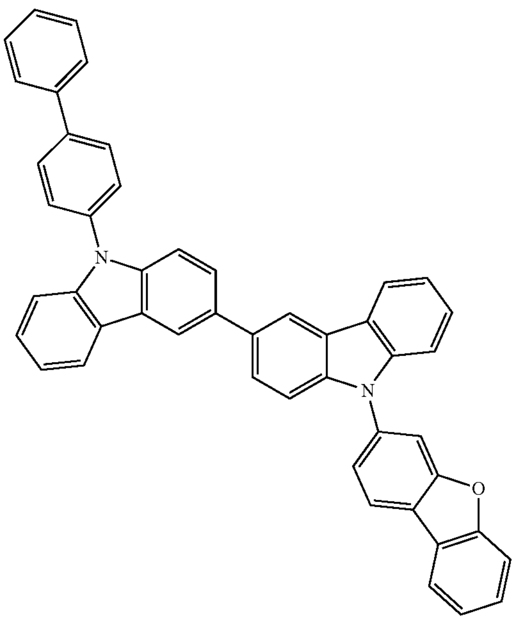
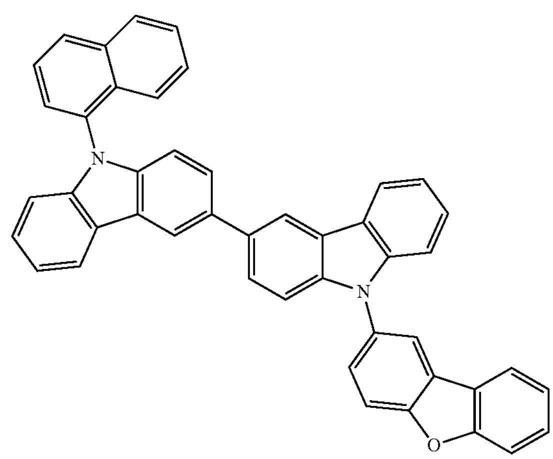
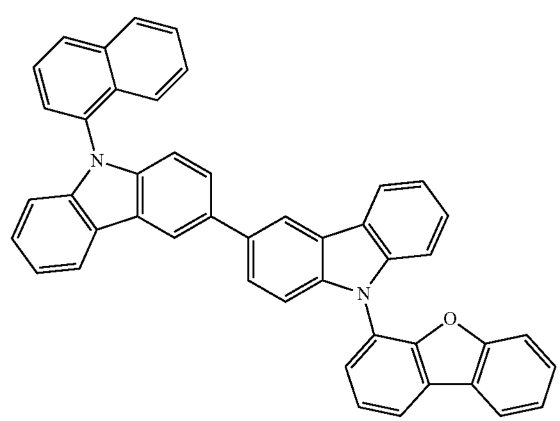

-continued
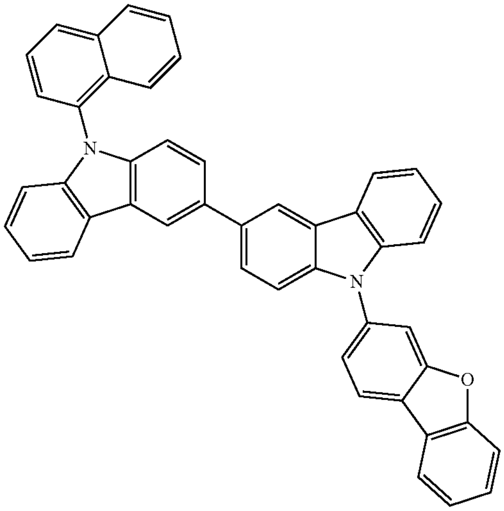
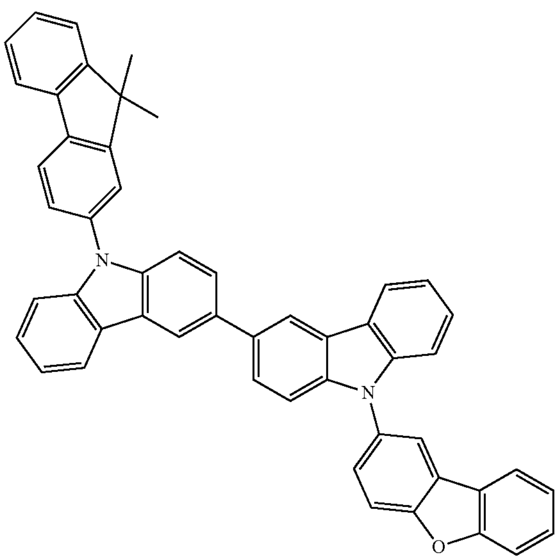
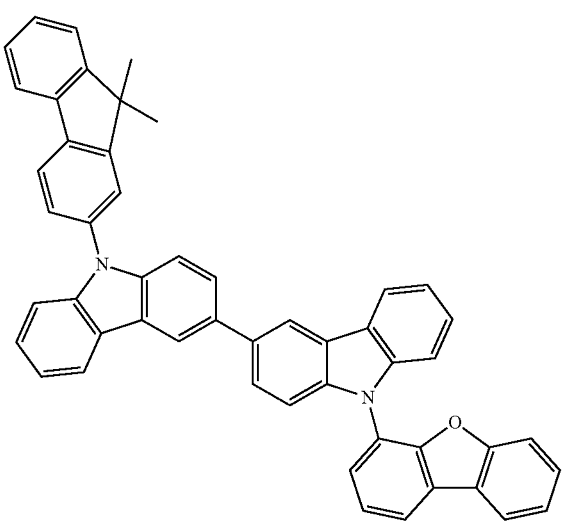
-continued
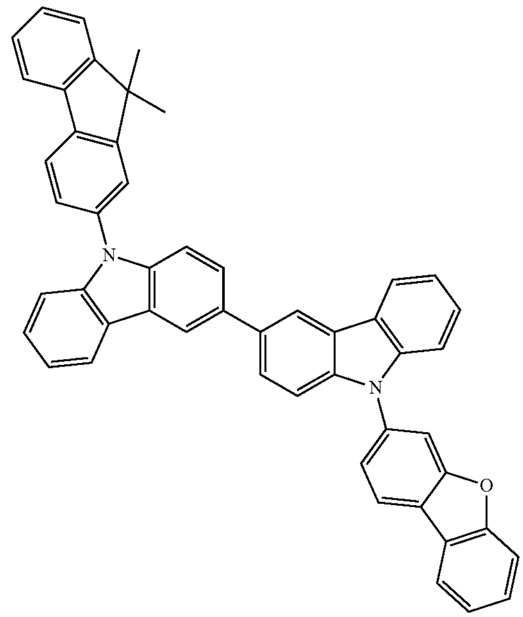
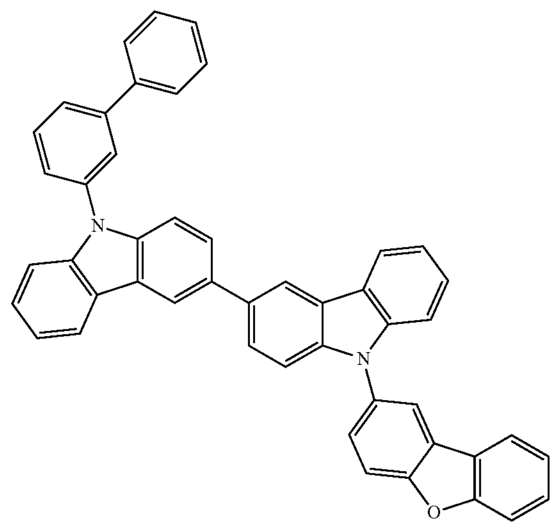
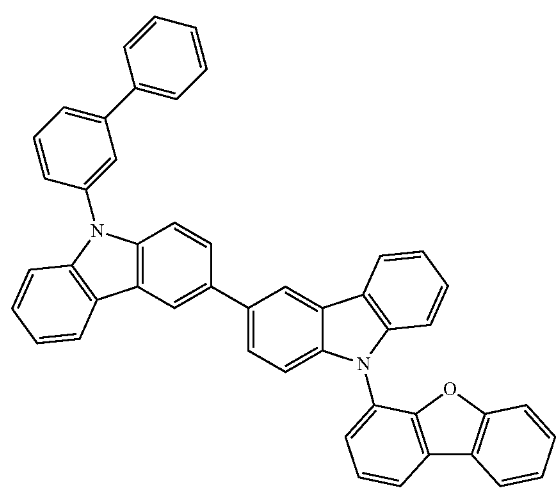

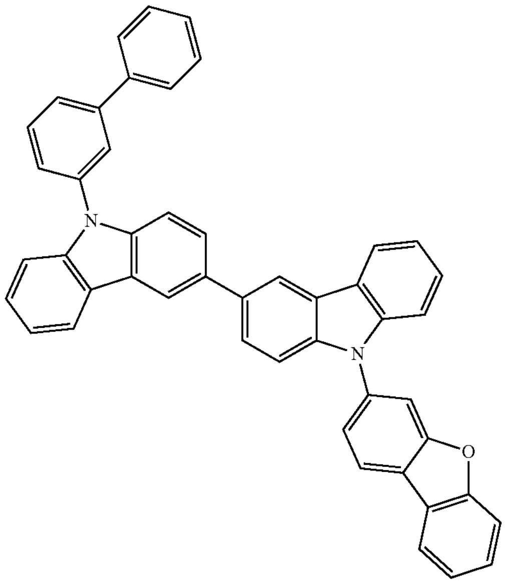
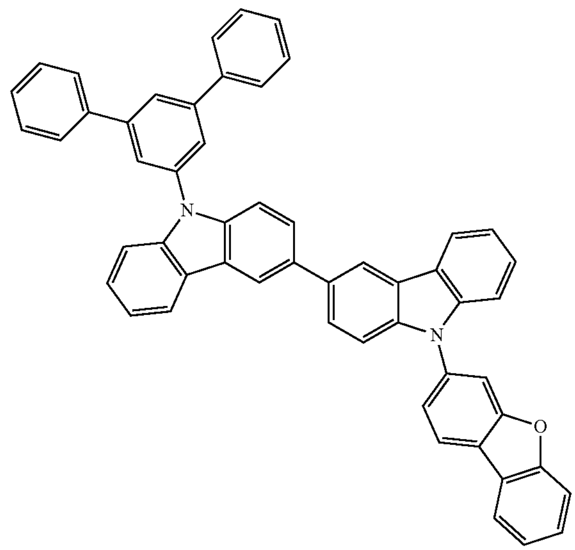
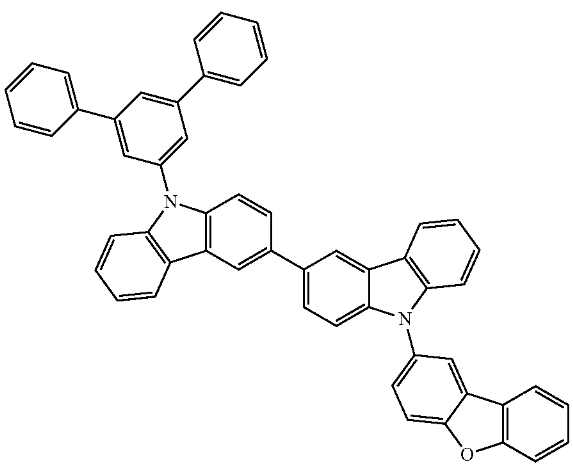
N
N
O
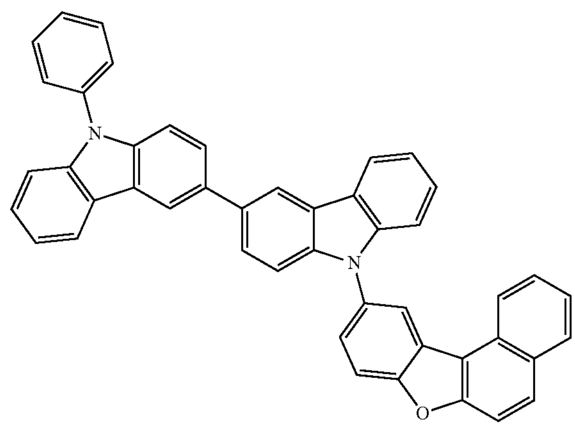
N
N
O
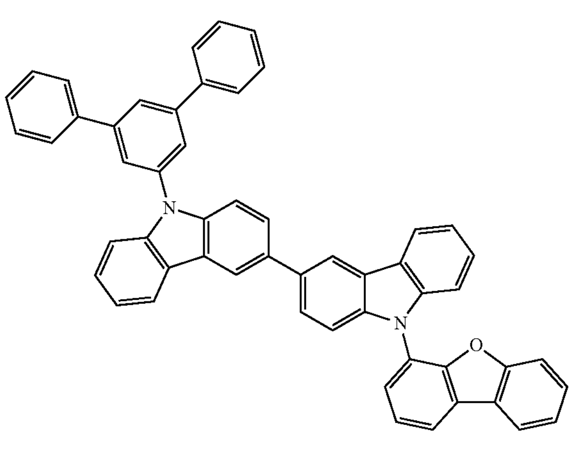
N
N
O
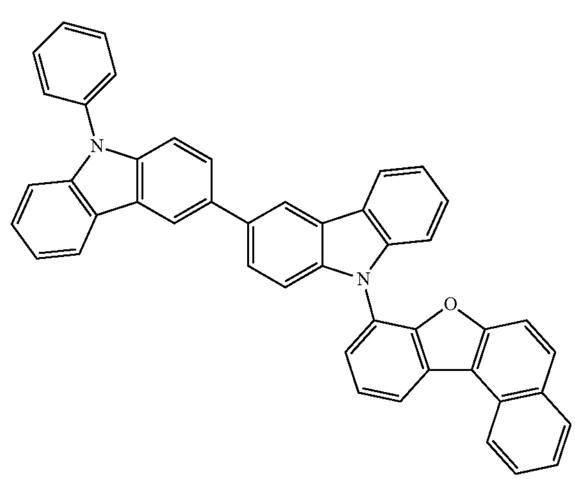
N
N
O

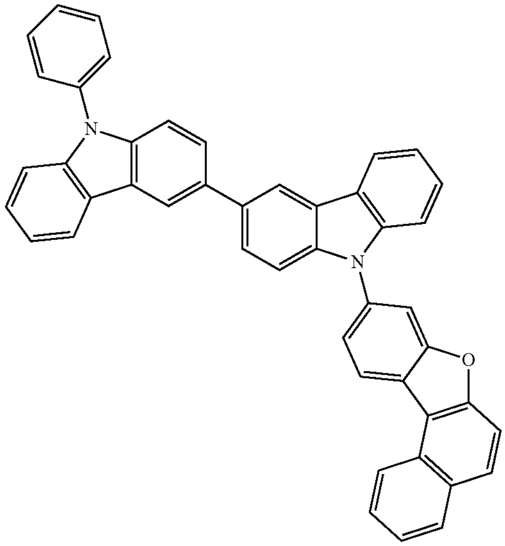
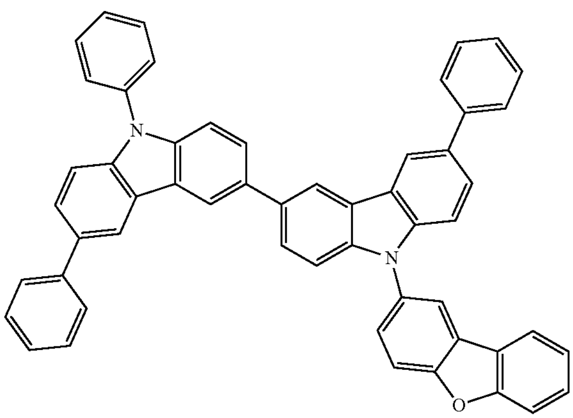
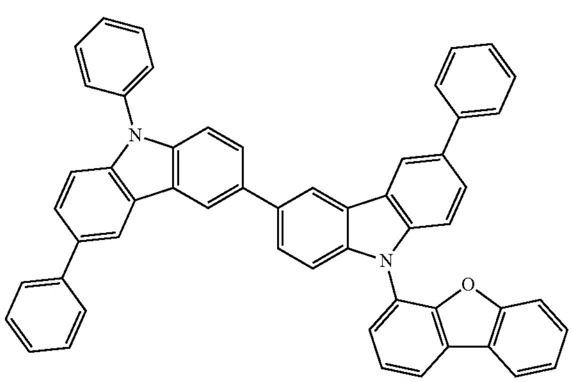
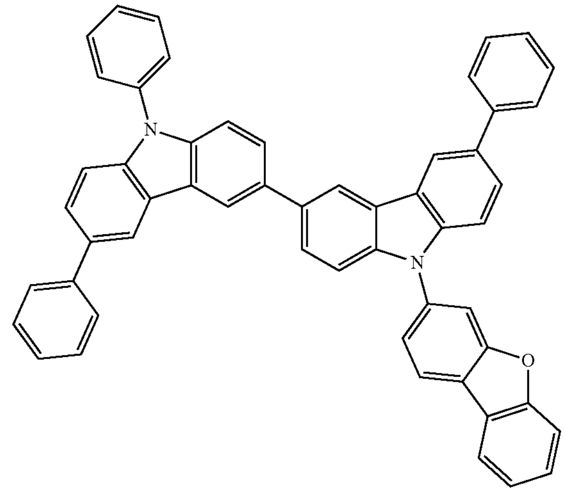
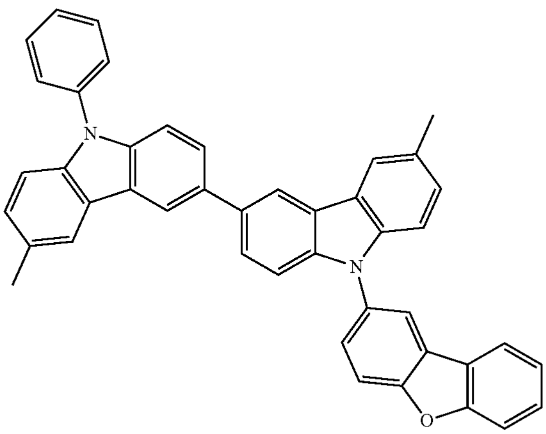
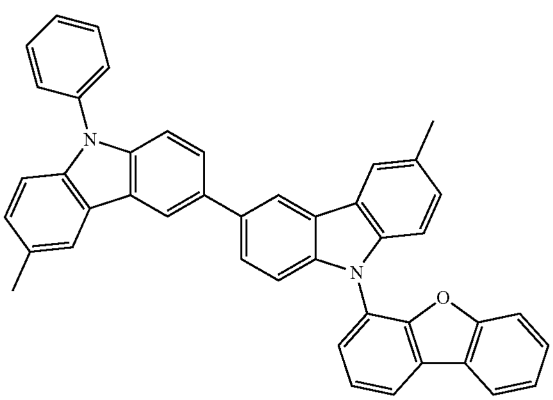

-continued
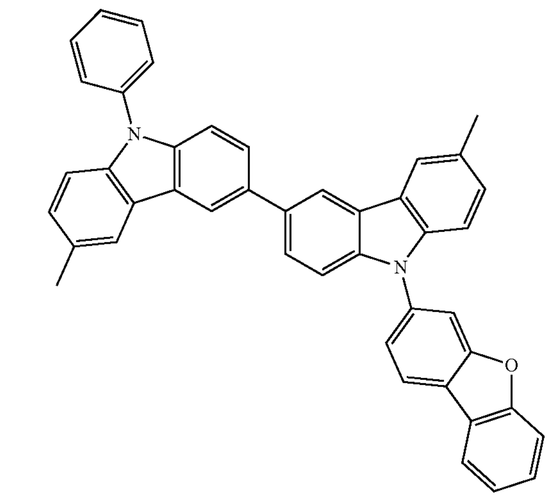
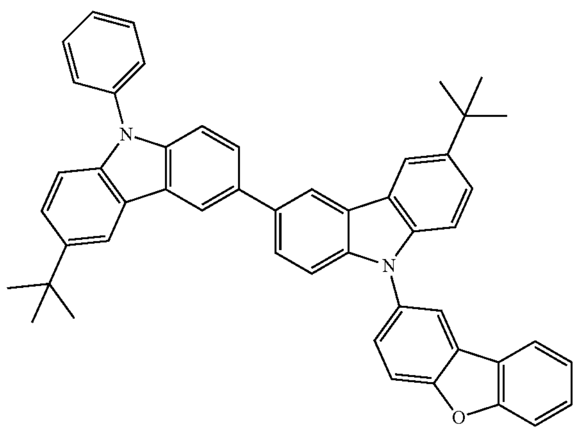
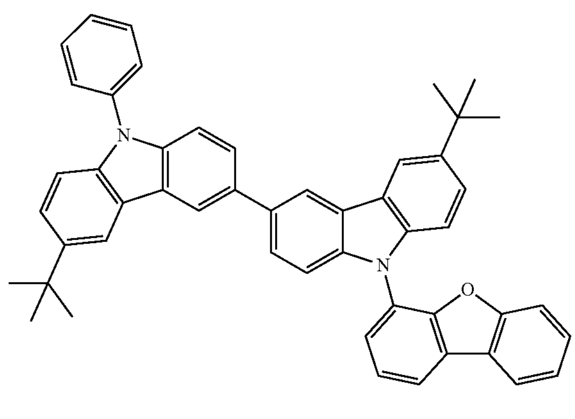
-continued
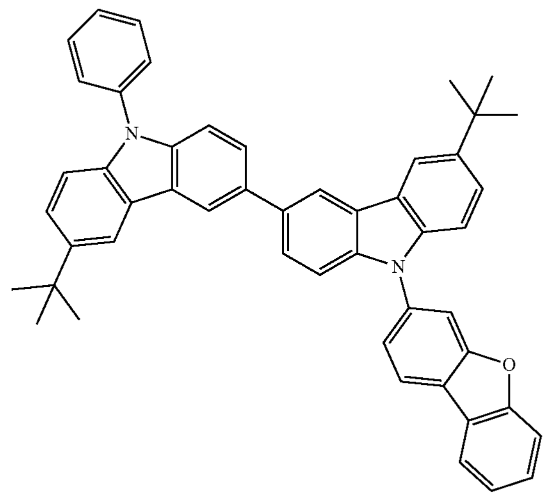
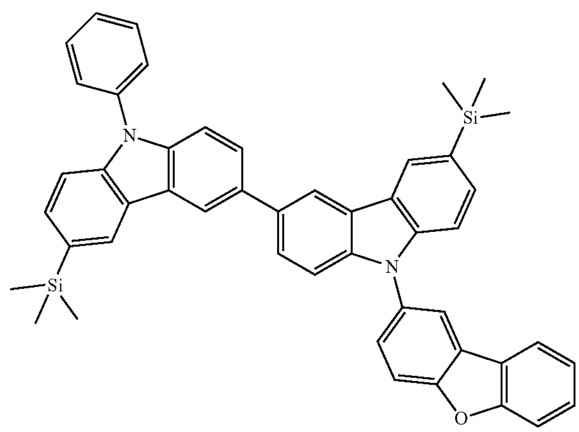
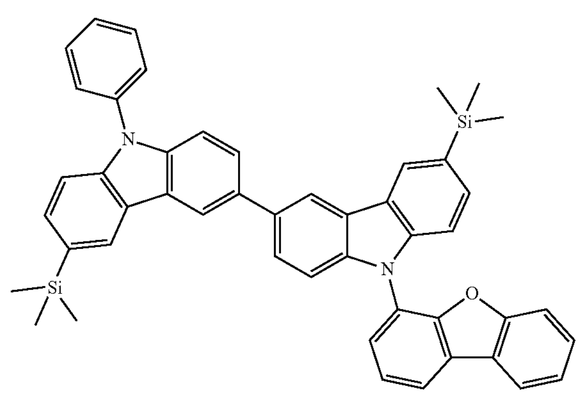

-continued
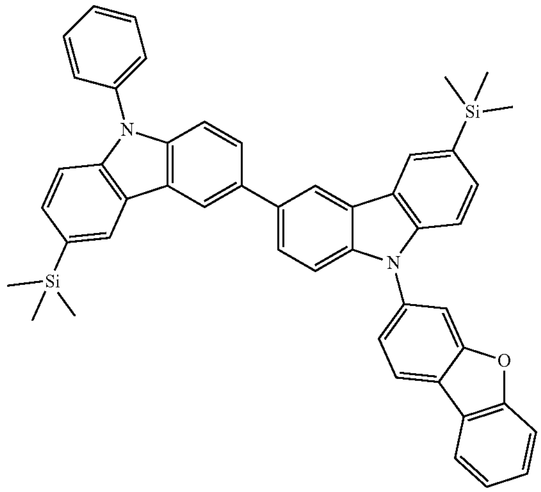
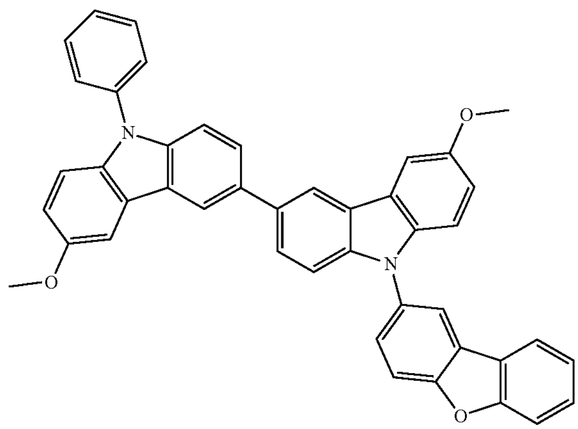
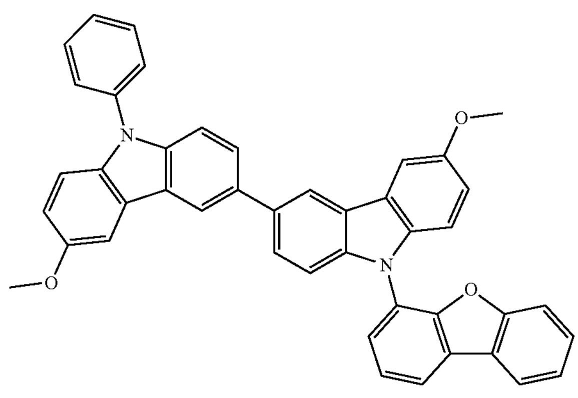
-continued
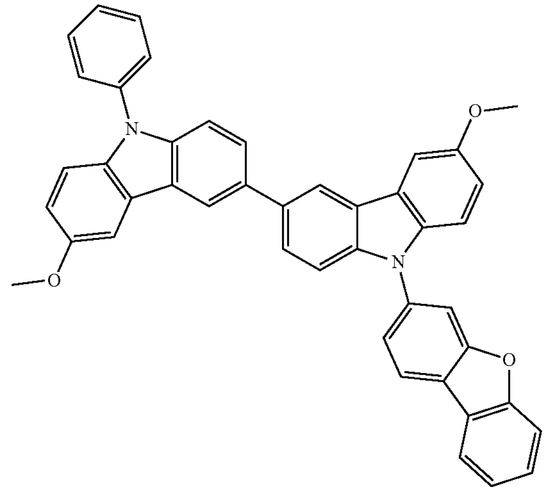
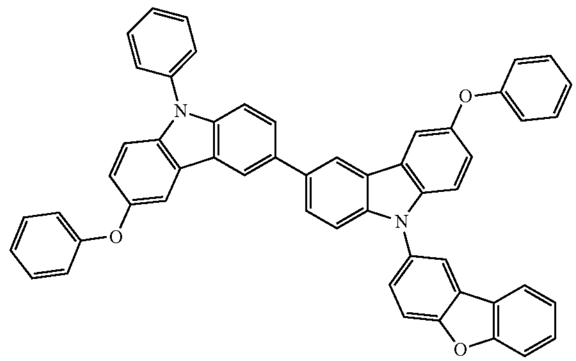
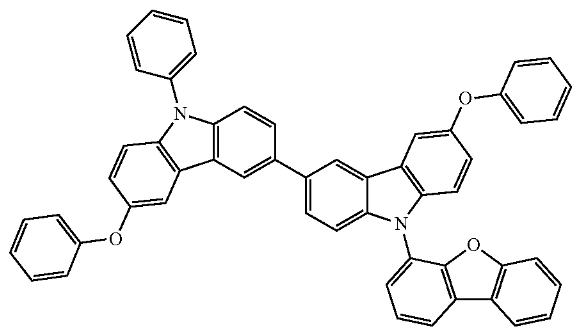
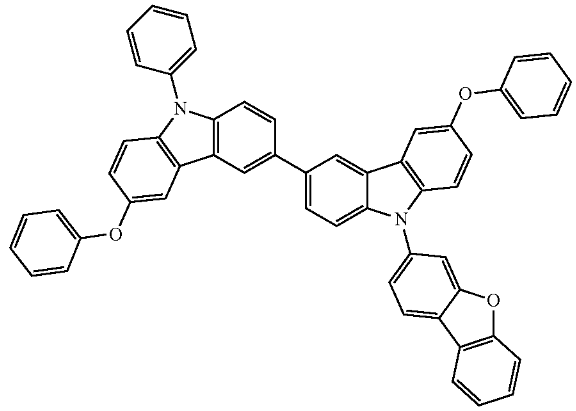

-continued
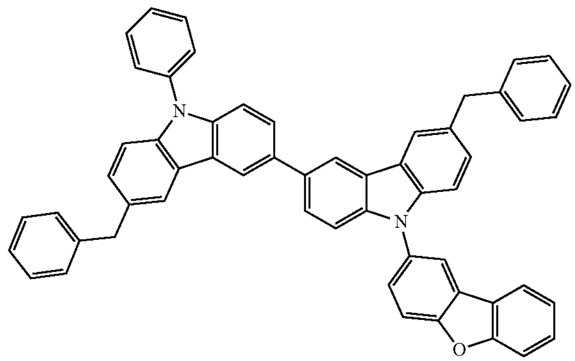
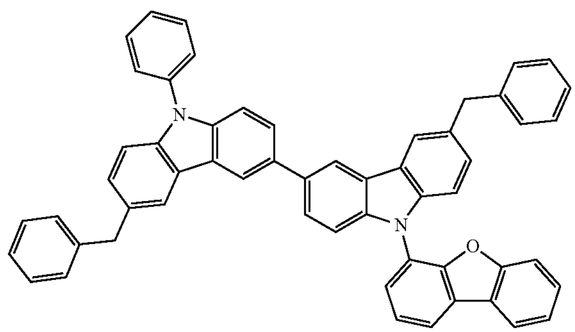
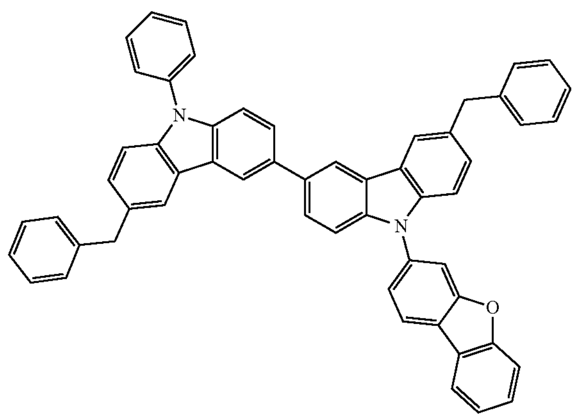
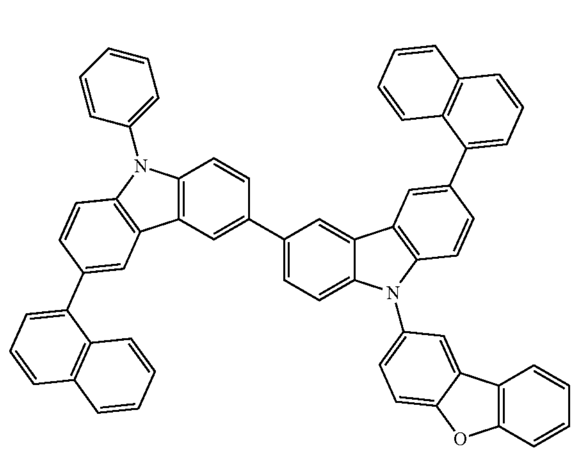
-continued
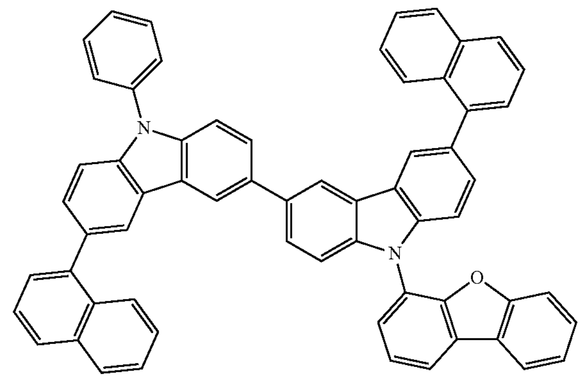
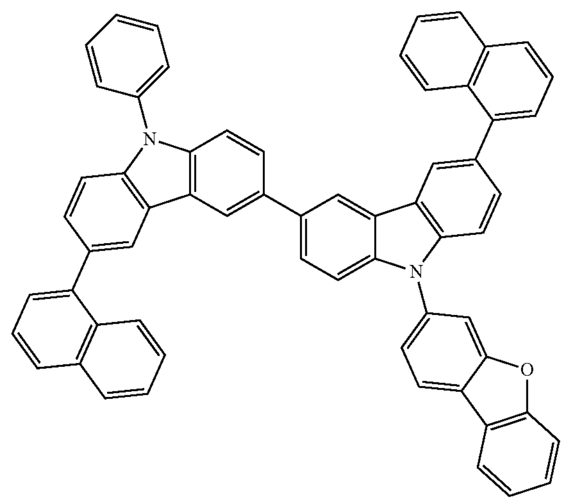
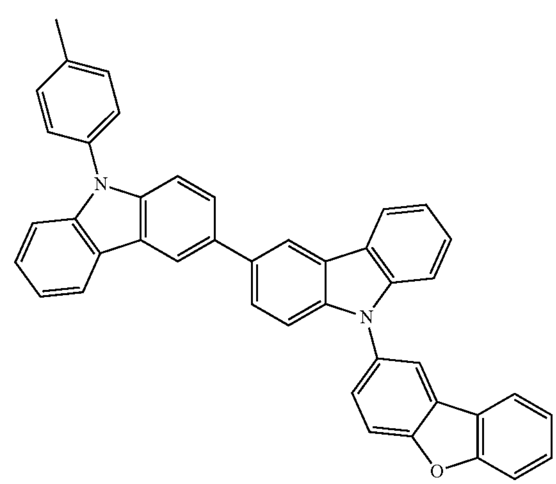

-continued
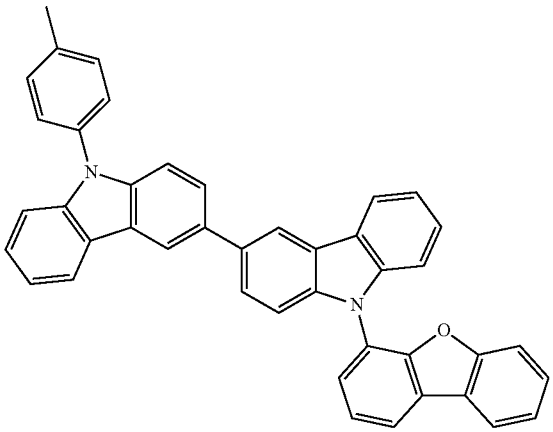
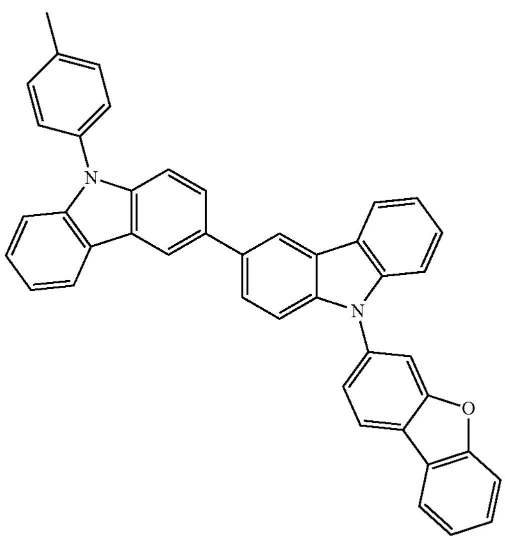
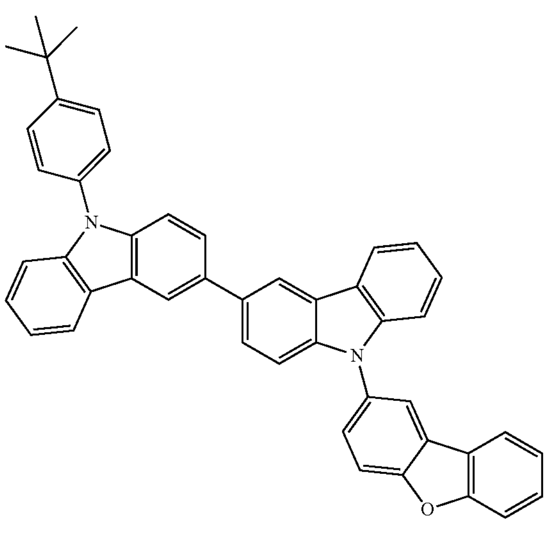
-continued
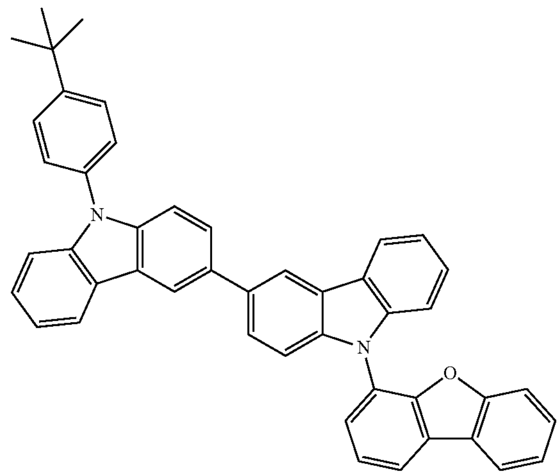
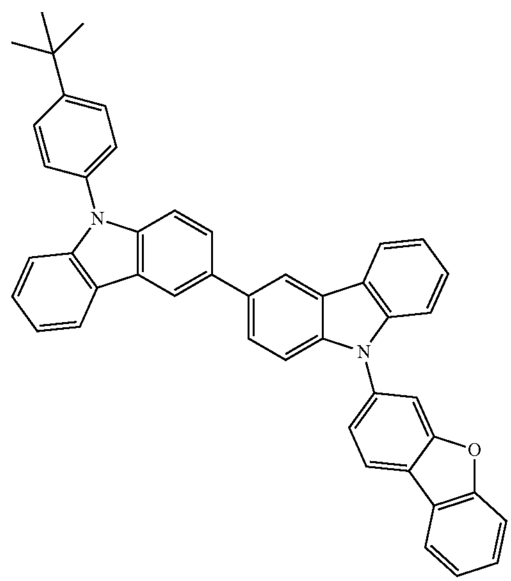
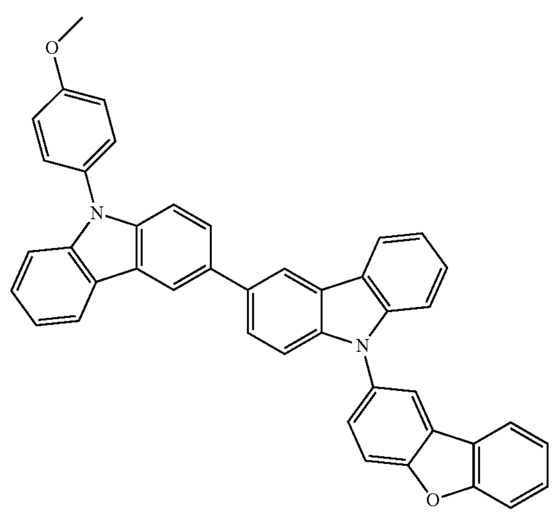

-continued
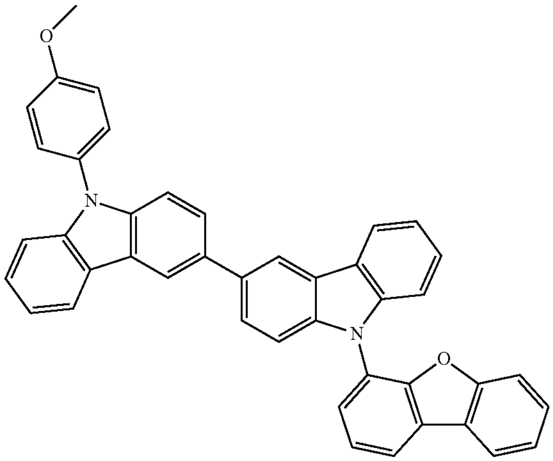
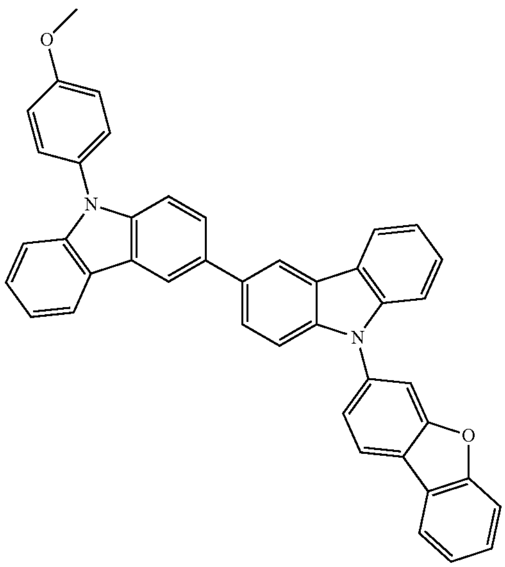
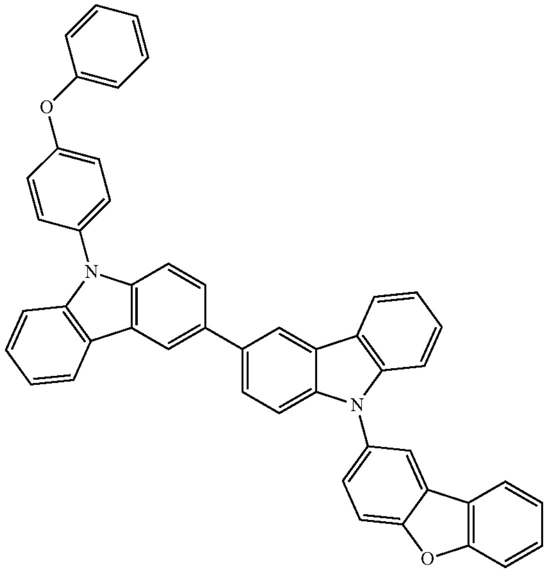
-continued
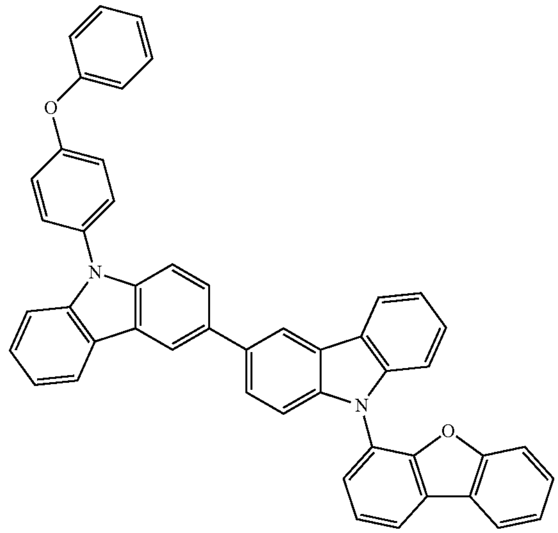
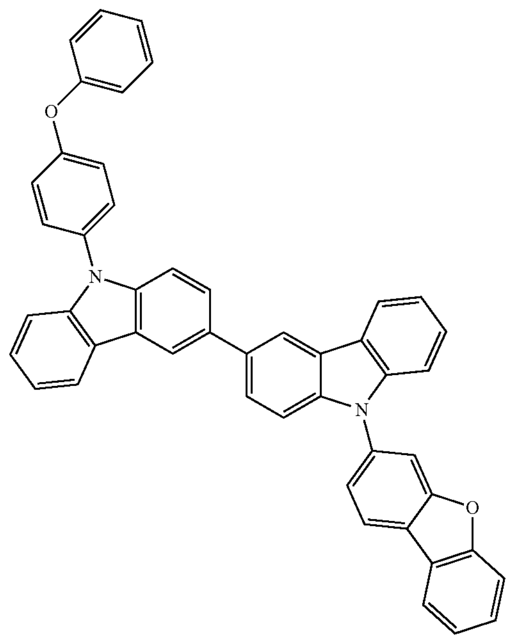
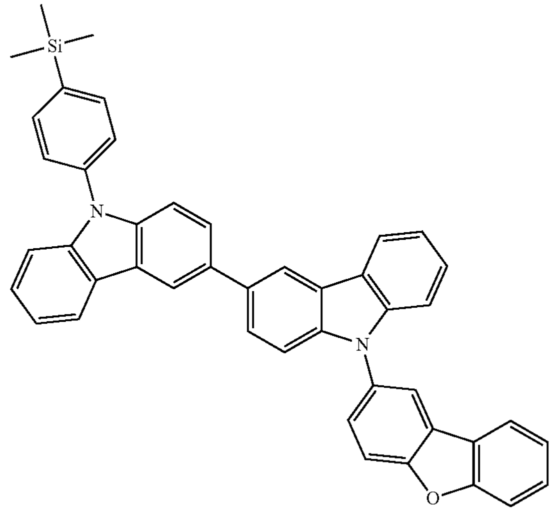

-continued
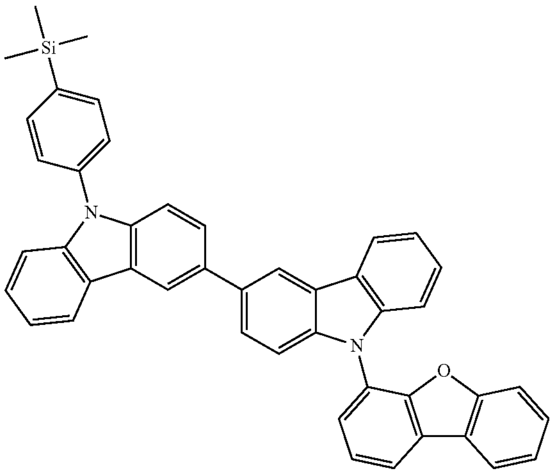
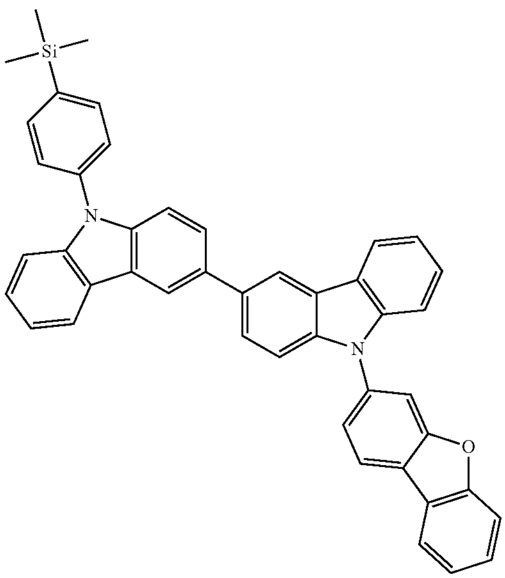
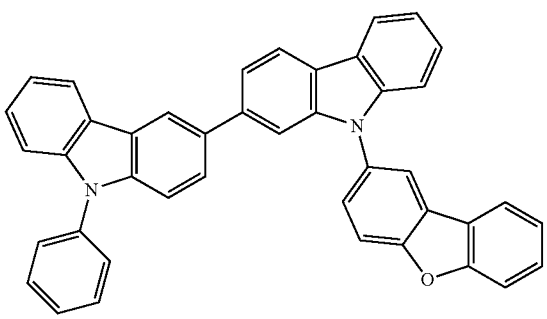
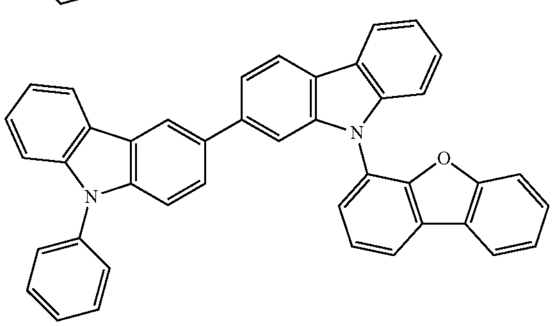
-continued
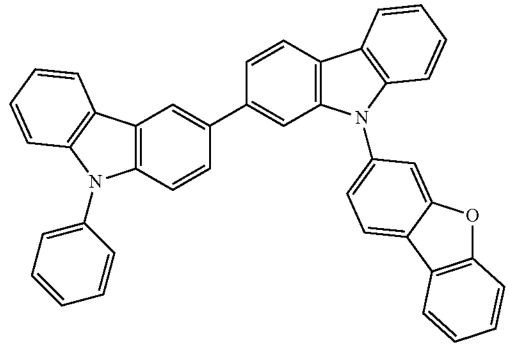
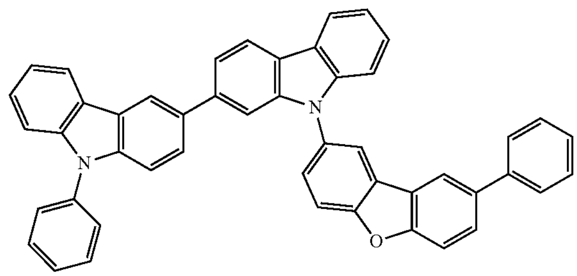
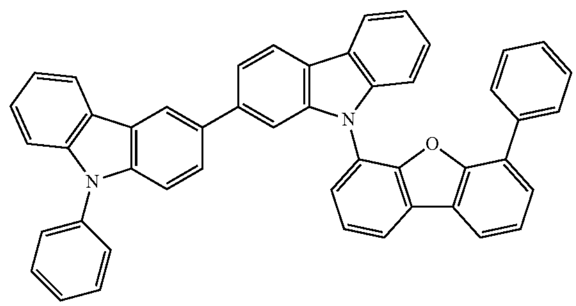
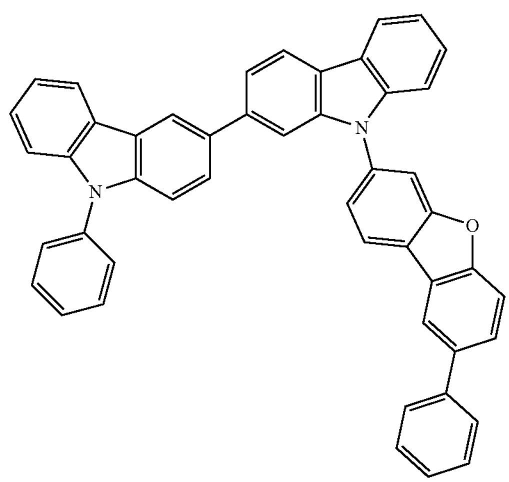

-continued
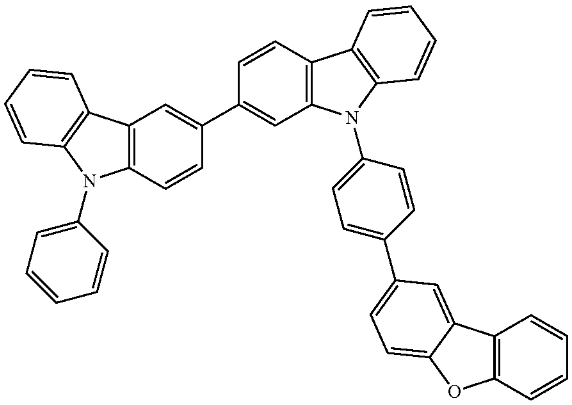
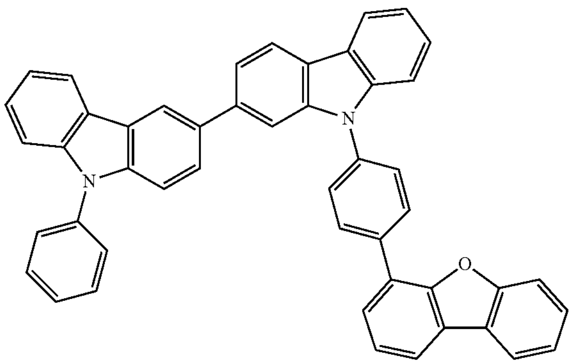
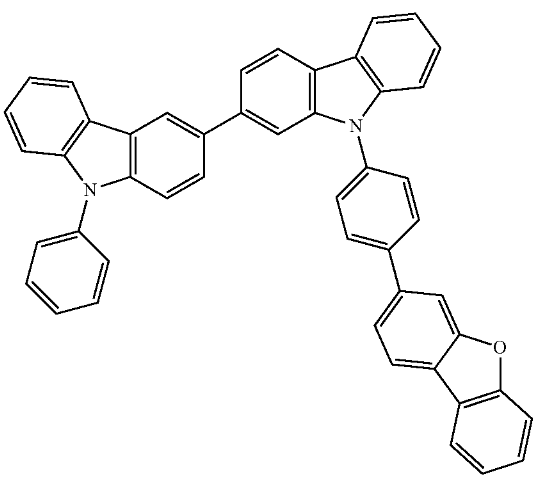
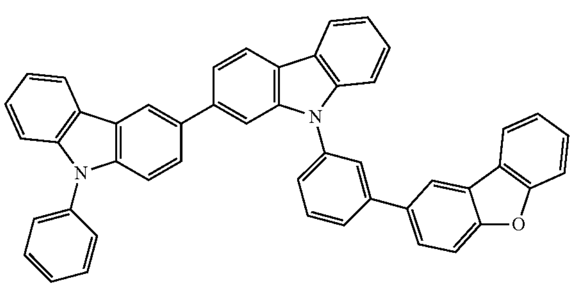
-continued
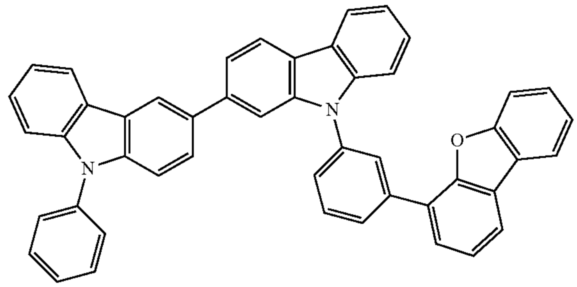
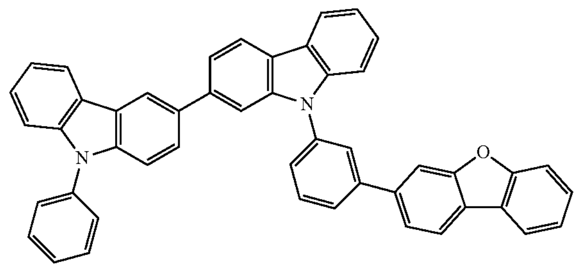
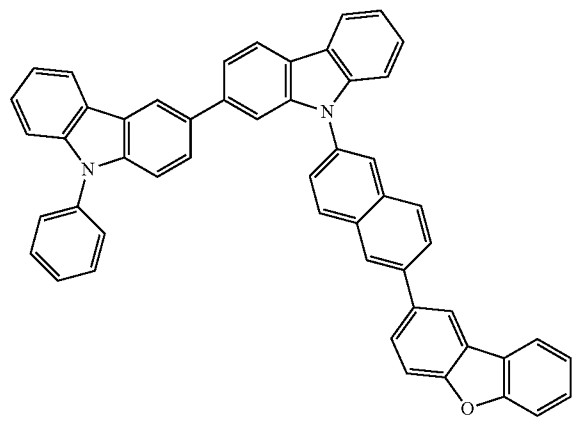
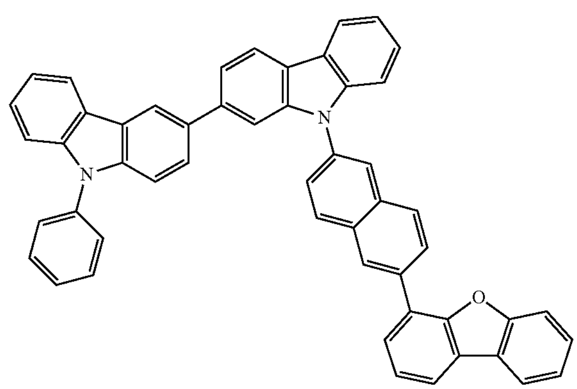

-continued
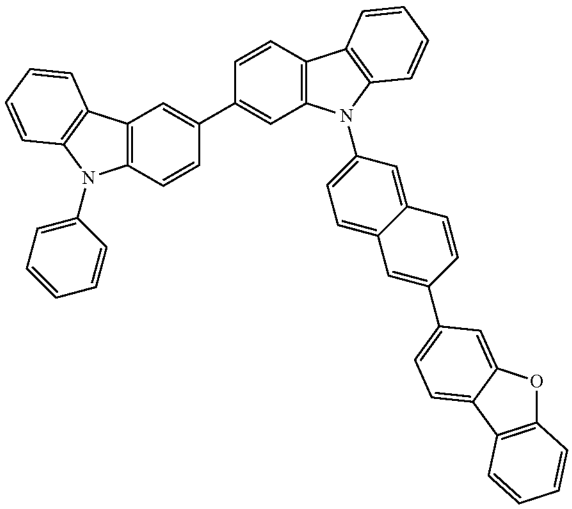
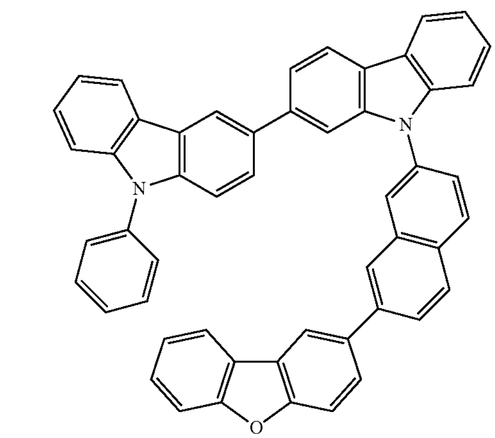
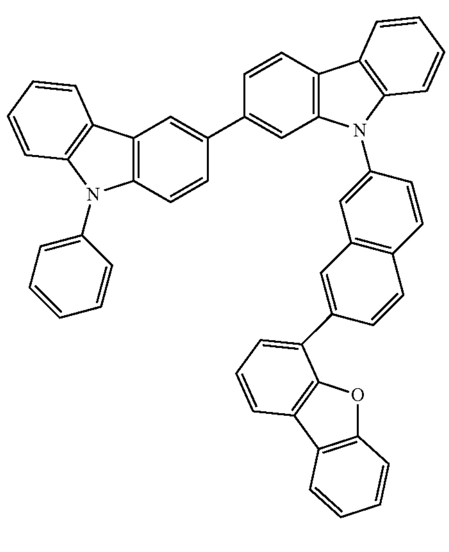
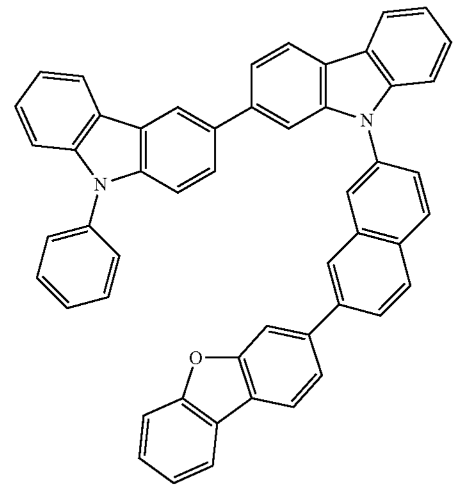
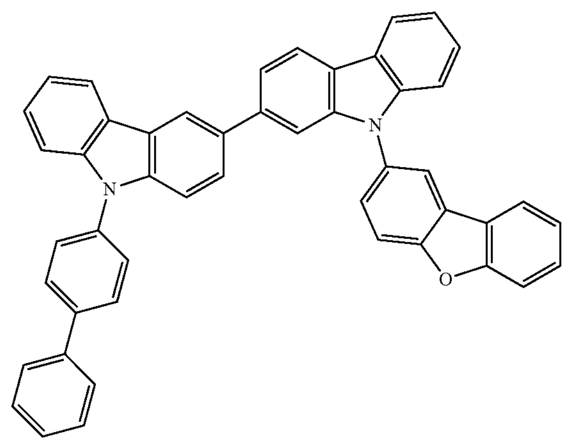
-continued
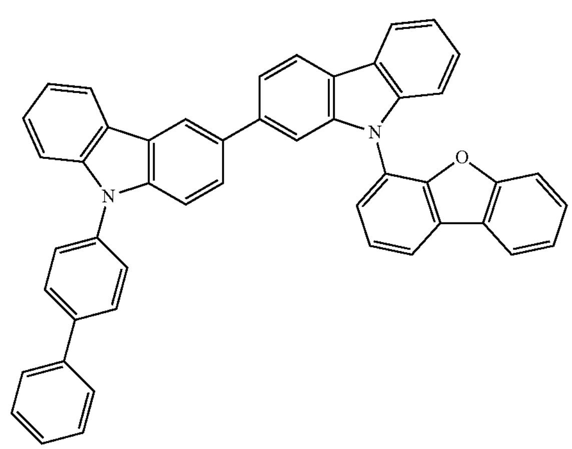

-continued
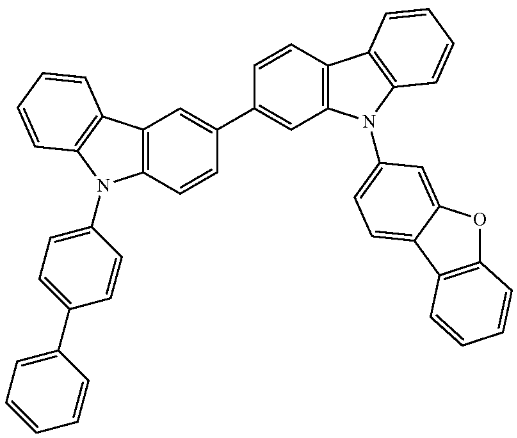
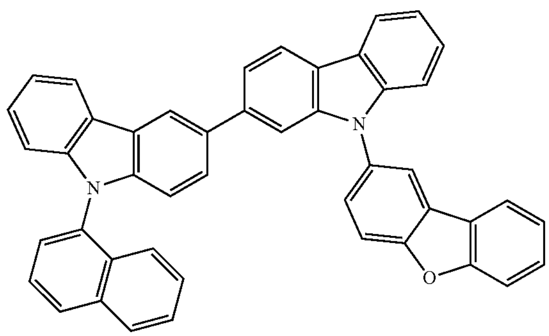
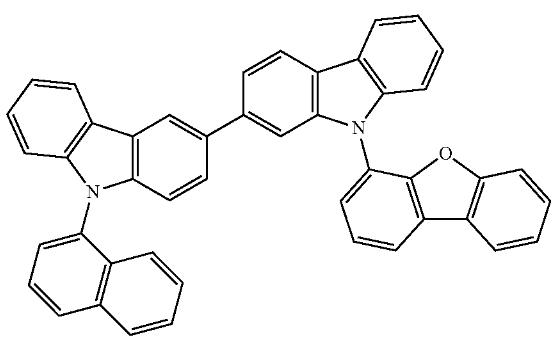
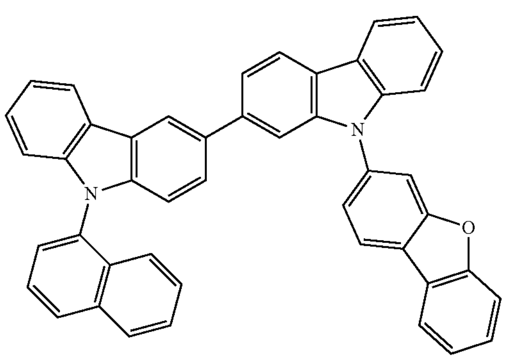
-continued
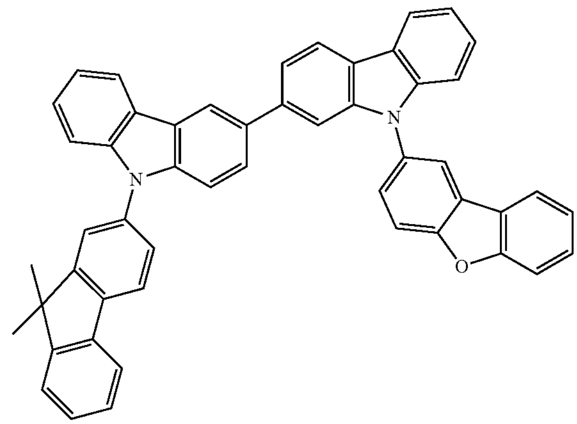
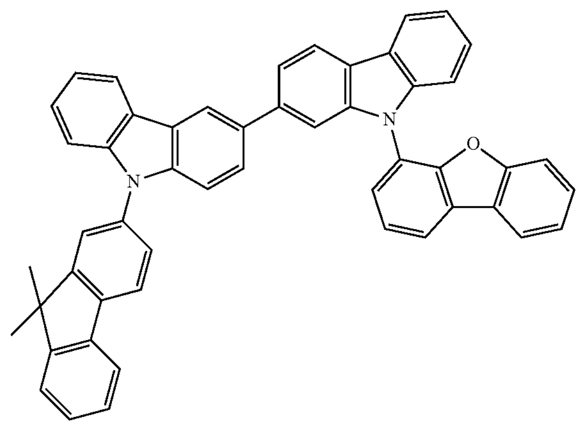
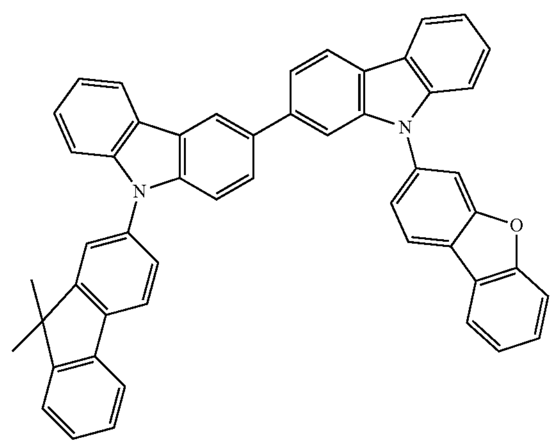
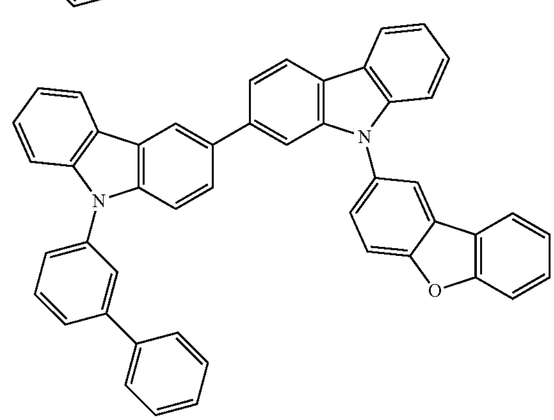

-continued
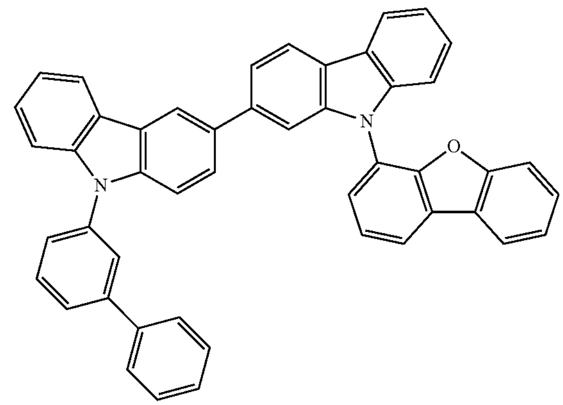
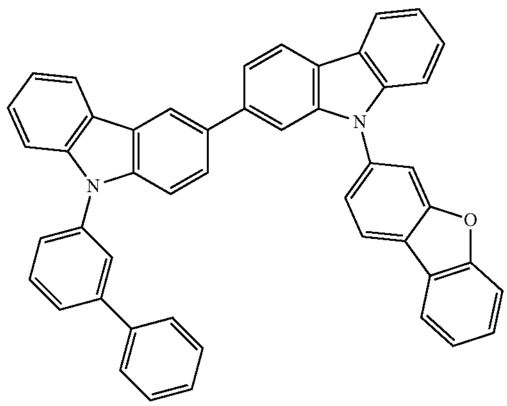
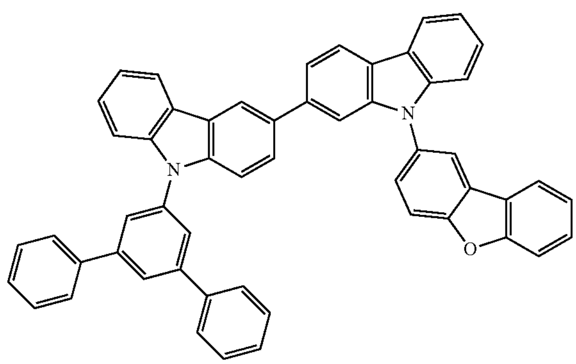
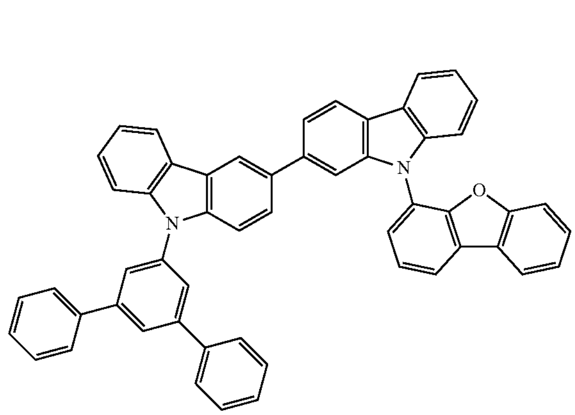
-continued
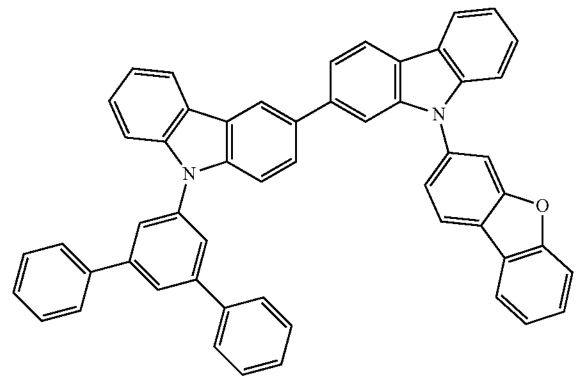
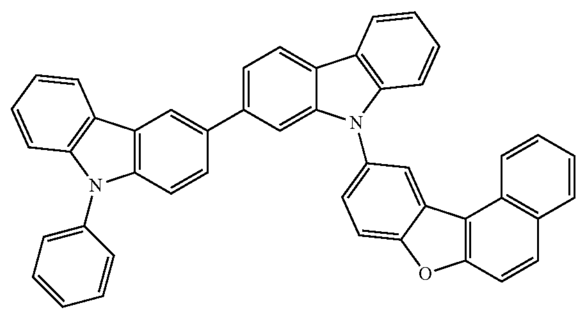
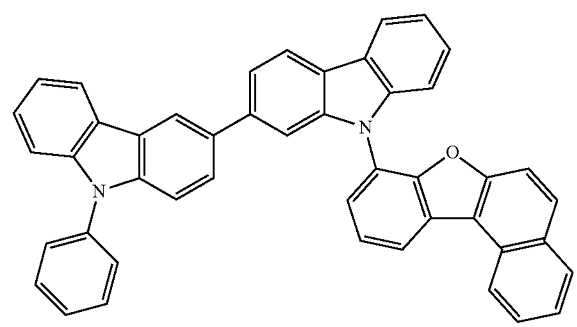
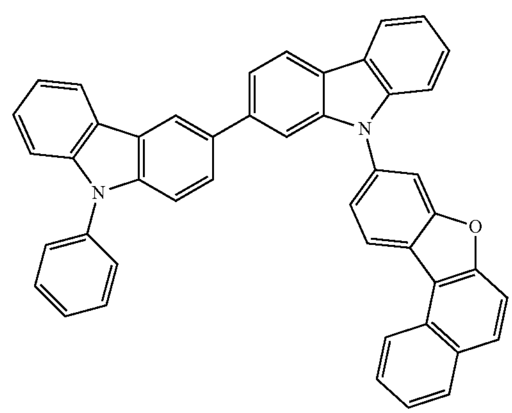

-continued
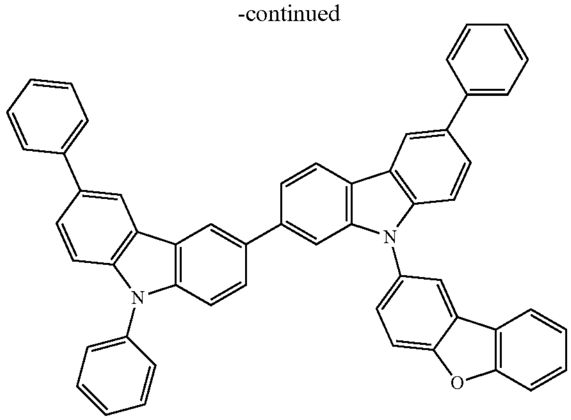
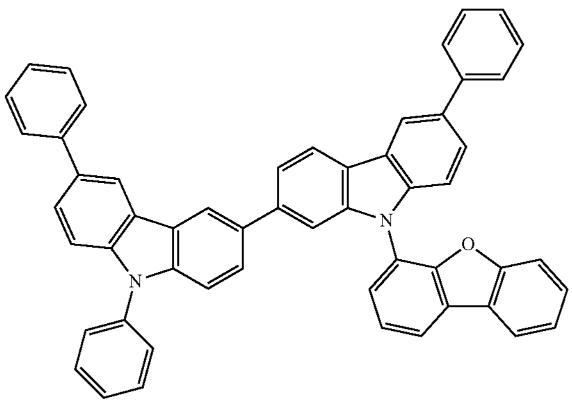
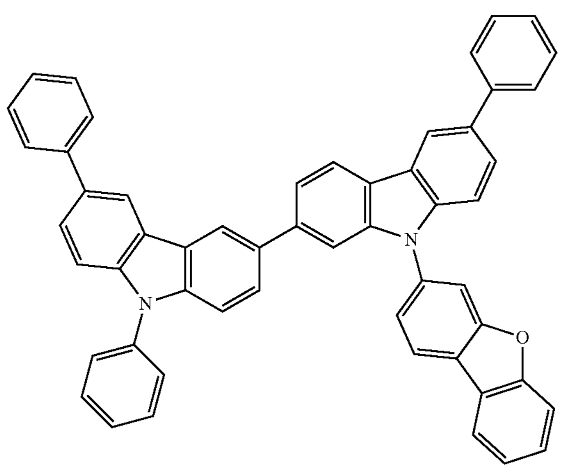
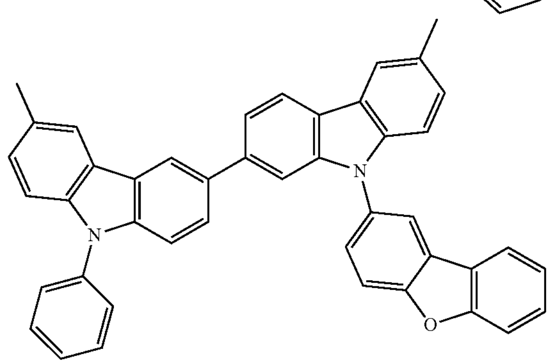
-continued
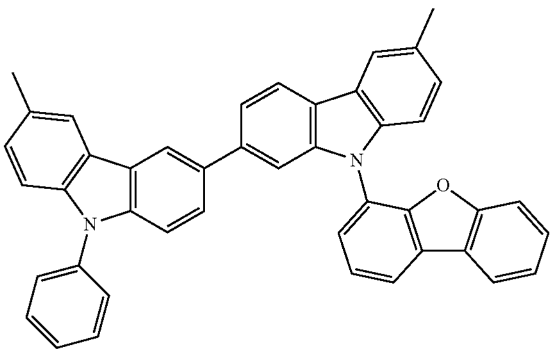
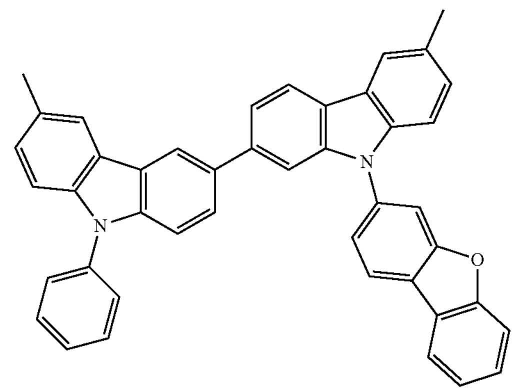
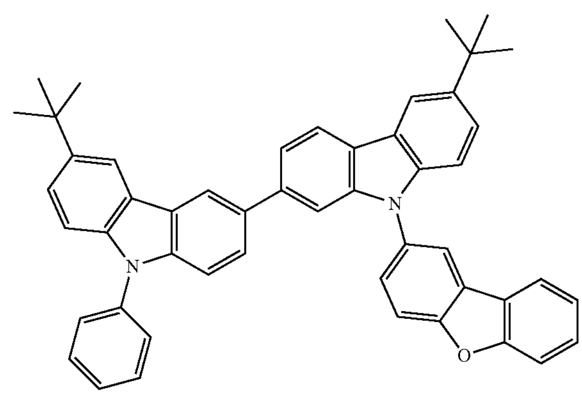
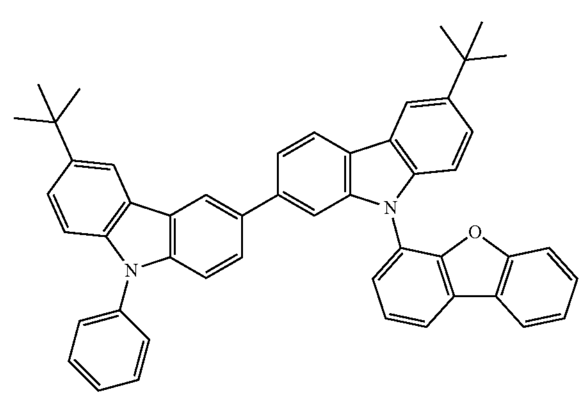

-continued
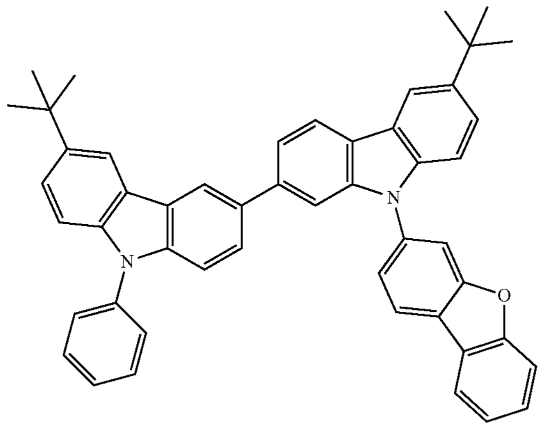
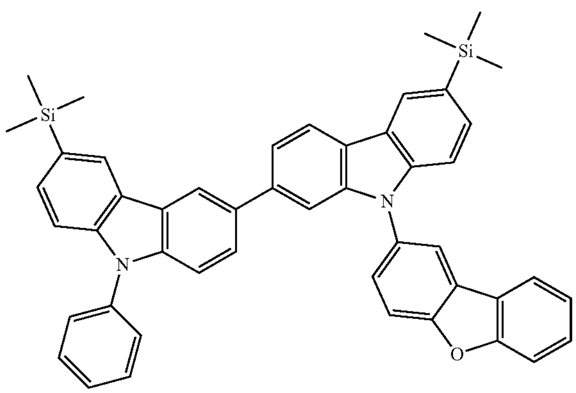
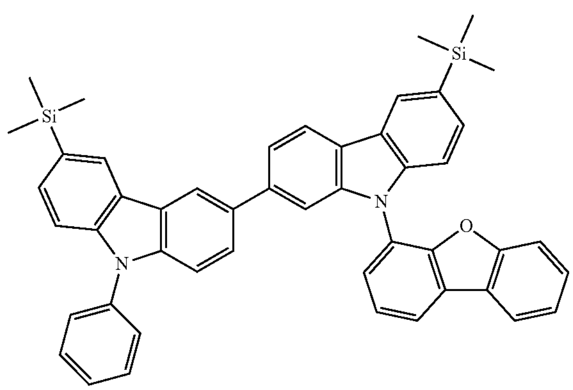
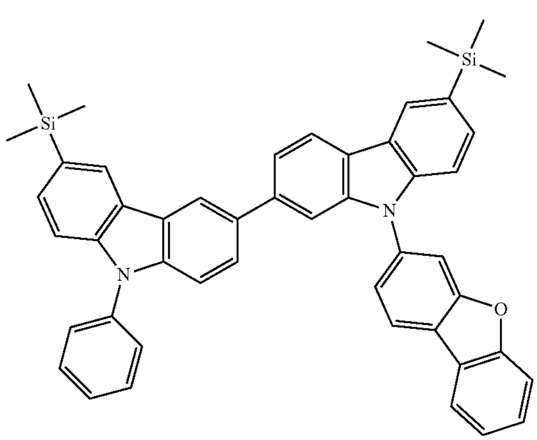
-continued
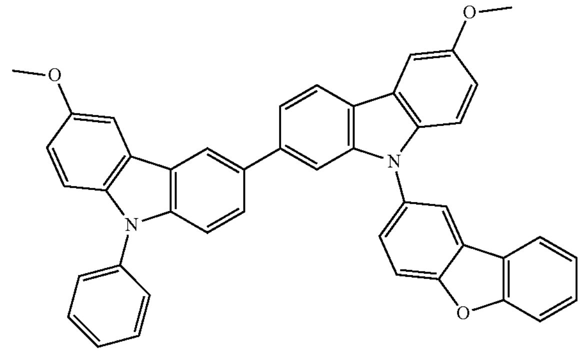
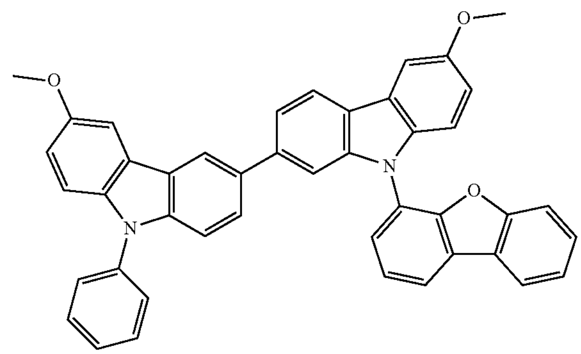
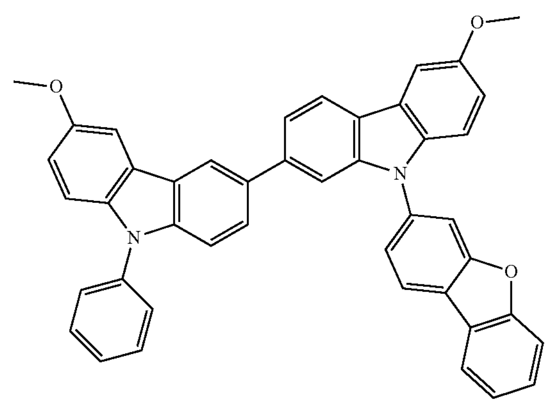
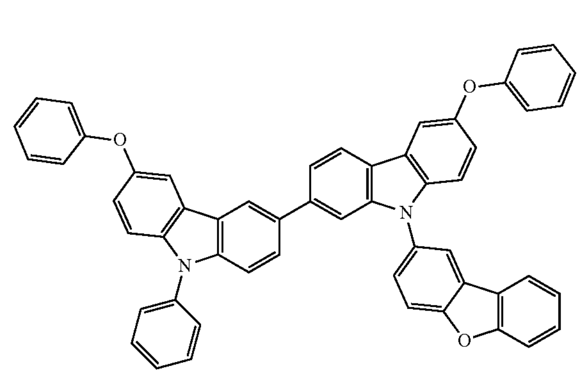

-continued
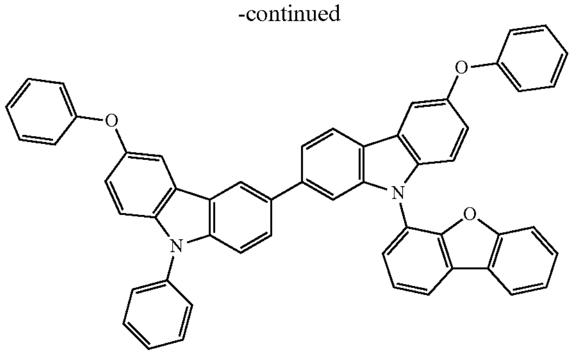
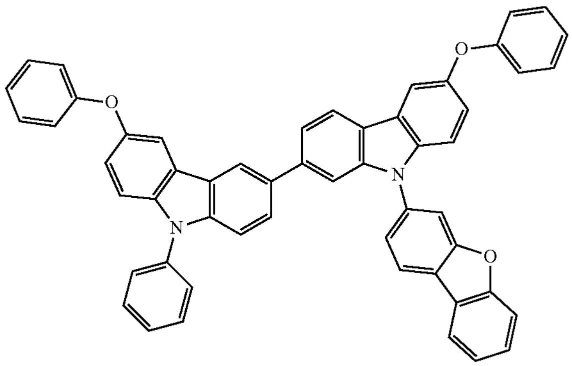
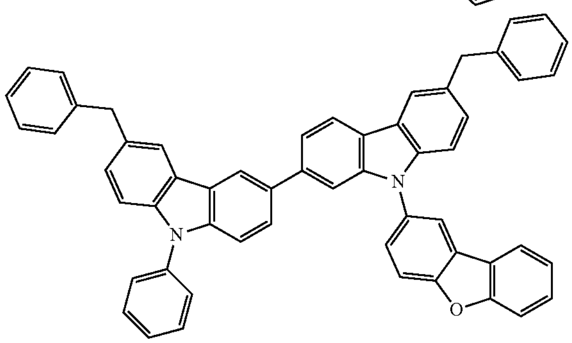
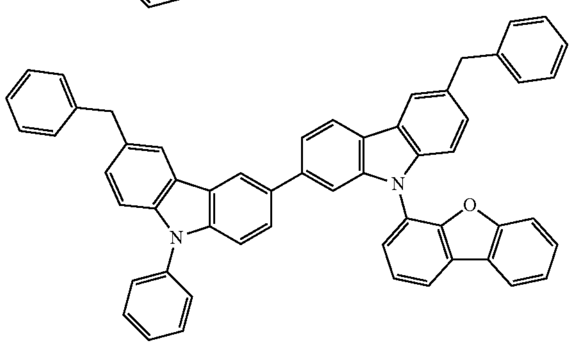
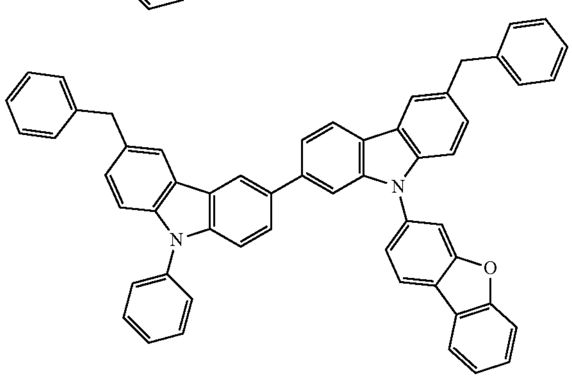
-continued
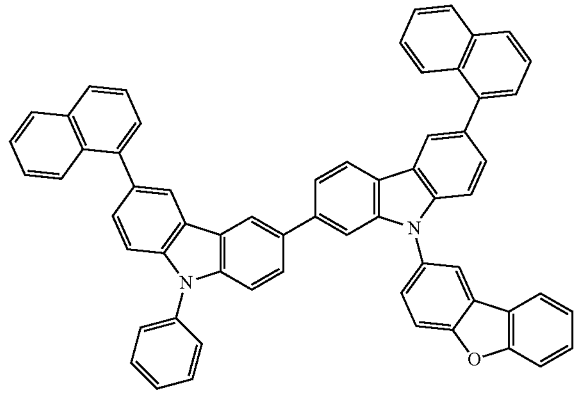
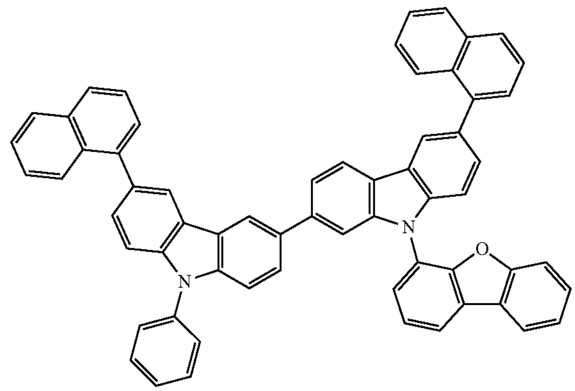
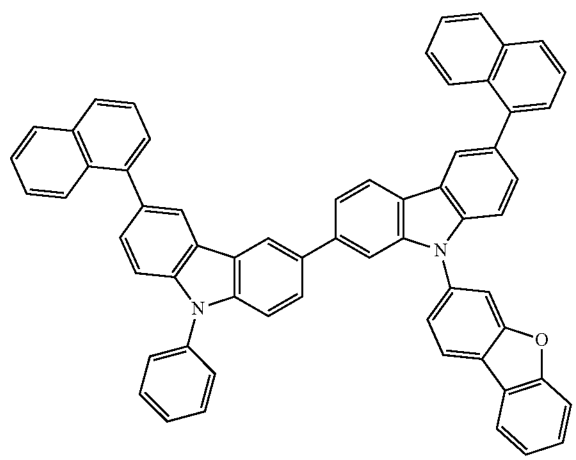
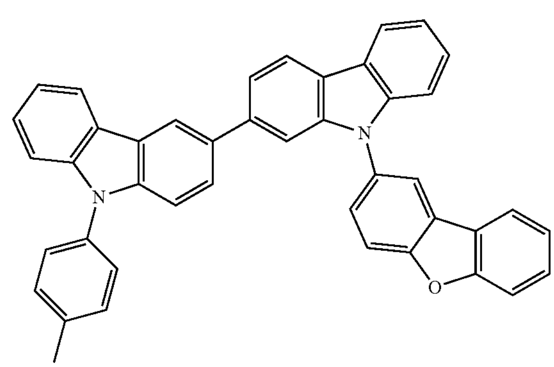

-continued
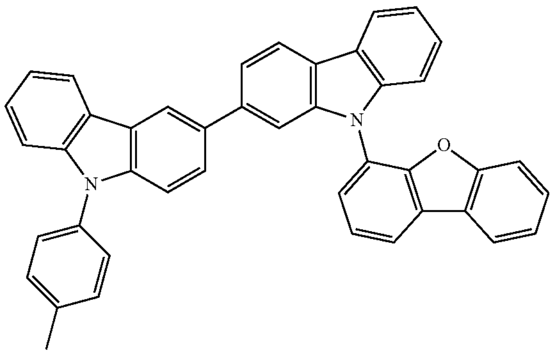
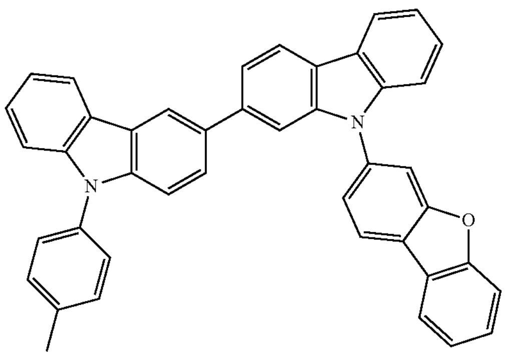
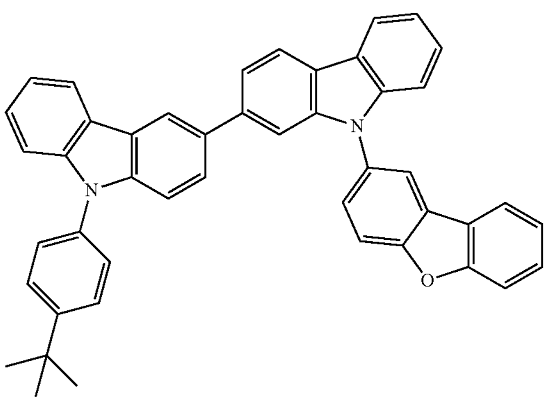
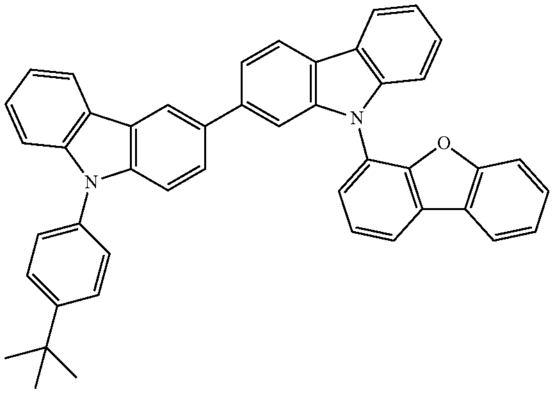
-continued
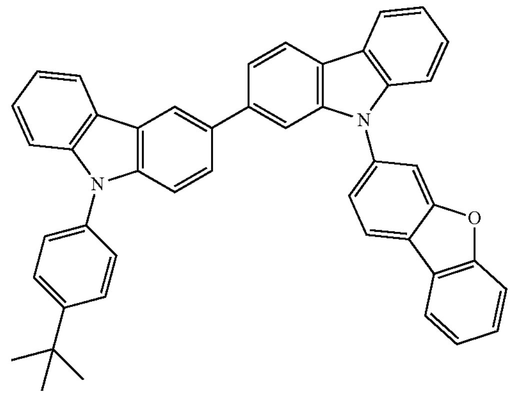
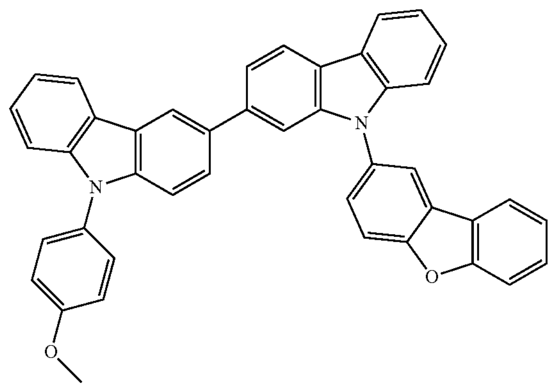
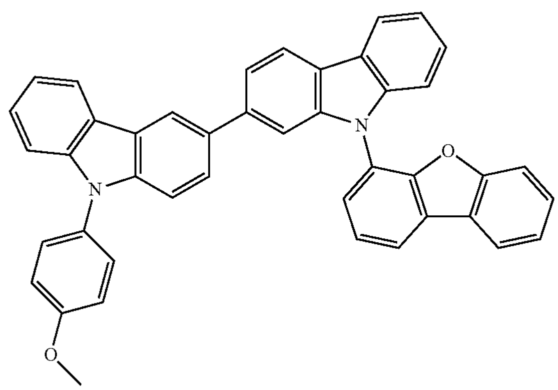
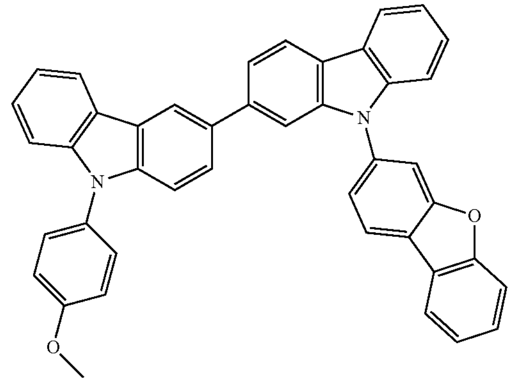

-continued
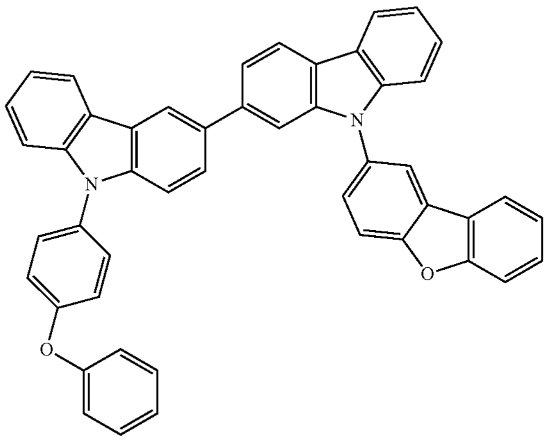
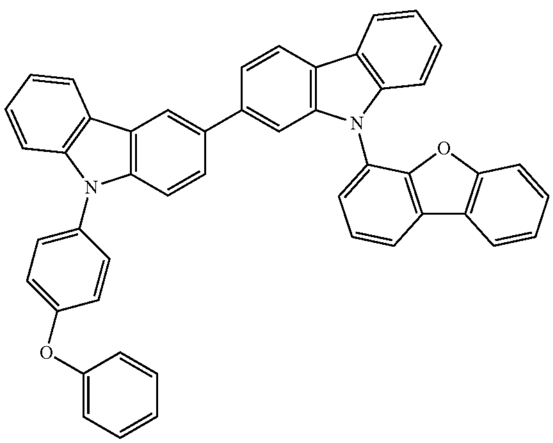
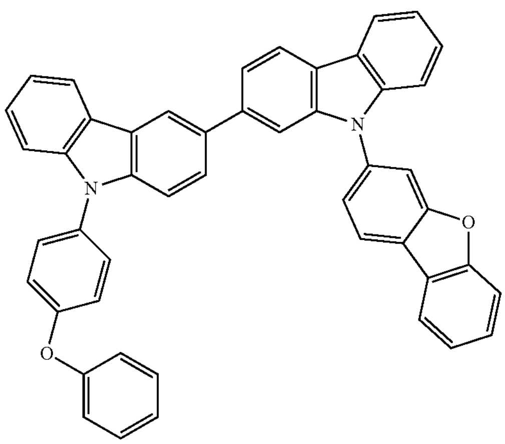
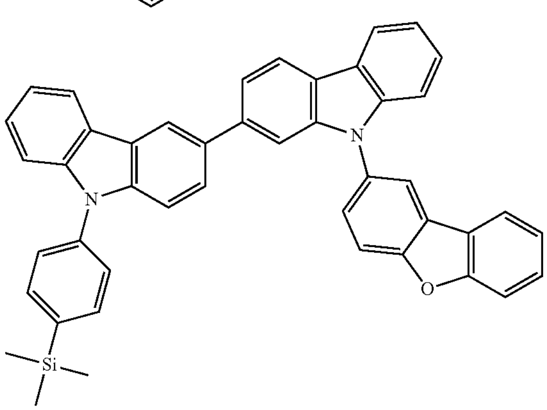
-continued
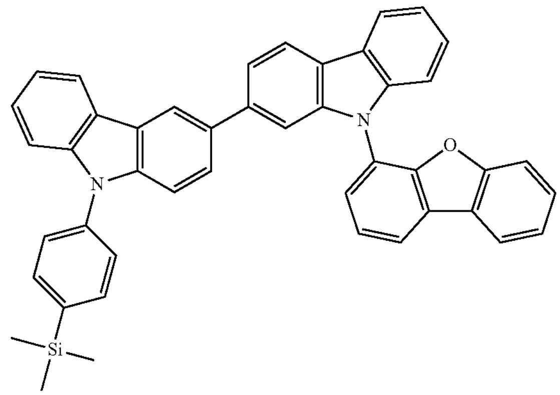
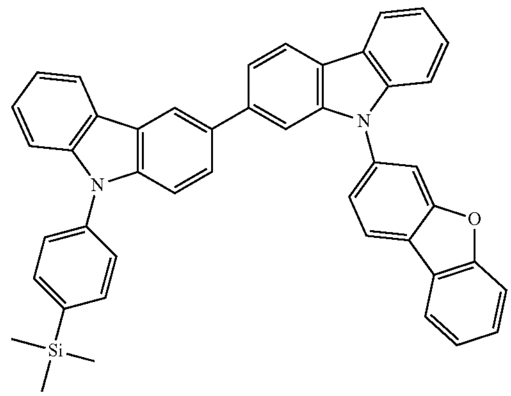
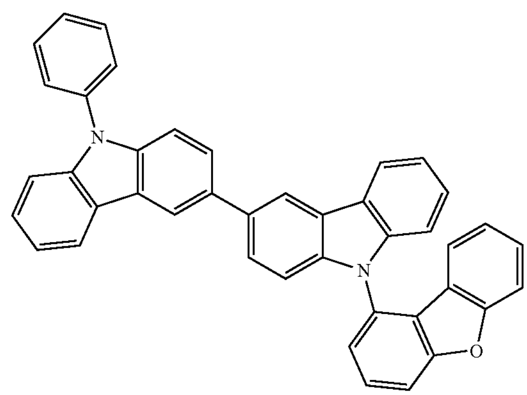
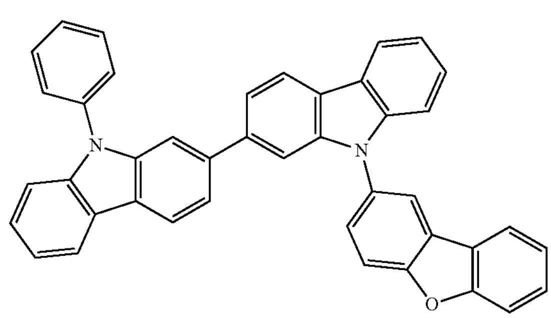

-continued
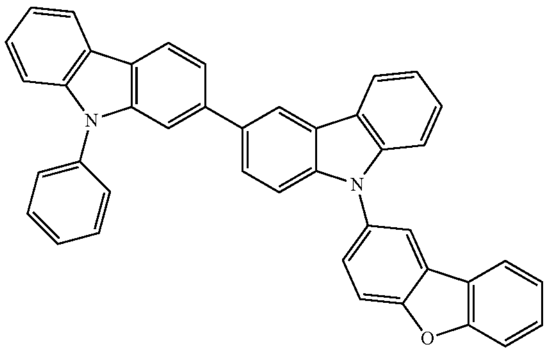
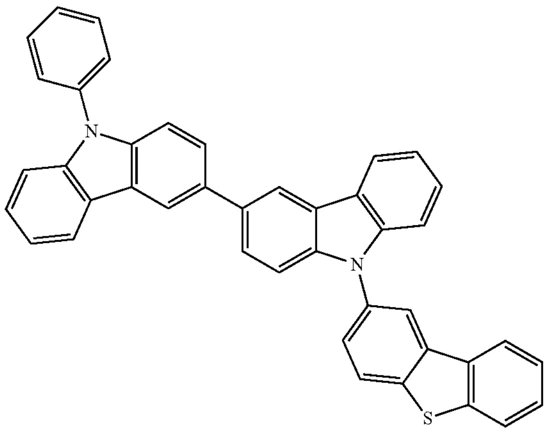
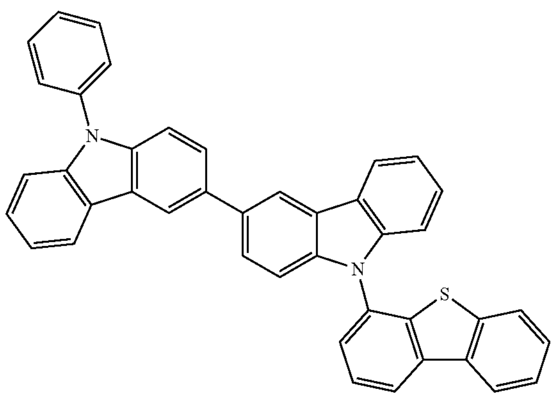
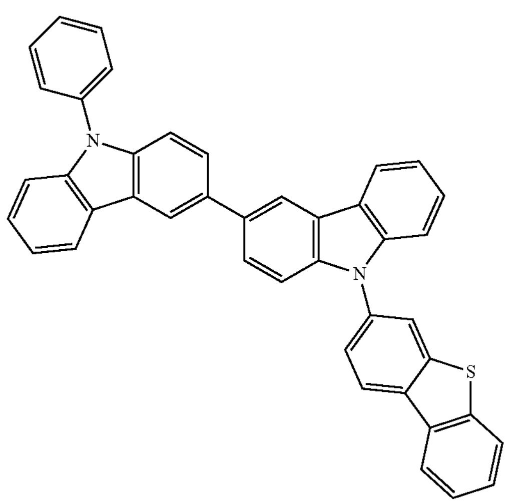
-continued
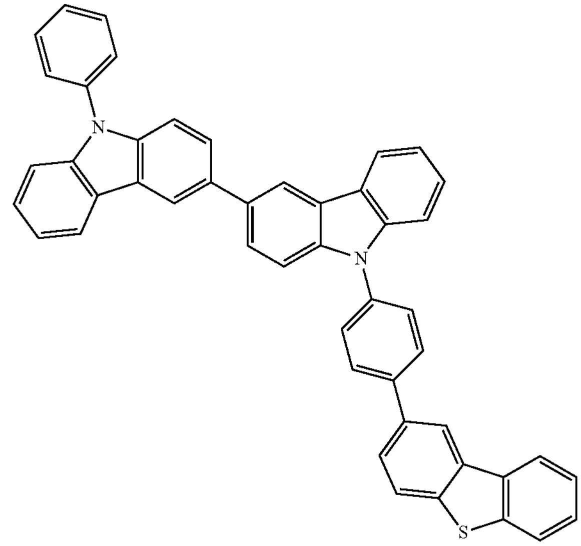
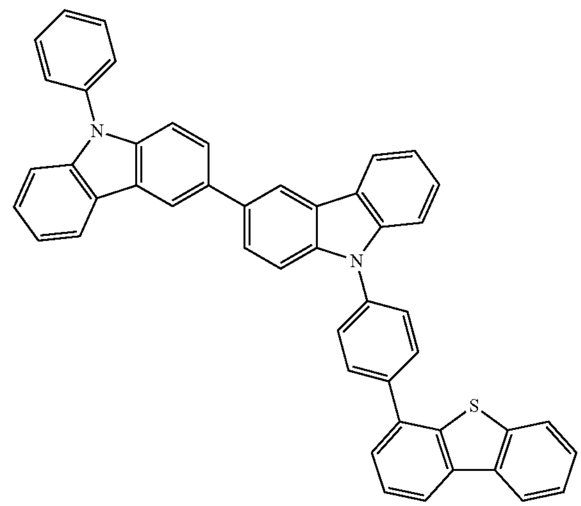
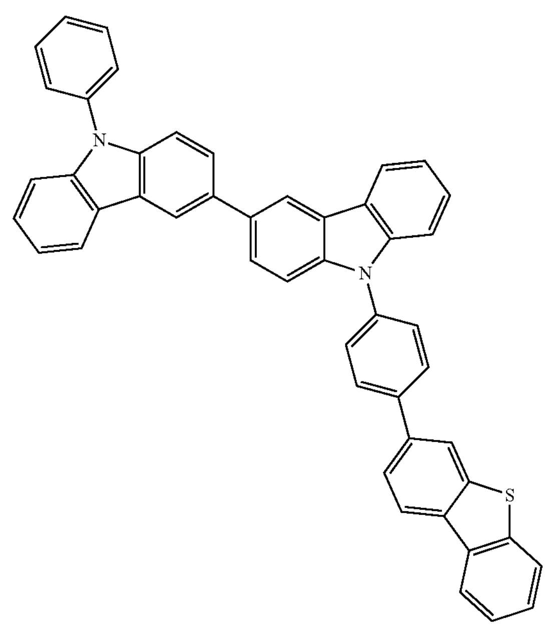

-continued
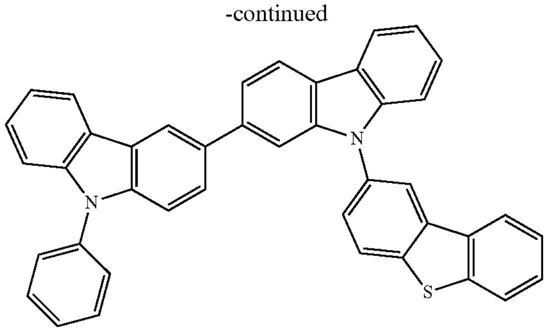
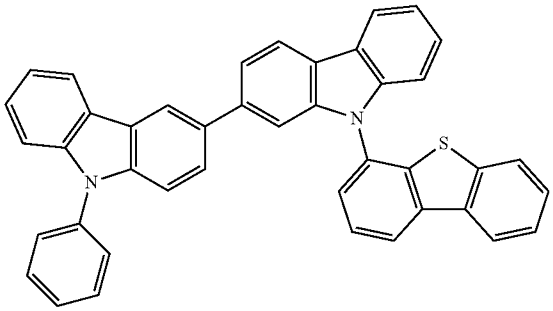
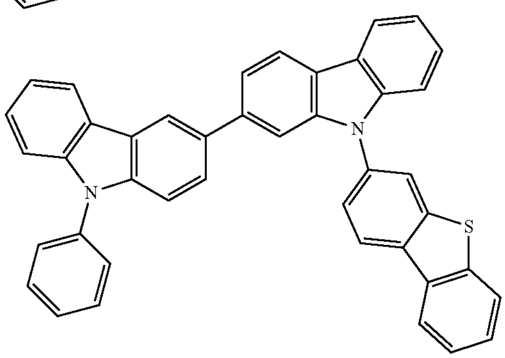
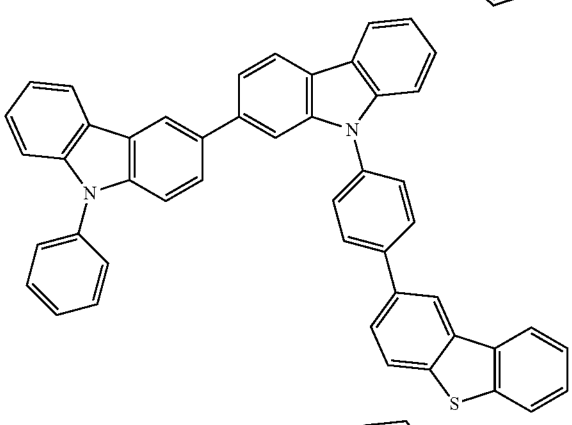
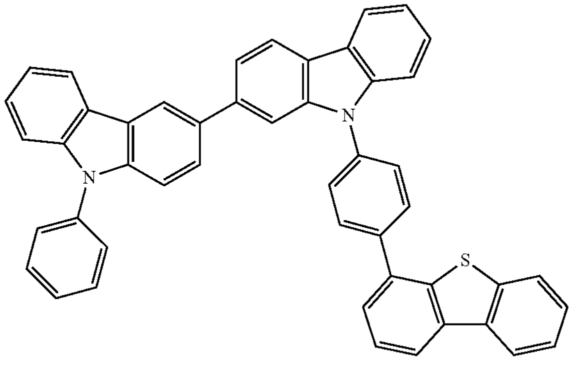
-continued
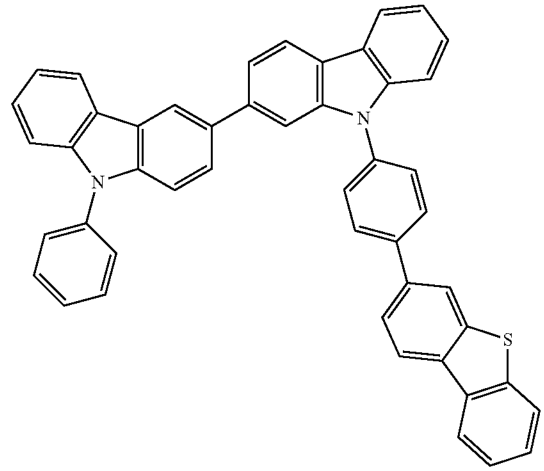
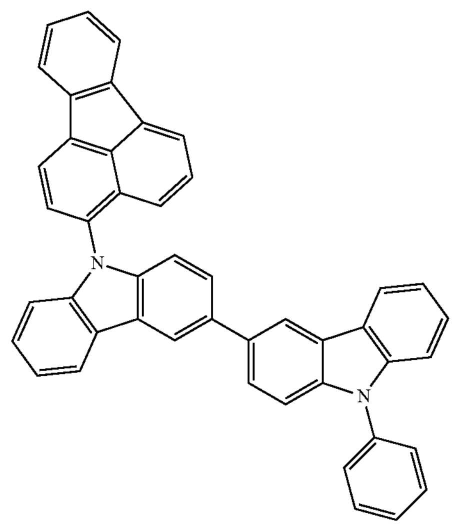
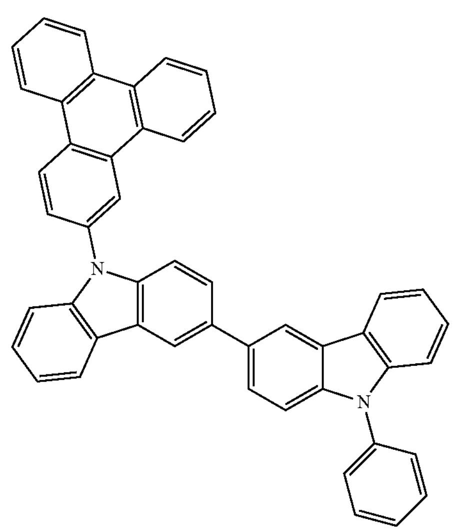

-continued
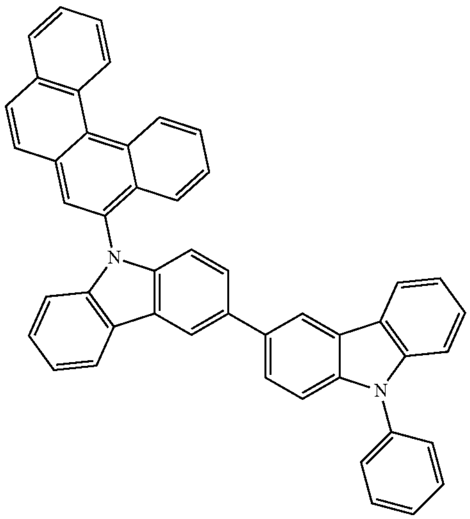
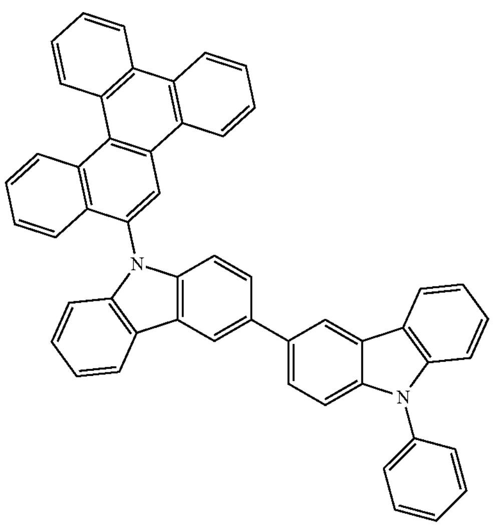
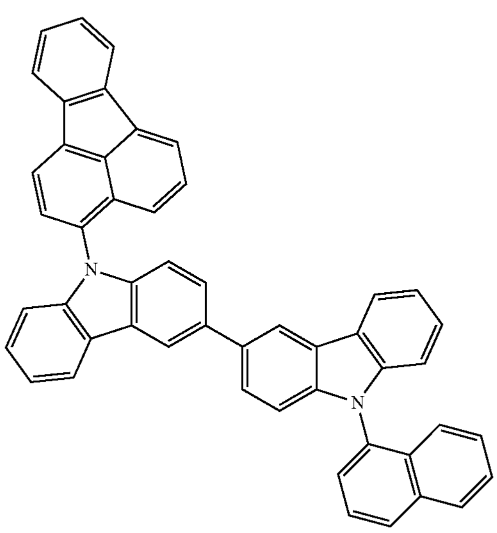
-continued
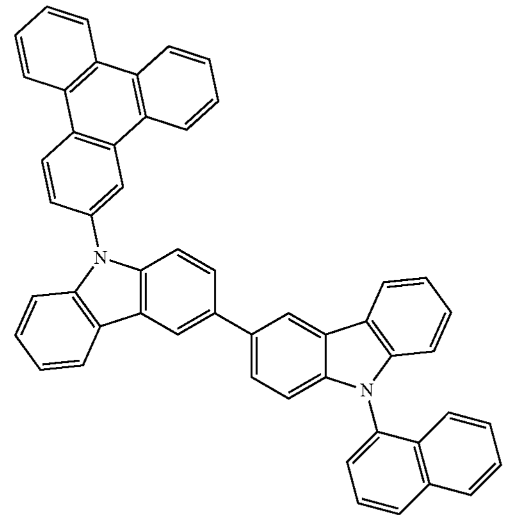
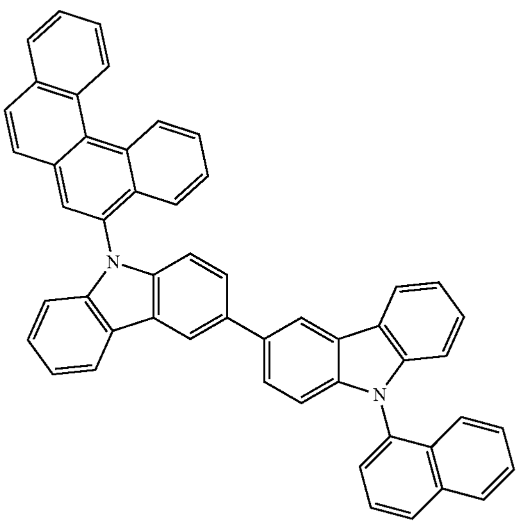
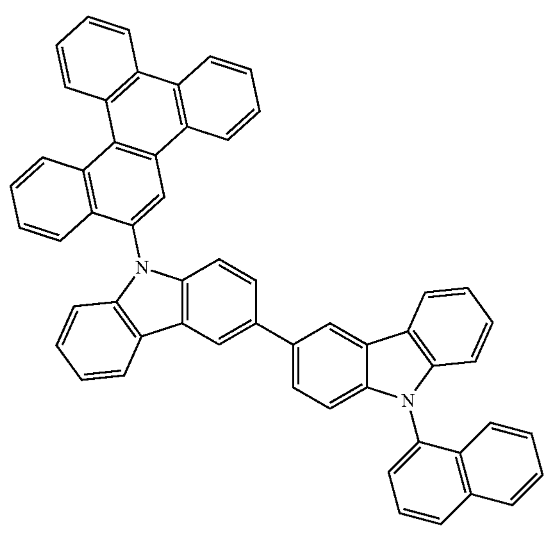

-continued
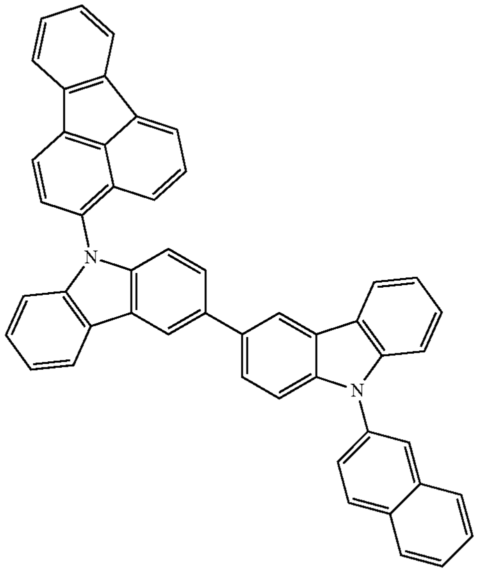
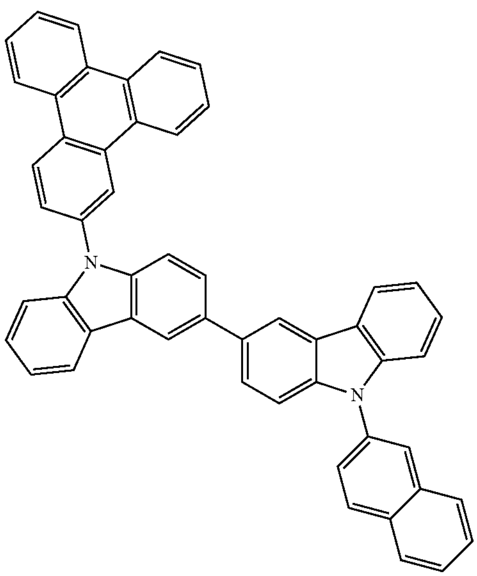
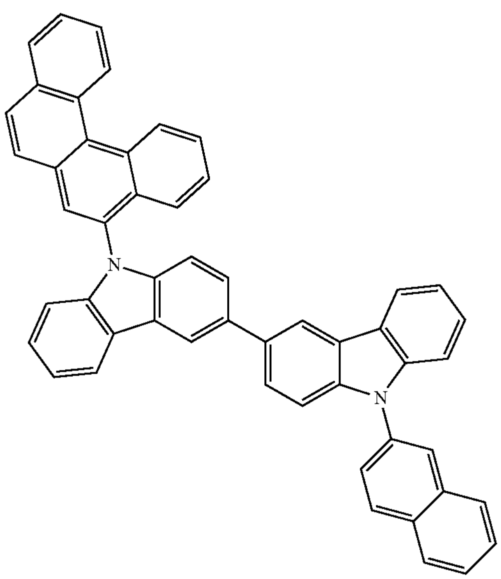
-continued
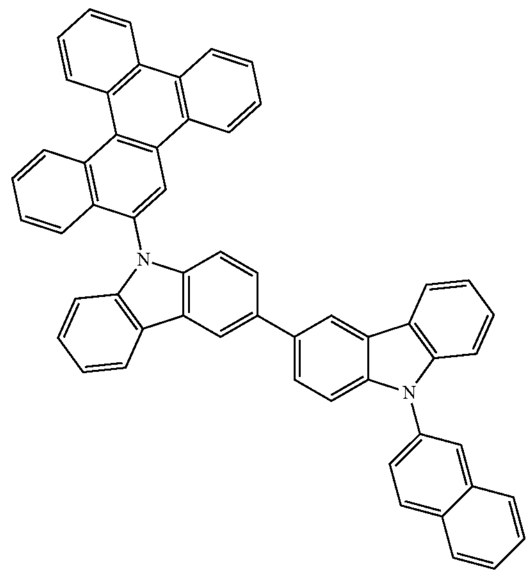
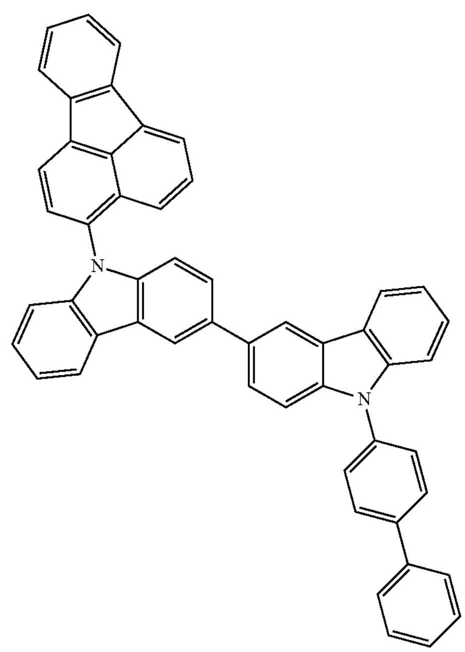

-continued
-continued
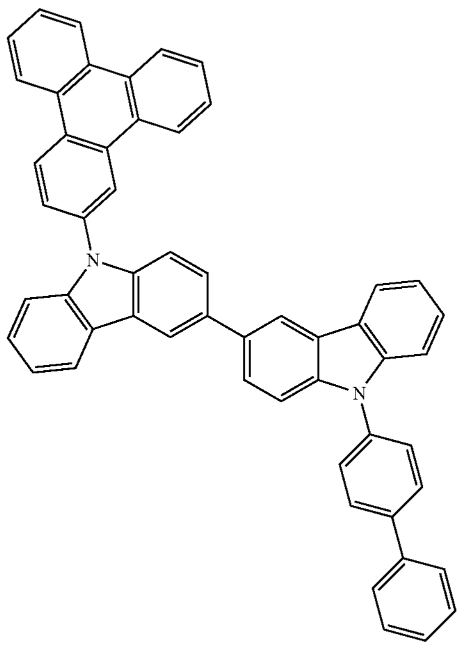
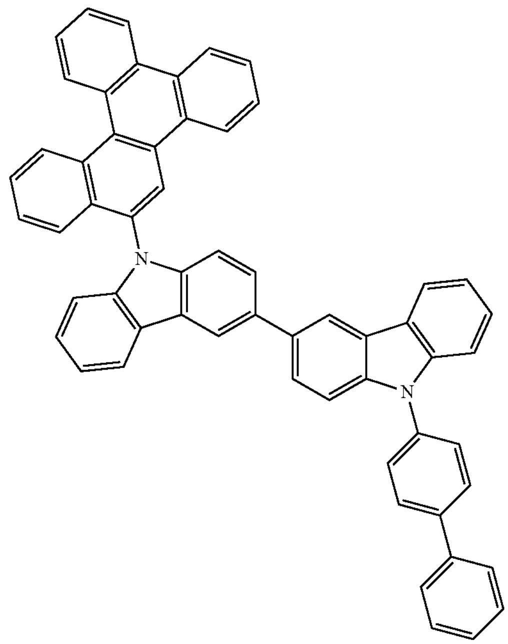
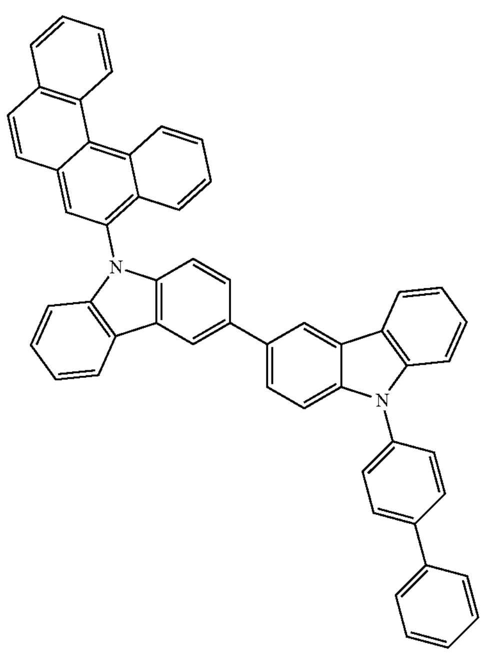
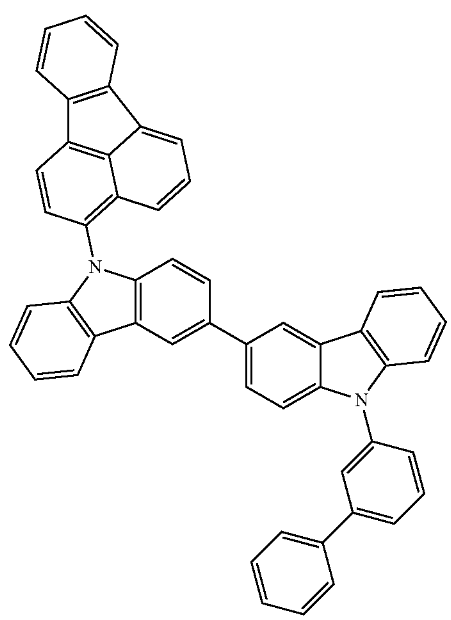

-continued
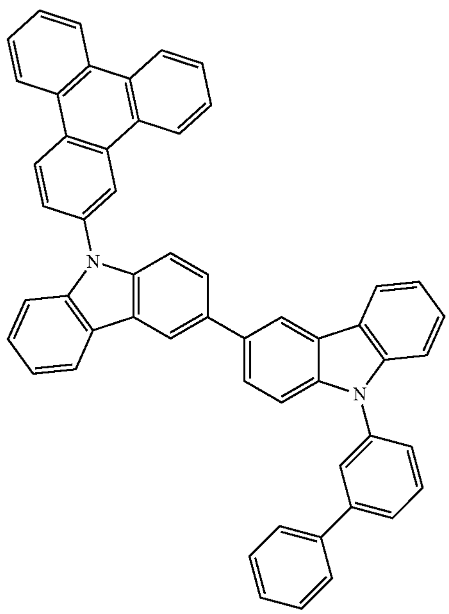
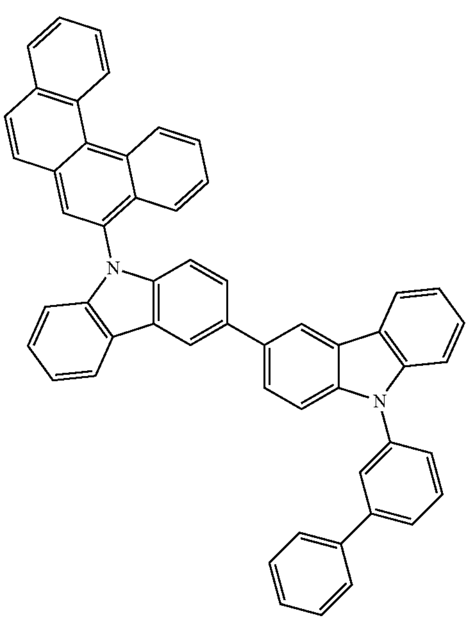
-continued
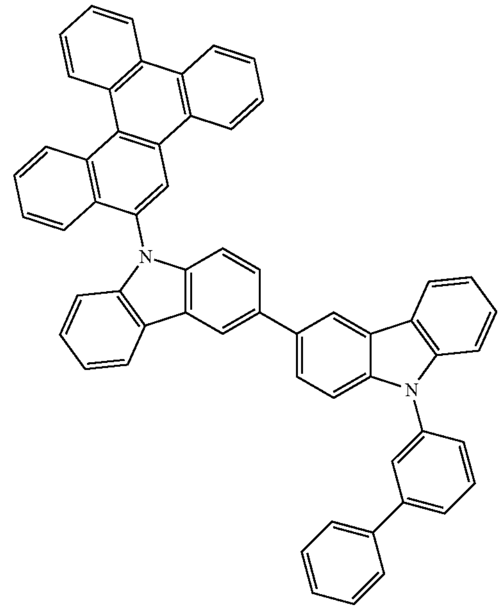
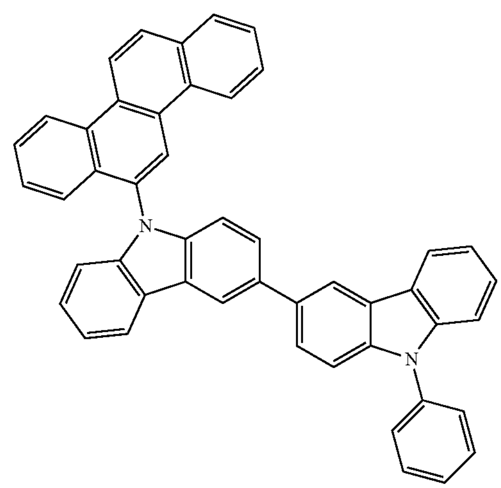
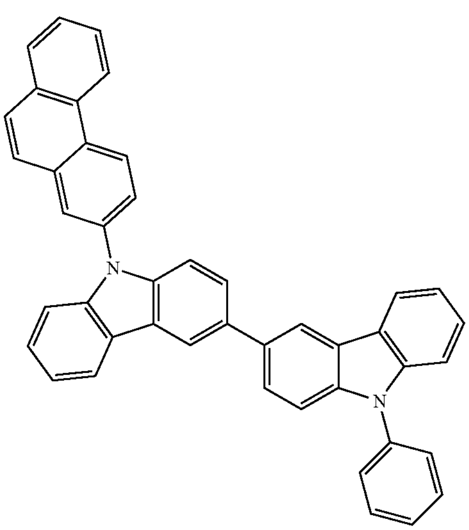

-continued
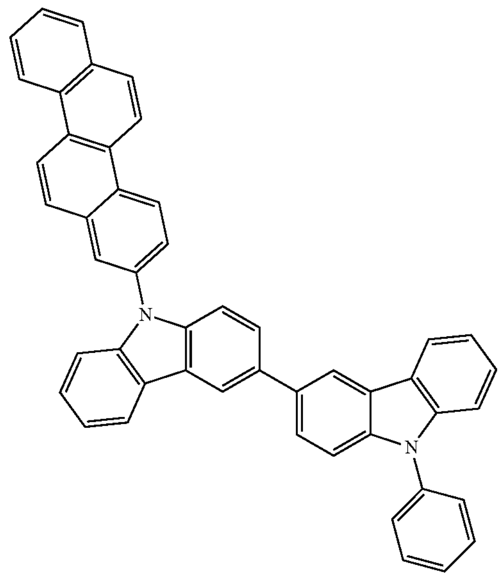
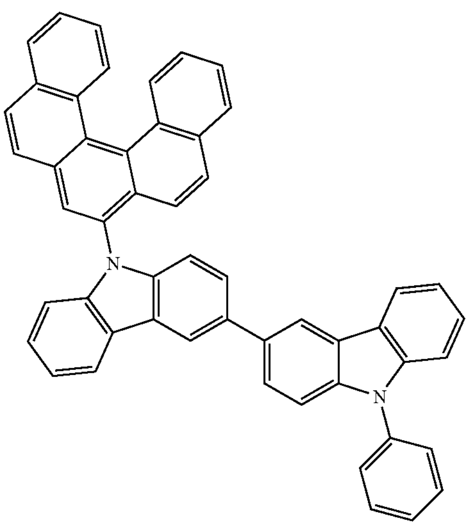
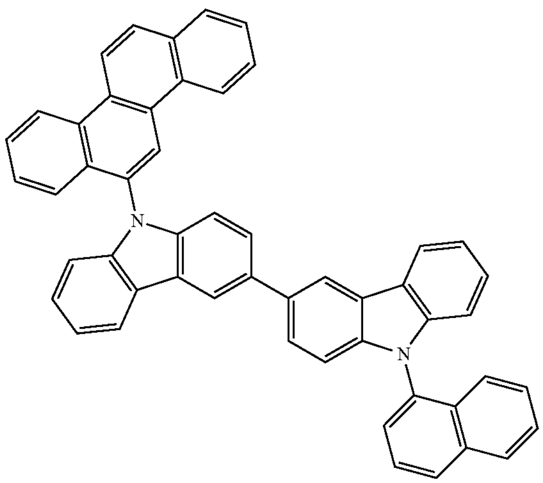
-continued
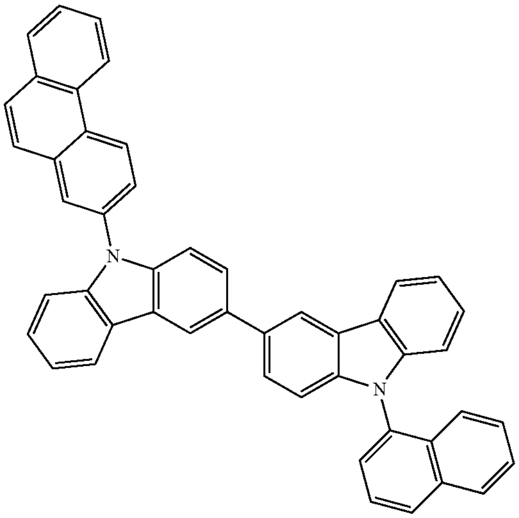
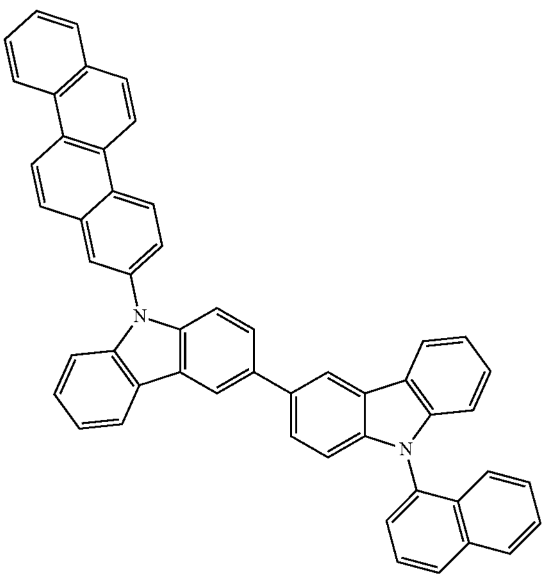
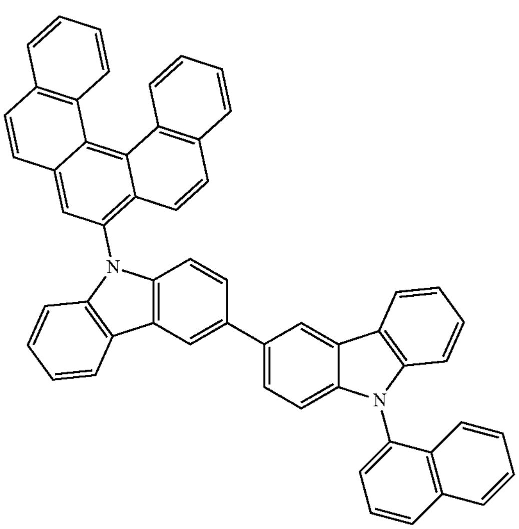

-continued
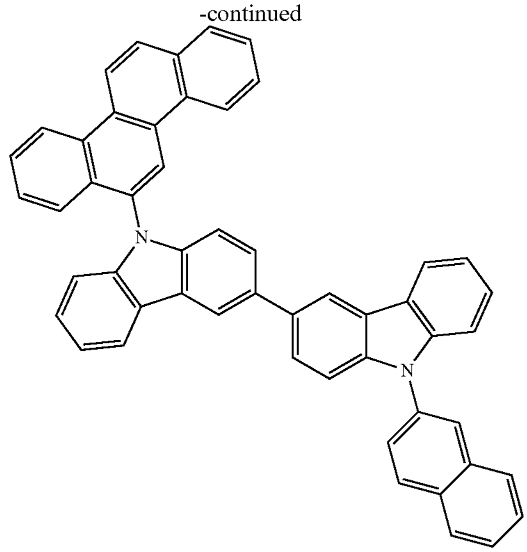
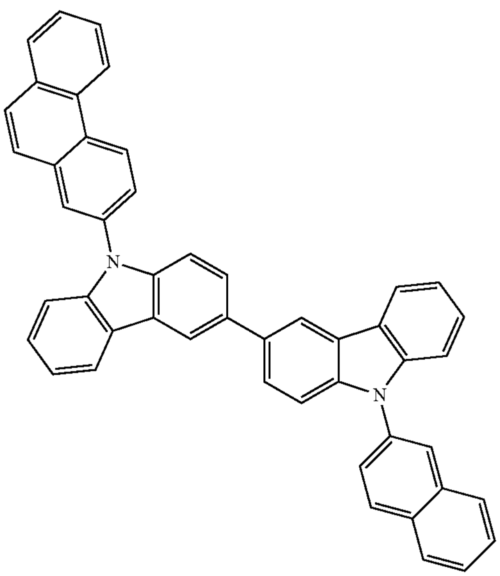
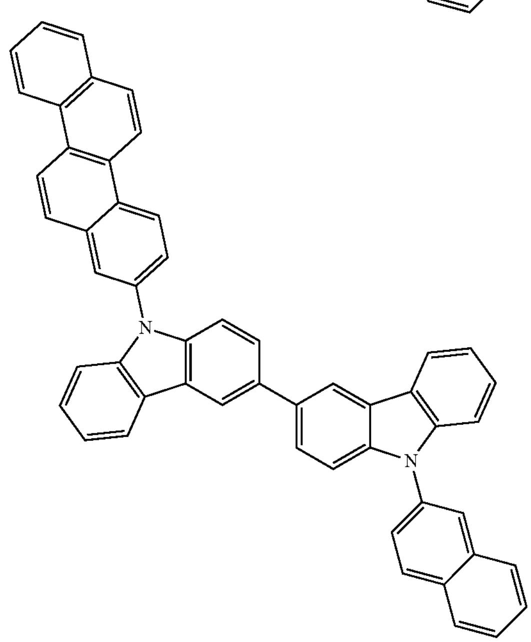
-continued
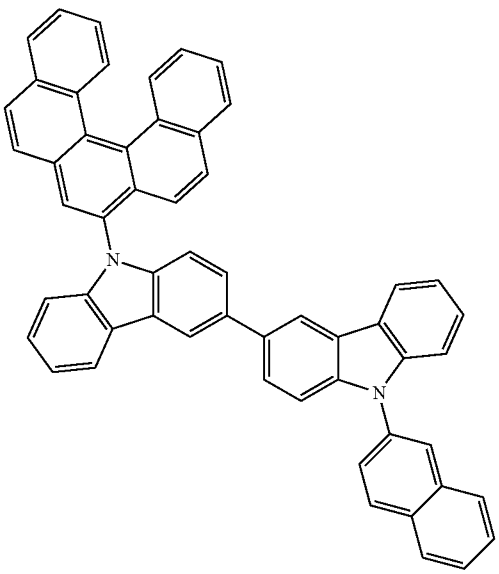
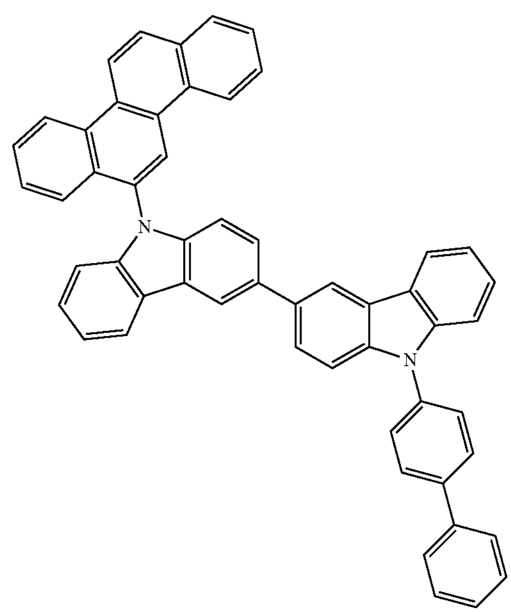

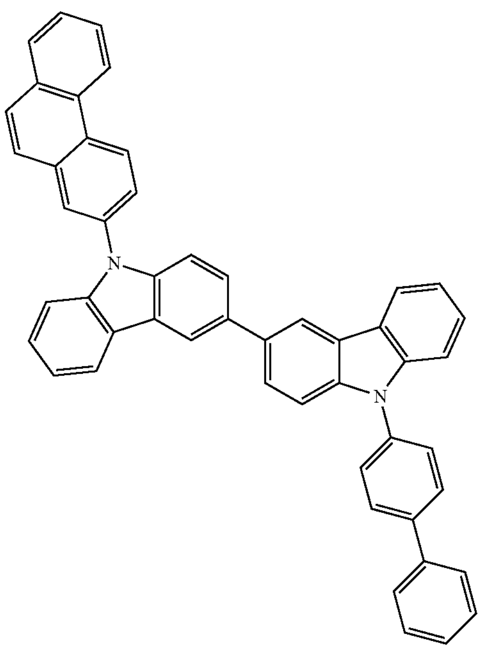
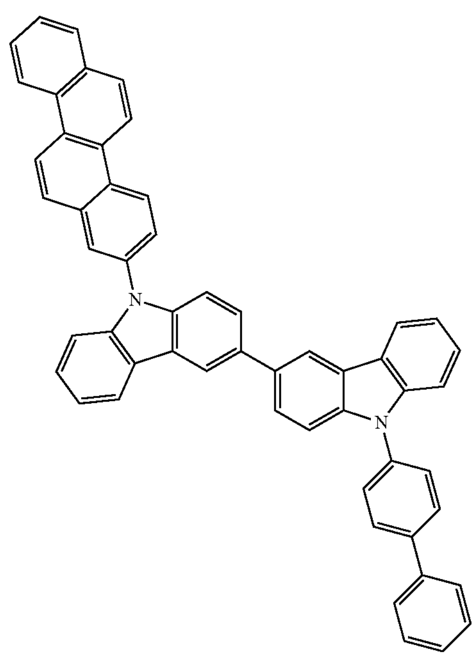
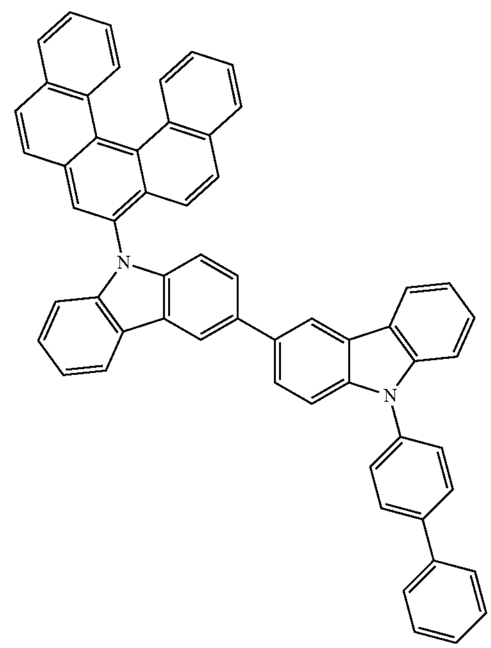
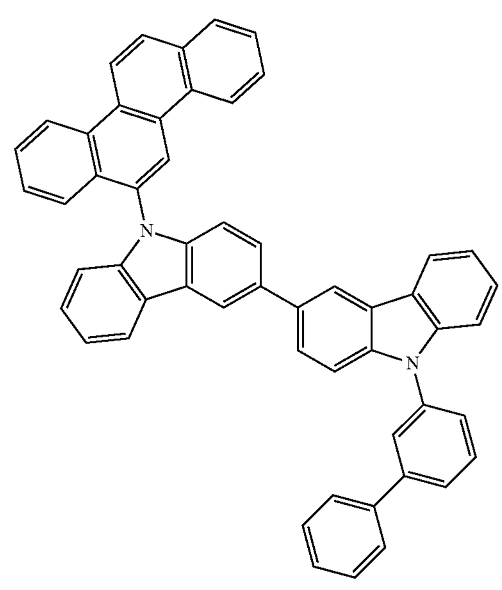

-continued
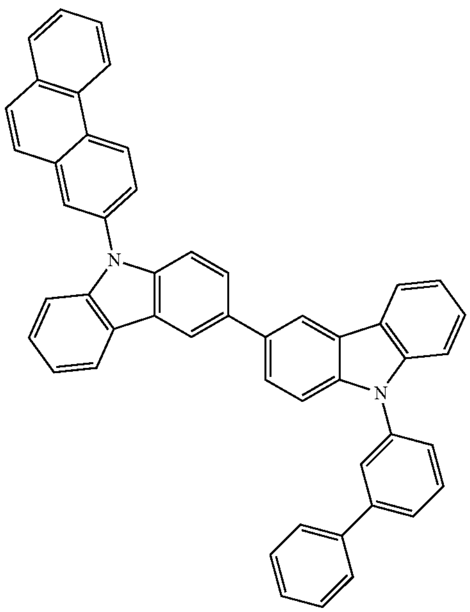
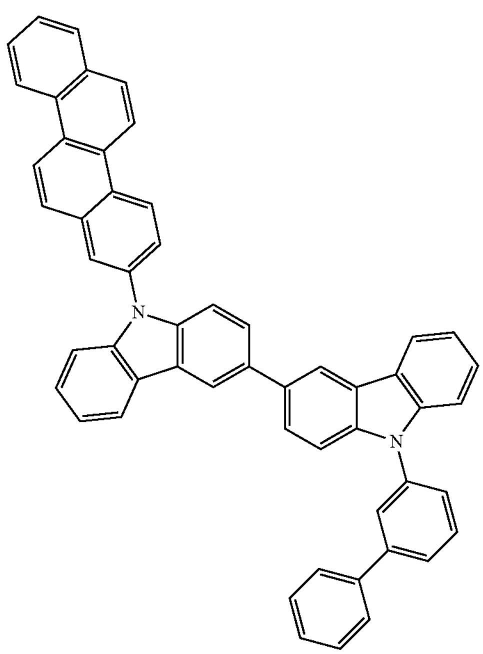
-continued
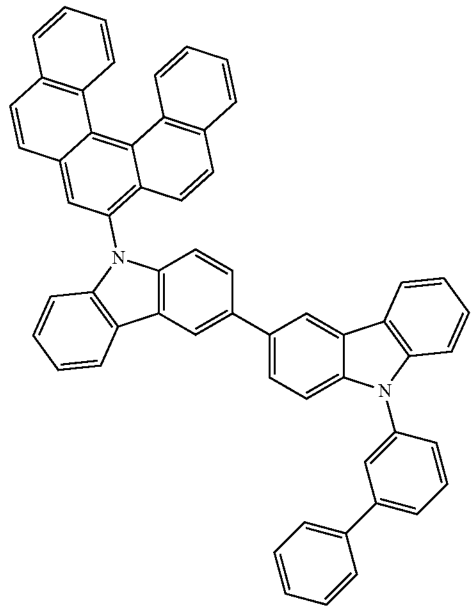
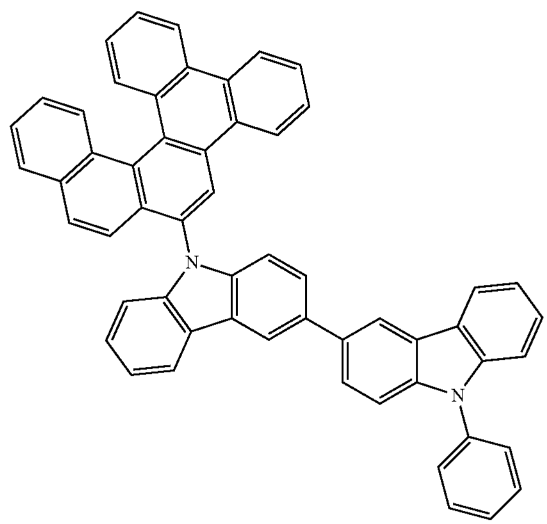
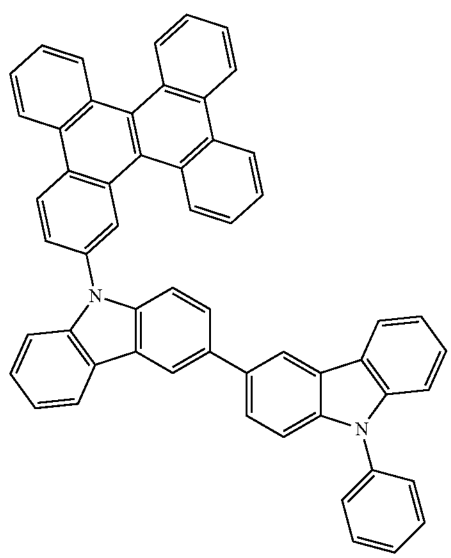

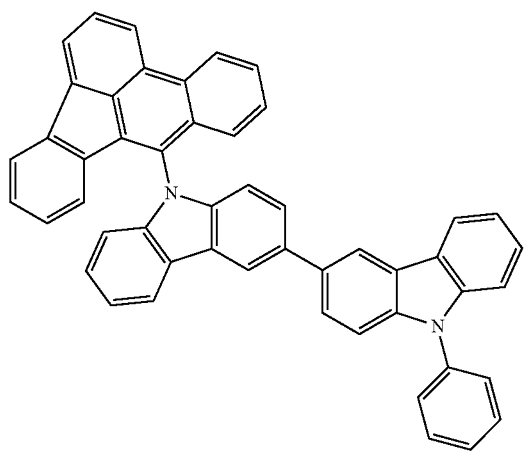
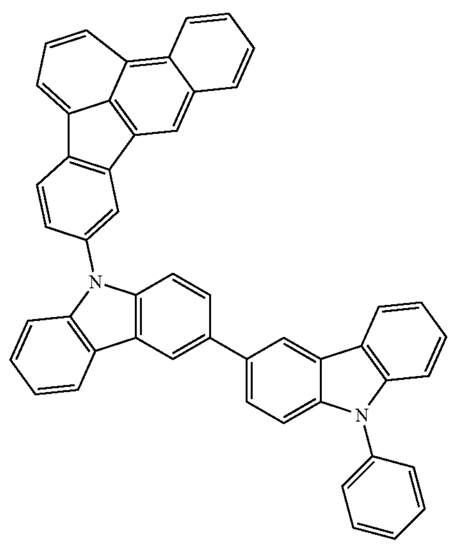
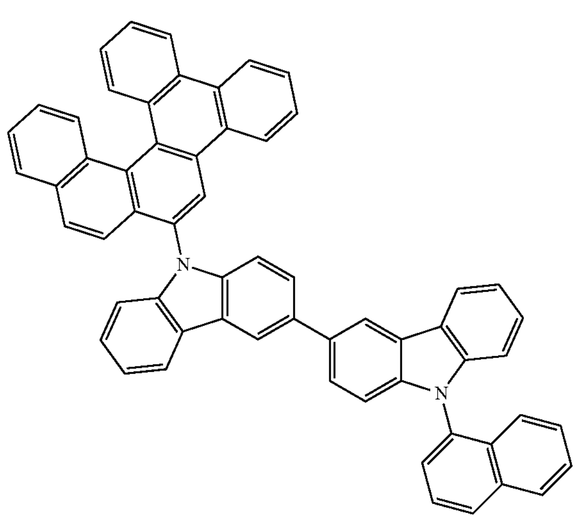
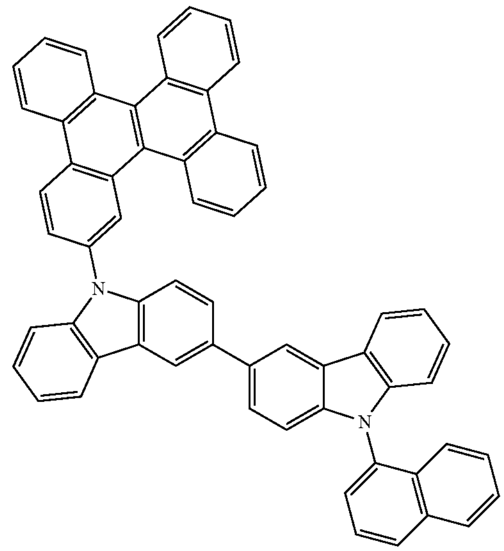
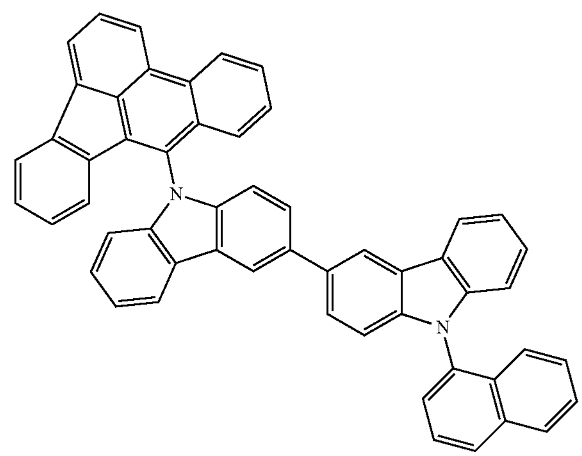
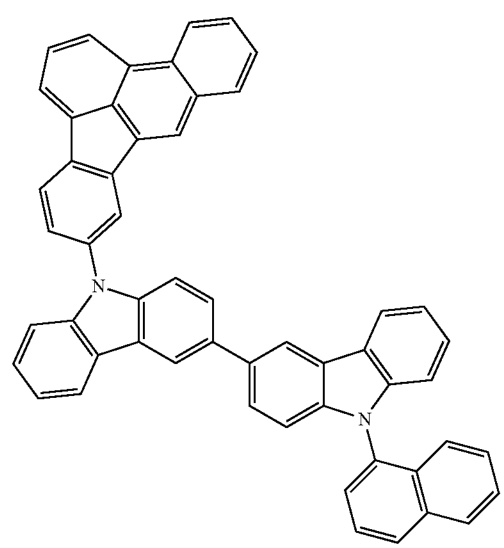

-continued
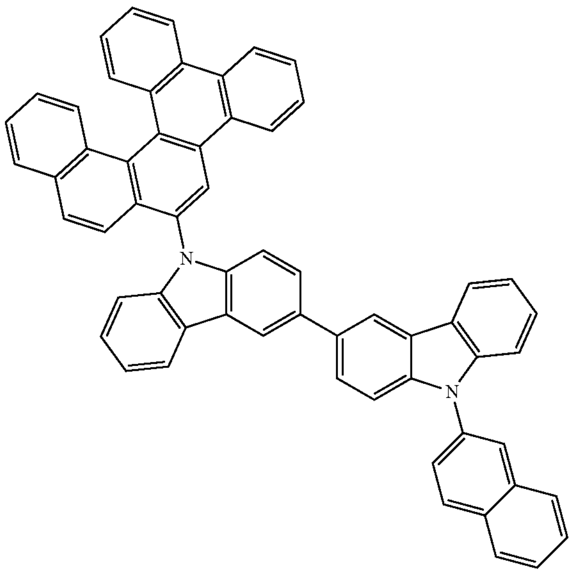
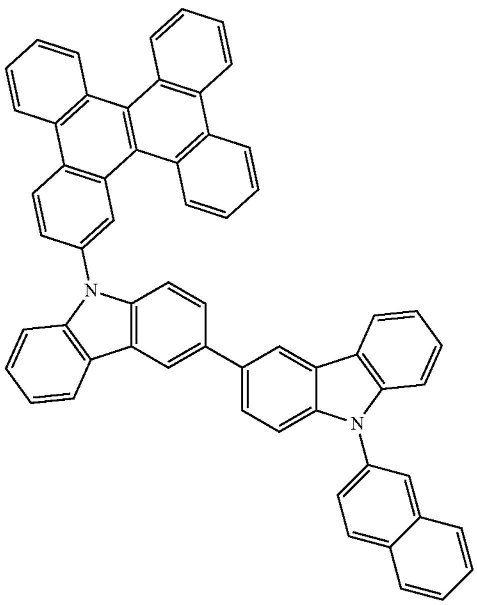
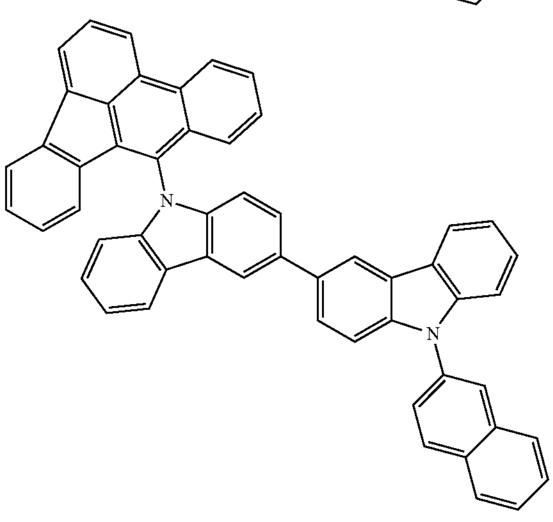
-continued
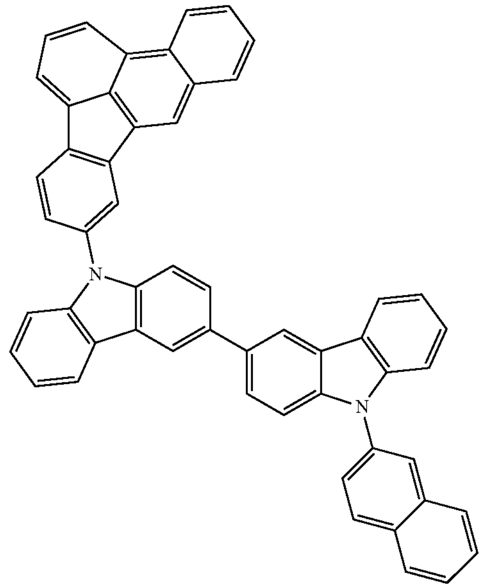
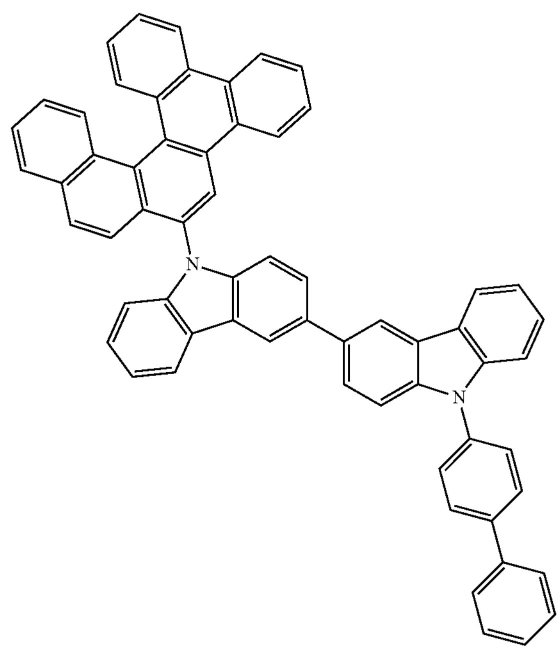

-continued
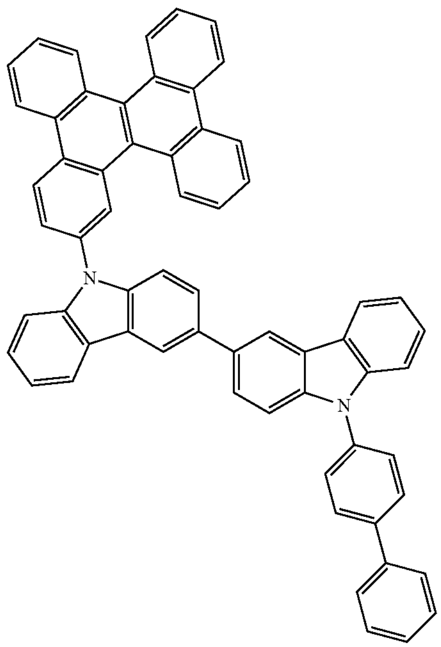
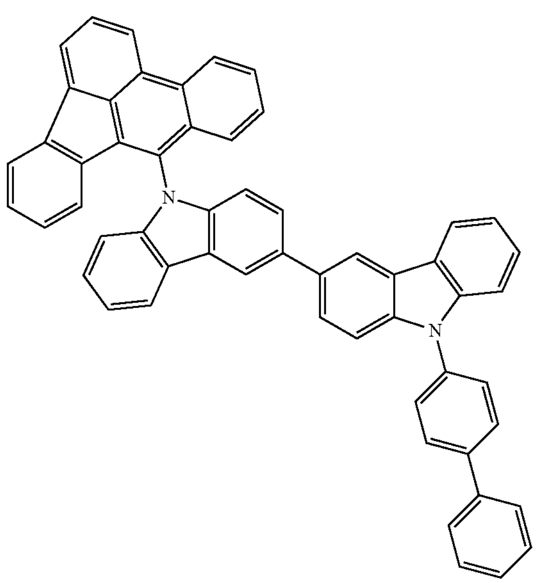
-continued
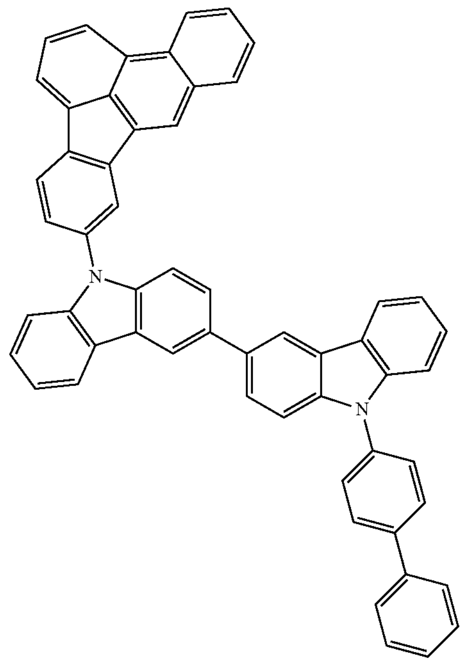
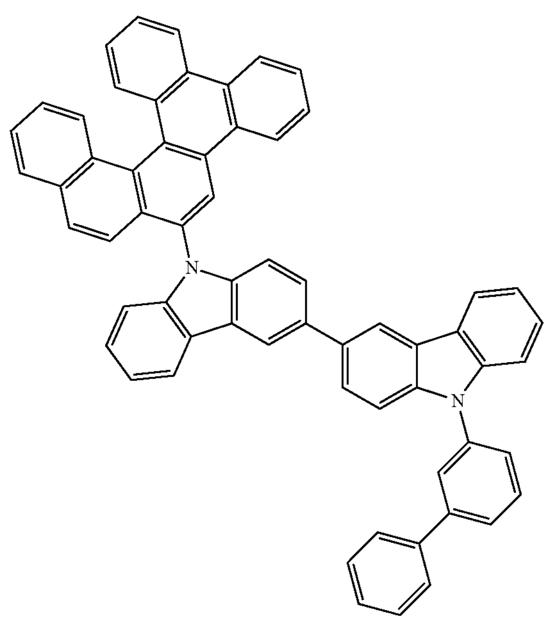

-continued
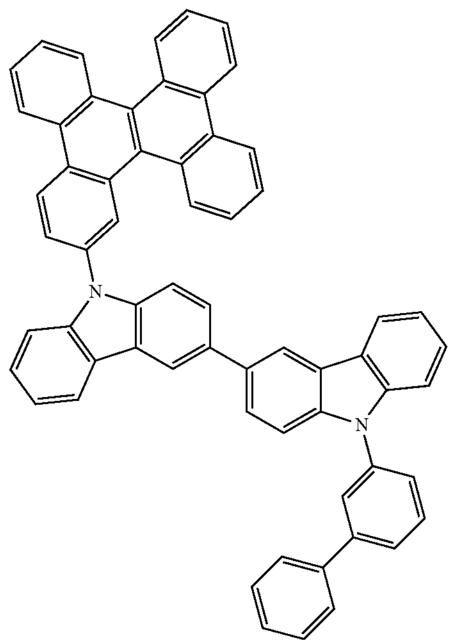
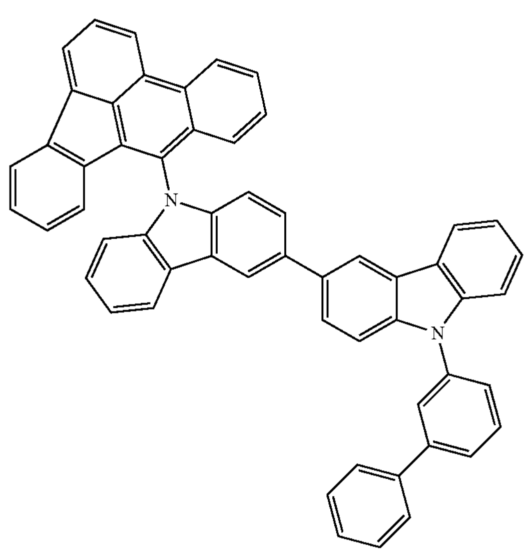
-continued
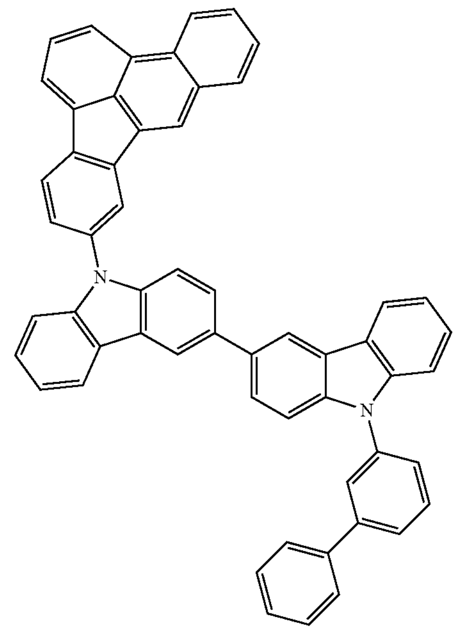
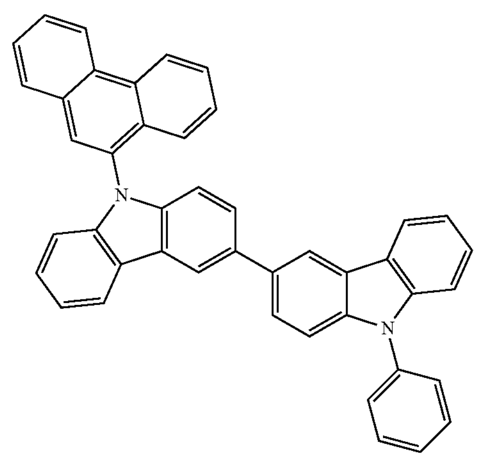
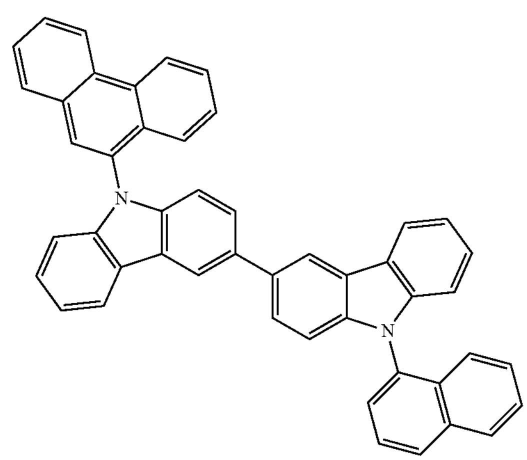

-continued
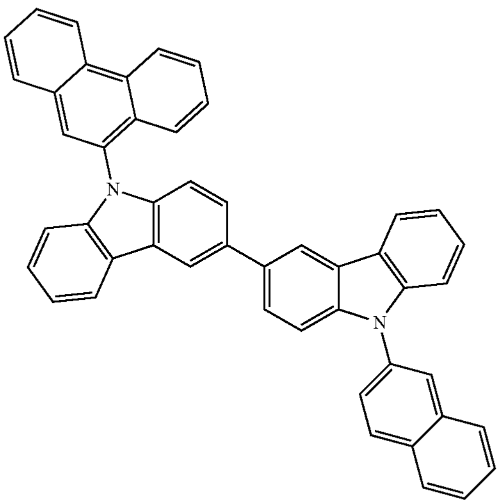
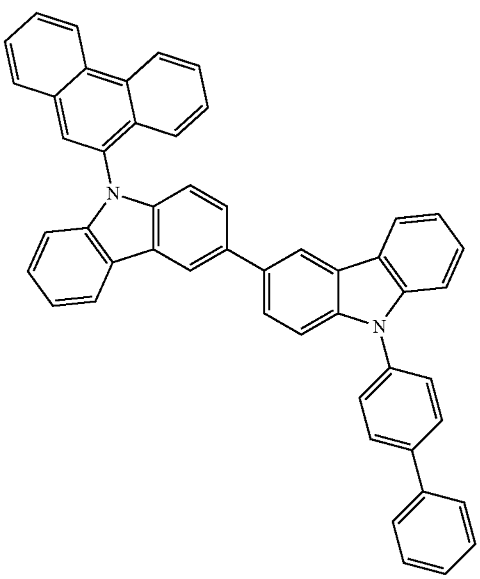
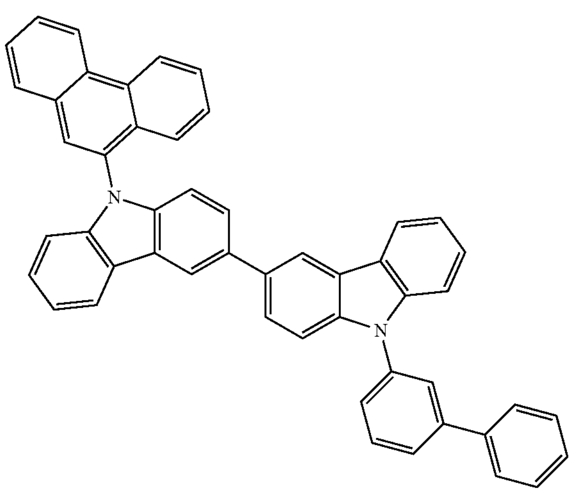
-continued
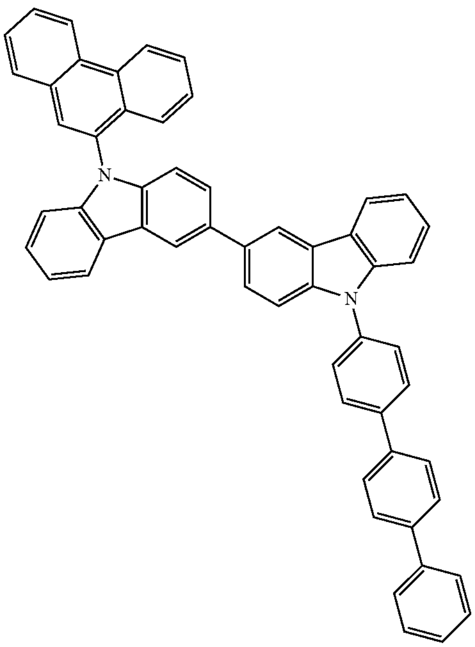
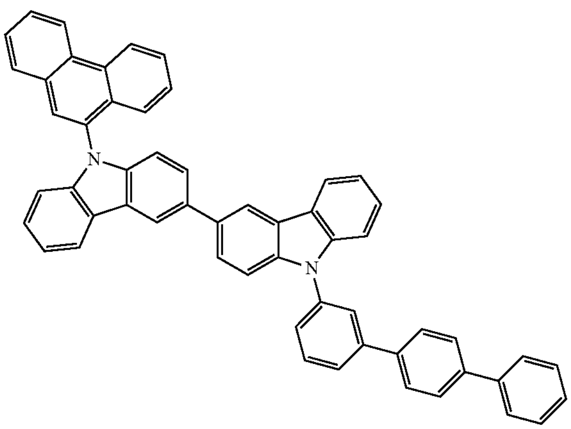
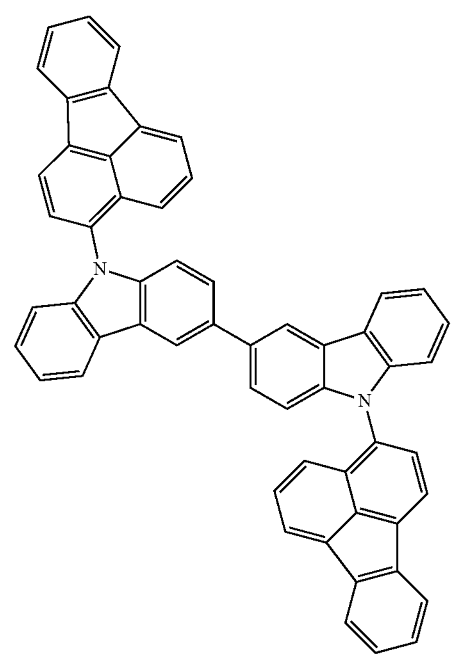

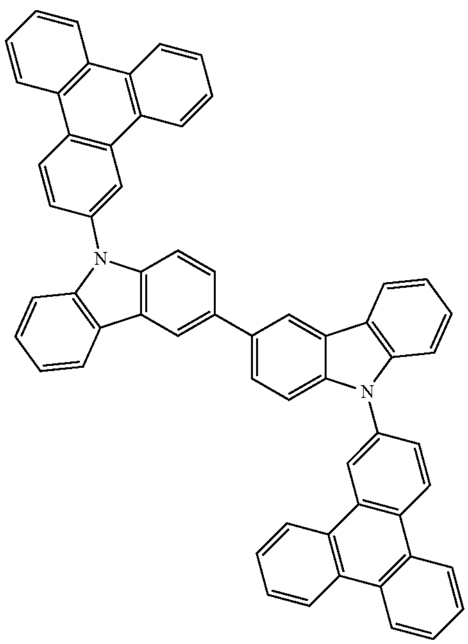
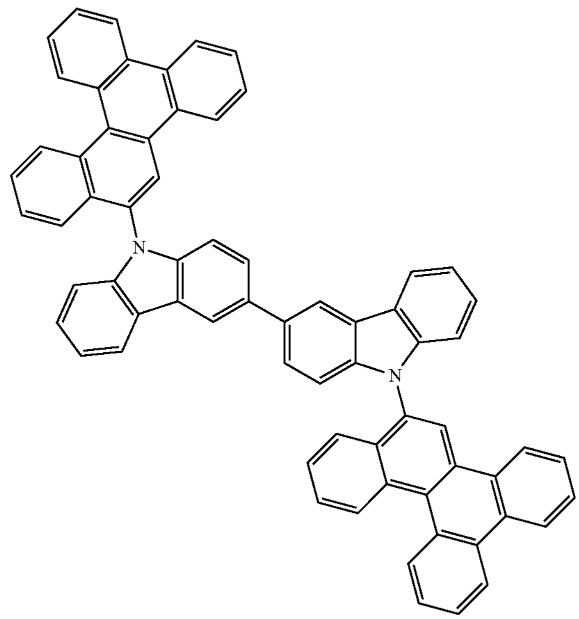
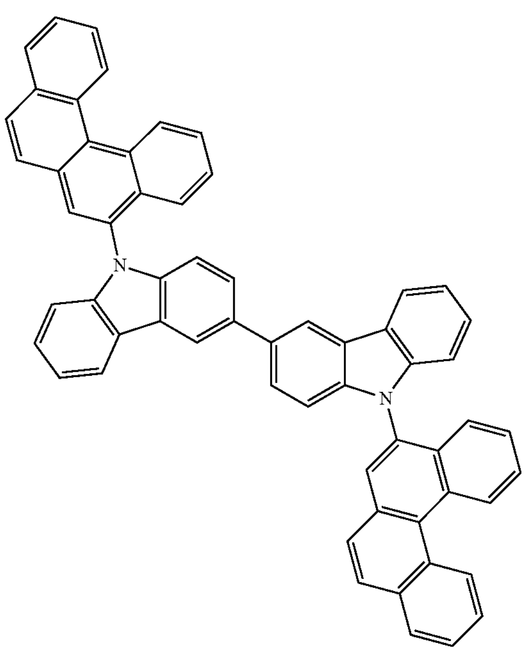
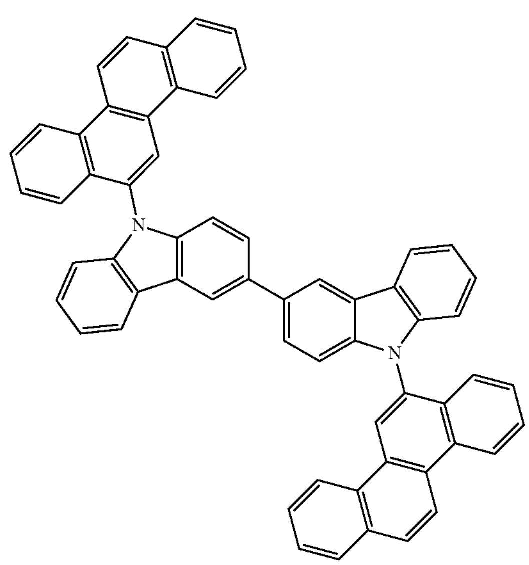

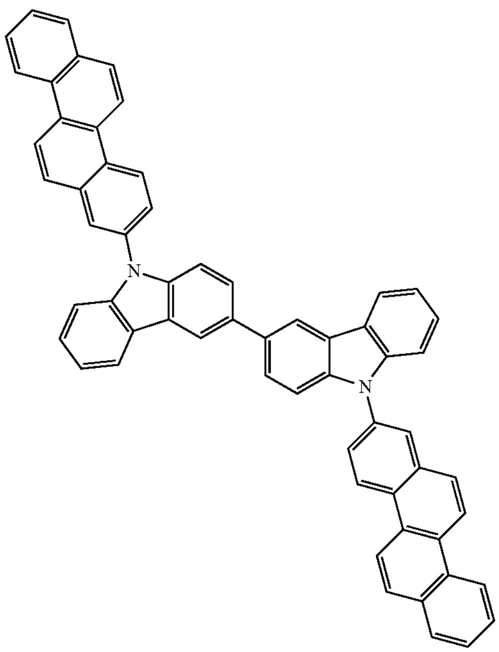
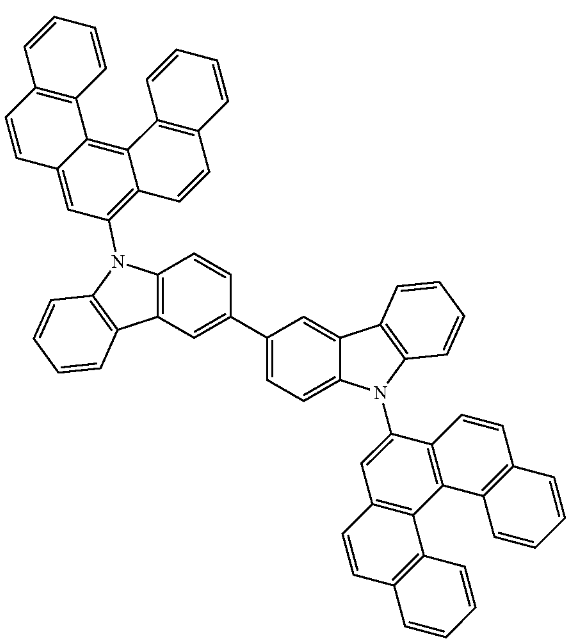
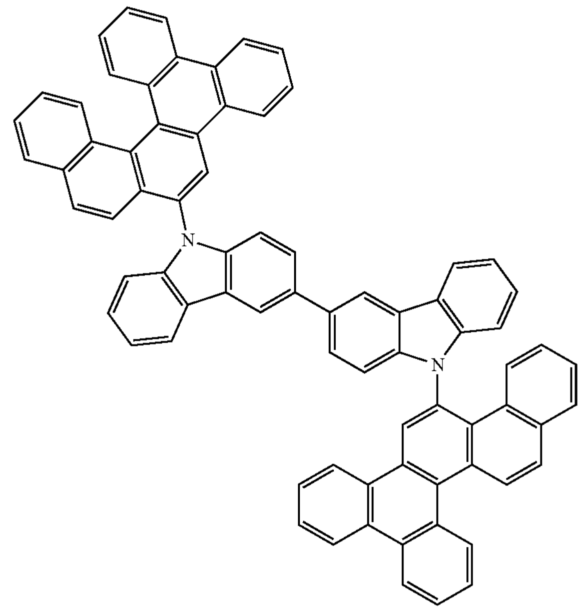
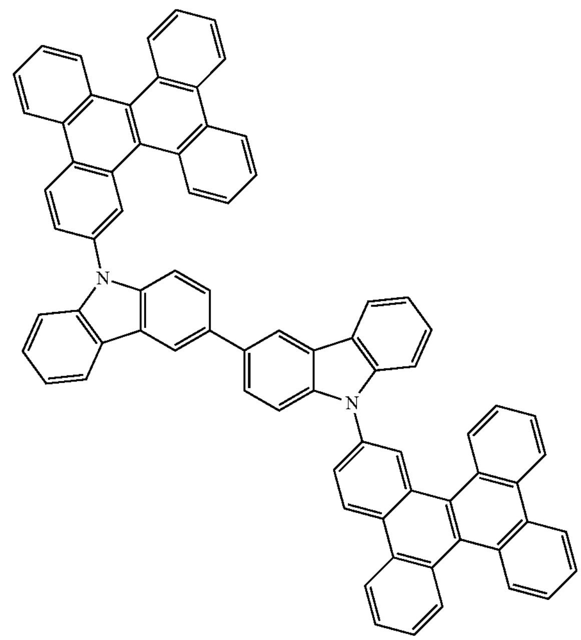
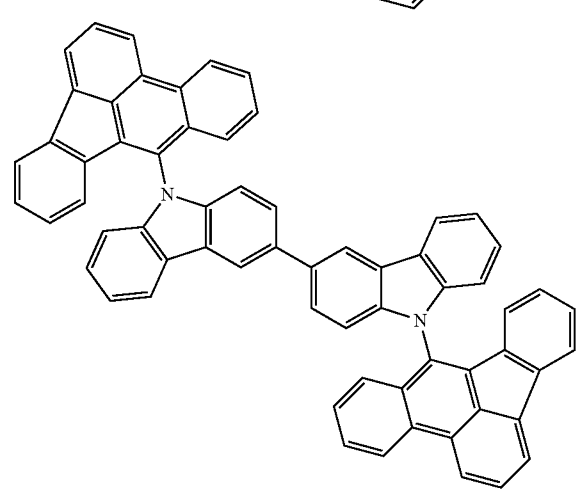

-continued
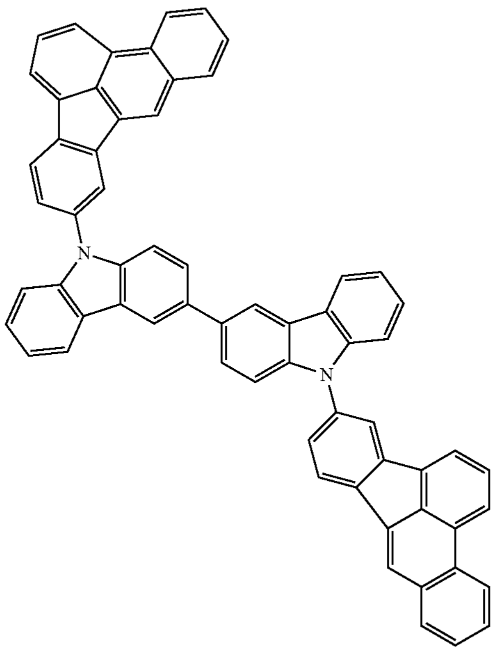
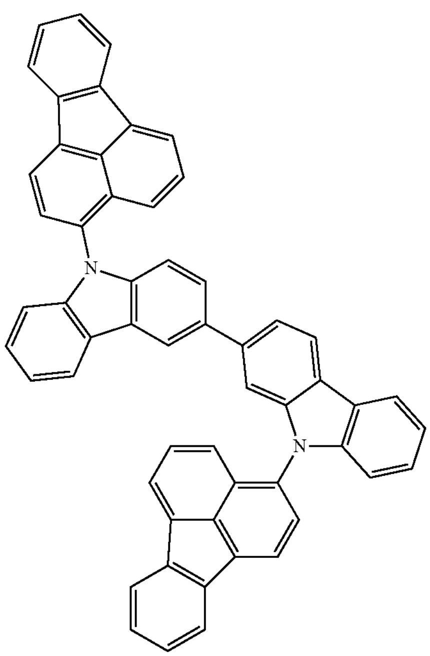
-continued
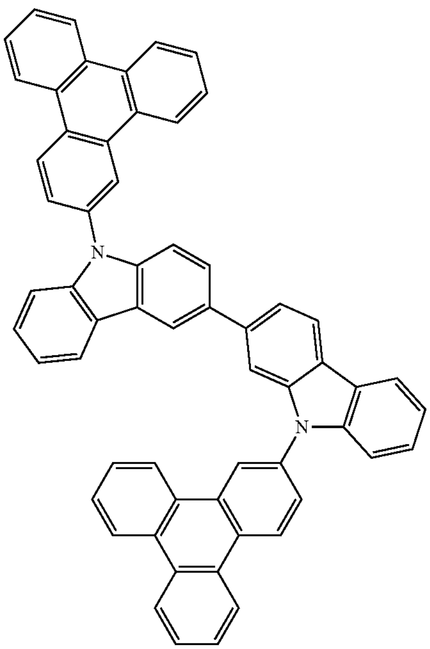
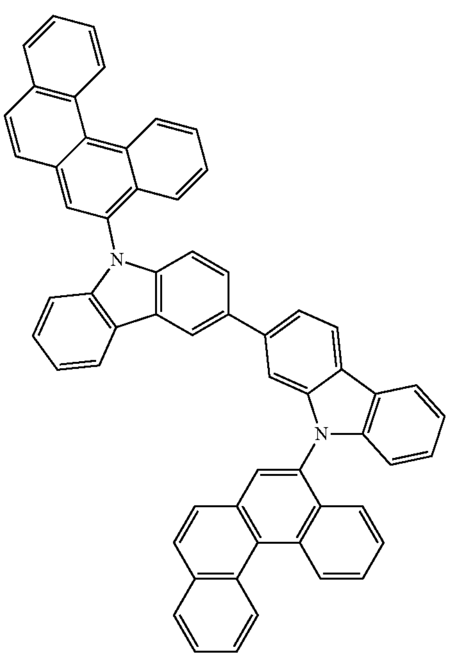

-continued
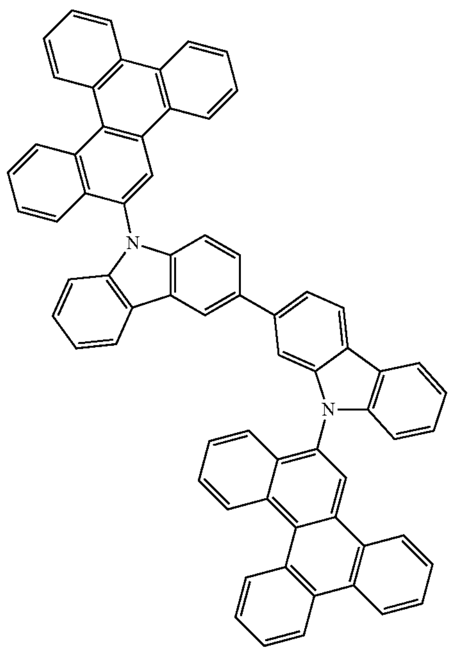
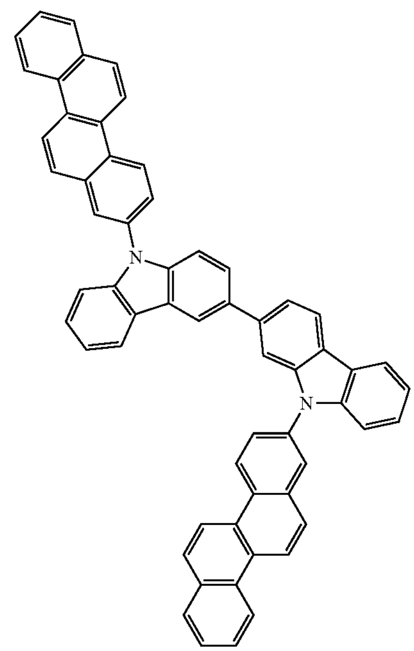
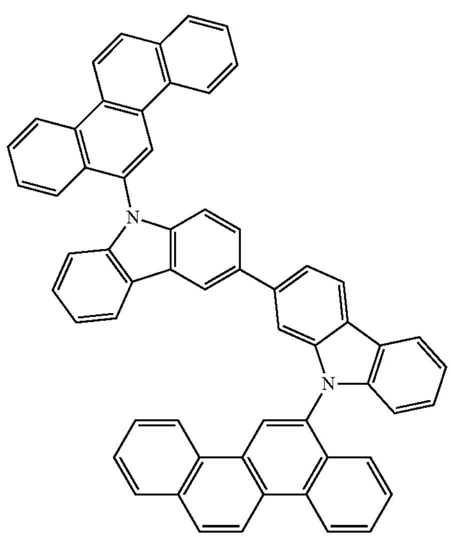
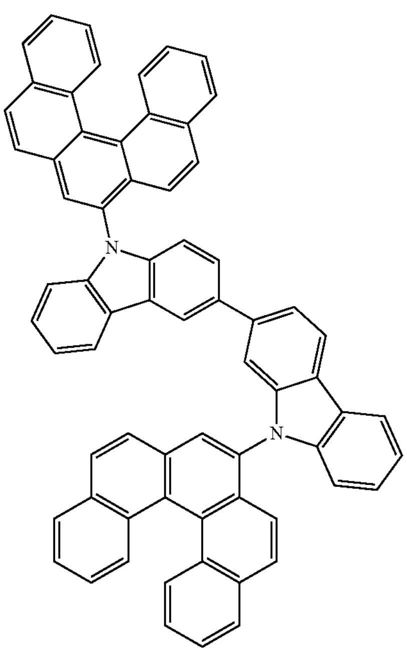

-continued
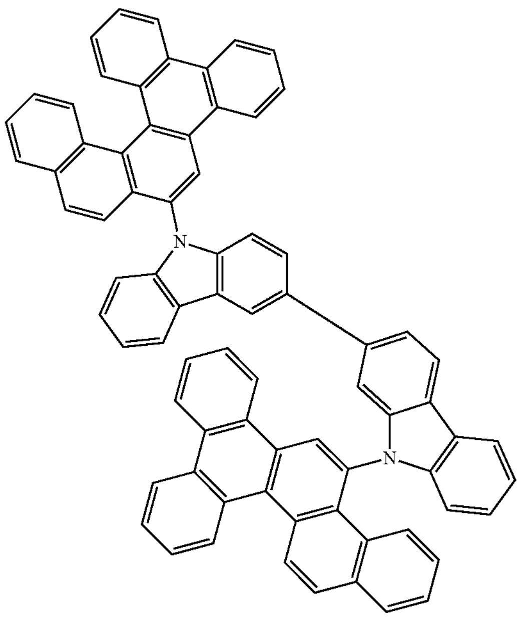
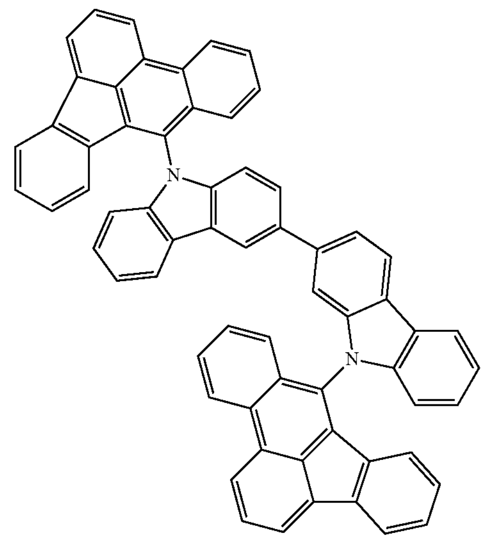
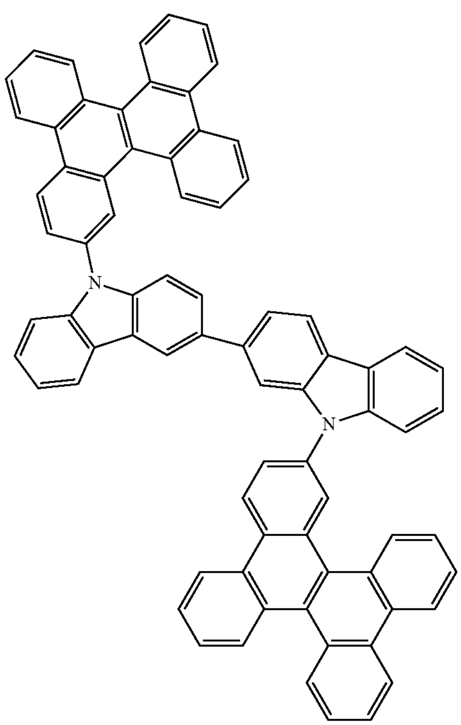
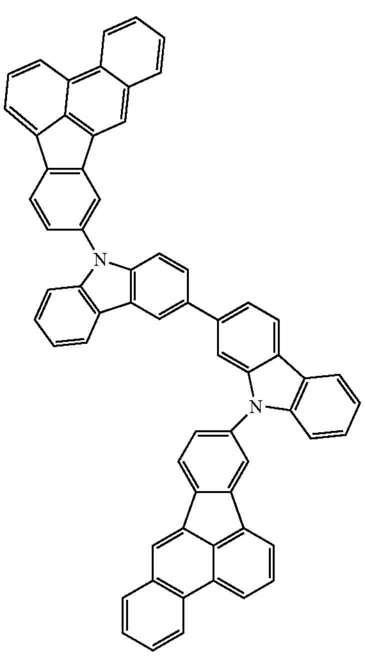
-continued

-continued
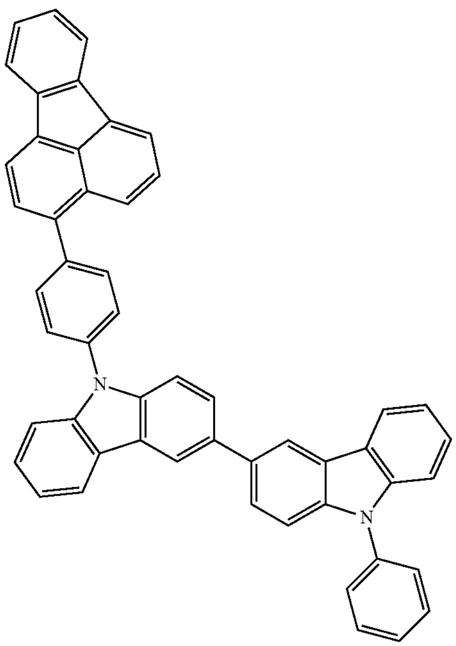
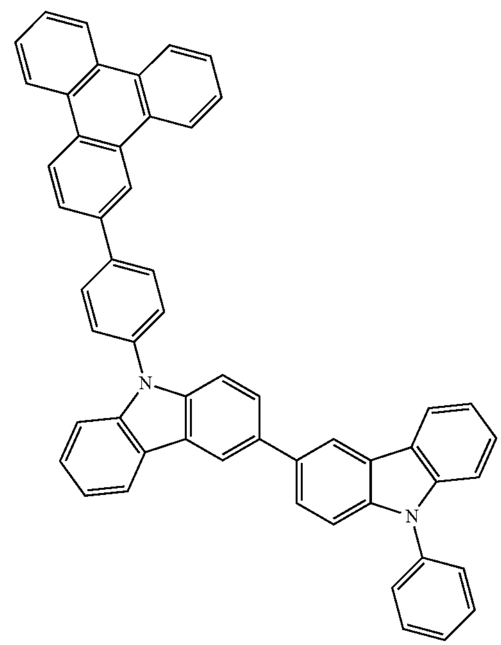
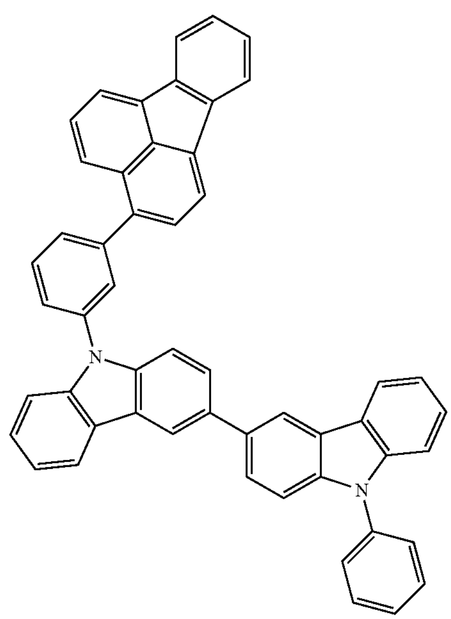
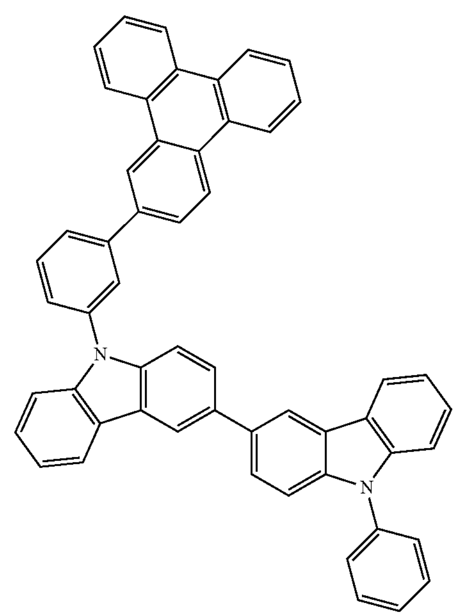

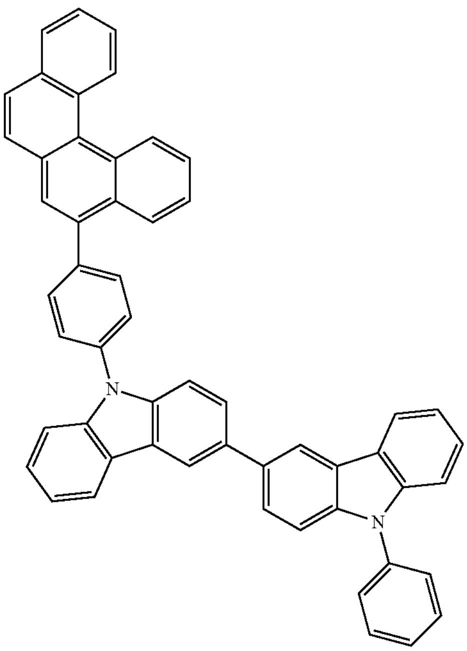
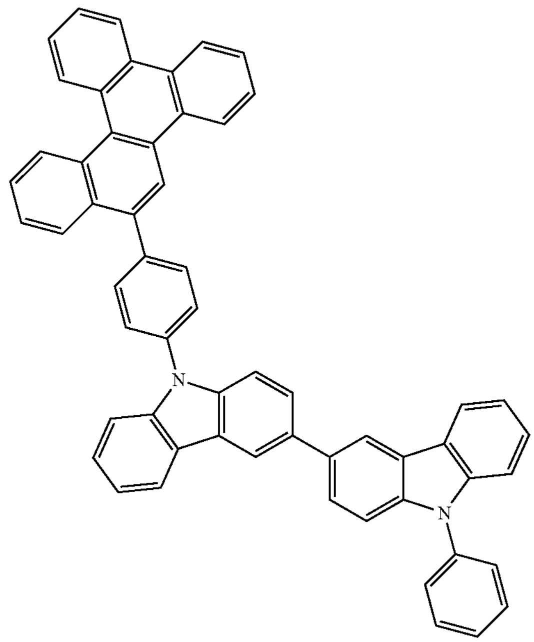
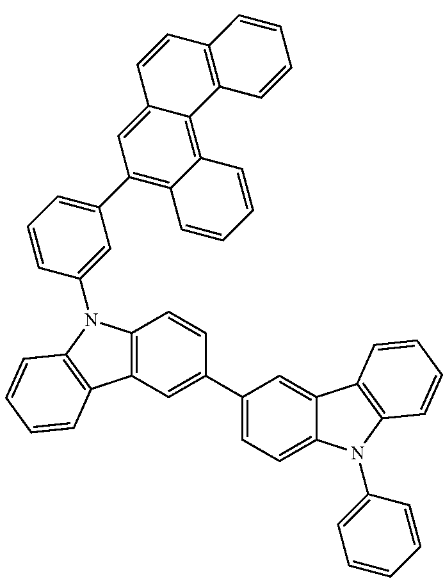
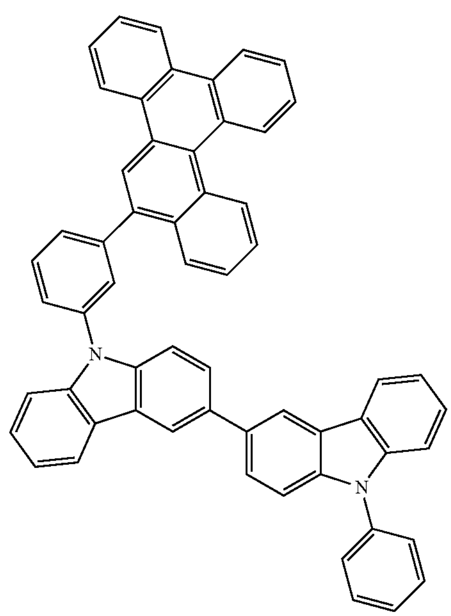

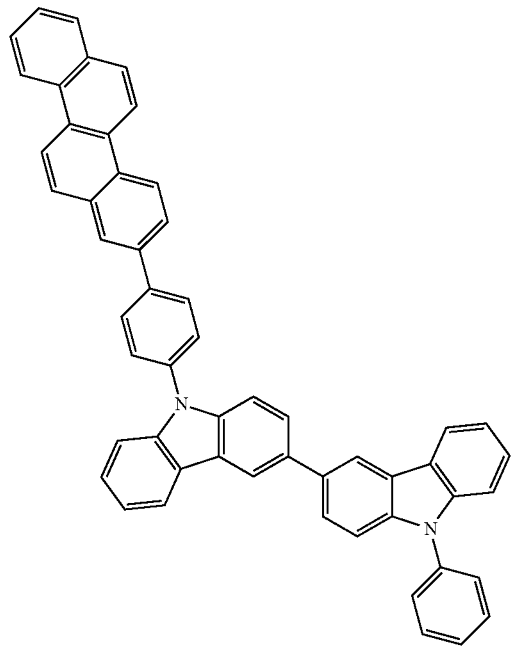
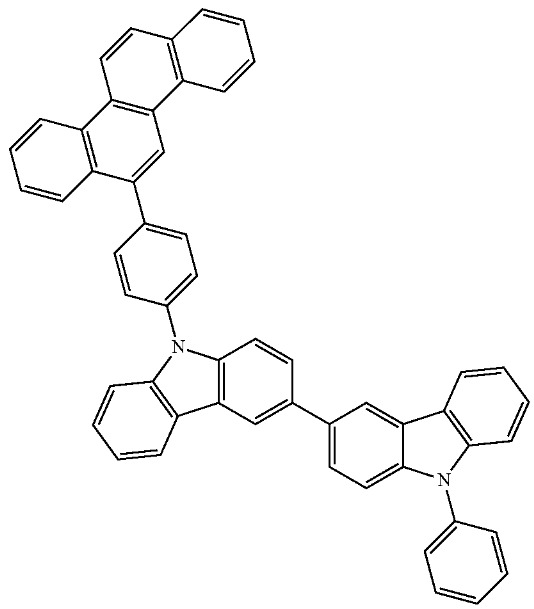
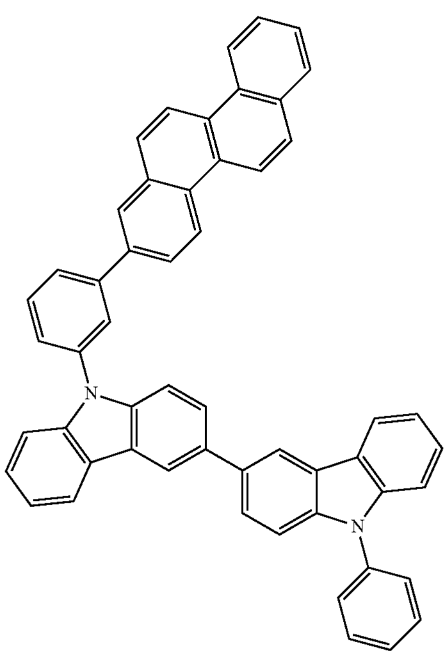
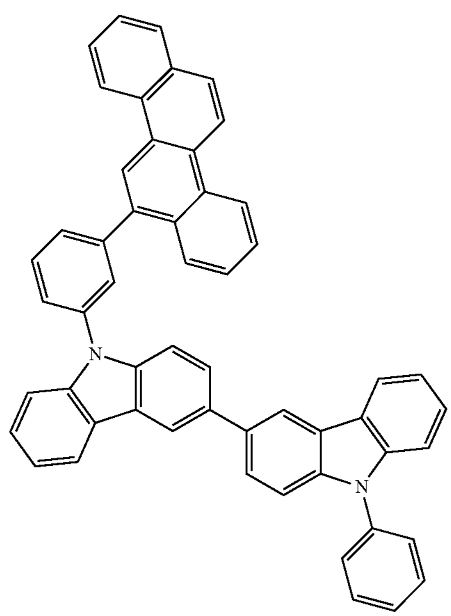
N
N

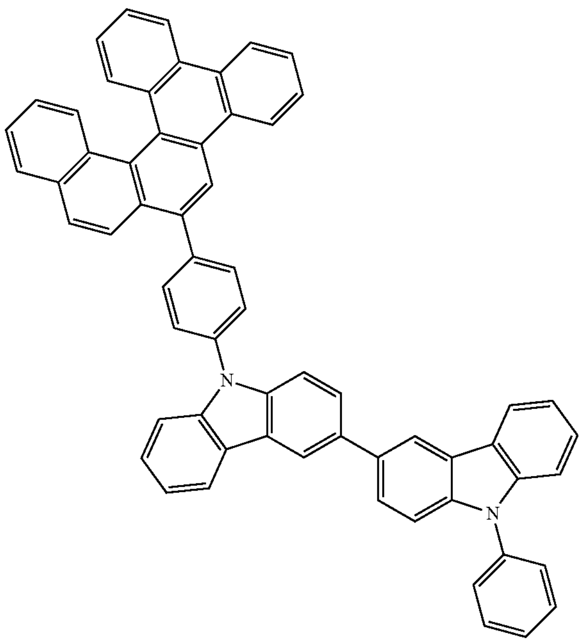
N
N
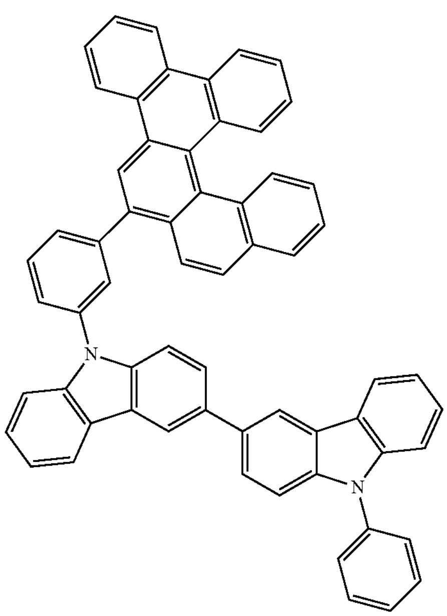
N
N
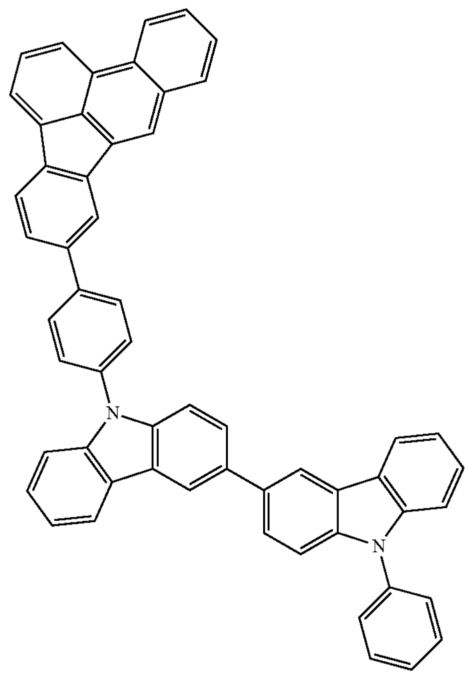
N
N
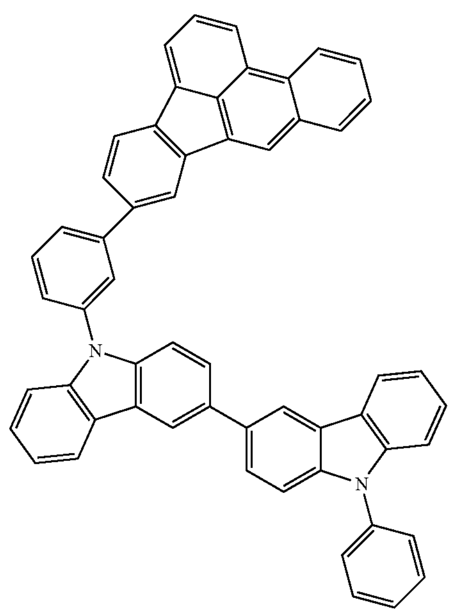
N
N

-continued
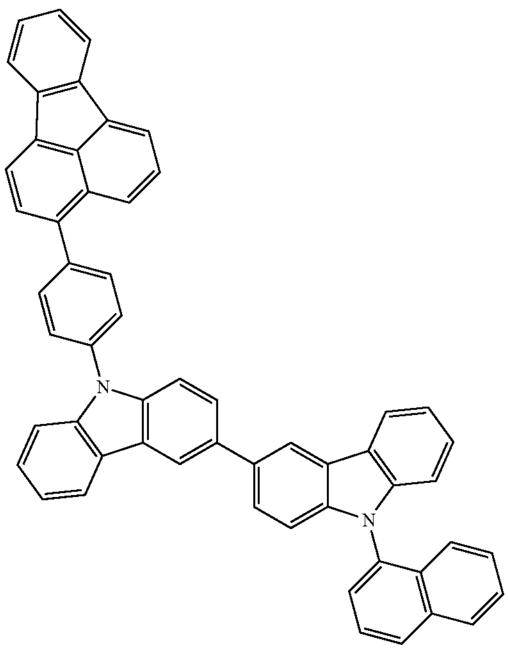
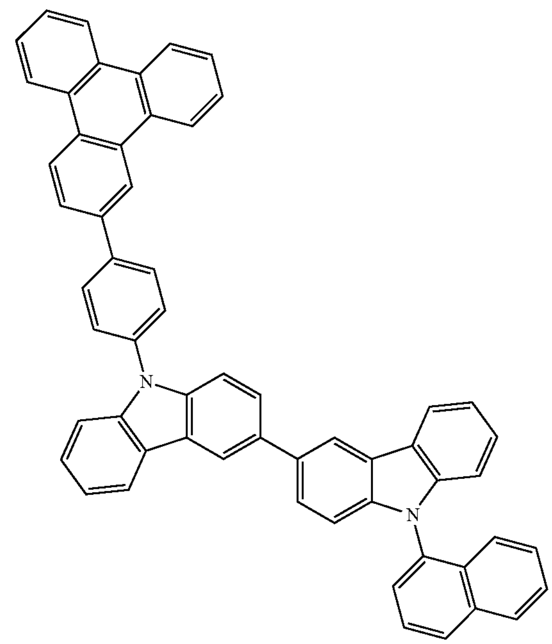
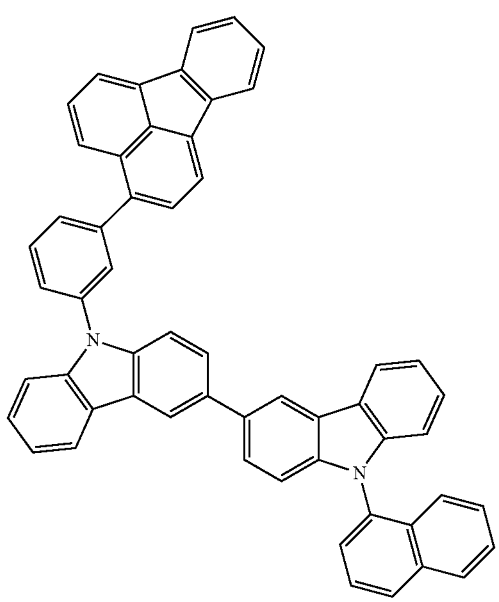
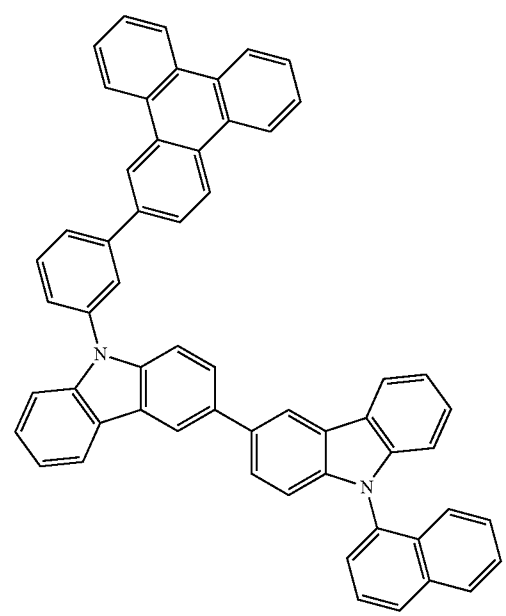
-continued

-continued
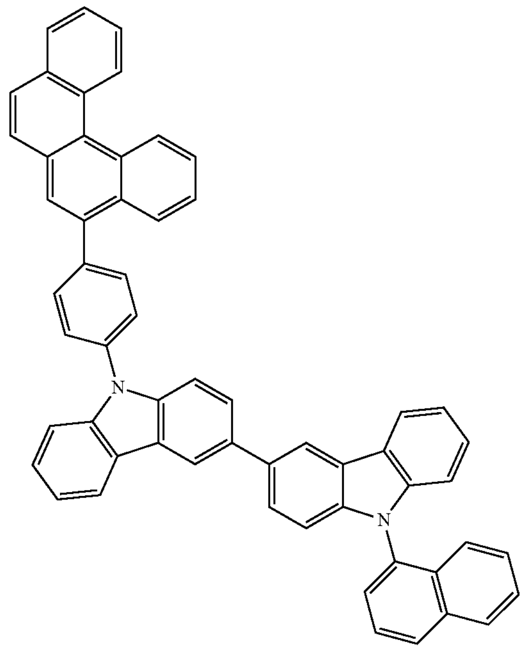
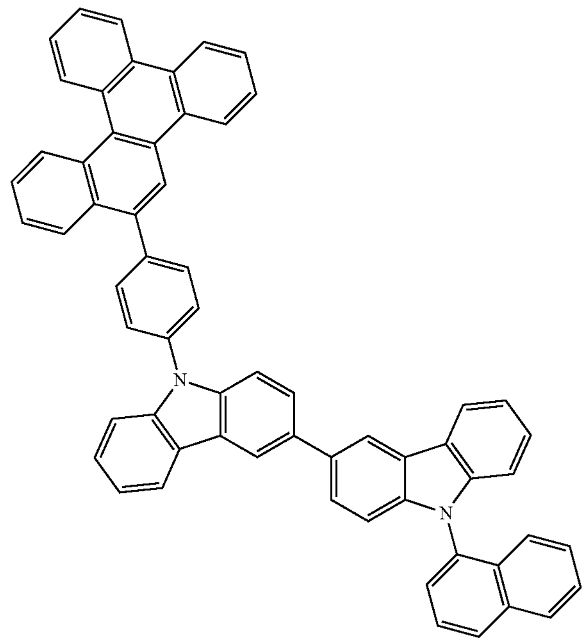
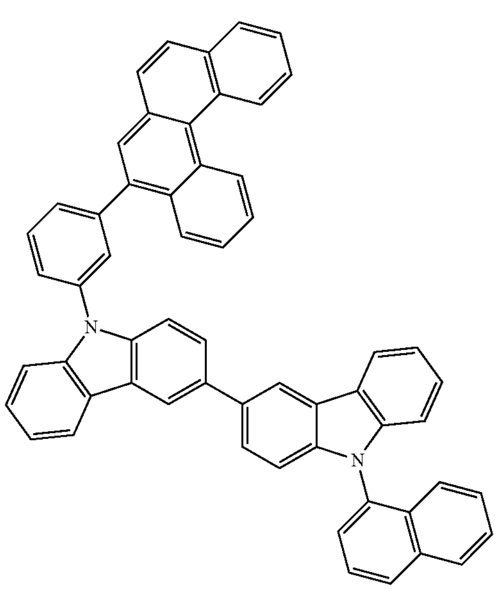
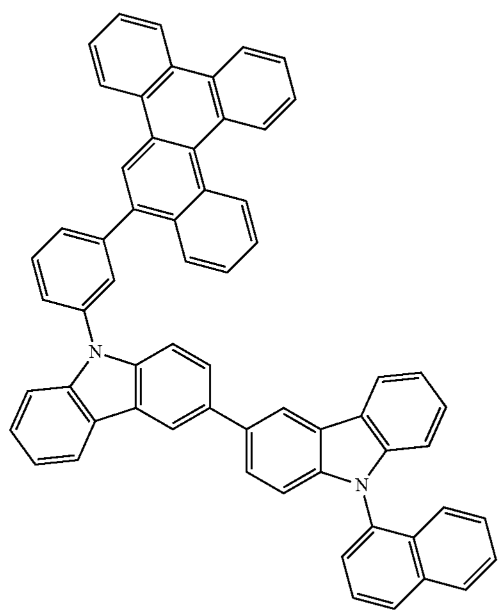
-continued

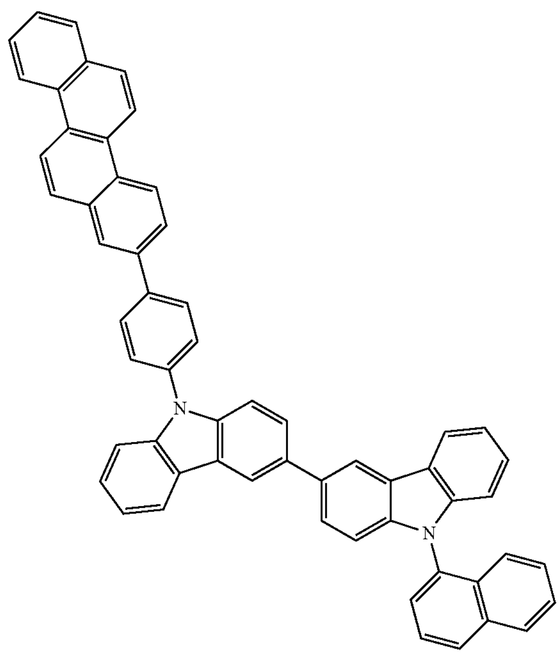
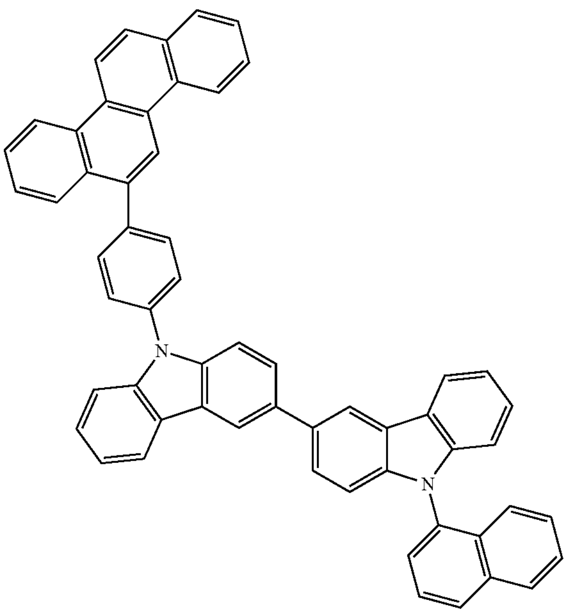
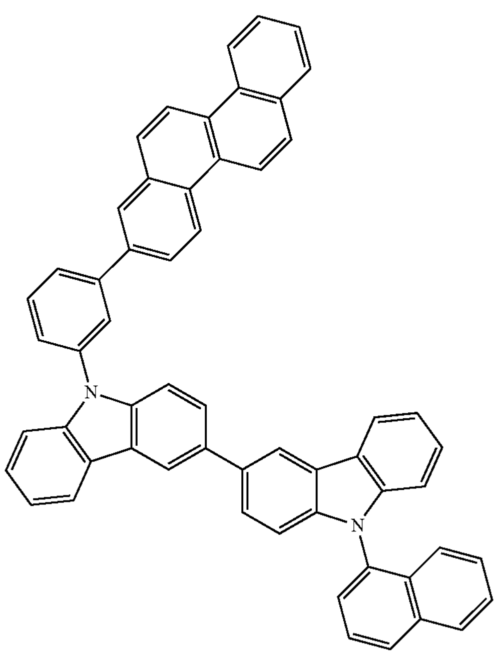
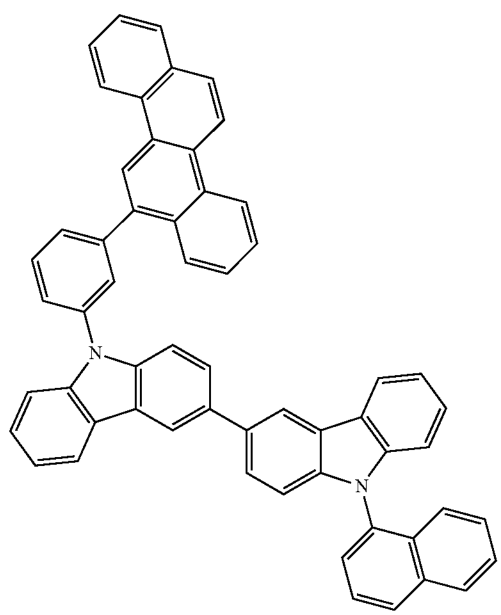

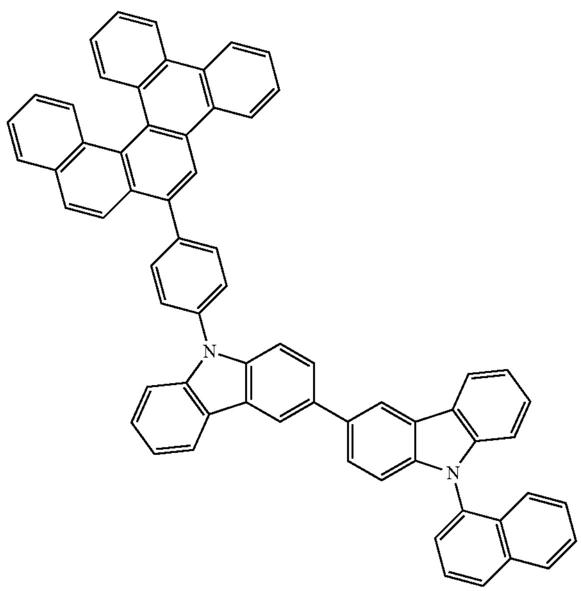
N
N
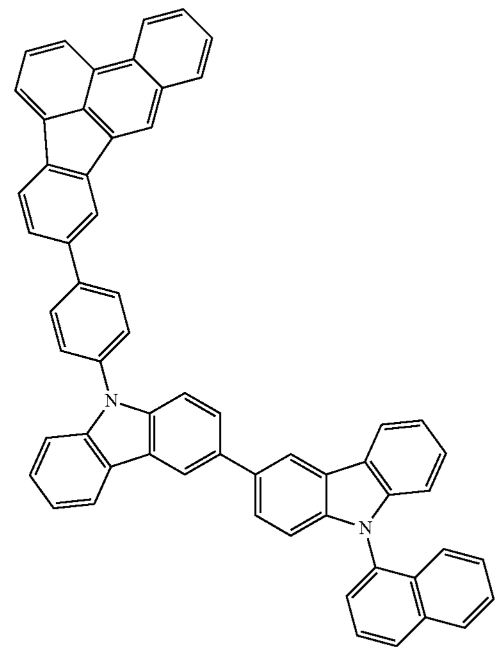
N
N
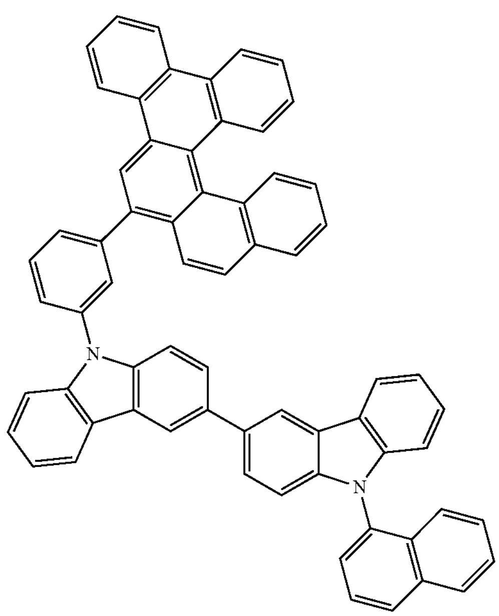
N
N
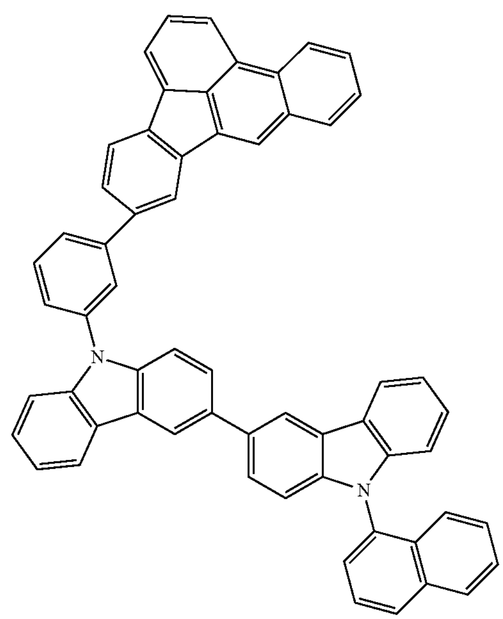
N
N

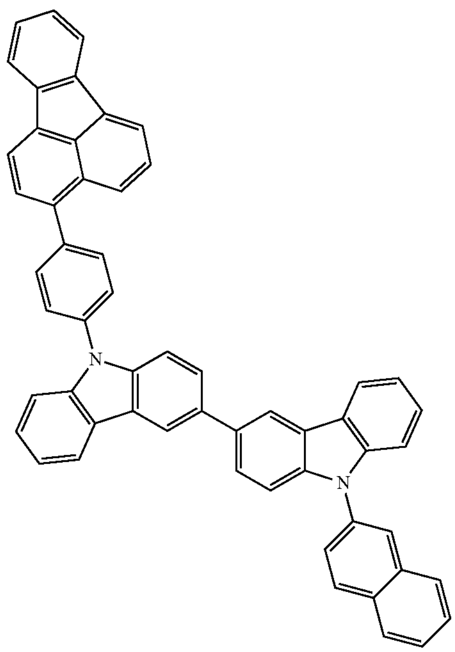
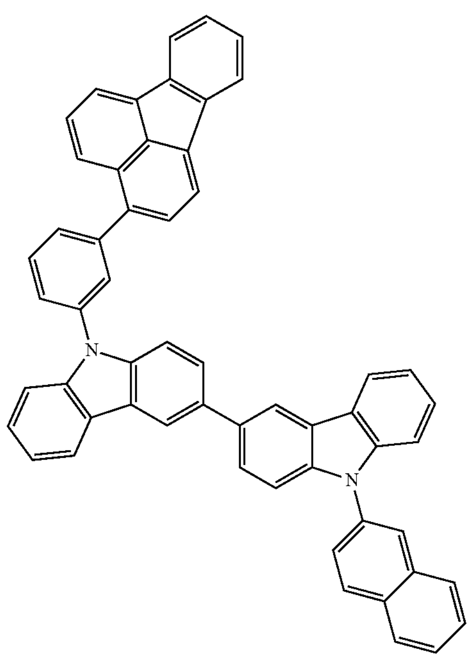
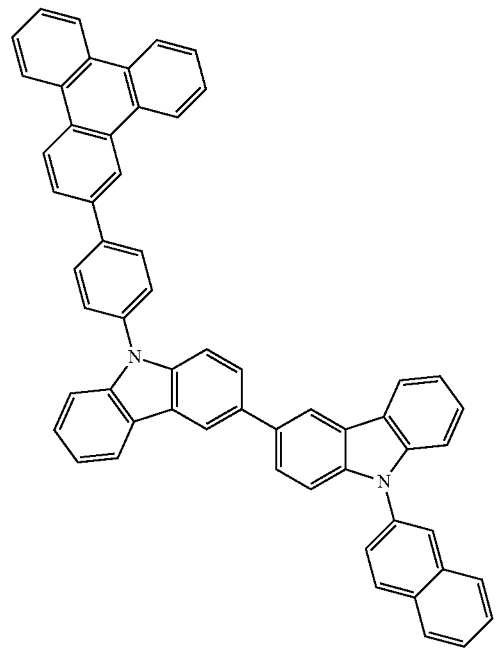
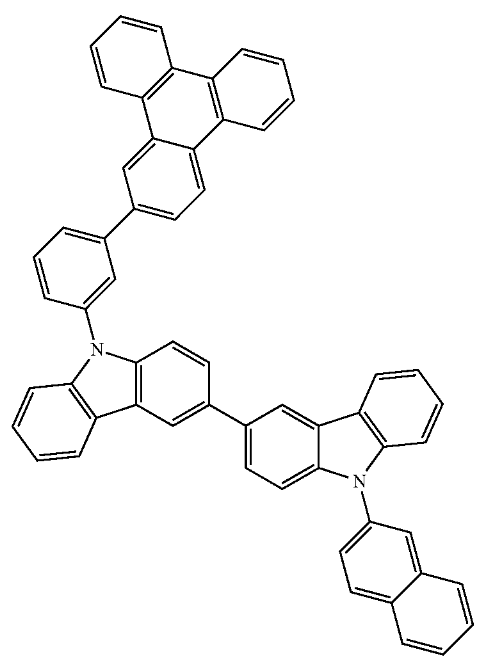

-continued
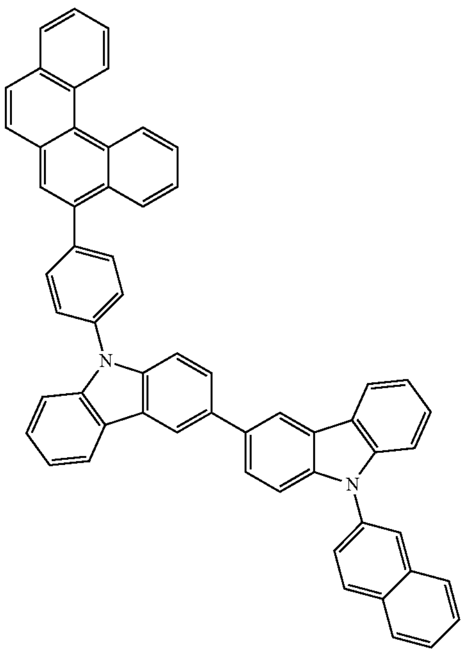 [SMILES: c1ccc2cc(-n3c4ccccc4c4cc(-c5ccc6c(c5)c5ccccc5n6-c5ccc(-c6cc7ccc8ccccc8c7c7ccccc67)cc5)ccc43)ccc2c1]
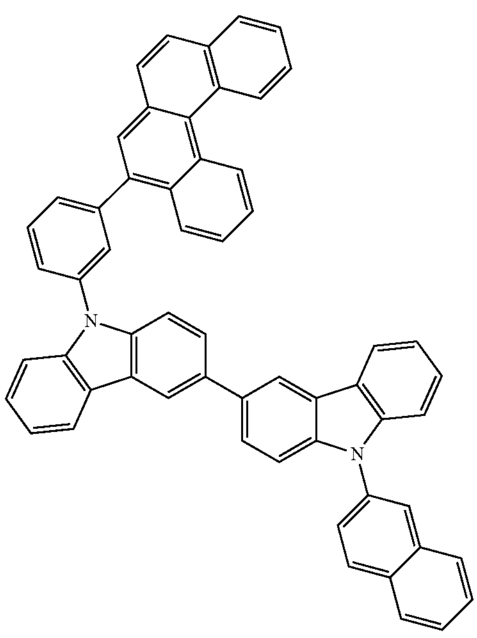
-continued
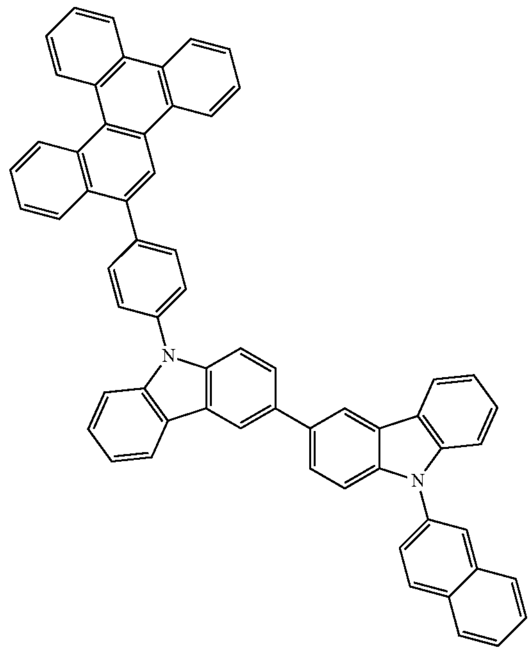
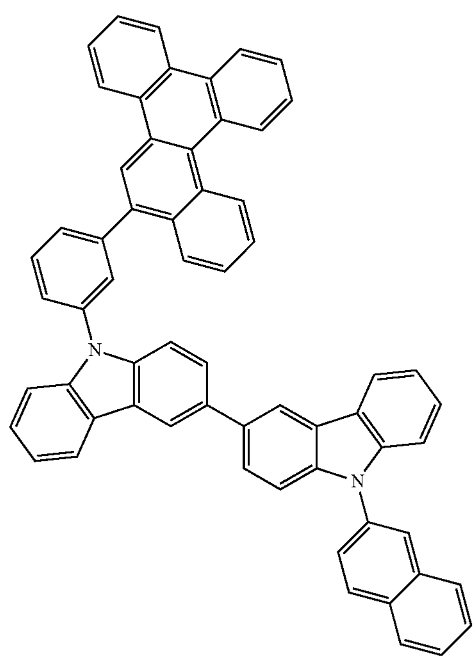

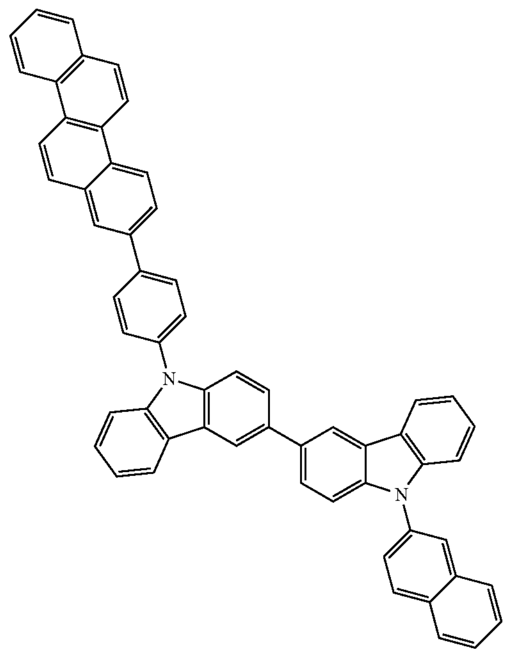
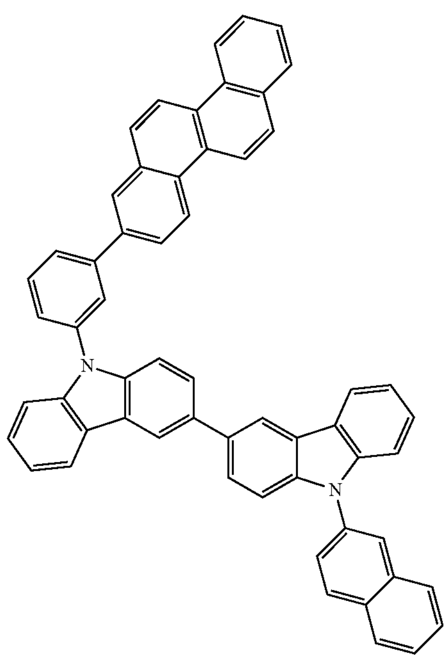
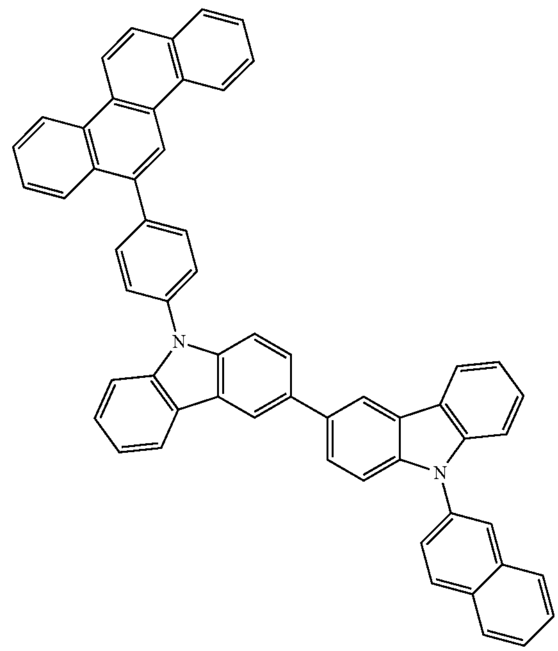
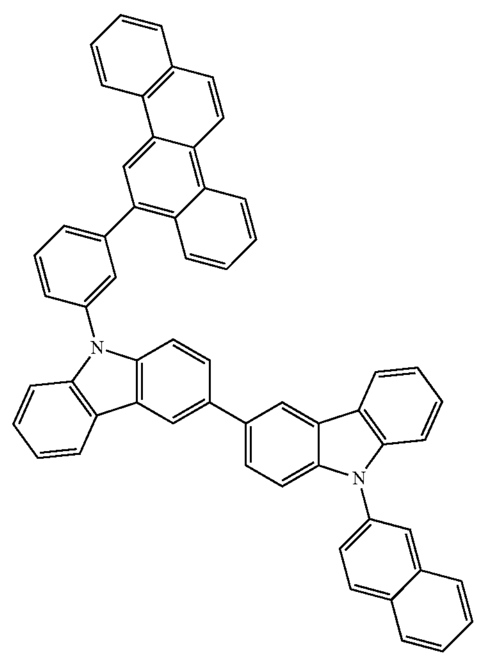

-continued
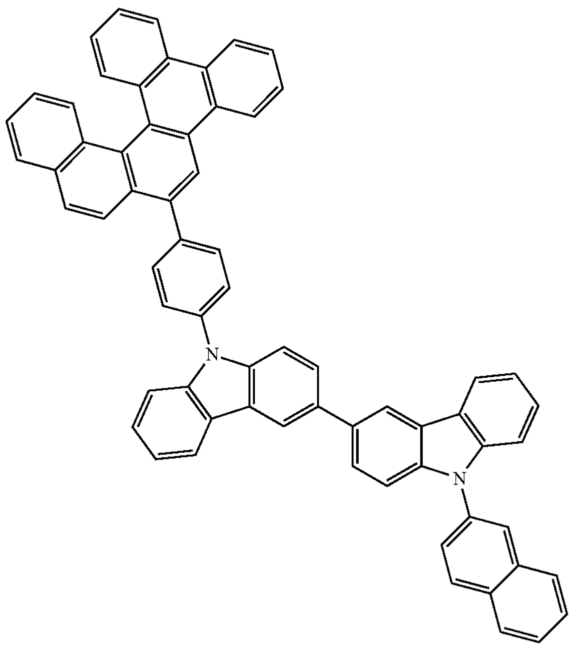
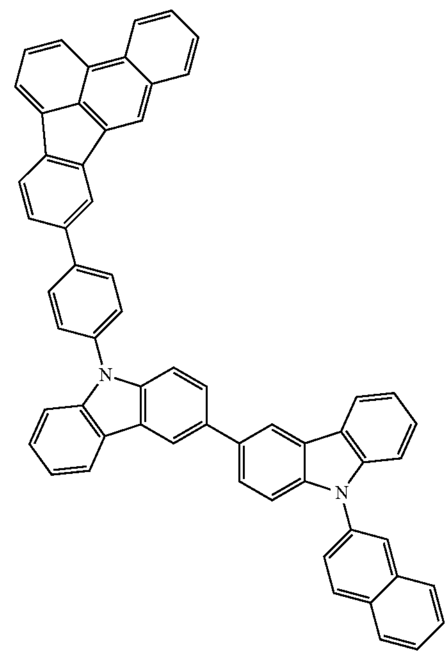
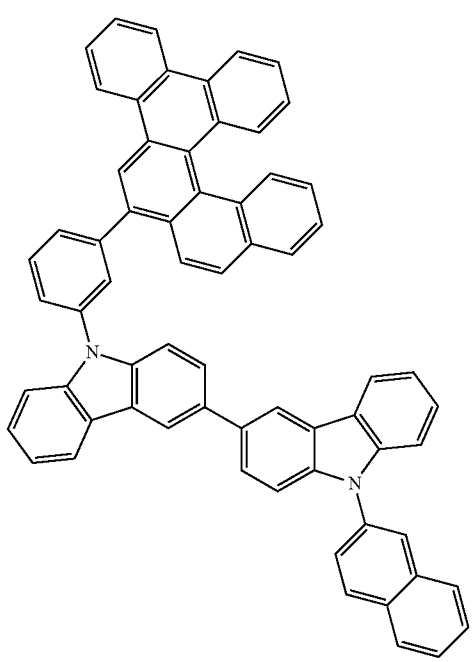 [SMILES: c1cc(-c2cc3c4ccccc4c4ccccc4c3c3c2ccc2ccccc23)cc(-n2c3ccccc3c3cc(-c4ccc5c(c4)c4ccccc4n5-c4ccc5ccccc5c4)ccc32)c1]
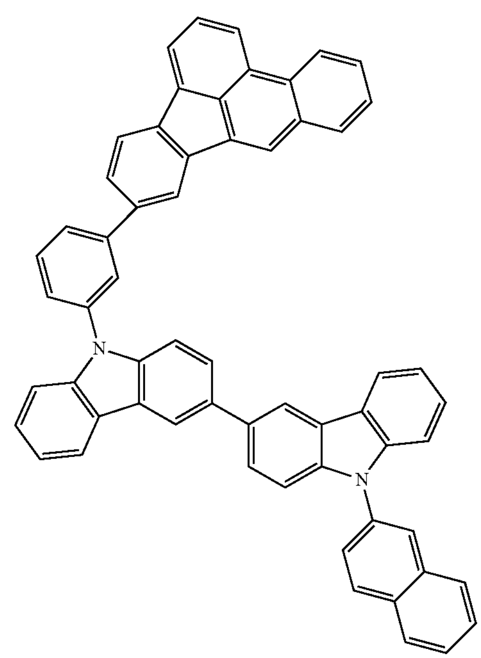

-continued
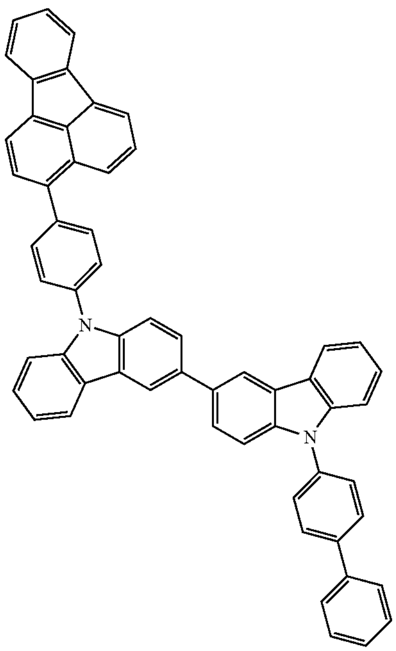
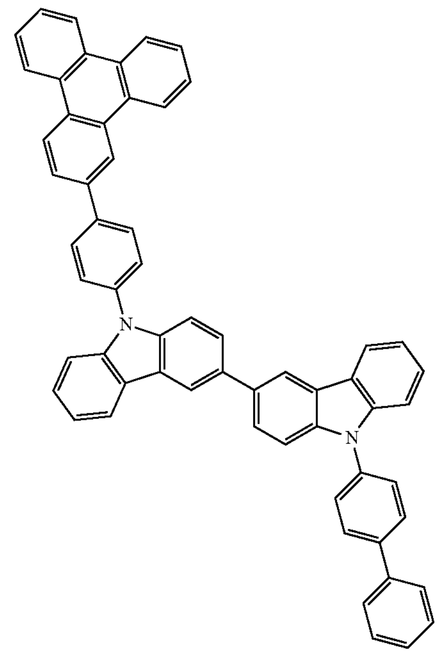
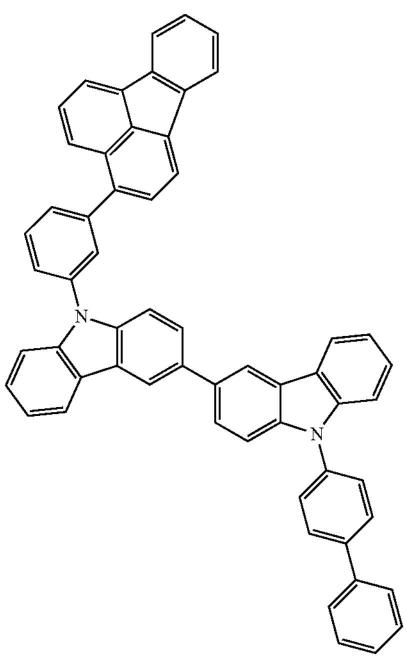
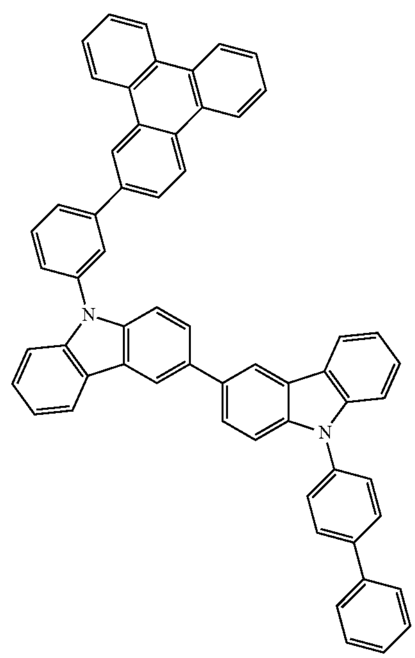
-continued

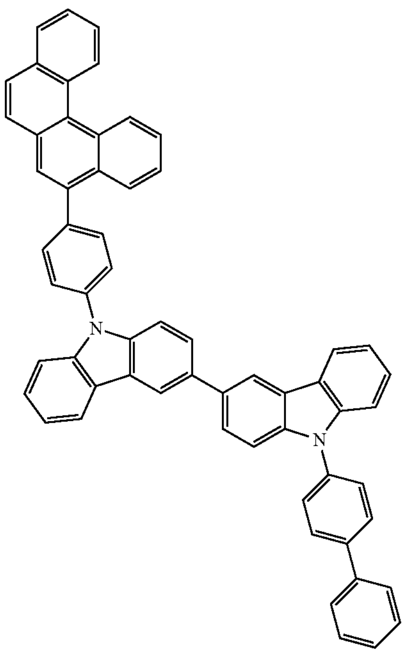 [SMILES: c1ccc(-c2ccc(-n3c4ccccc4c4cc(-c5ccc6c(c5)c5ccccc5n6-c5ccc(-c6cc7ccc8ccccc8c7c7ccccc67)cc5)ccc43)cc2)cc1]
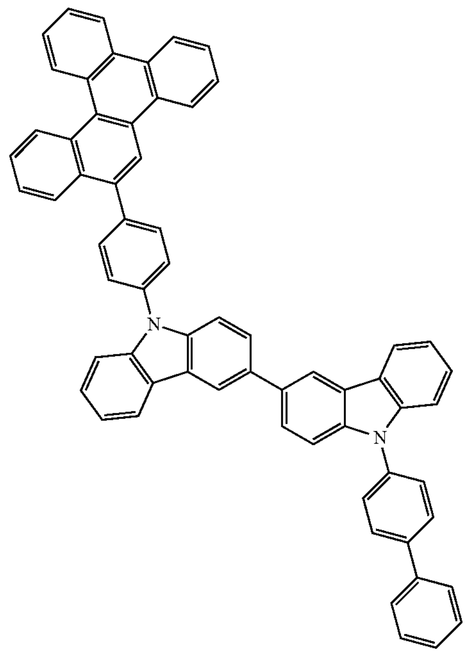
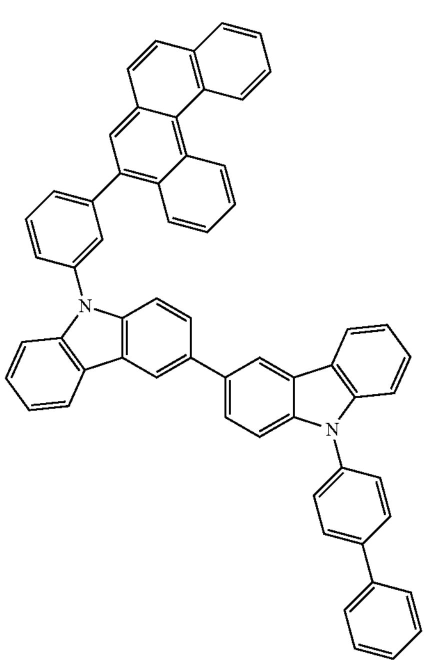
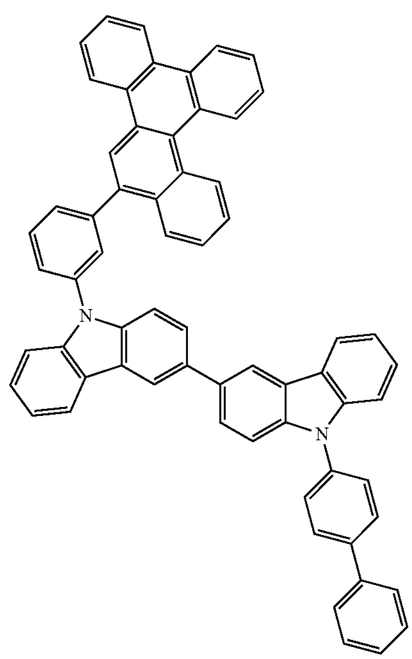

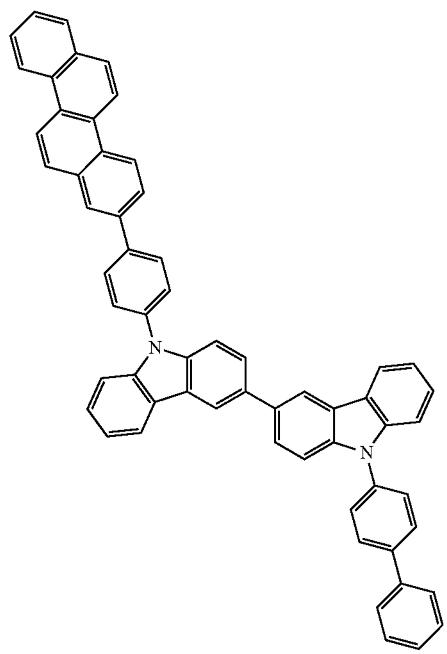
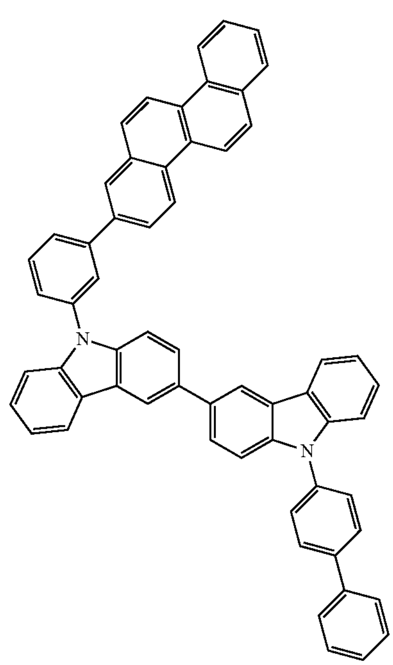
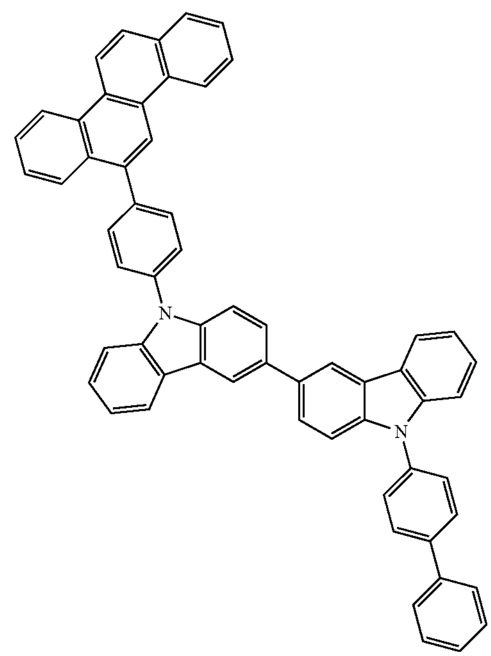
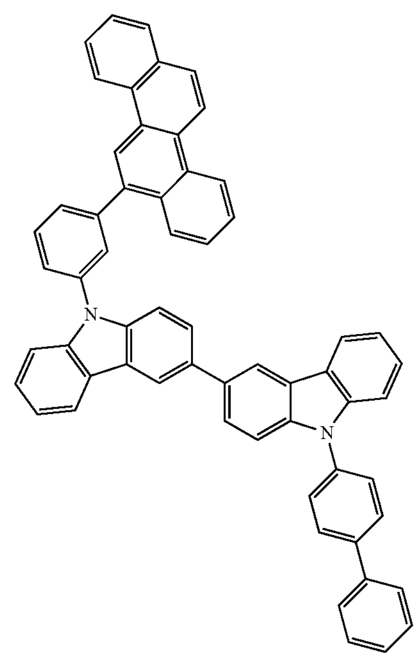

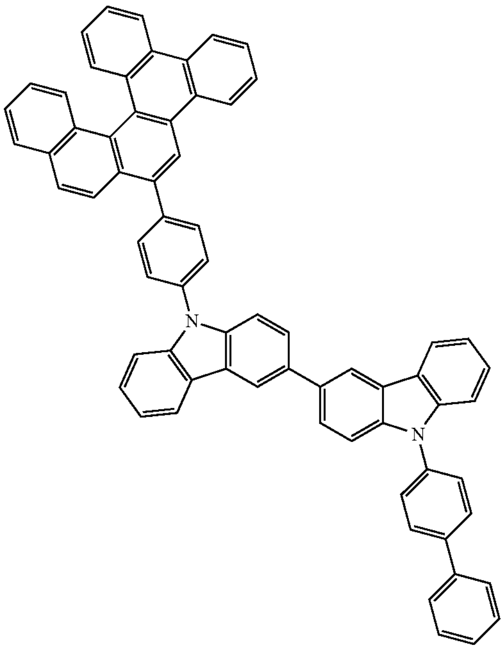
N
N
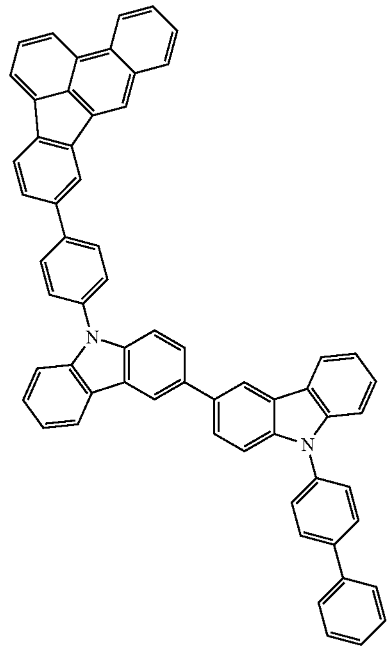
N
N
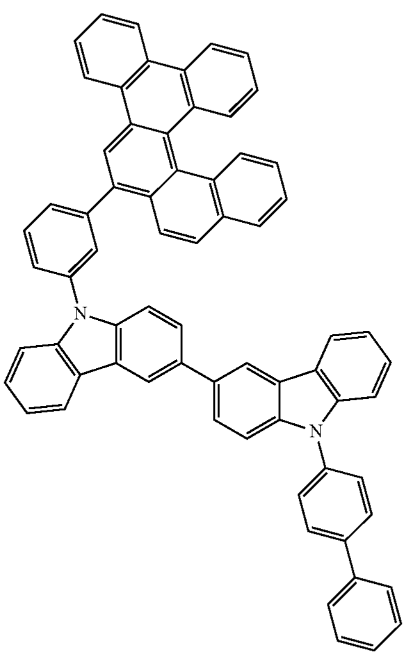 [SMILES: c1ccc(-c2ccc(-n3c4ccccc4c4cc(-c5ccc6c(c5)c5ccccc5n6-c5cccc(-c6cc7c8ccccc8c8ccccc8c7c7c6ccc6ccccc67)c5)ccc43)cc2)cc1]
N
N
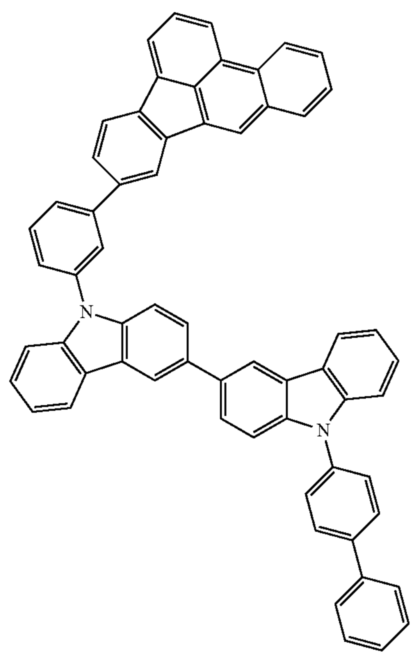
N
N

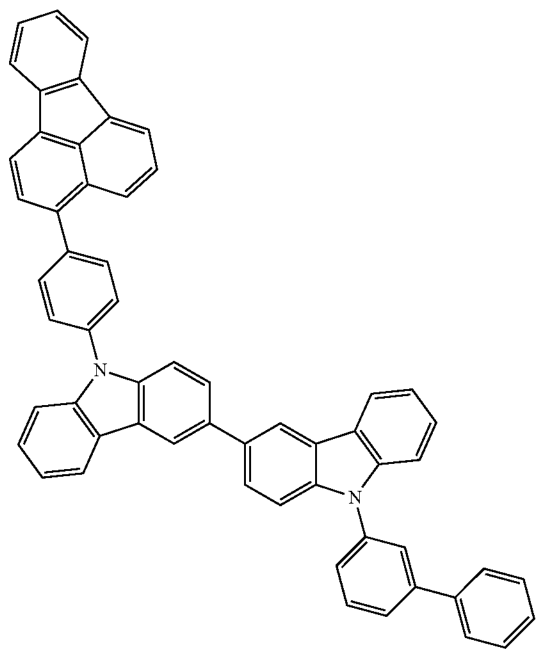
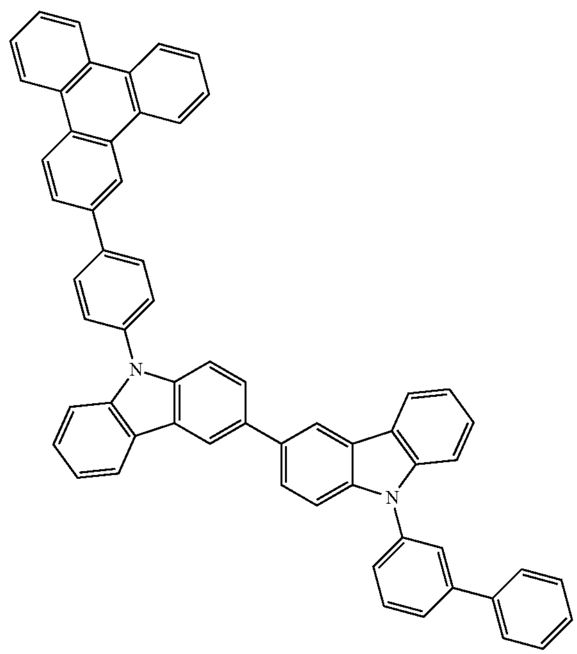
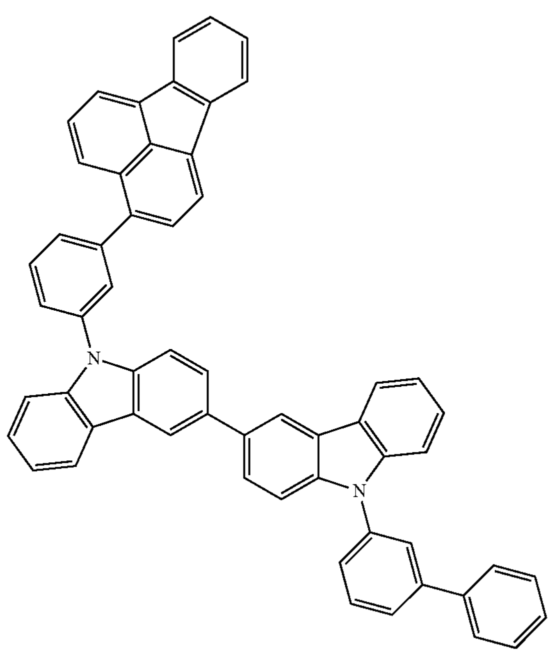
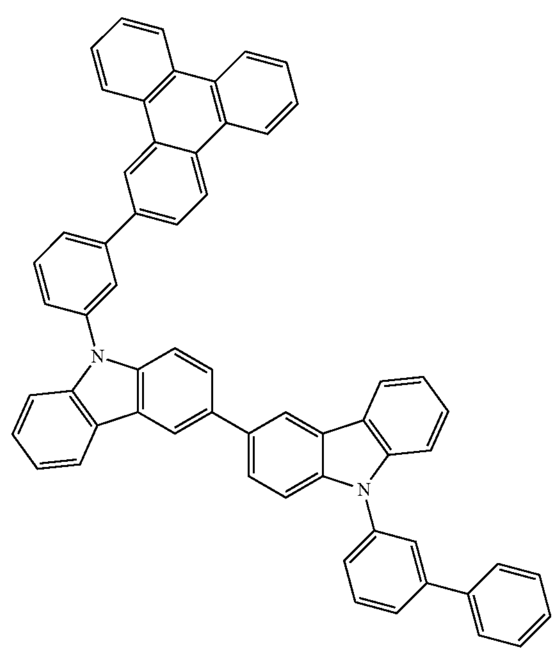

-continued
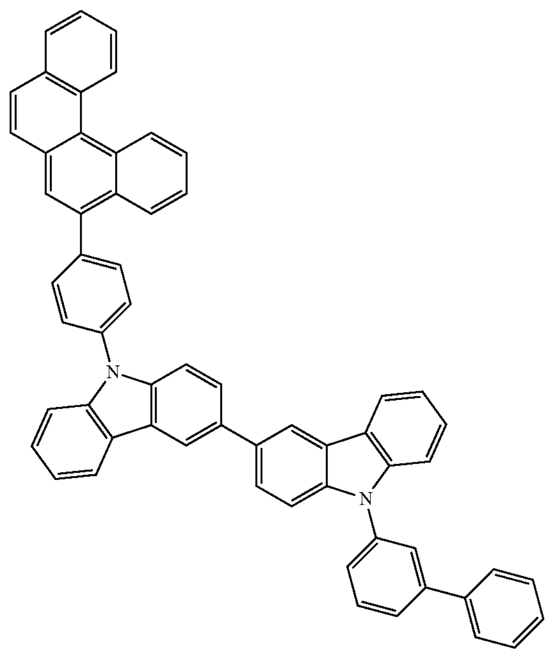 [SMILES: c1ccc(-c2cccc(-n3c4ccccc4c4cc(-c5ccc6c(c5)c5ccccc5n6-c5ccc(-c6cc7ccc8ccccc8c7c7ccccc67)cc5)ccc43)c2)cc1]
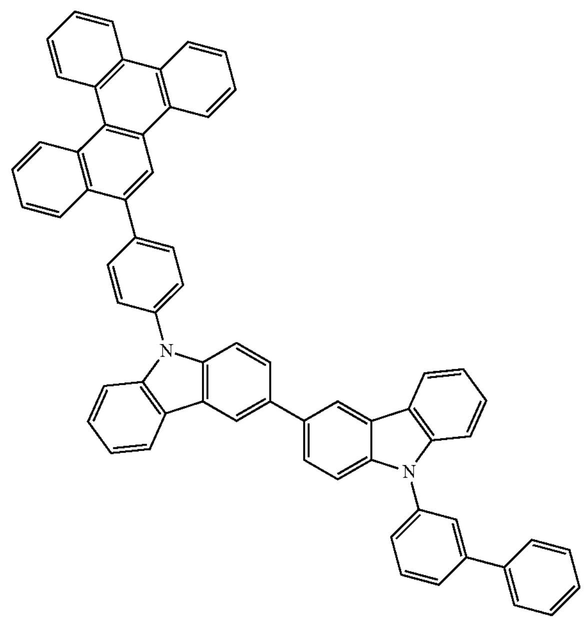
-continued
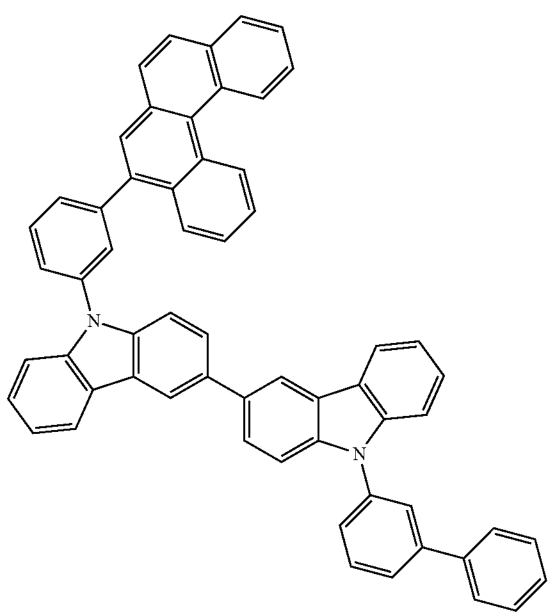
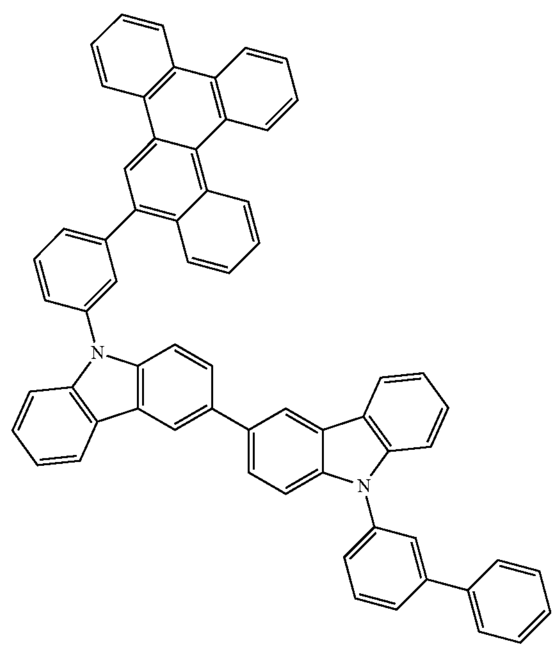

-continued
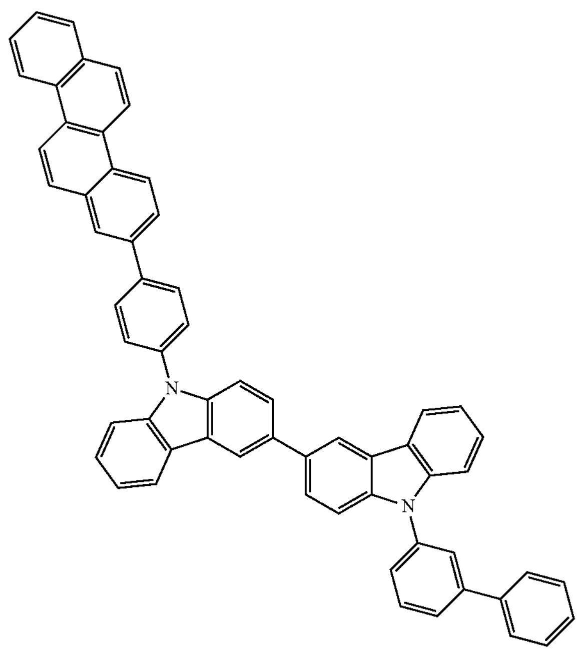
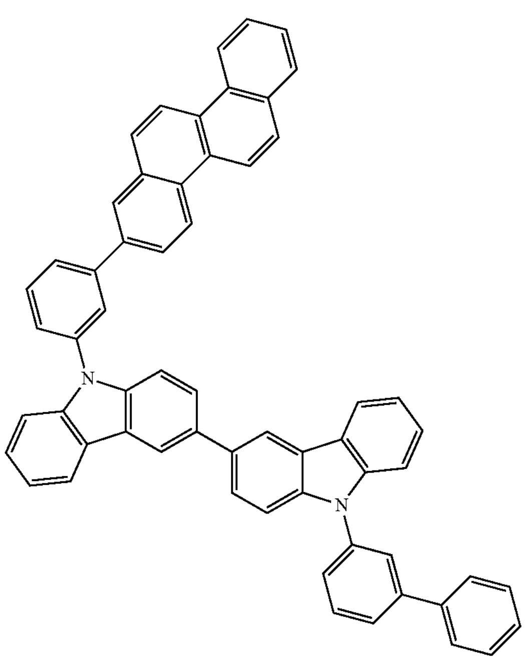
-continued
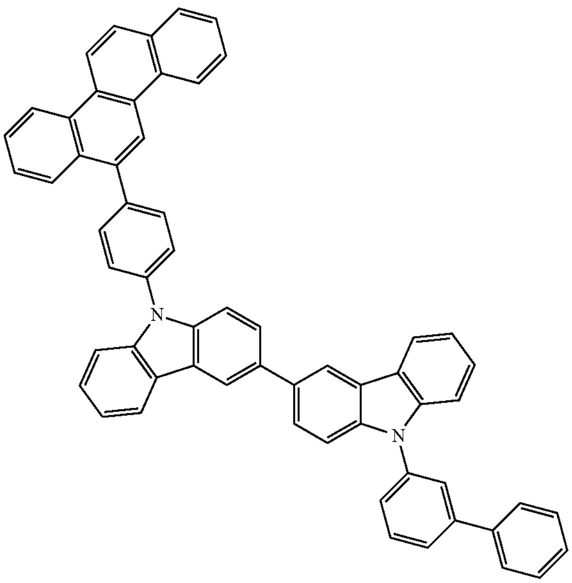
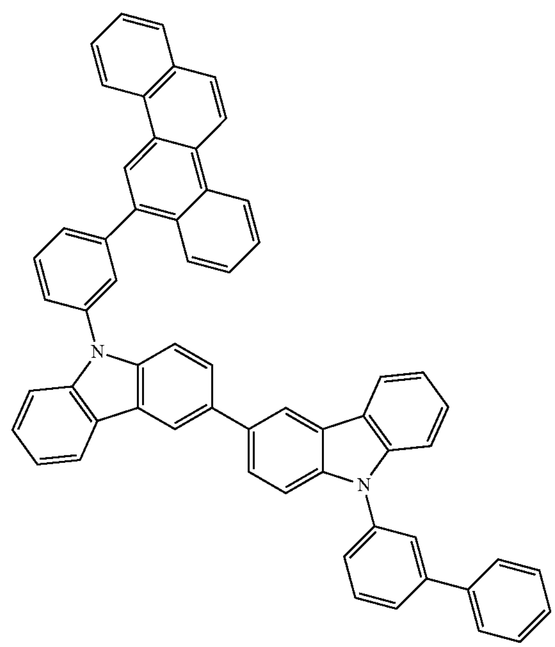

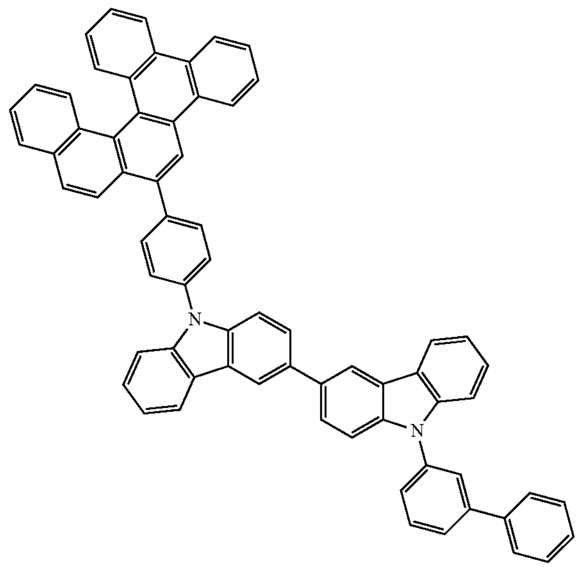
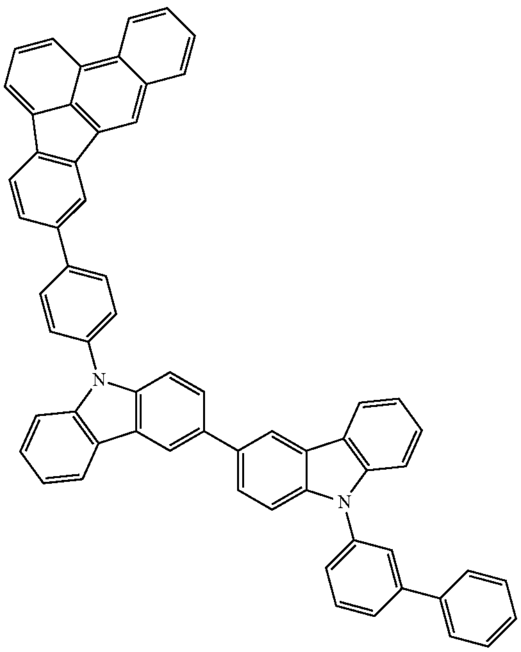
N
N
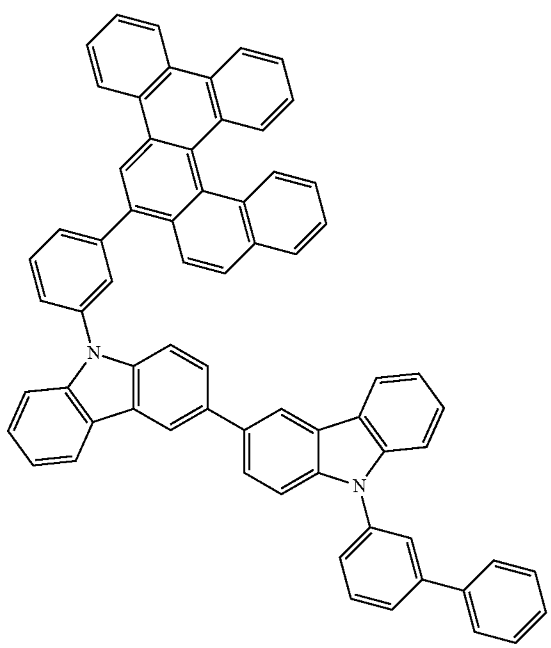 [SMILES: c1ccc(-c2cccc(-n3c4ccccc4c4cc(-c5ccc6c(c5)c5ccccc5n6-c5cccc(-c6cc7c8ccccc8c8ccccc8c7c7c6ccc6ccccc67)c5)ccc43)c2)cc1]
N
N
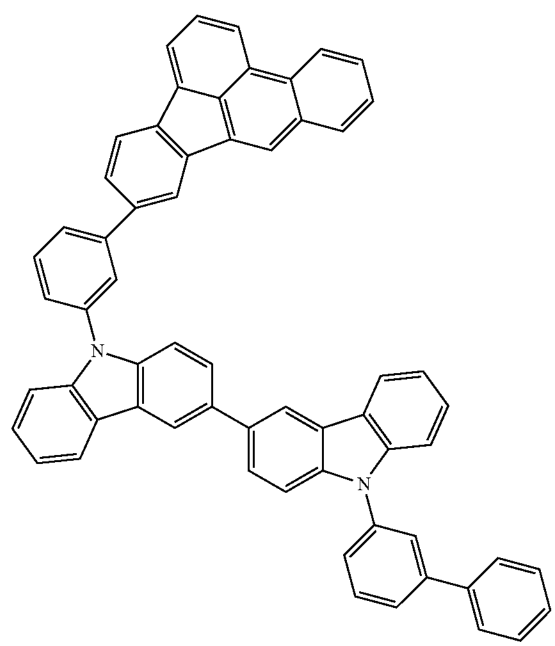
N
N

-continued
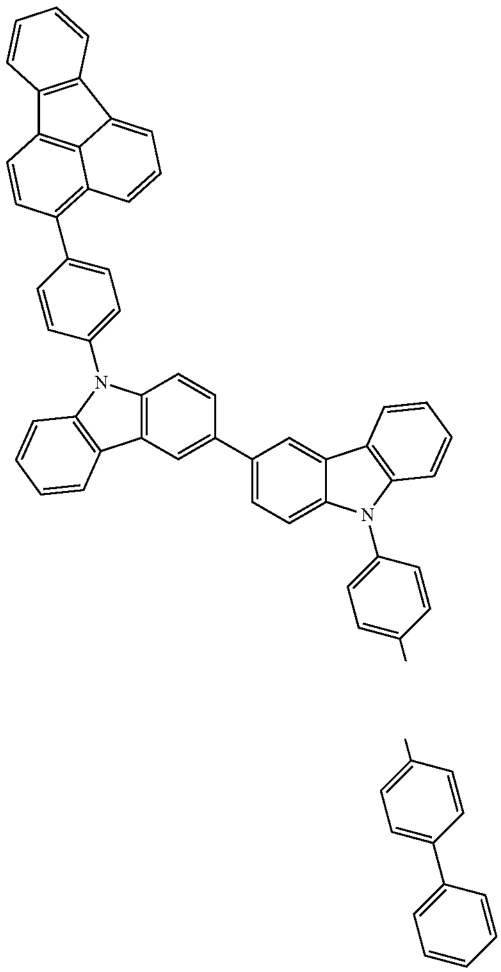
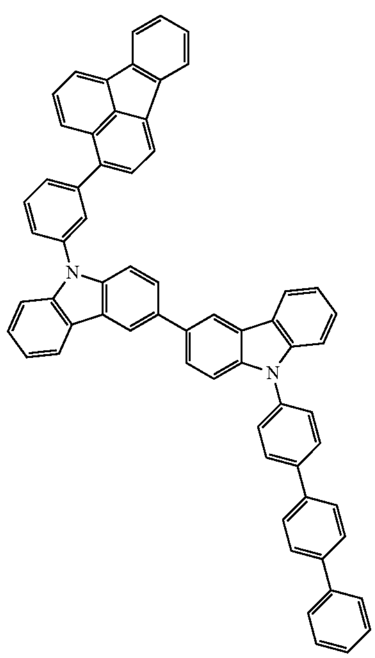
-continued
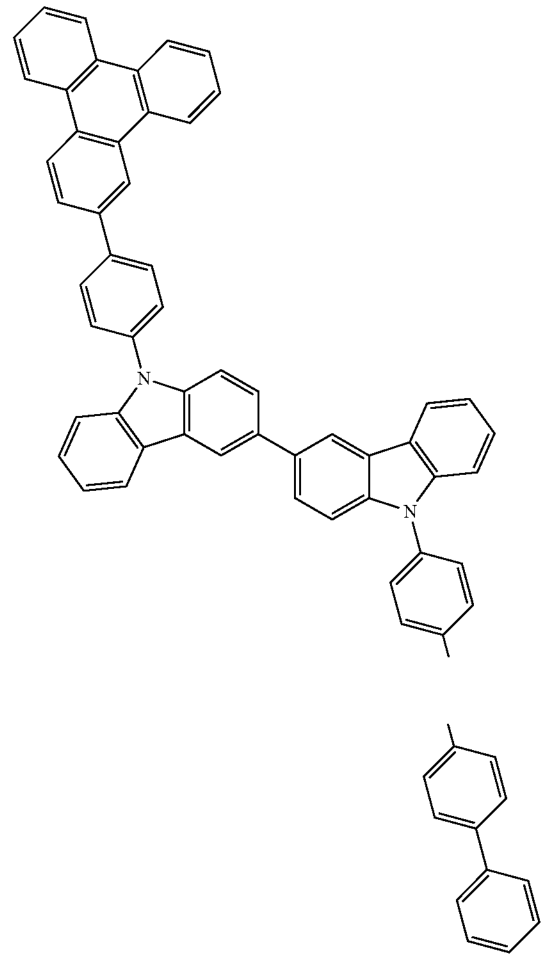
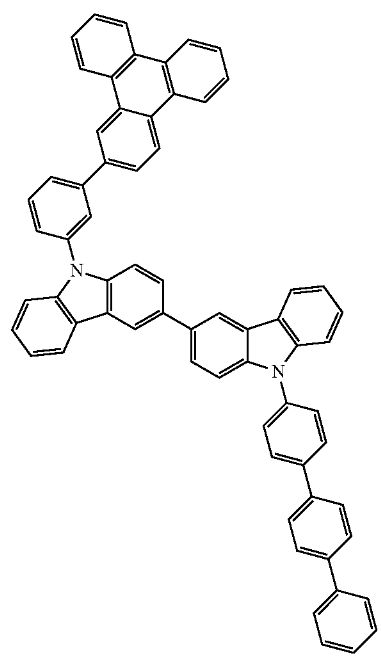

-continued
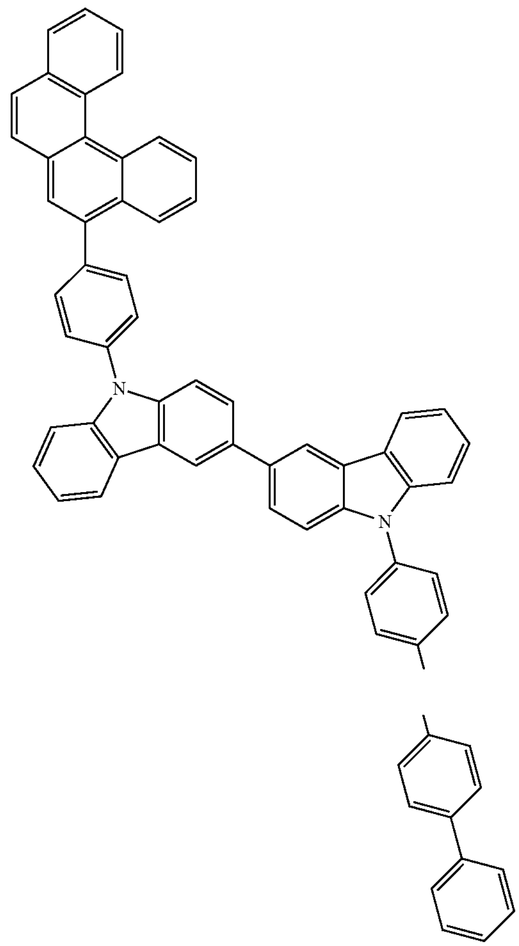
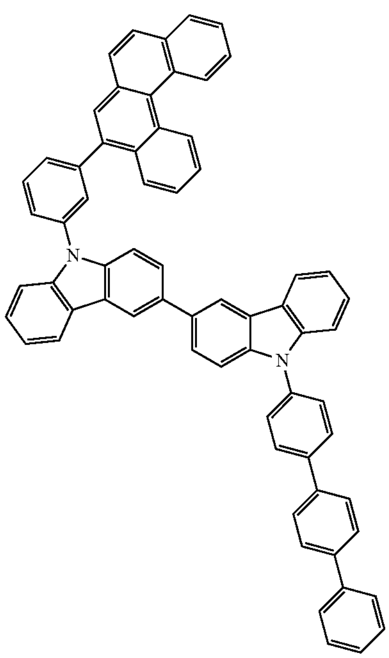
-continued
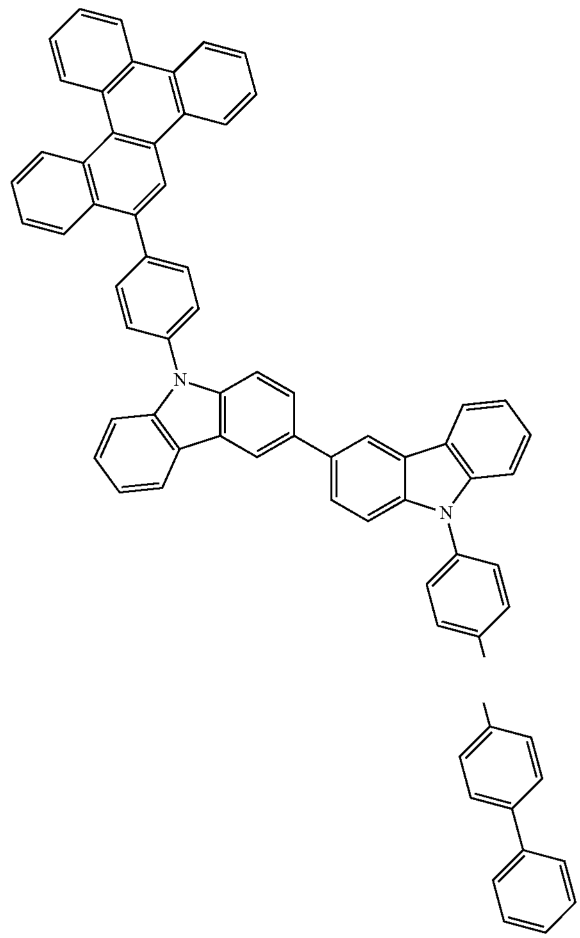
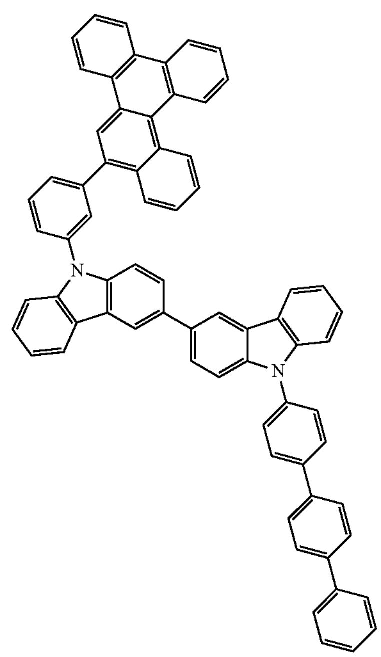

-continued
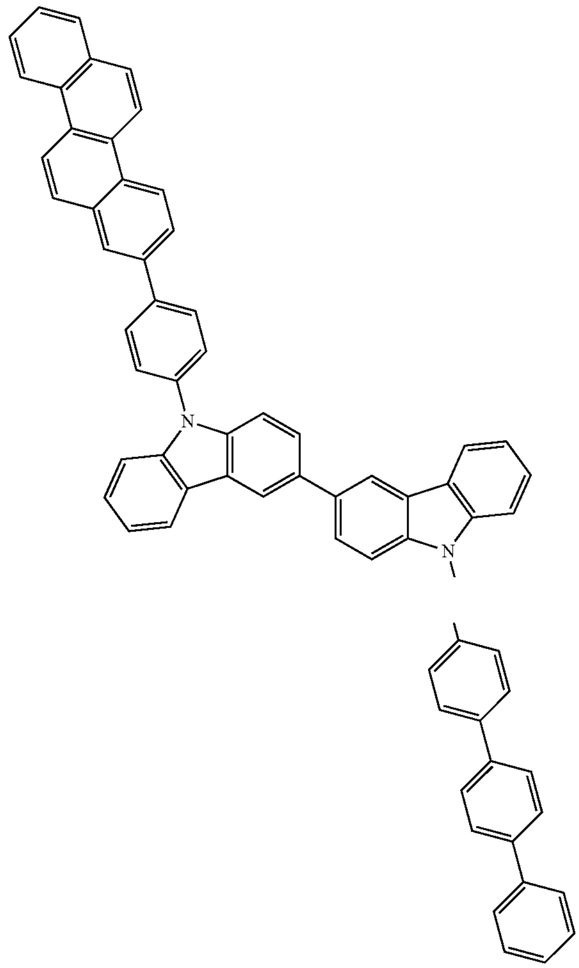
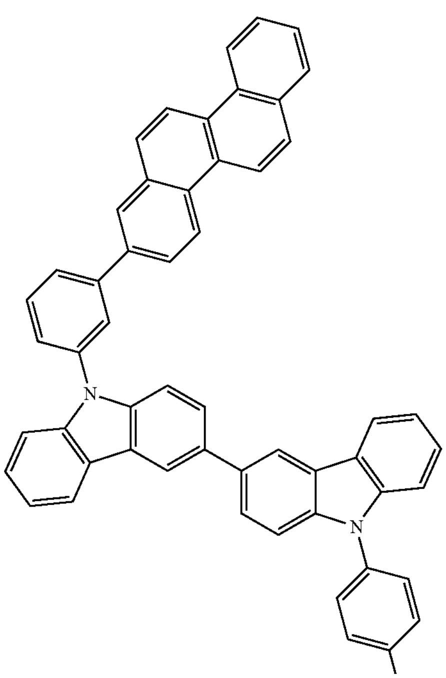
-continued
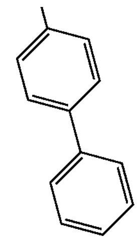
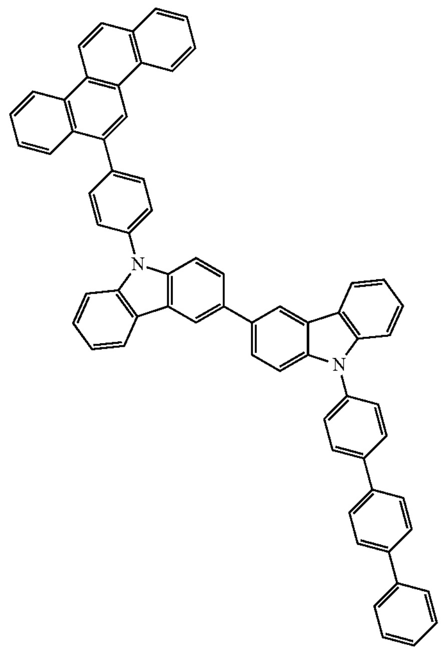
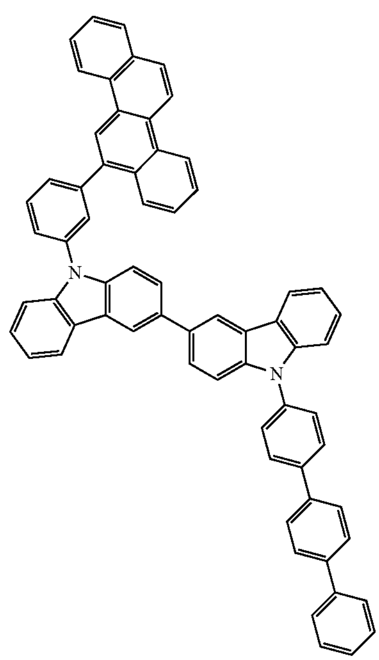

-continued
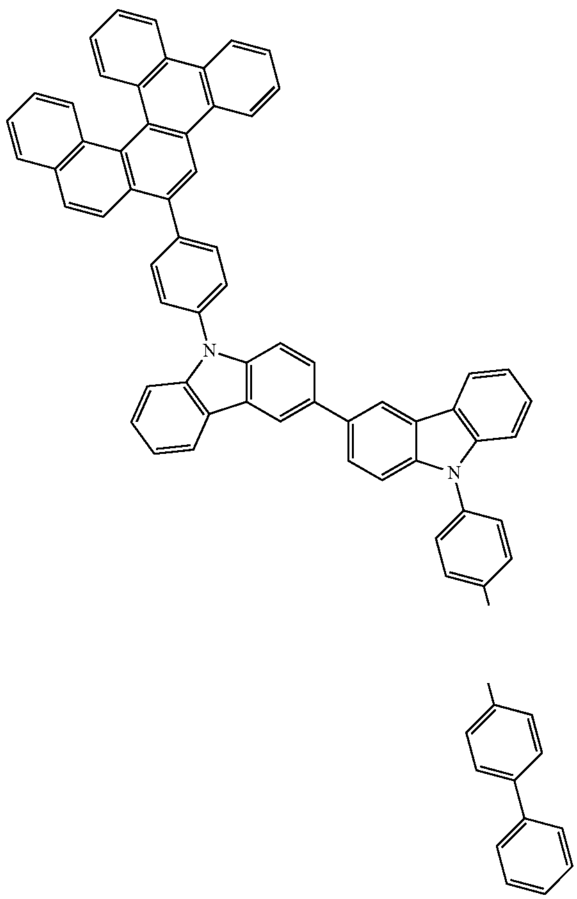
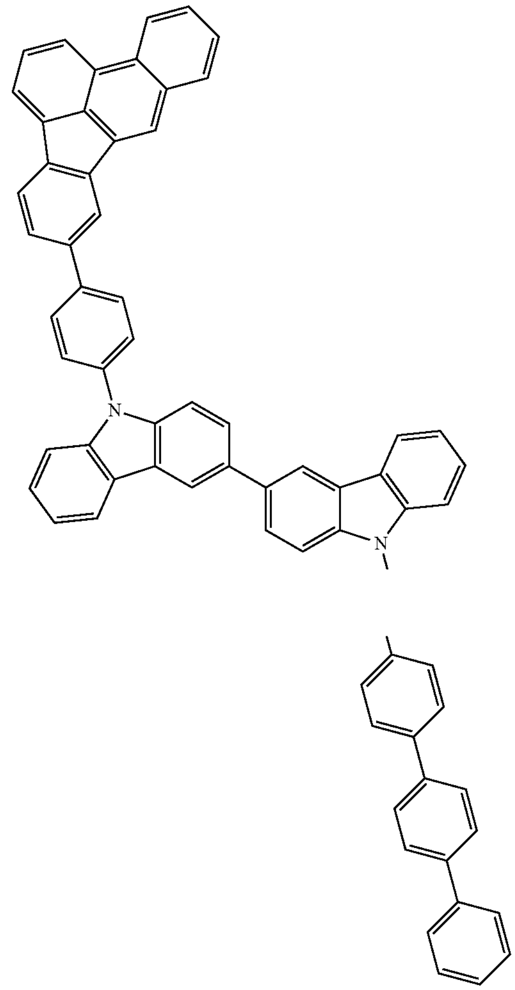
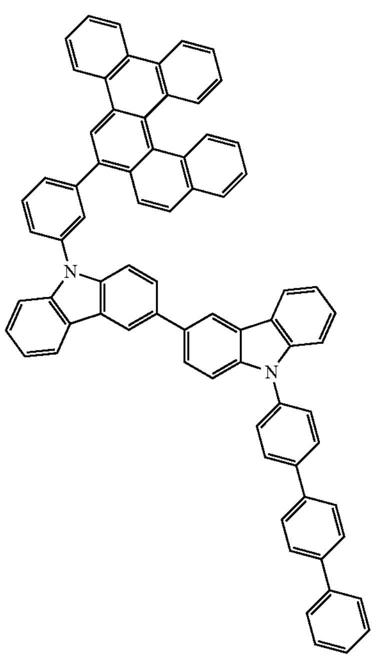 [SMILES: c1ccc(-c2ccc(-c3ccc(-n4c5ccccc5c5cc(-c6ccc7c(c6)c6ccccc6n7-c6cccc(-c7cc8c9ccccc9c9ccccc9c8c8c7ccc7ccccc78)c6)ccc54)cc3)cc2)cc1]
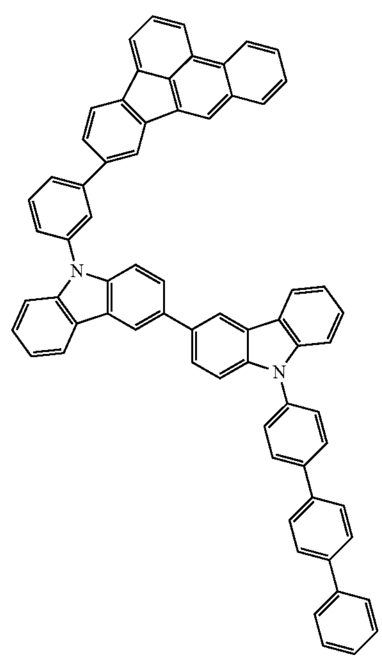

-continued
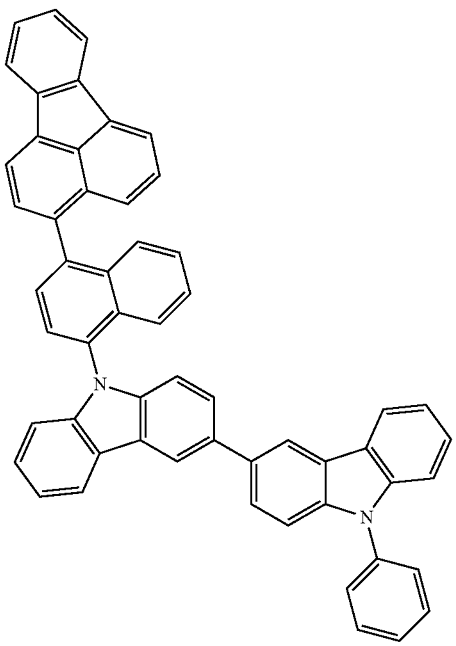
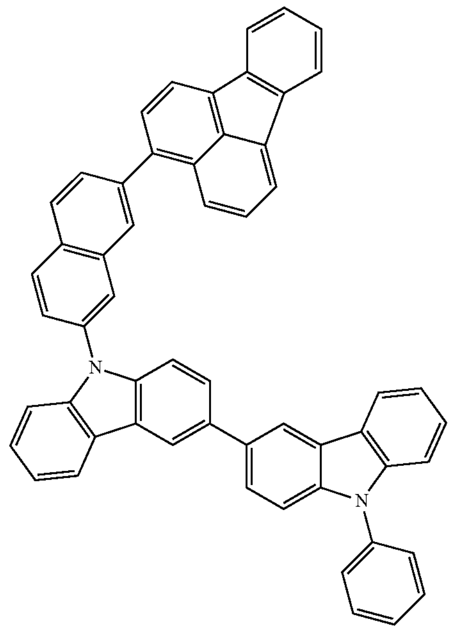
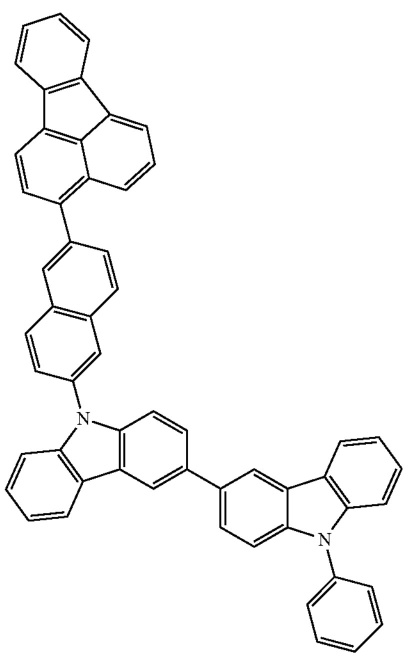
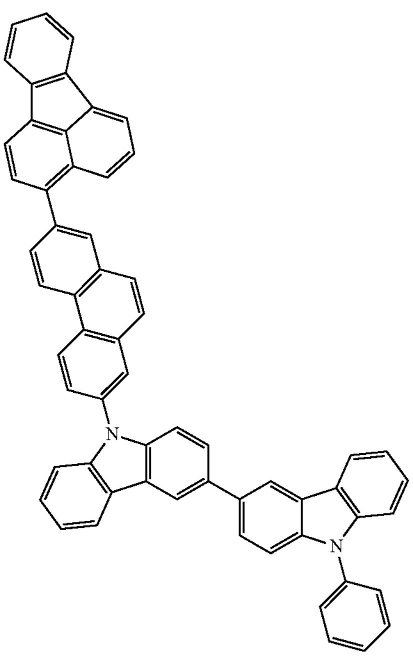
-continued

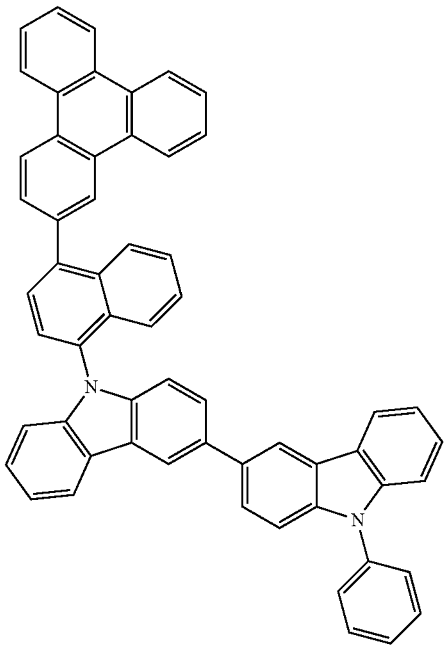
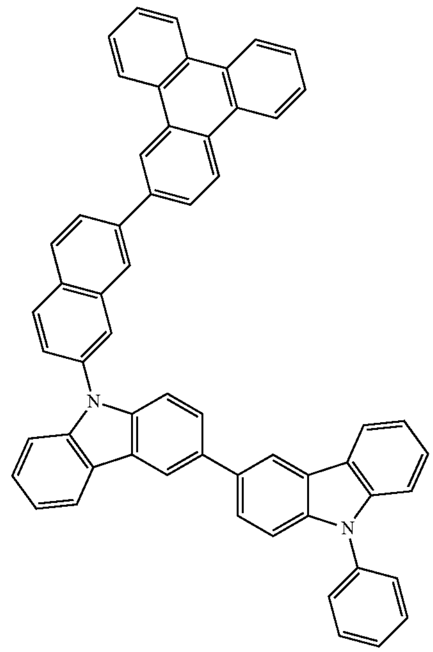
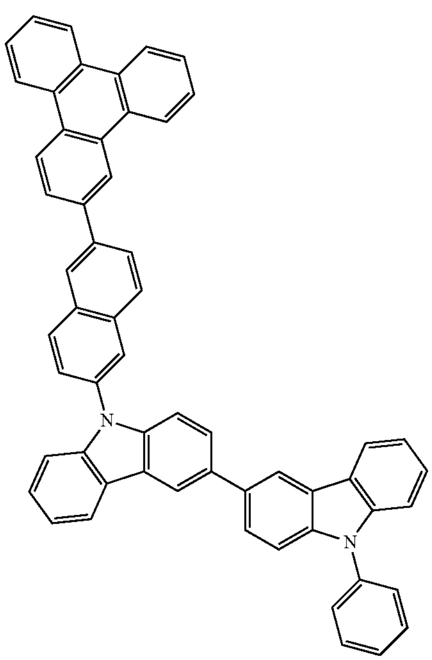
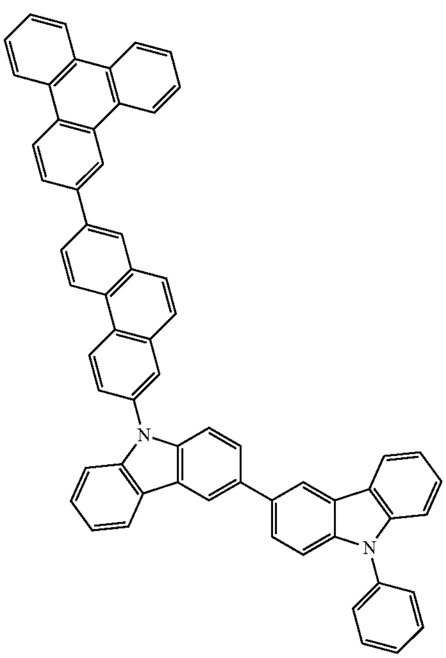

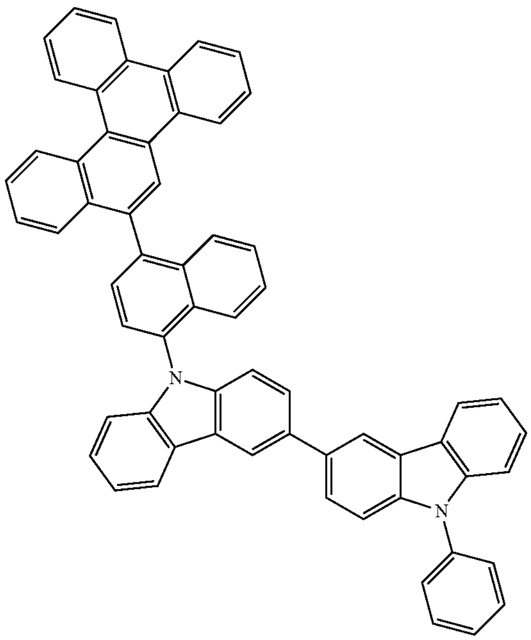
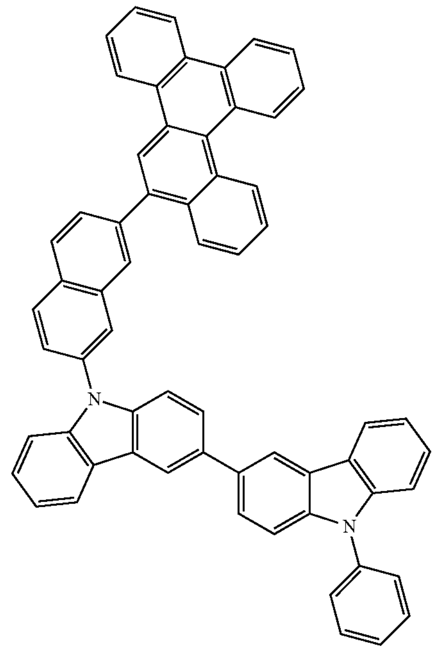
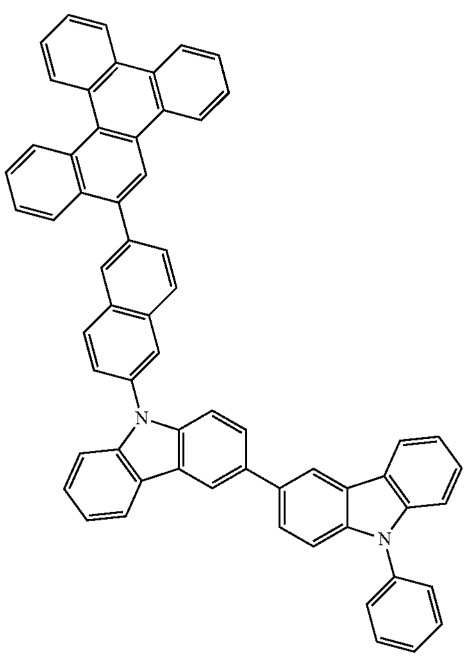
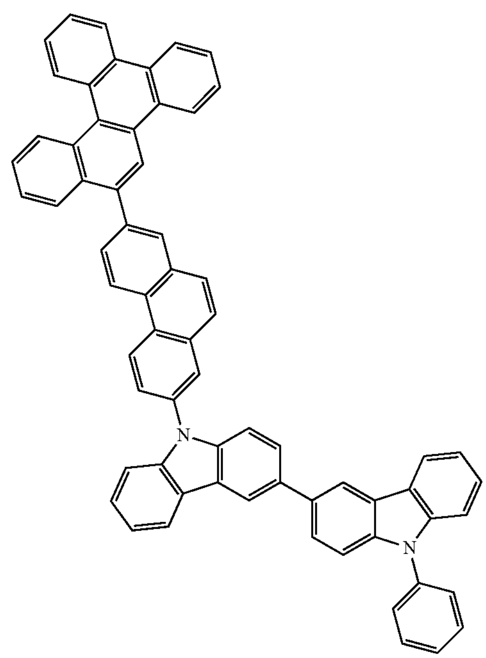

-continued
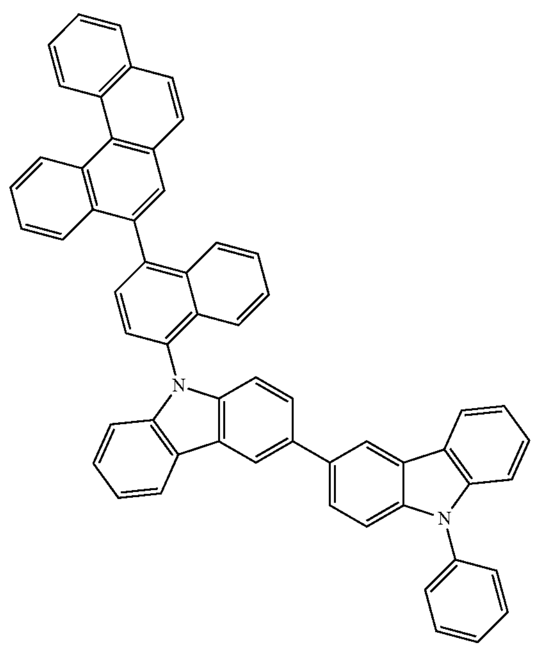
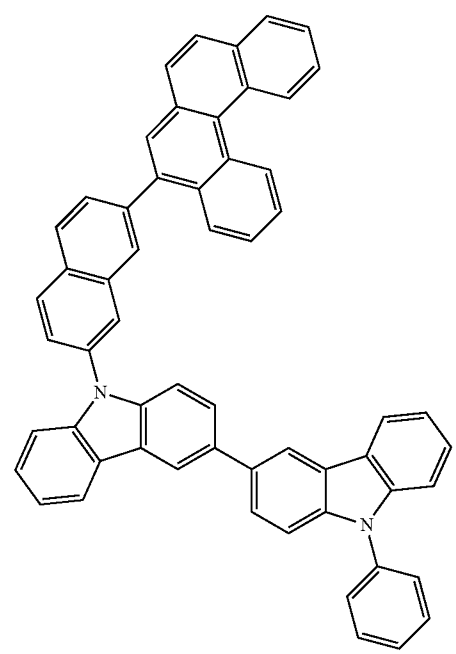
-continued
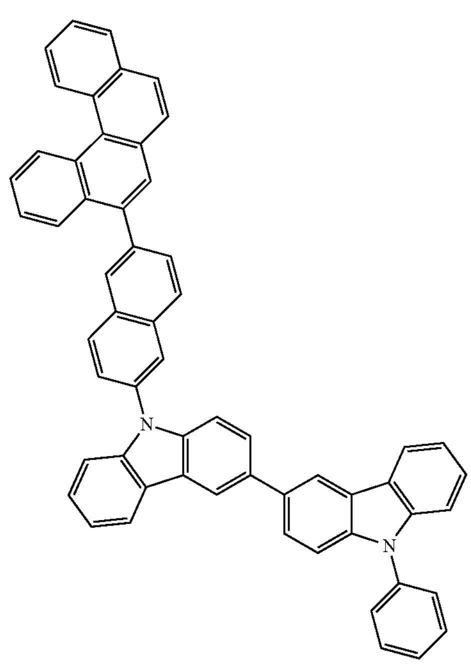
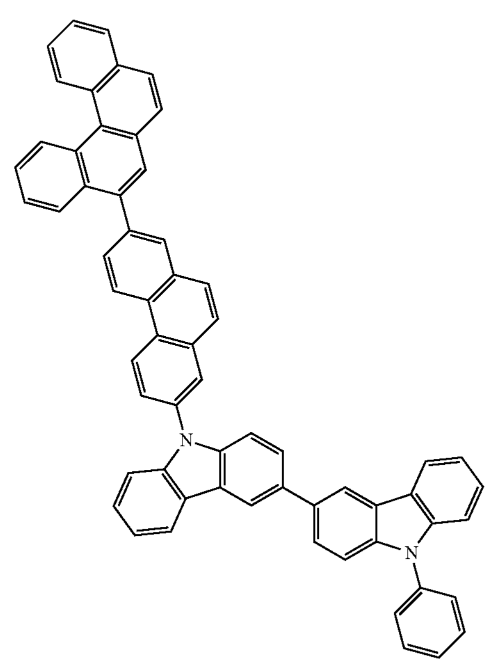

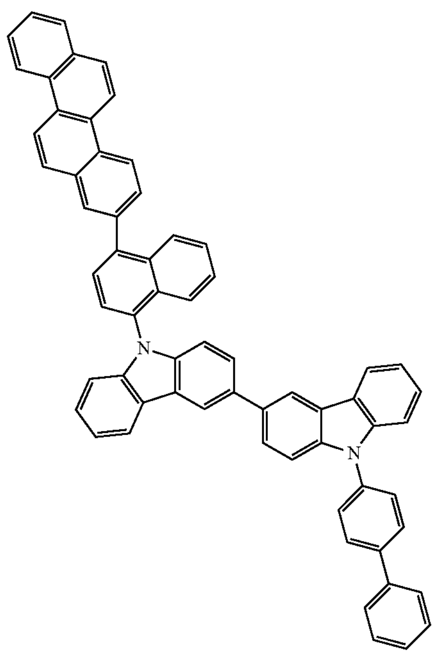
N
N
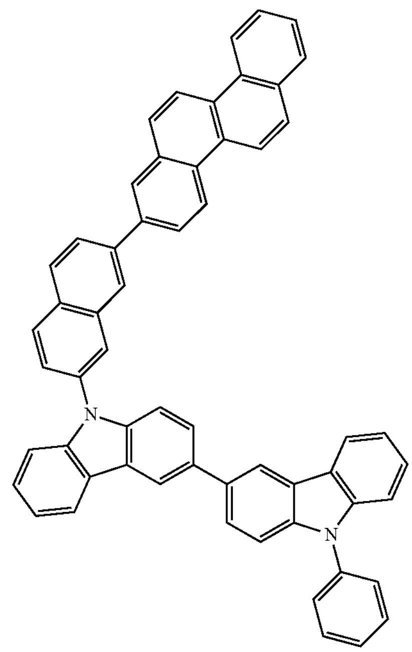
N
N
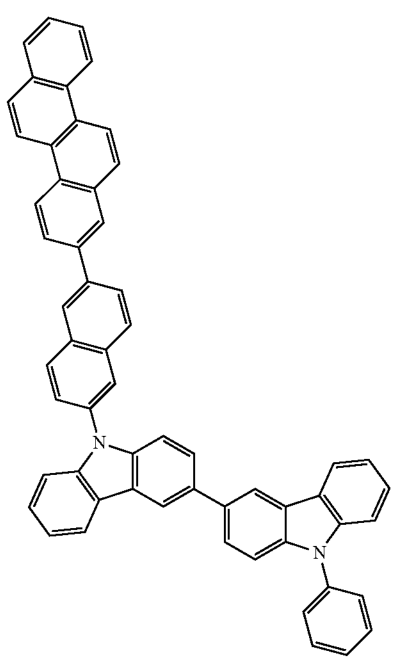
N
N
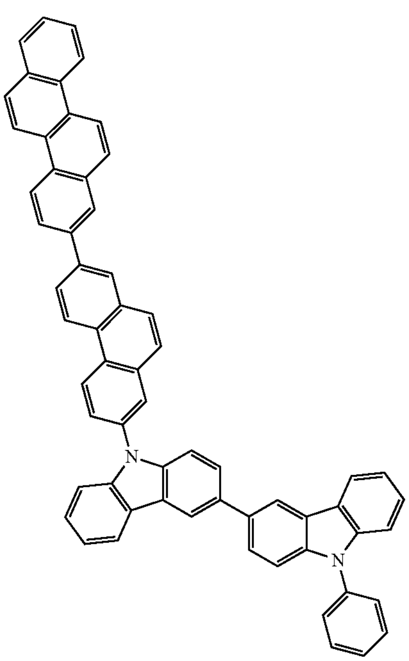
N
N

-continued
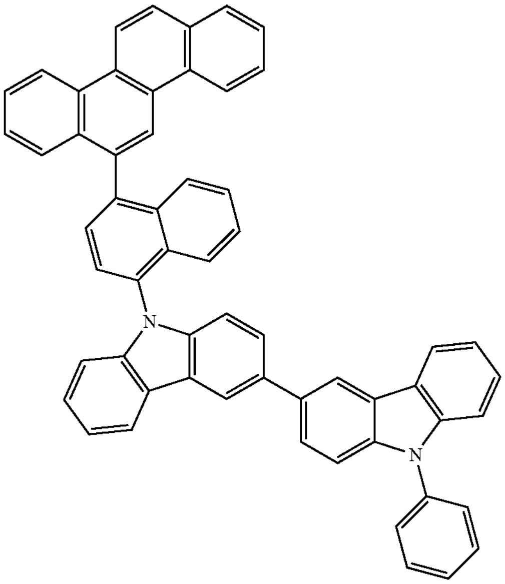
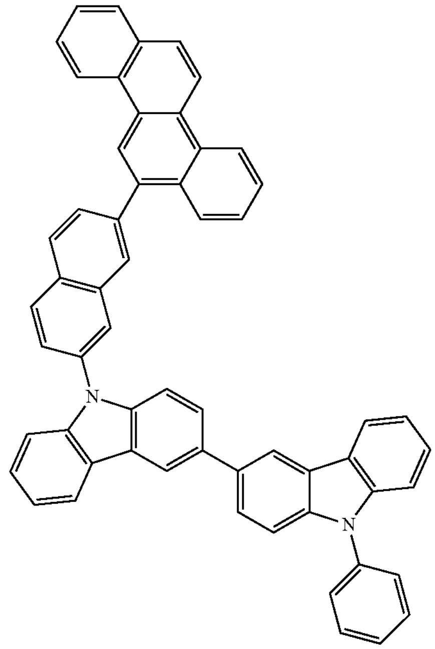
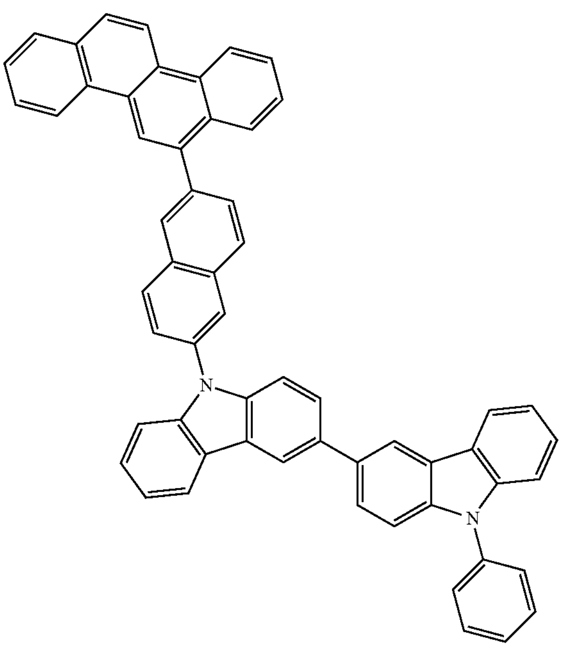
-continued
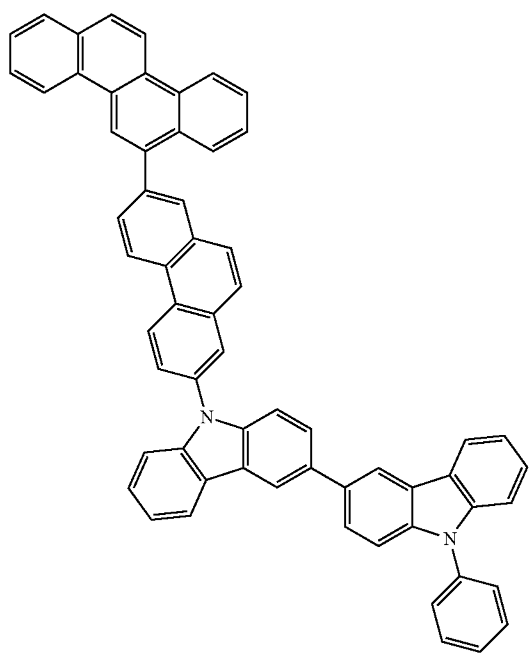

-continued
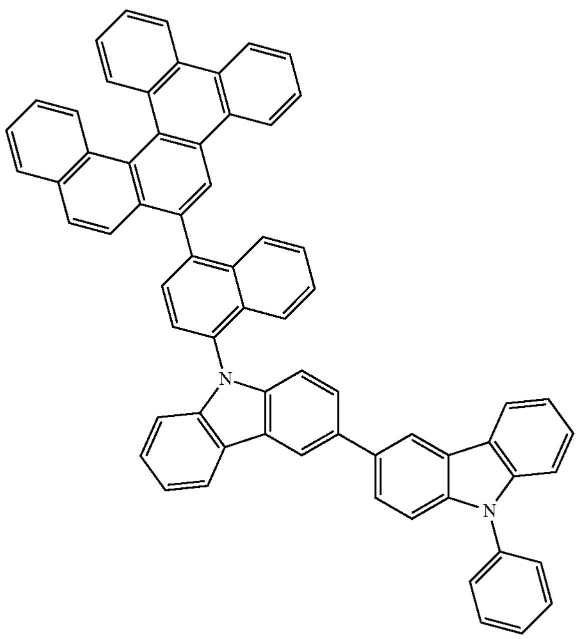
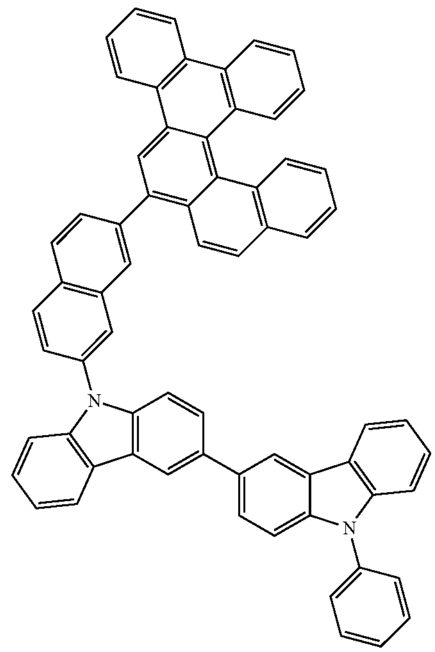
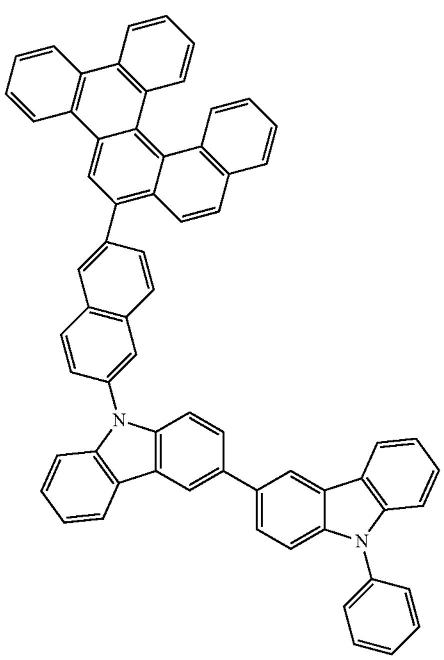
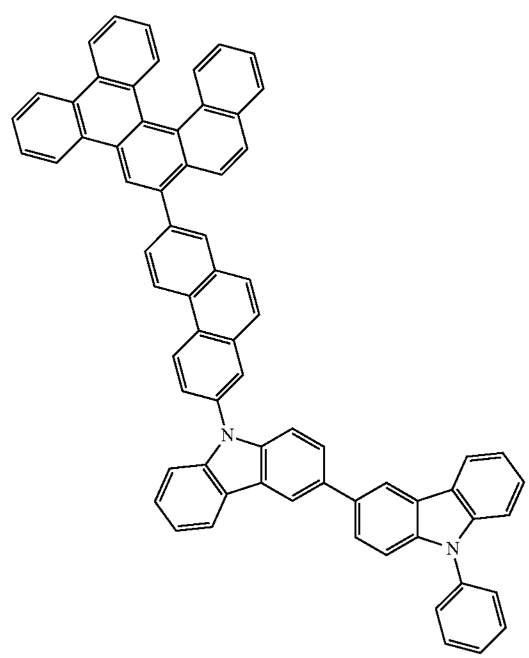
-continued

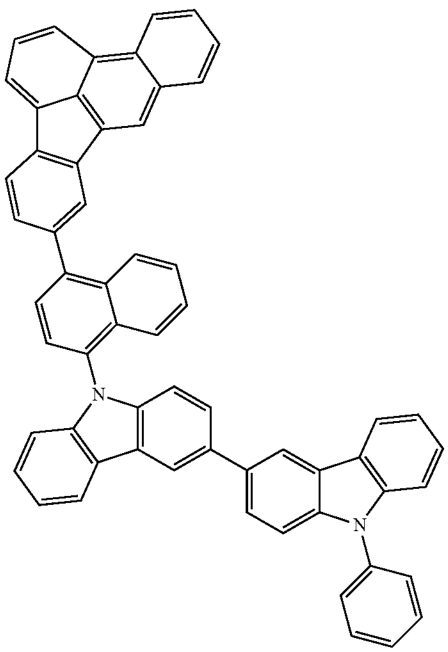
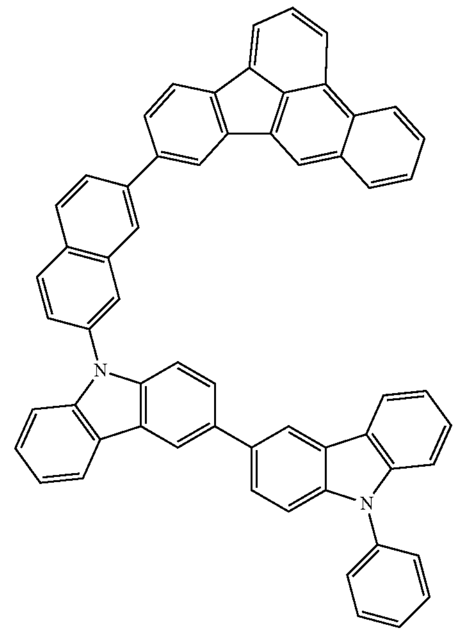
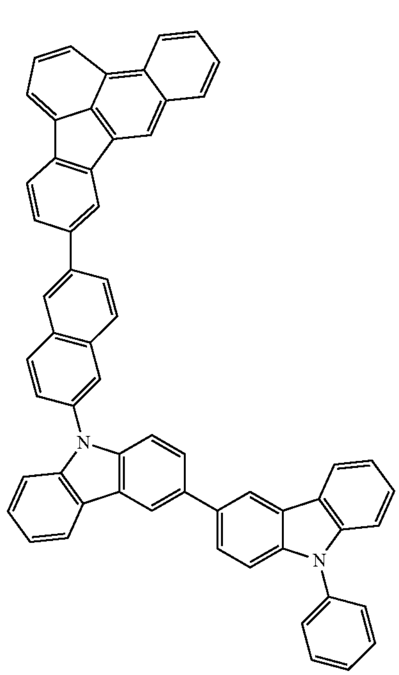
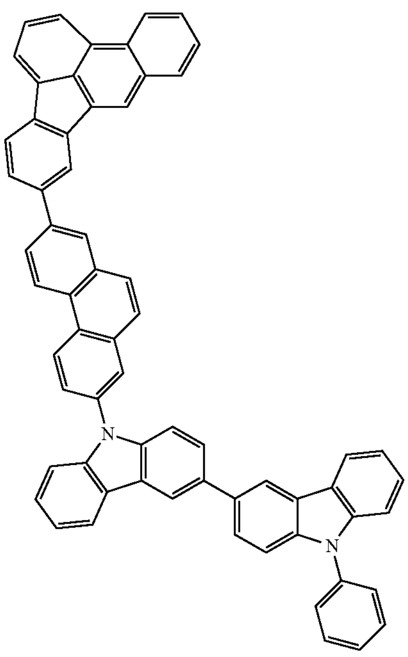

-continued
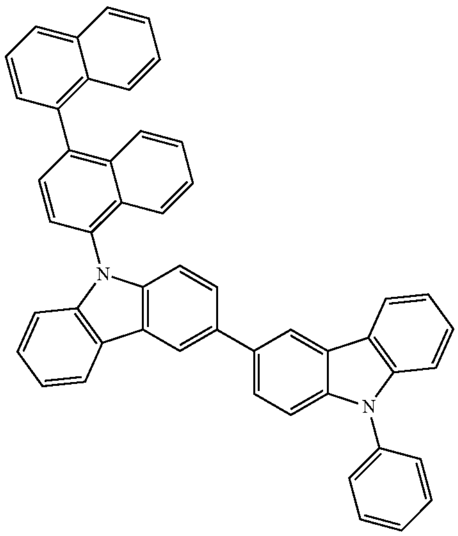
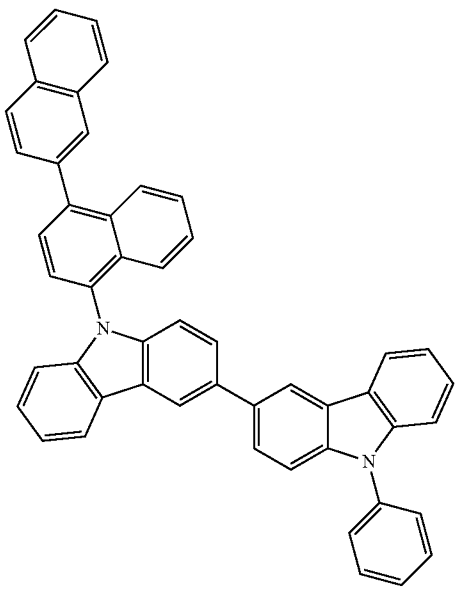
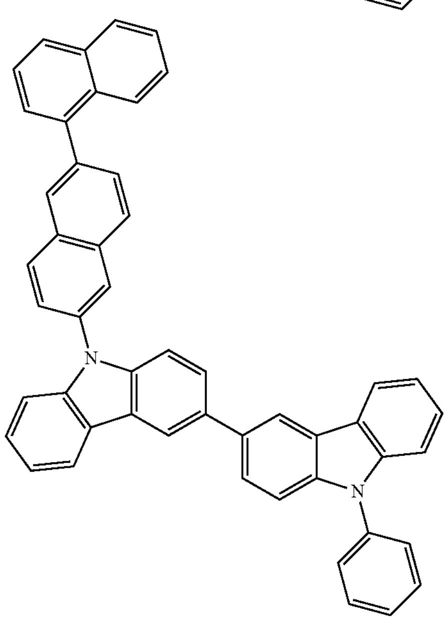
-continued
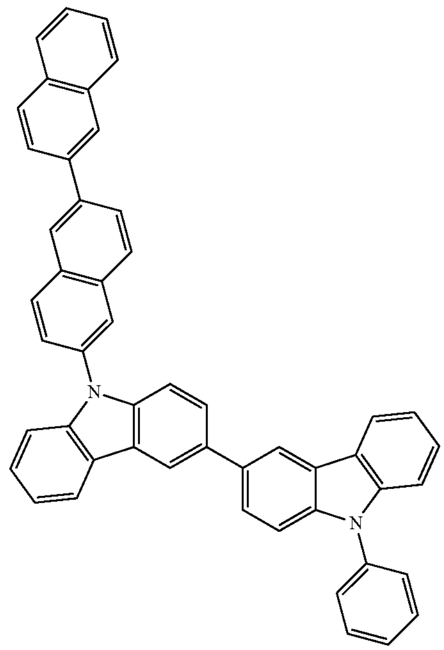
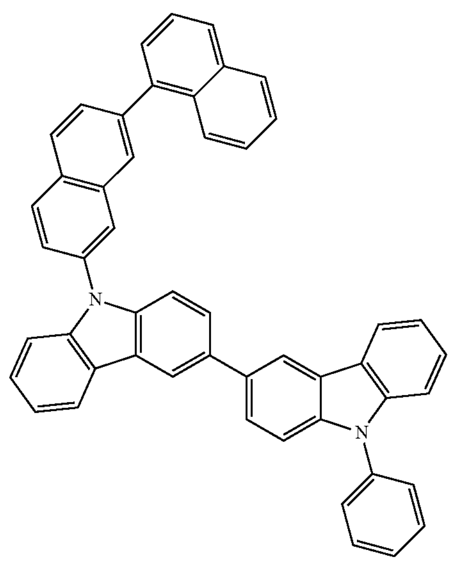

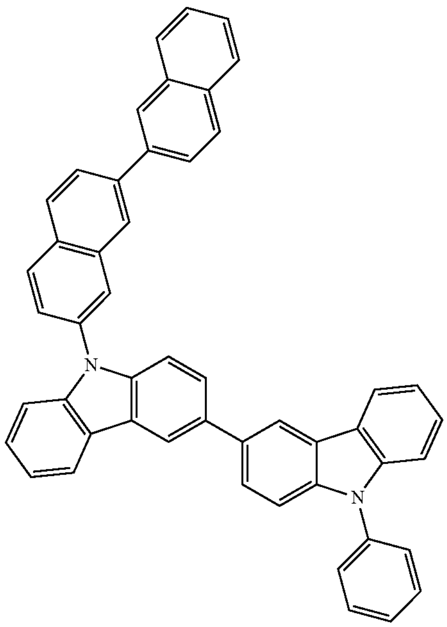
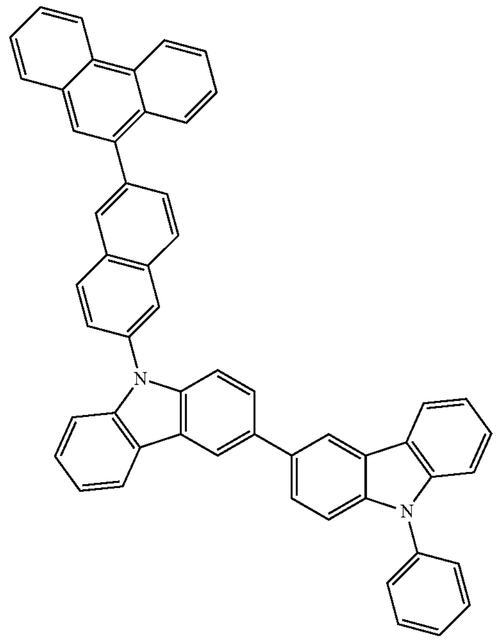
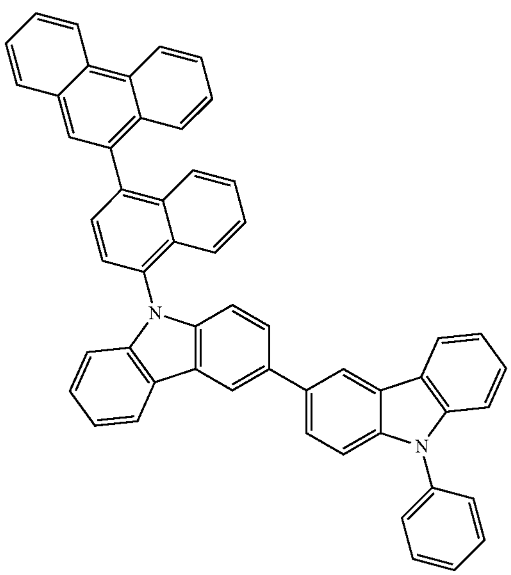
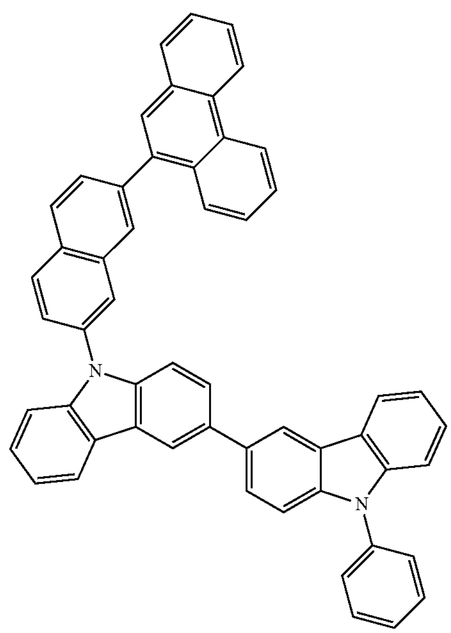
N
N

-continued
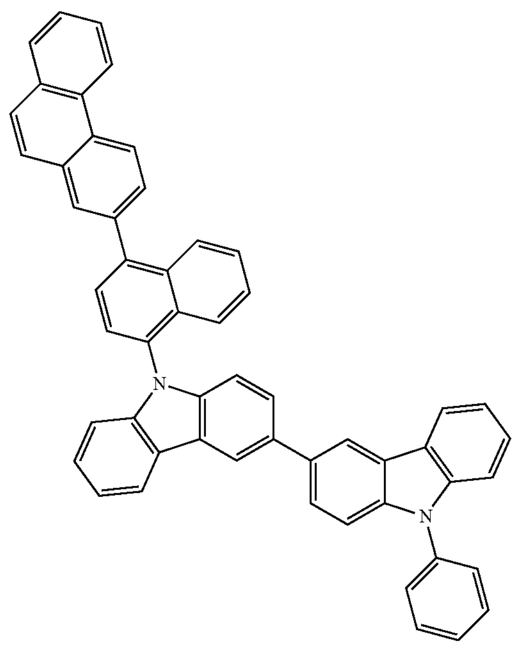
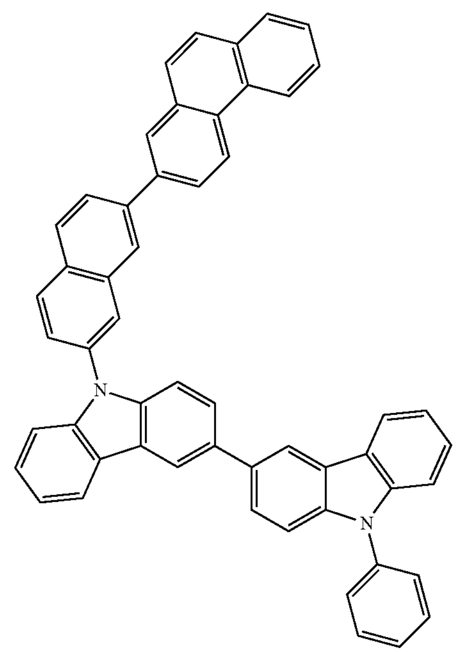
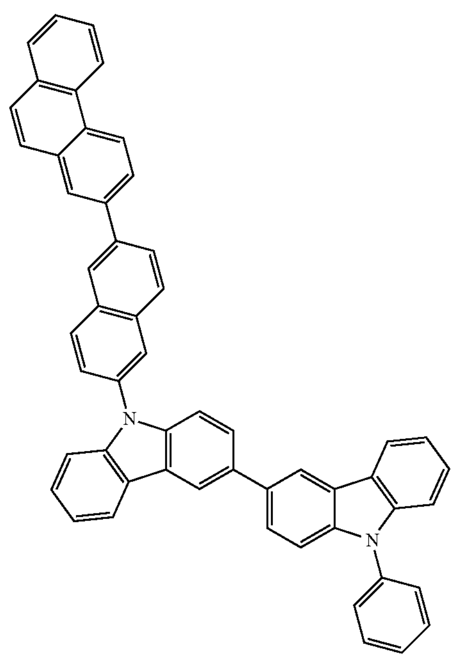
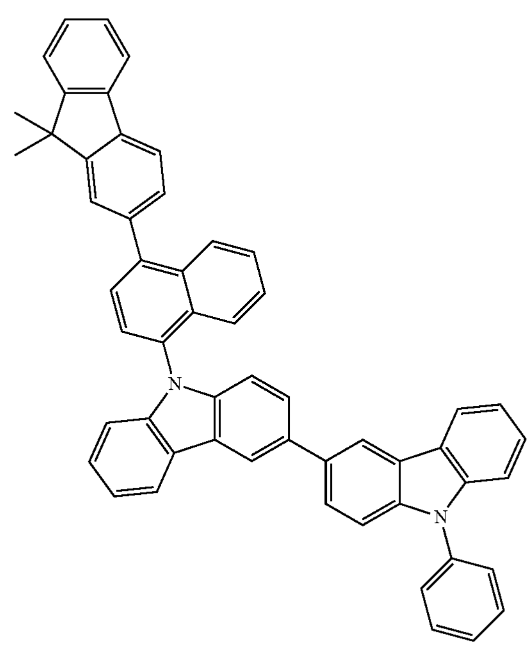

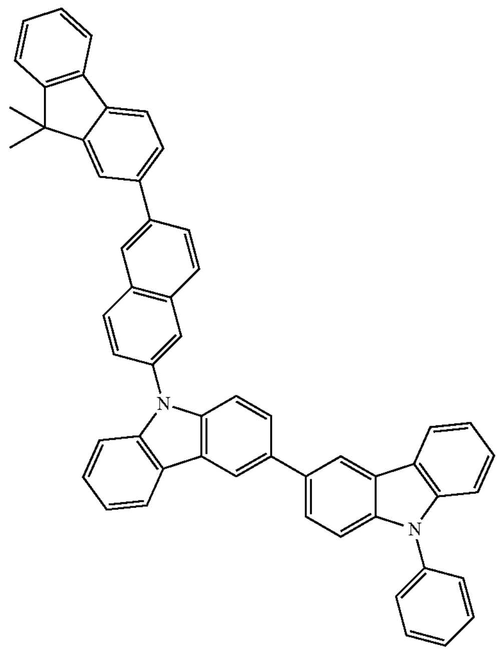
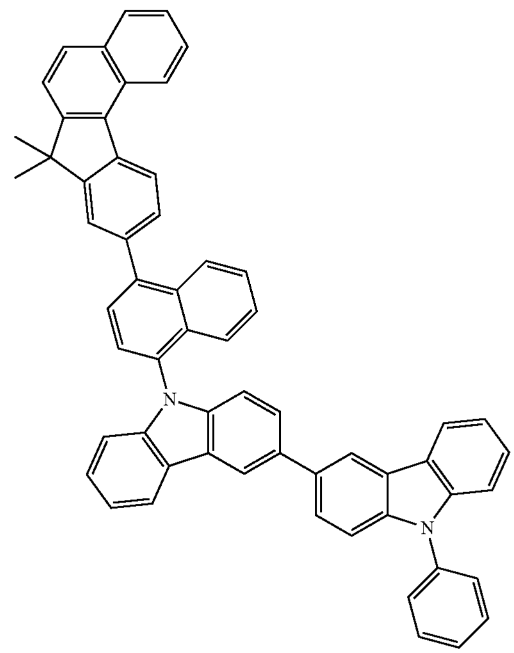
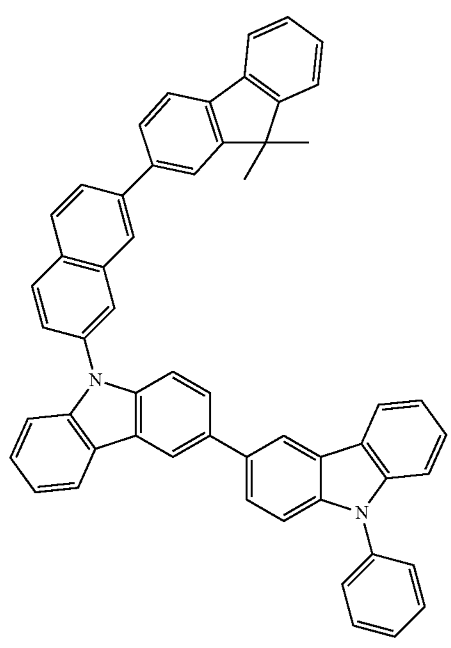
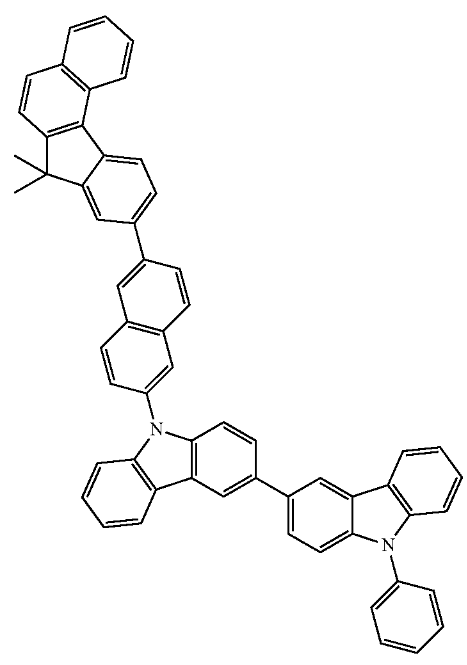

-continued
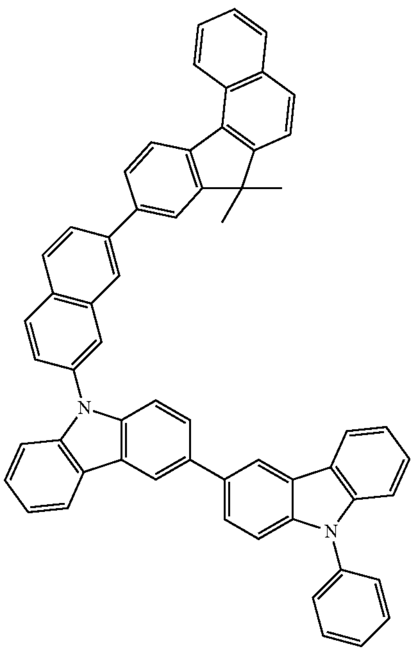
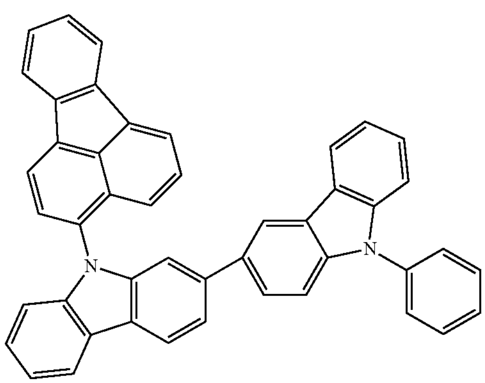
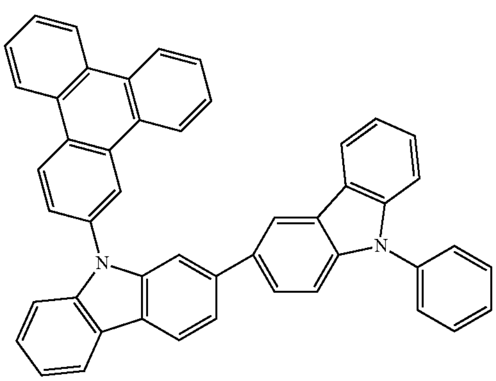
-continued
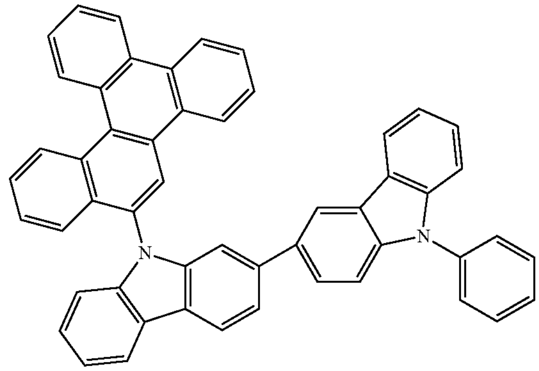
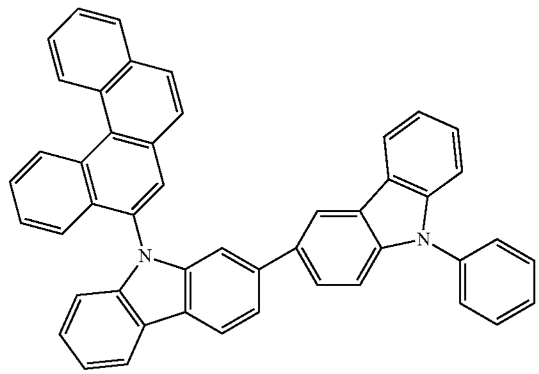
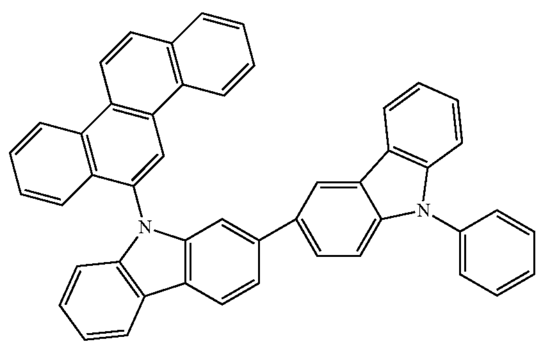
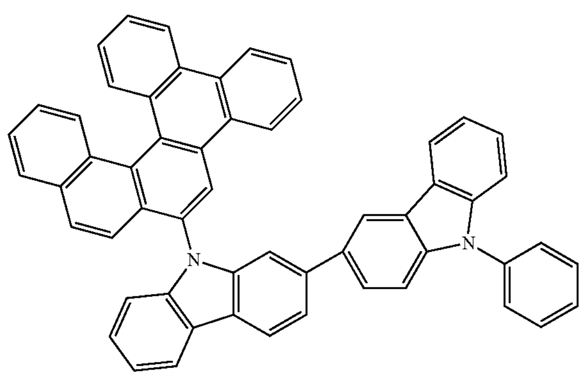

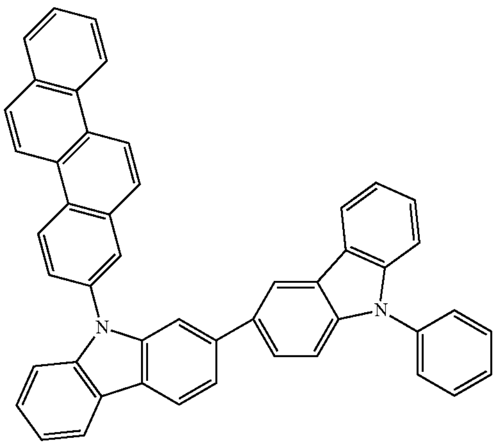
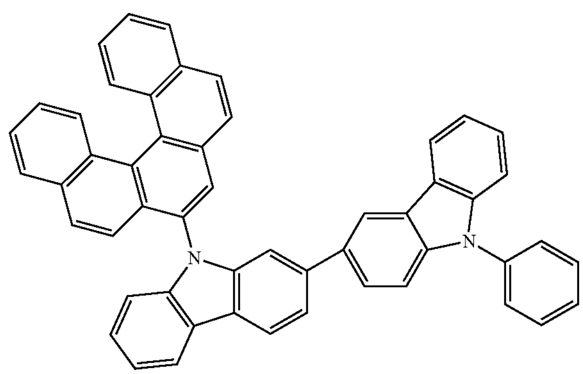
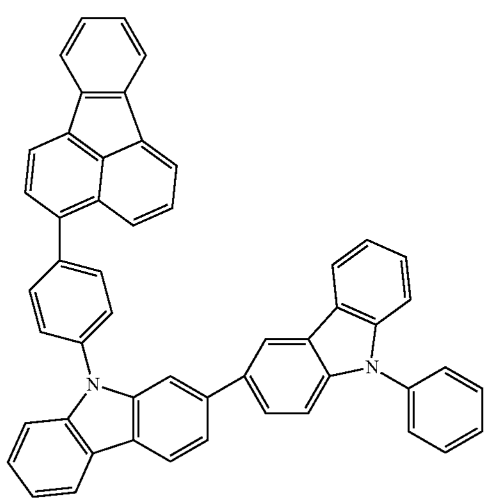
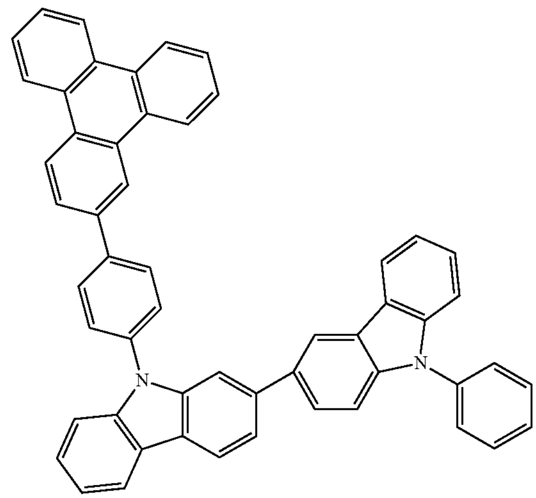
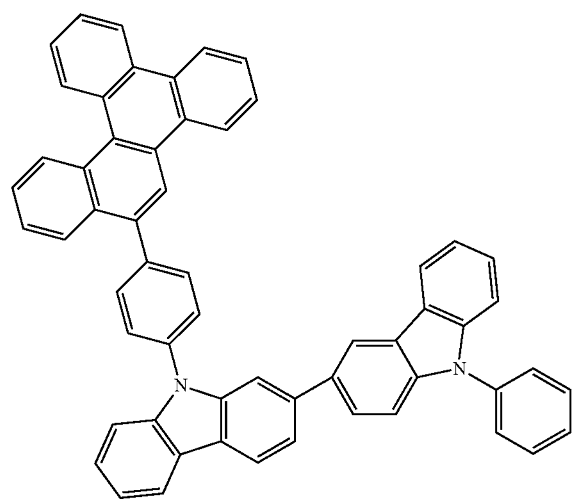
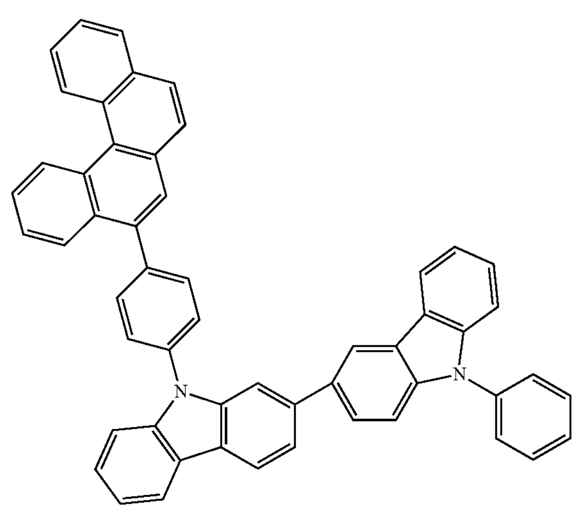

-continued
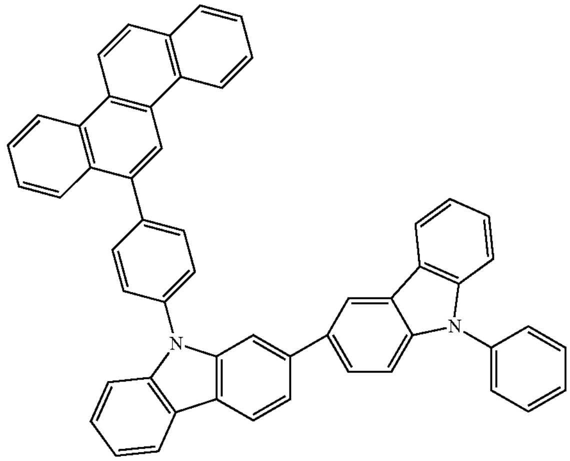
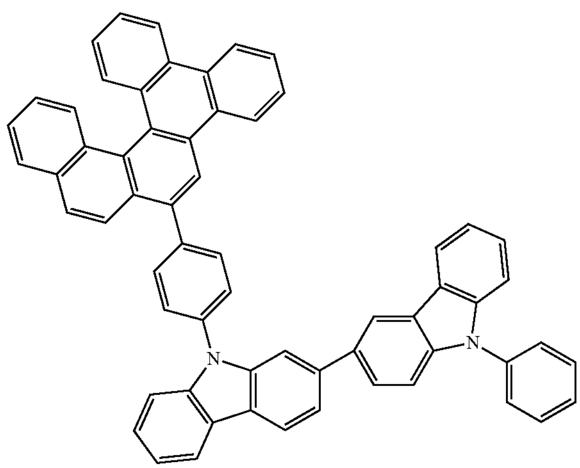
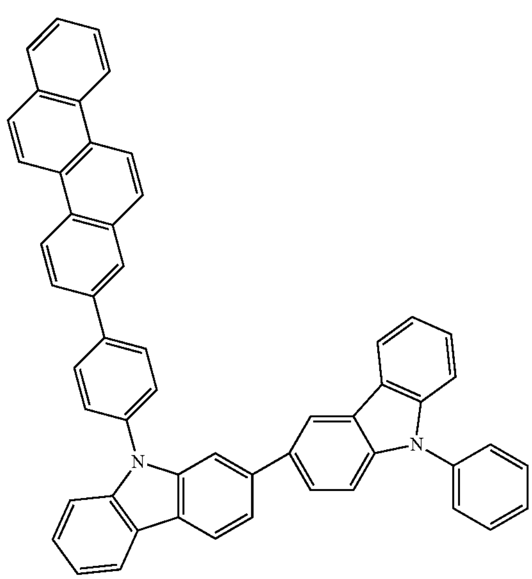
-continued
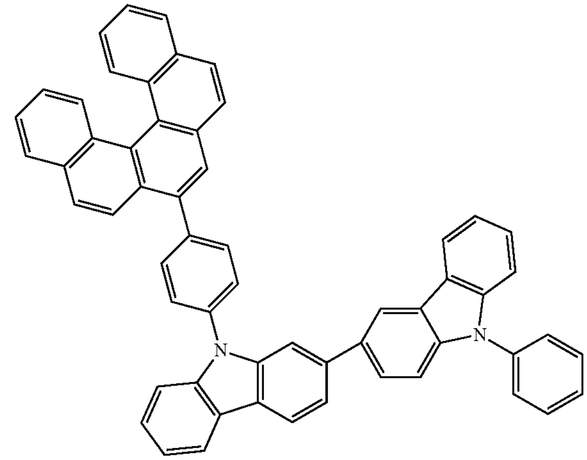
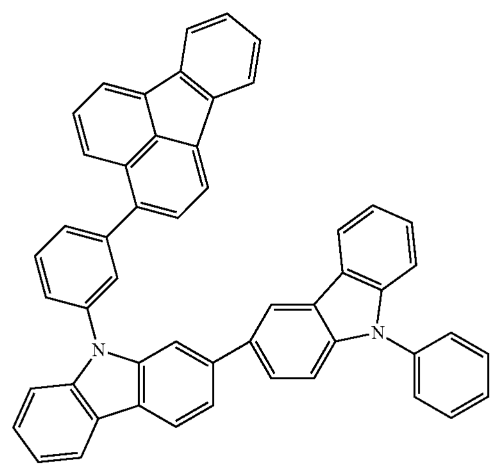
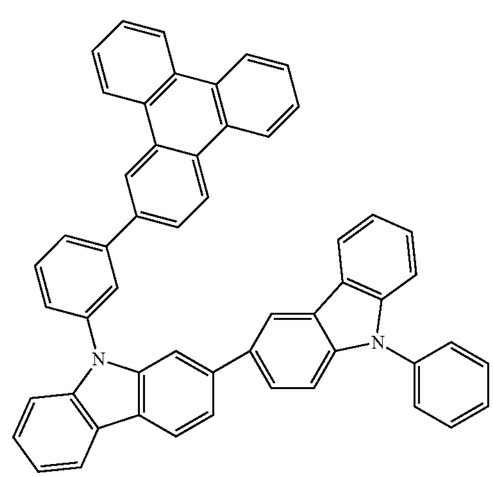

-continued
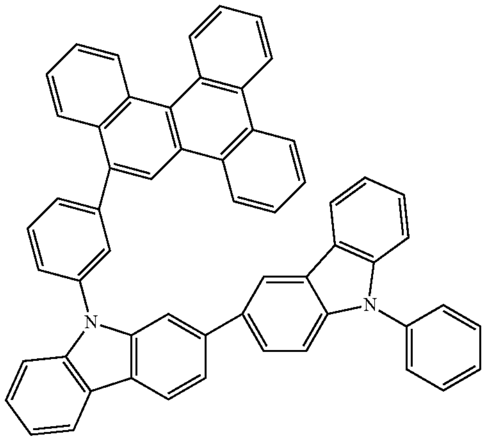
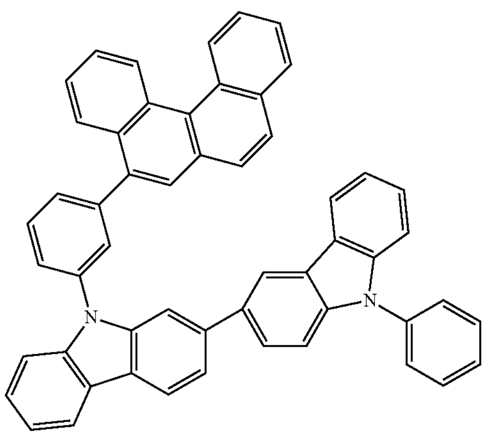
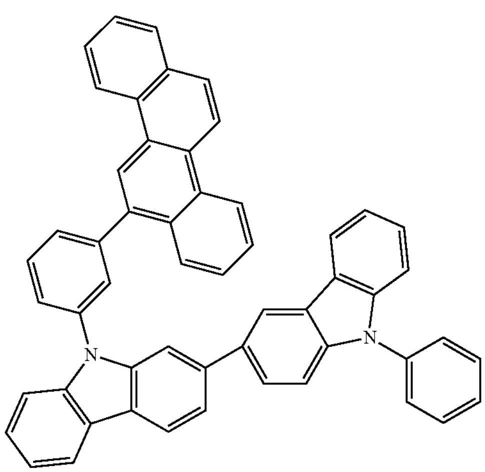
-continued
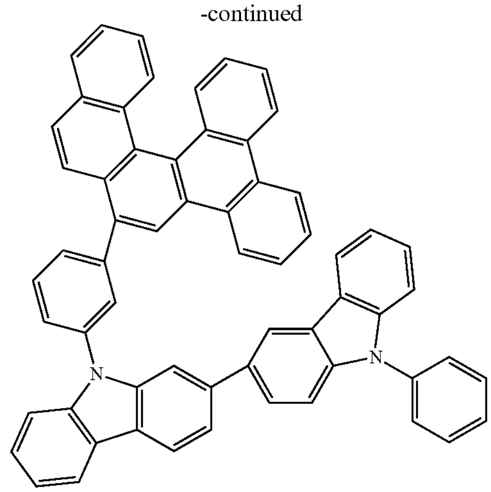
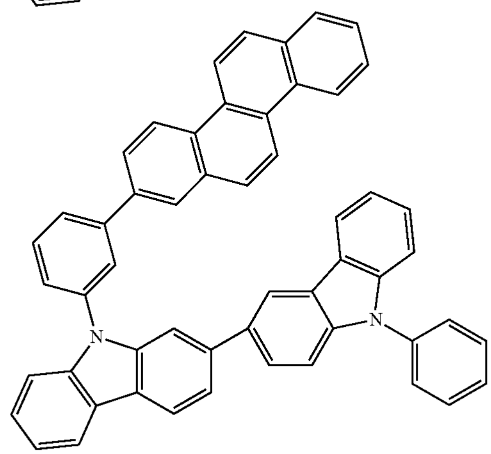
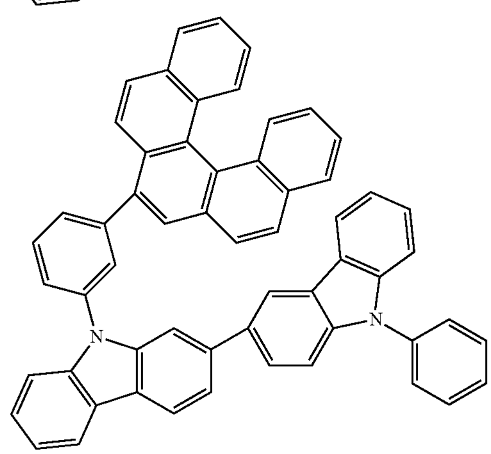
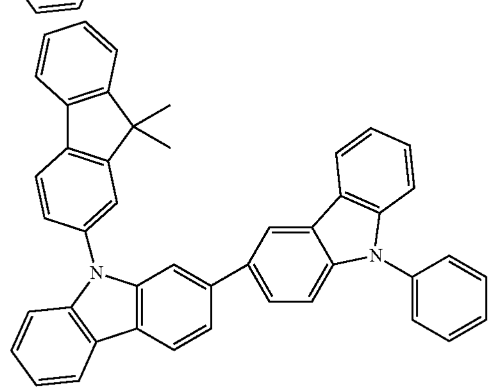

-continued
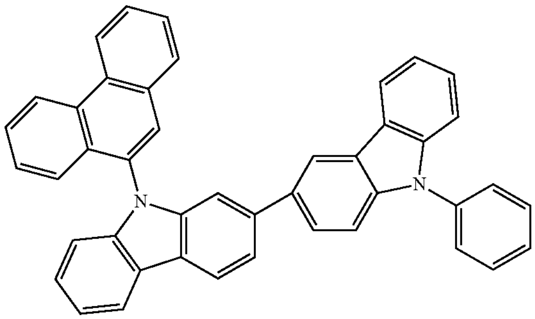
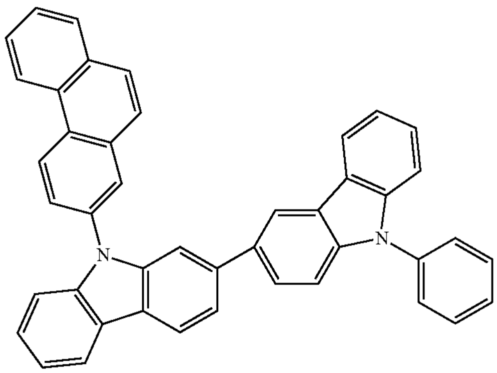
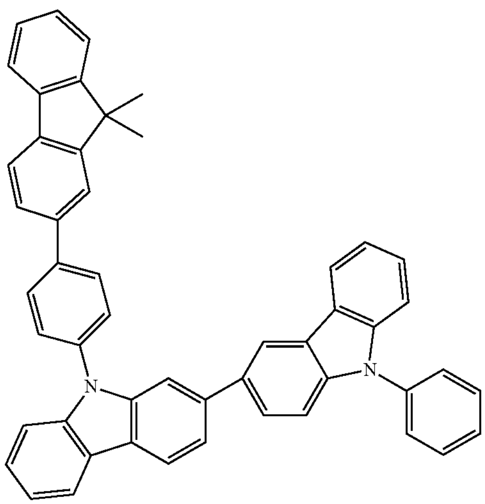
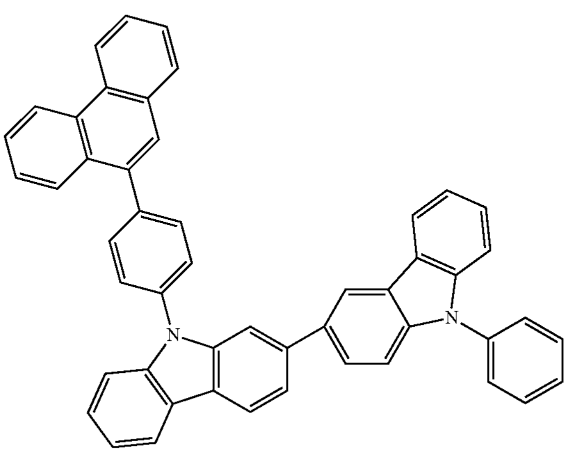
-continued
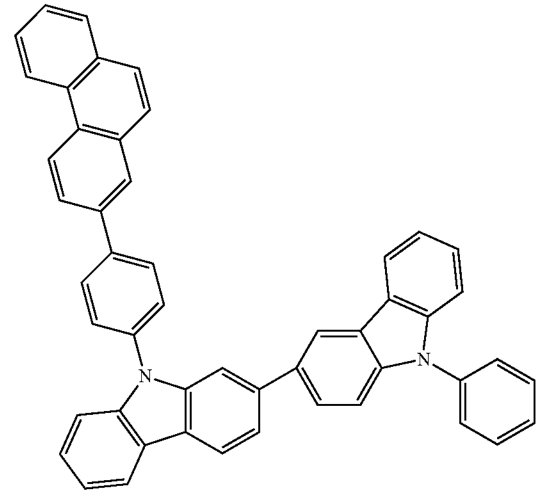
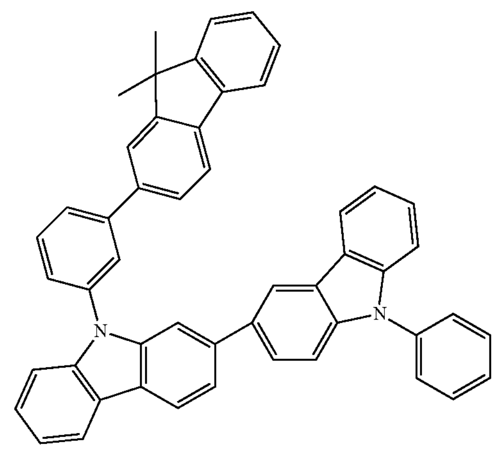
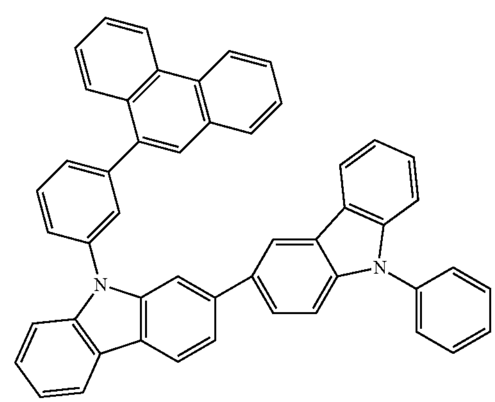

-continued
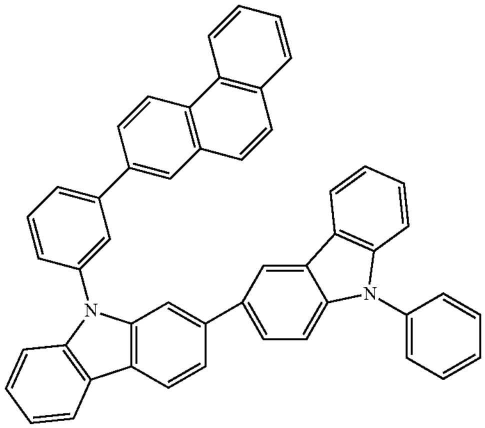
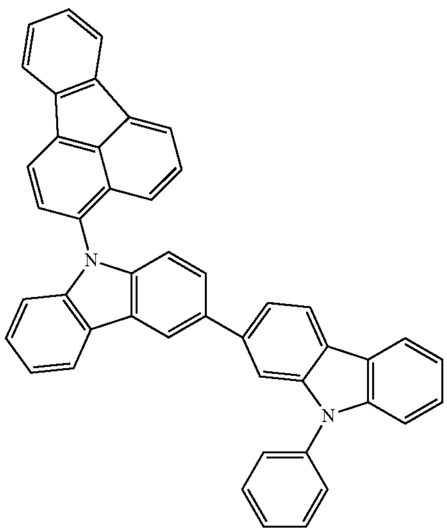
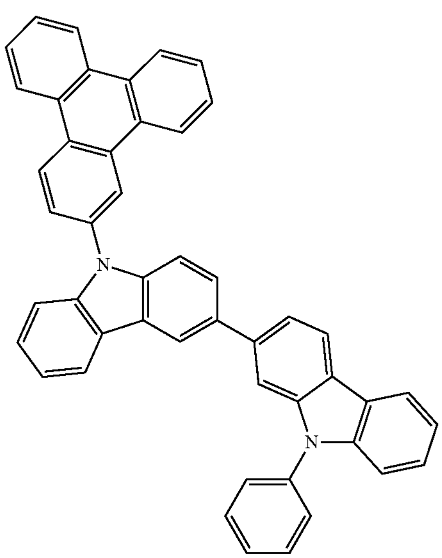
-continued
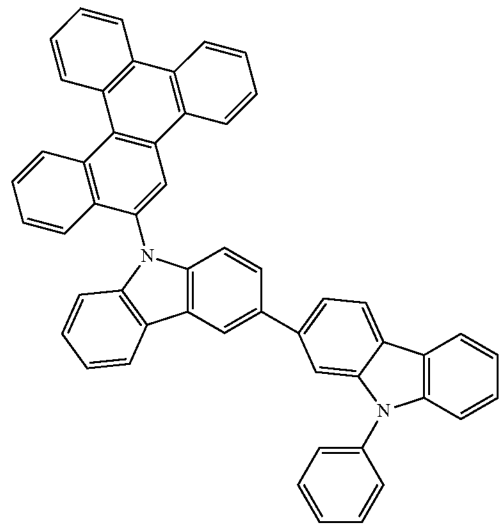
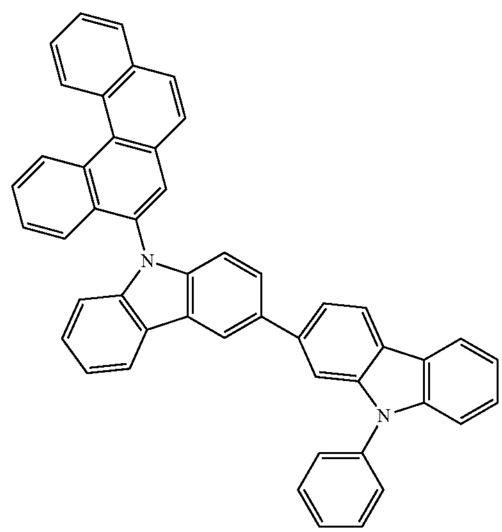
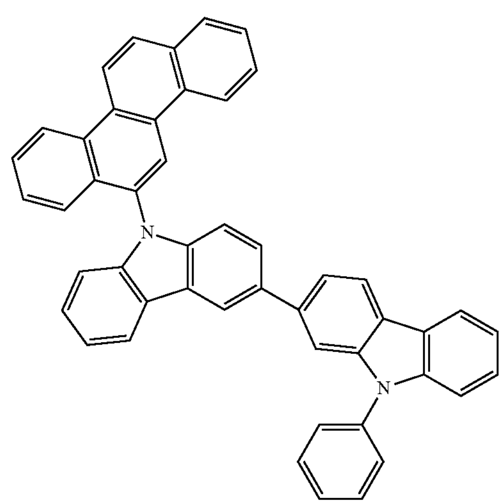

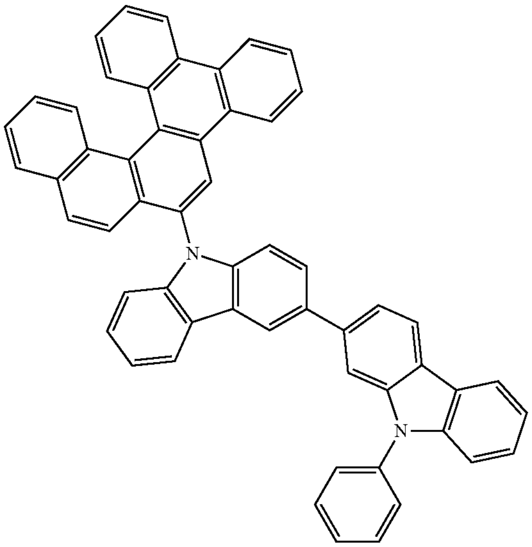
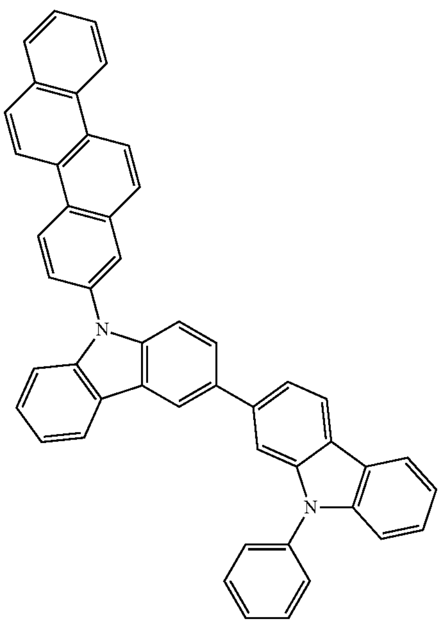
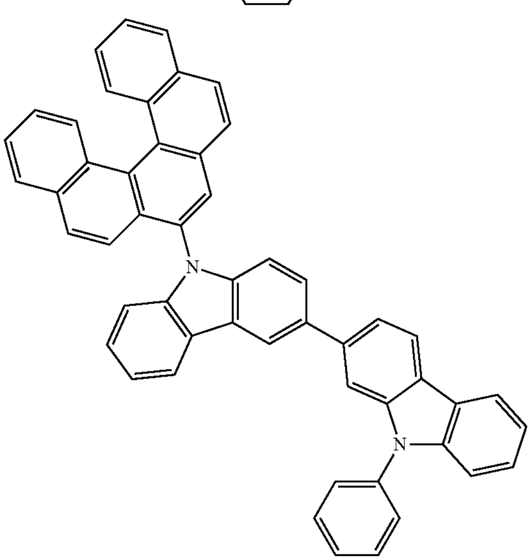
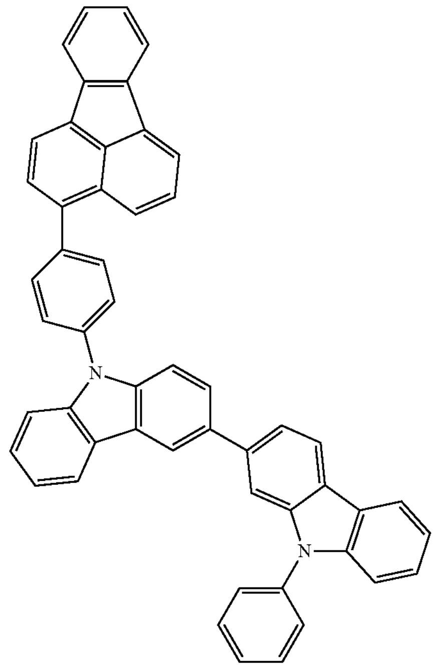
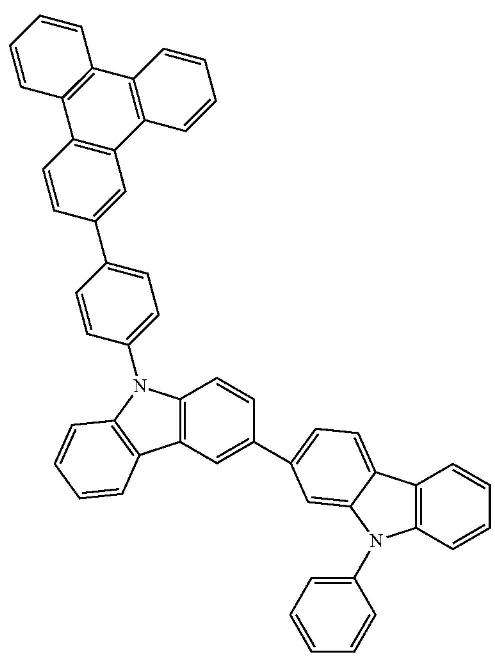

-continued
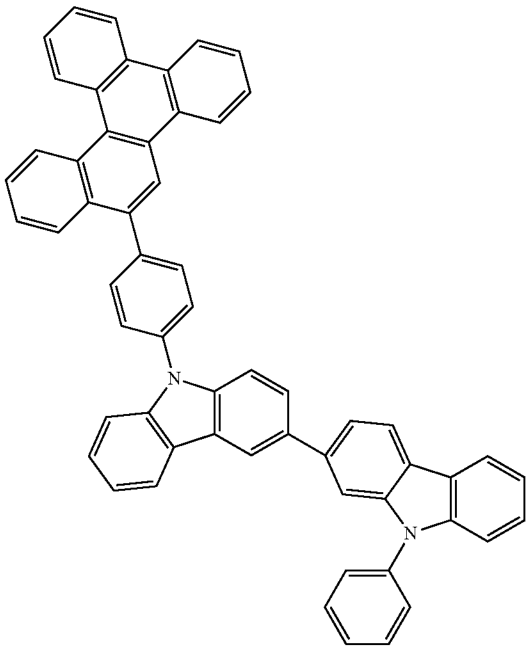
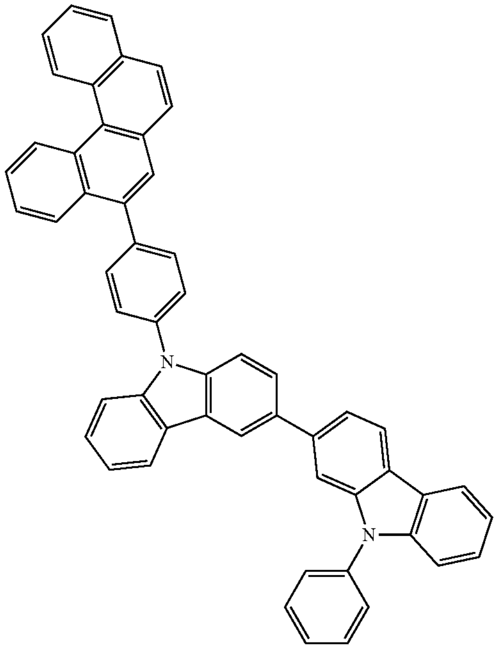
-continued
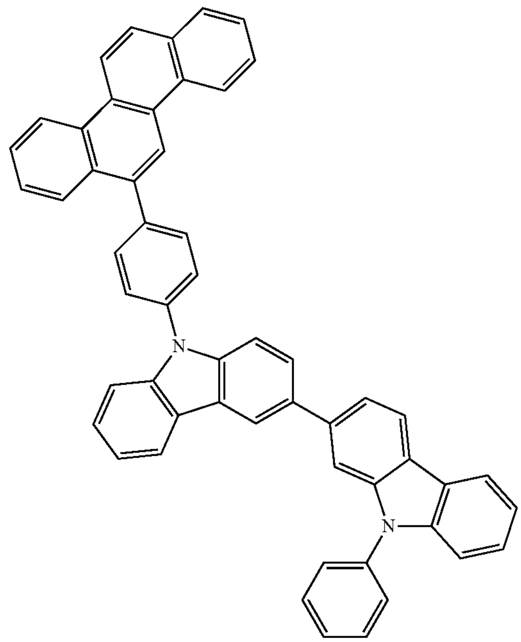
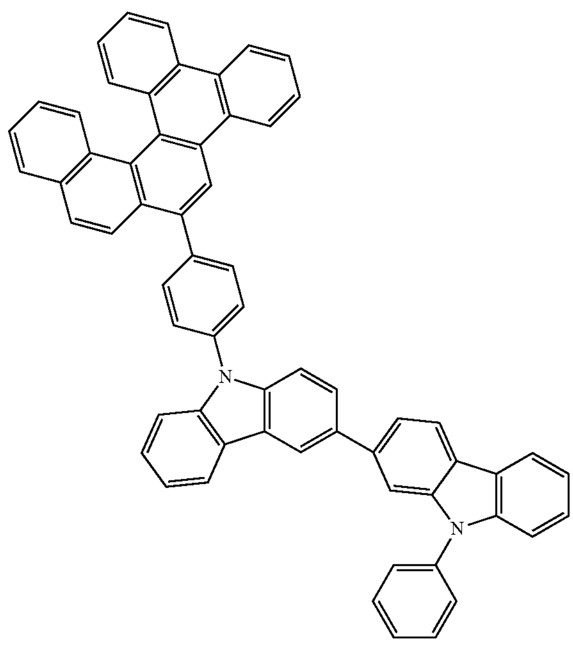

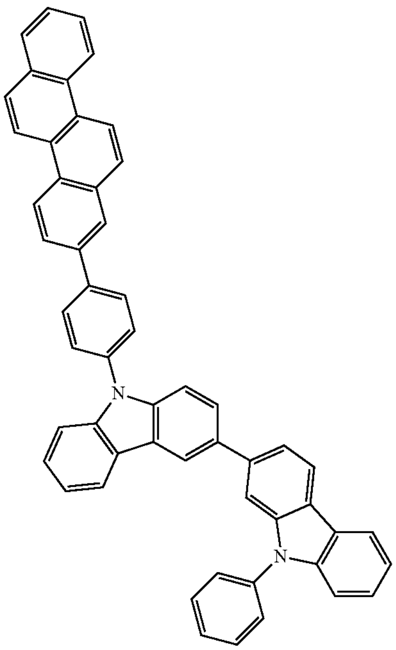
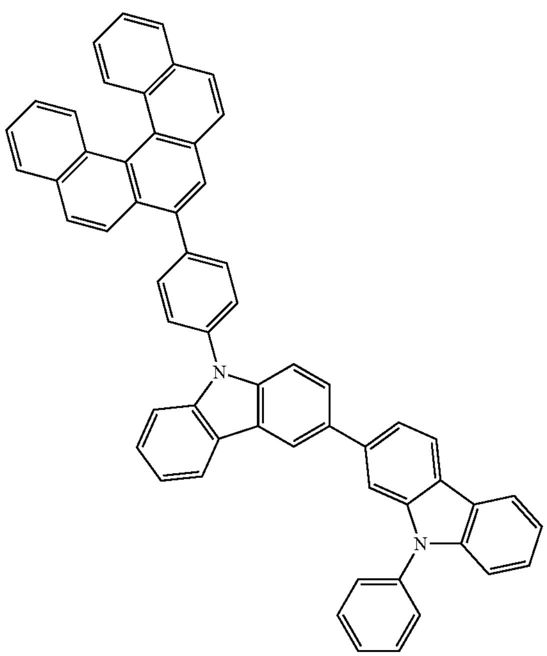
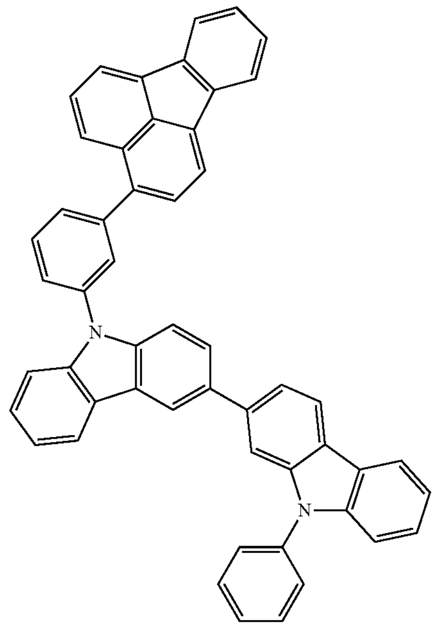
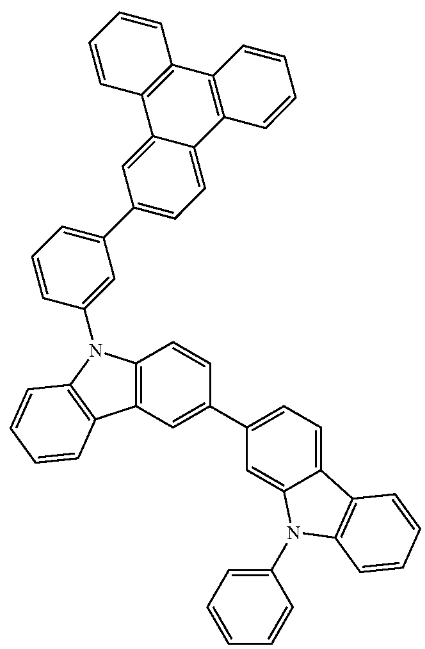 [SMILES: c1ccc(-n2c3ccccc3c3ccc(-c4ccc5c(c4)c4ccccc4n5-c4cccc(-c5ccc6c7ccccc7c7ccccc7c6c5)c4)cc32)cc1]
N
N

-continued
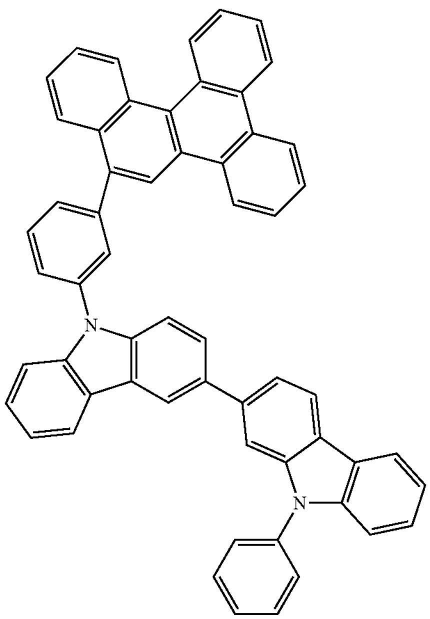
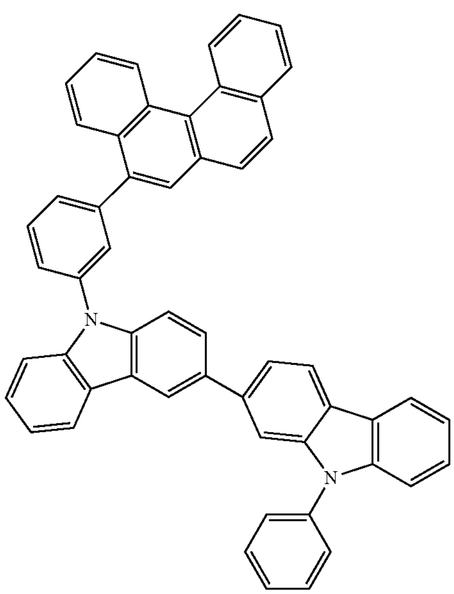
-continued
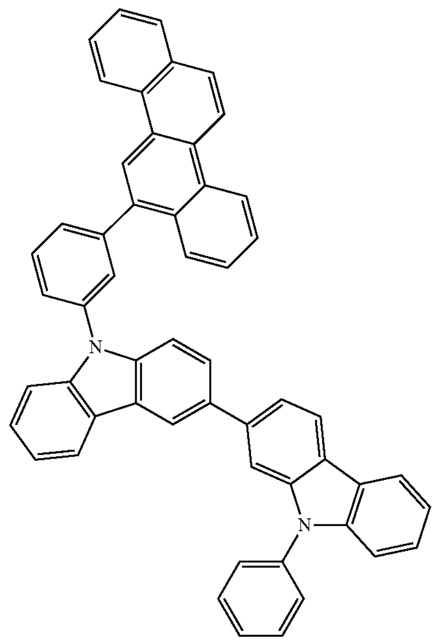
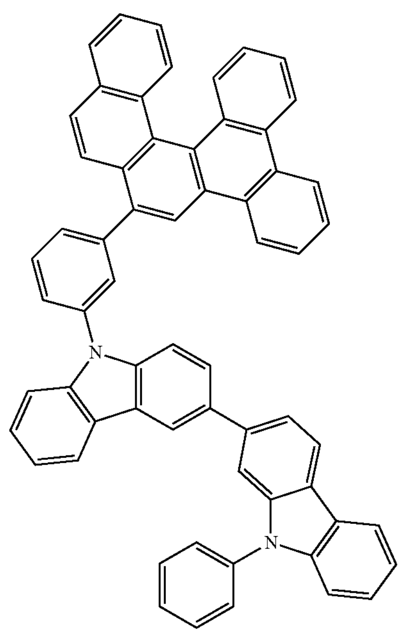

-continued
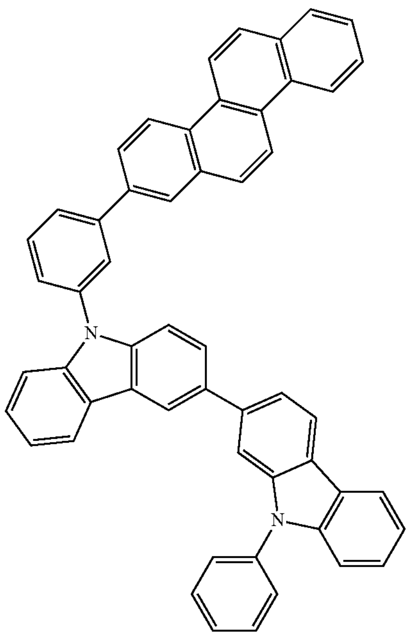
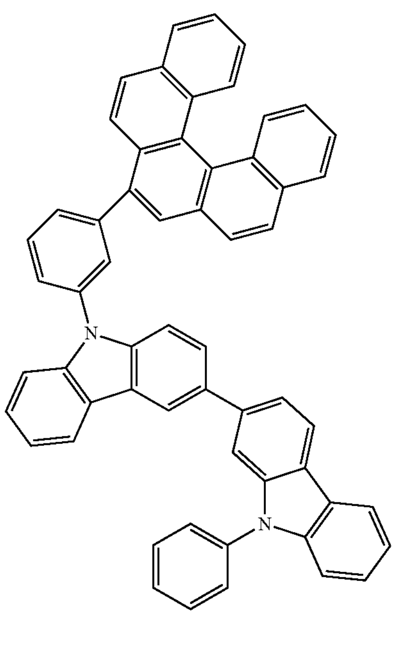
-continued
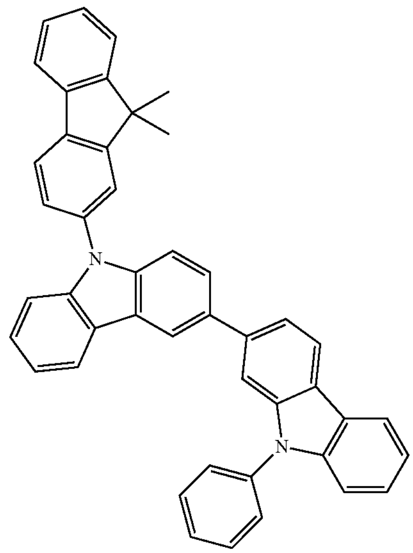
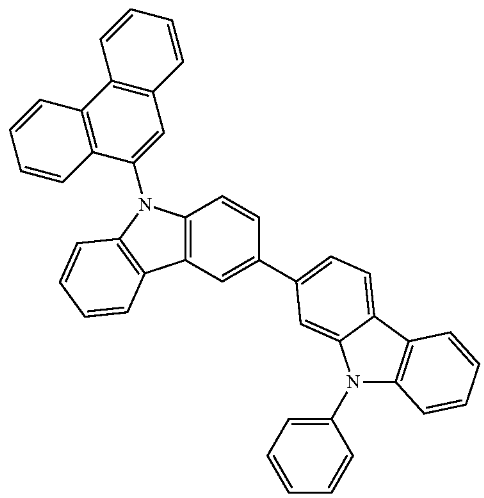
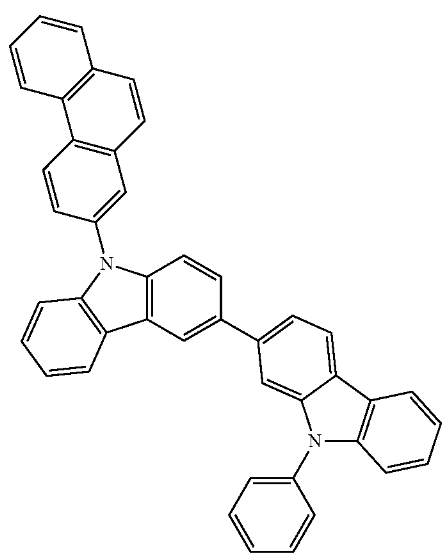

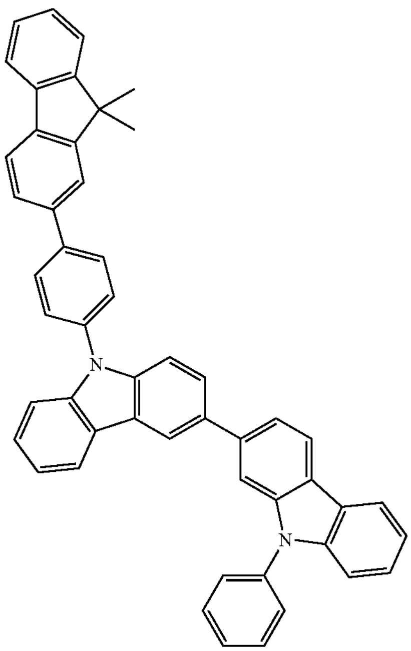
N
N
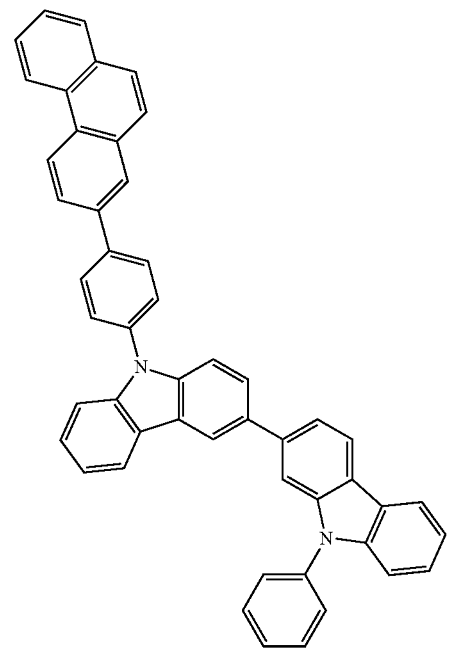
N
N
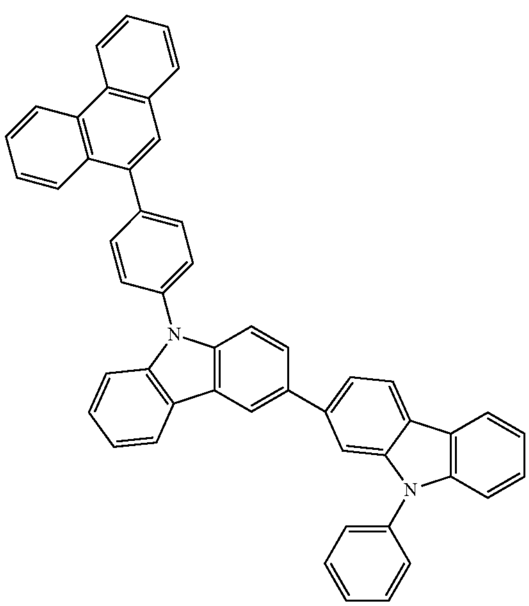
N
N
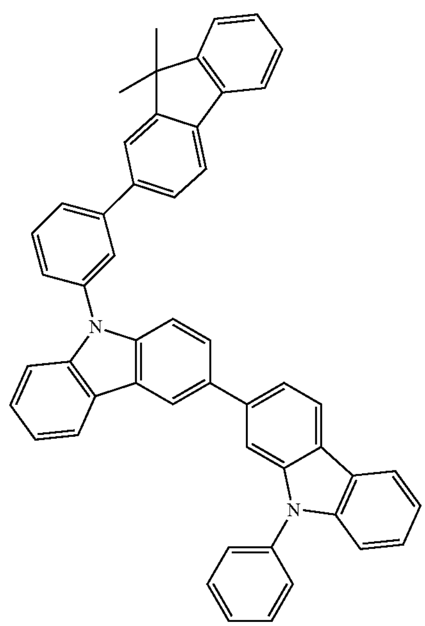
N
N

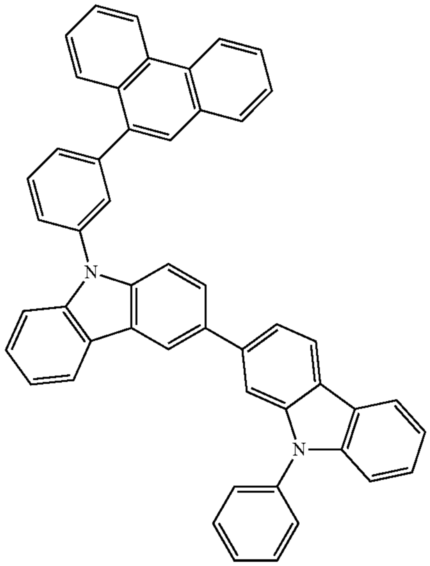
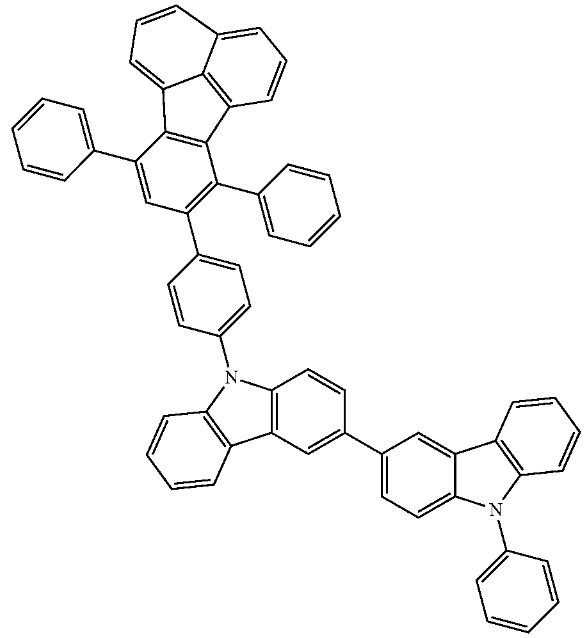
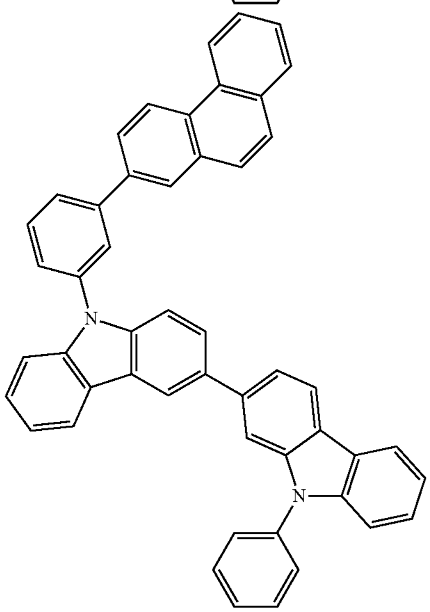
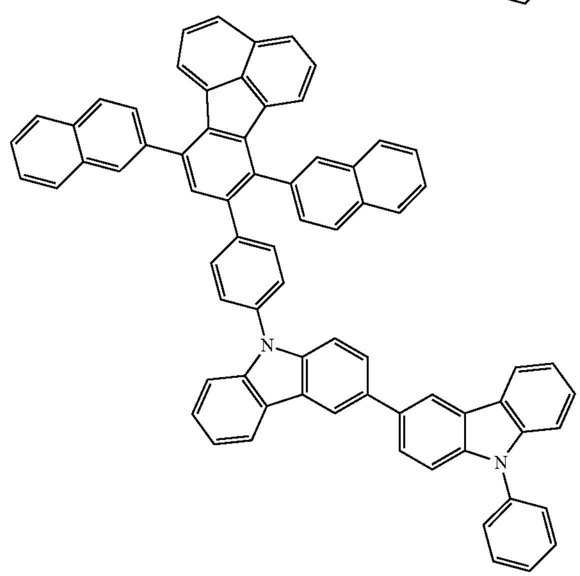
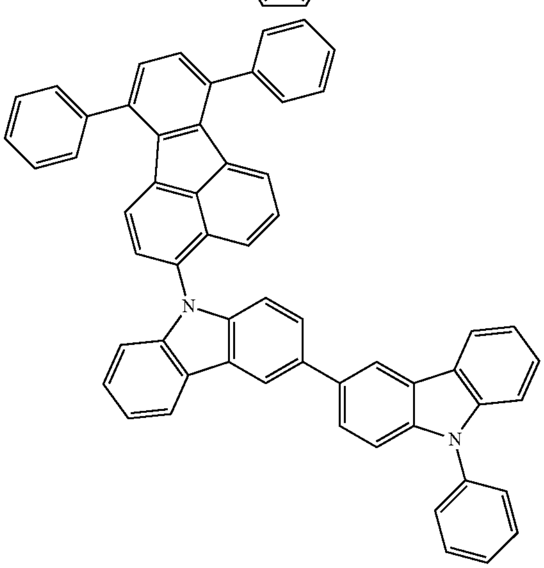
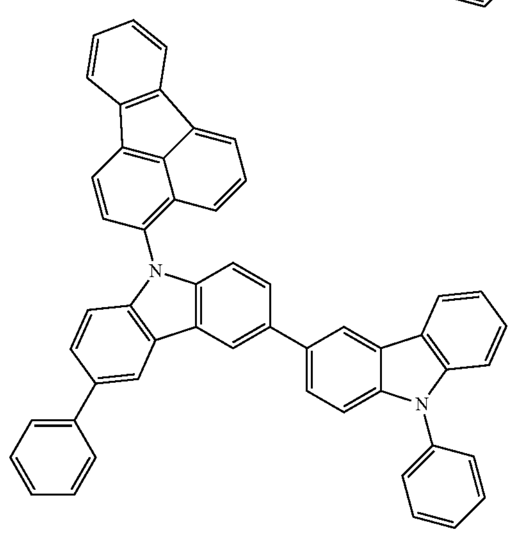
N
N -continued
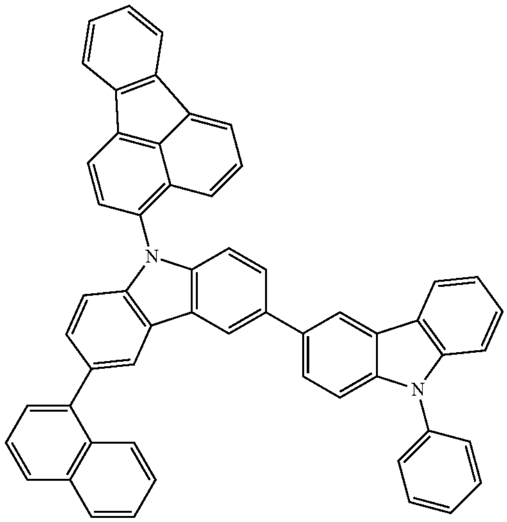
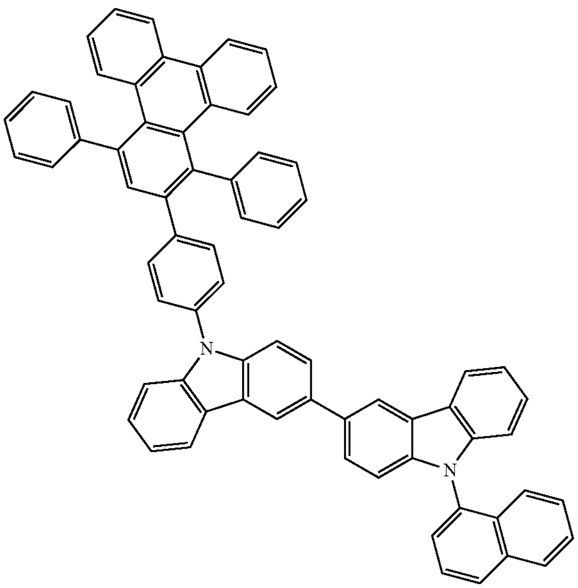
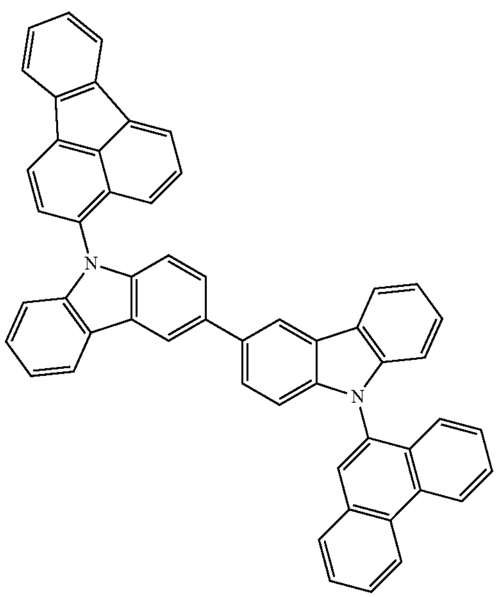
-continued
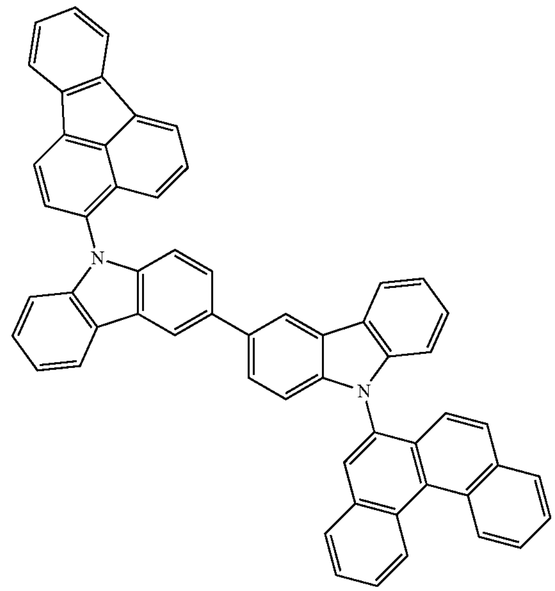
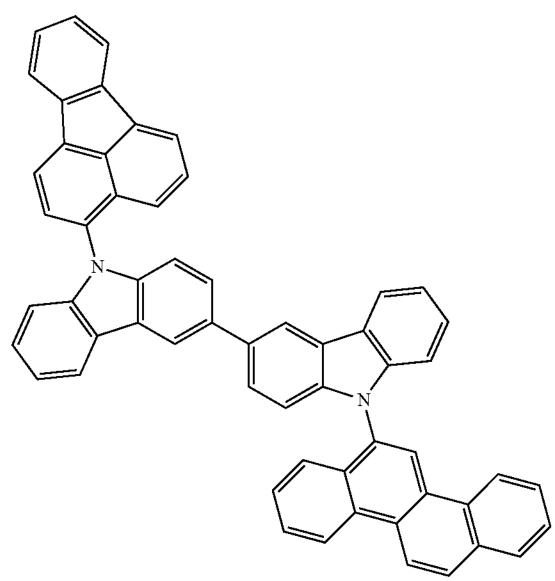

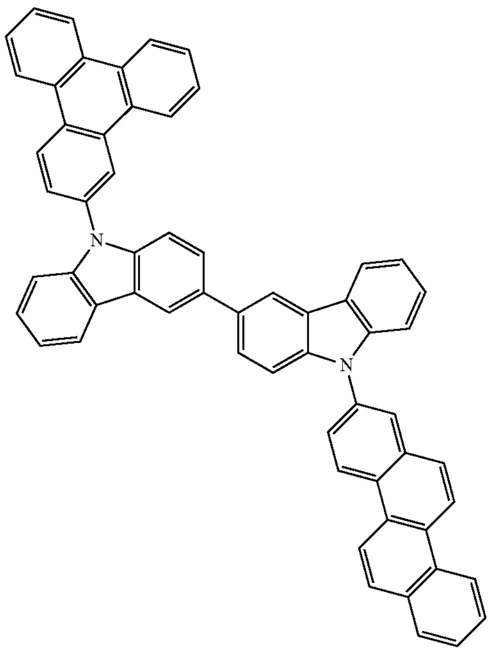
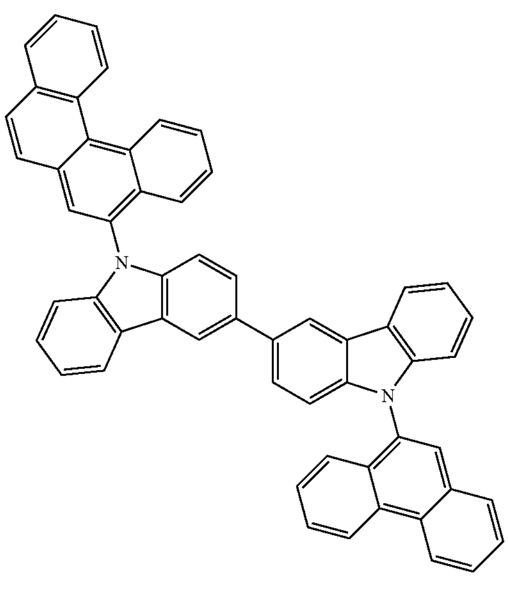
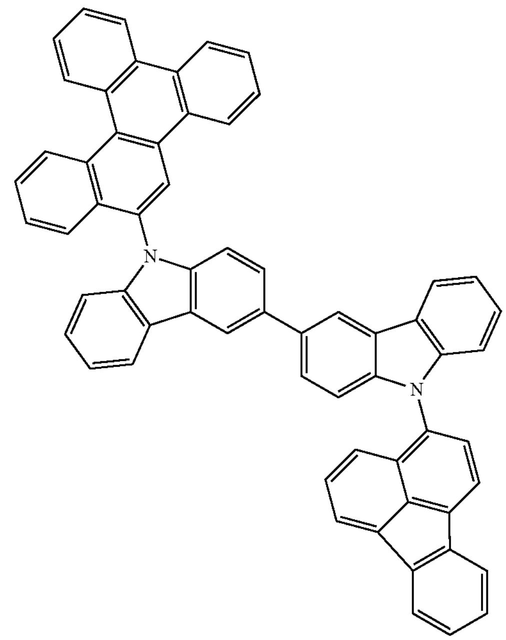
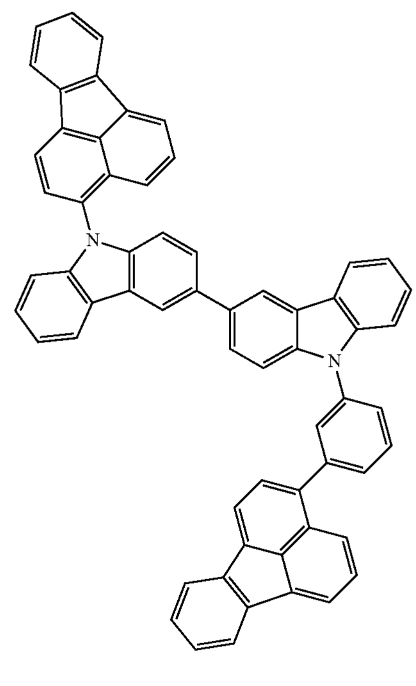

-continued
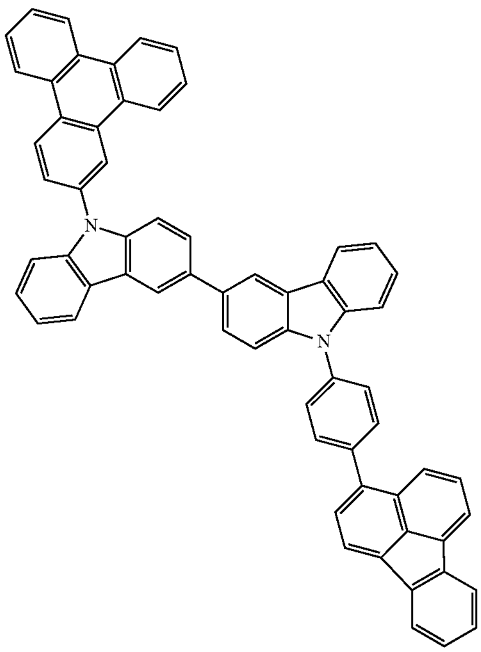
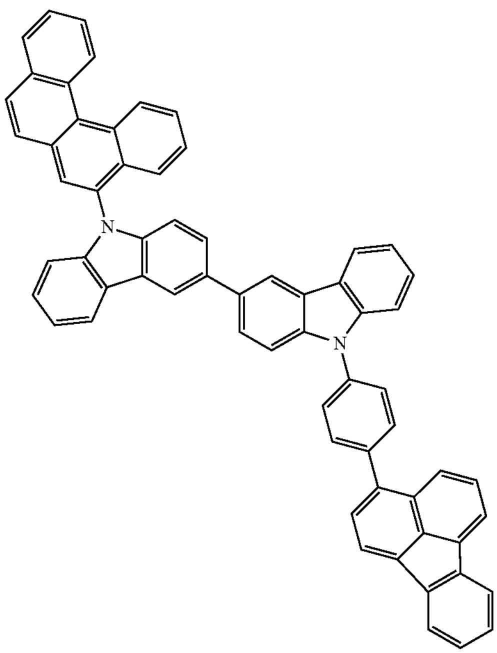
-continued
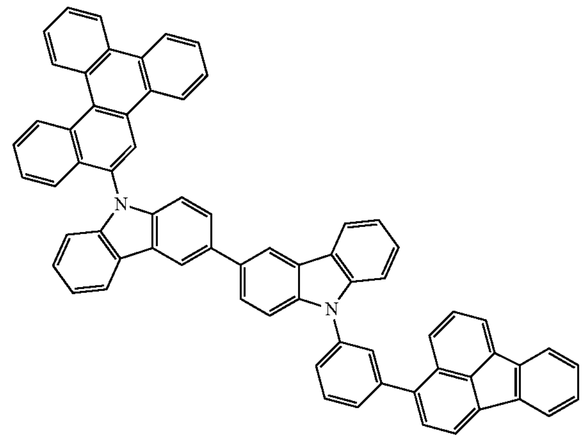
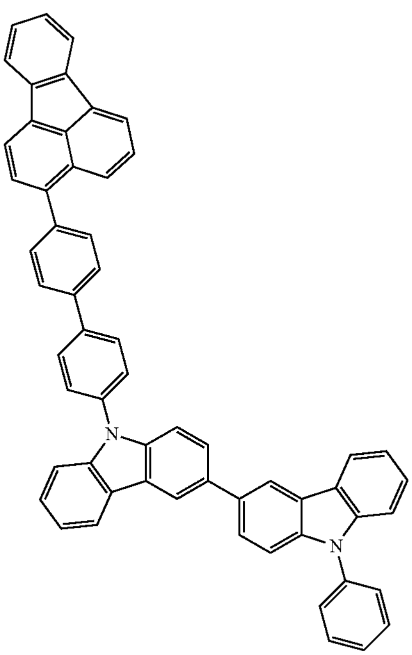

-continued
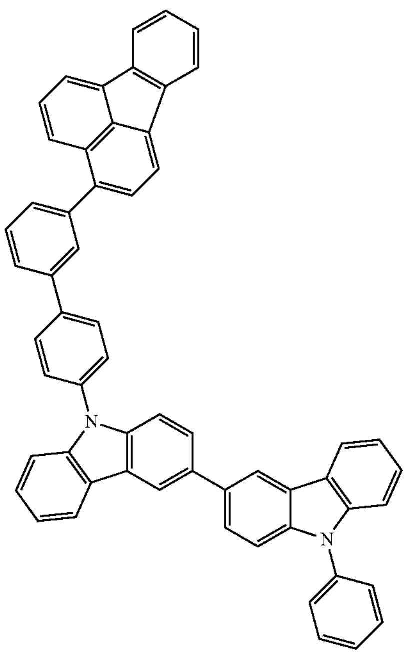
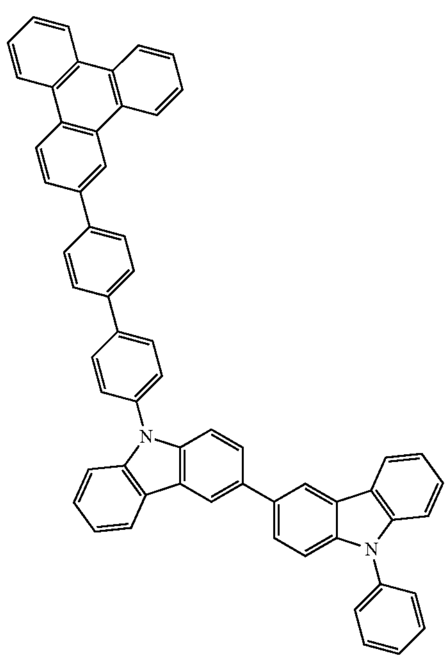
-continued
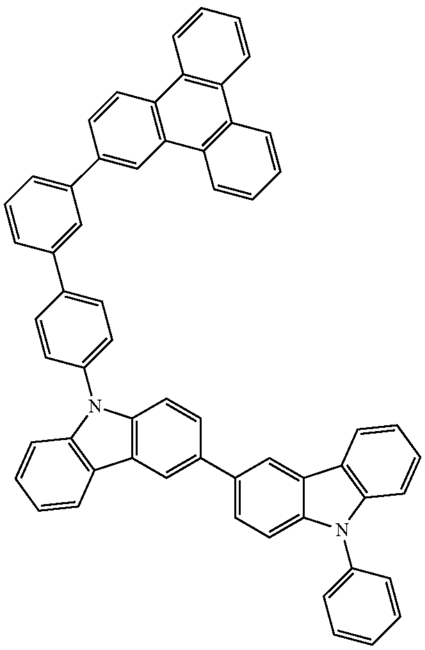
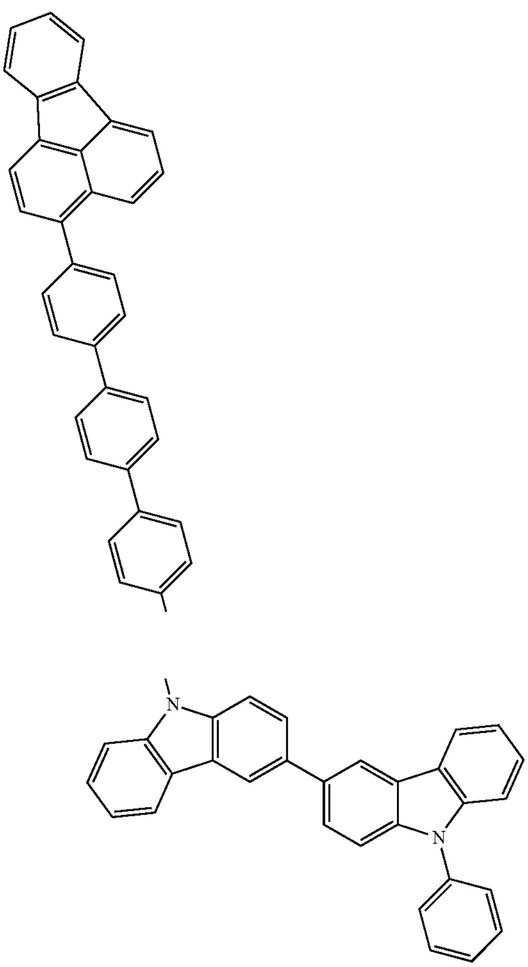

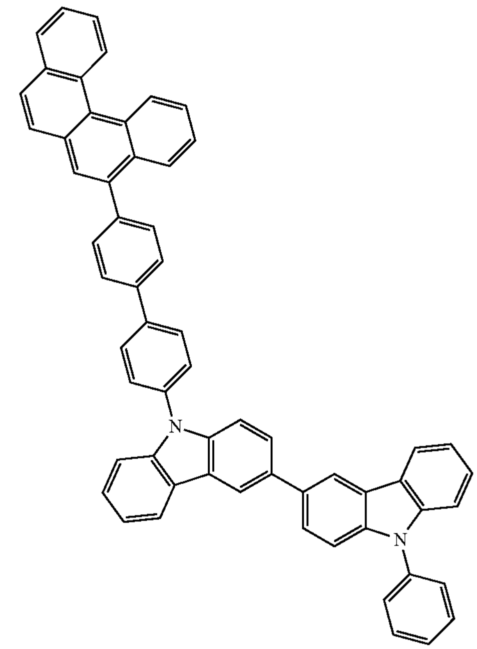
N
N
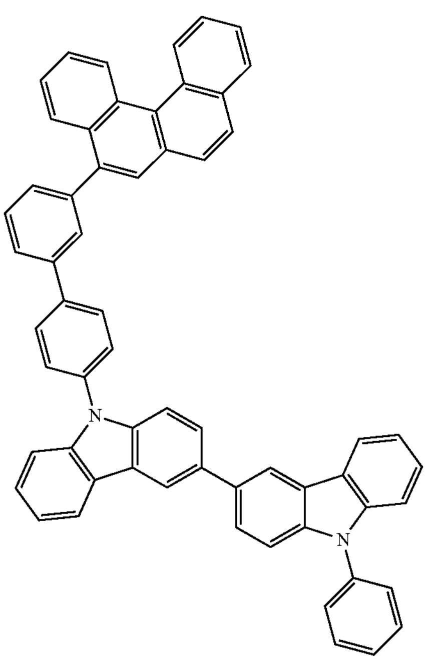
N
N
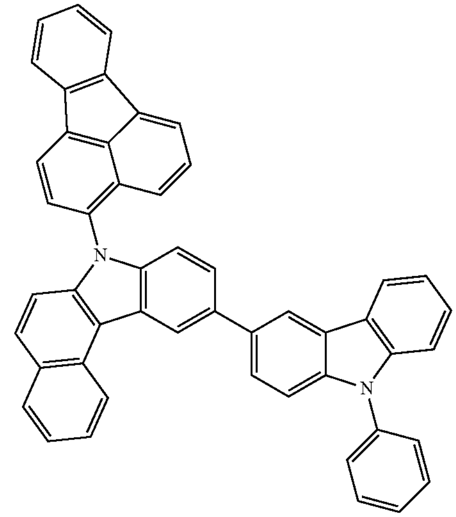
N
N
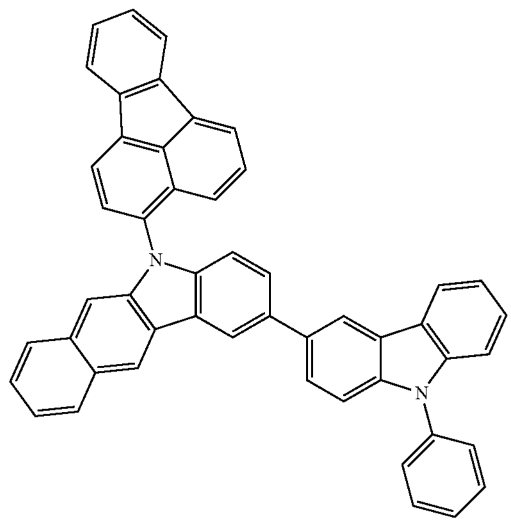
N
N
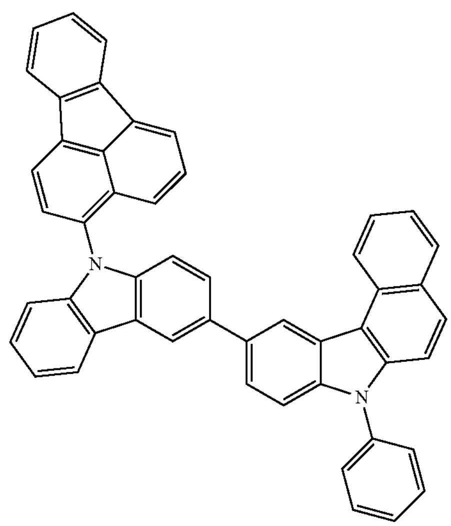
N
N -continued
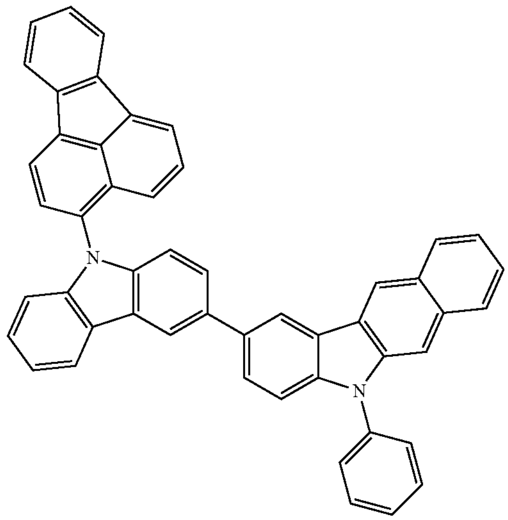
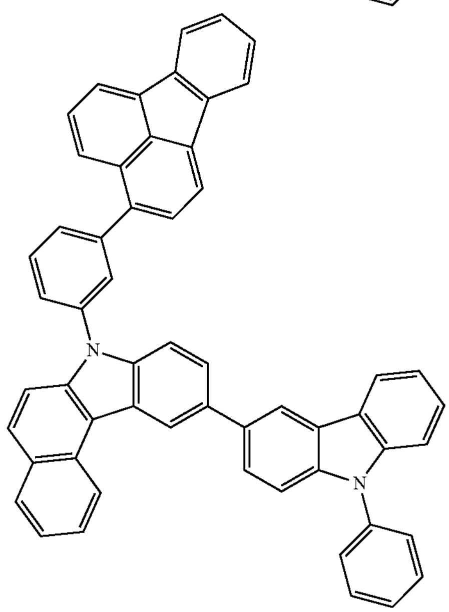
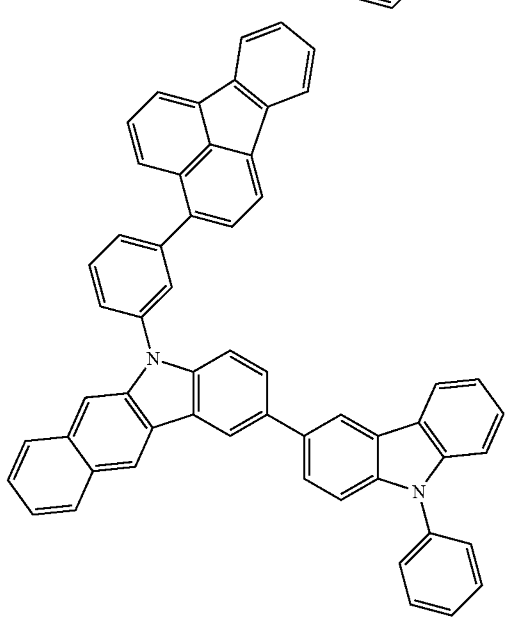
-continued
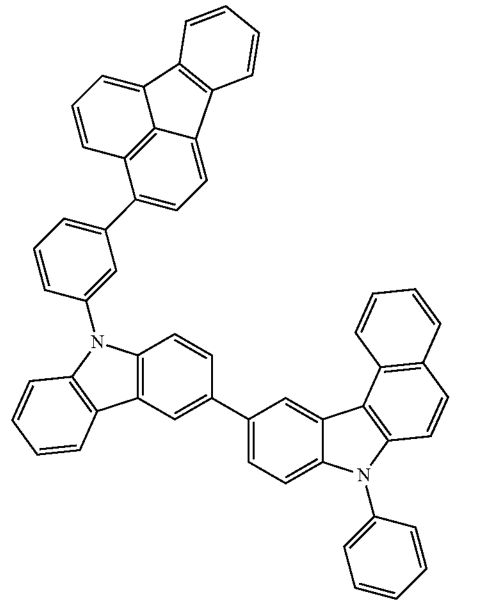
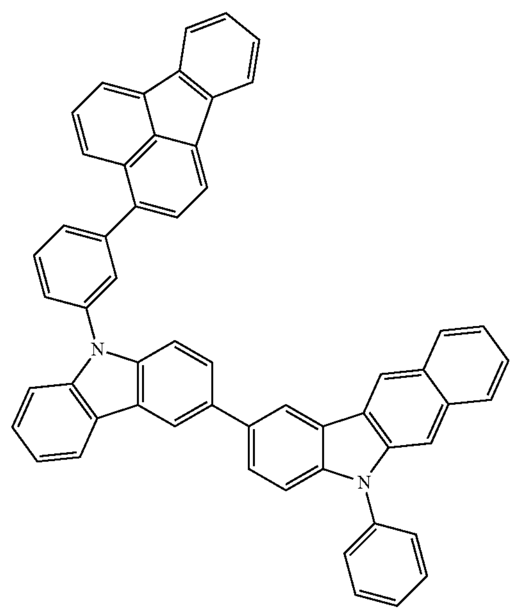
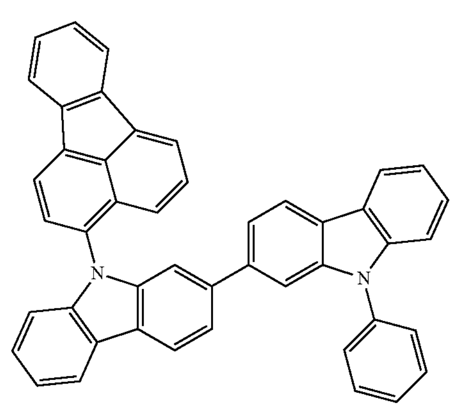

-continued
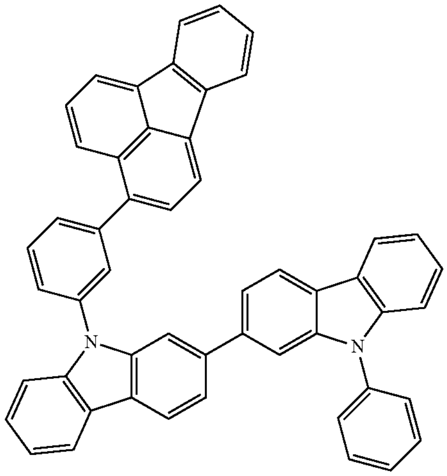
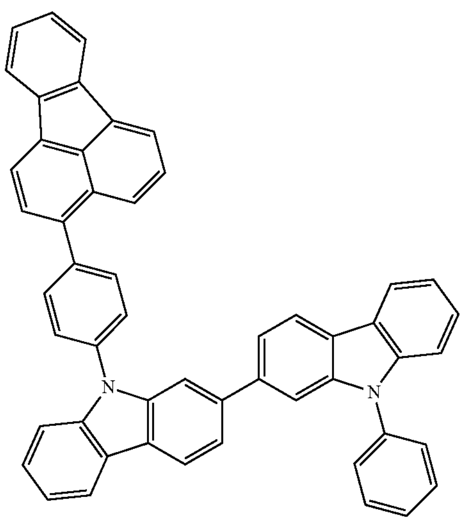
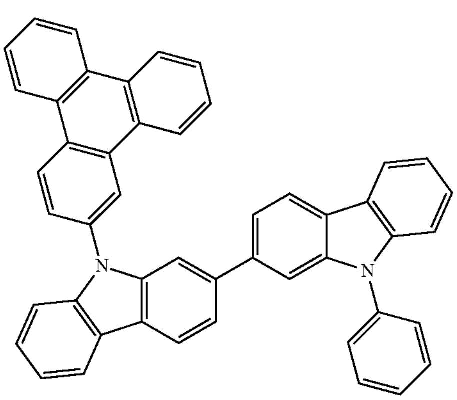
-continued
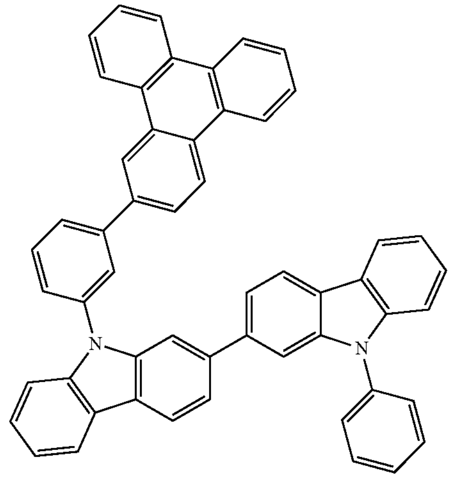
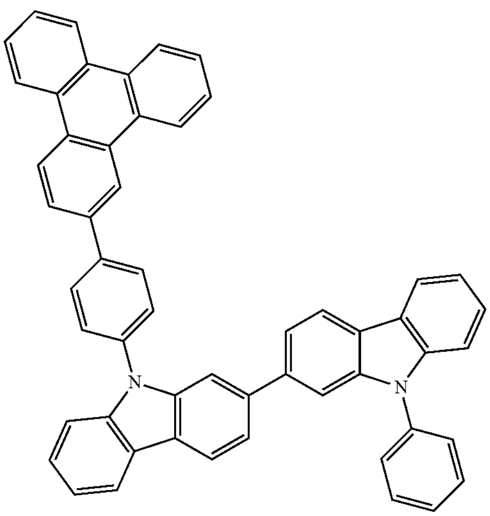
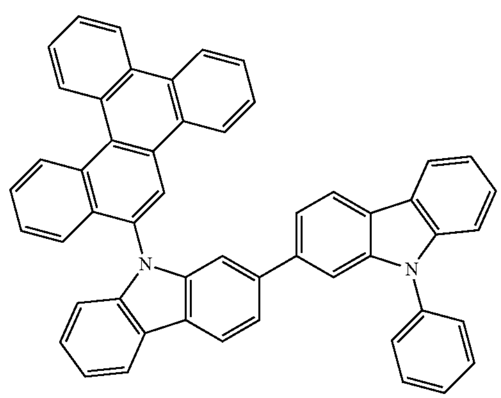

-continued
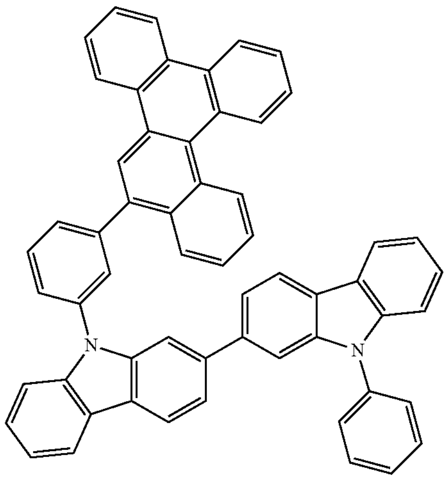
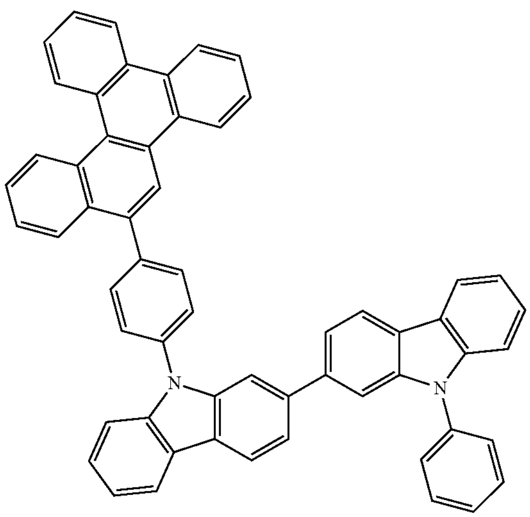
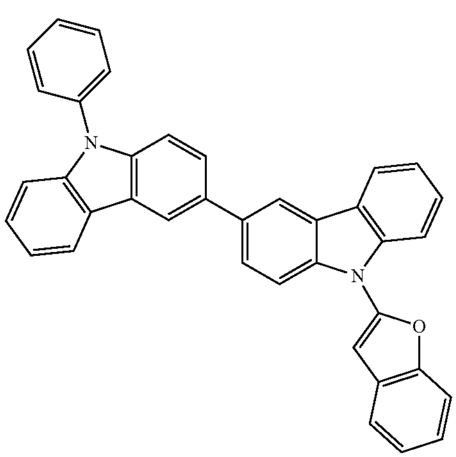
-continued
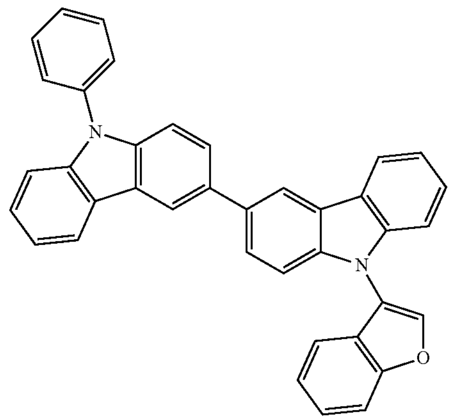
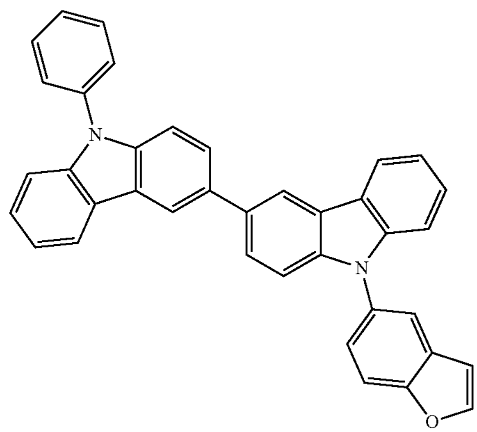
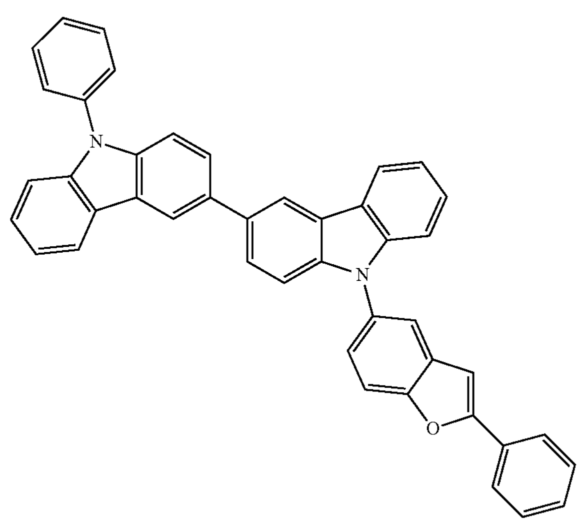

-continued
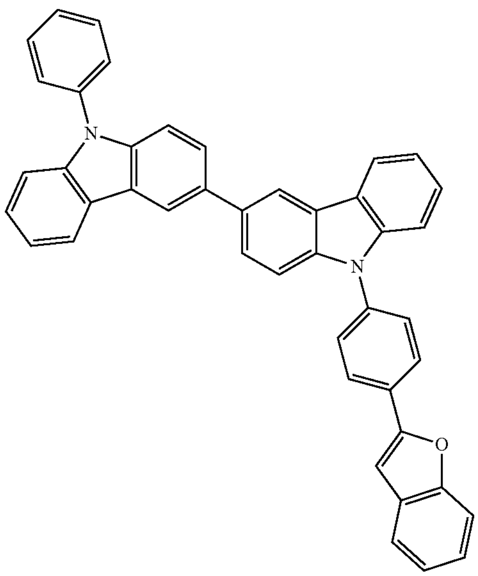
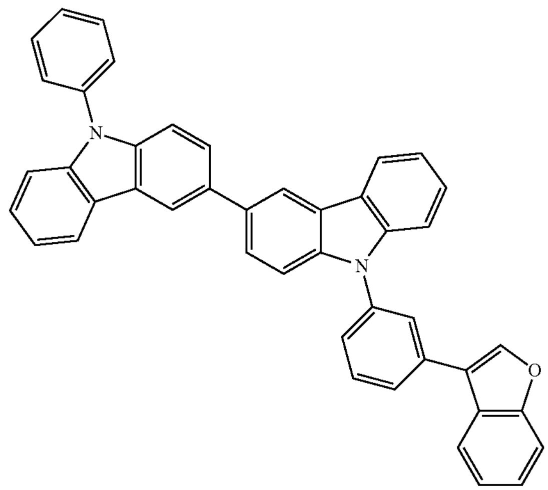
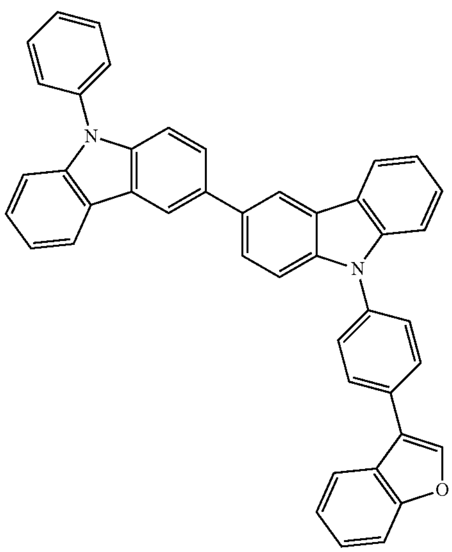
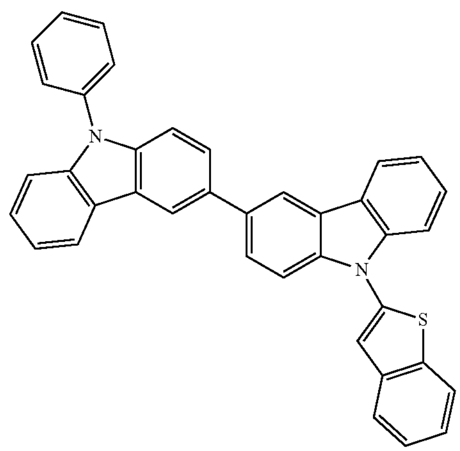
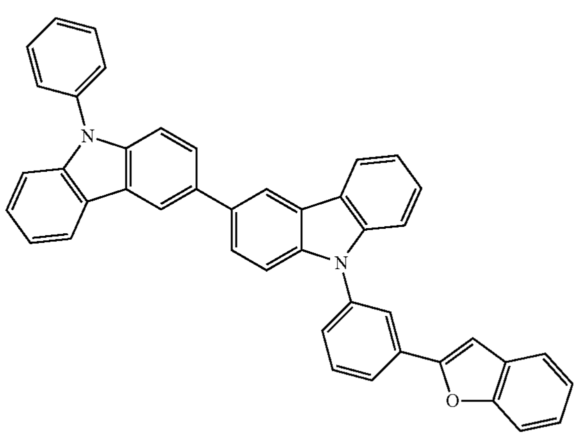
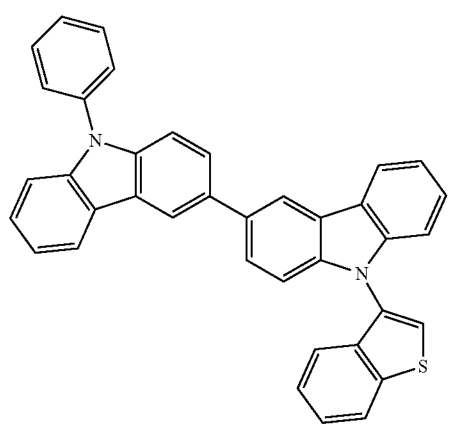

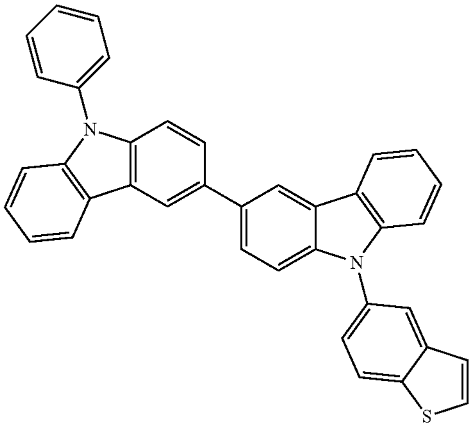
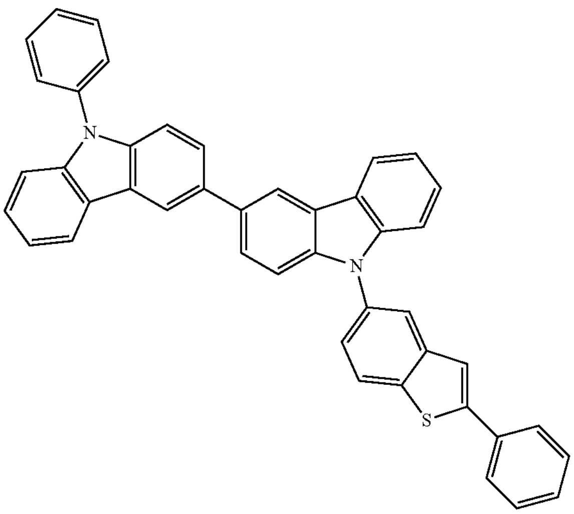
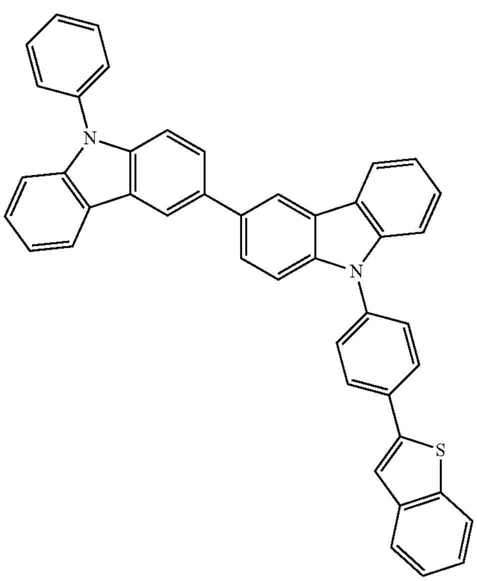
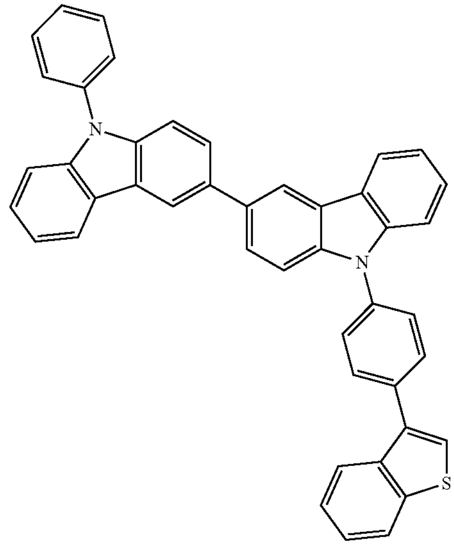
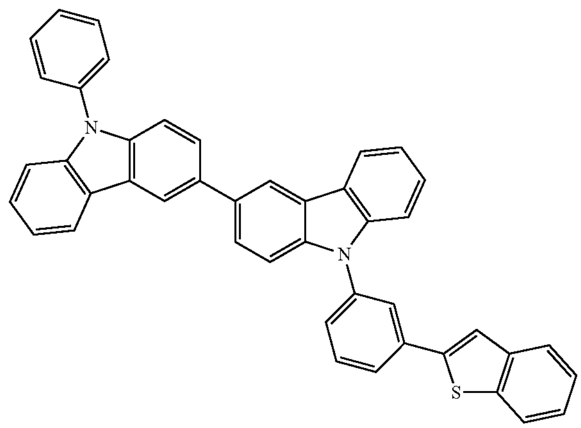
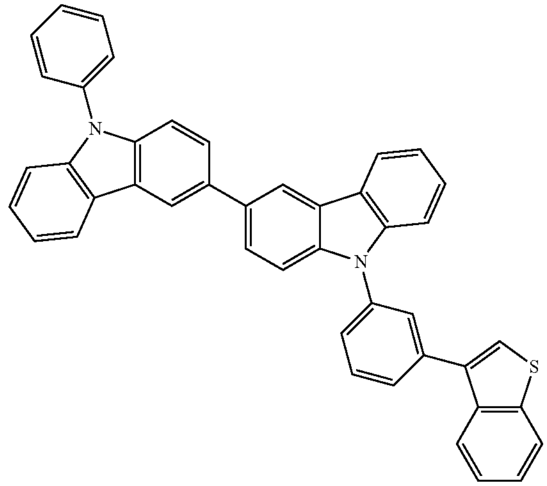

-continued
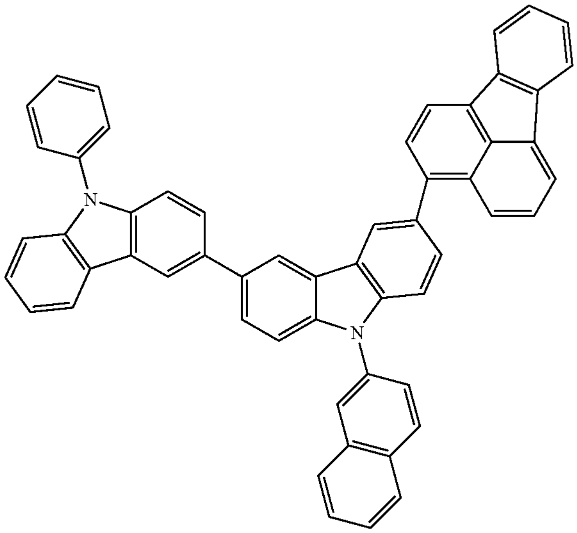
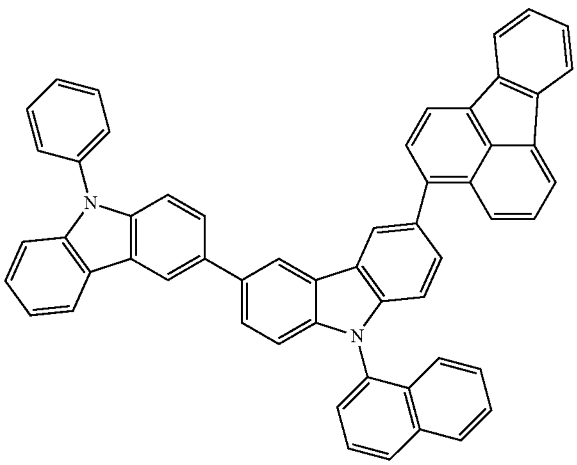
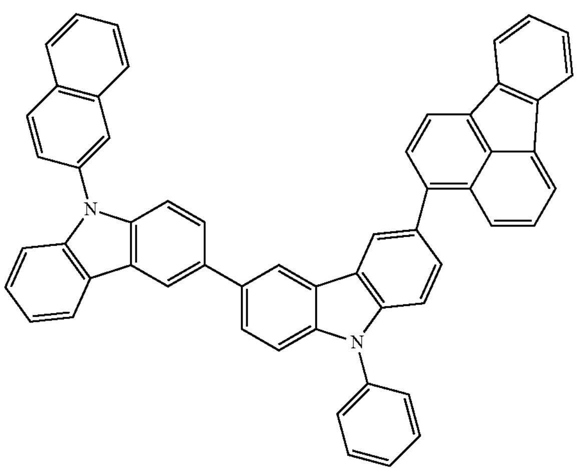
-continued
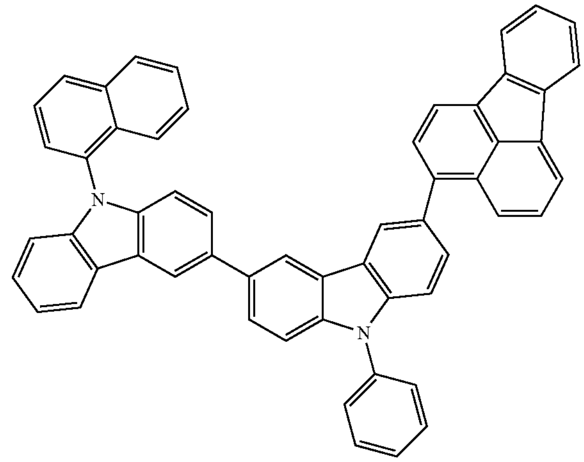
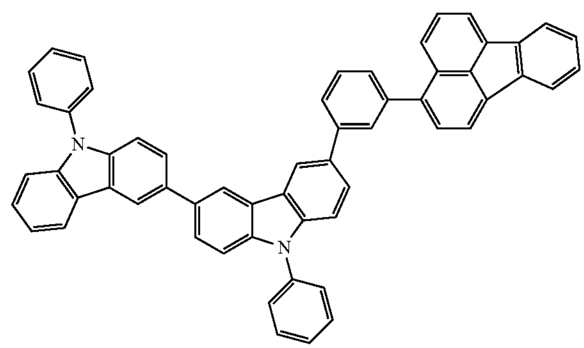
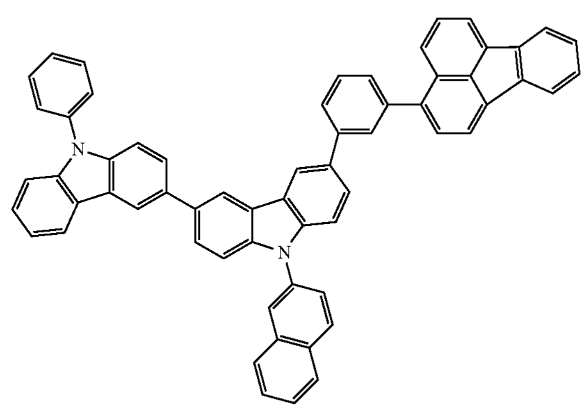

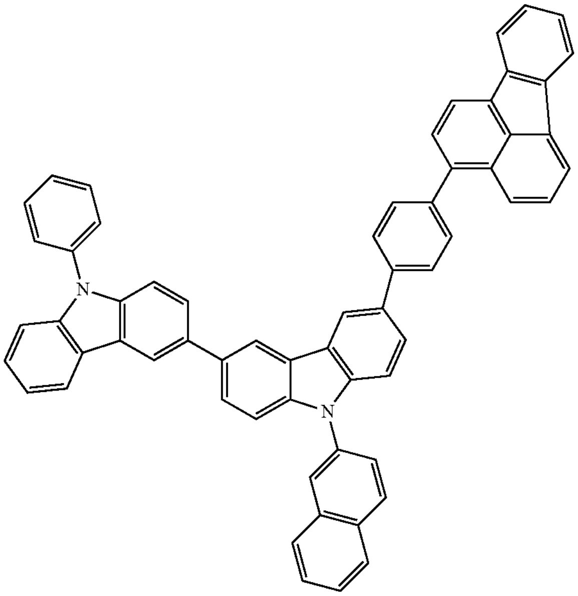
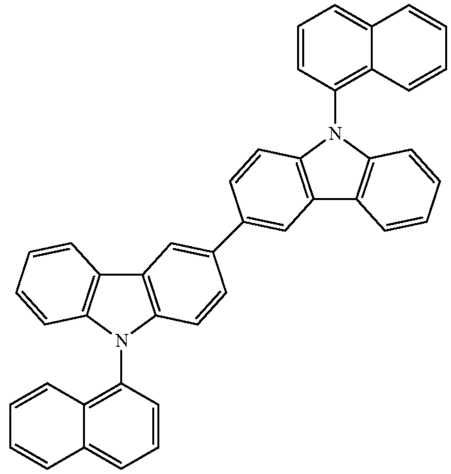
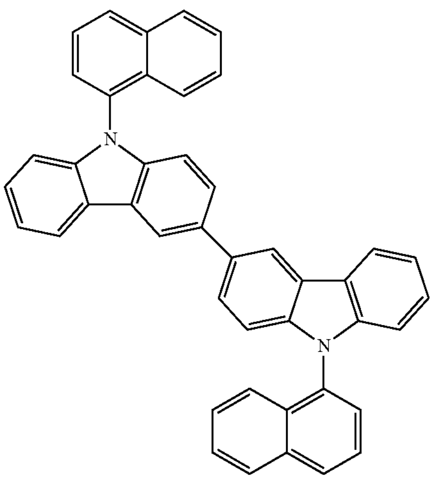
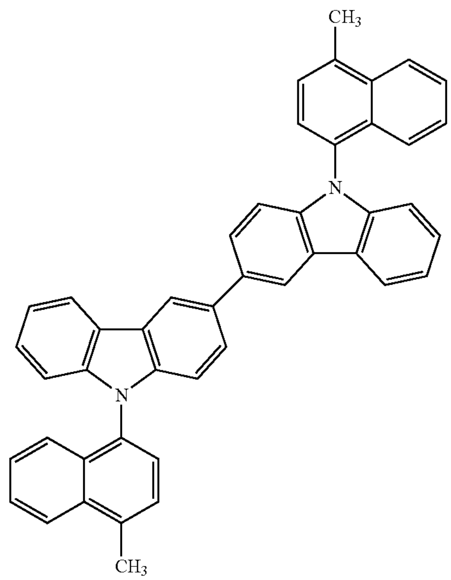
CH3
CH3
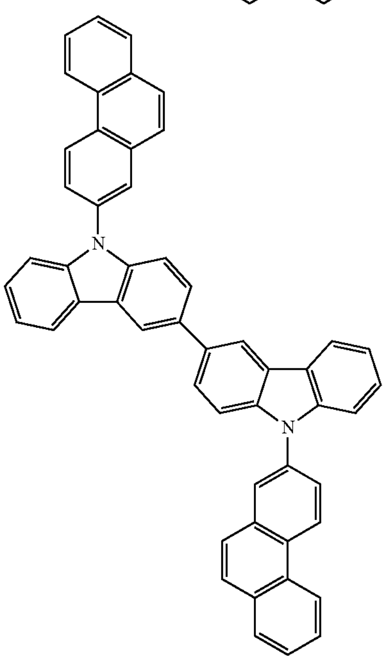
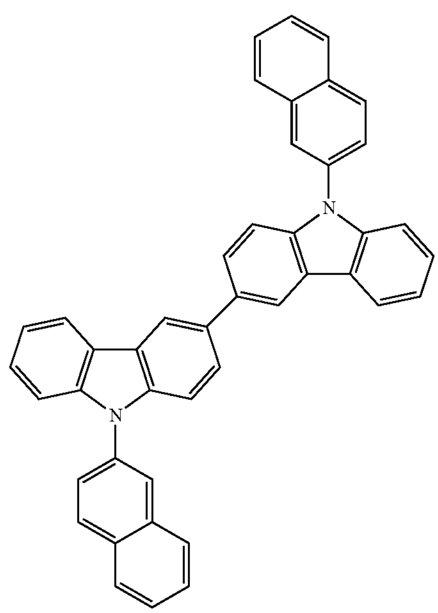

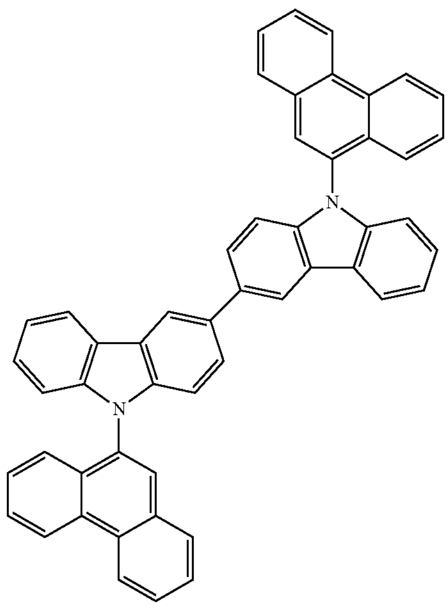
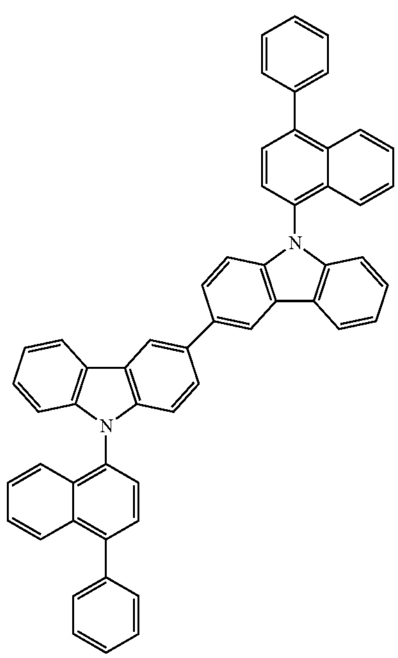
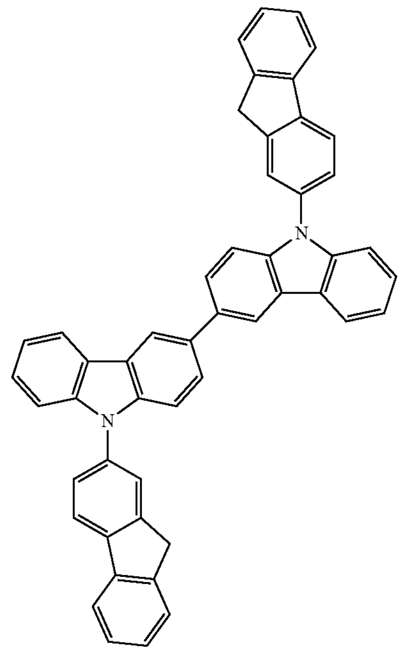
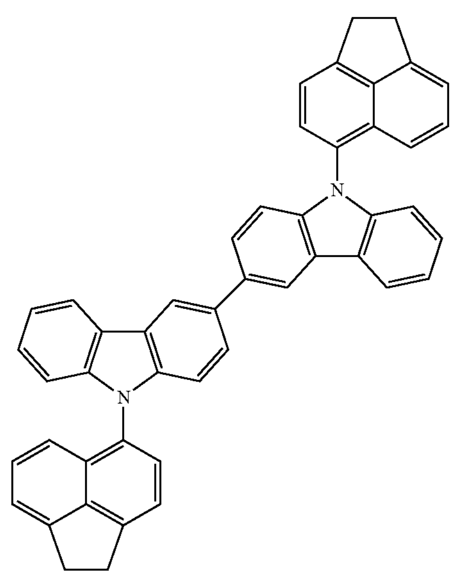

-continued
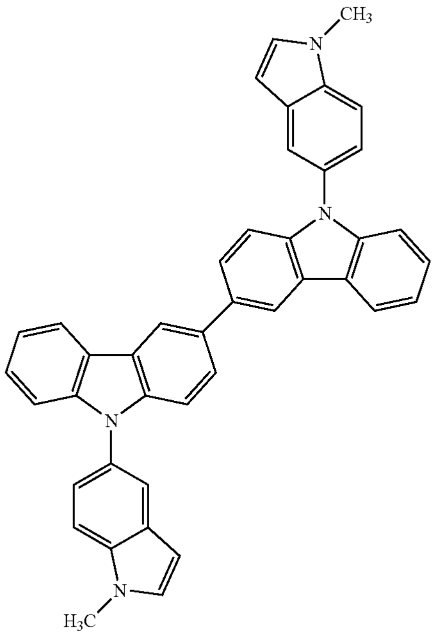
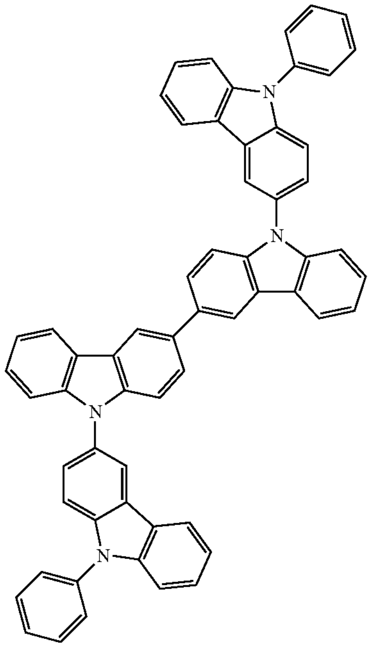
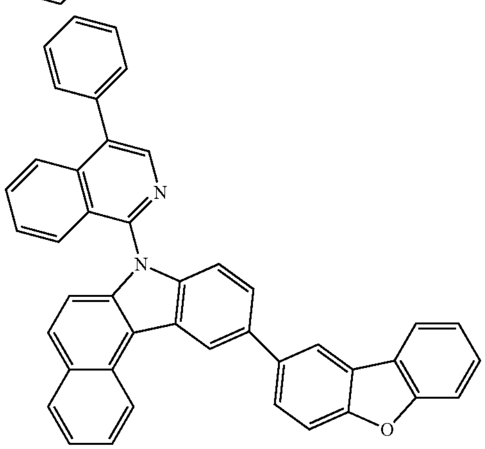
-continued
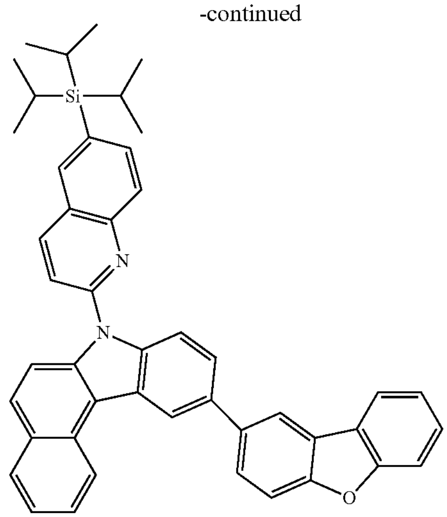
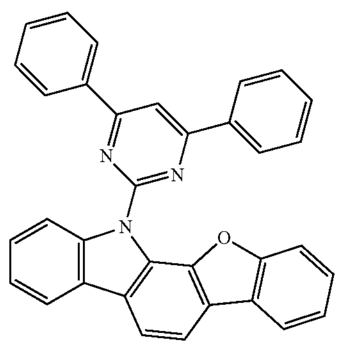
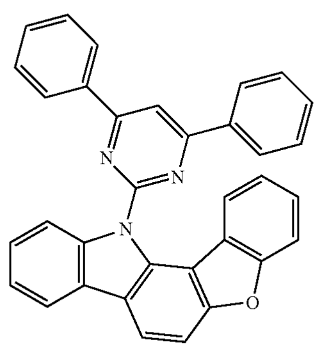
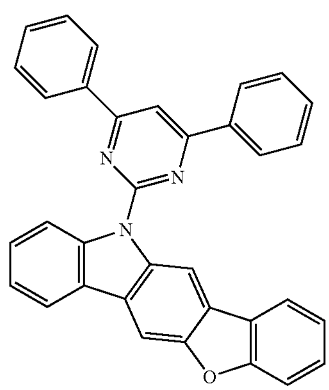

-continued
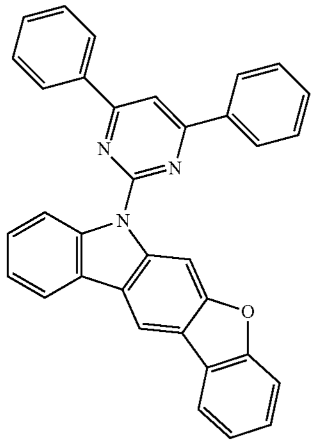
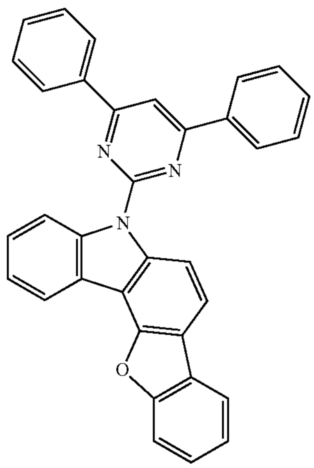
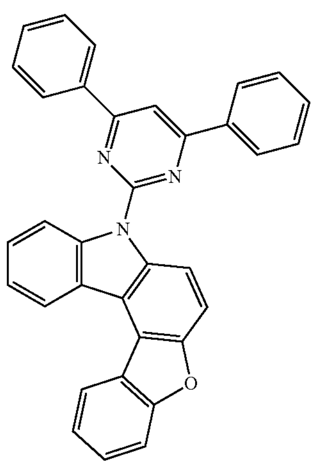
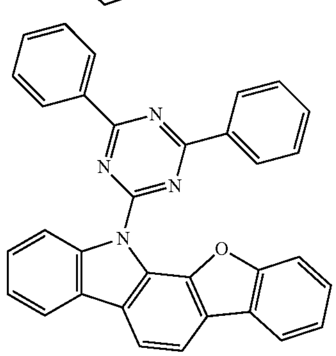
-continued
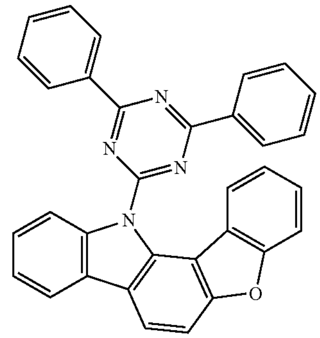
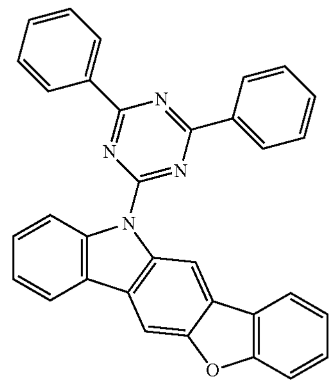
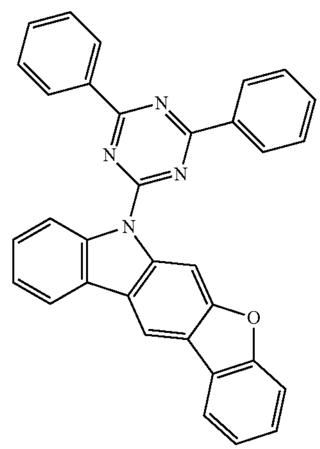
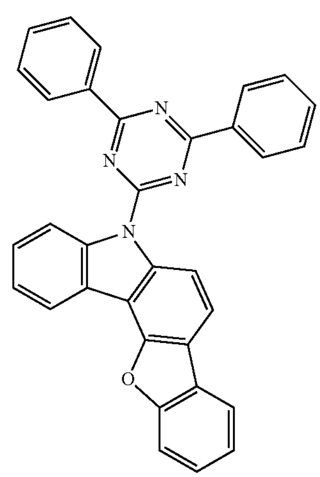

-continued
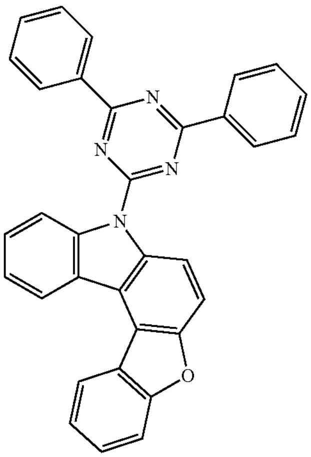
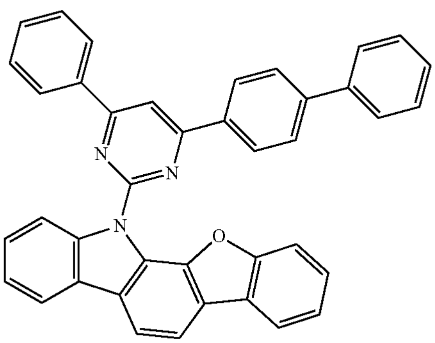
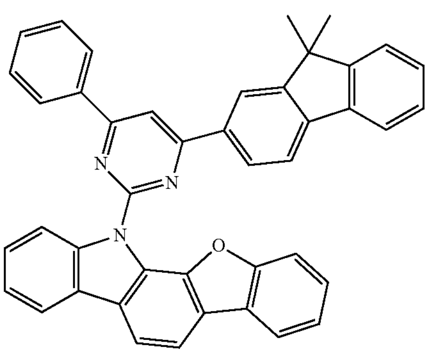
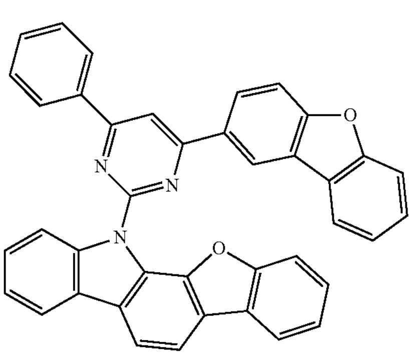
-continued
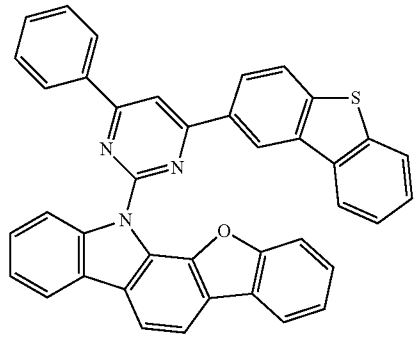
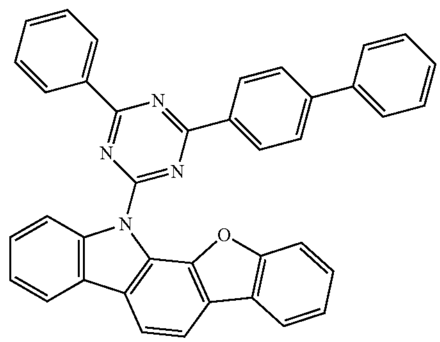
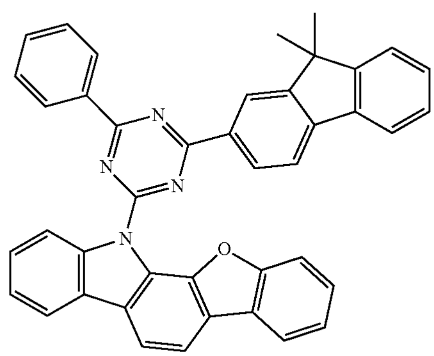
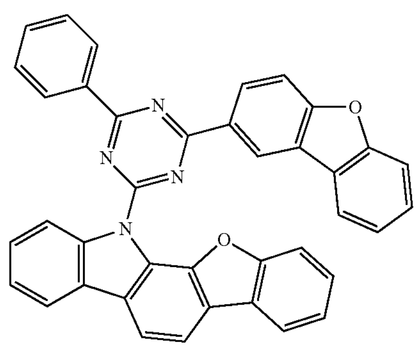
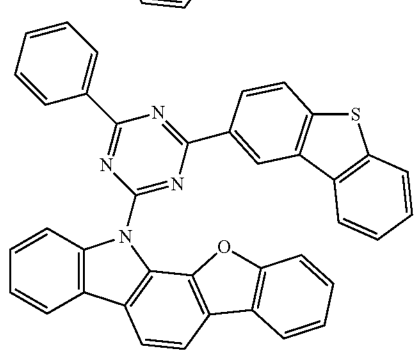

-continued
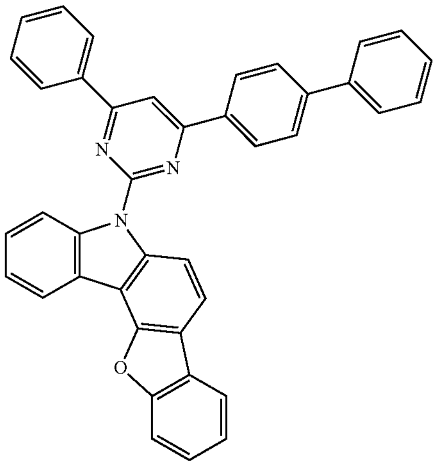
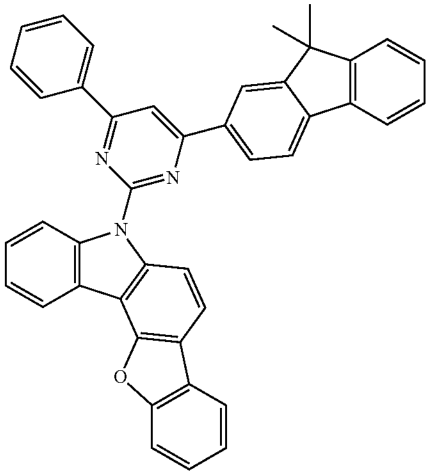
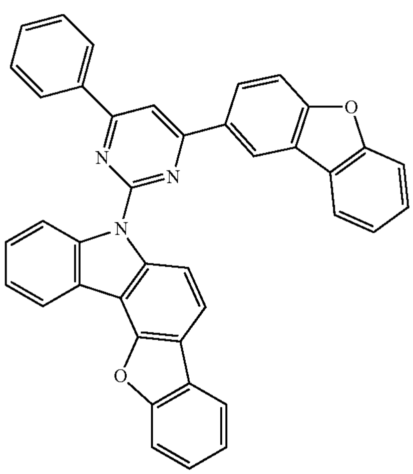
-continued
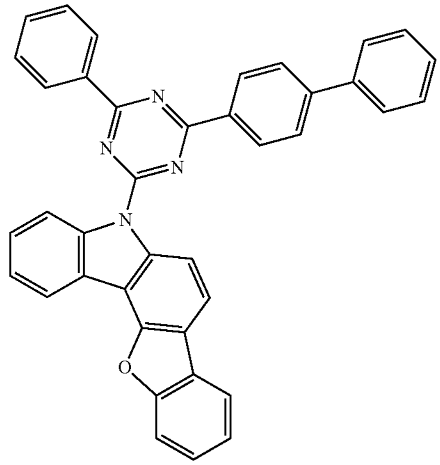
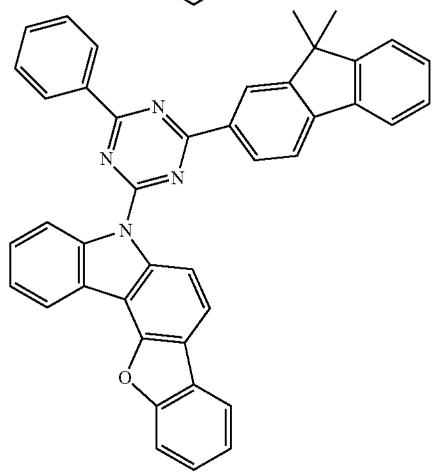
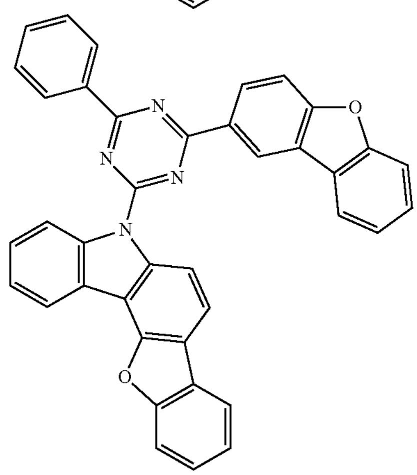
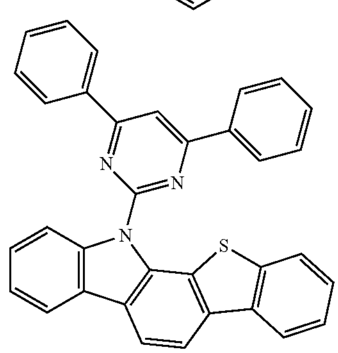

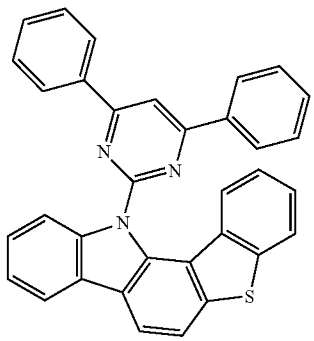
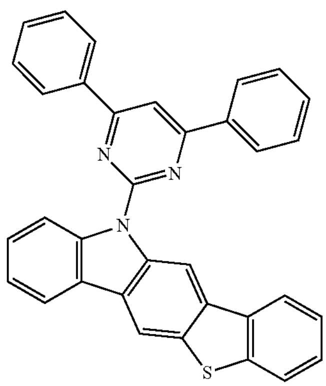
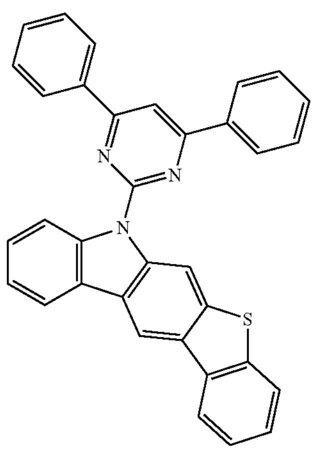
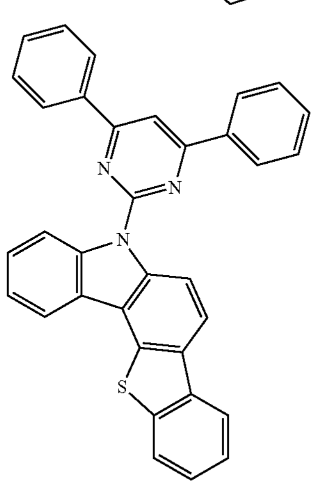
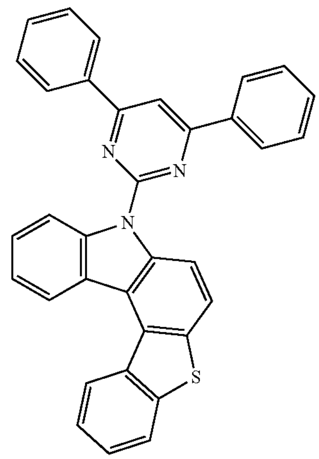
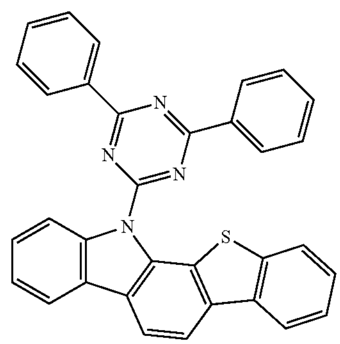
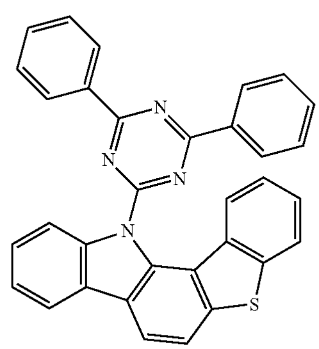
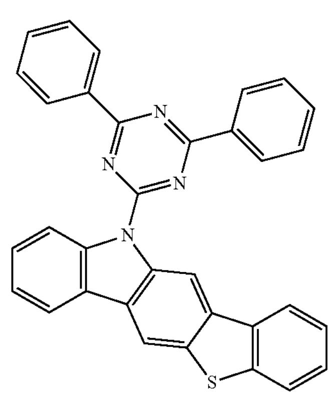

-continued
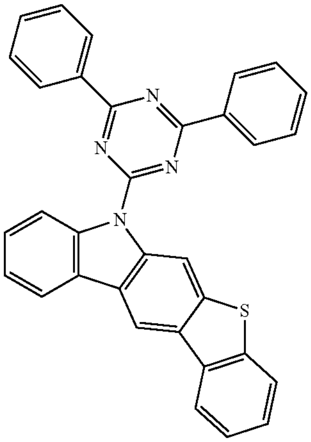
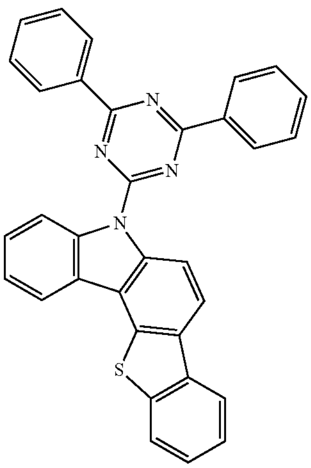
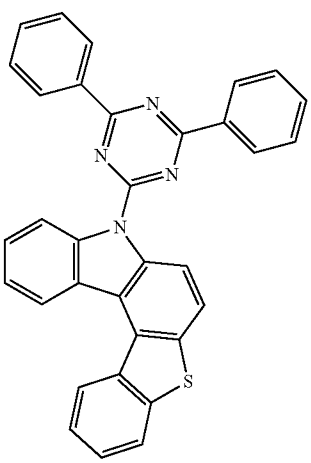
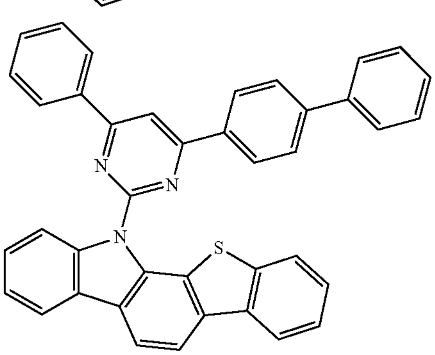
-continued
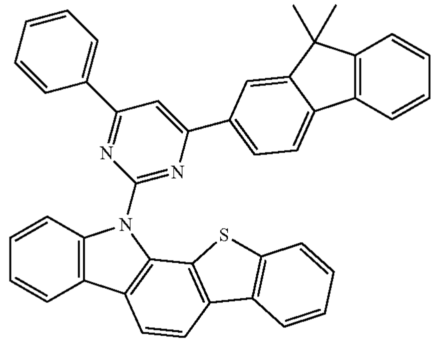
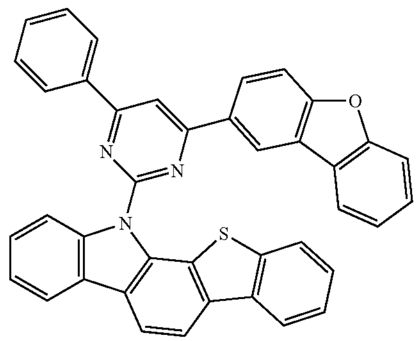
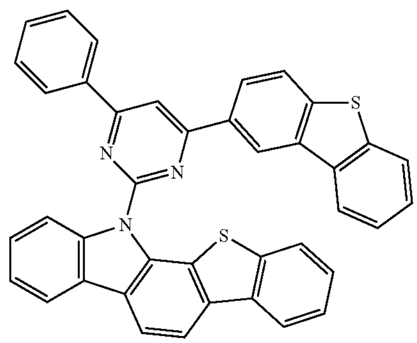
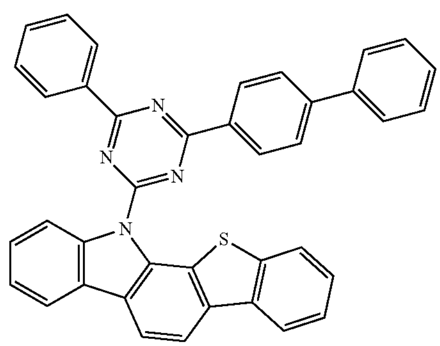
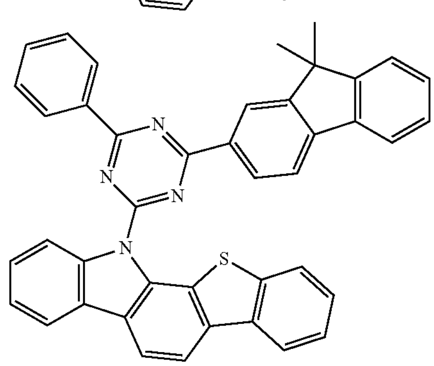

-continued
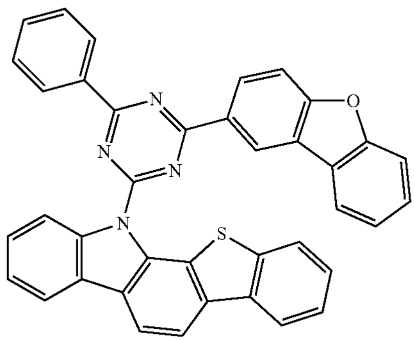
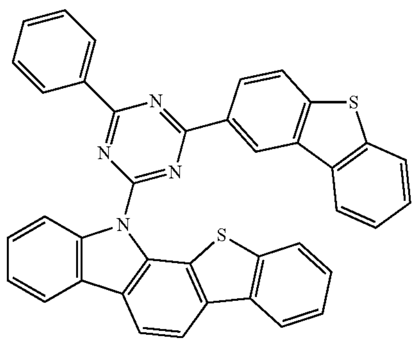
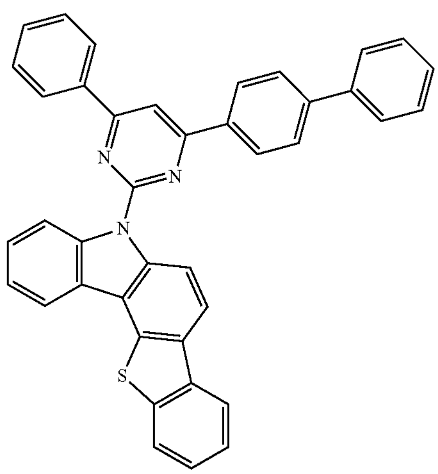
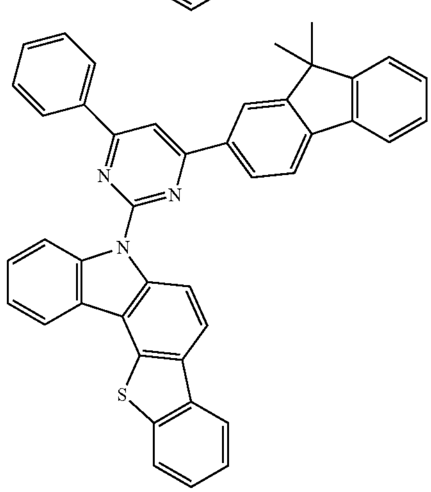
-continued
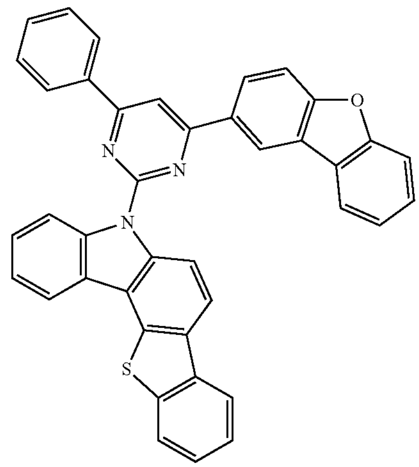
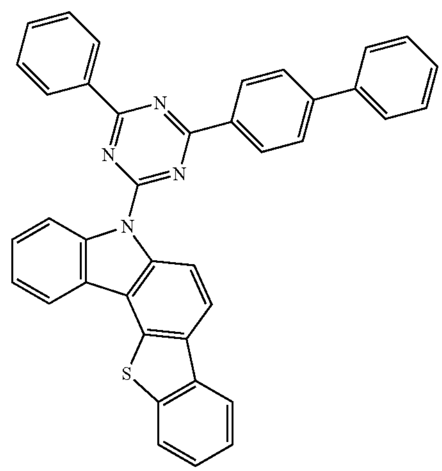
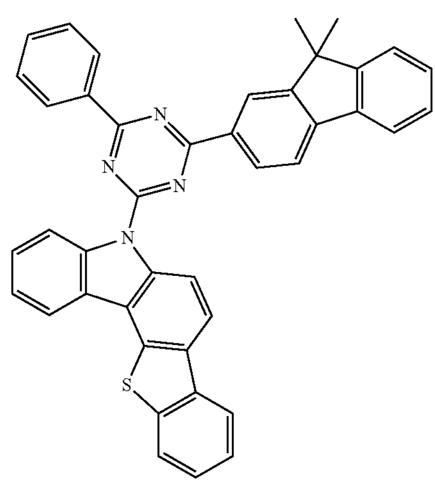

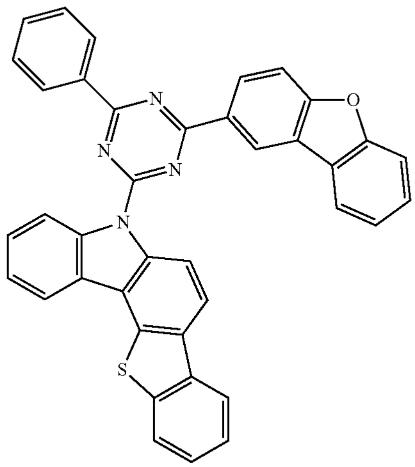
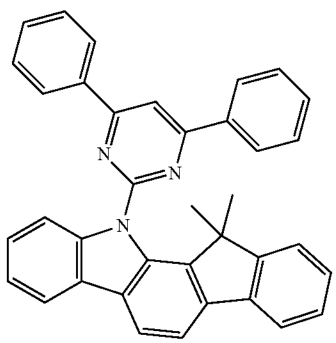
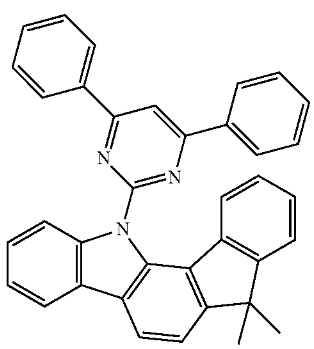
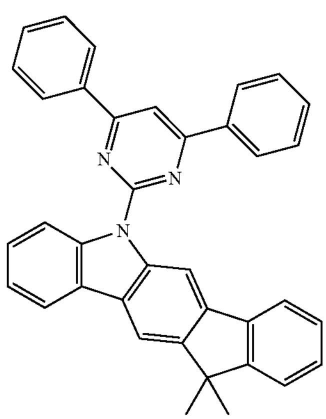
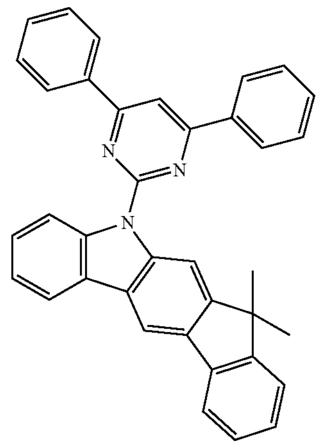
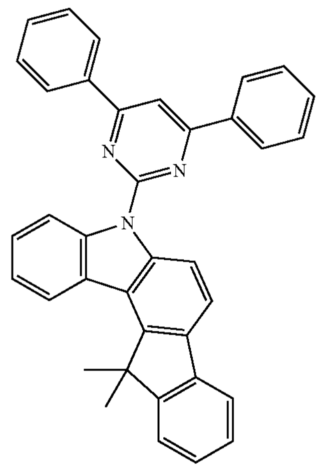
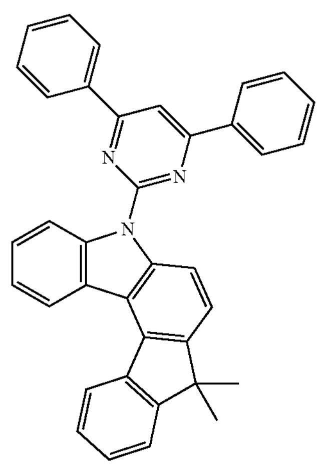
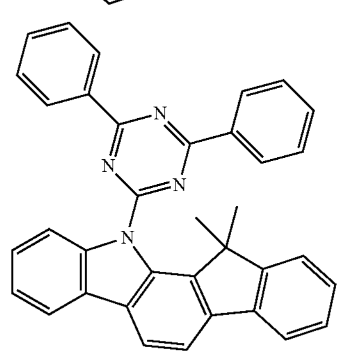

-continued
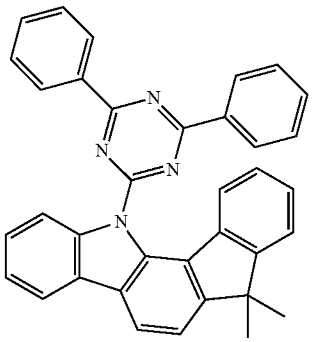
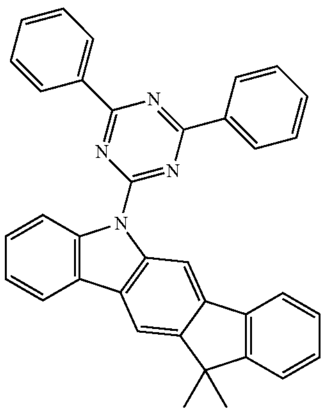
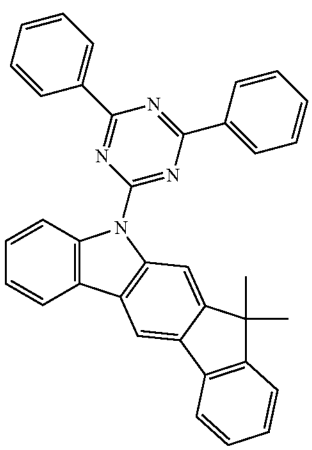
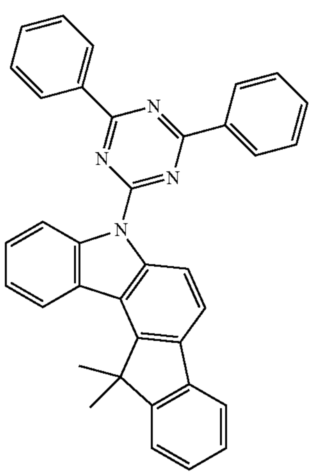
-continued
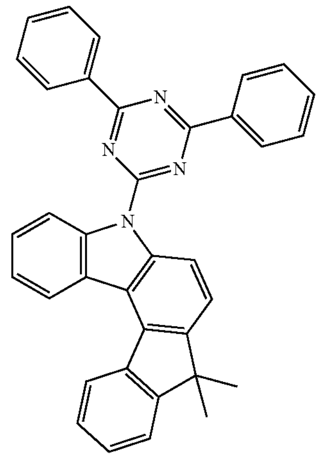
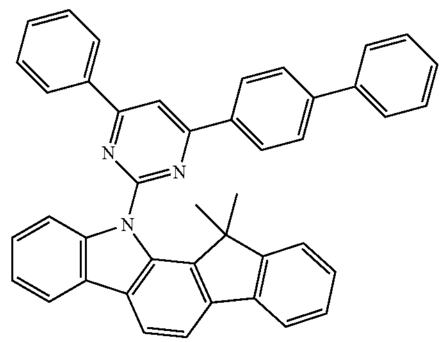
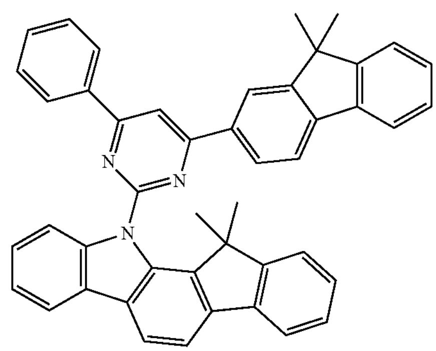
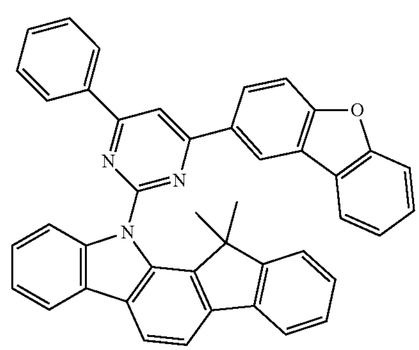

-continued
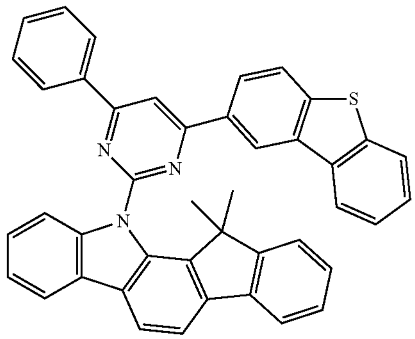
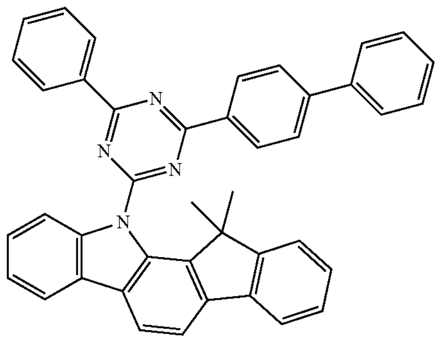
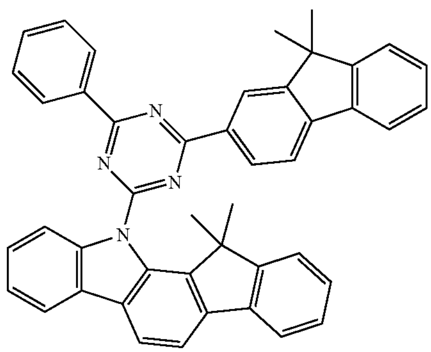
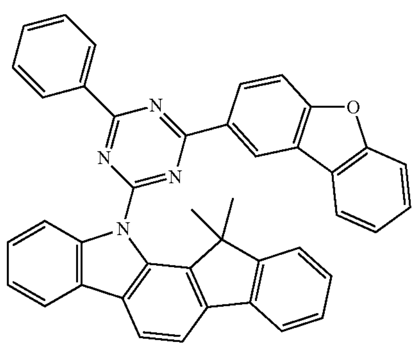
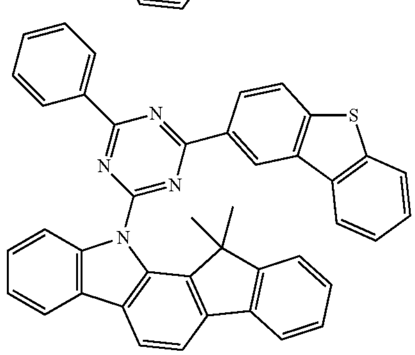
-continued
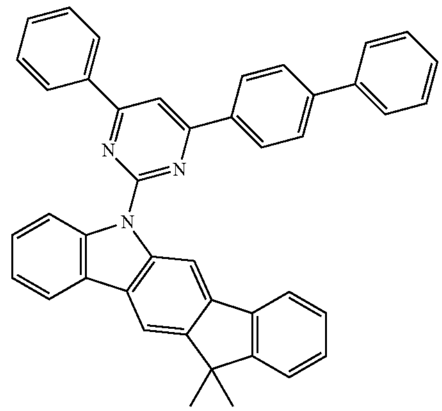
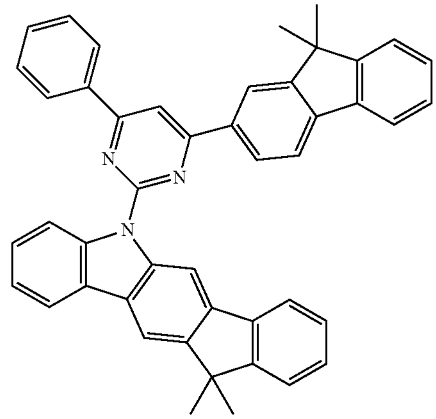
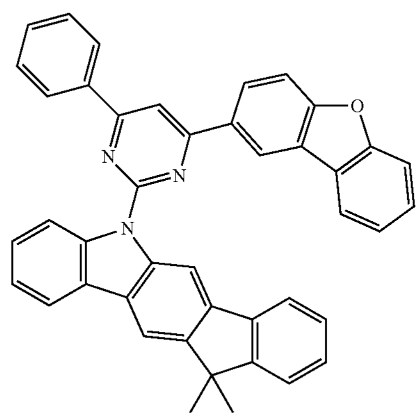
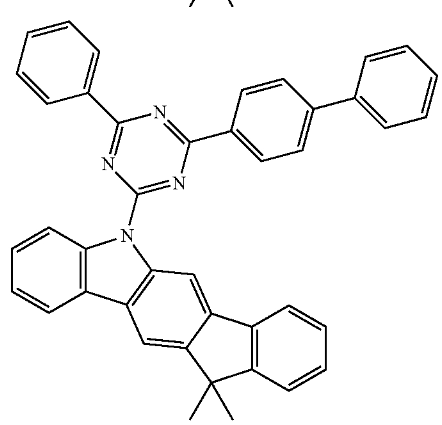

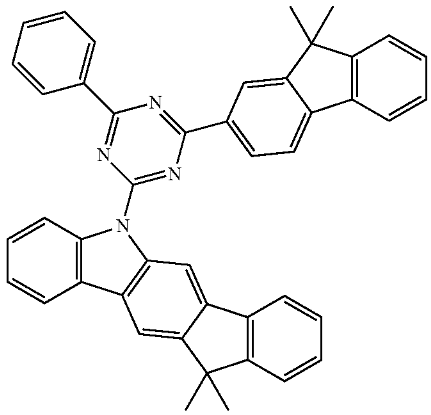

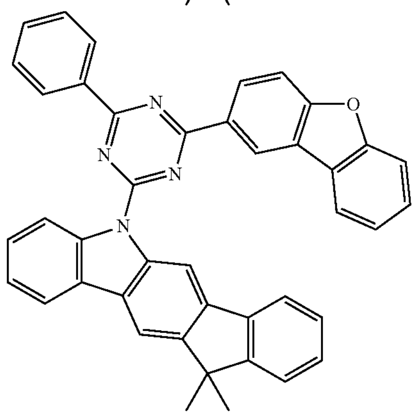

Dopant Material

In the exemplary embodiment, the phosphorescent dopant material preferably contains a metal complex, and the metal complex preferably has a metal atom selected from Ir, Pt, Os, Au, Cu, Re and Ru, and a ligand. Particularly, the ligand preferably has an ortho-metal bond.

The phosphorescent dopant material is preferably a compound containing a metal selected from iridium (Ir), osmium (Os) and platinum (Pt) because such a compound, which exhibits high phosphorescence quantum yield, can further enhance external quantum efficiency of the emitting device. The phosphorescent dopant material is more preferably a metal complex such as an iridium complex, osmium complex or platinum complex, among which an iridium complex and platinum complex are more preferable and ortho metalation of an iridium complex is the most preferable.

Examples of such a preferable metal complex are shown below.

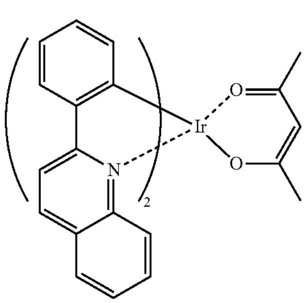

PQIr

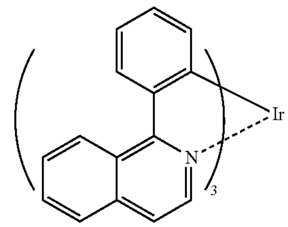

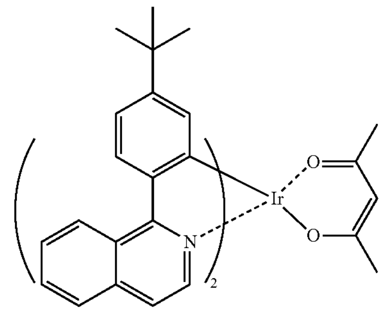

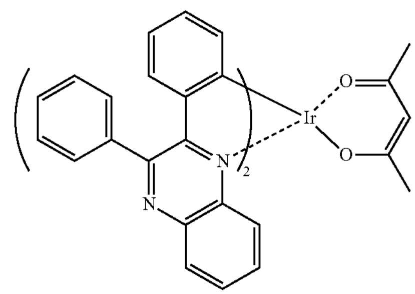

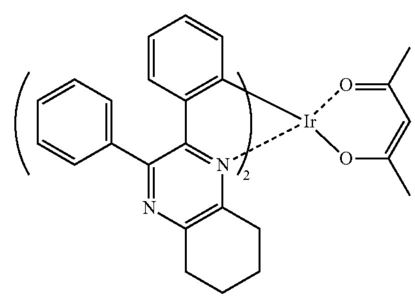

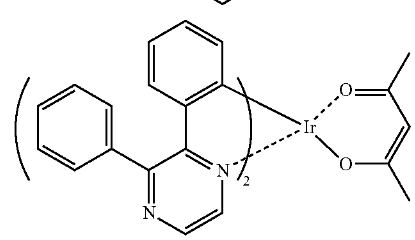

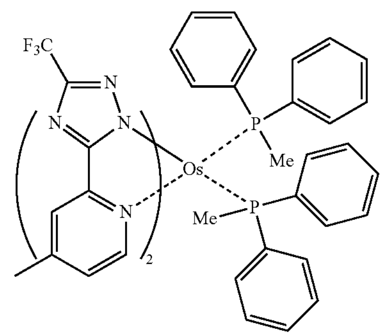

-continued
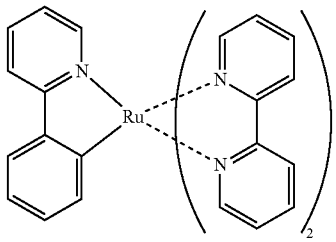
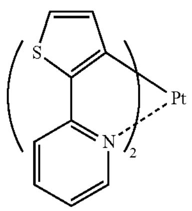
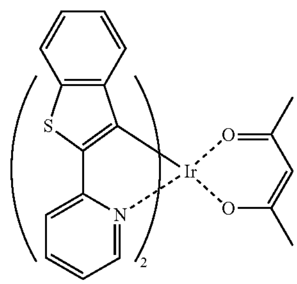
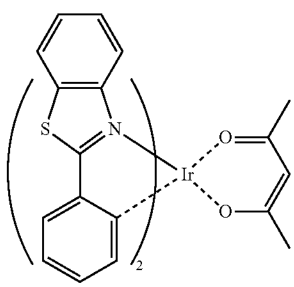
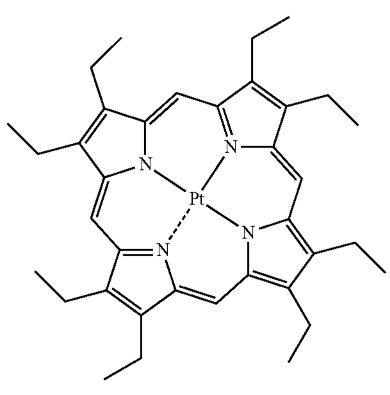
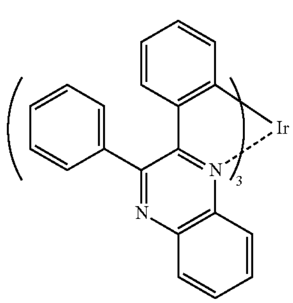
-continued
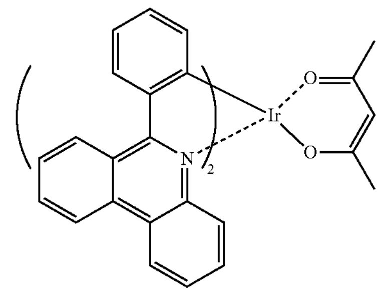
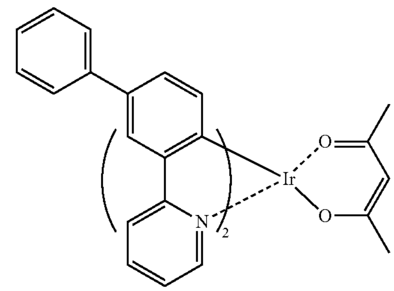
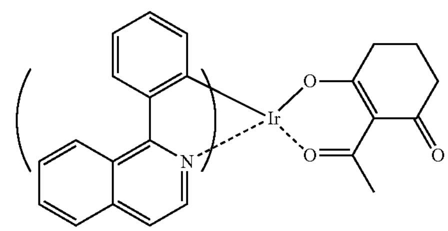
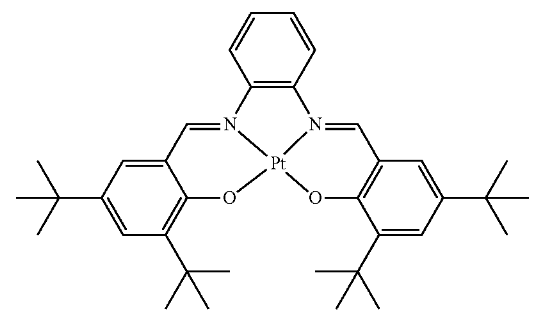
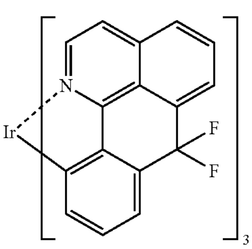
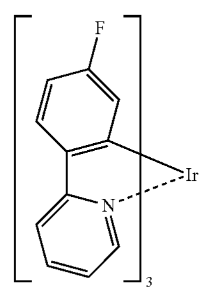
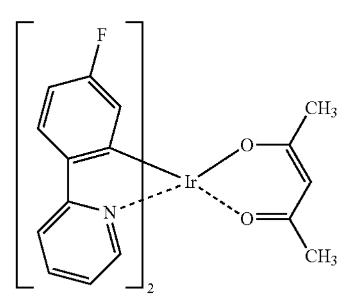

-continued
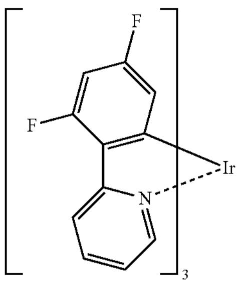
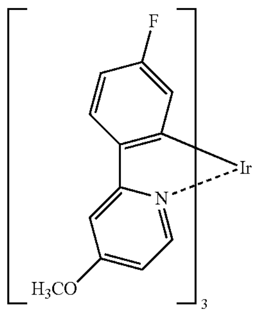
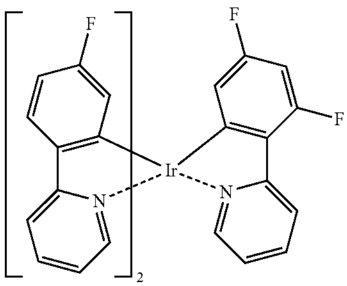
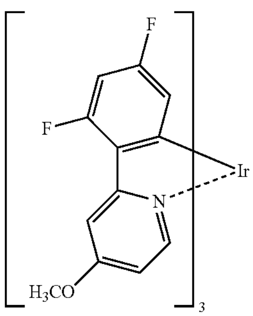
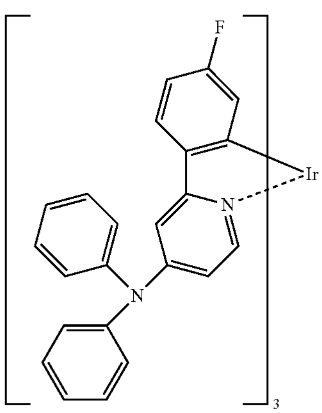
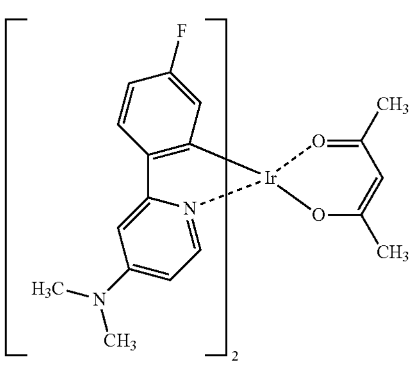
-continued
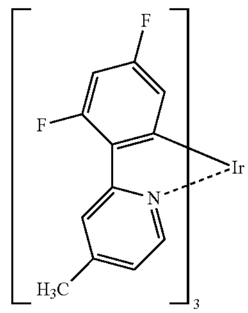
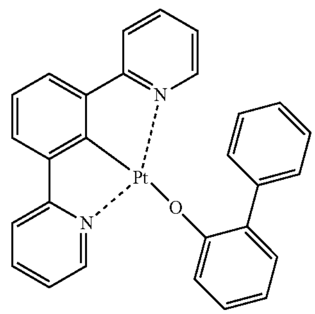
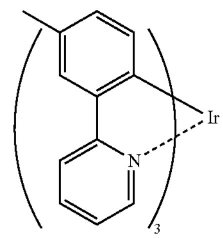
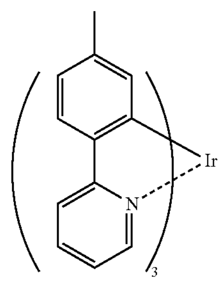
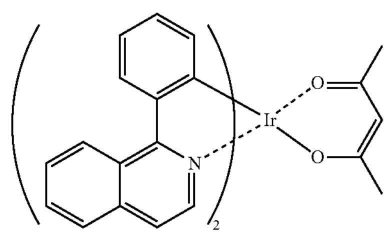
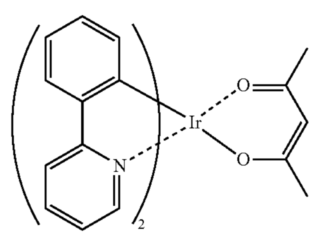
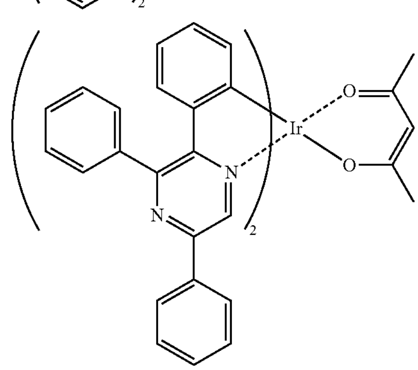

-continued
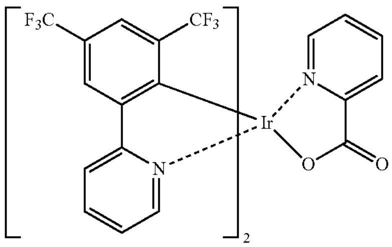
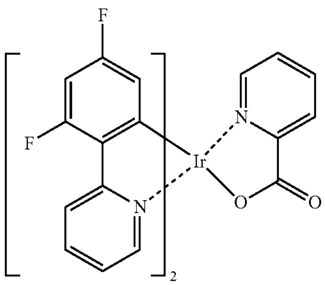
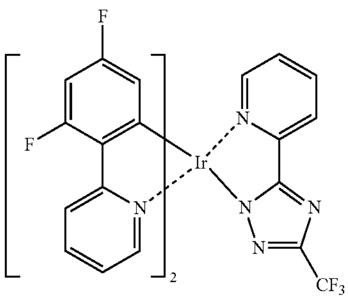
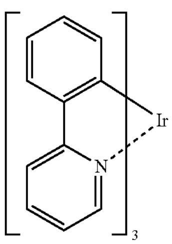
Ir(ppy)$_3$
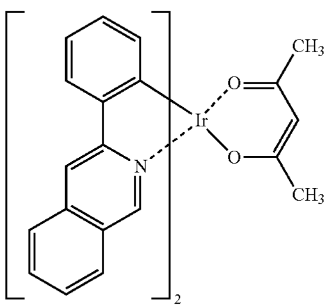
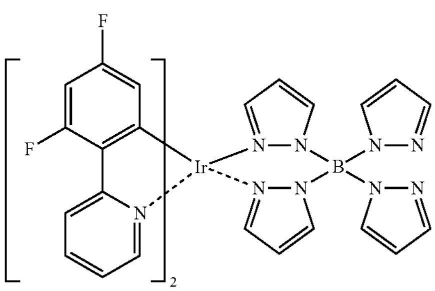
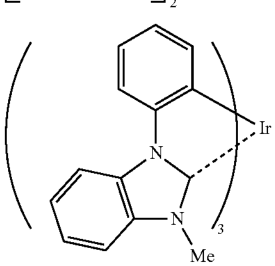
-continued
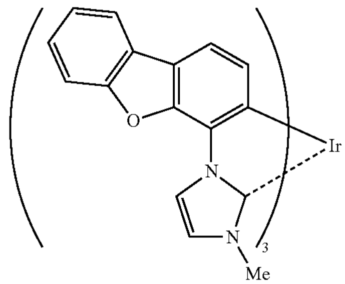
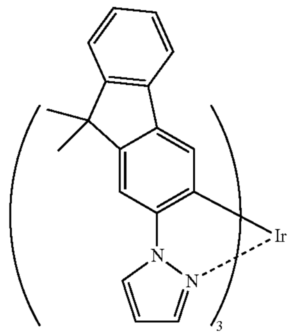
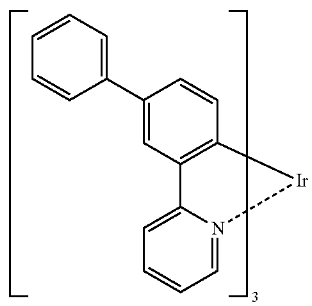
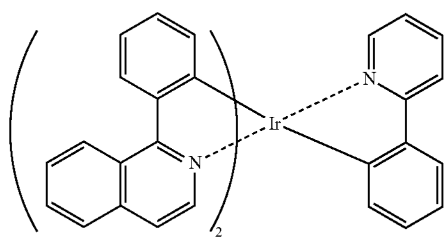
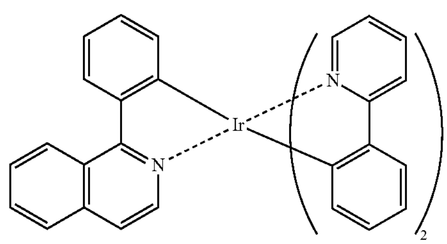
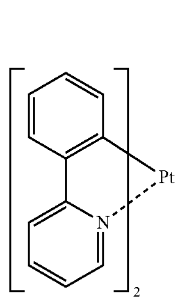
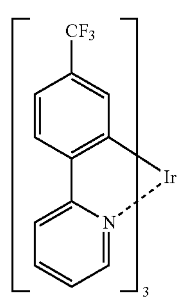

-continued

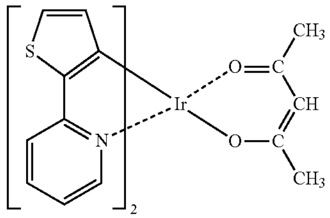

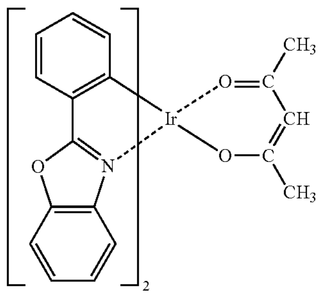

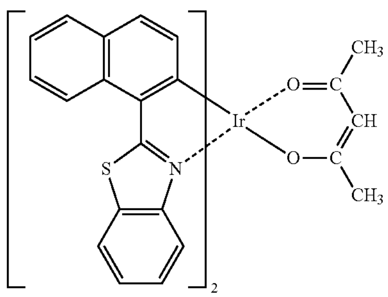

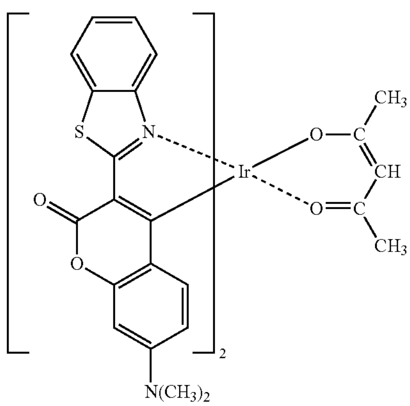

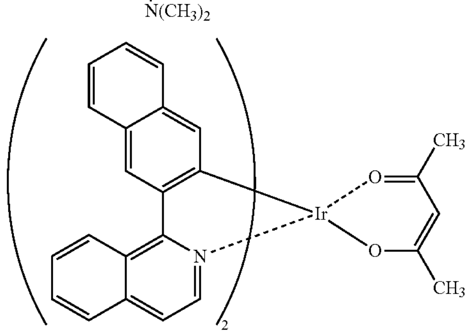

-continued

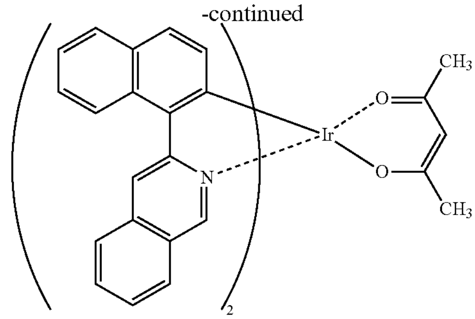

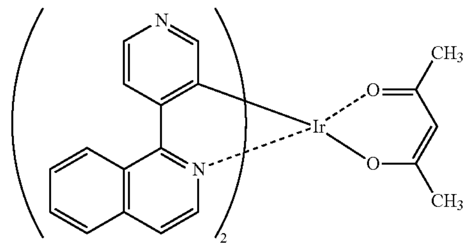

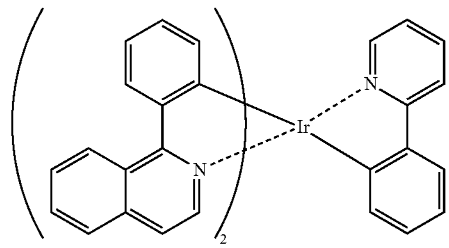

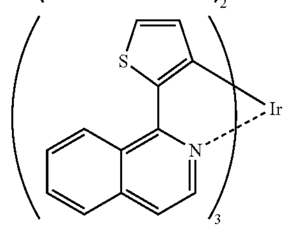

Hole Injecting/Transporting Layer

The hole injecting/transporting layer helps injection of holes to the emitting layer and transport the holes to an emitting region. A compound having a large hole mobility and a small ionization energy is used in the hole injecting/transporting layer.

A material for forming the hole injecting/transporting layer is preferably a material of transporting the holes to the emitting layer at a lower electric field intensity. For instance, an aromatic amine compound is preferably used.

Electron Injecting/Transporting Layer

The electron injecting/transporting layer helps injection of the electrons into the emitting layer and transports the electrons to an emitting region. A compound having a large electron mobility is used as the electron injecting/transporting layer.

A preferable example of the compound used as the electron injecting/transporting layer is an aromatic heterocyclic compound having at least one heteroatom in a molecule. Particularly, a nitrogen-containing cyclic derivative is preferable. The nitrogen-containing cyclic derivative is preferably a heterocyclic compound having a nitrogen-containing six-membered or five-membered ring skeleton.

In the organic EL device in the exemplary embodiment, in addition to the above exemplary compound, any compound selected from compounds used in a typical organic El device is usable as a compound for the organic layer other than the emitting layer.

Substrate

The organic EL device in the exemplary embodiment is formed on a light-transmissive substrate. The light-transmissive substrate supports an anode, an organic layer, a cathode and the like of the organic EL device. The light-transmissive substrate is preferably a smoothly-shaped substrate that transmits 50% or more of light in a visible region of 400 nm to 700 nm.

The light-transmissive plate is exemplarily a glass plate, a polymer plate or the like.

The glass plate is formed of soda-lime glass, barium/strontium-containing glass, lead glass, aluminosilicate glass, borosilicate glass, barium borosilicate glass, quartz and the like.

The polymer plate is formed of polycarbonate, acryl, polyethylene terephthalate, polyether sulfide and polysulfone.

Anode and Cathode

The anode of the organic EL device injects holes into the emitting layer, so that it is efficient that the anode has a work function of 4.5 eV or higher.

Exemplary materials for the anode are indium-tin oxide (ITO), tin oxide (NESA), indium zinc oxide, gold, silver, platinum and copper.

When light from the emitting layer is to be emitted through the anode, the anode preferably transmits more than 10% of the light in the visible region. Sheet resistance of the anode is preferably several hundreds Ω/square or lower. The thickness of the anode is typically in a range of 10 nm to 1 μm, and preferably in a range of 10 nm to 200 nm, though it depends on the material of the anode.

The cathode is preferably formed of a material with smaller work function in order to inject electrons into the emitting layer.

Although a material for the cathode is subject to no specific limitation, examples of the material are indium, aluminum, magnesium, alloy of magnesium and indium, alloy of magnesium and aluminum, alloy of aluminum and lithium, alloy of aluminum, scandium and lithium, and alloy of magnesium and silver.

Like the anode, the cathode may be made by forming a thin film on, for instance, the electron transporting layer and the electron injecting layer by a method such as vapor deposition. In addition, the light from the emitting layer may be emitted through the cathode. When light from the emitting layer is to be emitted through the cathode, the cathode preferably transmits more than 10% of the light in the visible region.

Sheet resistance of the cathode is preferably several hundreds Ω/sq. or lower.

The film thickness of the cathode is typically in a range of 10 nm to 1 μm, and preferably in a range of 50 nm to 200 nm, though it depends on the material of the cathode.

Manufacturing Method of Each Layer of Organic EL Device

A method of forming each of the layers in the organic EL device according to this exemplary embodiment is not particularly limited. Conventionally-known methods such as vacuum deposition and spin coating may be employed for forming the layers. The organic layer, which is used in the organic EL device of the exemplary embodiment, may be formed by a known method such as vacuum deposition, molecular beam epitaxy (MBE (Molecular Beam Epitaxy) method) or coating methods using a solution such as a dipping, spin coating, casting, bar coating, and roll coating.

Film Thickness of Each Layer of Organic EL Device

A film thickness of the emitting layer is preferably in a range of 5 nm to 50 nm, more preferably in a range of 7 nm to 50 nm and most preferably in a range of 10 nm to 50 nm. When the film thickness of the emitting layer is 5 nm or more, it becomes easy to form the emitting layer and adjust chromaticity. When the film thickness of the emitting layer is 50 nm or less, increase in the drive voltage is suppressible.

Although the film thickness of each of other organic layers is not specifically limited, the film thickness is typically preferably in a range of several nm to 1 μm. With the film thickness defined in such a range, deficiencies such as pin holes caused by an excessively thin film thickness can be prevented and increase in the drive voltage caused by an excessively thick film thickness can be suppressed to prevent deterioration in efficiency.

Second Exemplary Embodiment

An arrangement of an organic EL device according to a second exemplary embodiment will be described.

In the description of the second exemplary embodiment, the explanation of the same components as those in the first exemplary embodiment will be omitted. In the second exemplary embodiment, the same materials and compounds as described in the first exemplary embodiment are usable for a material and a compound which are not particularly described. The second exemplary embodiment is different from the first exemplary embodiment in using a compound represented by a formula (30) below as the second host material.

It is preferable to use the compound represented by the formula (30) as the second host material of this exemplary embodiment.

(30)

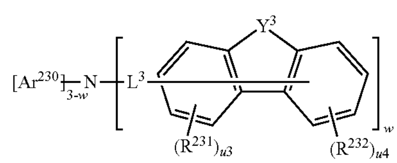

In the formula (30), $Ar^{230}$ is a substituted or unsubstituted aromatic hydrocarbon group having 6 to 30 ring carbon atoms.

$Y^3$ is selected from an oxygen atom, a sulfur atom, $NR^{230}$ and a nitrogen atom to be bonded to $L^3$ by a single bond.

$L^3$ is a single bond or a linking group. The linking group is a substituted or unsubstituted aromatic hydrocarbon group having 6 to 30 ring carbon atoms.

$L^3$ may be bonded to a carbon atom of the group including $Y^3$. When $Y^3$ is a nitrogen atom, $L^3$ may be bonded to $Y^3$.

w is 1 or 2. When w is 1, two $Ar^{230}$ are mutually the same or different. When w is 2, structures represented by a formula (30-1) below are mutually the same or different.

$R^{230}$ to $R^{232}$ each independently represent the same as $R^1$ of the formula (1).

u3 and u4 are each independently an integer of 3 to 4.

A plurality of $R^{231}$ are mutually the same or different. Adjacent ones of $R^{231}$ may be bonded to each other to form a ring. $R^{232}$ is mutually the same or different. Adjacent ones of $R^{232}$ may be bonded to each other to form a ring.

(30-1)

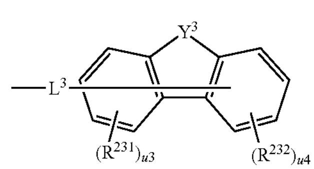

In the formula (30-1), $Y^3$, $L^3$, $R^{231}$, $R^{232}$, u3 and u4 respectively represent the same as $Y^3$, $L^3$, $R^{231}$, $R^{232}$, u3 and u4 of the formula (30).

The formula (30) is preferably a compound represented by one of formulae (30-A) to (30-D) below.

(30-A)

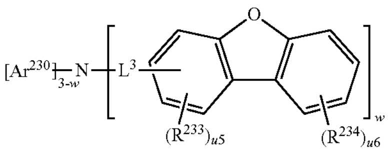

(30-B)

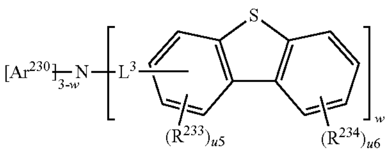

(30-C)

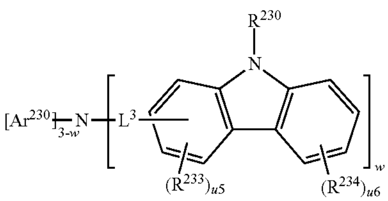

(30-D)

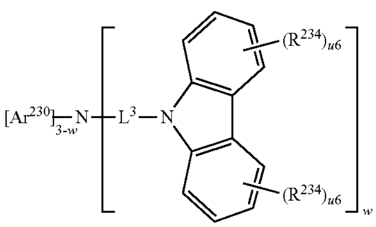

In the formulae (30-A) to (30-D), $Ar^{230}$, $L^3$, w and $R^{230}$ respectively represent the same as $Ar^{230}$, $L^3$, w and $R^{230}$ of the formula (30).

$R^{233}$ and $R^{234}$ represent the same as $R^{231}$ and $R^{232}$ of the formula (30).

u5 is 3 and u6 is 4.

In the formulae (30) and (30-A) to (30-D), $Ar^{230}$ and $L^3$ are preferably a substituted or unsubstituted non-fused aromatic hydrocarbon group having 6 to 30 ring carbon atoms. The non-fused aromatic hydrocarbon group having 6 to 30 ring carbon atoms is preferably a phenyl group or a group provided by linking a plurality of benzene rings. The non-fused aromatic hydrocarbon group having 6 to 30 ring carbon atoms is particularly preferably one selected from a phenyl group, biphenyl group and terphenyl group.

Examples of each of the substituents described in the formulae (30), (30-A) to (30-D) are the same as the examples of each of the substituents described in the formulae (1) to (3), (1-1) to (1-6) and (2-1) to (2-4).

In the formulae (30), (30-A) to (30-D), examples of a substituent in a "substituted or unsubstituted" are the same as described above.

Specific examples of the compounds represented by the formulae (30), (30-A) to (30-D) are shown below, but the compounds represented by the formulae (30), (30-A) to (30-D) are not limited thereto.

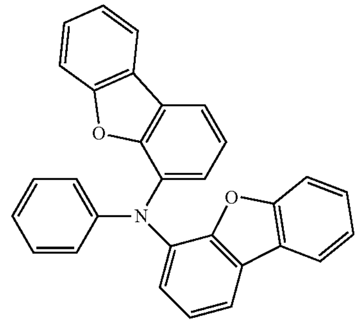

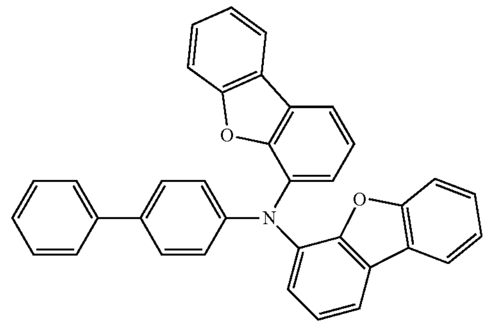

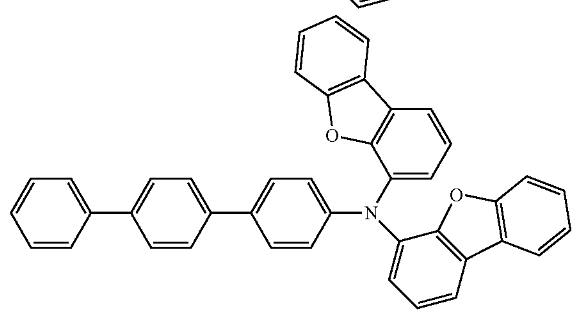

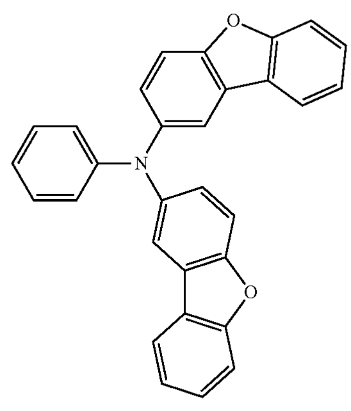

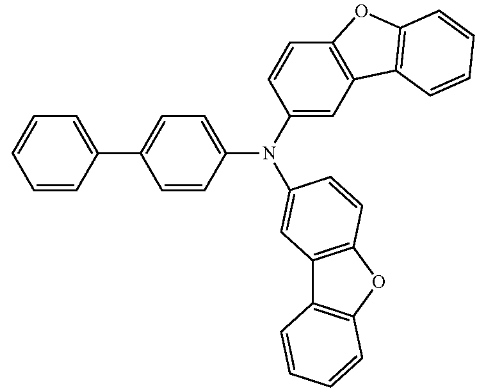

-continued
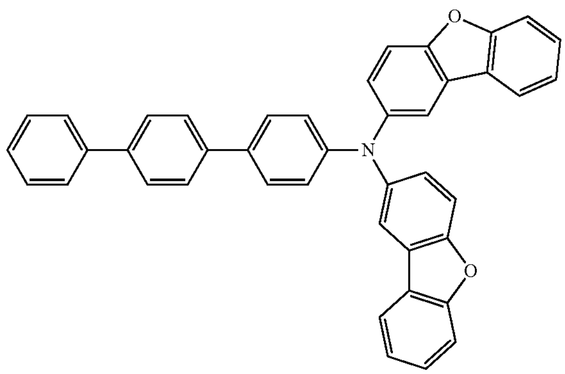
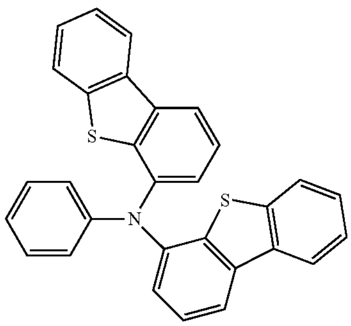
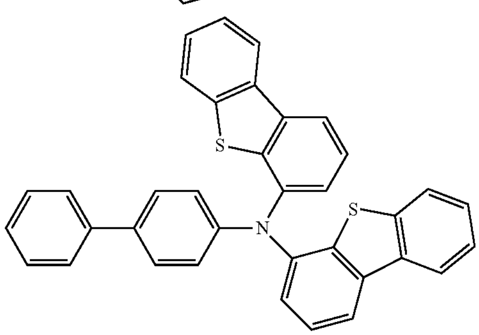
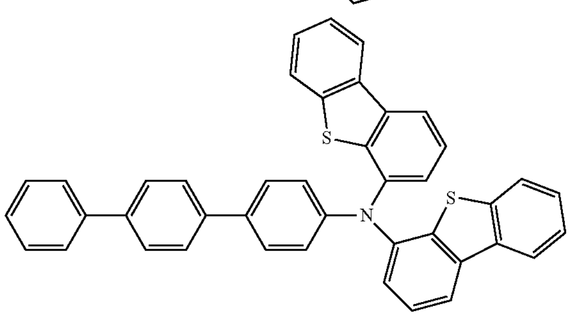
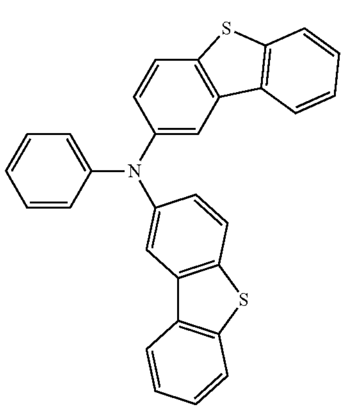
-continued
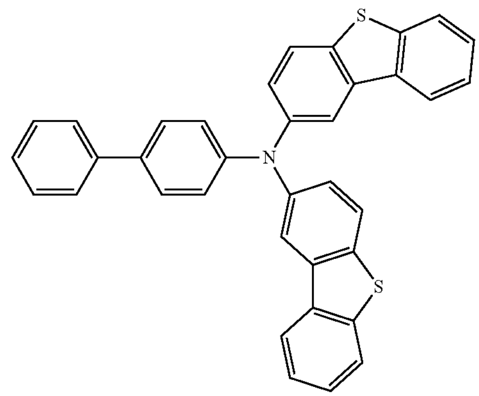
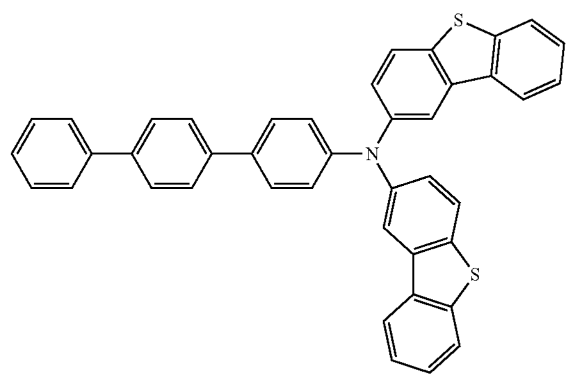
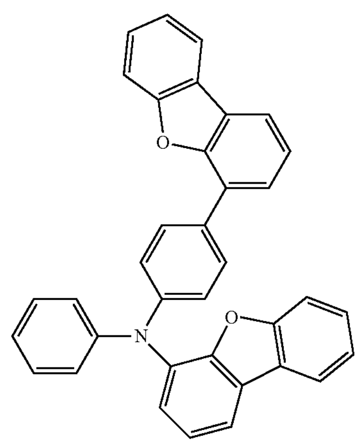
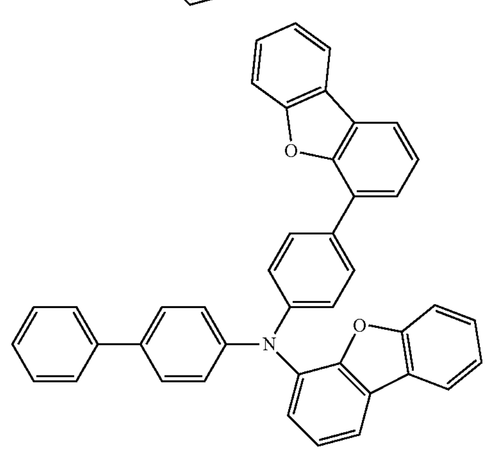

-continued
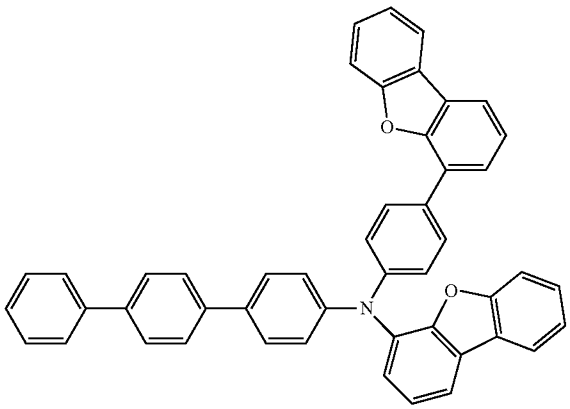
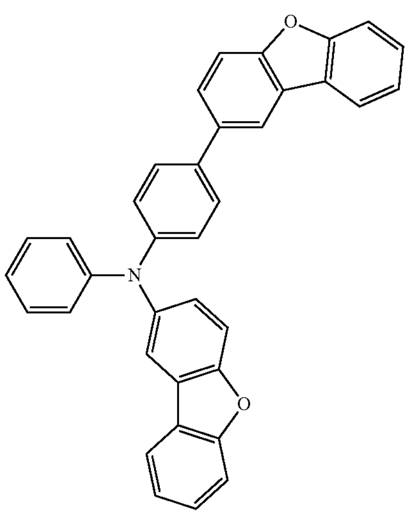
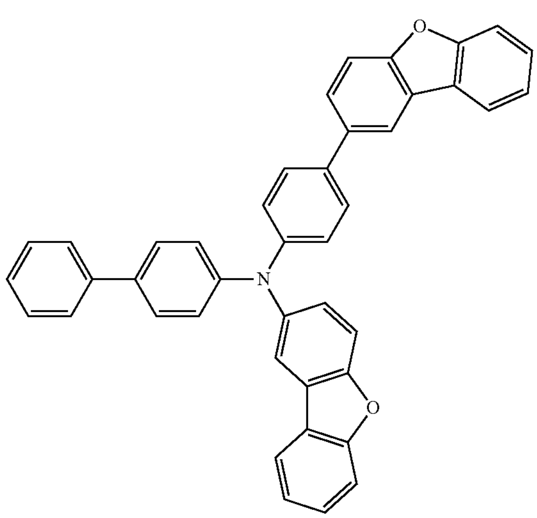
-continued
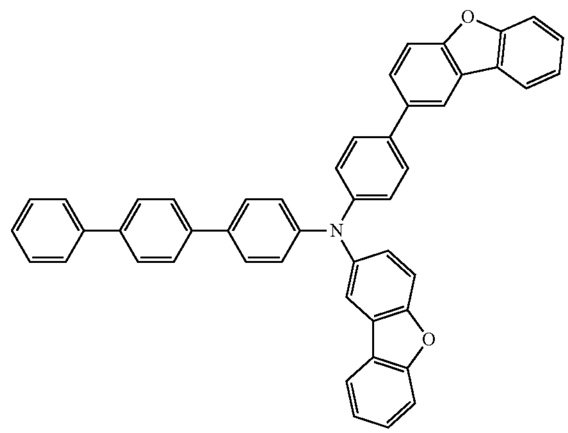
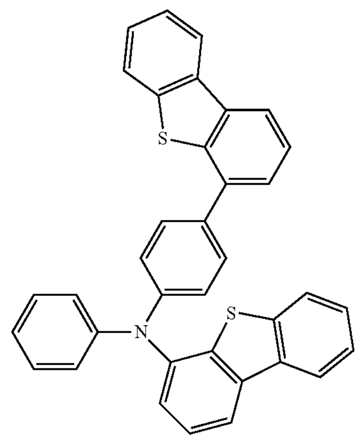
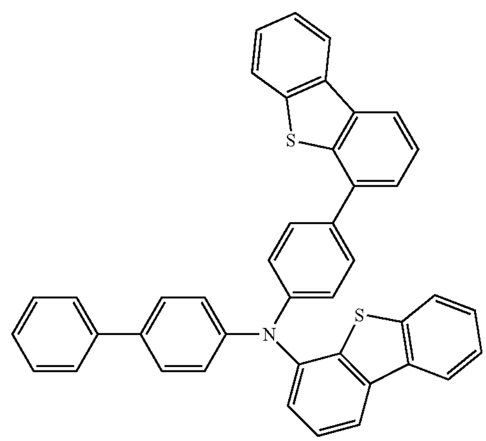
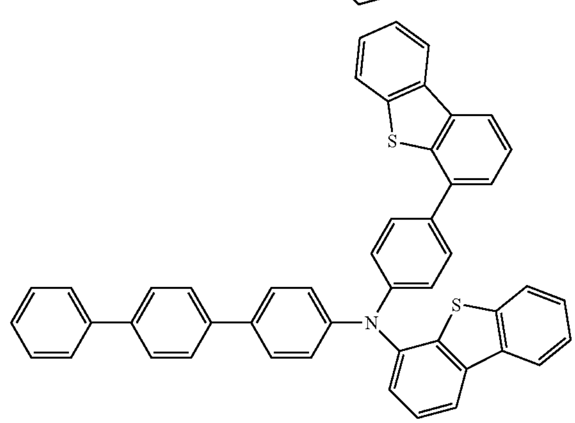

-continued
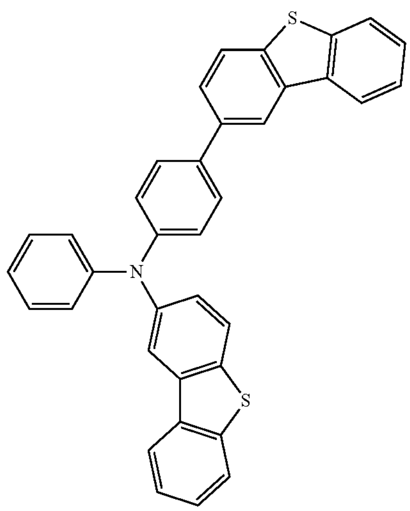
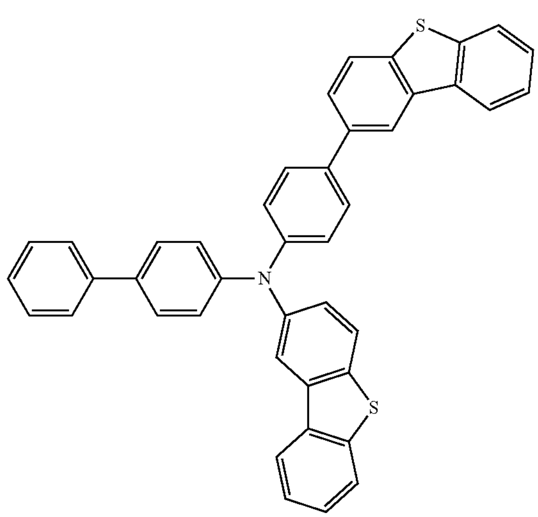
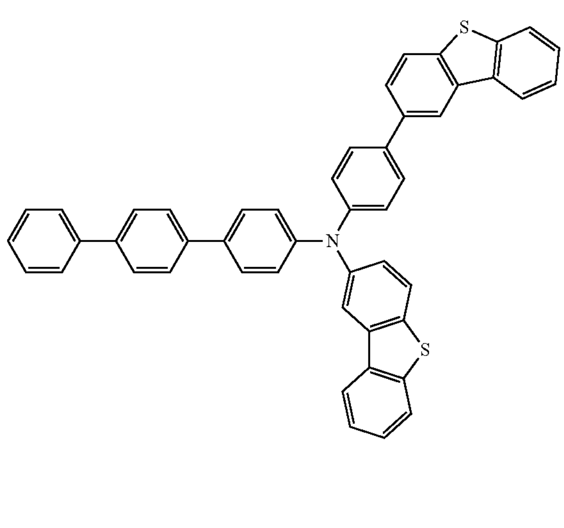
-continued
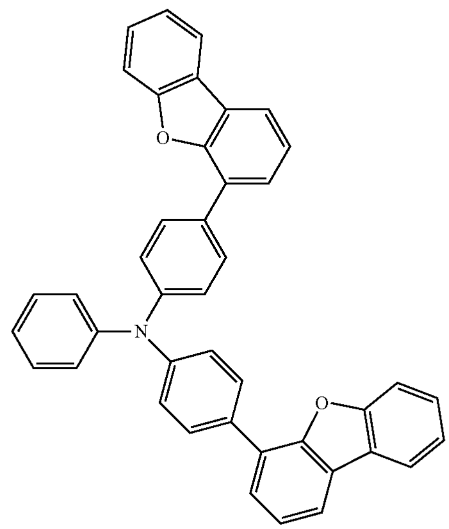
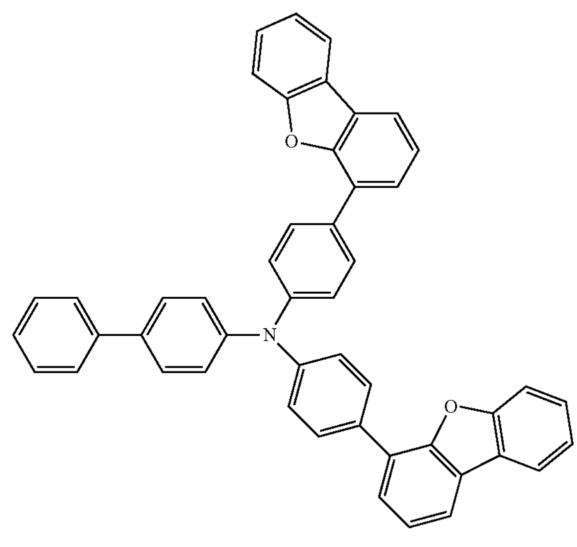
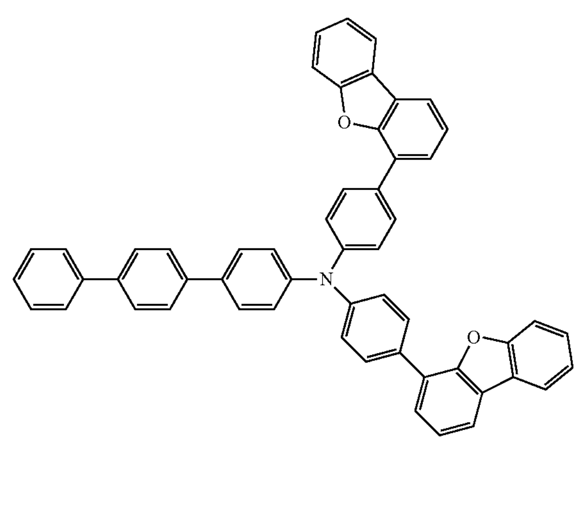

-continued
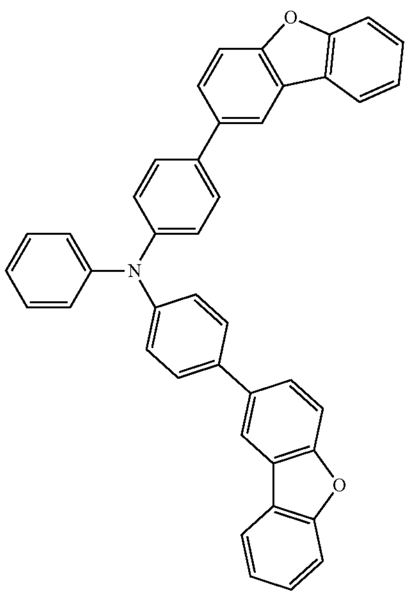
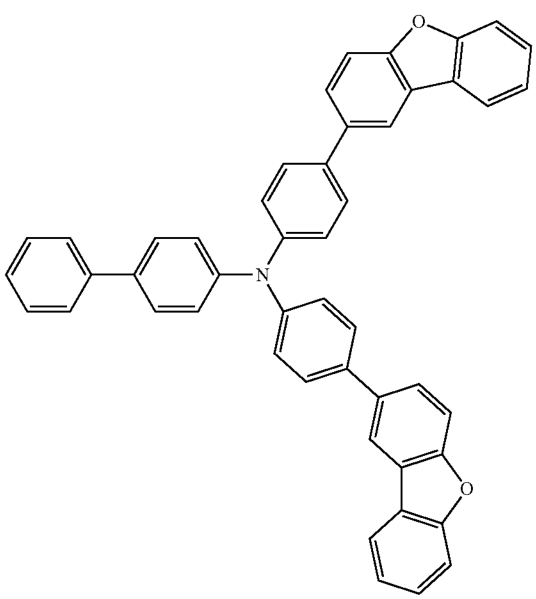
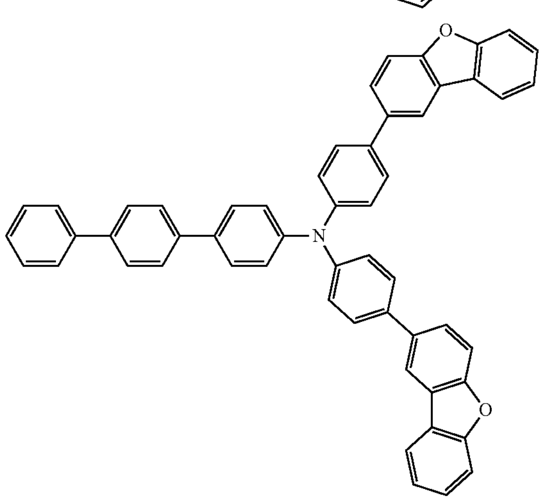
-continued
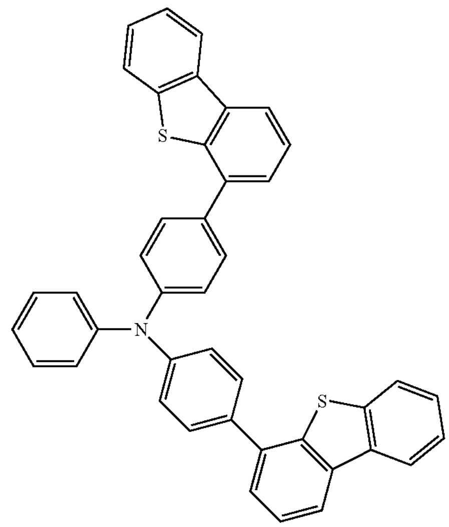
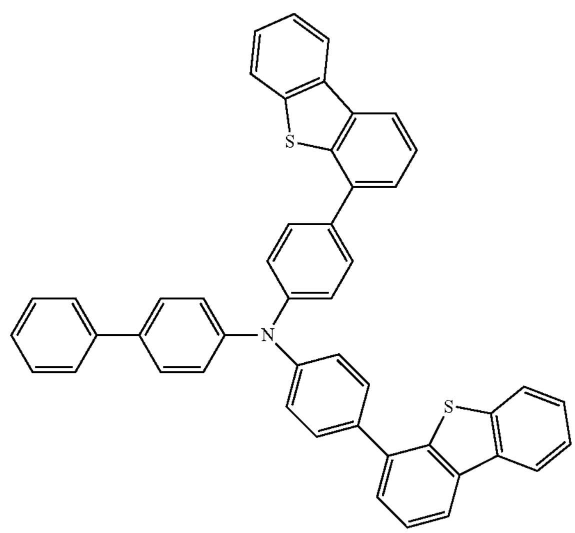
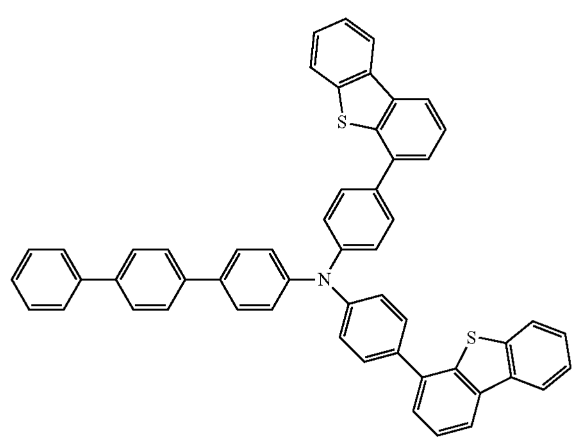

-continued
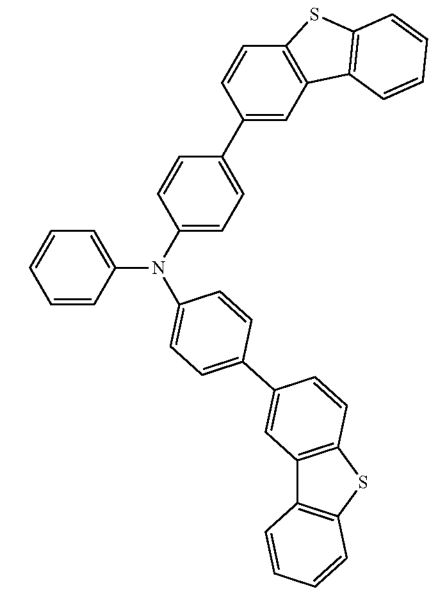
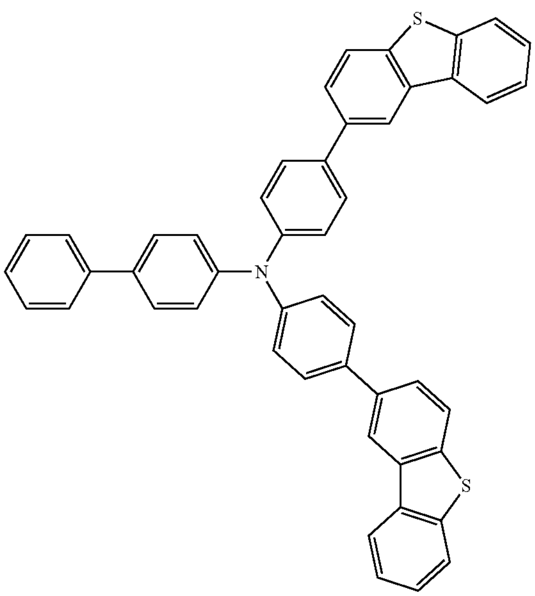
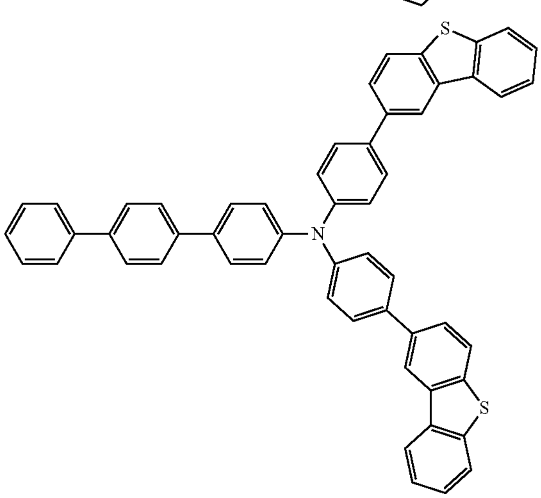
-continued
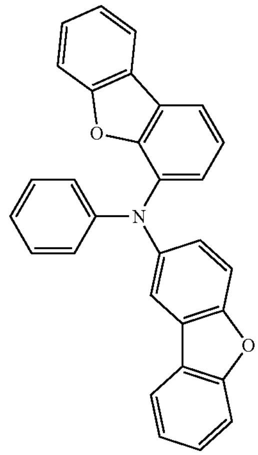
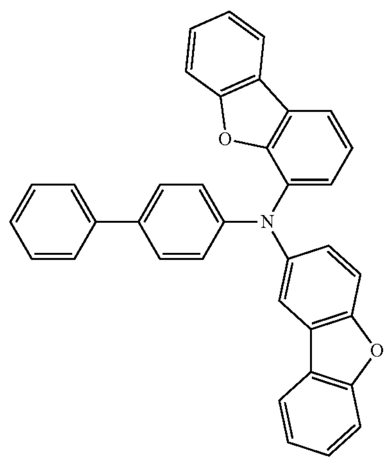
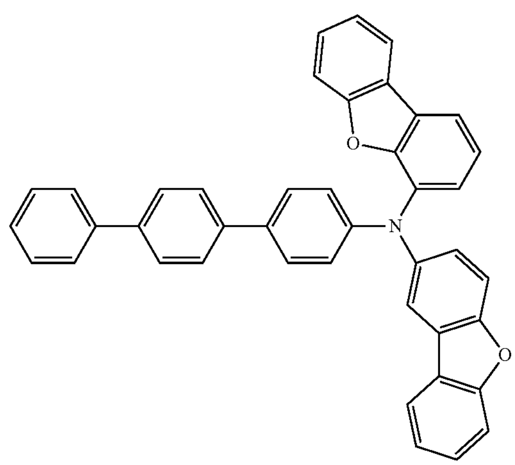

-continued
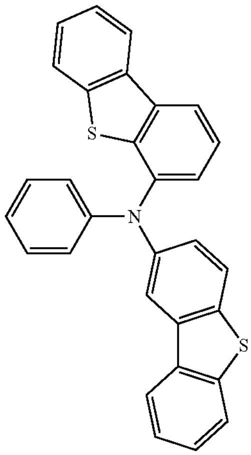
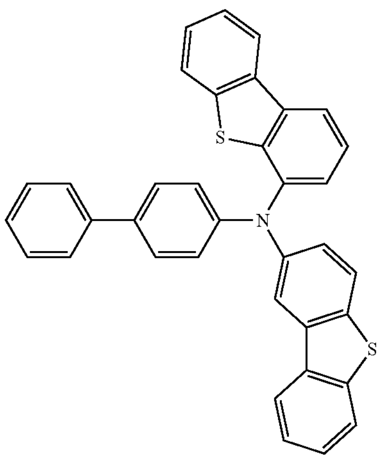
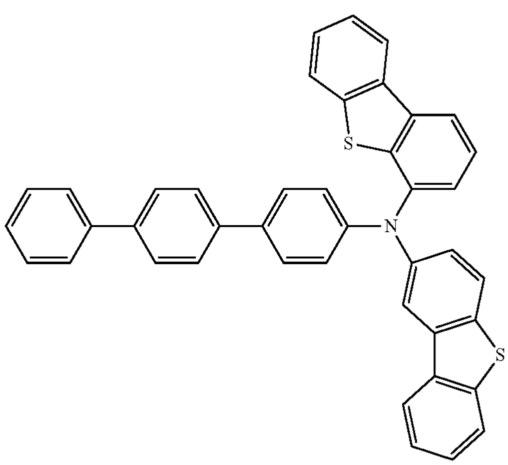
-continued
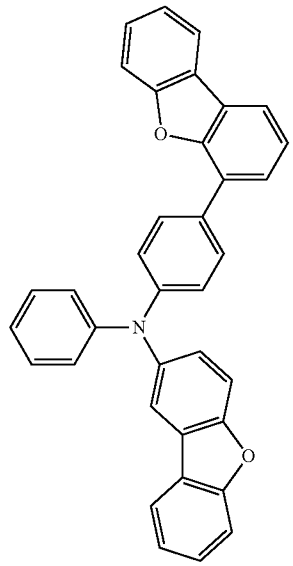
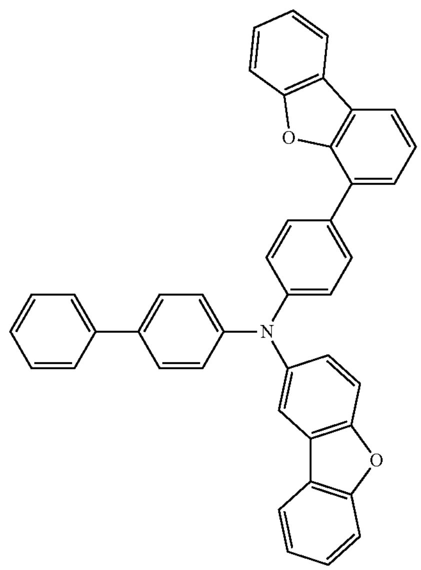
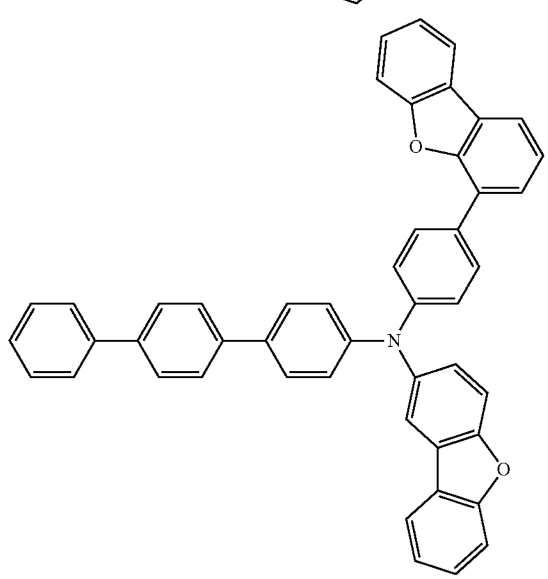

-continued
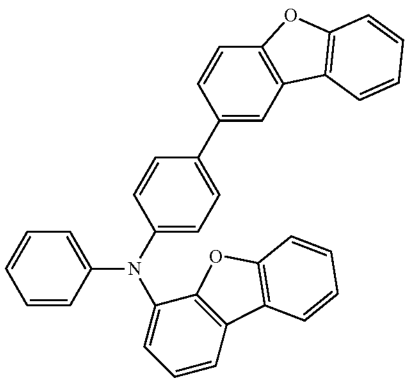
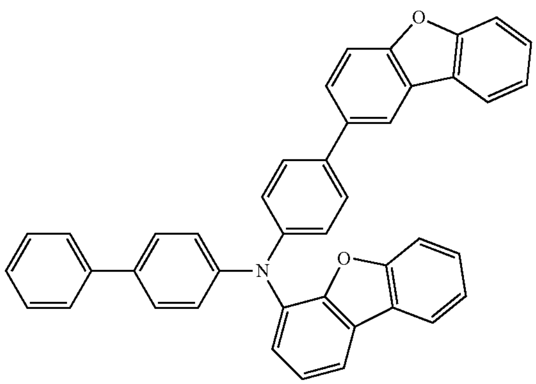
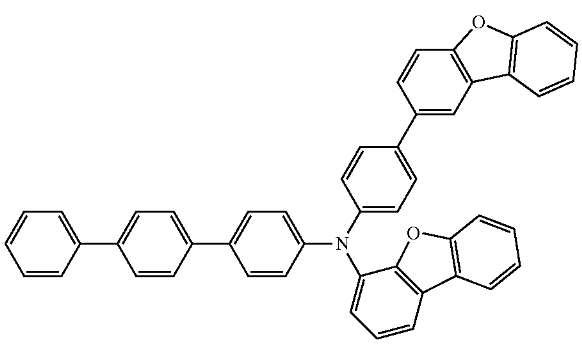
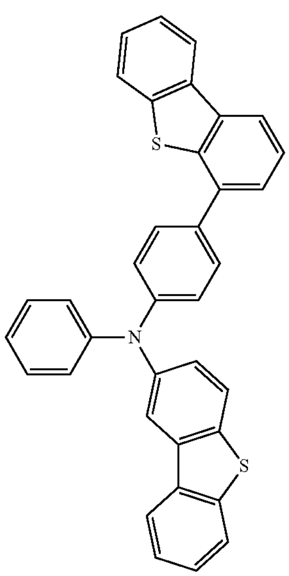
-continued
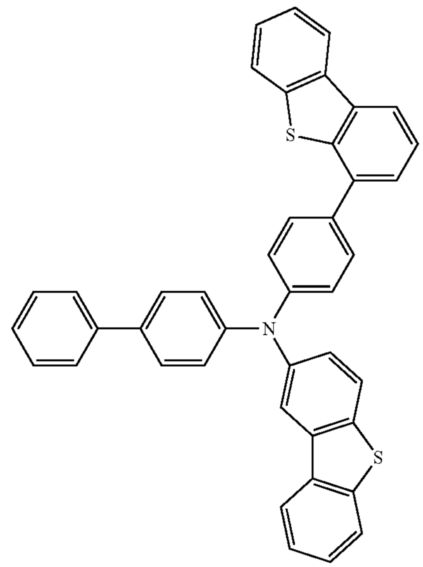
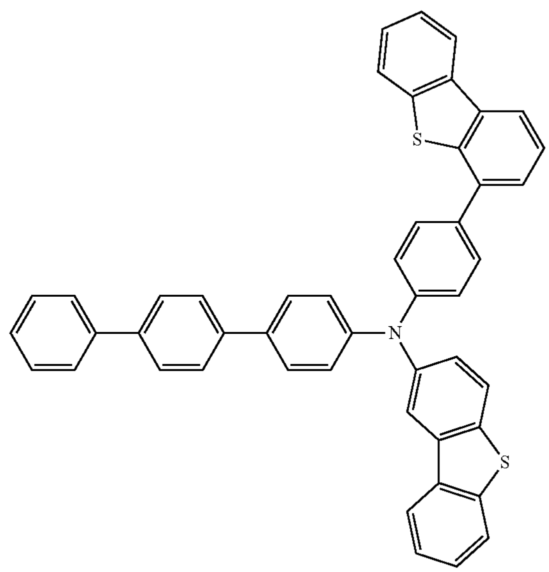
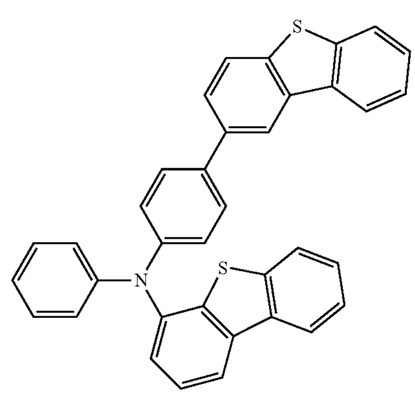

-continued
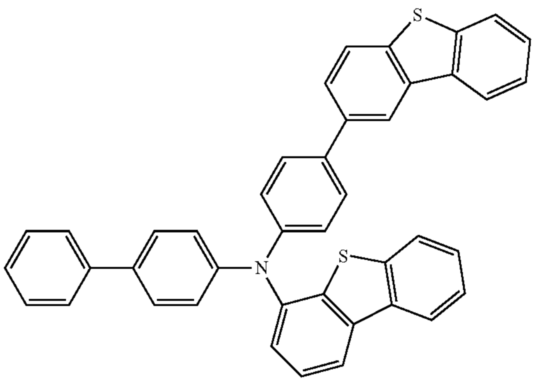
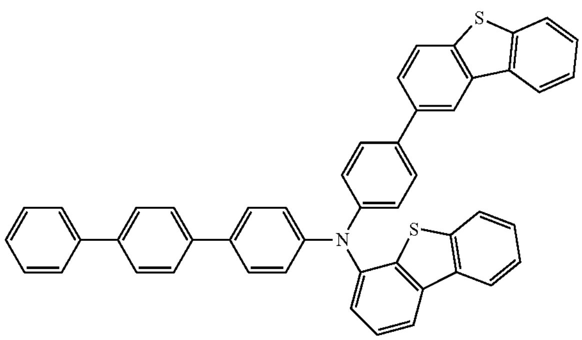
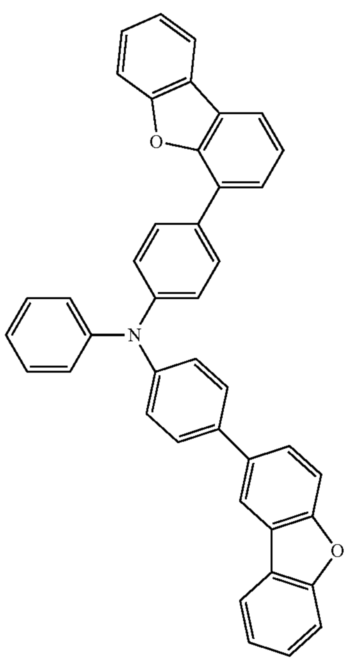
-continued
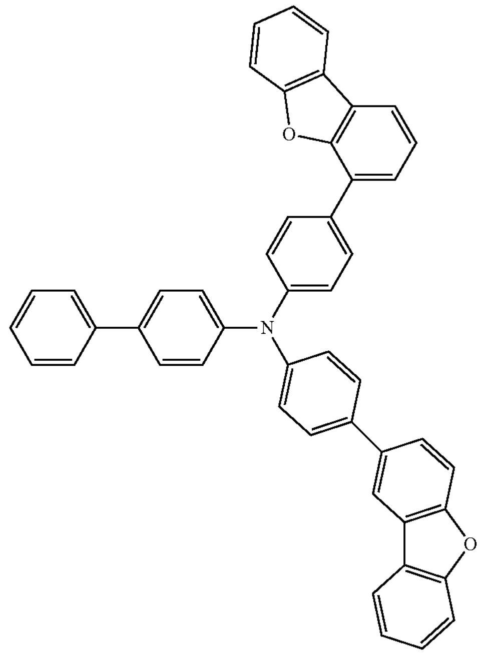
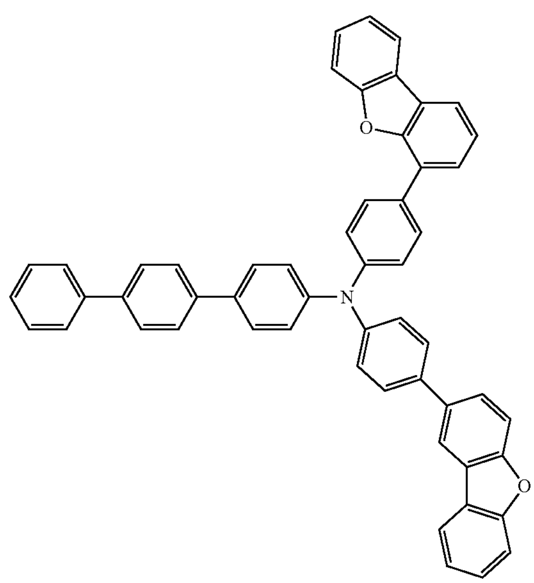

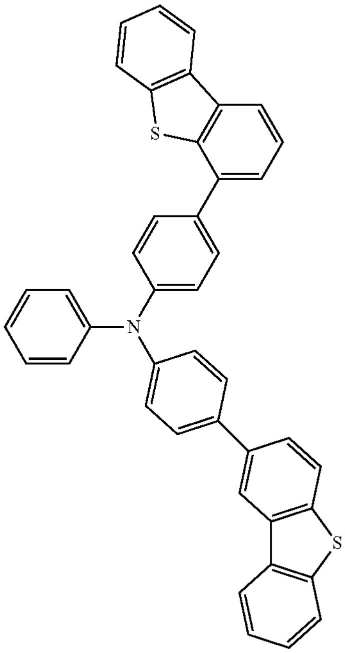
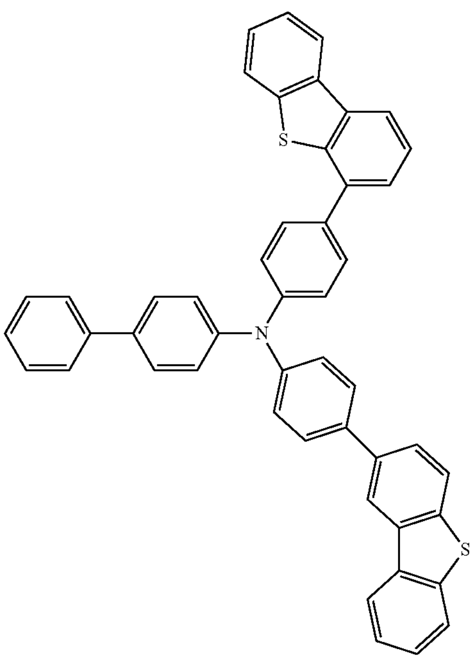
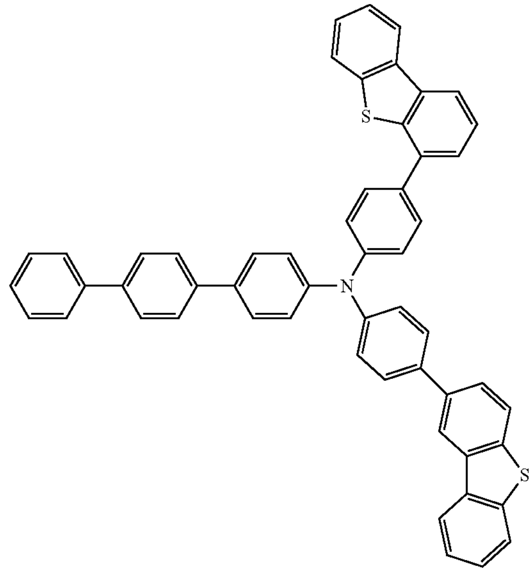
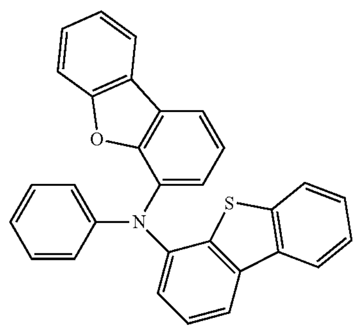
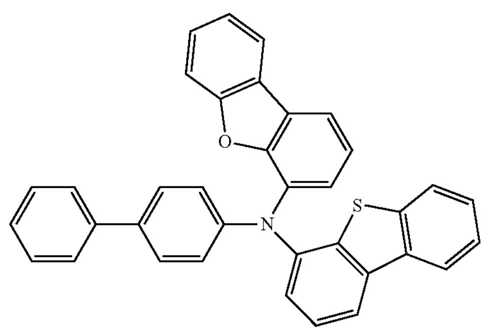
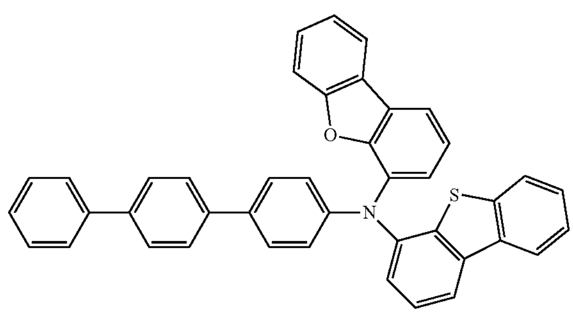

-continued
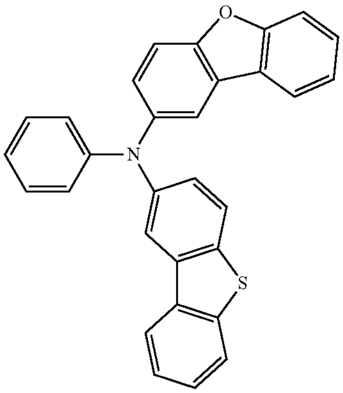
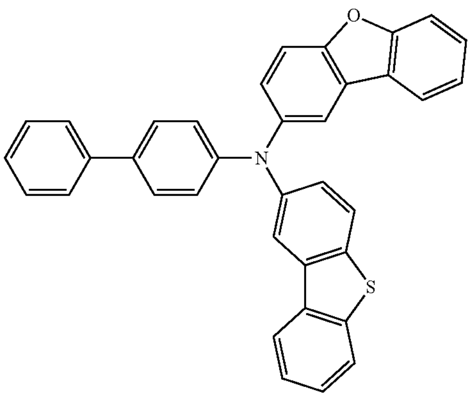
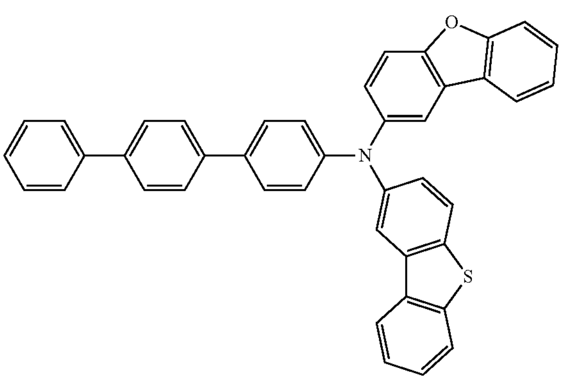
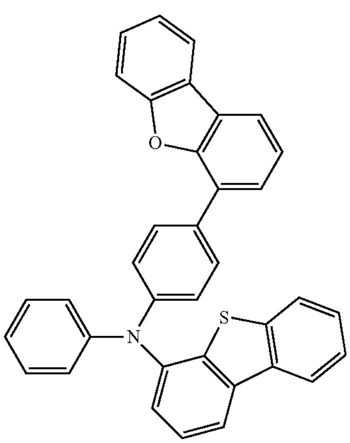
-continued
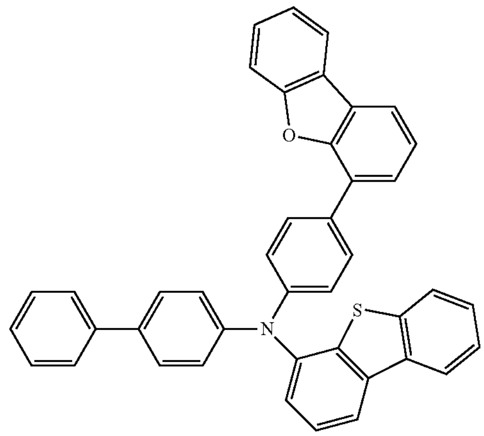
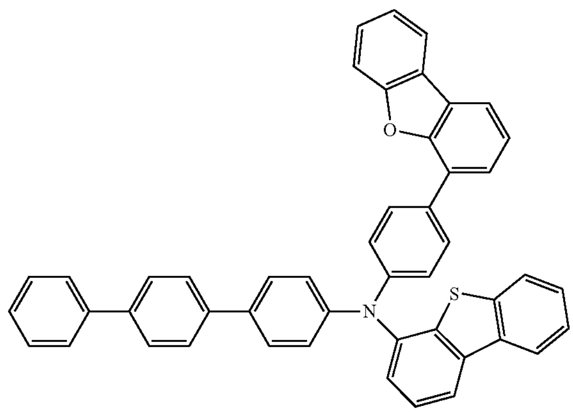
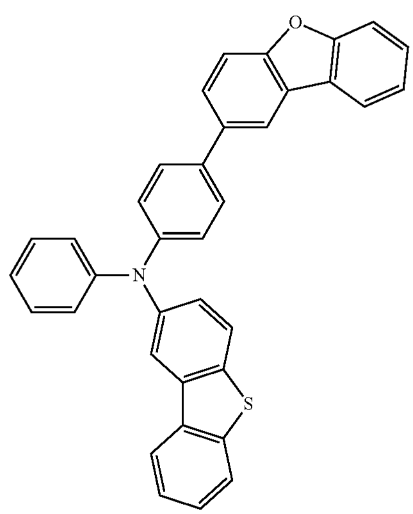

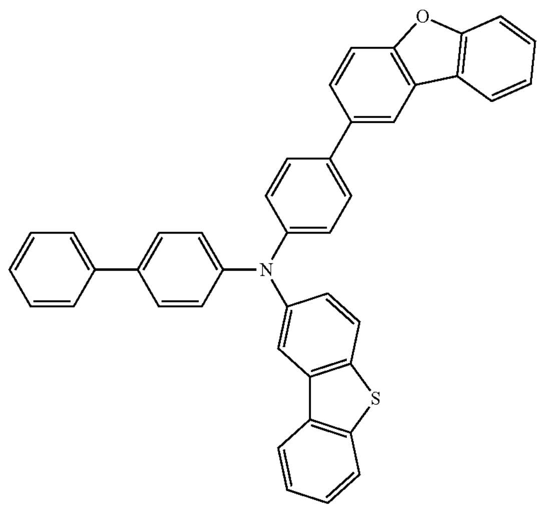
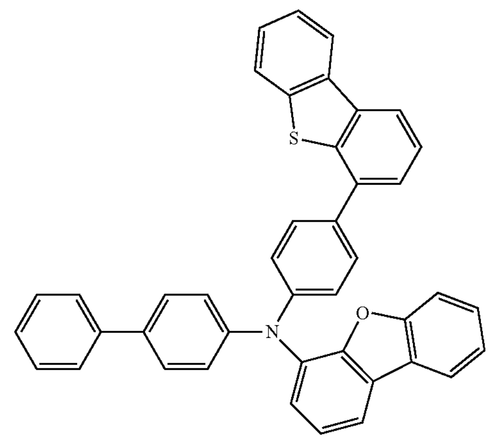
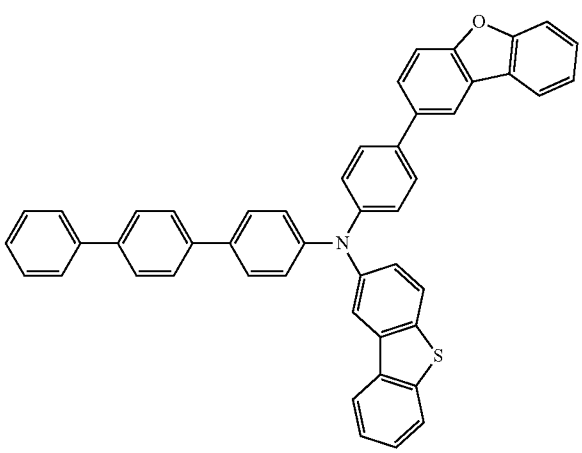
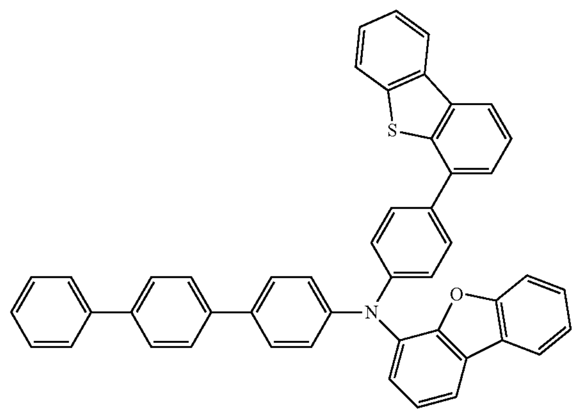
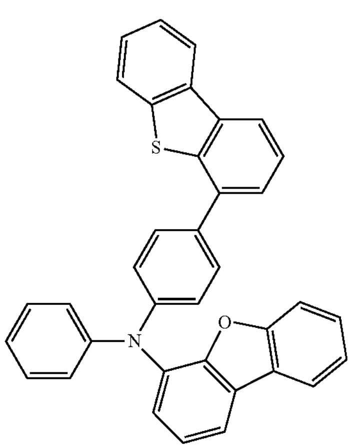
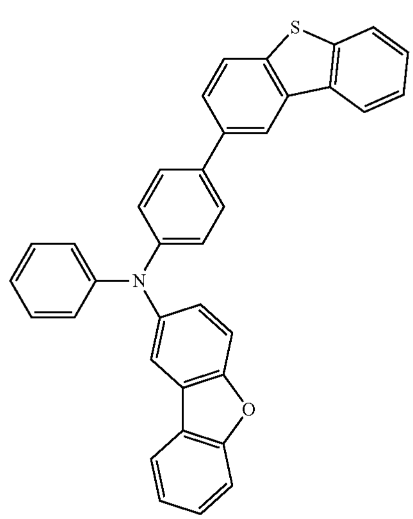

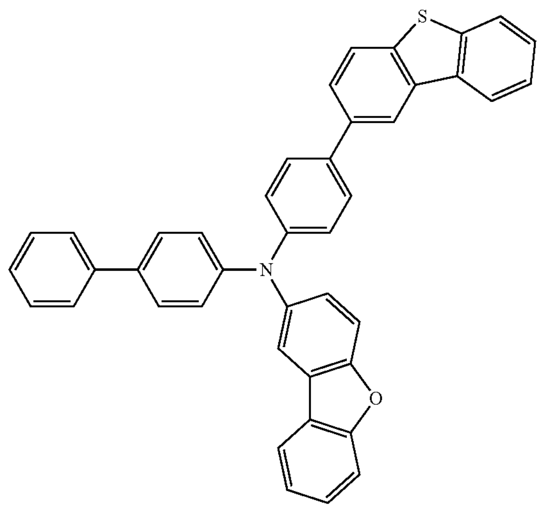
S
N
O
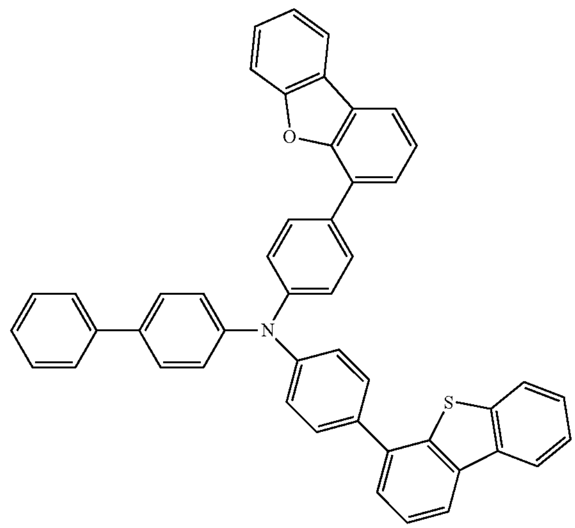
O
N
S
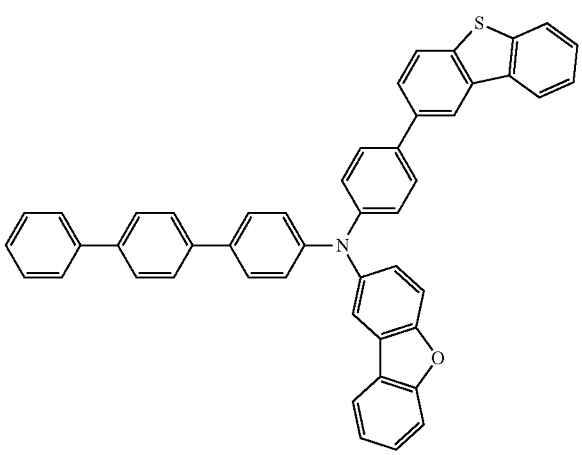
S
N
O
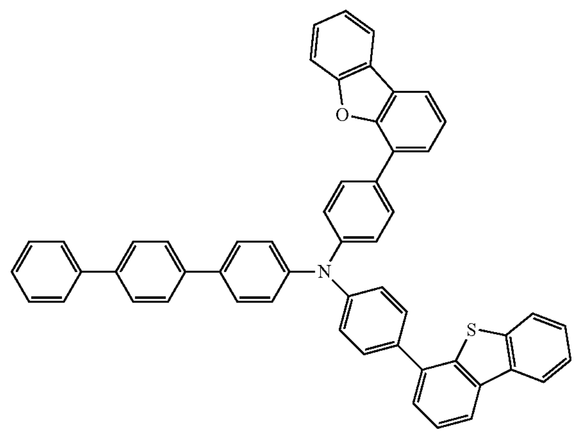
O
N
S
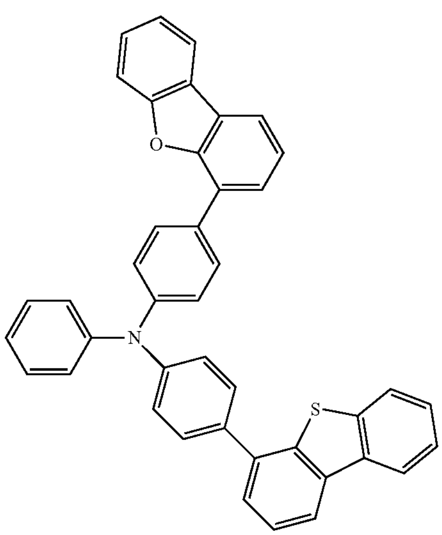
O
N
S
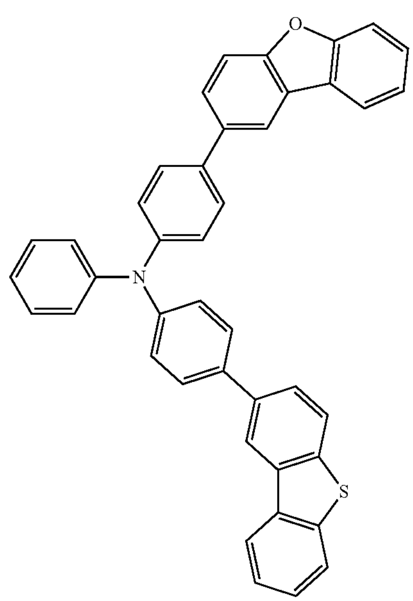
O
N
S -continued
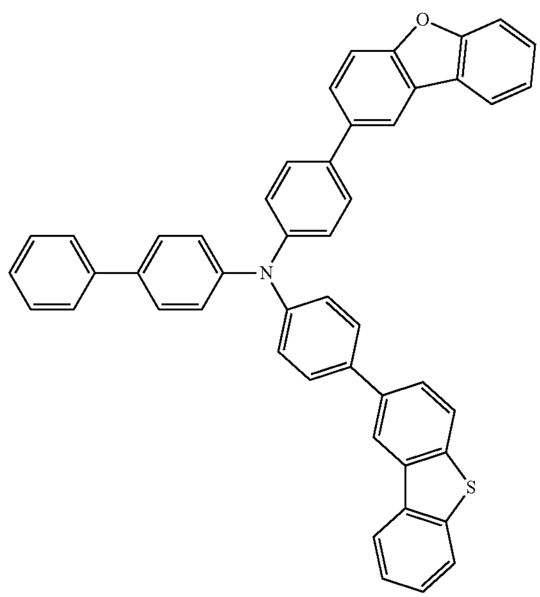
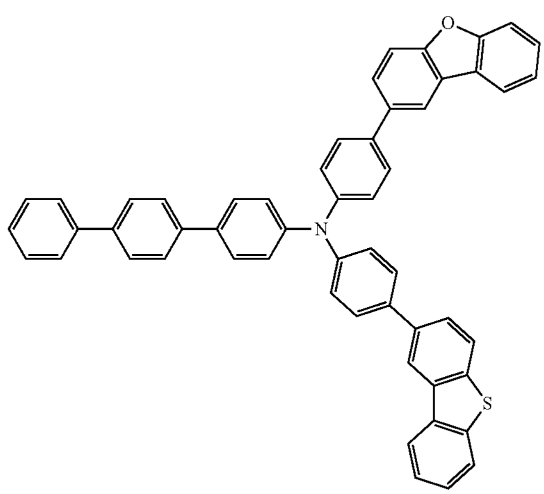
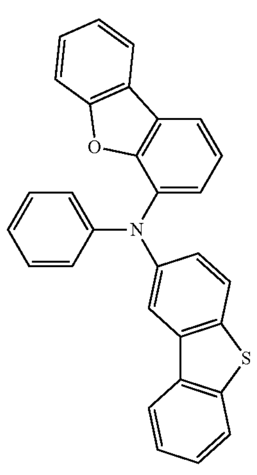
-continued
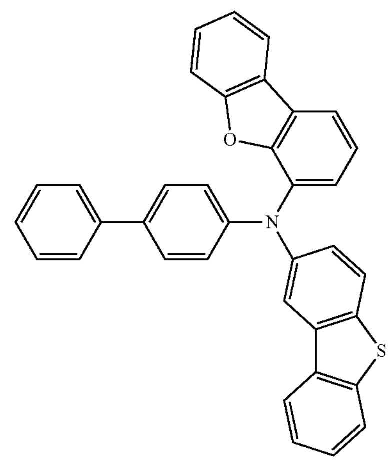
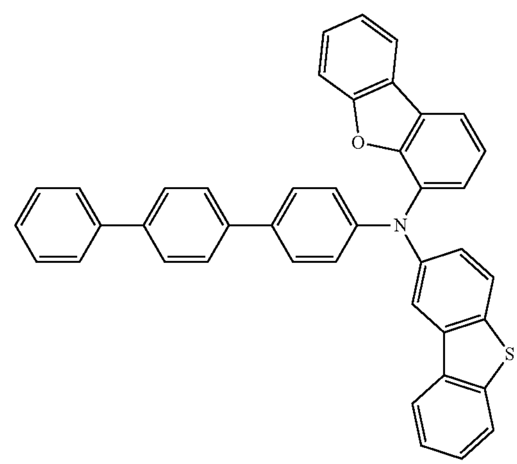
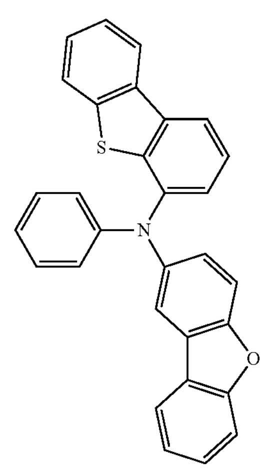

-continued
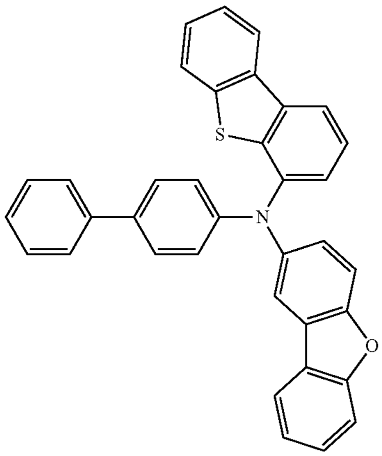
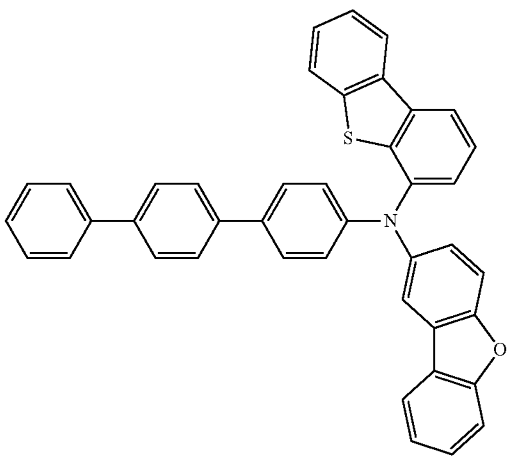
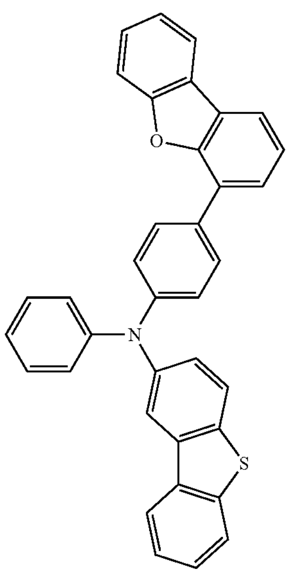
-continued
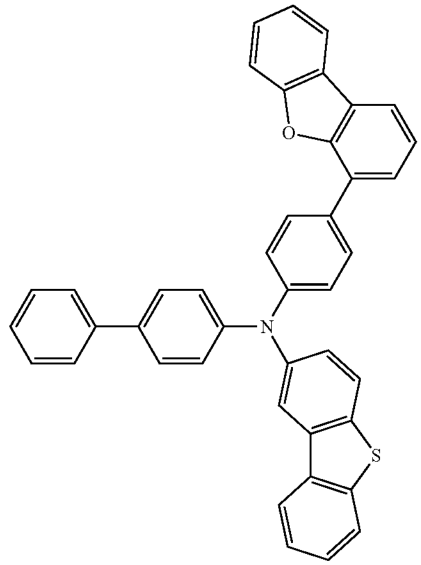
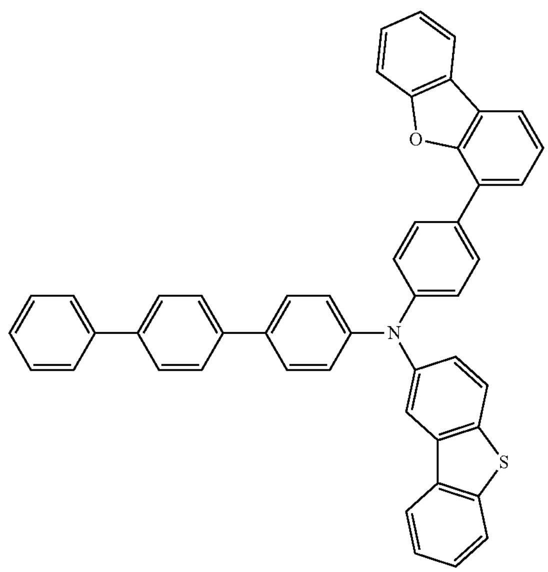
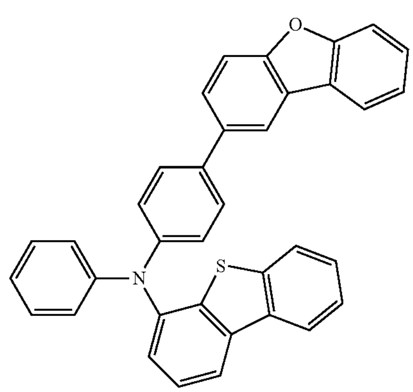

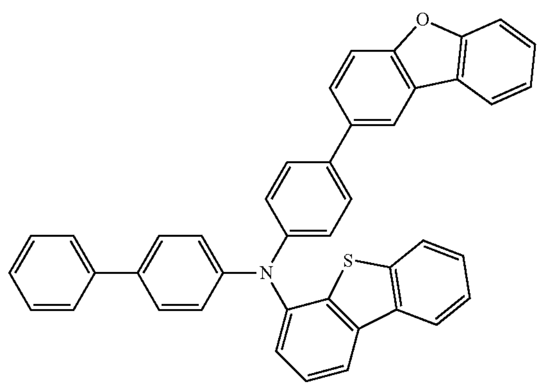
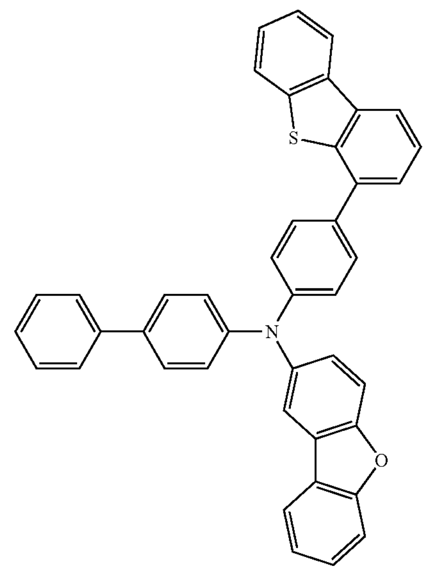
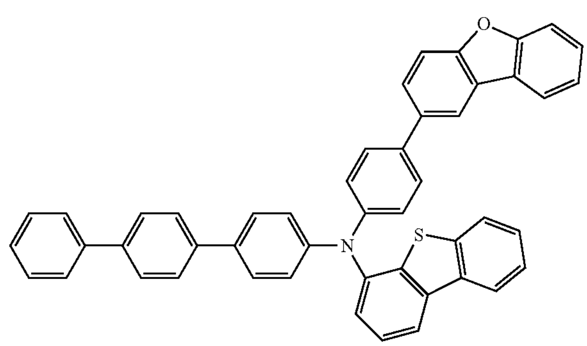
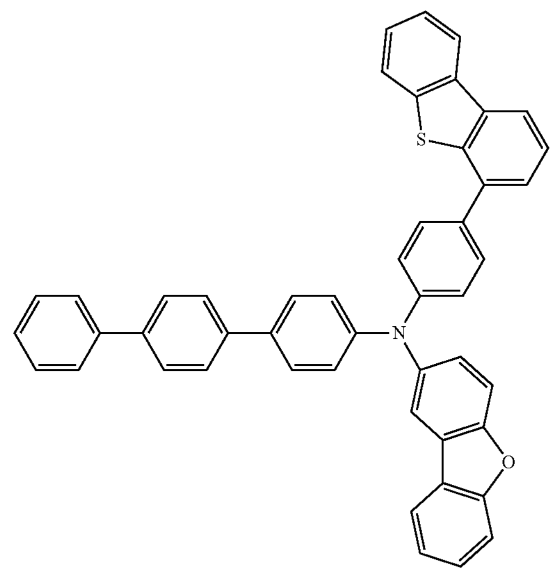
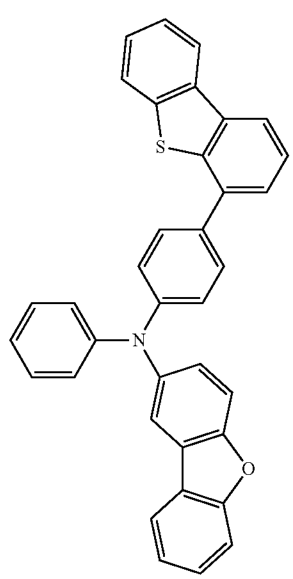
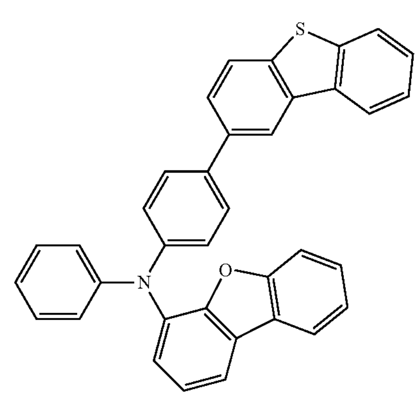
S
O

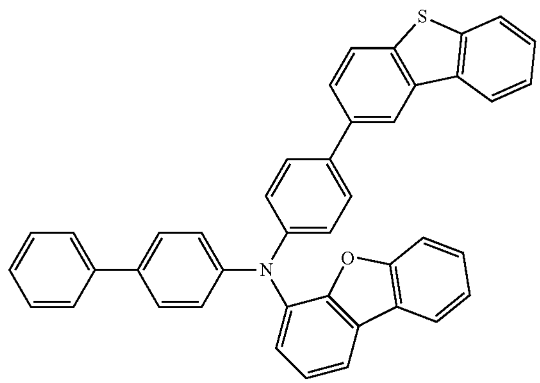
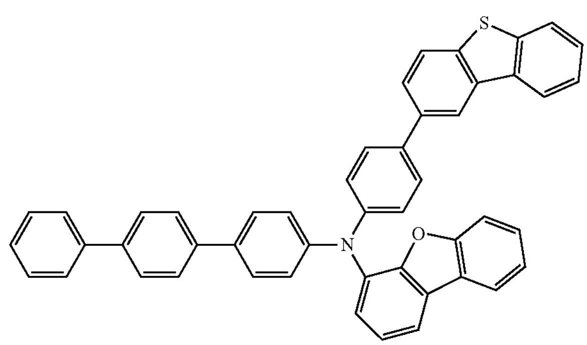
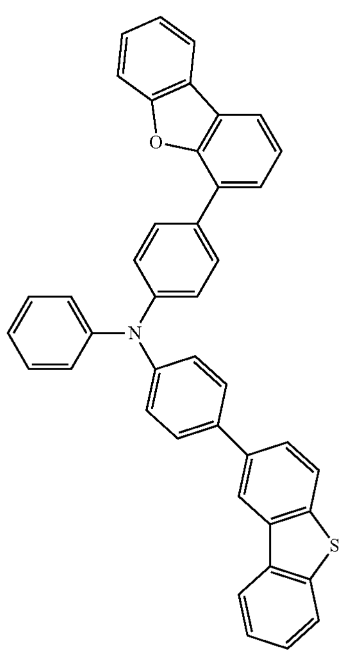
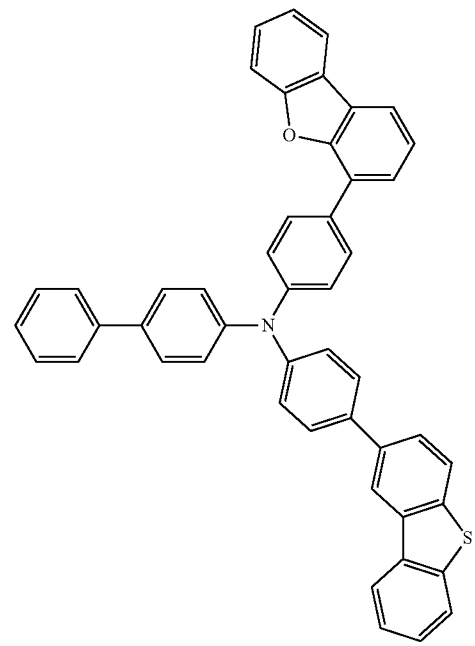
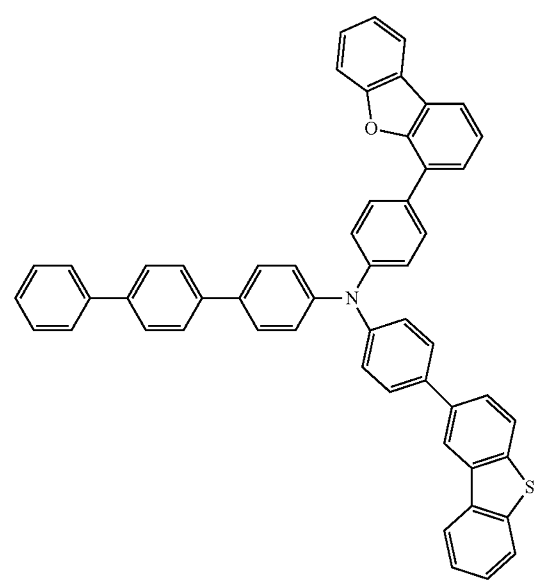

-continued
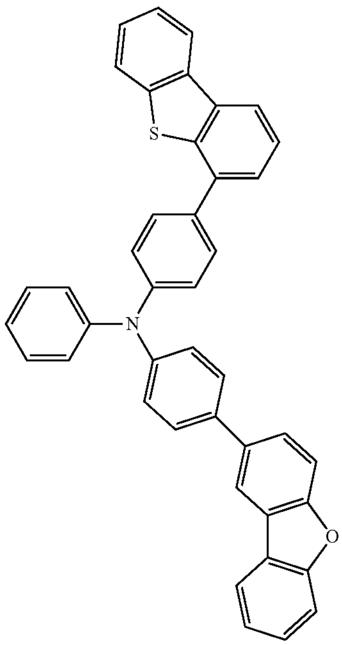
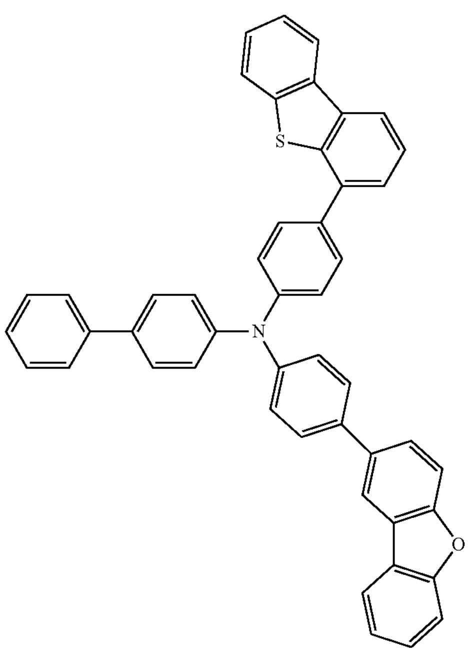
-continued
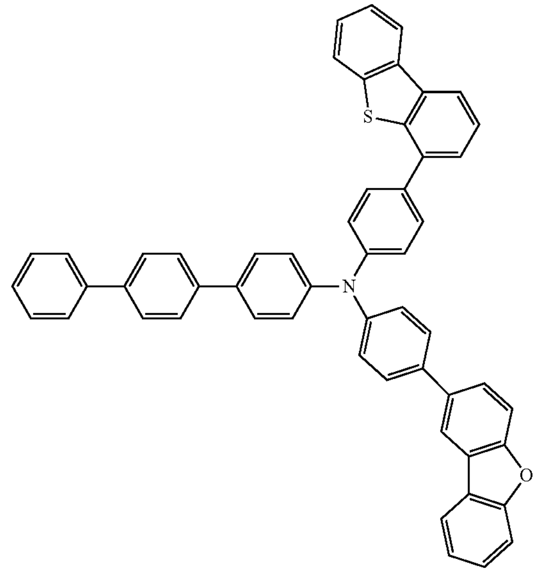
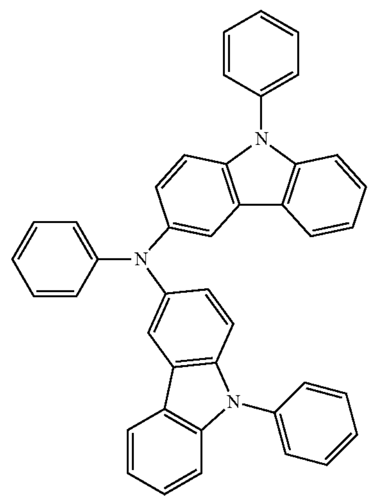
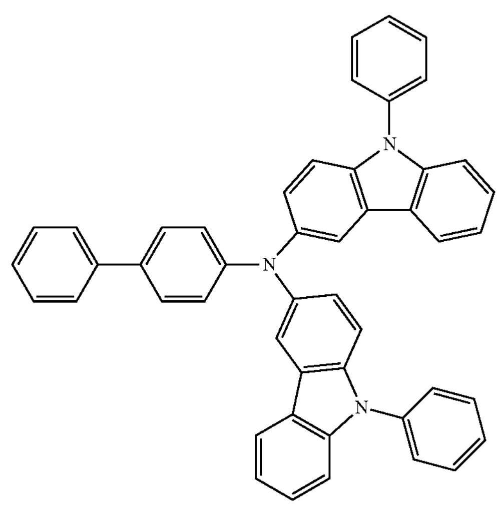

-continued
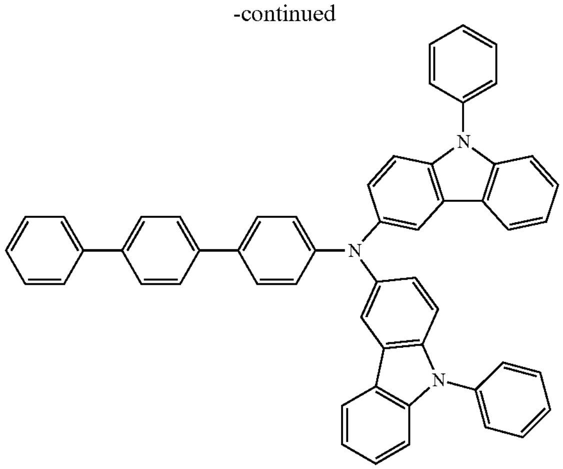
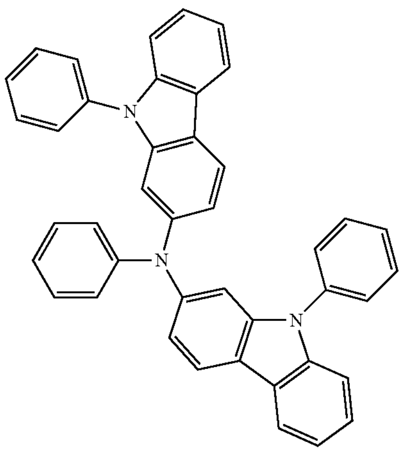
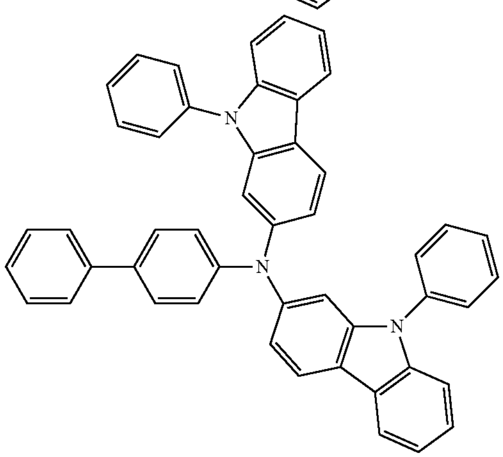
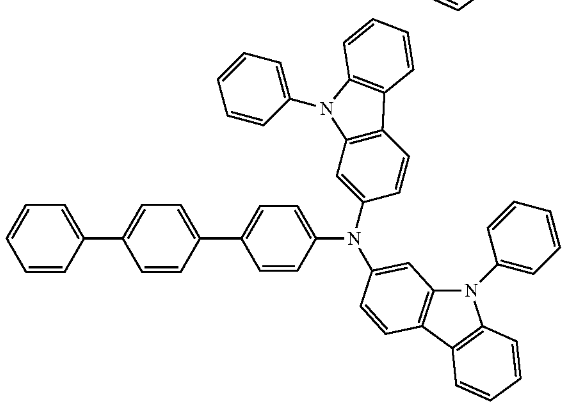
-continued
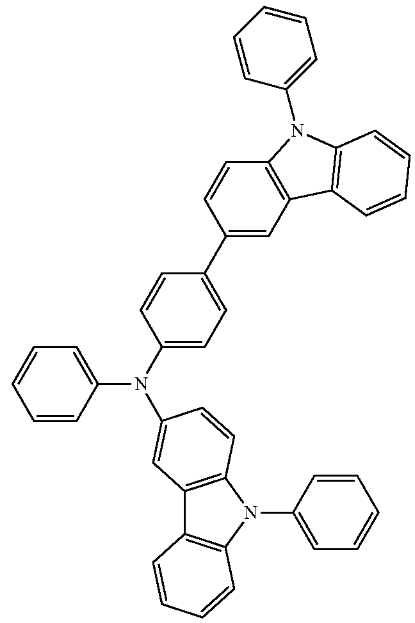
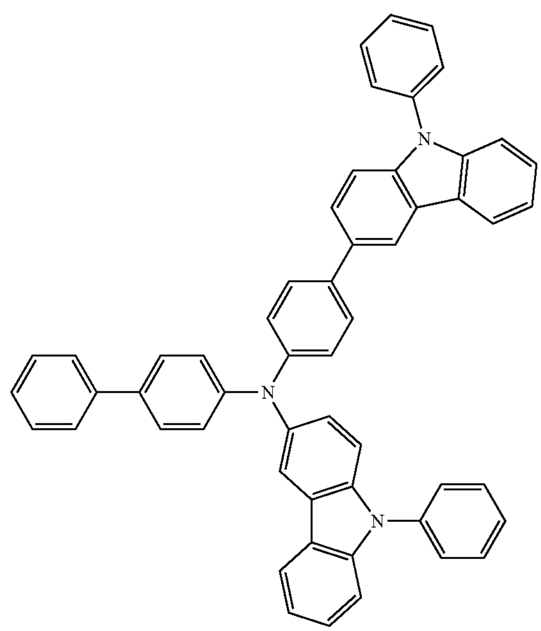

-continued
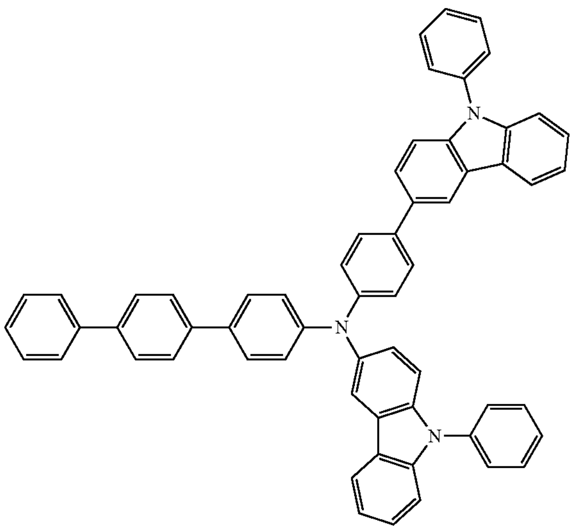
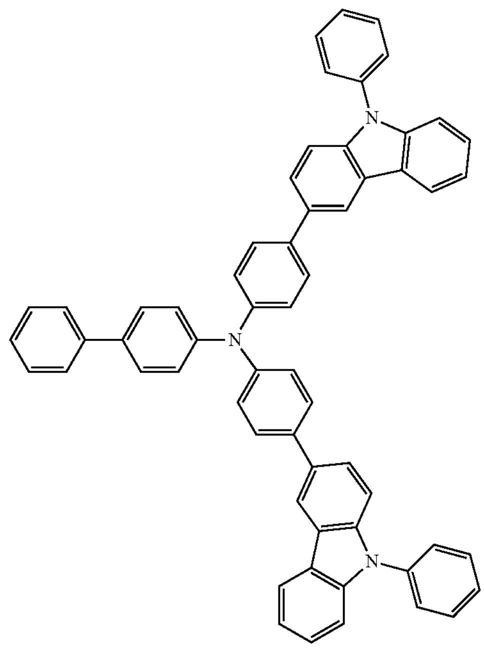
-continued
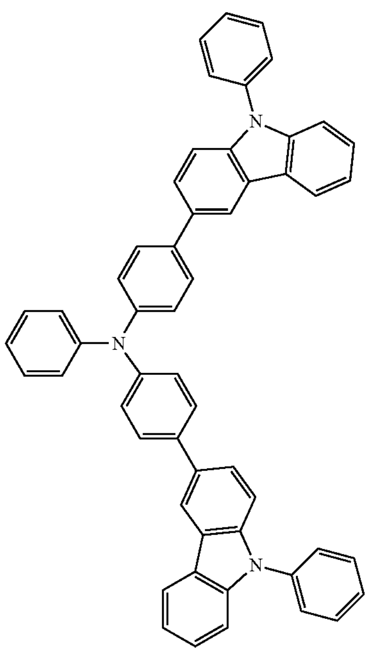
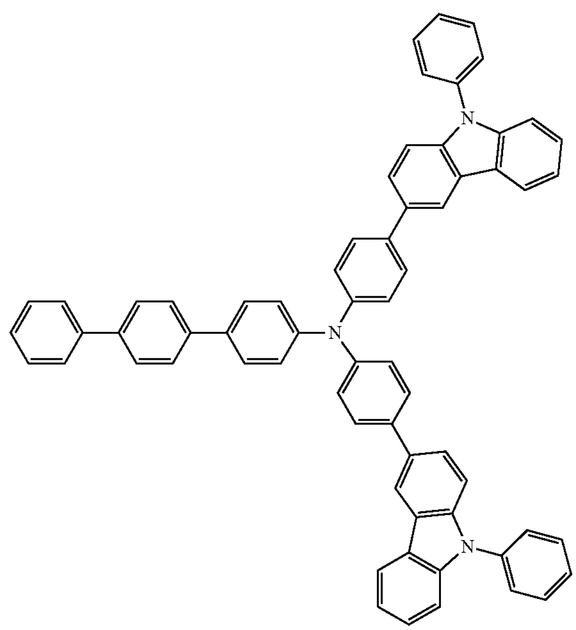

-continued
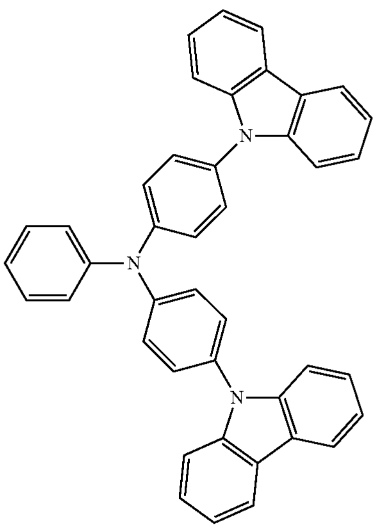
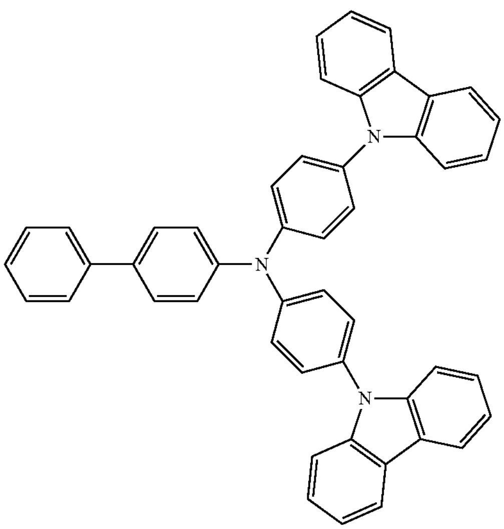
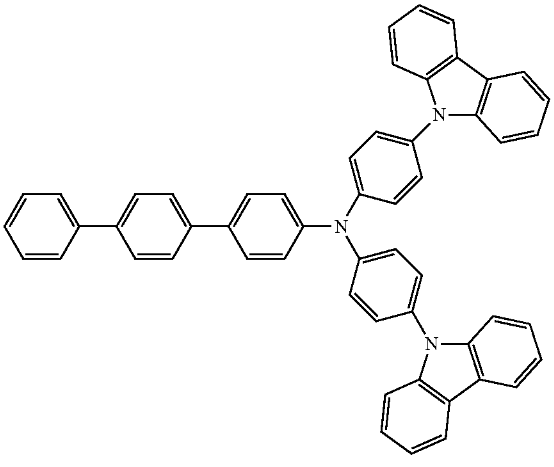
-continued
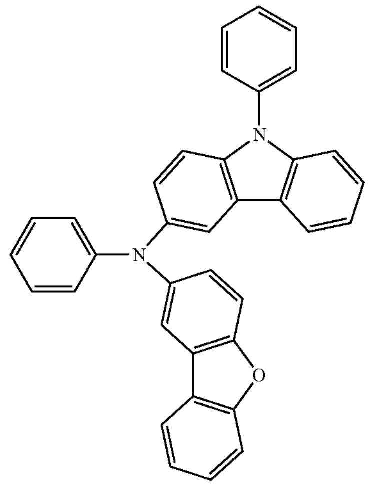
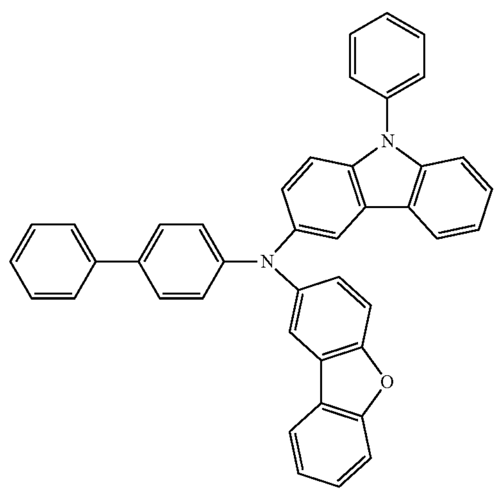
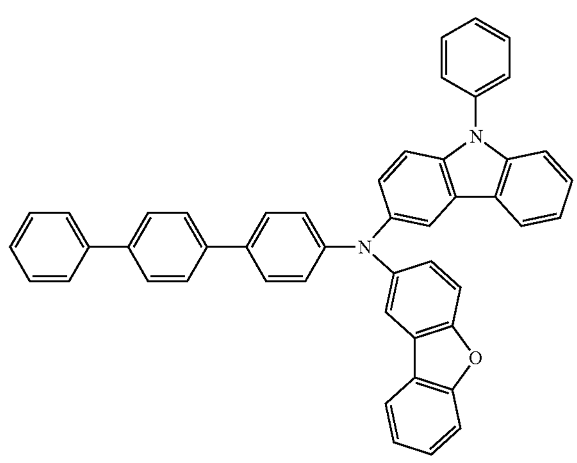

-continued
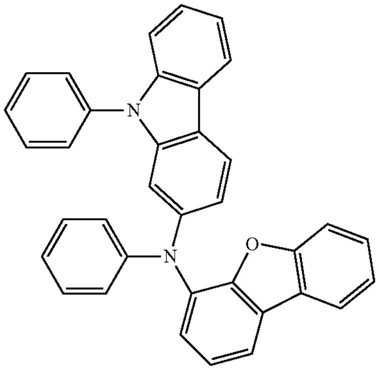
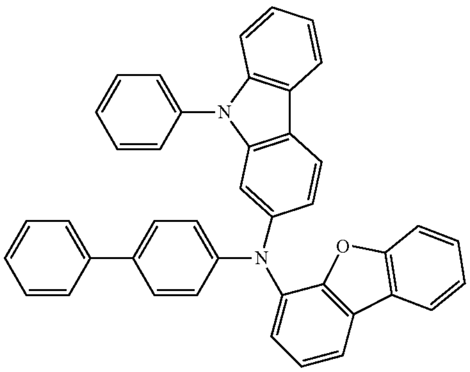
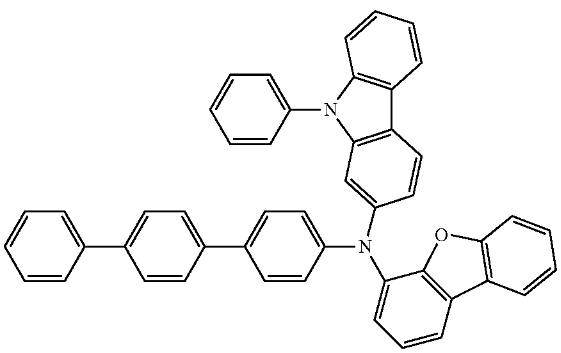
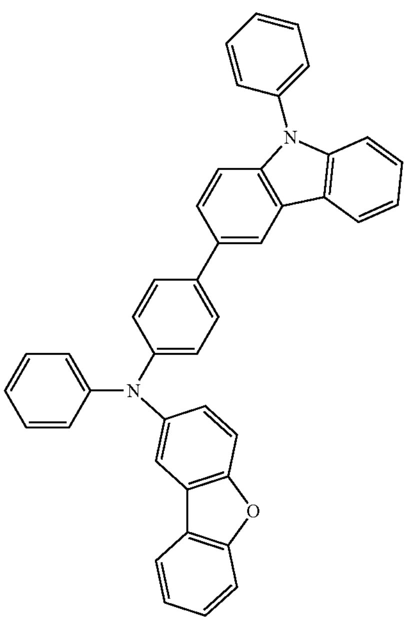
-continued
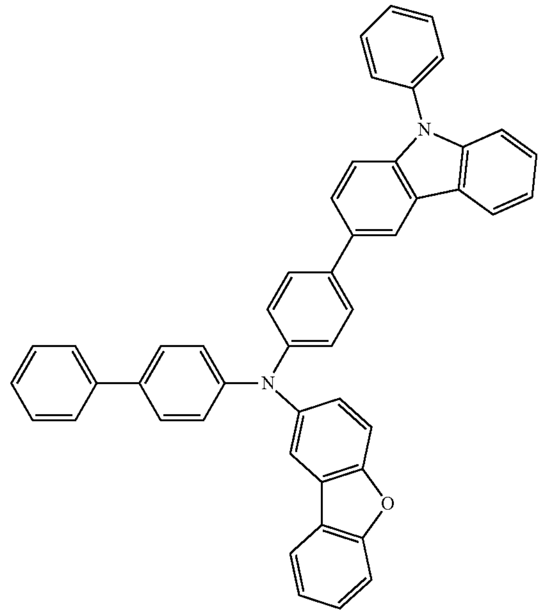
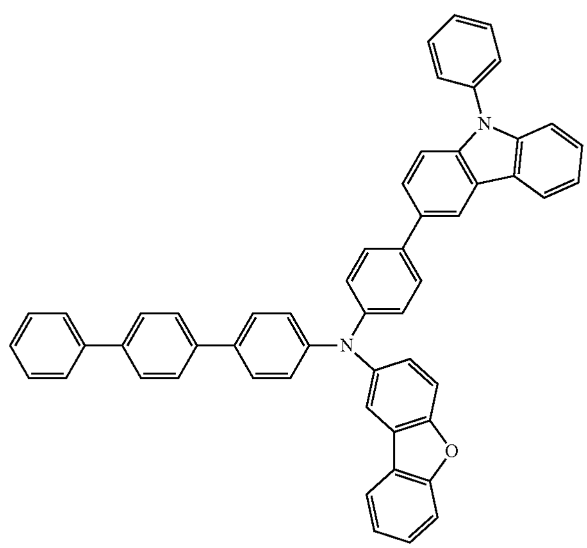

-continued
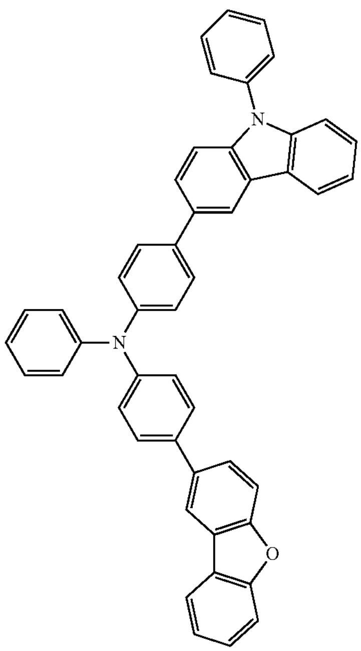
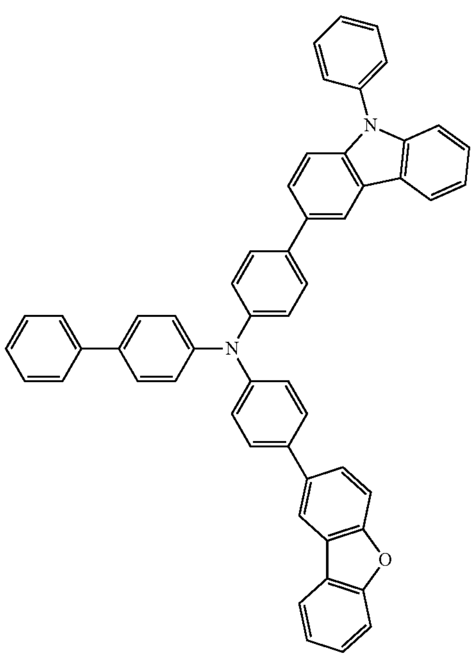
-continued
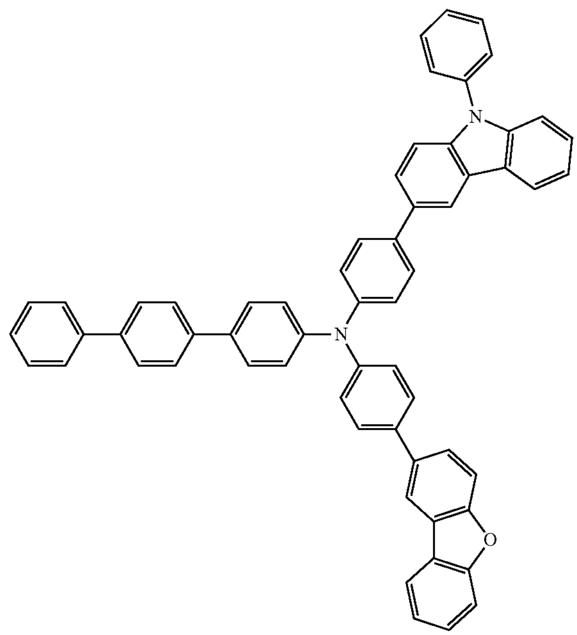
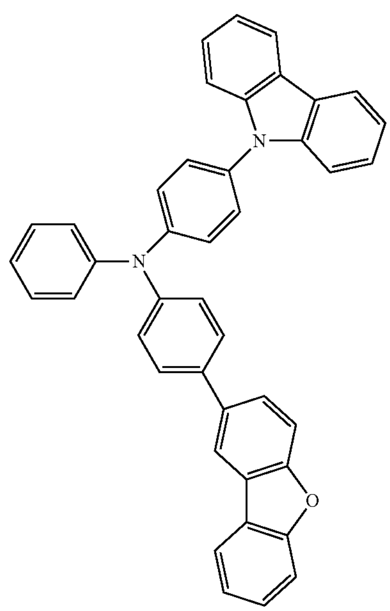

-continued
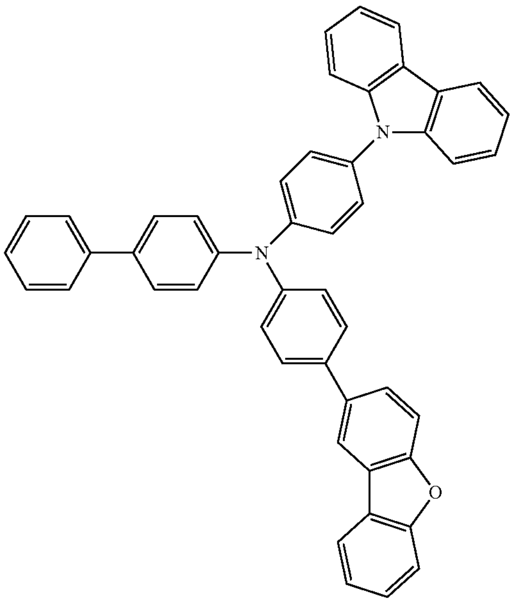
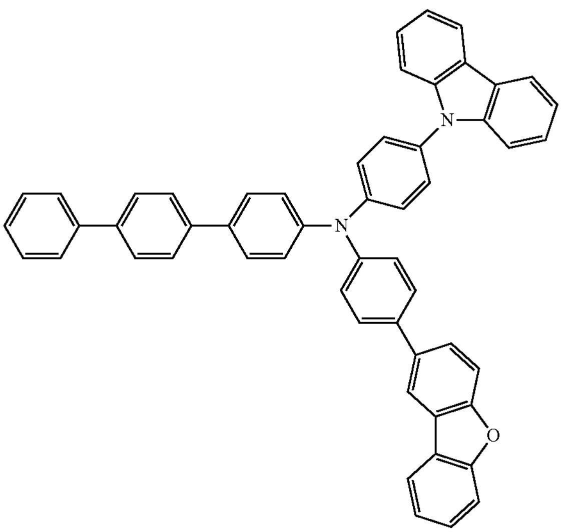
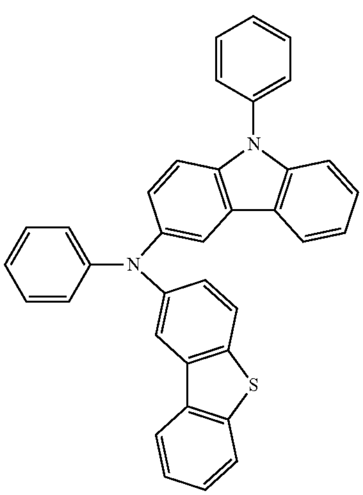
-continued
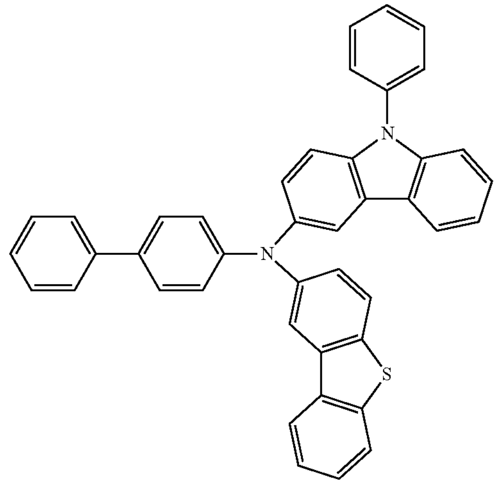
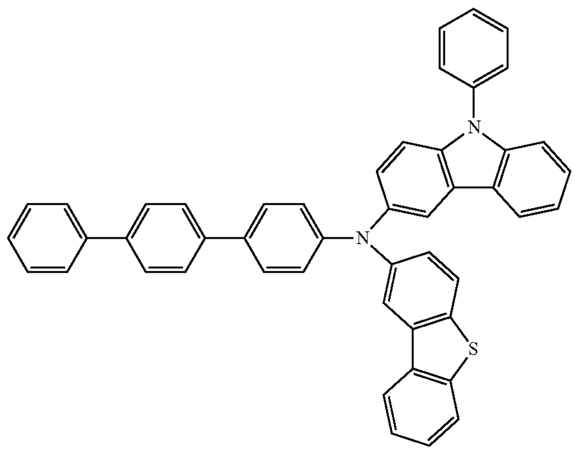
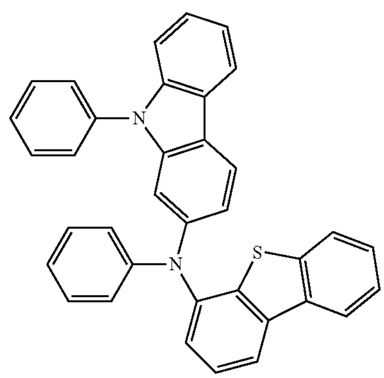
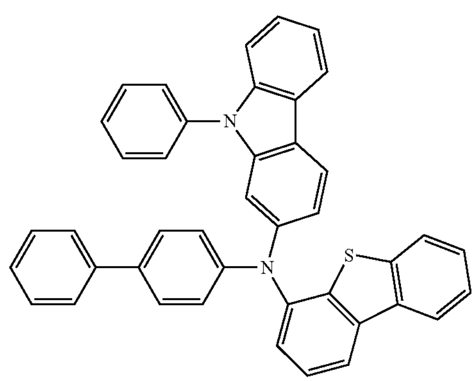

-continued
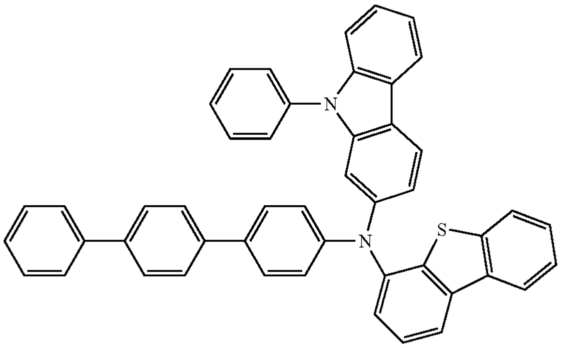
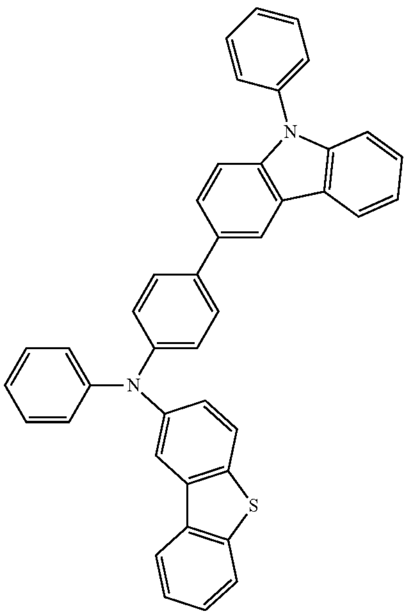
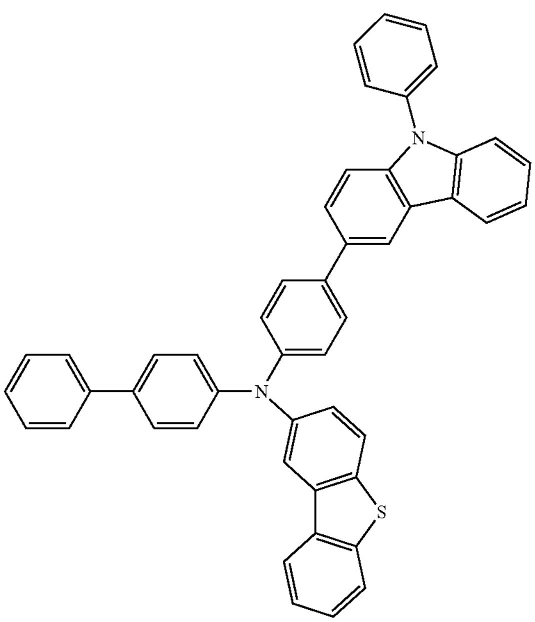
-continued
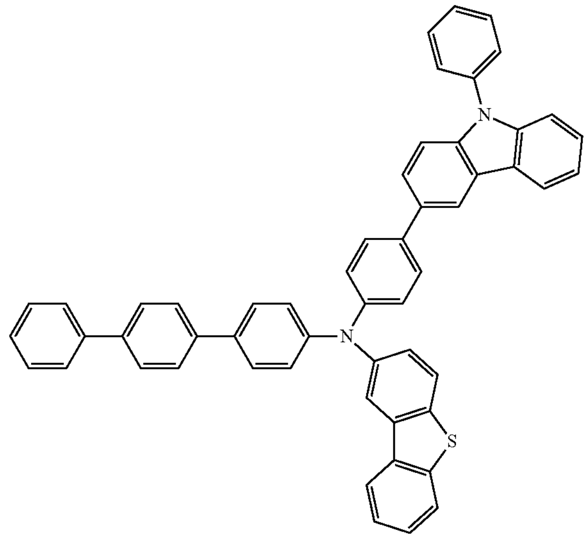
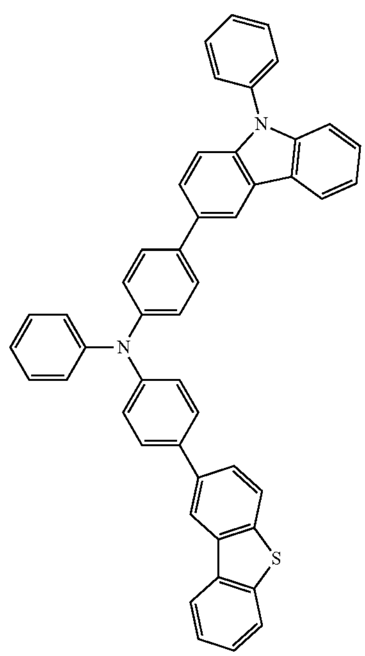

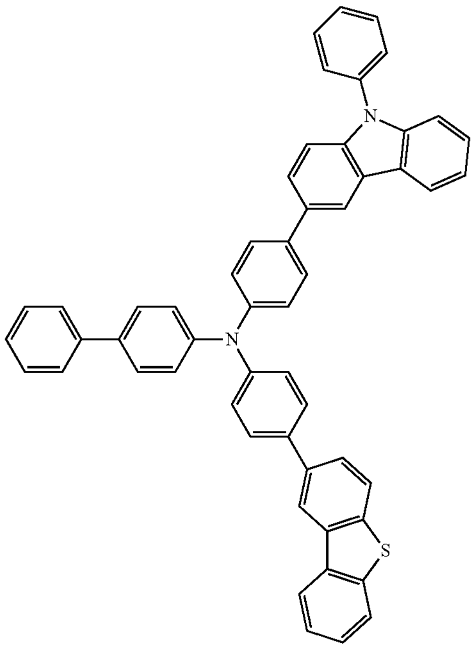
S
N
N
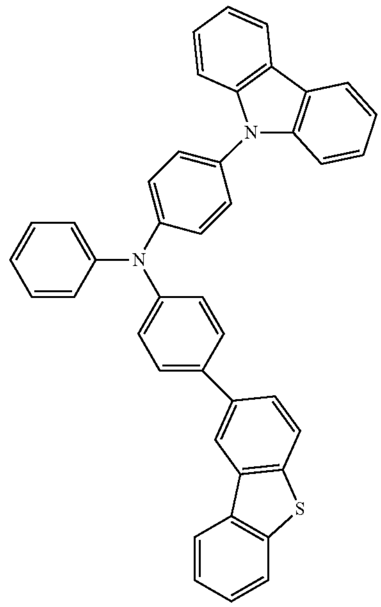
S
N
N
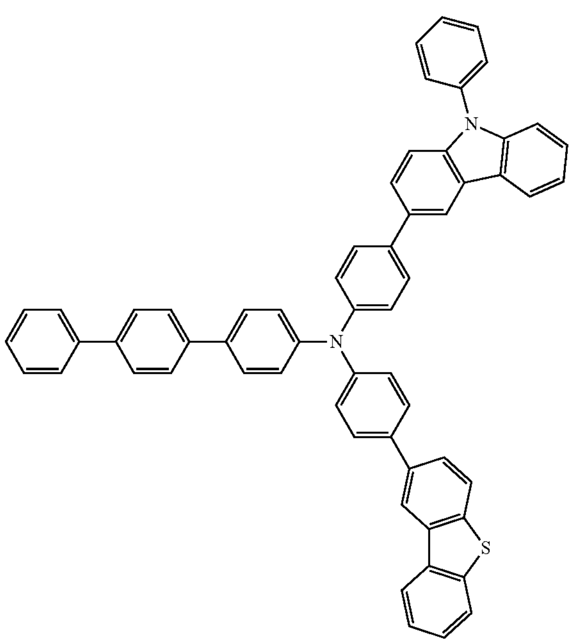
S
N
N
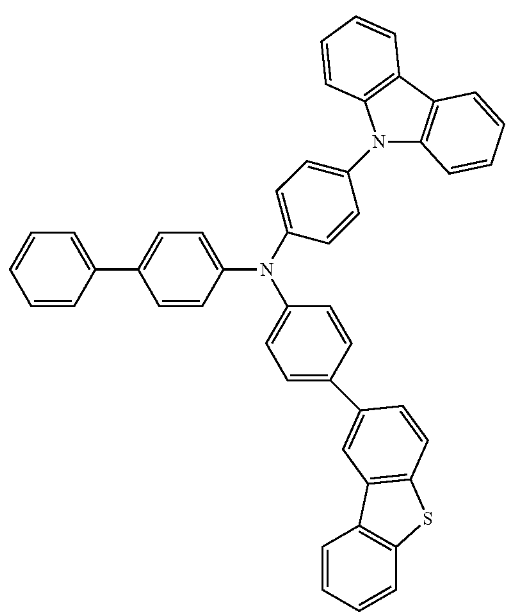
S
N
N

-continued
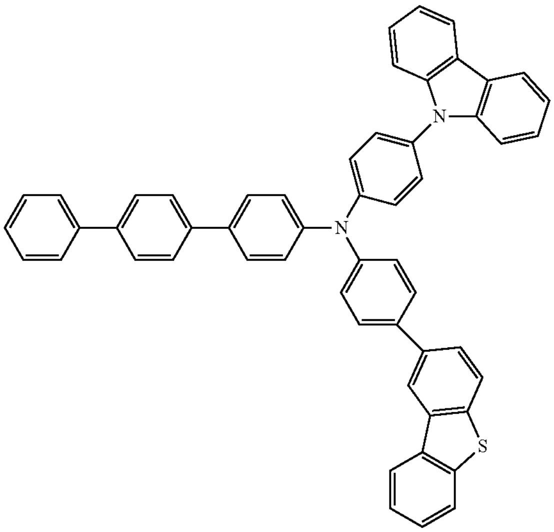
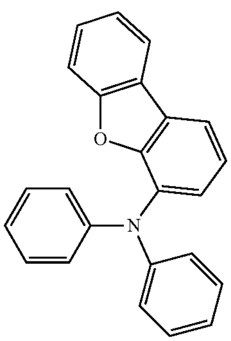
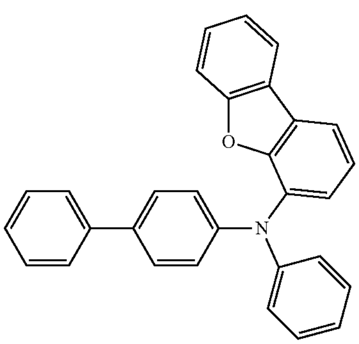
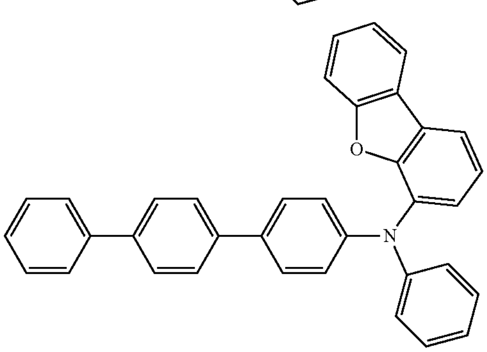
-continued
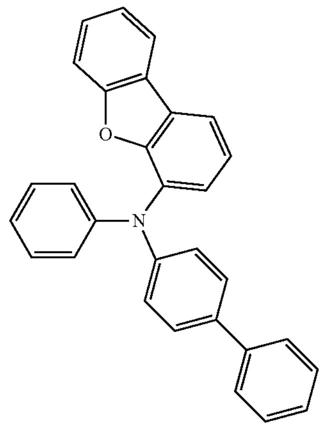
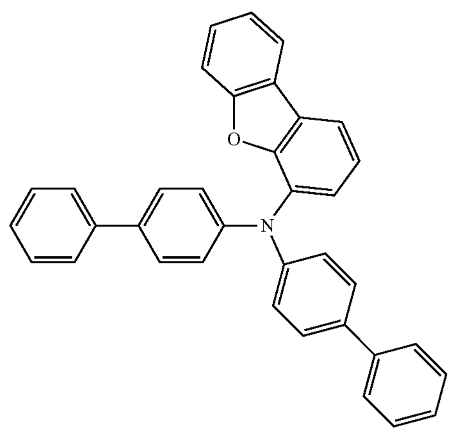
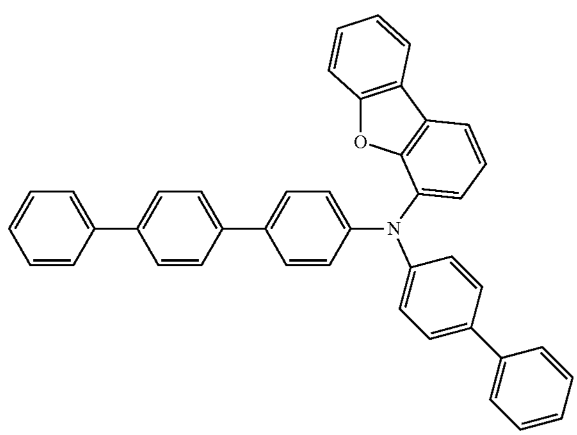

-continued
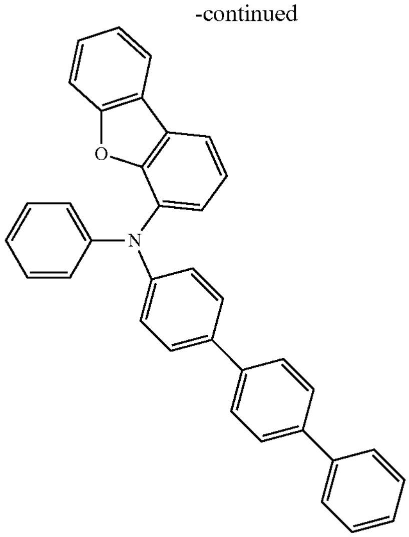
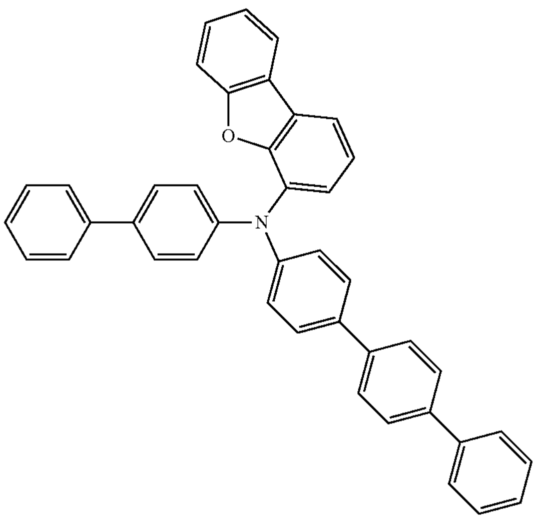
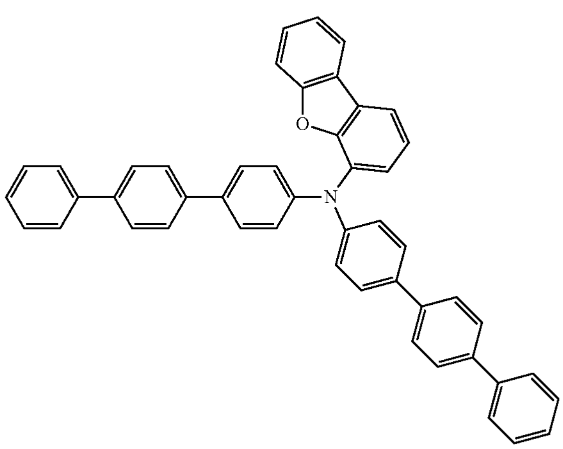
-continued
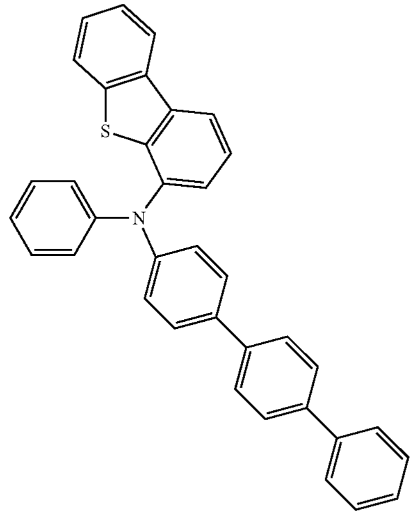
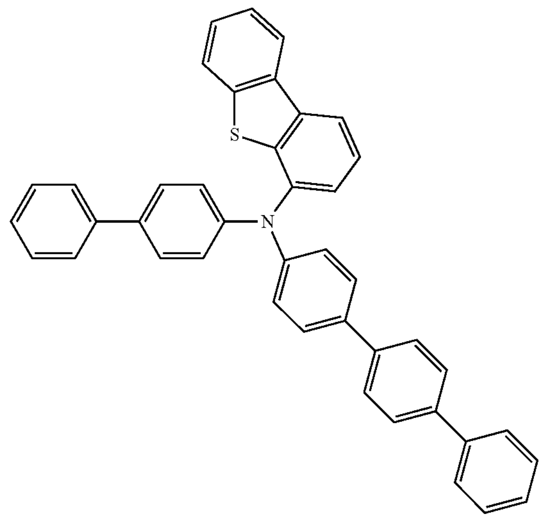
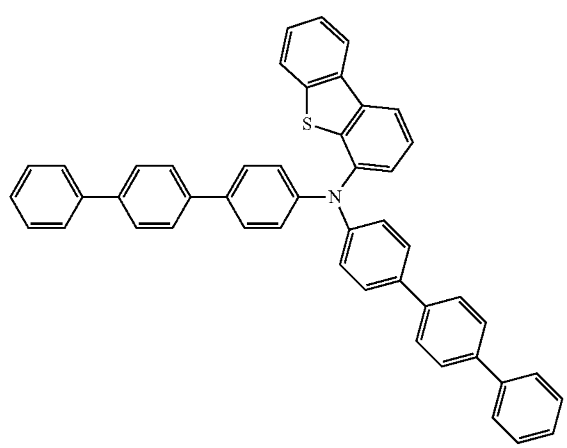

-continued
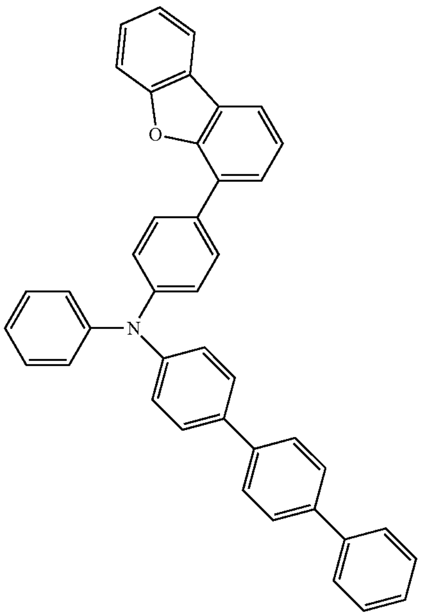
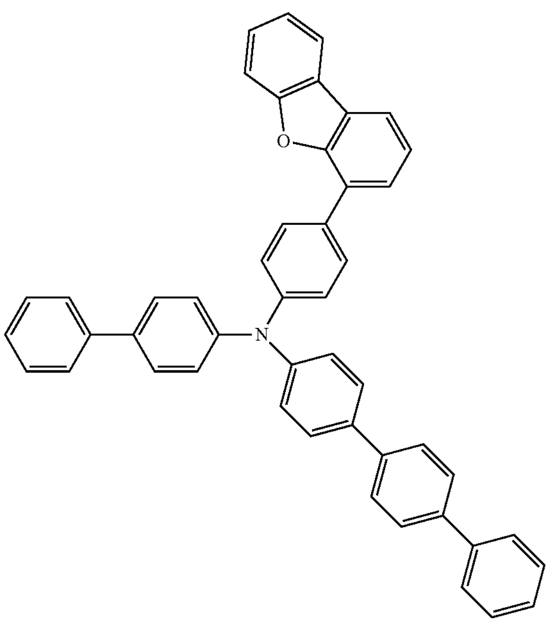
-continued
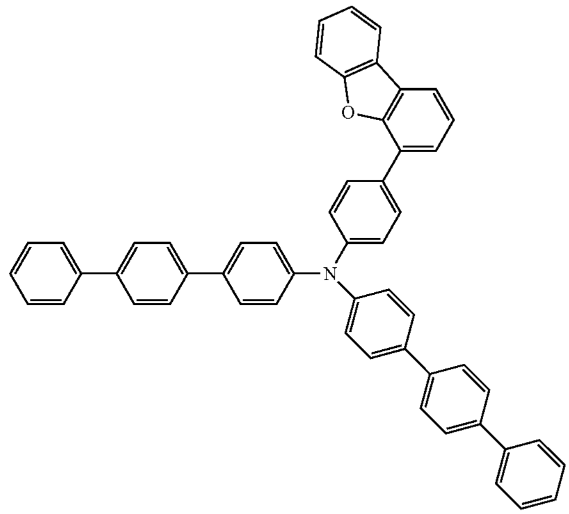
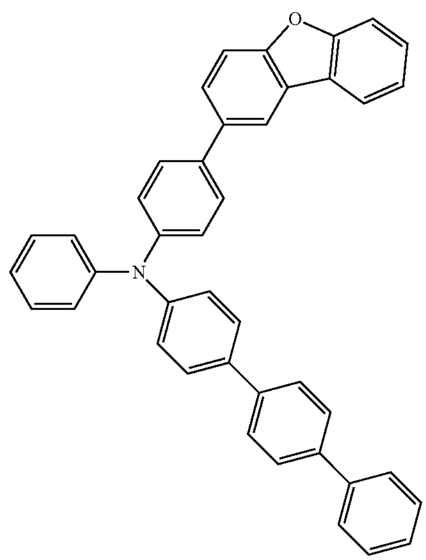
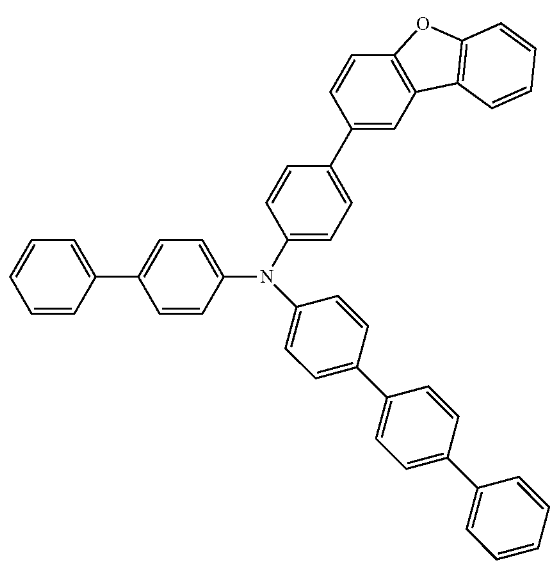

-continued
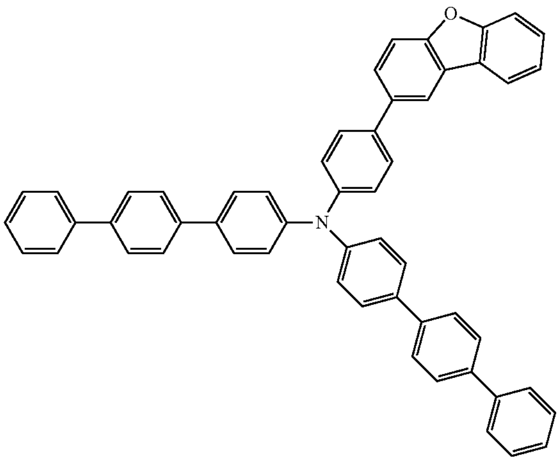
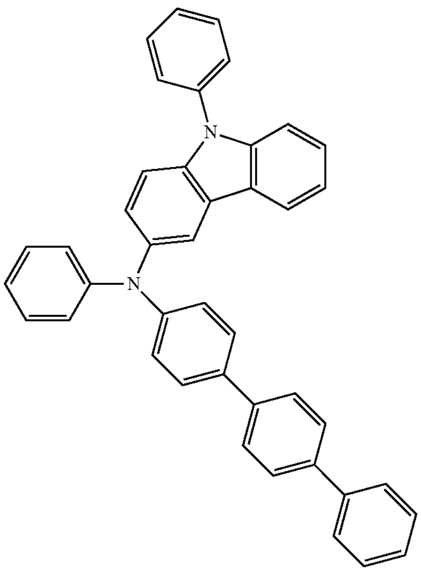
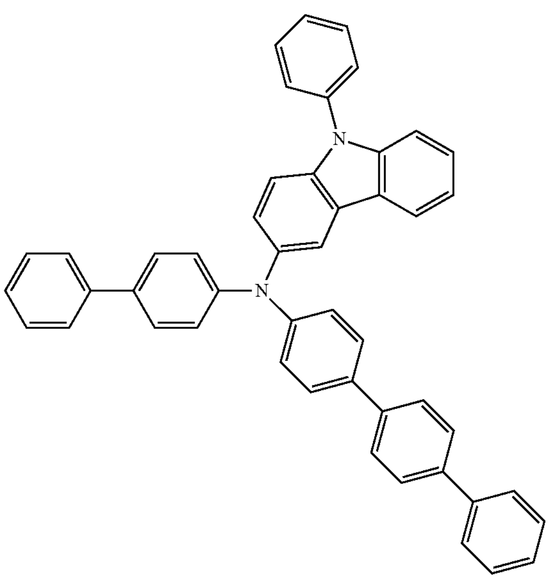
-continued
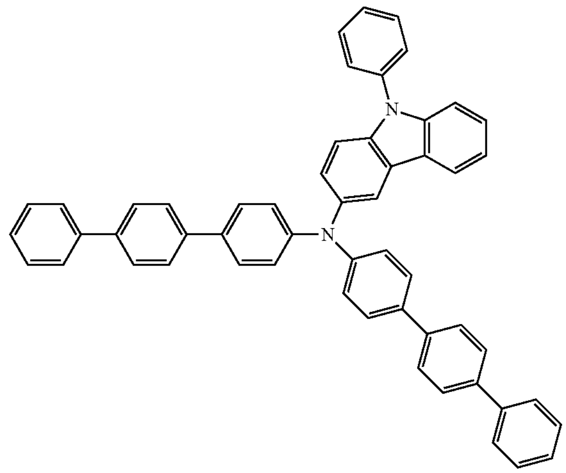
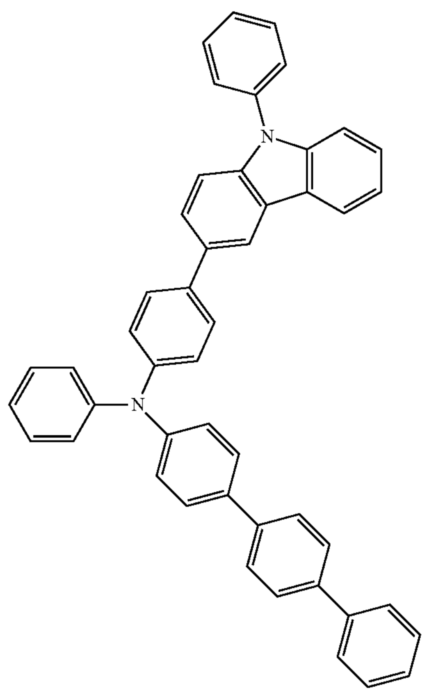

-continued
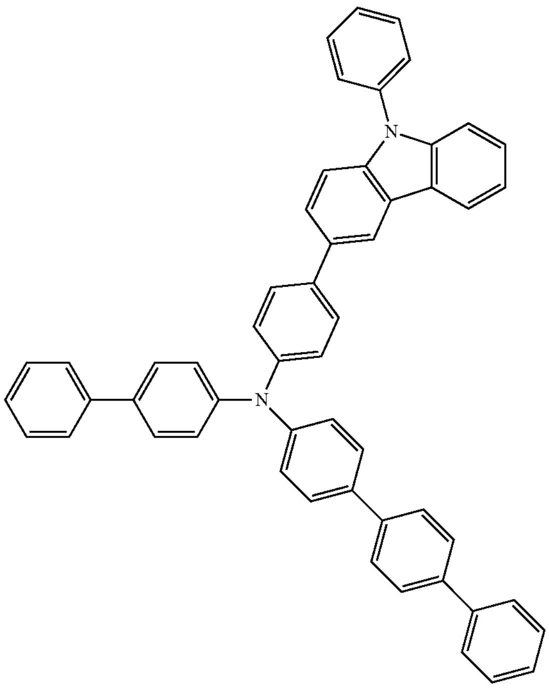
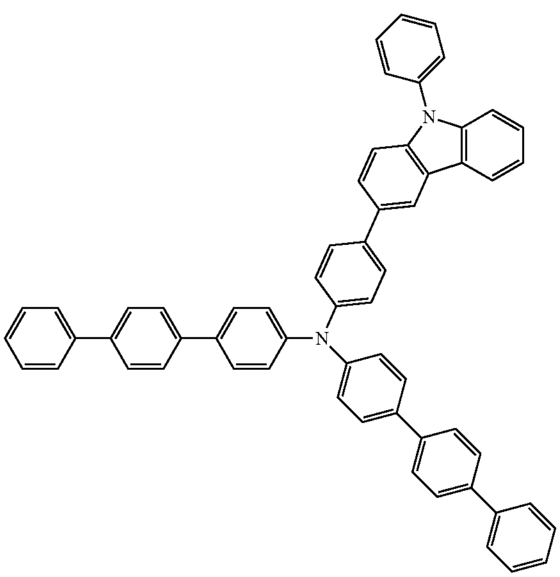
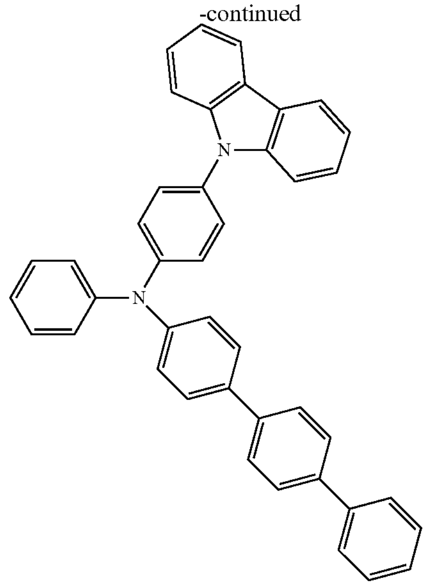
-continued
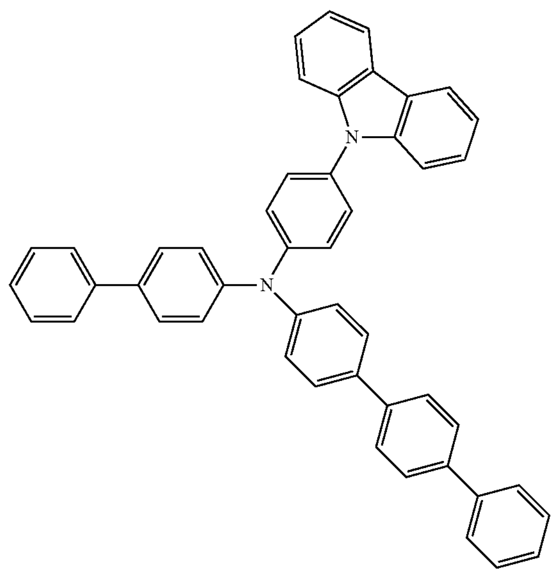
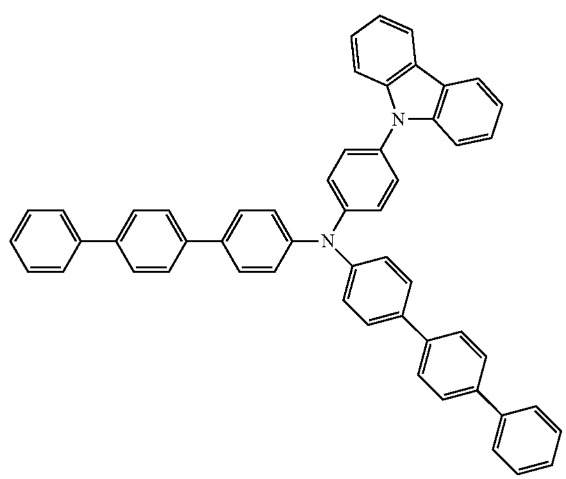

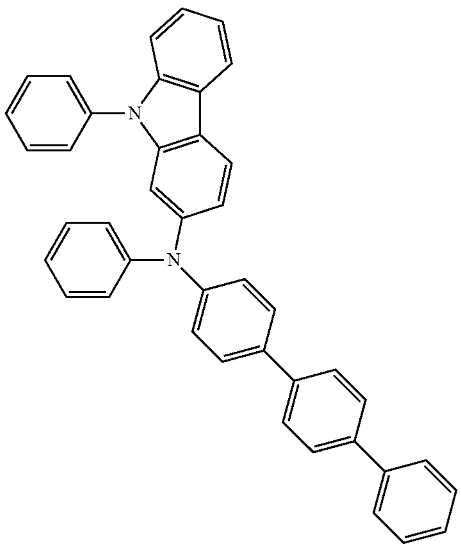
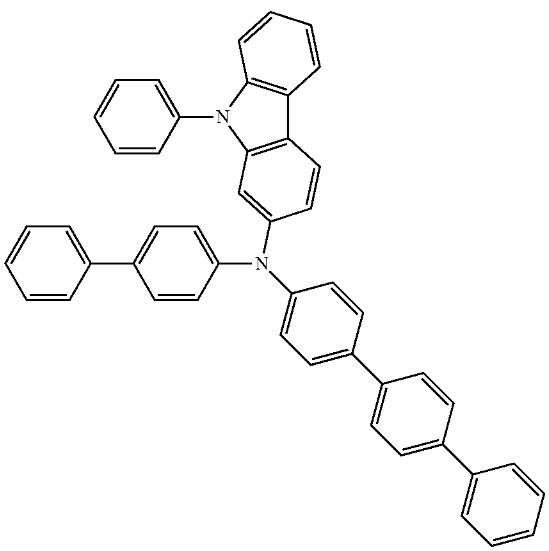
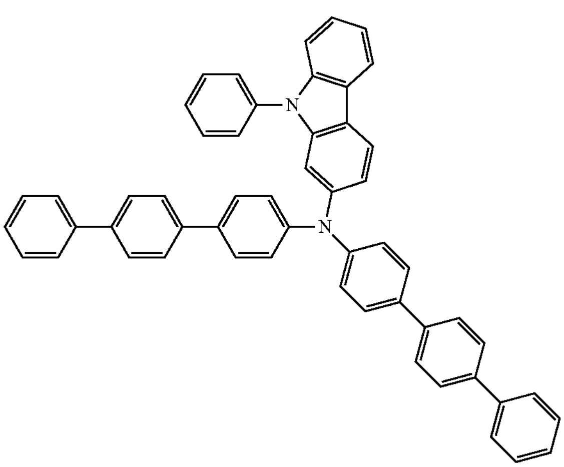
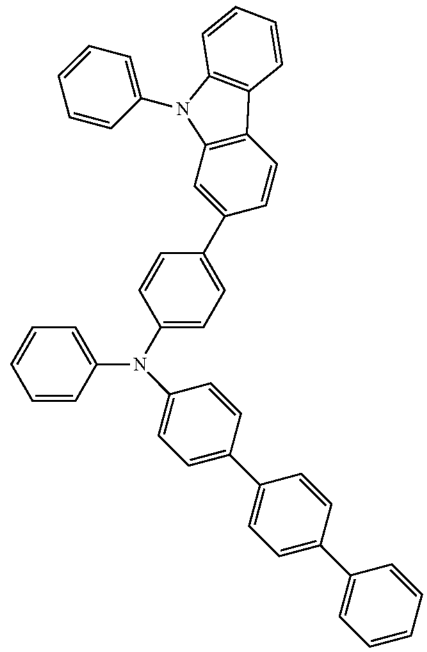
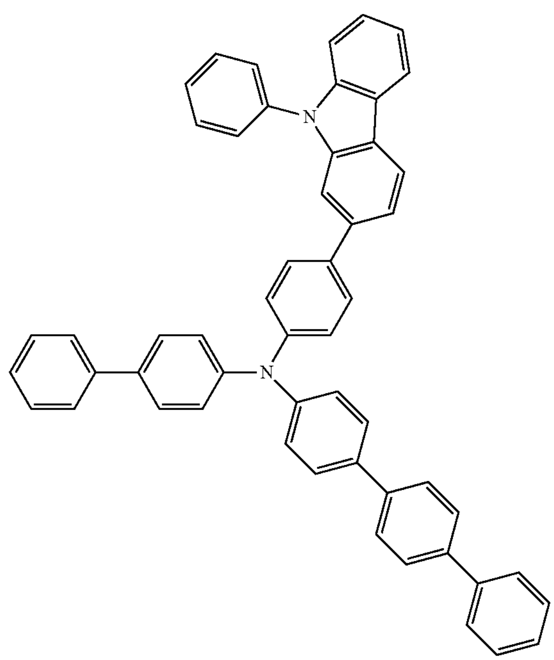
N
N

-continued

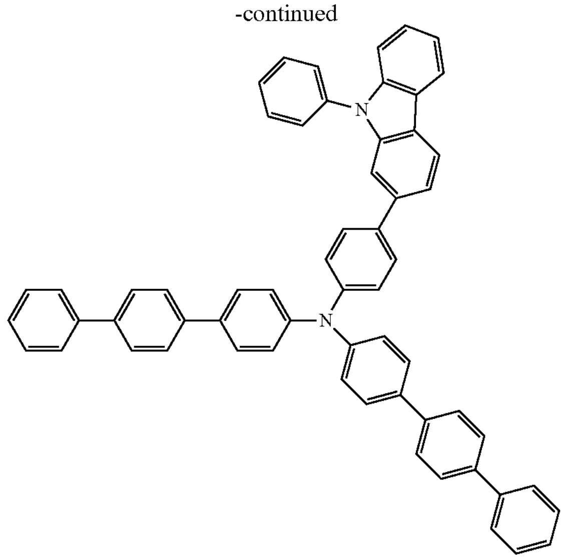

Combination of First Host Material and Second Host Material

In the first and second exemplary embodiments, the compound represented by the formula (1) is used as the first host material and the compound represented by the formula (4) or (30) is used as the second host material. Since the compound represented by the formula (1) has a stable skeleton, lifetime of the organic EL device can be prolonged by using the compound represented by the formula (1) as the host material in the emitting layer. However, hole transporting capability of the compound represented by the formula (1) is not sufficient. On the other hand, the compounds represented by the formulae (4) and (30) exhibit electron blocking capability or hole transporting capability. Accordingly, the lifetime of the organic EL device can be further prolonged by using the compound represented by the formula (4) or (30) in the emitting layer in which the compound represented by the formula (1) is used.

Specifically, a carbazolyl group to be used in the first host material has been generally known as an easily oxidizable (cation/anion) group (JP-A-2008-088083). Accordingly, it is assumed that the first host material exhibits a low stability to reduction while functioning as a hole transporting compound.

In the first and second exemplary embodiments, a furan compound (dibenzofuranyl group) and a thiophene compound (dibenzothiophenyl group), which are less oxidizable than a carbazolyl group, are used as the first host material.

Since the furan compound and the thiophene compound are less oxidizable, the furan compound and the thiophene compound exhibit a larger ionization potential (Ip) than the carbazolyl compound. Accordingly, the furan compound and the thiophene compound exhibit a high stability to reduction.

When the furan compound (dibenzofuranyl group), and the thiophene compound (dibenzothiophenyl group) are used as an organic EL device, hole injecting capability becomes insufficient to deteriorate performance of the organic EL device.

In the first and second exemplary embodiments, it has been found that the above insufficient holes can be solved by using the compound represented by the formula (4) or (30) together with the compound represented by the formula (1). The compound represented by the formula (4) or (30) functions as a hole transporting compound.

According to the above exemplary embodiments of the invention, an organic electroluminescence device having a long lifetime can be provided.

Modifications of Embodiments

It should be noted that the invention is not limited to the above exemplary embodiments but may include any modification and improvement as long as such modification and improvement are compatible with the invention.

The emitting layer is not limited to a single layer, but may be provided as laminate by a plurality of emitting layers. When the organic EL device includes the plurality of emitting layers, it is only required that at least one of the emitting layers includes the first host material represented by the formula (1), the second host material represented by the formula (4), and a phosphorescent dopant material. The others of the emitting layers may be a fluorescent emitting layer or a phosphorescent emitting layer.

When the organic EL device includes the plurality of emitting layers, the plurality of emitting layers may be adjacent to each other, or provide a so-called tandem-type organic EL device in which a plurality of emitting units are layered through an intermediate layer.

In the invention, the emitting layer may also preferably contain a material for assisting injection of charges.

When the emitting layer is formed of a host material that exhibits a wide energy gap, a difference in ionization potential (Ip) between the host material and the hole injecting/transporting layer etc. becomes so large that injection of the holes into the emitting layer becomes difficult, which may cause a rise in a driving voltage required for providing sufficient luminance.

In the above instance, introducing a hole-injectable or hole-transportable assistance substance for assisting injection of charges in the emitting layer can contribute to facilitation of the injection of the holes into the emitting layer and to reduction of the driving voltage.

As the material for assisting injection of charges, for instance, a typical hole injecting/transporting material or the like is usable.

Specific examples of the material for assisting the injection of charges are a triazole derivative, oxadiazole derivative, imidazoles derivative, polyarylalkane derivative, pyrazoline derivative, pyrazolone derivative, phenylenediamine derivative, arylamine derivative, amino-substituted chalcone derivative, oxazole derivative, fluorenone derivative, hydrazone derivative, stilbene derivative, silazane derivative, polysilane copolymer, aniline copolymer, and conductive polymer oligomer (particularly, a thiophene oligomer).

The hole injecting material is exemplified by the above. The hole injecting material is preferably a porphyrin compound, aromatic tertiary amine compound and styryl amine compound, particularly preferably aromatic tertiary amine compound.

In addition, 4,4'-bis(N-(1-naphthyl)-N-phenylamino)biphenyl (hereinafter, abbreviated as NPD) having two fused aromatic rings in a molecule, or 4,4',4''-tris(N-(3-methylphenyl)-N-phenylamino)triphenylamine (hereinafter, abbreviated as MTDATA) in which three triphenylamine units are bonded in a starburst form as disclosed and the like may also be used.

Moreover, a hexaazatriphenylene derivative and the like may be also preferably used as the hole injecting material.

Alternatively, inorganic compounds such as p-type Si and p-type SiC may also be used as the hole-injecting material.

Electronic Device

The organic EL device of the invention is suitably applicable to an electronic device such as: a display of a television, a mobile phone, a personal computer and the like; and an emitting unit of an illuminator or a vehicle light.

According to the above exemplary embodiments of the invention, an electronic device including the organic electroluminescence device having a long lifetime can be provided.

EXAMPLES

Examples of the invention will be described below. However, the invention is not limited by these Examples.

Compounds used in Examples and Comparative will be shown below.

H1

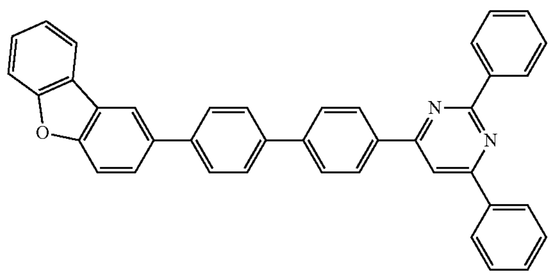

H2

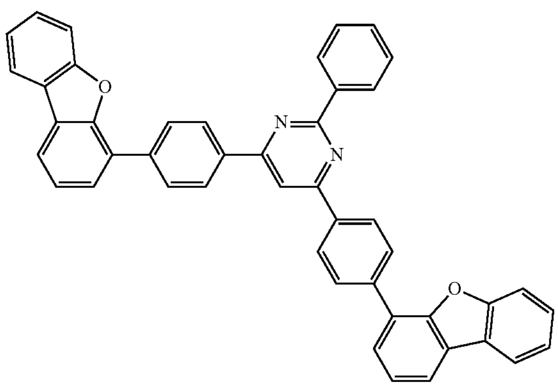

H3

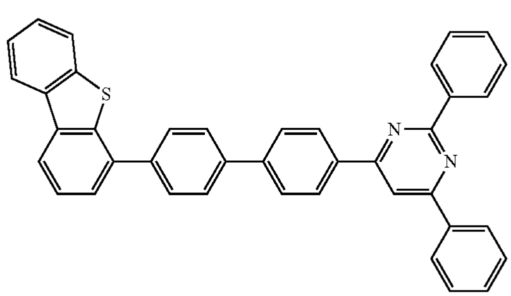

H4

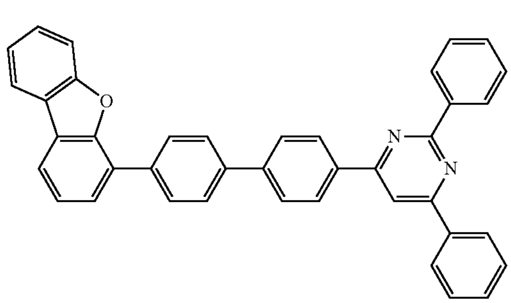

-continued

H5

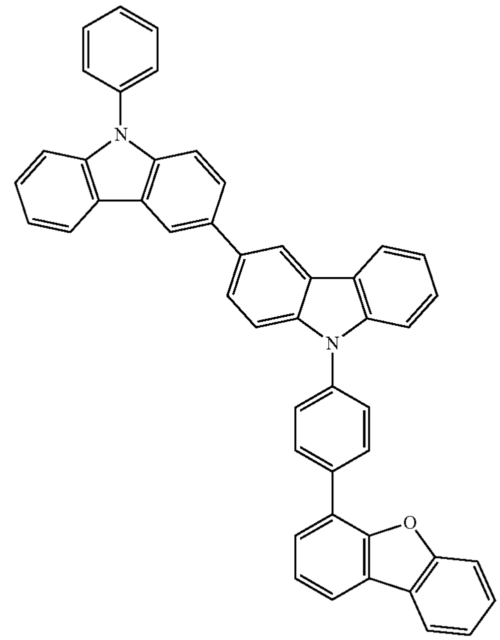

H6

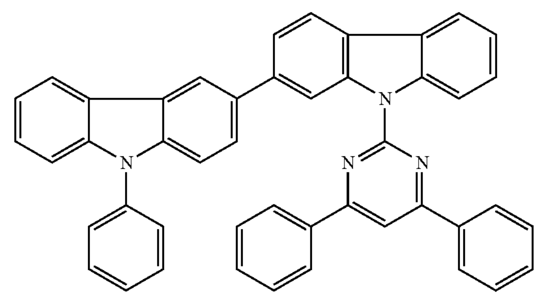

H7

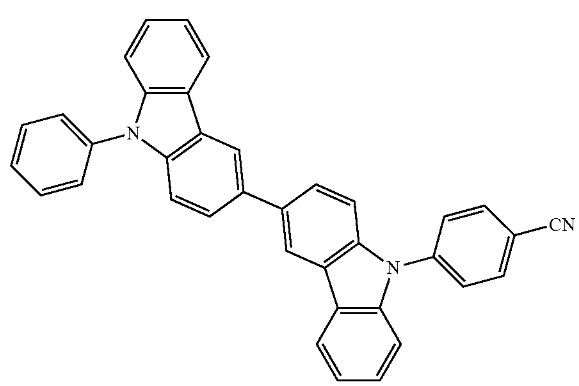

H8
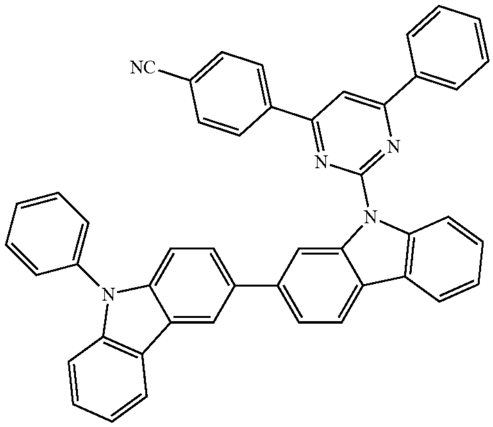
H9
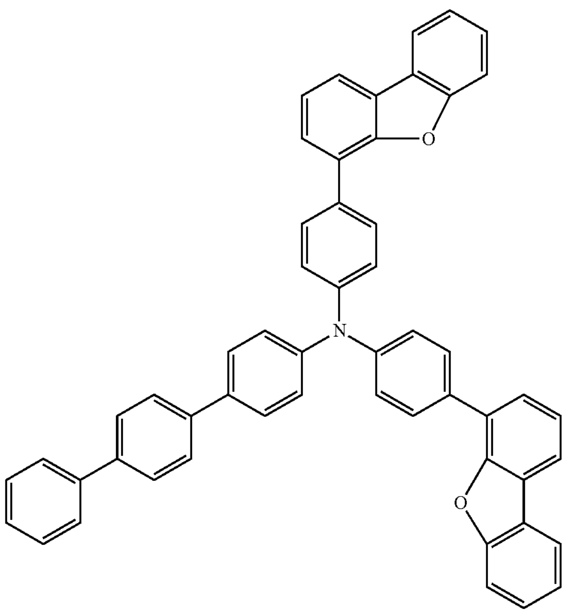
H13
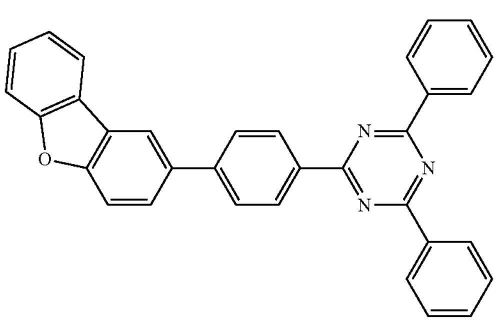
HI
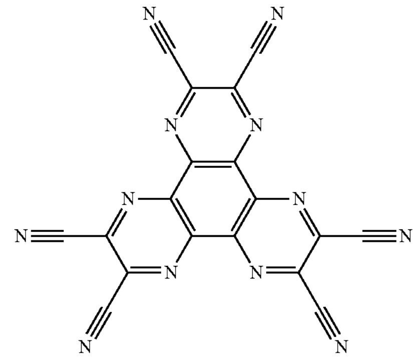
HT1
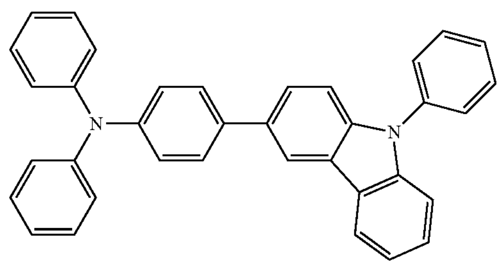
HT2
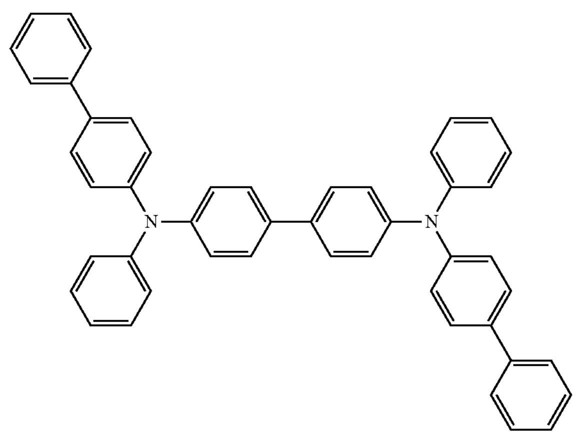
ET1
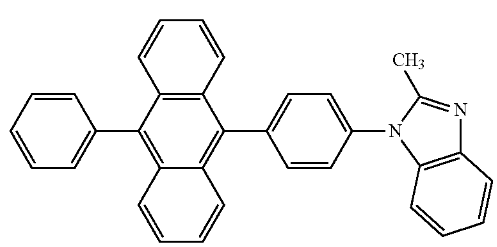

-continued

D1

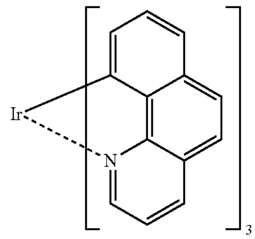

$Ir(bzq)_3$

Example 1

A glass substrate (size: 25 mm×75 mm×0.04 in thick, manufactured by Geomatec Co., Ltd.) having an ITO transparent electrode (anode) was ultrasonic-cleaned in isopropyl alcohol for five minutes, and then UV/ozone-cleaned for 30 minutes. A film thickness of ITO was 77 nm thick.

After the glass substrate having the transparent electrode line was cleaned, the glass substrate was mounted on a substrate holder of a vacuum evaporation apparatus. Initially, a compound HI was deposited on a surface of the glass substrate where the transparent electrode line was provided in a manner to cover the transparent electrode, thereby forming a 5-nm thick HI film of the compound HI. The HI film serves as a hole injecting layer.

After the film formation of the HI film, a compound HT1 was deposited on the HI film to form a 65-nm thick HT1 film. The HT1 film serves as a first hole transporting layer.

Further, a compound HT2 was deposited on the HT1 film to form a 10-nm thick HT2 film. The HT2 film serves as a second hole transporting layer.

Then, a compound H1 (first host material), a compound H5 (second host material) and a compound D1 ($Ir(bzq)_3$) (phosphorescent dopant material) were co-deposited on the second hole transporting layer to form a 25-nm thick emitting layer. A concentration of the first host material was set at 45 mass %, a concentration of the second host material was set at 45 mass %, and a concentration of the dopant material was set at 10 mass % in the emitting layer.

An electron transporting compound ET1 was deposited on the emitting layer to form a 35-nm thick electron transporting layer.

LiF was deposited on the electron transporting layer to form a 1-nm thick LiF layer.

A metal Al was deposited on the LiF film to form an 80-nm thick metal Al cathode.

A device arrangement of the organic EL device in Example 1 is schematically shown as follows.

ITO(77)/HI(5)/HT1(65)/HT2(10)/H1:H5:D1(25,45%:45%:10%)/ET1(35)/LiF(1)/Al(80)

Numerals in parentheses represent a film thickness (unit: nm). The numerals represented by percentage in parentheses indicate a ratio (mass percentage) of the added component.

Examples 2 to 11

In Examples 2 to 11, organic EL devices were manufactured in the same manner as in the Example 1 except for replacing the materials for the emitting layer as shown in Table 1.

Comparative 1

In Comparative 1, an organic EL device was manufactured in the same manner as in the Example 1 except for using no second host material and changing a concentration of the first host material shown in Table 1 to 90 mass %.

TABLE 1

| | First Host Material | Second Host Material |
|---|---|---|
| Example 1 | H1 | H5 |
| Example 2 | H2 | H6 |
| Example 3 | H3 | H6 |
| Example 4 | H4 | H6 |
| Example 5 | H1 | H6 |
| Example 6 | H13 | H6 |
| Example 7 | H4 | H7 |
| Example 8 | H2 | H7 |
| Example 9 | H1 | H8 |
| Example 10 | H2 | H8 |
| Example 11 | H1 | H9 |
| Comparative 1 | H1 | — |

The organic EL devices manufactured in Examples 1 to 11 and Comparative 1 were evaluated as follows. The evaluation results are shown in Table 2.

Drive Voltage

Voltage was applied between ITO and Al such that the current density was 10 mA/cm$^2$, where the voltage (unit: V) was measured.

Current Efficiency L/J

Voltage was applied on each of the organic EL devices such that the current density was 10 mA/cm$^2$, where spectral radiance spectra were measured by a spectroradiometer CS-1000 (Manufactured by Konica Minolta, Inc.). Based on the obtained spectral radiance spectra, the current efficiency (unit: cd/A) was calculated.

Main Peak Wavelength $\lambda_p$

A main peak wavelength $\lambda_p$ was calculated based on the obtained spectral-radiance spectra.

Lifetime LT80

A voltage was applied on the organic EL devices such that a current density was 50 mA/cm$^2$, where a time (unit: hrs) elapsed before a luminance intensity was reduced to 80% of the initial luminance intensity was measured.

TABLE 2

| | Voltage (V) | L/J (cd/A) | $\lambda_p$ (nm) | LT80 (hrs) |
|---|---|---|---|---|
| Example 1 | 3.45 | 59.7 | 551 | 118 |
| Example 2 | 2.96 | 47.9 | 553 | 131 |
| Example 3 | 3.04 | 52.3 | 551 | 152 |
| Example 4 | 3.06 | 54.4 | 554 | 179 |
| Example 5 | 2.99 | 46.3 | 552 | 191 |
| Example 6 | 2.95 | 53.2 | 551 | 214 |
| Example 7 | 3.05 | 53.6 | 552 | 195 |
| Example 8 | 2.98 | 50.5 | 551 | 194 |
| Example 9 | 3.22 | 50.3 | 551 | 125 |
| Example 10 | 3.11 | 48.5 | 551 | 179 |
| Example 11 | 3.75 | 61.7 | 552 | 114 |
| Comparative 1 | 4.29 | 47.8 | 555 | 82 |

It has been found from Table 2 that the organic EL devices according to Examples 1 to 11, in which the first host material represented by the formula (1) and the second host material represented by the formula (4) were used, have a significantly prolonged lifetime than the organic EL device according to Comparative 1 in which the host material is singularly used.

What is claimed is:

1. An organic electroluminescence device, comprising:

a cathode;

an anode; and an organic layer having one or more layers and provided between the anode and the cathode, wherein the organic layer comprises an emitting layer, the emitting layer comprises a first host material, a second host material, and a phosphorescent dopant material, the first host material is a compound represented by a formula (1) below, and the second host material is a compound represented by a formula (4) below,

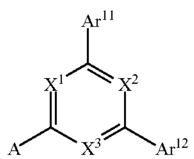
(1)

where:

$X^1$ to $X^3$ each are a nitrogen atom or $CR^1$ with a proviso that at least one of $X^1$ to $X^3$ is a nitrogen atom;

$R^1$ independently represents a hydrogen atom, a halogen atom, a cyano group, a substituted or unsubstituted alkyl group having 1 to 30 carbon atoms, a substituted or unsubstituted alkenyl group having 2 to 30 carbon atoms, a substituted or unsubstituted alkynyl group having 2 to 30 carbon atoms, a substituted or unsubstituted alkylsilyl group having 3 to 30 carbon atoms, a substituted or unsubstituted arylsilyl group having 6 to 30 ring carbon atoms, a substituted or unsubstituted alkoxy group having 1 to 30 carbon atoms, a substituted or unsubstituted aralkyl group having 6 to 30 ring carbon atoms, a substituted or unsubstituted aryloxy group having 6 to 30 ring carbon atoms, a substituted or unsubstituted aromatic hydrocarbon group having 6 to 30 ring carbon atoms, or a substituted or unsubstituted heterocyclic group having 5 to 30 ring atoms;

A is represented by a formula (2) below; and $Ar^{11}$ and $Ar^{12}$ are each independently represented by the formula (2), or a substituted or unsubstituted aromatic hydrocarbon group having 6 to 30 ring carbon atoms, or a substituted or unsubstituted heterocyclic group having 5 to 30 ring atoms, $$(HAr^1)_m\text{-}L^1\text{-} \quad (2)$$

where:

$HAr^1$ is represented by a formula (3) below;

m is 1 or 2;

when m is 1, $L^1$ is a single bond or a divalent linking group;

when m is 2, $L^1$ is a trivalent linking group and $HAr^1$ are the same or different;

the linking group in $L^1$ is a substituted or unsubstituted divalent or trivalent aromatic hydrocarbon group having 6 to 30 ring carbon atoms, a substituted or unsubstituted divalent or trivalent heterocyclic group having 5 to 30 ring atoms, or a divalent or trivalent multiple linking group provided by bonding two or three groups selected from the aromatic hydrocarbon group and the heterocyclic group; and in the multiple linking group, the aromatic hydrocarbon group and the heterocyclic group forming the multiple linking group are mutually the same or different and are optionally mutually bonded to form a ring,

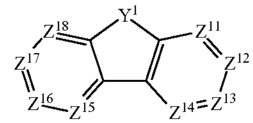
(3)

where:

$Z^{11}$ to $Z^{18}$ each independently represent a nitrogen atom, $CR^{11}$ or a carbon atom to be bonded to $L^1$ by a single bond;

$Y^1$ represents an oxygen atom, a sulfur atom, $SiR^{12}R^{13}$ or a silicon atom to be bonded to $L^1$ by a single bond;

one of the carbon atom at $Z^{11}$ to $Z^{18}$ and $R^{11}$ to $R^{13}$ and the silicon atom at $Y^1$ is bonded to $L^1$;

$R^{11}$, $R^{12}$ and $R^{13}$ represent the same as $R^1$ of the formula (1); a plurality of $R^{11}$ are mutually the same or different; adjacent ones of $R^{11}$ are optionally bonded to each other to form a ring; $R^{12}$ and $R^{13}$ are mutually the same or different; and $R^{12}$ and $R^{13}$ are optionally bonded to each other to form a ring,

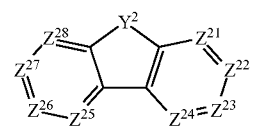
(4)

where:

$Y^2$ is represented by a formula (4-B) below;

one of $Z^{21}$ to $Z^{28}$ is a carbon atom to be bonded to $L^{211}$ in a formula (5) below, or a pair of adjacent ones of $Z^{21}$ to $Z^{28}$ are carbon atoms to be bonded to b and c in one of formulae (6-1) to (6-4) below to form a fused ring;

$Z^{21}$ to $Z^{28}$ which are not bonded to $L^{211}$, b and c are $CR^{21}$; $R^{21}$ represents the same as $R^1$ of the formula (1); and a plurality of $R^{21}$ are mutually the same or different,

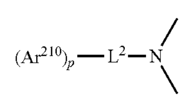
(4-B)

where:

$Ar^{210}$ is a substituted or unsubstituted aromatic hydrocarbon group having 6 to 30 ring carbon atoms, or a substituted or unsubstituted heterocyclic group having 5 to 30 ring atoms;

p is an integer of 1 to 3;

when p is 2 or more, a plurality of $Ar^{210}$ are mutually the same or different;

$L^2$ represents a single bond or a linking group;

the linking group in $L^2$ is a substituted or unsubstituted aromatic hydrocarbon group having 6 to 30 ring carbon atoms, a substituted or unsubstituted heterocyclic group having 5 to 30 ring atoms, or a polyvalent multiple linking group provided by bonding two or three groups selected from the aromatic hydrocarbon group and the heterocyclic group; and in the multiple linking group, the aromatic hydrocarbon group and the heterocyclic group forming the multiple linking group are mutually the same or different and are optionally mutually bonded to form a ring, (5)

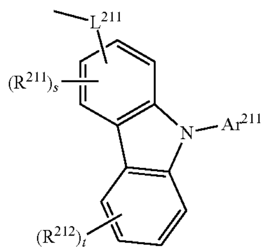

where:

$L^{211}$ is a single bond or a linking group which is bonded to one of $Z^{21}$ to $Z^{28}$ in the formula (4);

the linking group in $L^{211}$ is a substituted or unsubstituted divalent or trivalent aromatic hydrocarbon group having 6 to 30 ring carbon atoms, a substituted or unsubstituted divalent or trivalent heterocyclic group having 5 to 30 ring atoms, or a divalent or trivalent multiple linking group provided by bonding two or three groups selected from the aromatic hydrocarbon group and the heterocyclic group;

in the multiple linking group, the aromatic hydrocarbon group and the heterocyclic group forming the multiple linking group are mutually the same or different and are optionally mutually bonded to form a ring;

$Ar^{211}$ is a substituted or unsubstituted aromatic hydrocarbon group having 6 to 30 ring carbon atoms or a substituted or unsubstituted heterocyclic group having 5 to 30 ring atoms;

$R^{211}$ and $R^{212}$ represent the same as $R^1$ of the formula (1);

s is 3 and t is 4; and a plurality of $R^{211}$ and $R^{212}$ are mutually the same or different, (6-1)

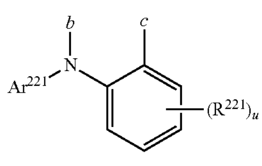

(6-2)

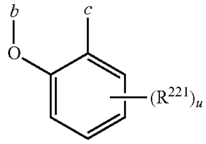

(6-3)

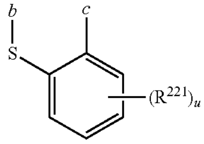

-continued (6-4)

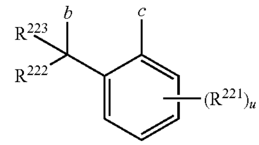

where:

b and c are bonded to one of the pair of adjacent ones of $Z^{21}$ to $Z^{28}$ to form a fused ring;

$Ar^{221}$ is a substituted or unsubstituted aromatic hydrocarbon group having 6 to 30 ring carbon atoms or a substituted or unsubstituted heterocyclic group having 5 to 30 ring atoms;

$R^{221}$ to $R^{223}$ represent the same as $R^1$ of the formula (1);

u is 4; a plurality of $R^{221}$ are mutually the same or different; and adjacent ones of $R^{221}$ are optionally bonded to each other to form a ring.

2. The organic electroluminescence device according to claim 1, wherein the second host material is a compound represented by one of formulae (7) to (9) below, (7)

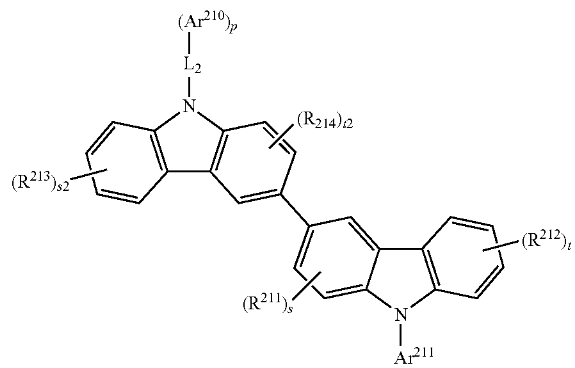

(8)

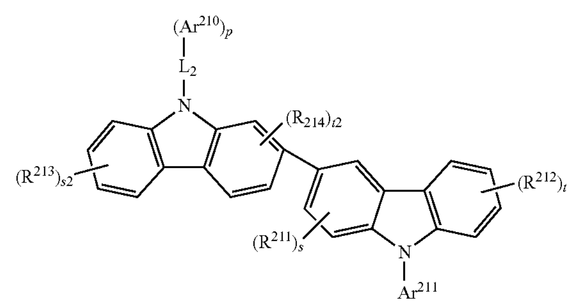

(9)

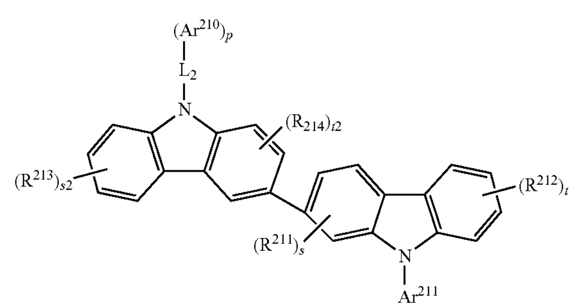

where:

$Ar^{210}$, $L^2$ and p respectively represent the same as $Ar^{210}$, $L^2$ and p of the formula (4-B);

when p is 2 or more, a plurality of $Ar^{210}$ are the same or different;

$R^{213}$ and $R^{214}$ represent the same as $R^1$ of the formula (1); a plurality of $R^{213}$ and $R^{214}$ are mutually the same or different;

s2 is 4 and t2 is 3; and $Ar^{211}$, $R^{211}$, $R^{212}$, s and t respectively represent the same as $Ar^{211}$, $R^{211}$, $R^{212}$, s and t of the formula (5).

3. The organic electroluminescence device according to claim 1, wherein the second host material is a compound represented by one of formulae (10) to (27) below, (10)

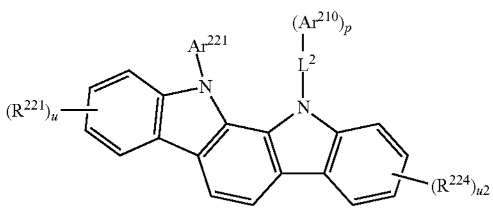

(11)

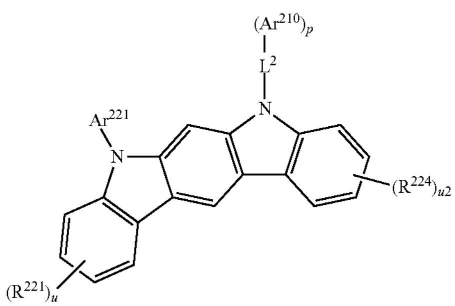

(12)

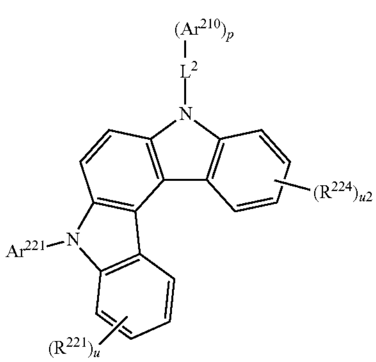

(13)

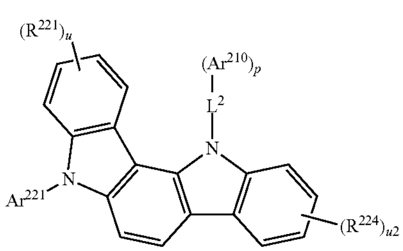

-continued (14)

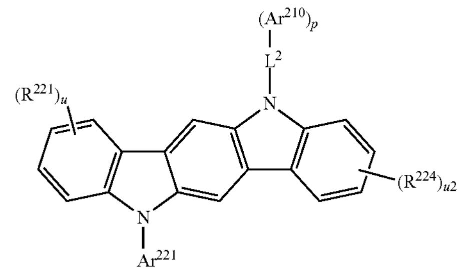

(15)

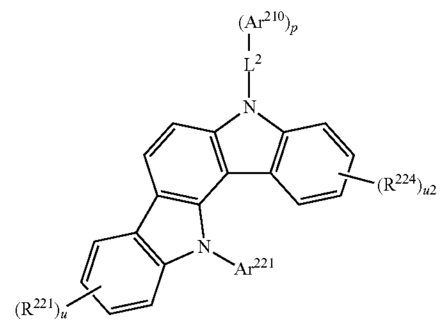

(16)

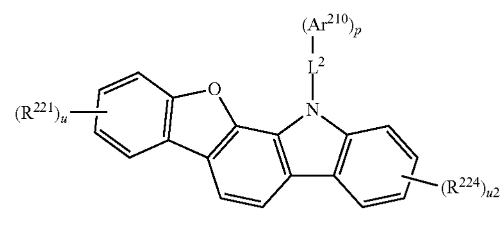

(17)

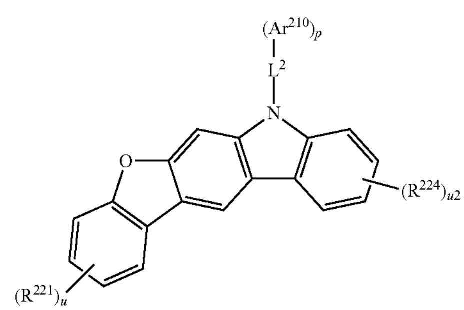

(18)

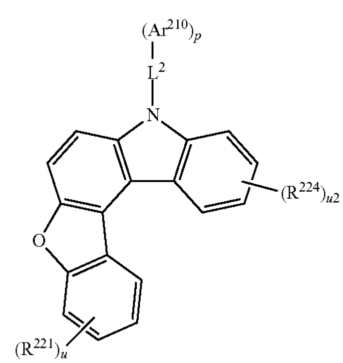

-continued (19)

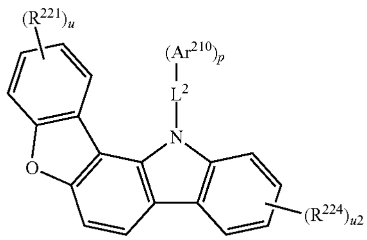

(20)

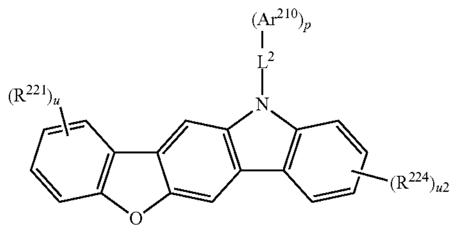

(21)

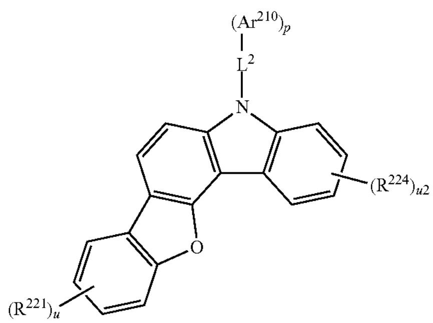

(22)

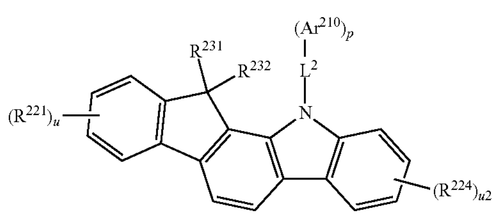

(23)

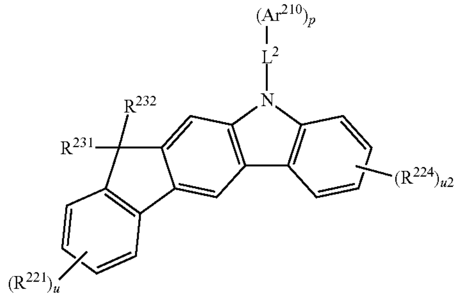

-continued (24)

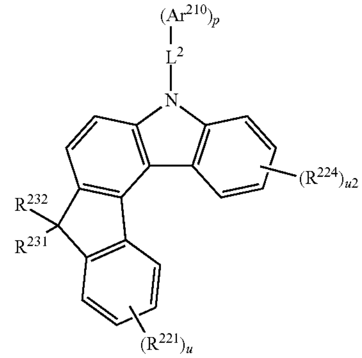

(25)

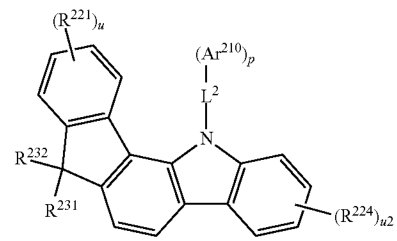

(26)

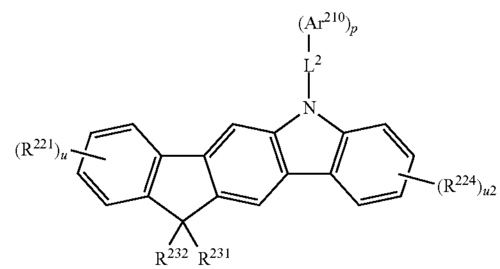

(27)

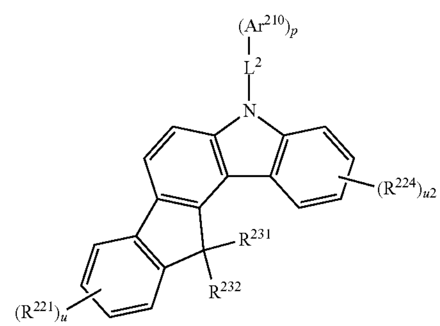

where:

$Ar^{210}$, $L^2$ and p respectively represent the same as $Ar^{210}$, $L^2$ and p of the formula (4-B);

when p is 2 or more, a plurality of $Ar^{210}$ are mutually the same or different;

$Ar^{221}$ is a substituted or unsubstituted aromatic hydrocarbon group having 6 to 30 ring carbon atoms or a substituted or unsubstituted heterocyclic group having 5 to 30 ring atoms;

$R^{221}$, $R^{224}$, $R^{231}$ and $R^{232}$ represent the same as $R^1$ of the formula (1);

u and u2 are 4;

a plurality of $R^{221}$ and $R^{224}$ are mutually the same or different; and adjacent ones of $R^{221}$, adjacent ones of $R^{224}$, and $R^{2}$" and $R^{232}$ are optionally respectively bonded to each other to form a ring.

4. The organic electroluminescence device according to claim 1, wherein $Y^1$ in the formula (3) is an oxygen atom or a sulfur atom.

5. The organic electroluminescence device according to claim 1, wherein $Y^1$ in the formula (3) is an oxygen atom or a sulfur atom, and one of $Z^{11}$ to $Z^{18}$ is a carbon atom to be bonded to $L^1$ by a single bond and the rest of $Z^{11}$ to $Z^{18}$, which are not bonded to $L^1$, are $CR^{11}$.

6. The organic electroluminescence device according to claim 1, wherein $Z^{13}$ or $Z^{16}$ in the formula (3) is a carbon atom to be bonded to $L^1$ by a single bond.

7. The organic electroluminescence device according to claim 1, wherein $Z^{11}$ or $Z^{18}$ in the formula (3) is a carbon atom to be bonded to $L^1$ by a single bond.

8. The organic electroluminescence device according to claim 1, wherein m is 1 in the formula (2), and $L^1$ in the formula (2) is a linking group and $L^1$ as the linking group is a substituted or unsubstituted divalent aromatic hydrocarbon group having 6 to 30 ring carbon atoms, or a substituted or unsubstituted divalent heterocyclic group having 5 to 30 ring atoms.

9. The organic electroluminescence device according to claim 1, wherein two or three of $X^1$ to $X^3$ are nitrogen atoms in the formula (1).

10. The organic electroluminescence device according to claim 1, wherein in the formula (2), $L^1$ is a divalent or trivalent linking group derived from one of benzene, biphenyl, terphenyl, naphthalene and phenanthrene.

11. An electronic device comprising the organic electroluminescence device according to claim 1.

12. An organic electroluminescence device, comprising:

a cathode;

an anode; and an organic layer having one or more layers and provided between the anode and the cathode, wherein the organic layer comprises an emitting layer, the emitting layer comprises a first host material, a second host material, and a phosphorescent dopant material, the first host material is a compound represented by a formula (1) below, and the second host material is a compound represented by a formula (30) below, (1)

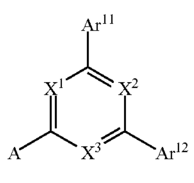

where:

$X^1$ to $X^3$ each are a nitrogen atom or $CR^1$ with a proviso that at least one of $X^1$ to $X^3$ is a nitrogen atom;

$R^1$ independently represents a hydrogen atom, a halogen atom, a cyano group, a substituted or unsubstituted alkyl group having 1 to 30 carbon atoms, a substituted or unsubstituted alkenyl group having 2 to 30 carbon atoms, a substituted or unsubstituted alkynyl group having 2 to 30 carbon atoms, a substituted or unsubstituted alkylsilyl group having 3 to 30 carbon atoms, a substituted or unsubstituted arylsilyl group having 6 to 30 ring carbon atoms, a substituted or unsubstituted alkoxy group having 1 to 30 carbon atoms, a substituted or unsubstituted aralkyl group having 6 to 30 ring carbon atoms, a substituted or unsubstituted aryloxy group having 6 to 30 ring carbon atoms, a substituted or unsubstituted aromatic hydrocarbon group having 6 to 30 ring carbon atoms, or a substituted or unsubstituted heterocyclic group having 5 to 30 ring atoms;

A is represented by a formula (2) below;

$Ar^{11}$ and $Ar^{12}$ are each independently represented by the formula (2), or a substituted or unsubstituted aromatic hydrocarbon group having 6 to 30 ring carbon atoms, or a substituted or unsubstituted heterocyclic group having 5 to 30 ring atoms, $$(HAr^1)_m\text{-}L^1\text{-} \quad (2)$$

where:

$HAr^1$ is represented by a formula (3) below;

m is 1 or 2;

when m is 1, $L^1$ is a single bond or a divalent linking group;

when m is 2, $L^1$ is a trivalent linking group and $HAr^1$ are the same or different;

the linking group in $L^1$ is a substituted or unsubstituted divalent or trivalent aromatic hydrocarbon group having 6 to 30 ring carbon atoms, a substituted or unsubstituted divalent or trivalent heterocyclic group having 5 to 30 ring atoms, or a divalent or trivalent multiple linking group provided by bonding two or three groups selected from the aromatic hydrocarbon group and the heterocyclic group; and in the multiple linking group, the aromatic hydrocarbon group and the heterocyclic group forming the multiple linking group are mutually the same or different and are optionally mutually bonded to form a ring, (3)

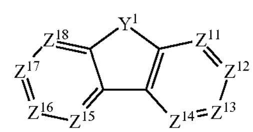

where:

$Z^{11}$ to $Z^{18}$ each independently represent a nitrogen atom, $CR^{11}$ or a carbon atom to be bonded to $L^1$ by a single bond;

$Y^1$ represents an oxygen atom, a sulfur atom, $SiR^{12}R^{13}$ or a silicon atom to be bonded to $L^1$ by a single bond;

one of the carbon atom at $Z^{11}$ to $Z^{18}$ and $R^{11}$ to $R^{13}$ and the silicon atom at $Y^1$ is bonded to $L^1$;

$R^{11}$, $R^{12}$ and $R^{13}$ represent the same as $R^1$ of the formula (1);

a plurality of $R^{11}$ are mutually the same or different;

adjacent ones of $R^{11}$ are optionally bonded to each other to form a ring;

$R^{12}$ and $R^{13}$ are mutually the same or different; and $R^{12}$ and $R^{13}$ are optionally bonded to each other to form a ring, (30)

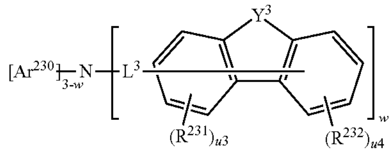

where:

$Ar^{230}$ is a substituted or unsubstituted aromatic hydrocarbon group having 6 to 30 ring carbon atoms;

$Y^3$ is selected from an oxygen atom, a sulfur atom, $NR^{230}$ and a nitrogen atom to be bonded to $L^3$ by a single bond;

$L^3$ is a single bond or a linking group and the linking group is a substituted or unsubstituted aromatic hydrocarbon group having 6 to 30 ring carbon atoms;

$L^3$ is optionally bonded to a carbon atom of the group including $Y^3$, or is optionally bonded to $Y^3$ when $Y^3$ is a nitrogen atom;

w is 1 or 2;

when w is 1, two $Ar^{230}$ are mutually the same or different;

when w is 2, structures represented by a formula (30-1) below are mutually the same or different;

$R^{230}$ to $R^{232}$ each independently represent the same as $R^1$ of the formula (1);

u3 and u4 are each independently an integer of 3 to 4;

a plurality of $R^{231}$ are mutually the same or different;

adjacent ones of $R^{231}$ are optionally bonded to each other to form a ring;

$R^{232}$ are mutually the same or different; and adjacent ones of $R^{232}$ are optionally bonded to each other to form a ring, (30-1)

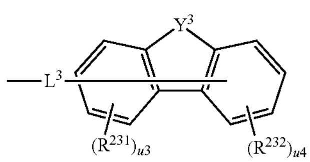

$Y^3$, $L^3$, $R^{231}$, $R^{232}$, u3 and u4 respectively represent the same as $Y^3$, $L^3$, $R^{231}$, $R^{232}$, u3 and u4 of the formula (30).

13. The organic electroluminescence device according to claim 1, wherein the phosphorescent dopant material is an ortho-metalated complex of a metal atom selected from iridium (Ir), osmium (Os) and platinum (Pt).

14. The organic electroluminescence device according to claim 12, wherein the phosphorescent dopant material is an ortho-metalated complex of a metal atom selected from iridium (Ir), osmium (Os) and platinum (Pt).

15. An electronic device comprising the organic electroluminescence device according to claim 12.

16. The organic electroluminescence device according to claim 12, wherein the second host material is a compound represented by any one of formulae (30-A) to (30-D):

(30-A)

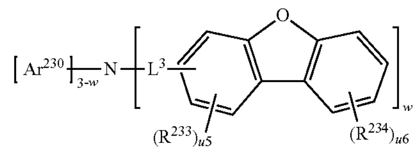

(30-B)

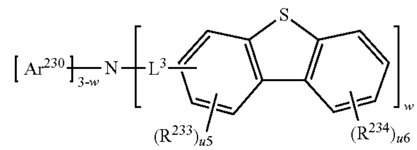

(30-C)

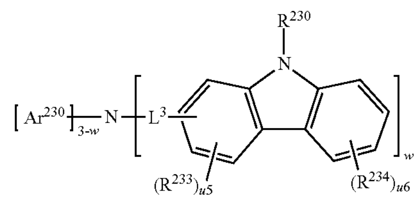

(30-D)

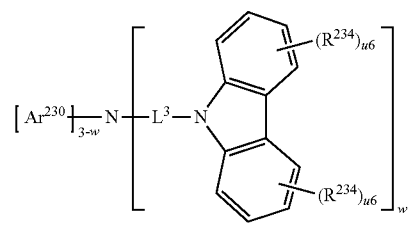

where:

$Ar^{230}$, $L^3$, w and $R^{230}$ respectively represent the same as $Ar^{230}$, $L^3$, w and $R^{230}$ of the formula (30);

$R^{233}$ and $R^{234}$ respectively represent the same as $R^{231}$ and $R^{232}$ of the formula (30); and u5 is 3 and u6 is 4.

17. The organic electroluminescence device according to claim 12, wherein $Ar^{230}$ is a phenyl group, biphenyl group or terphenyl group.

18. The organic electroluminescence device according to claim 12, wherein $L^3$ is a phenyl group, biphenyl group or terphenyl group.

19. The organic electroluminescence device according to claim 12, wherein $Ar^{230}$ is a phenyl group, biphenyl group or terphenyl group, and $L^3$ is a phenyl group, biphenyl group or terphenyl group.

* * * * *